(12) United States Patent
Or-Bach et al.

(10) Patent No.: US 7,986,042 B2
(45) Date of Patent: Jul. 26, 2011

(54) METHOD FOR FABRICATION OF A SEMICONDUCTOR DEVICE AND STRUCTURE

(75) Inventors: Zvi Or-Bach, San Jose, CA (US); Brian Cronquist, San Jose, CA (US); Israel Beinglass, Sunnyvale, CA (US); Jan Lodewijk de Jong, Cupertino, CA (US); Deepak C. Sekar, San Jose, CA (US)

(73) Assignee: MonolithIC 3D Inc., San Jose, CA (US)

( * ) Notice: Subject to any disclaimer, the term of this patent is extended or adjusted under 35 U.S.C. 154(b) by 0 days.

(21) Appl. No.: 12/849,272

(22) Filed: Aug. 3, 2010

(65) Prior Publication Data

US 2010/0289064 A1  Nov. 18, 2010

(51) Int. Cl.
H01L 23/58 (2006.01)
H01L 23/528 (2006.01)
H01L 21/98 (2006.01)

(52) U.S. Cl. ......... 257/773; 257/774; 257/797; 438/458
(58) Field of Classification Search .................. 257/499, 257/773, 774, 797; 438/458
See application file for complete search history.

(56) References Cited

U.S. PATENT DOCUMENTS

| | | | |
|---|---|---|---|
| 5,527,423 A | | 6/1996 | Neville et al. |
| 5,656,548 A | * | 8/1997 | Zavracky et al. ............... 438/23 |
| 5,977,961 A | * | 11/1999 | Rindal ......................... 345/208 |
| 6,703,328 B2 | | 3/2004 | Tanaka et al. |
| 6,759,282 B2 | | 7/2004 | Campbell et al. |
| 7,205,204 B2 | | 4/2007 | Ogawa et al. |
| 7,242,012 B2 | | 7/2007 | Leedy |
| 7,436,027 B2 | | 10/2008 | Ogawa et al. |
| 7,508,034 B2 | | 3/2009 | Takafuji et al. |
| 2009/0052827 A1 | | 2/2009 | Durfee et al. |

OTHER PUBLICATIONS

D. Lee, et al., "Single-crystalline silicon micromirrors actuated by self-aligned vertical electrostatic combdrives with piston-motion and rotation capability," Sensors and Actuators, 2004, pp. 423-428, vol. A 114.
Muhannad S. Bakir, et al., "3D Device-Stacking Technology for Memory," pp. 407-410.
C. Auth, et al., "45nm High-k + Metal Gate Strain-Enchanced Transistors," Symposium on VLSI Technology Digest of Technical Papers, 2008, pp. 128-129.
C. H. Jan, et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

* cited by examiner

*Primary Examiner* — Evan Pert
(74) *Attorney, Agent, or Firm* — Venable LLP; Michael A. Sartori; Yao Wang

(57) ABSTRACT

A semiconductor device comprising: a first single crystal silicon layer comprising first transistors, first alignment marks, and at least one metal layer overlying the first single crystal silicon layer, wherein the at least one metal layer comprises copper or aluminum more than other materials; and a second single crystal silicon layer overlying the at least one metal layers; wherein the second single crystal silicon layer comprises a plurality of second transistors arranged in substantially parallel bands wherein each of a plurality of the bands comprises a portion of the second transistors along an axis in a repeating pattern.

14 Claims, 276 Drawing Sheets

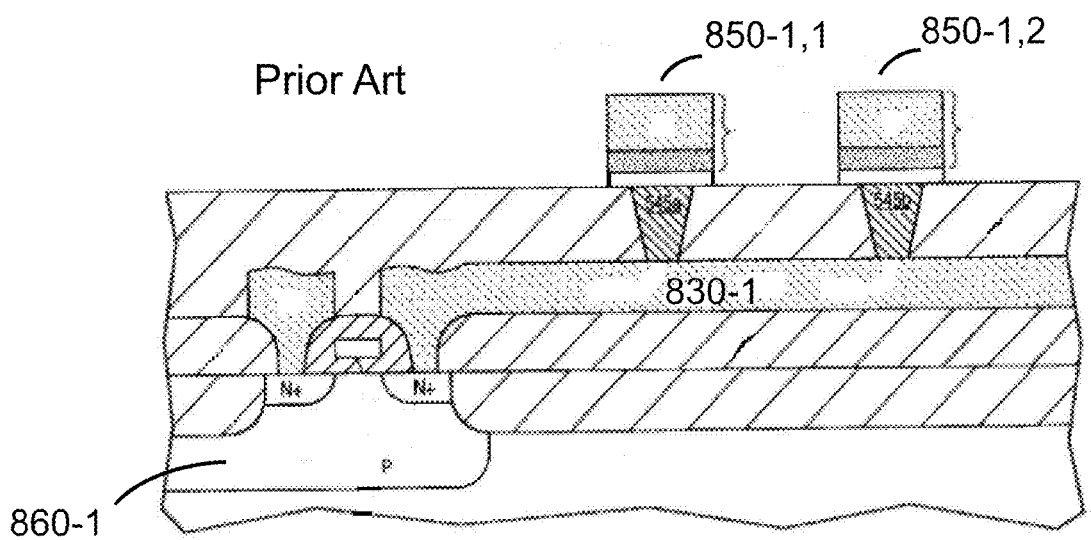
Fig 2 - prior art 1208A
1206A
1204A
1202A 1206B
1204B
1202B

1202C

1202D 1206E   1208E  1204E

1202E

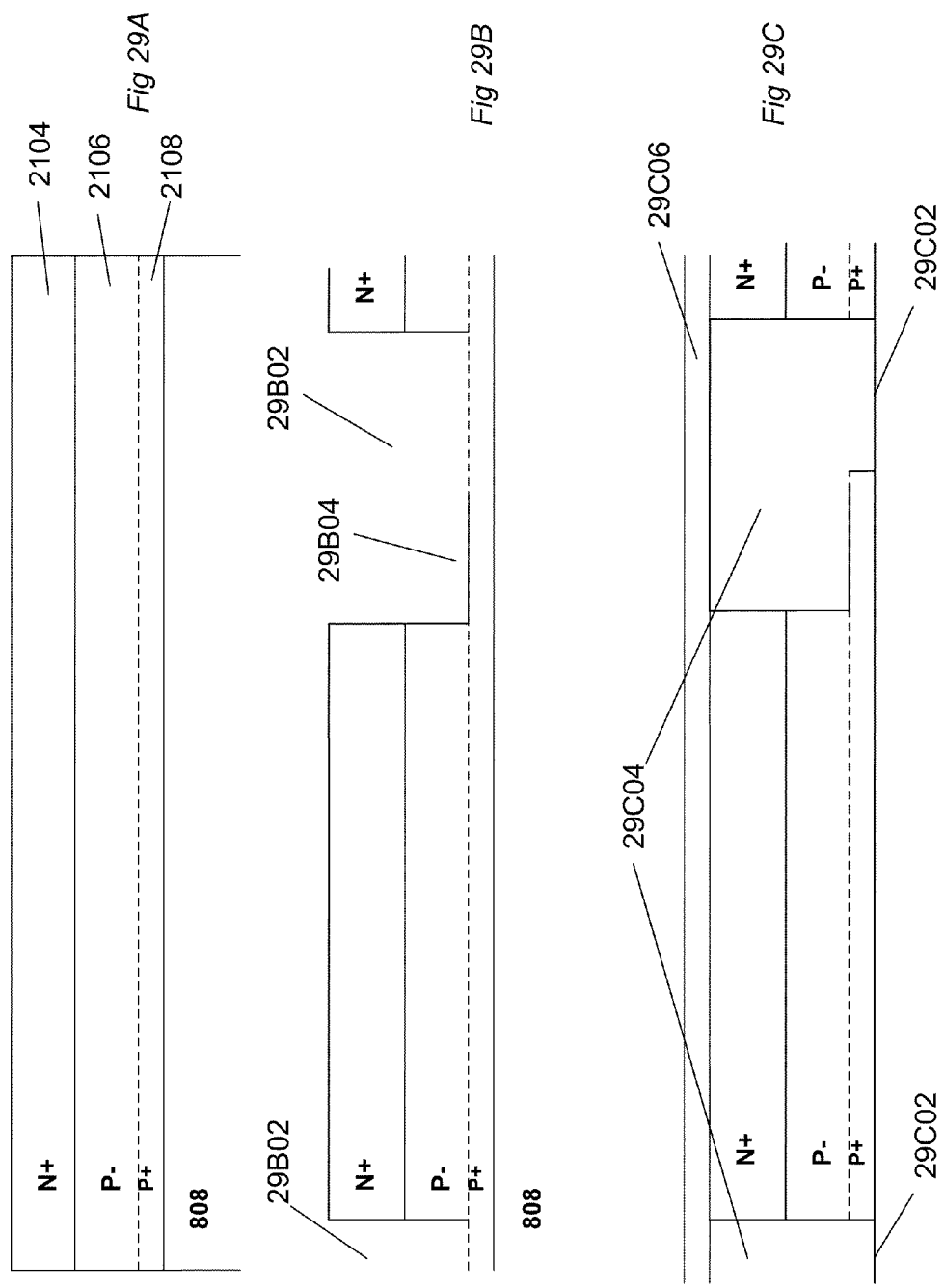

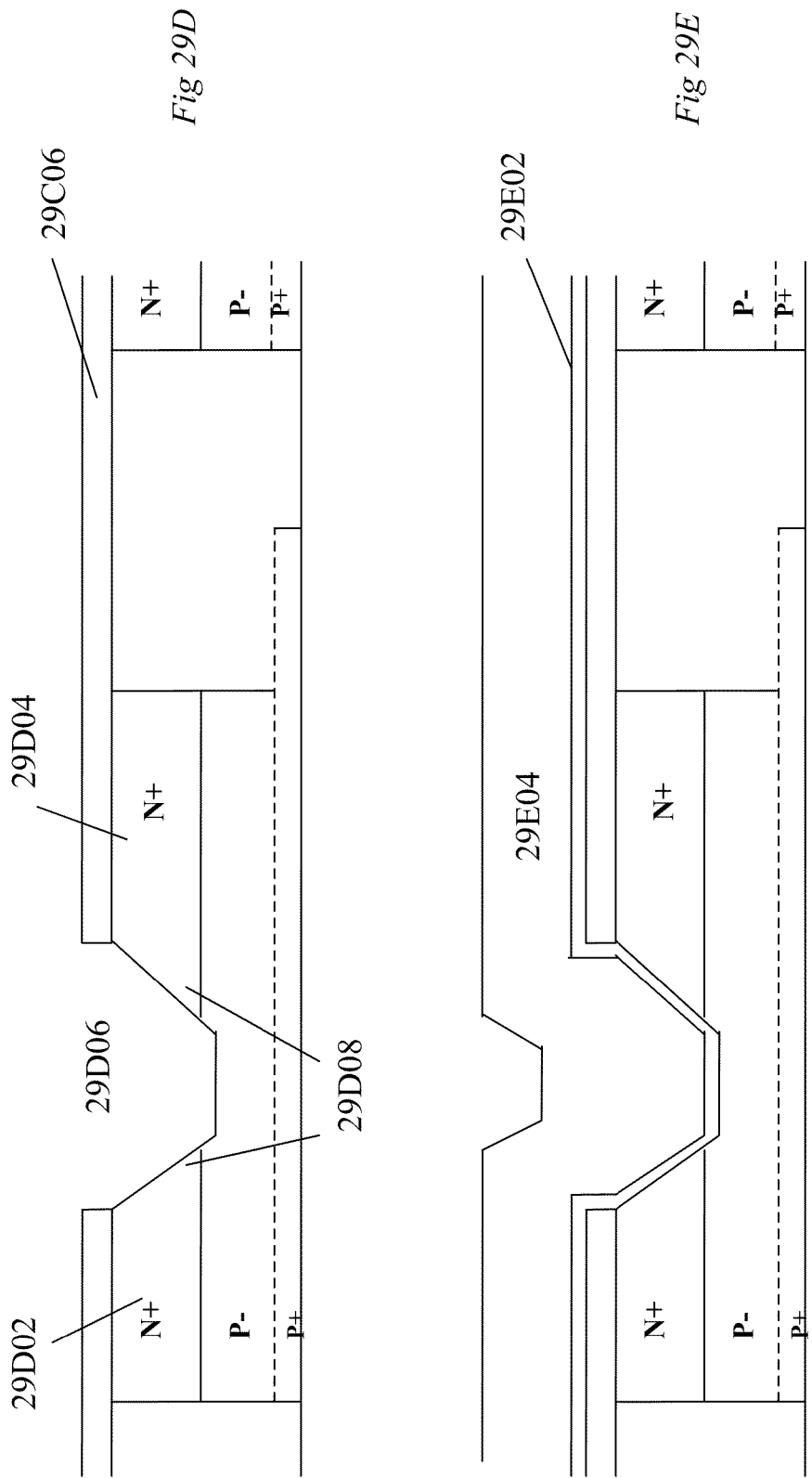

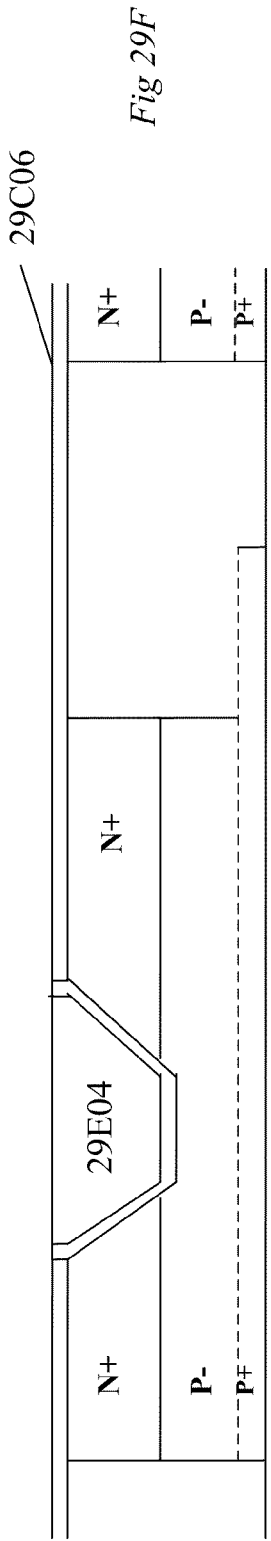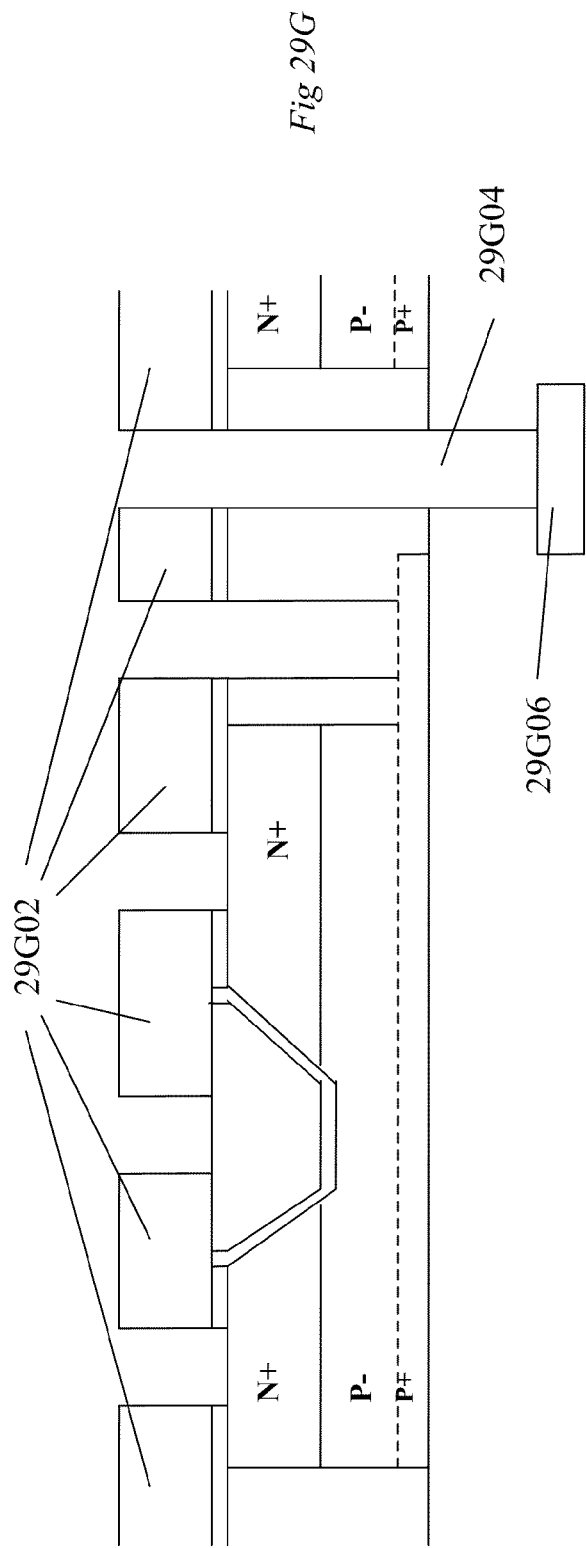

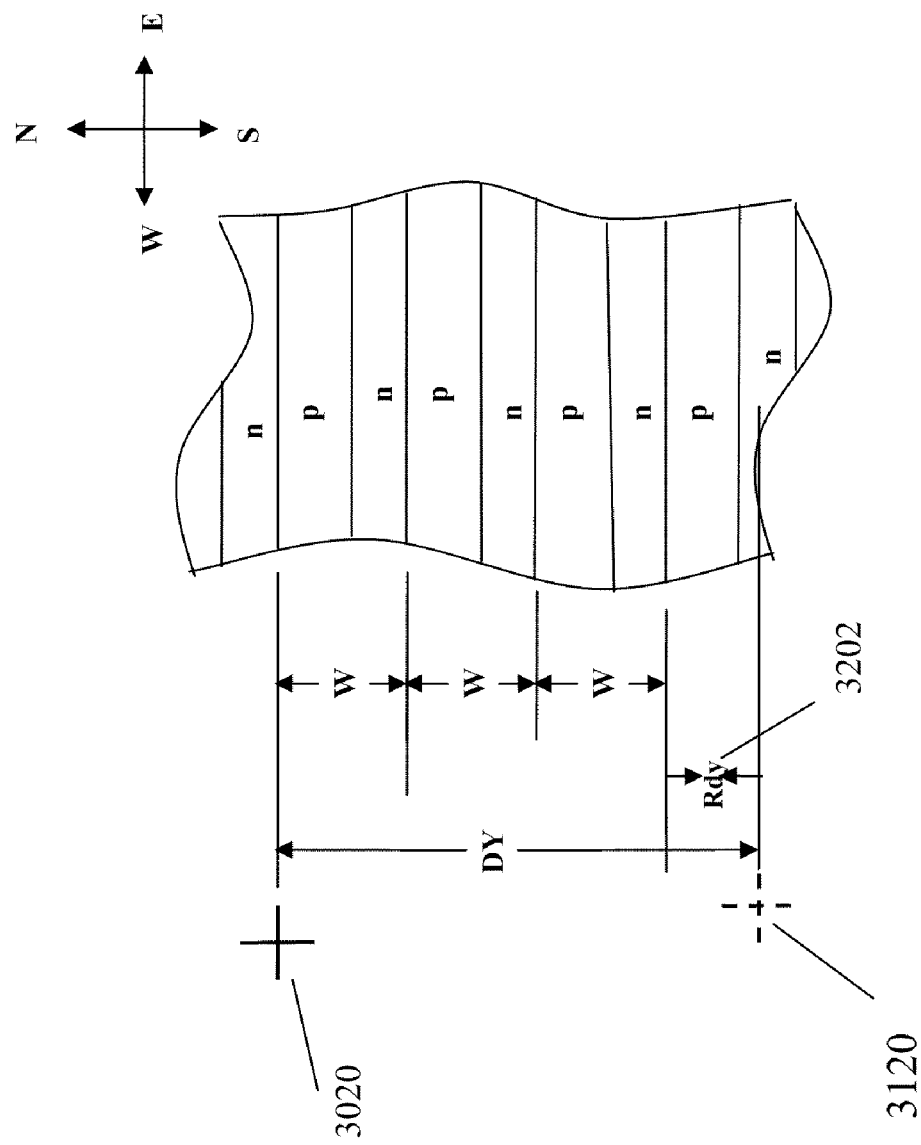

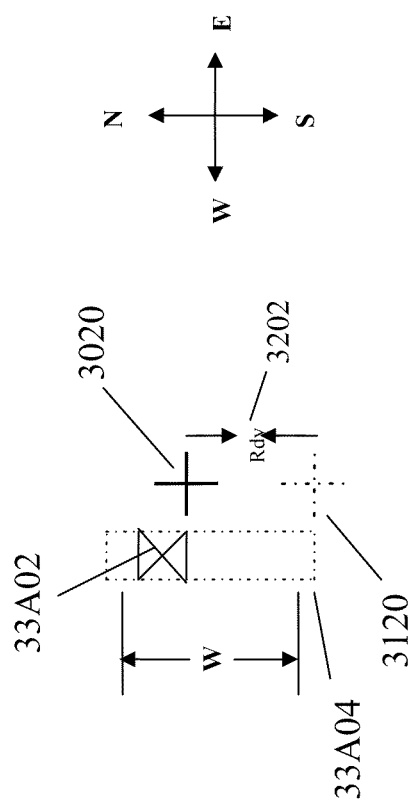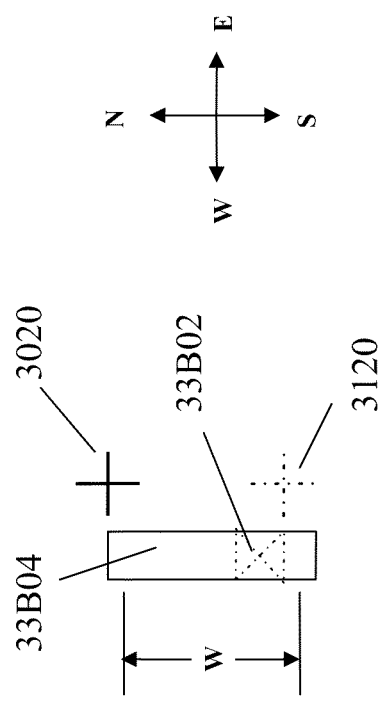
Fig 33A
Fig 33B

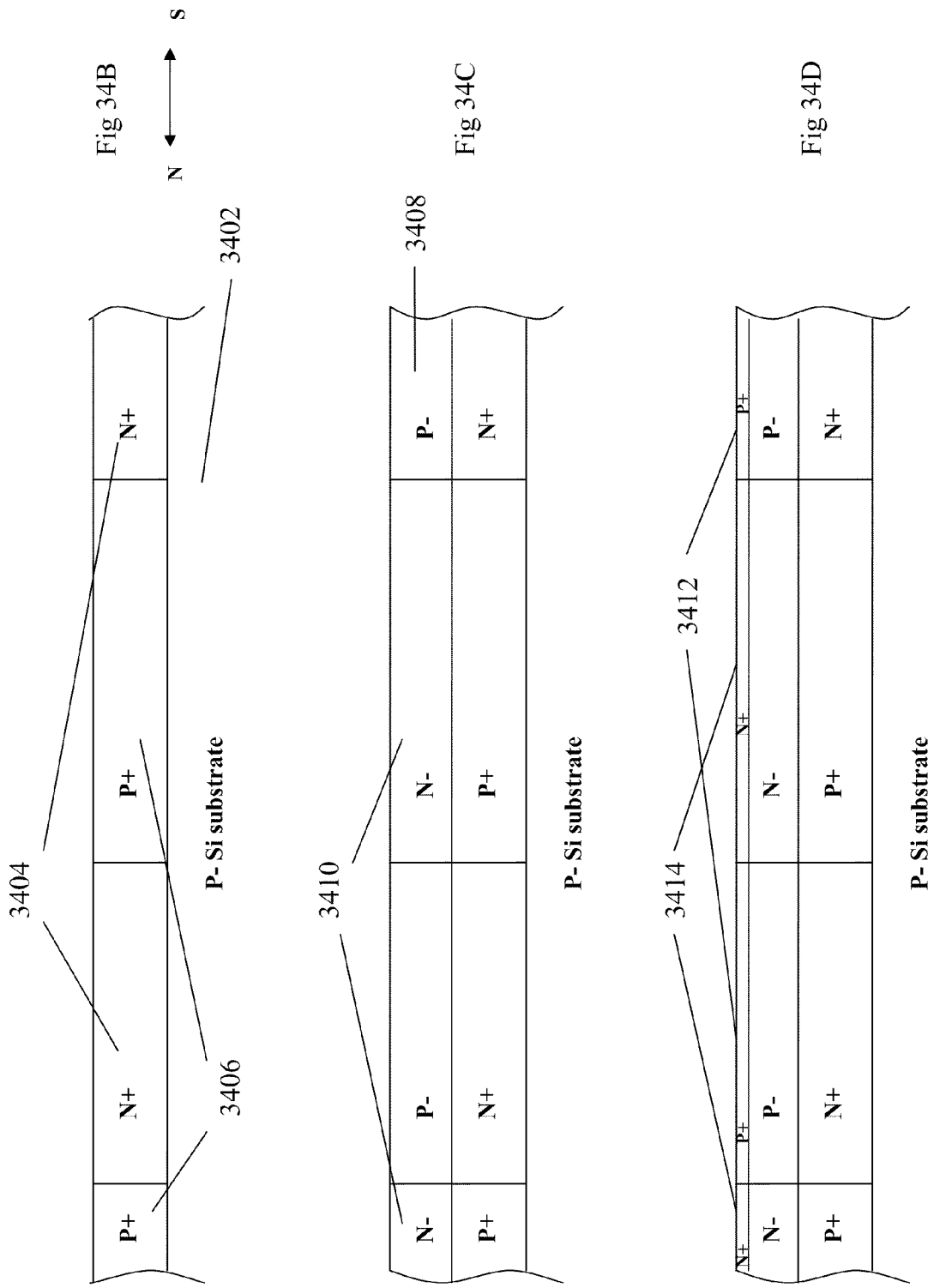

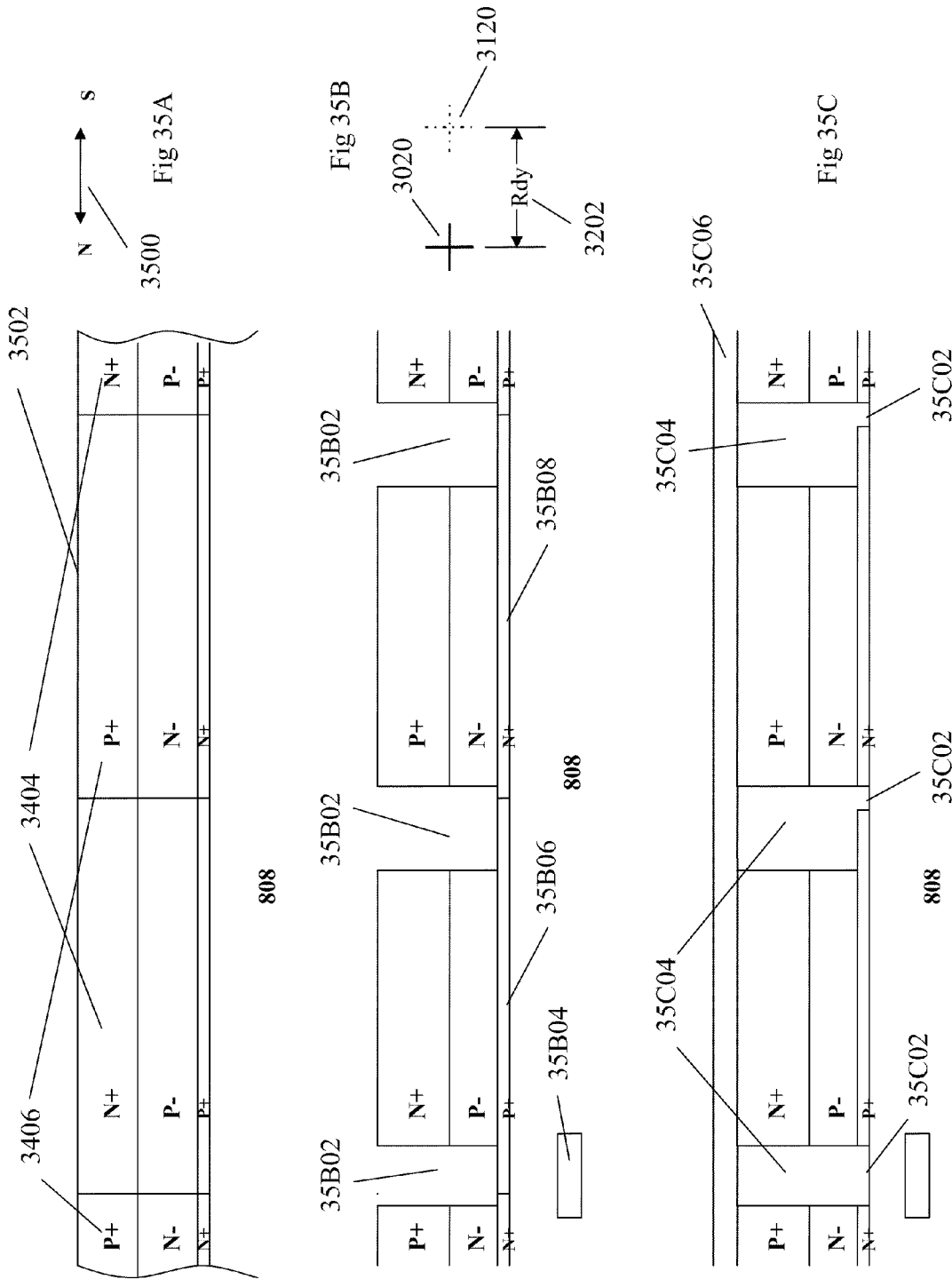

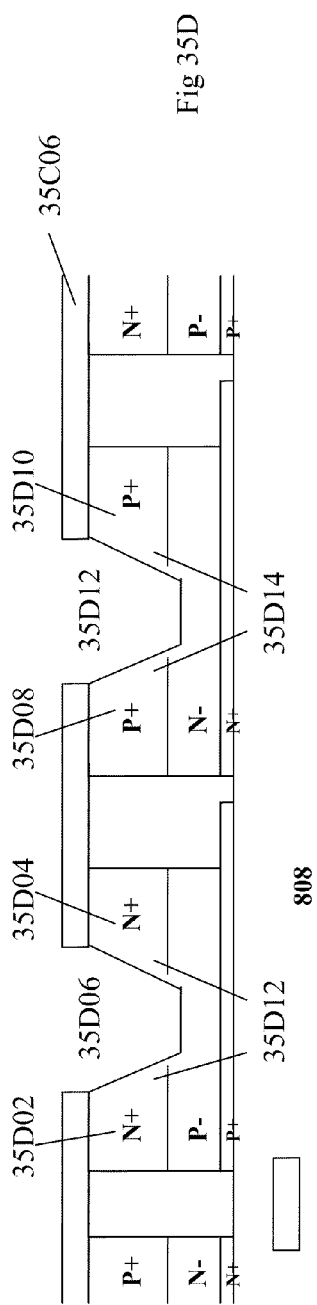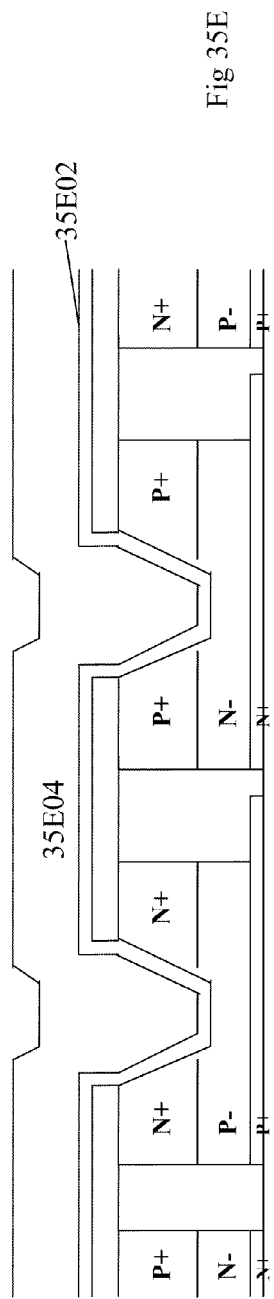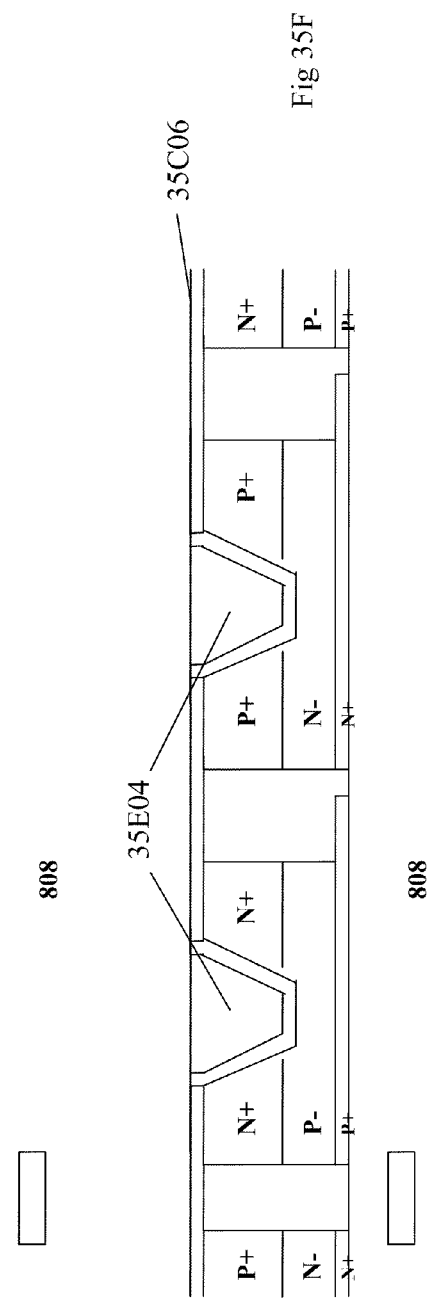

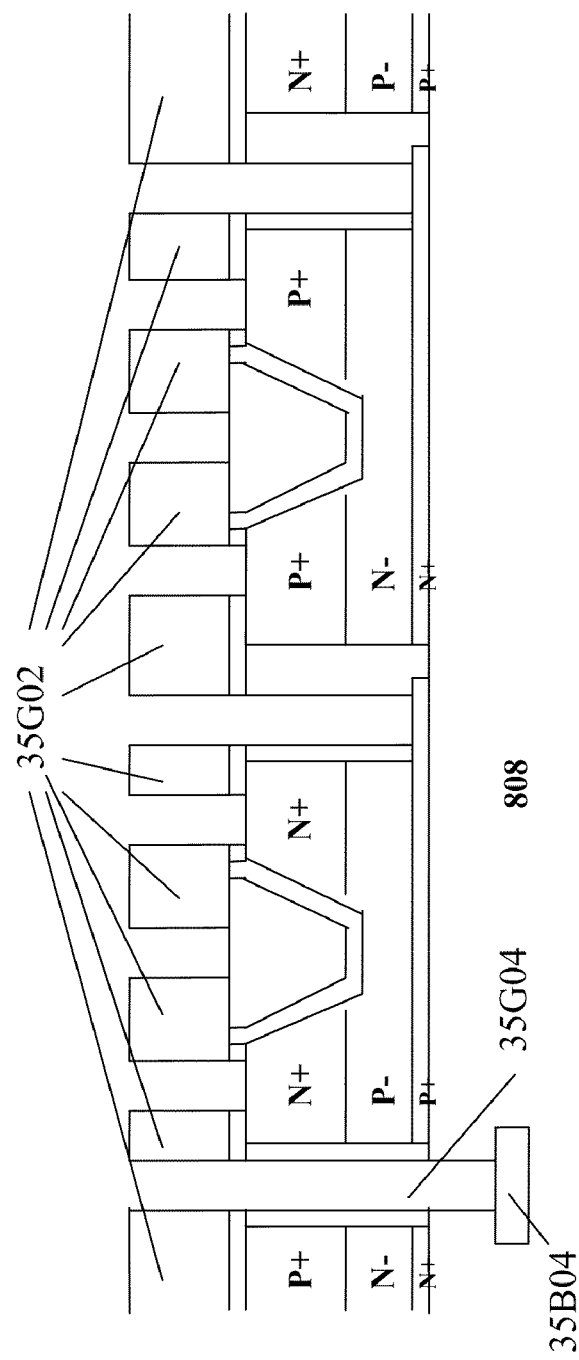

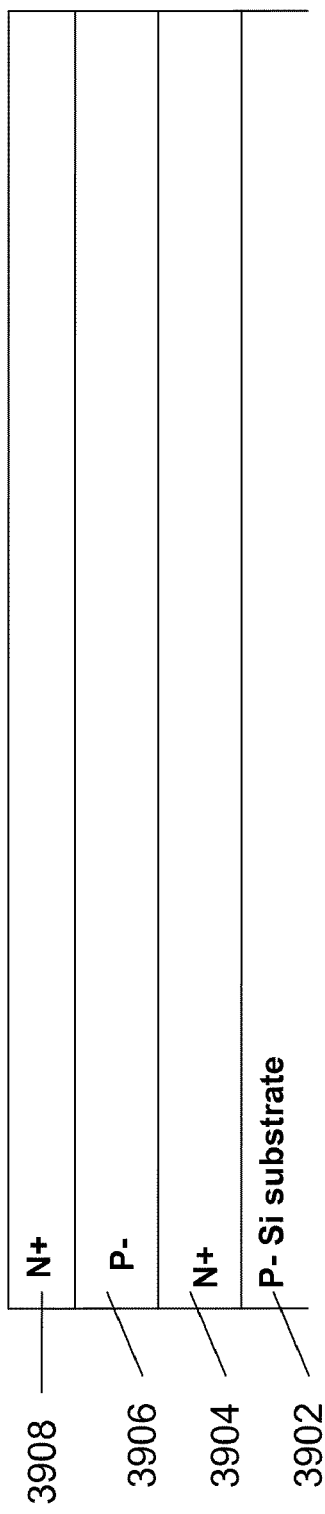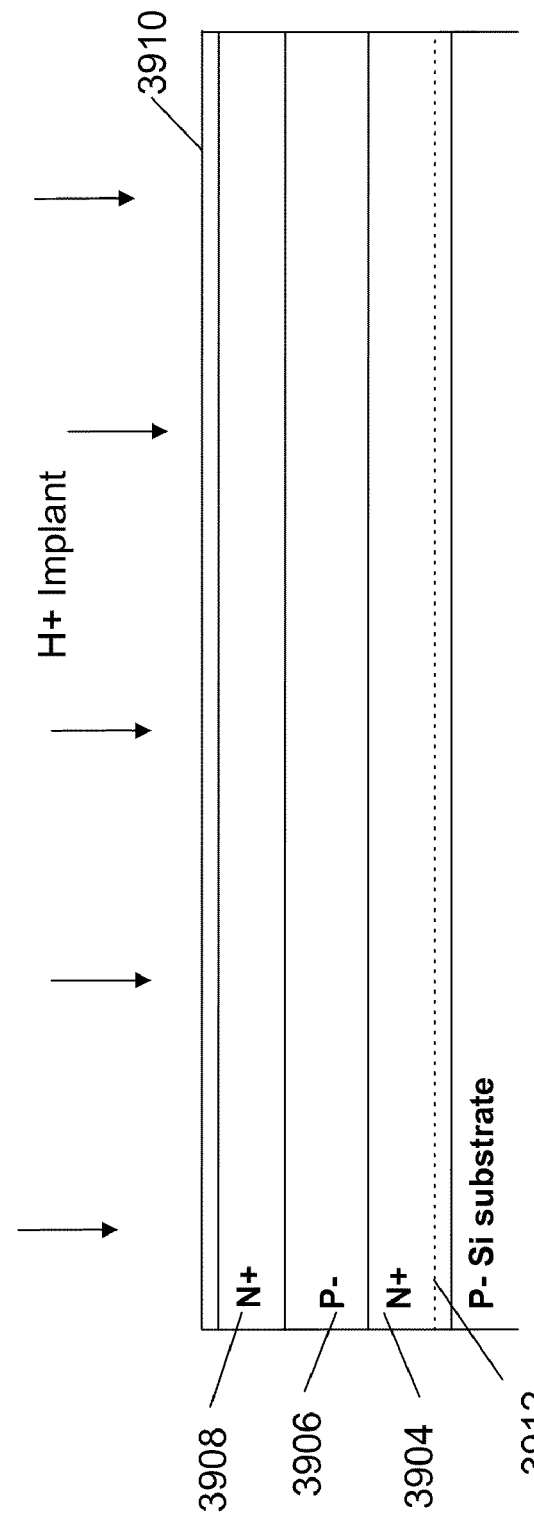
Fig 39A
Fig 39B

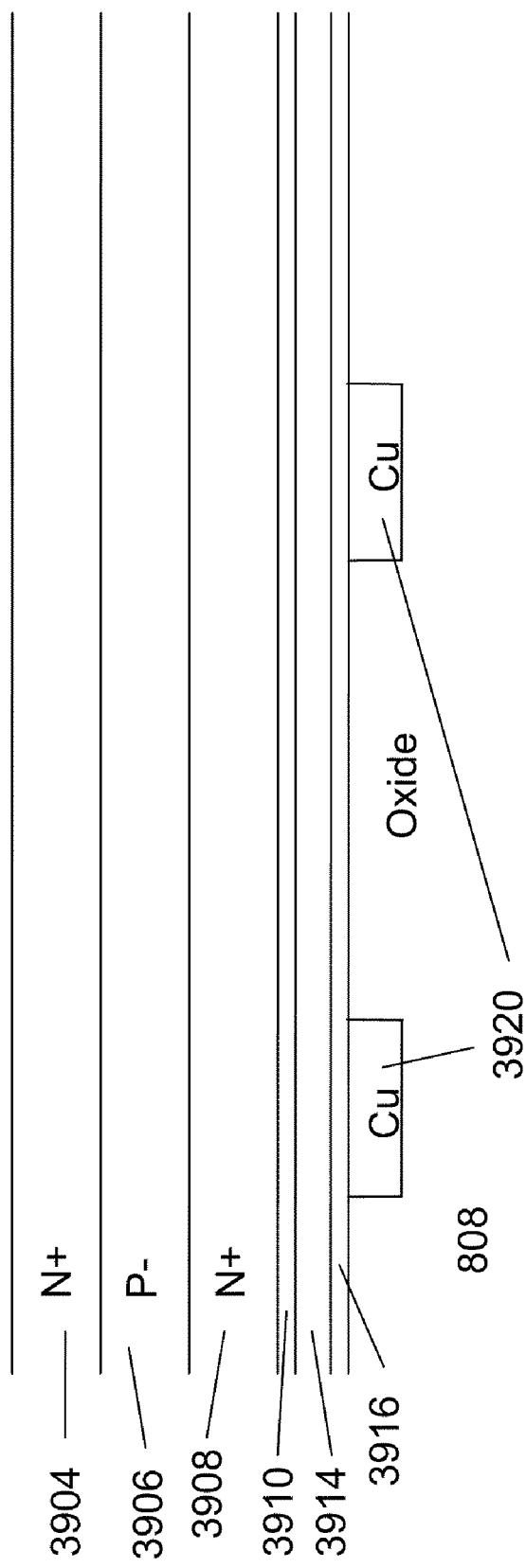

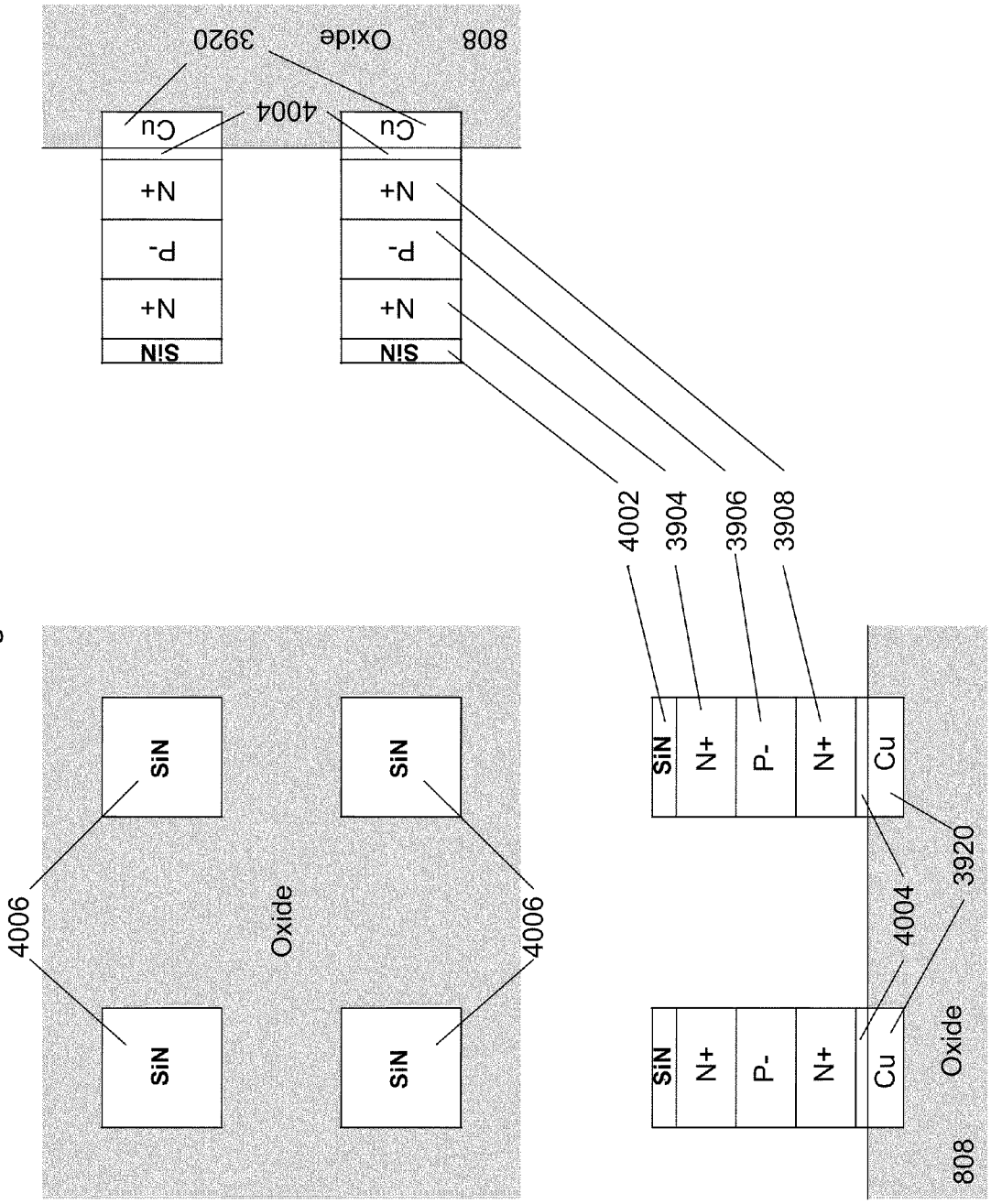

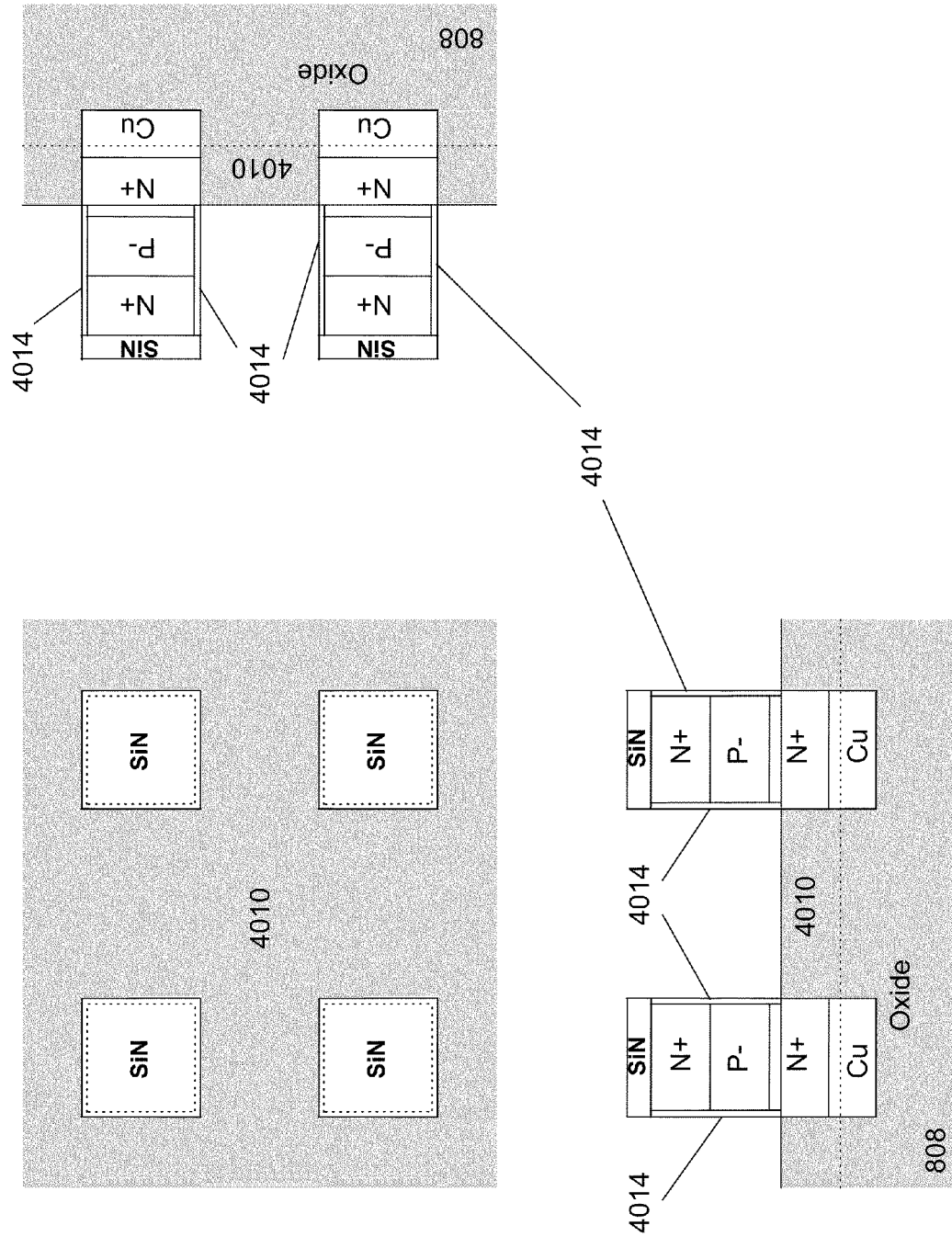

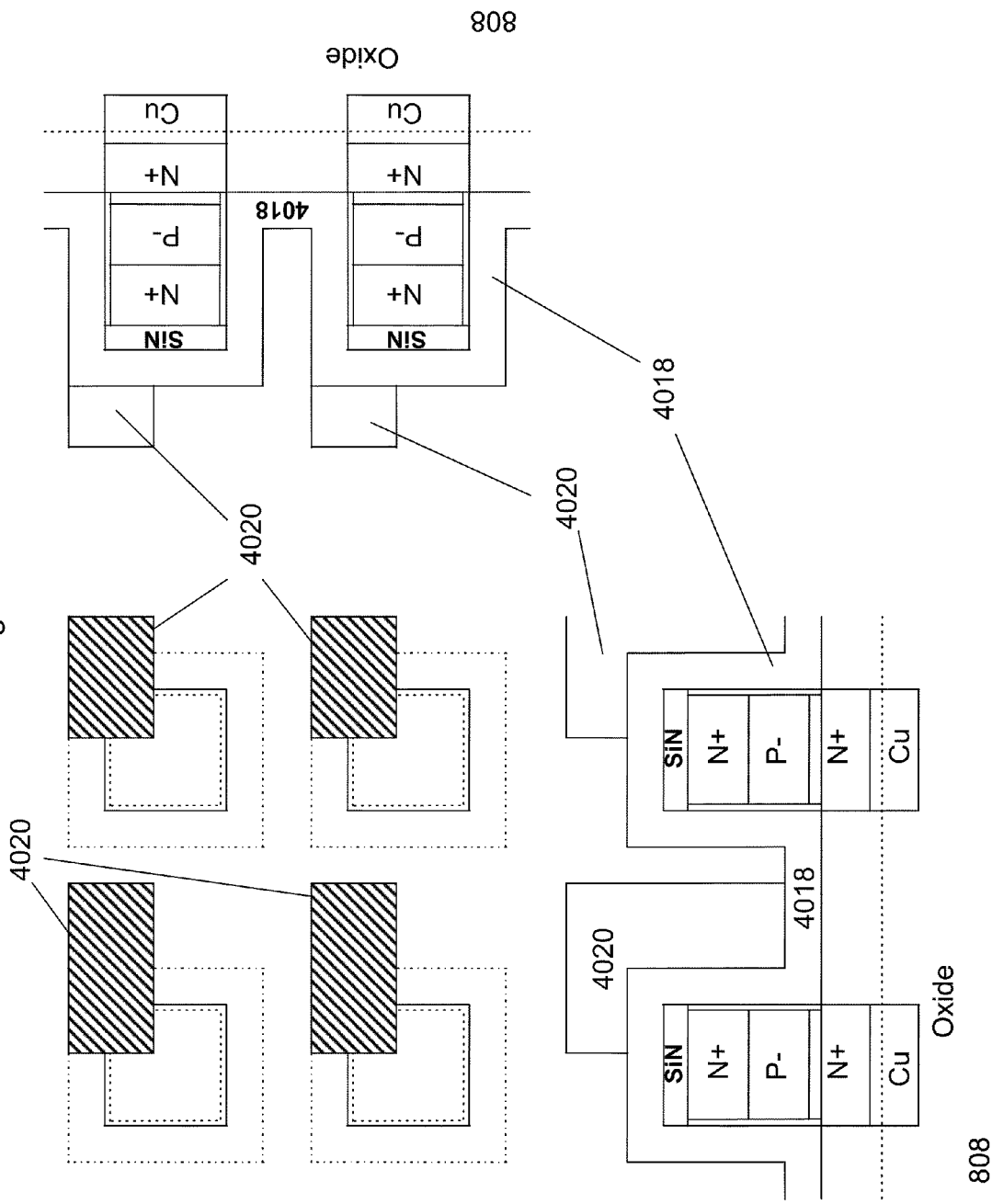

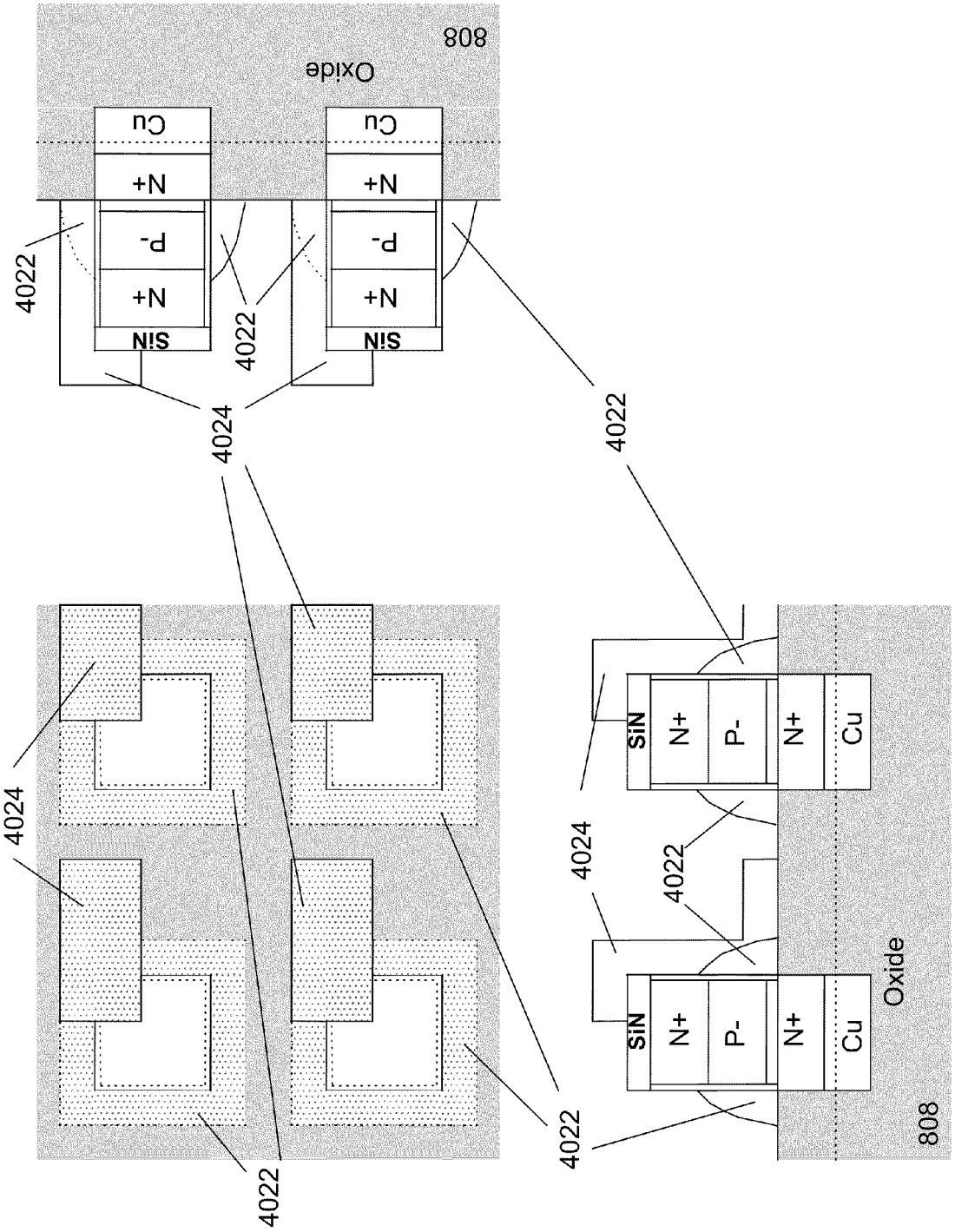

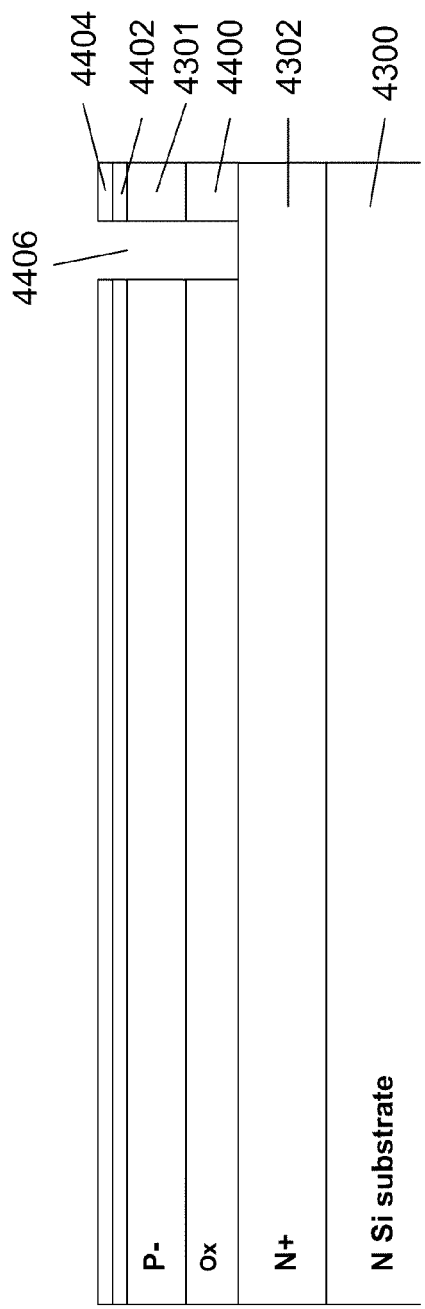
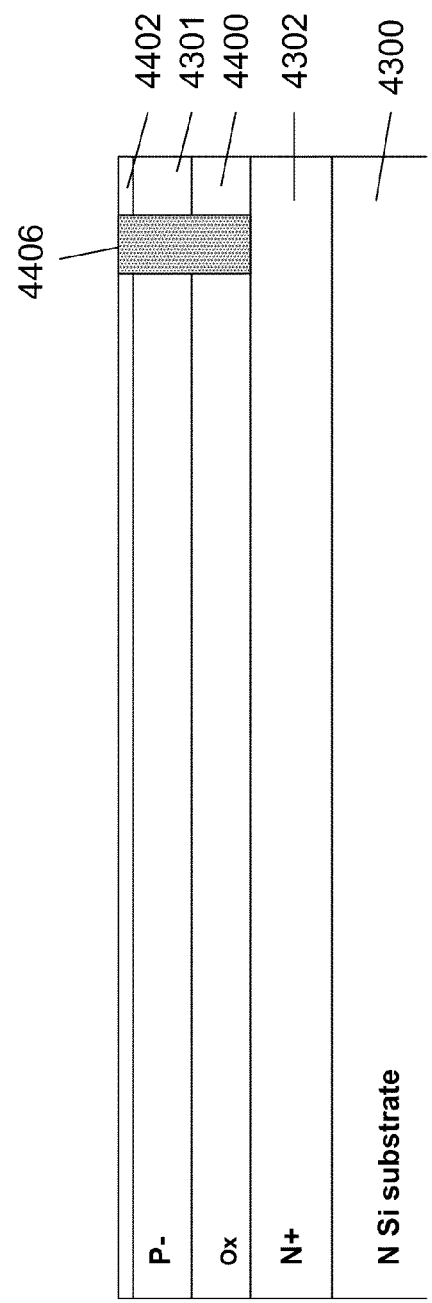

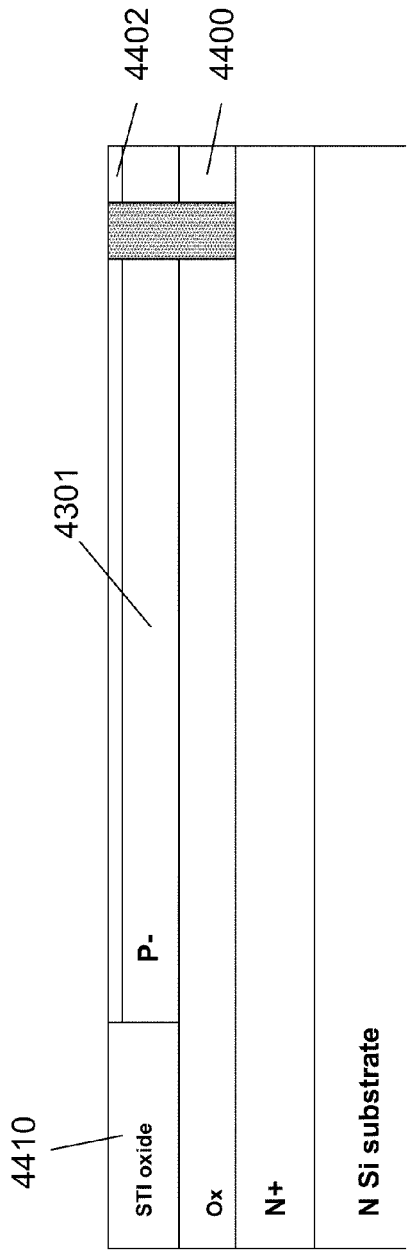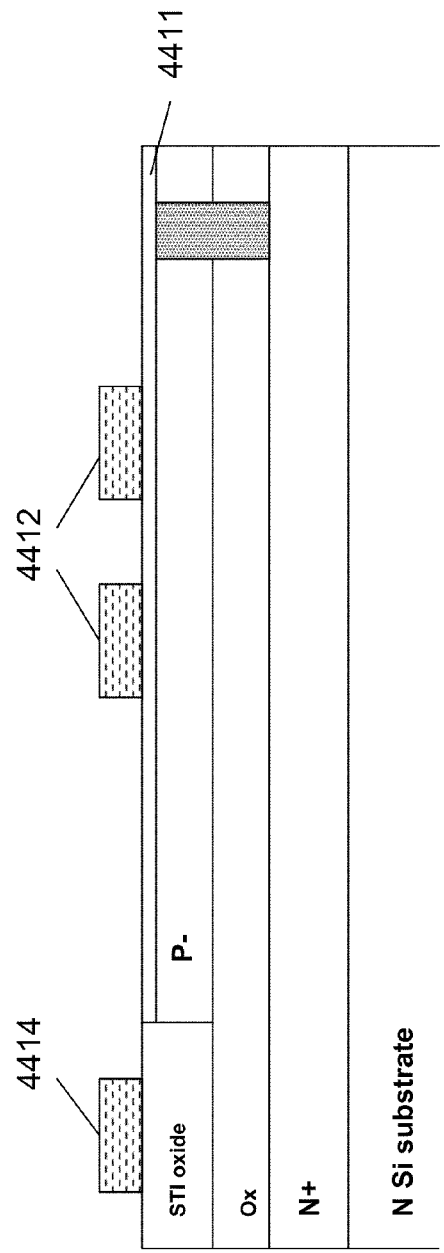

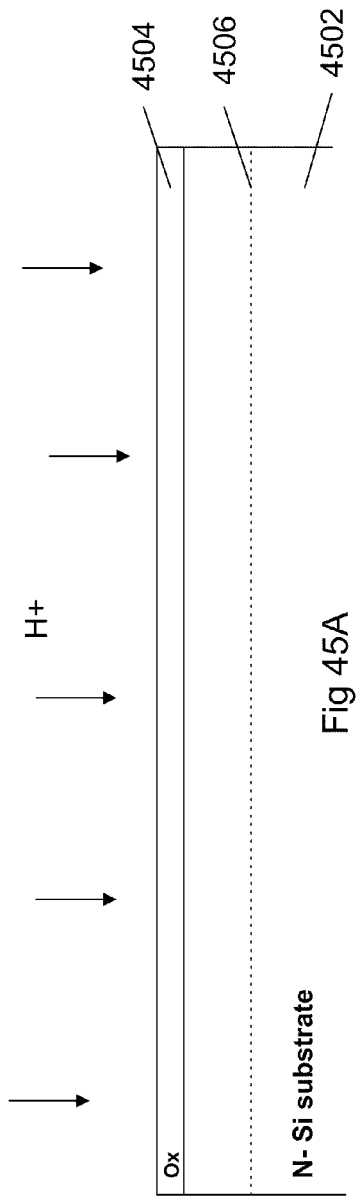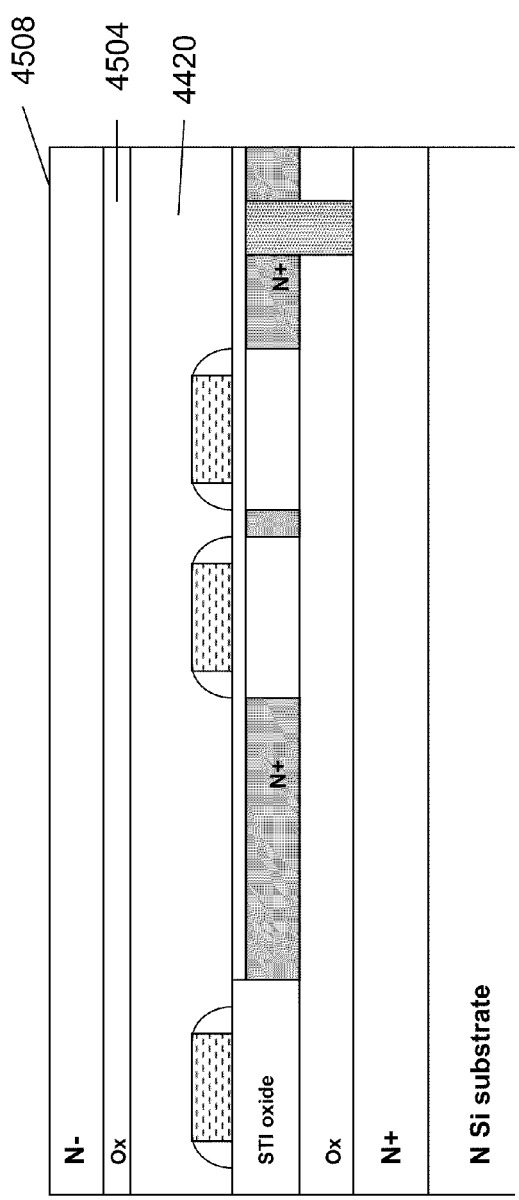

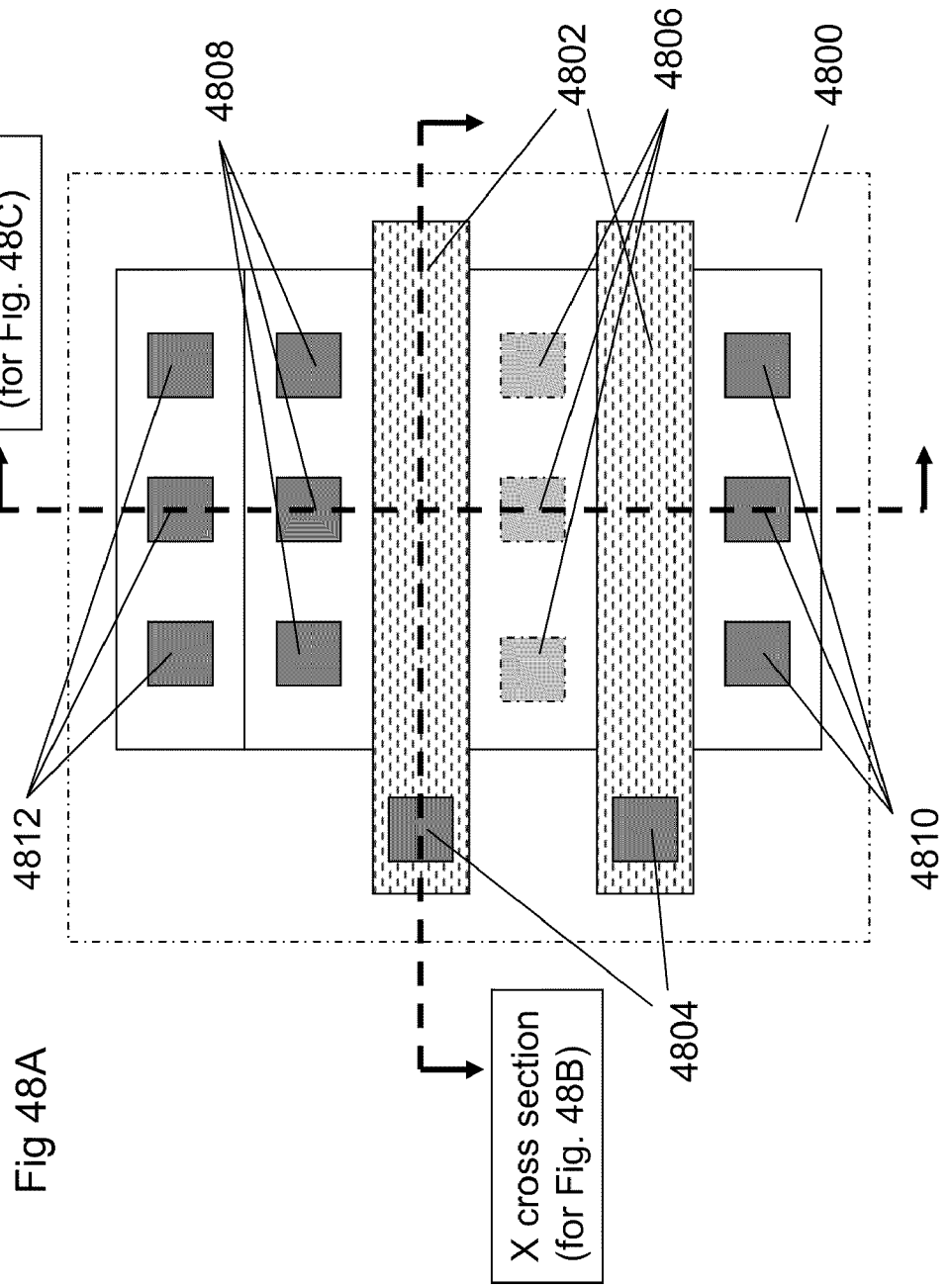

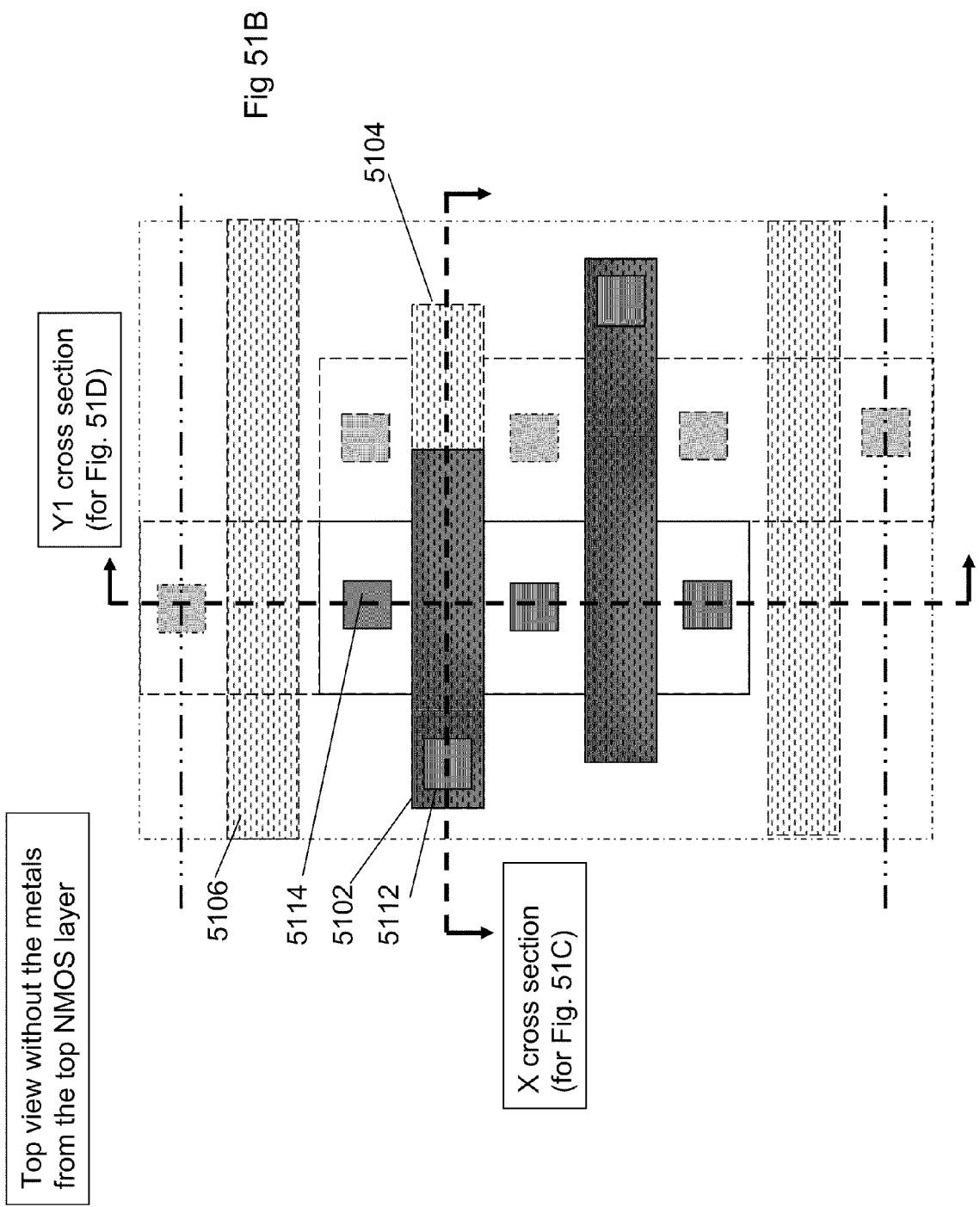

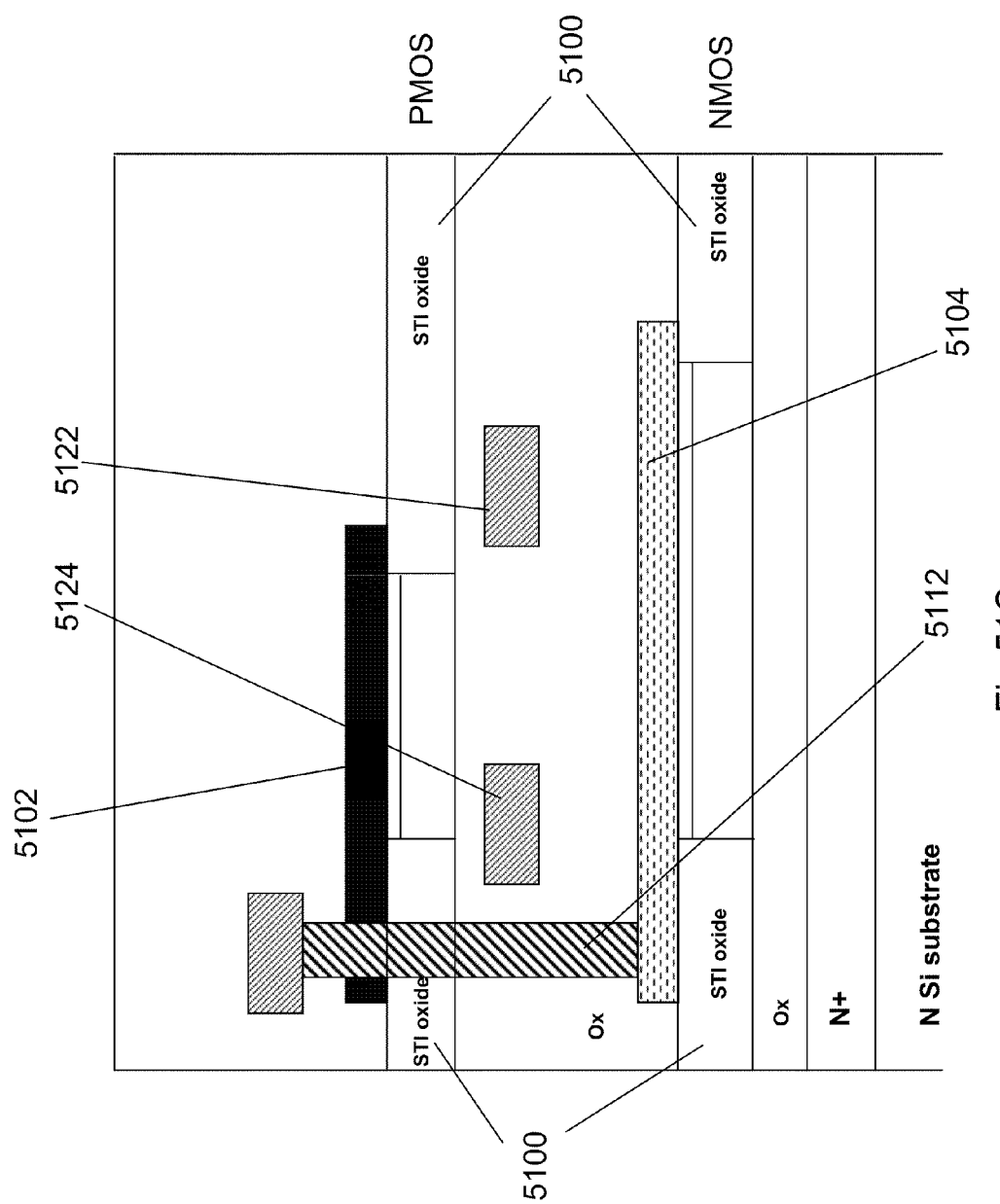

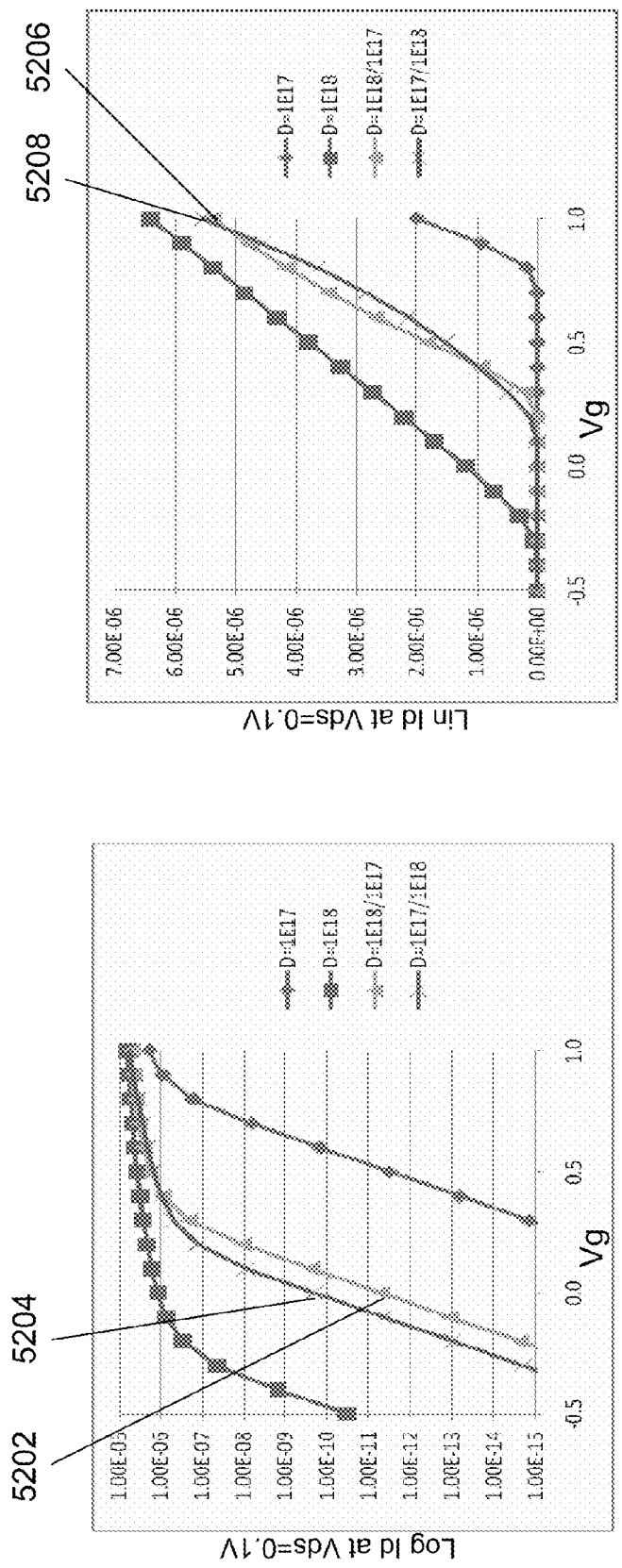

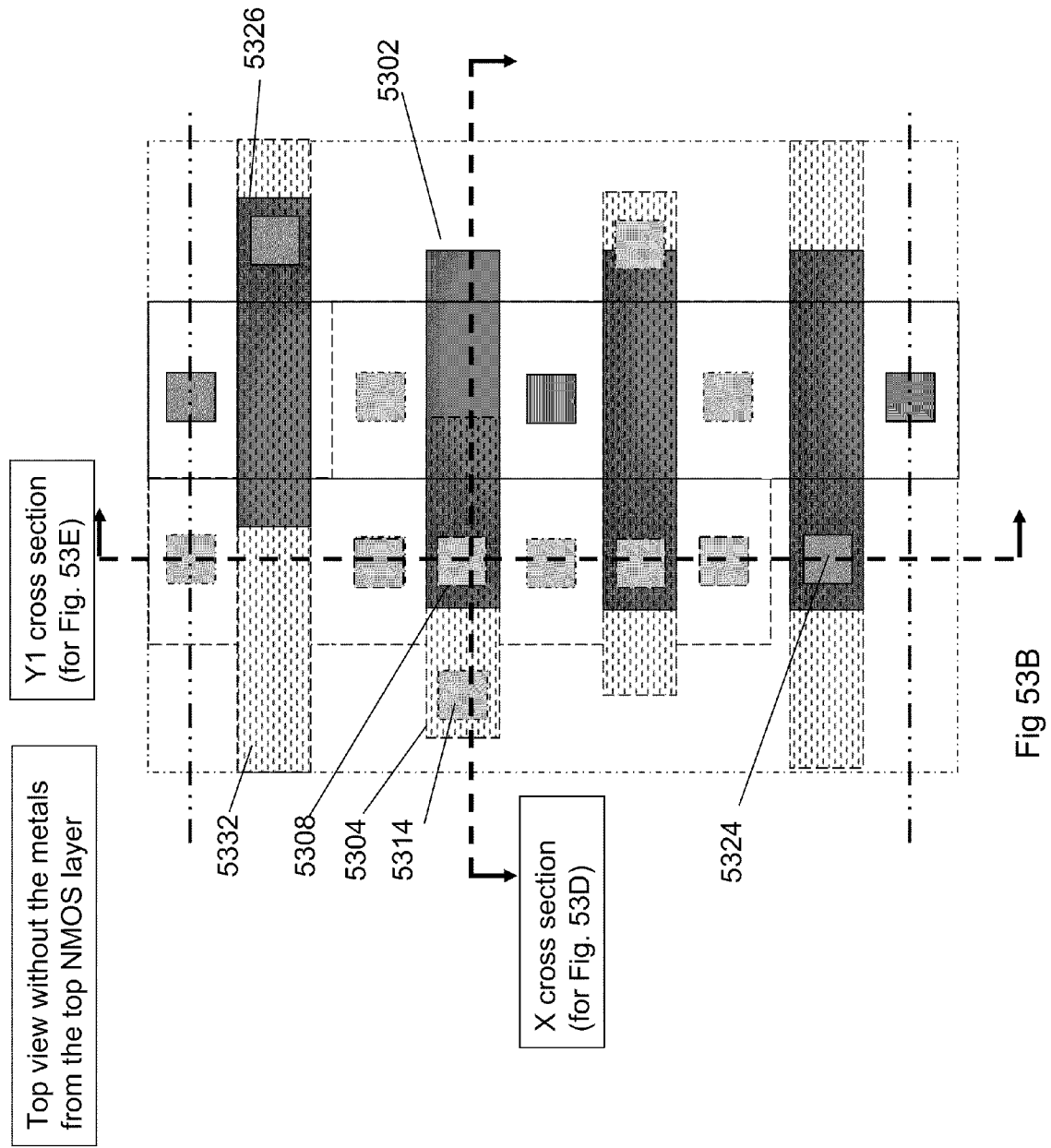

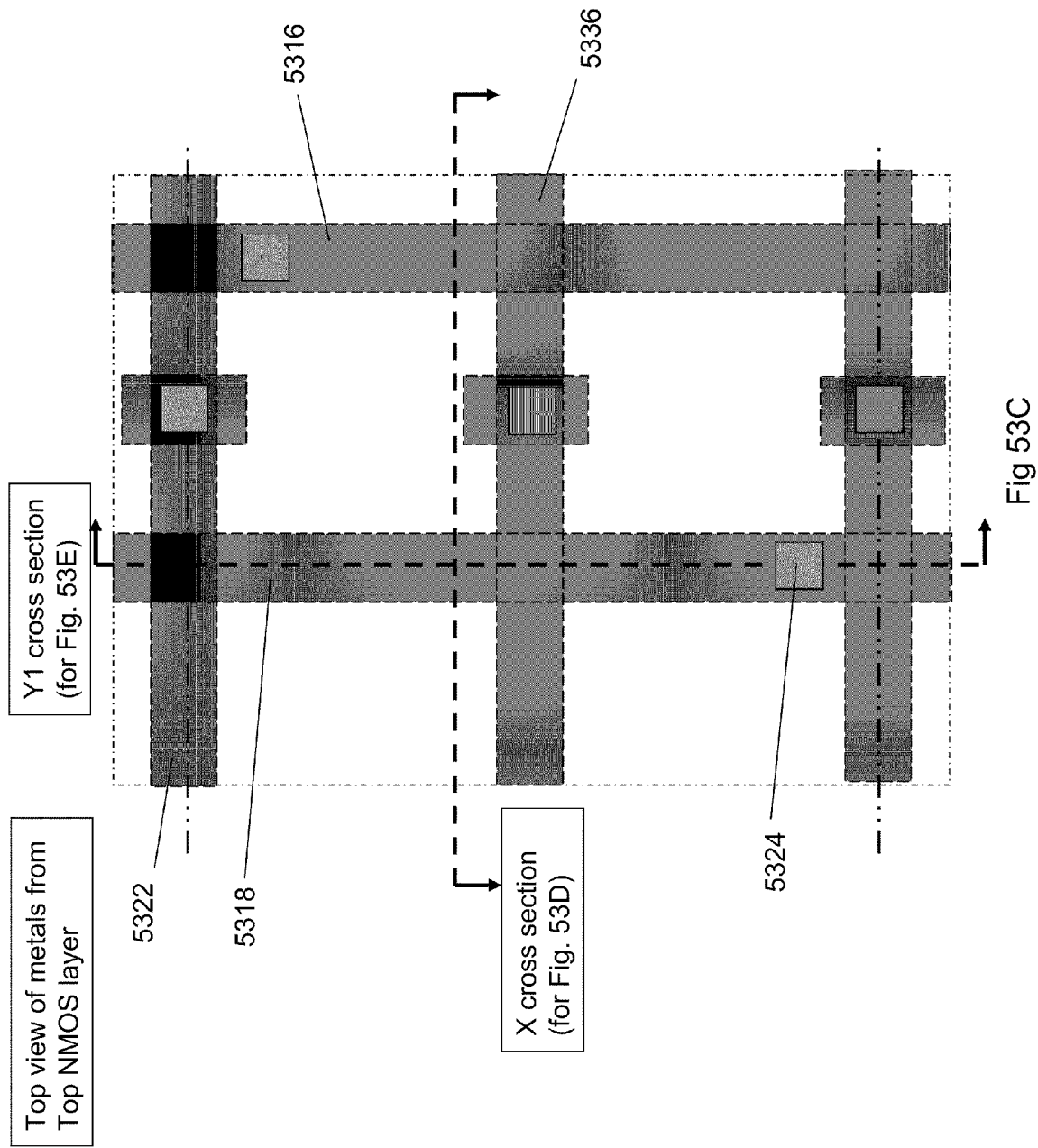

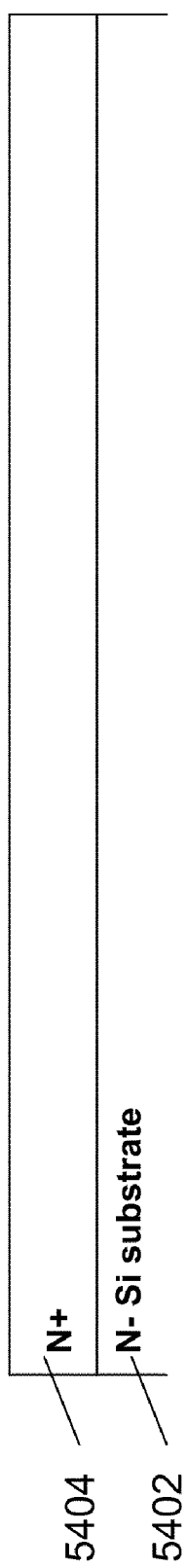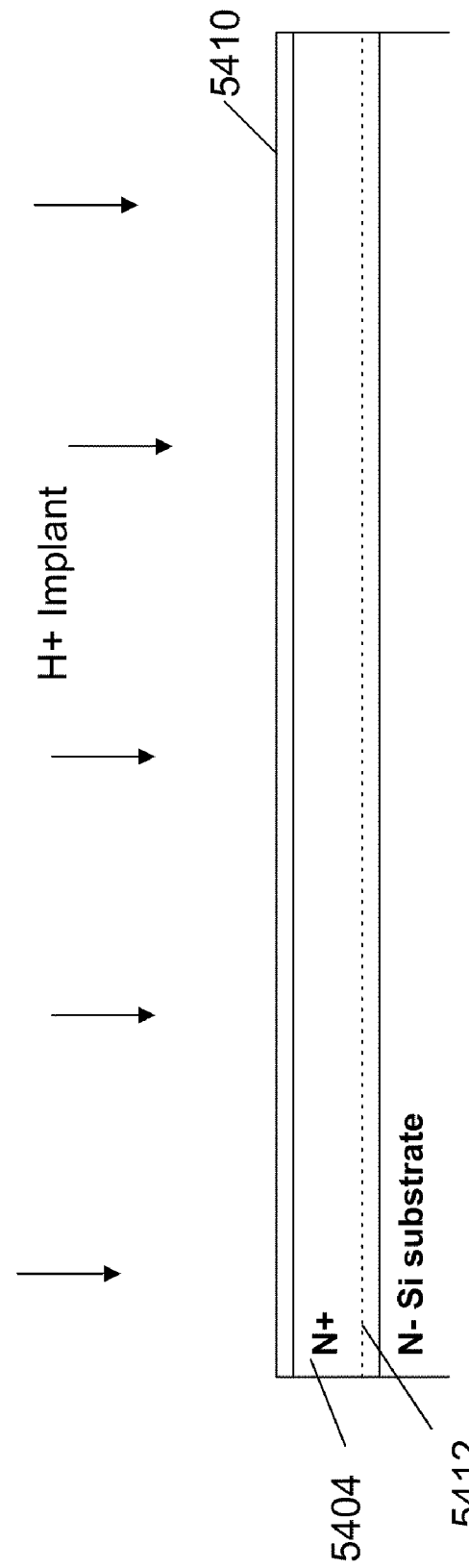

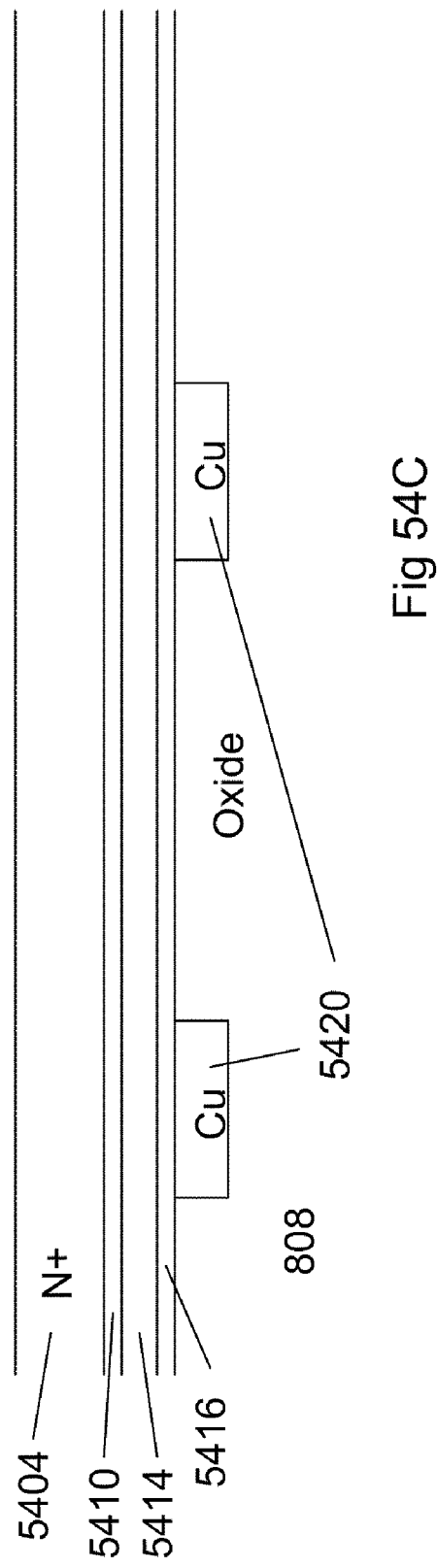

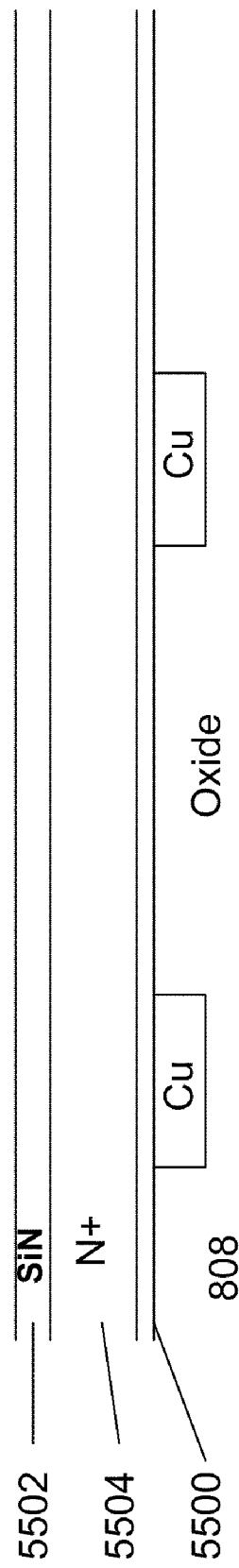

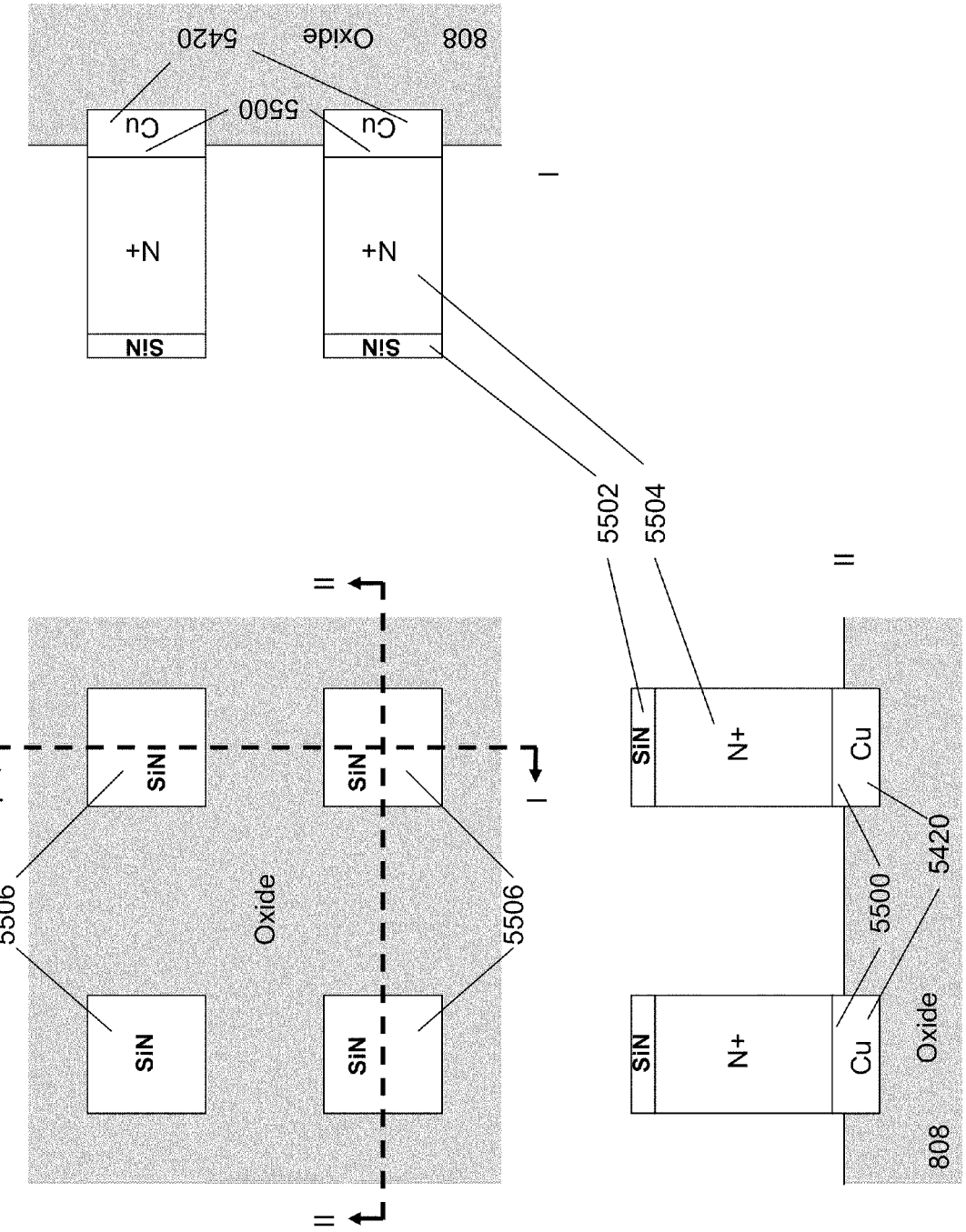

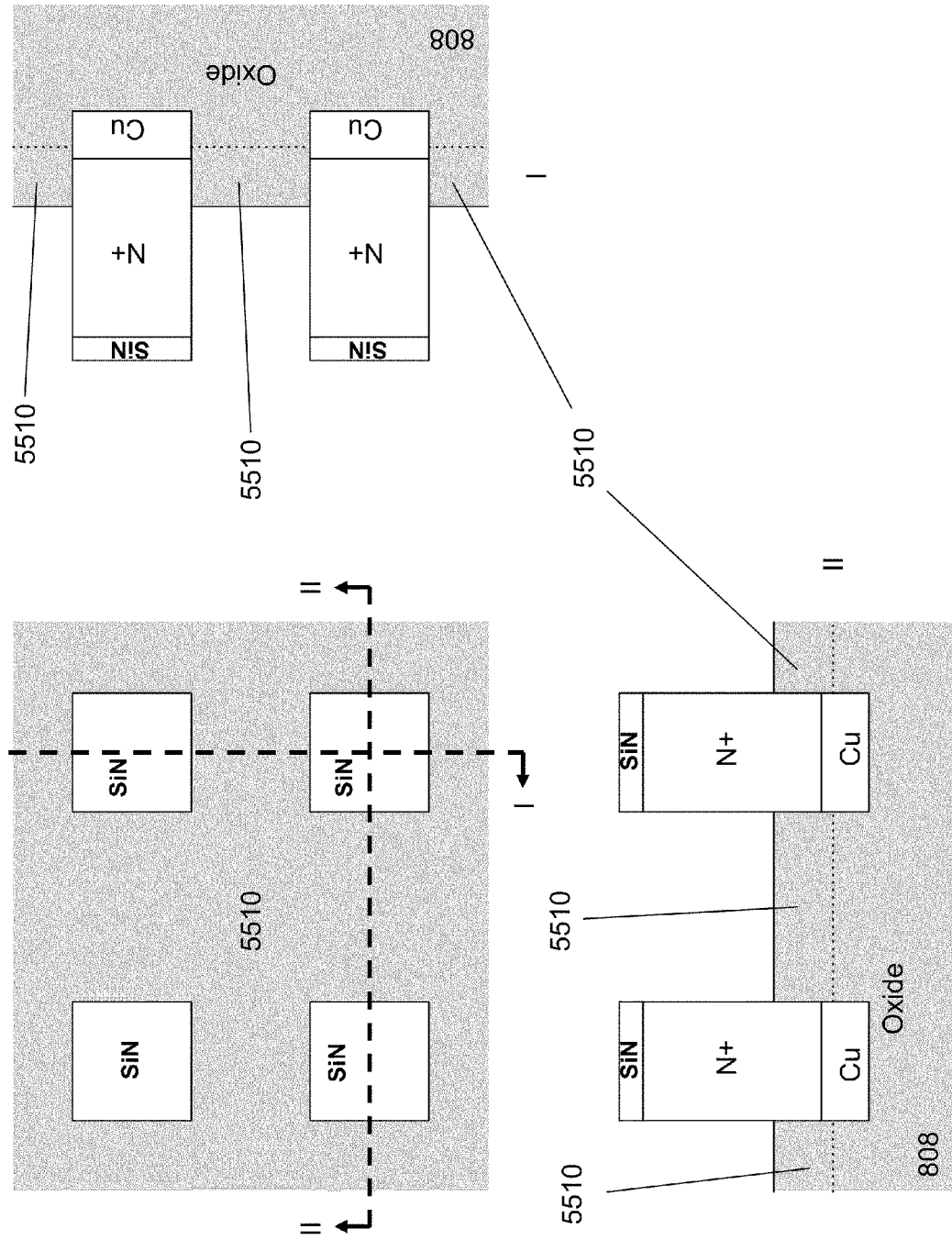

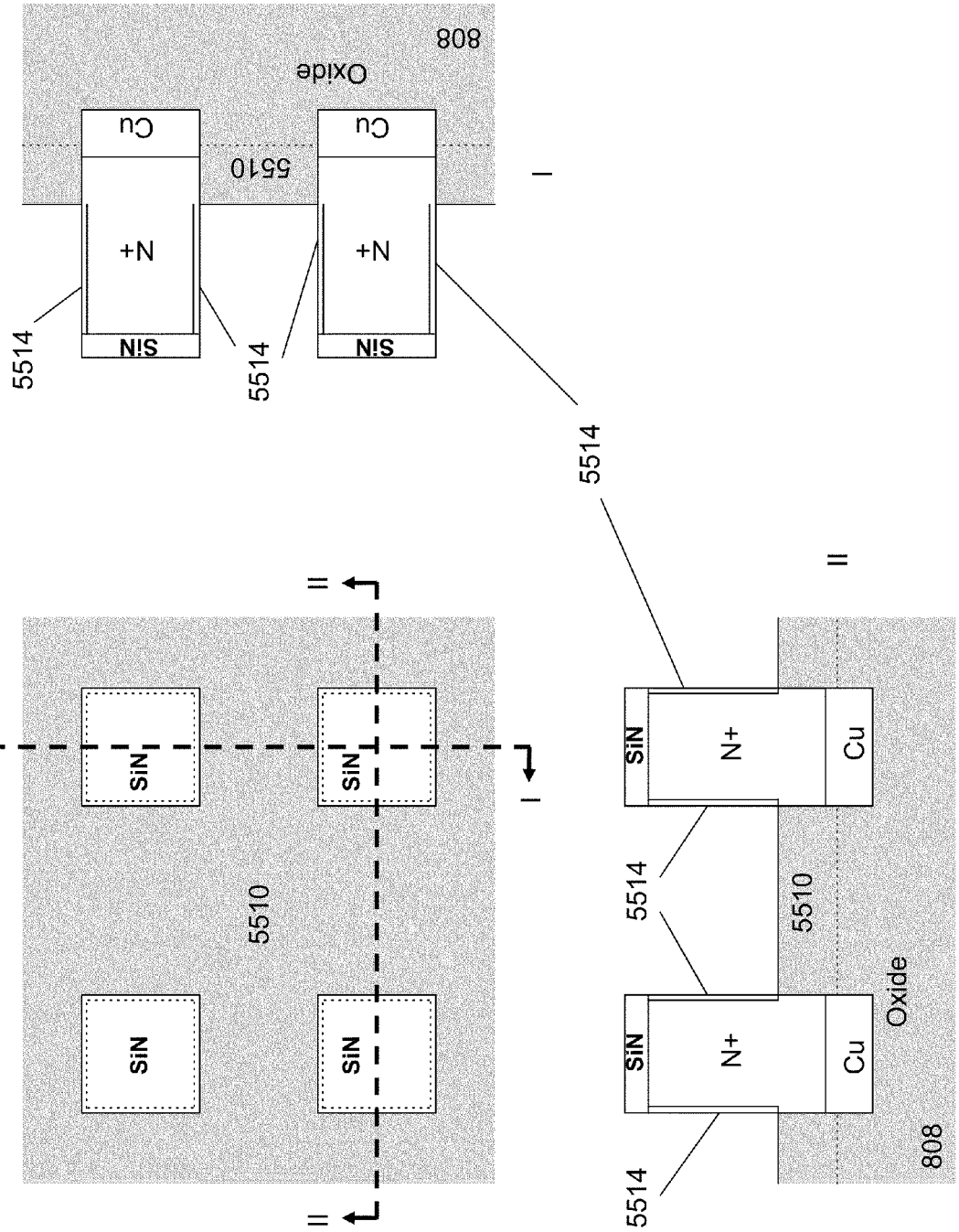

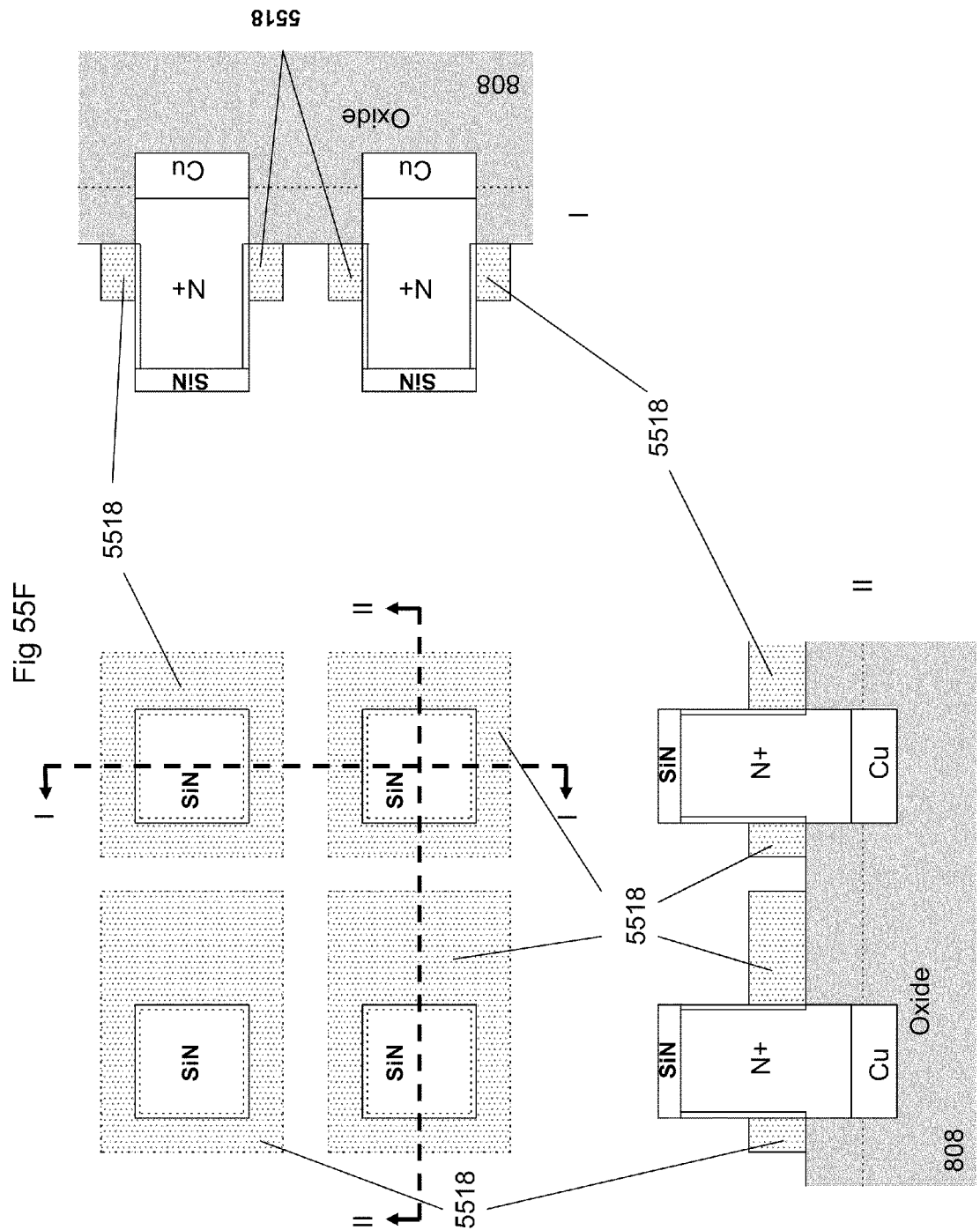

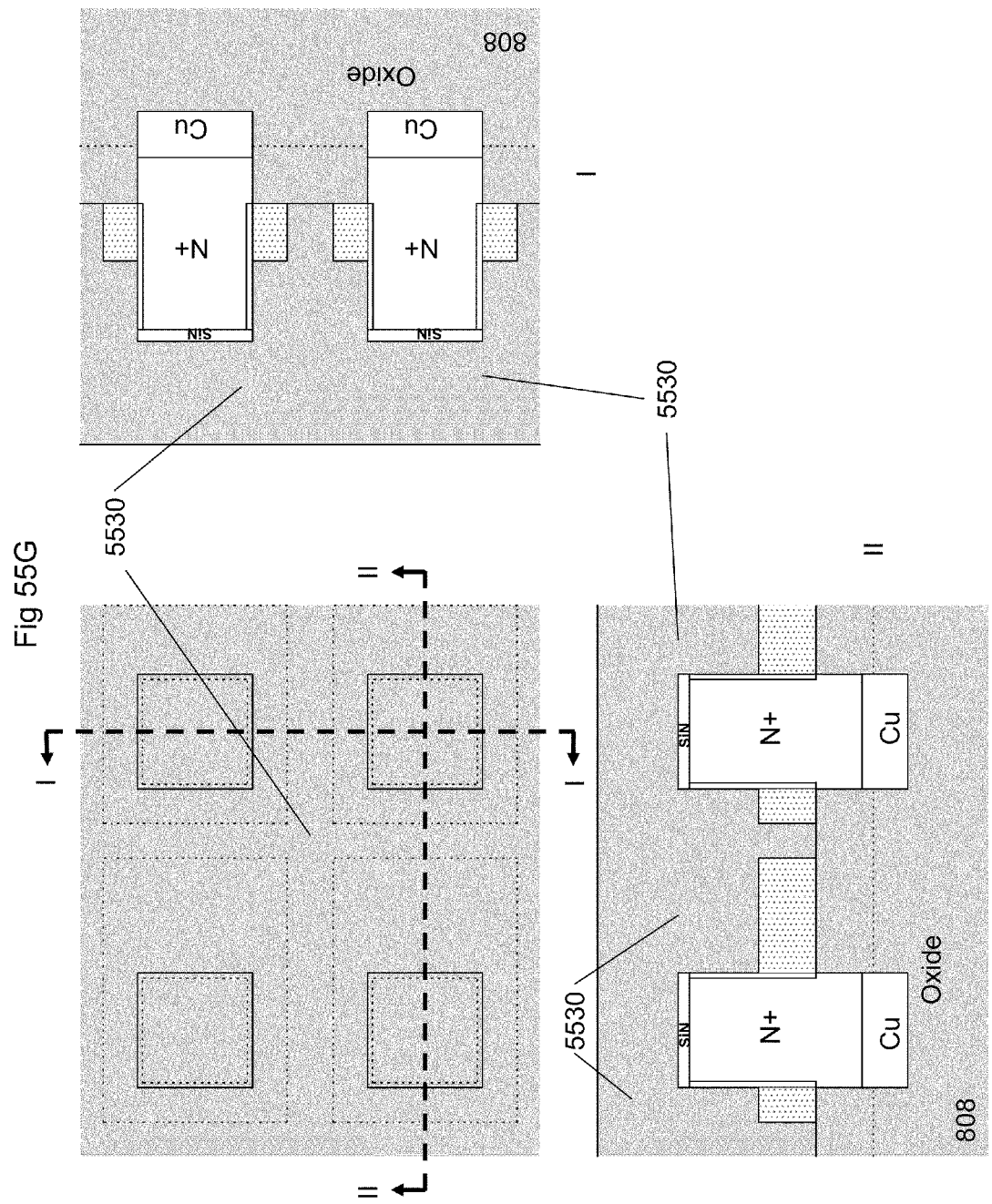

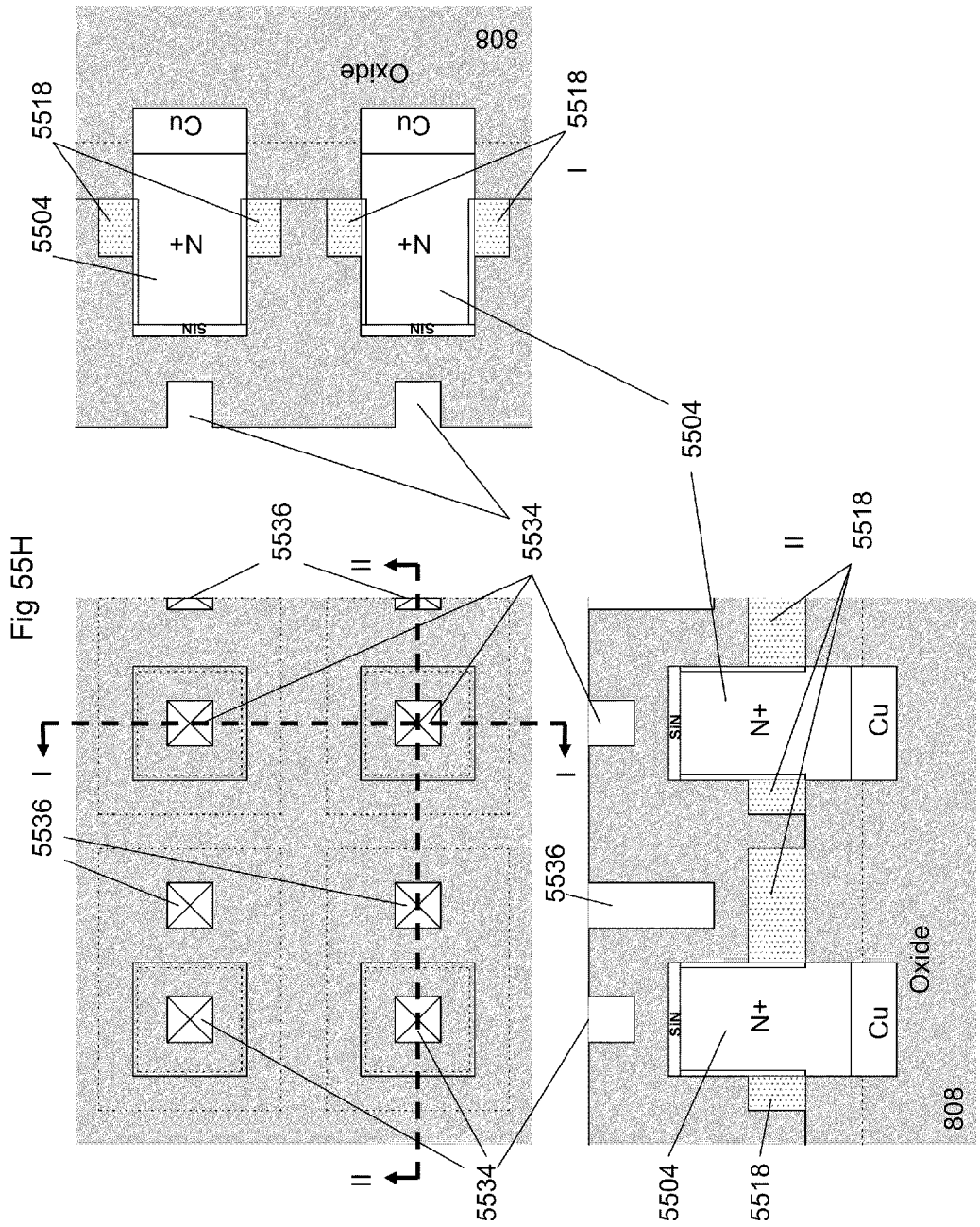

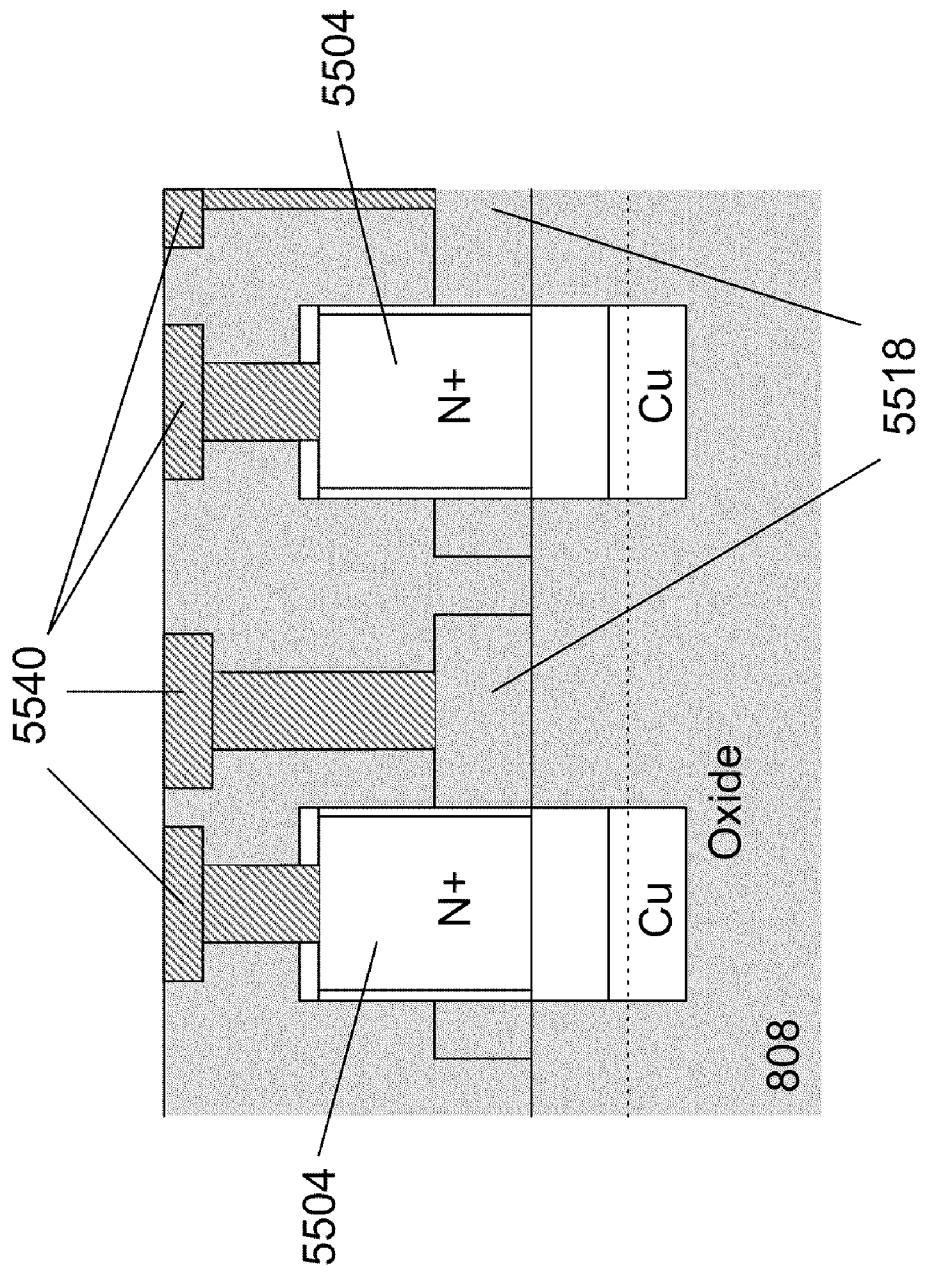

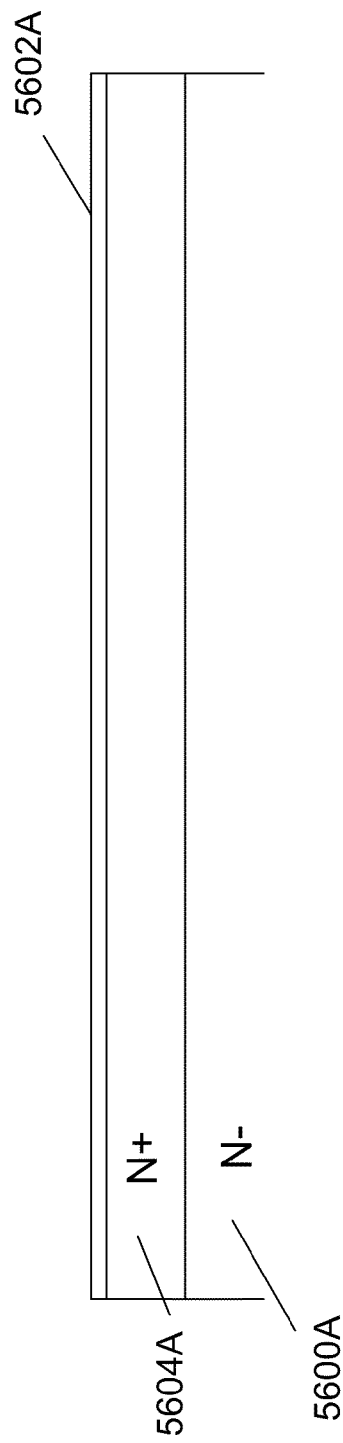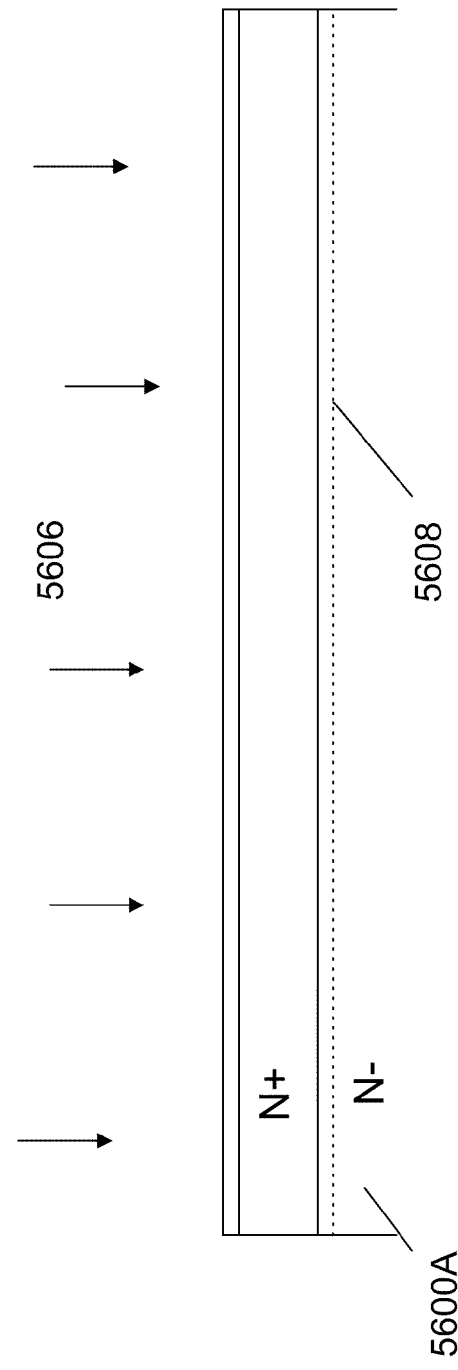

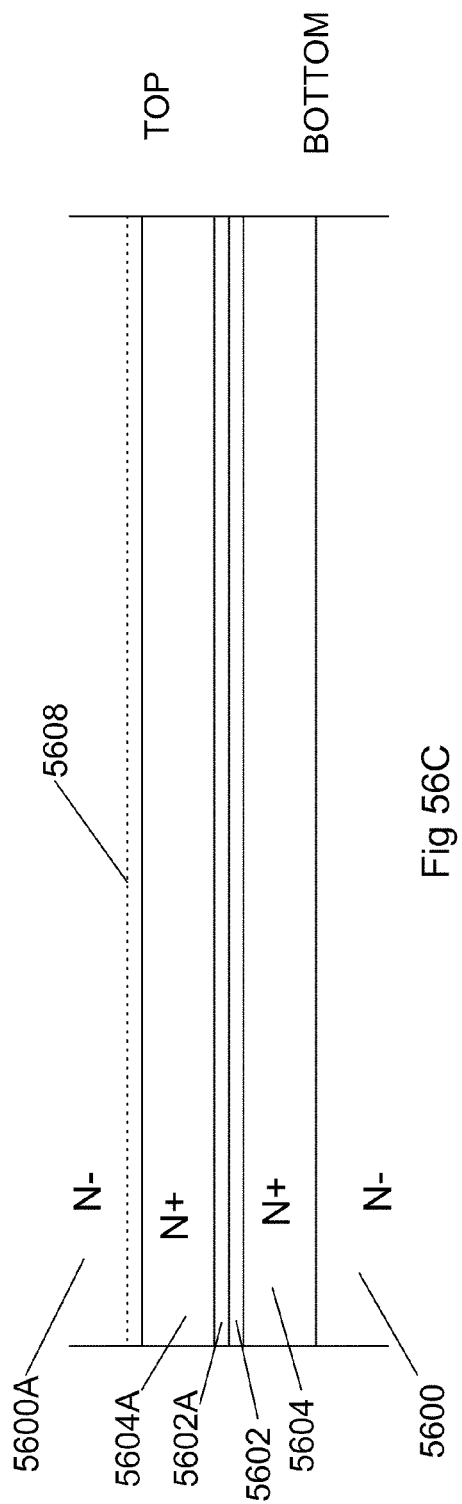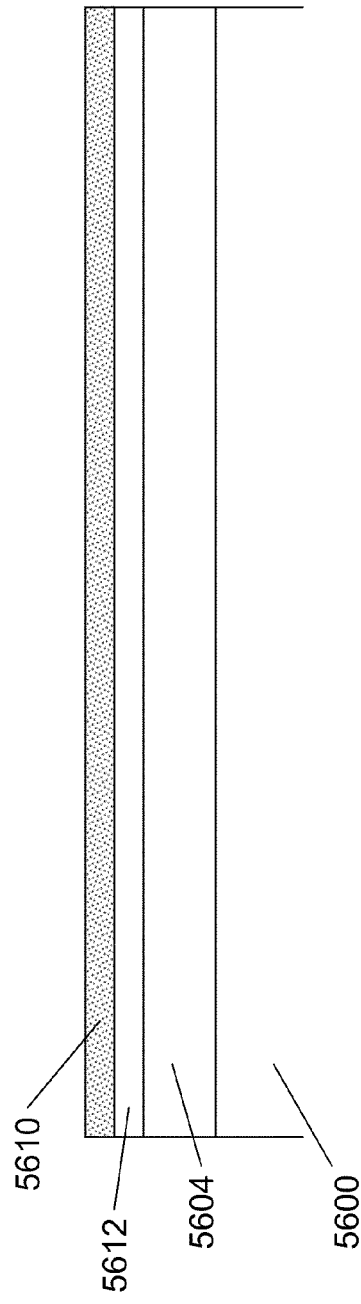

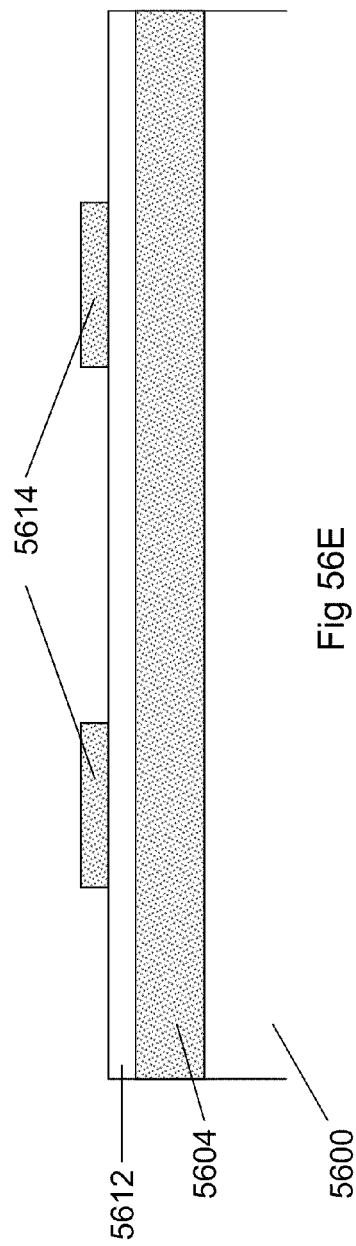
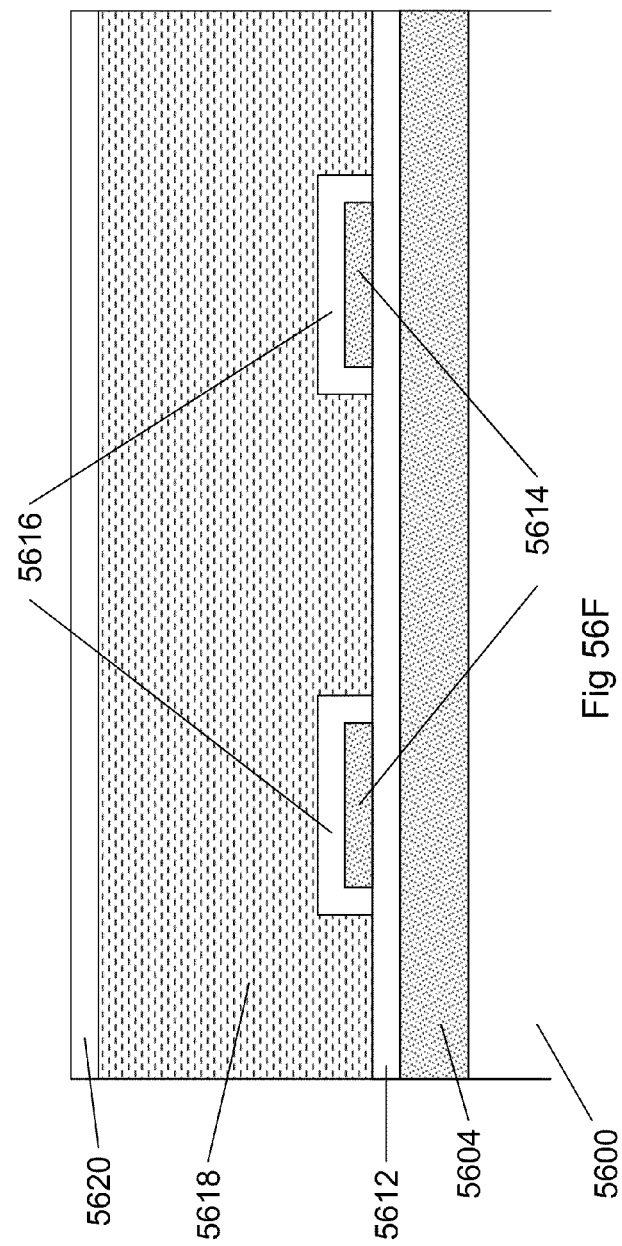

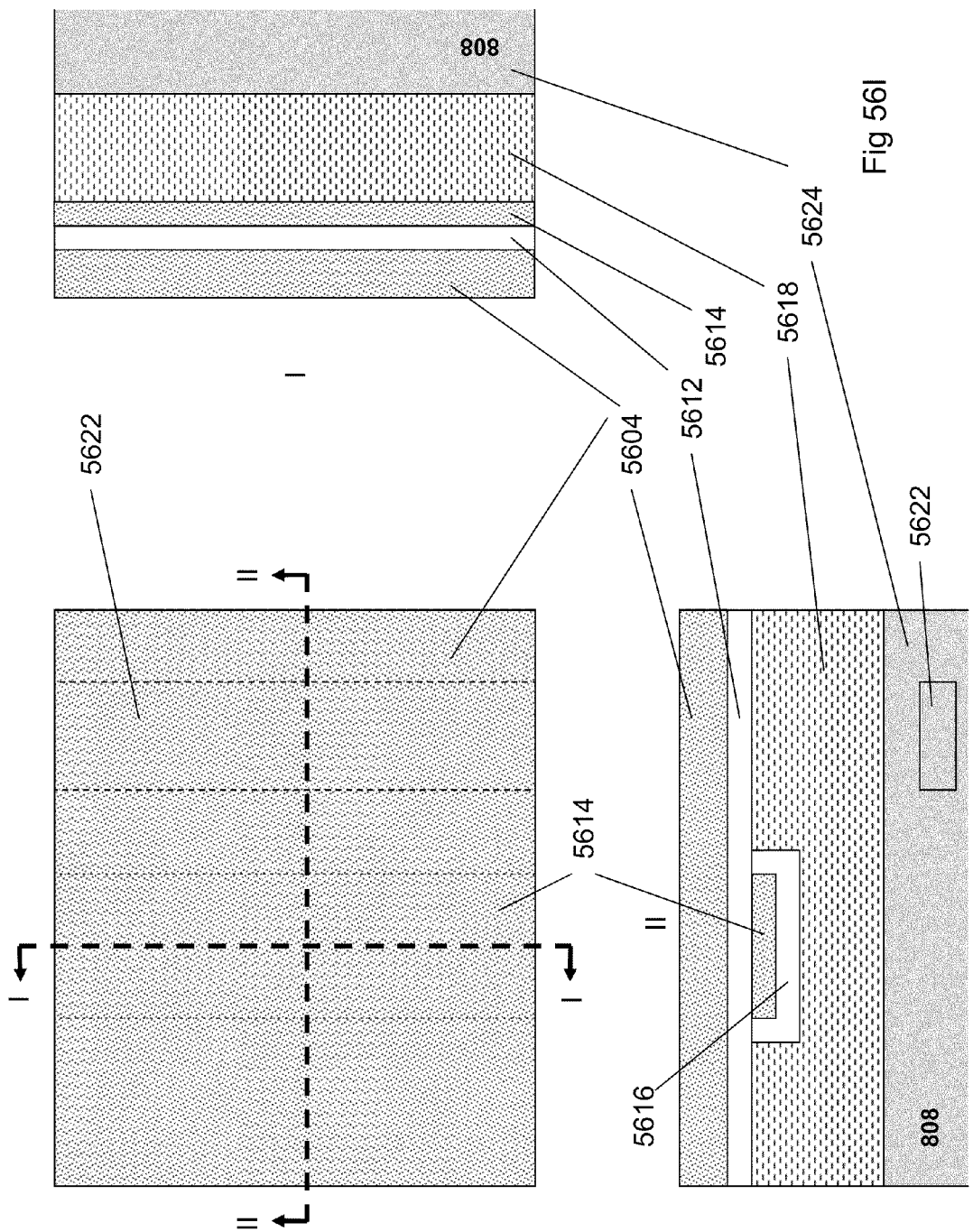

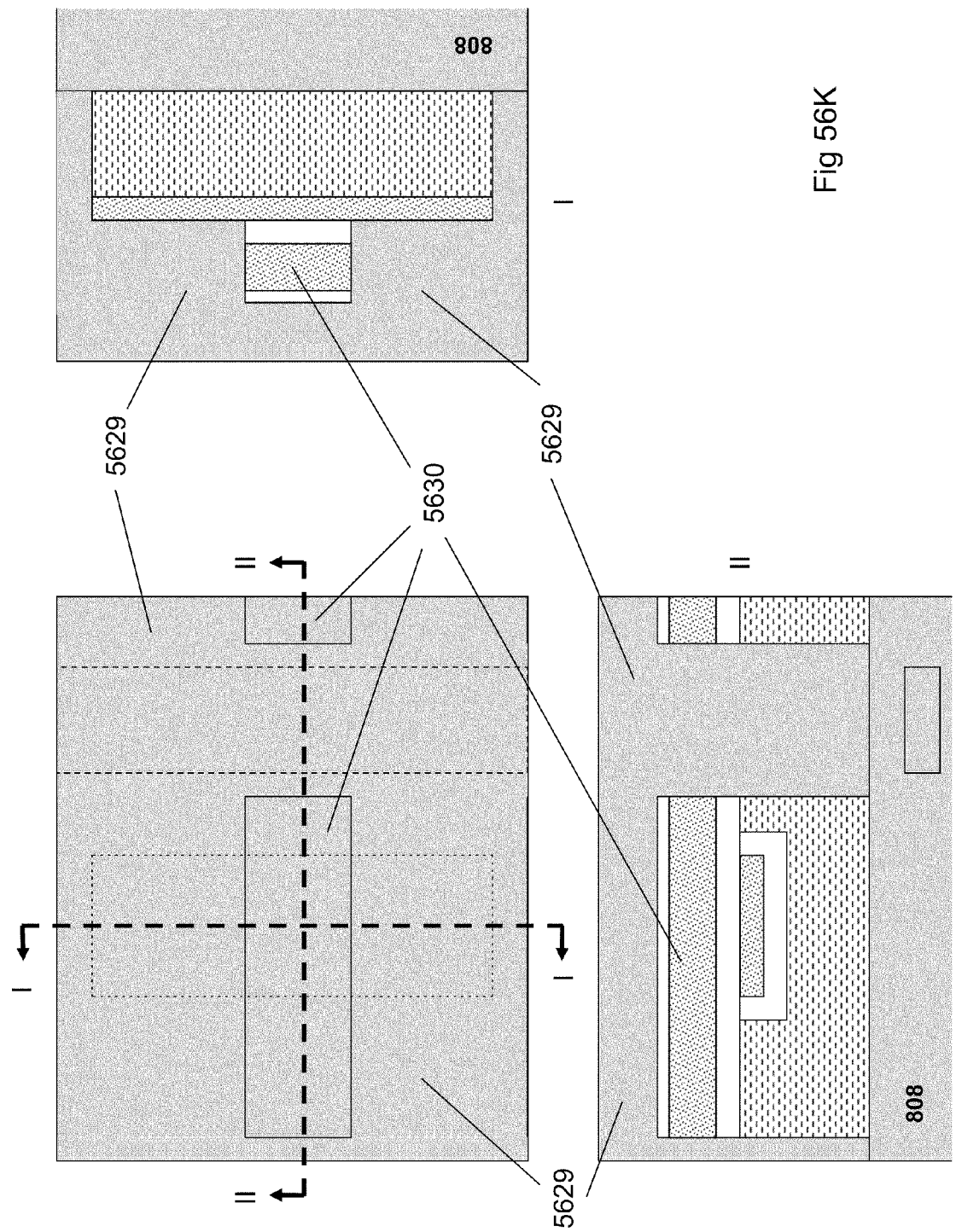

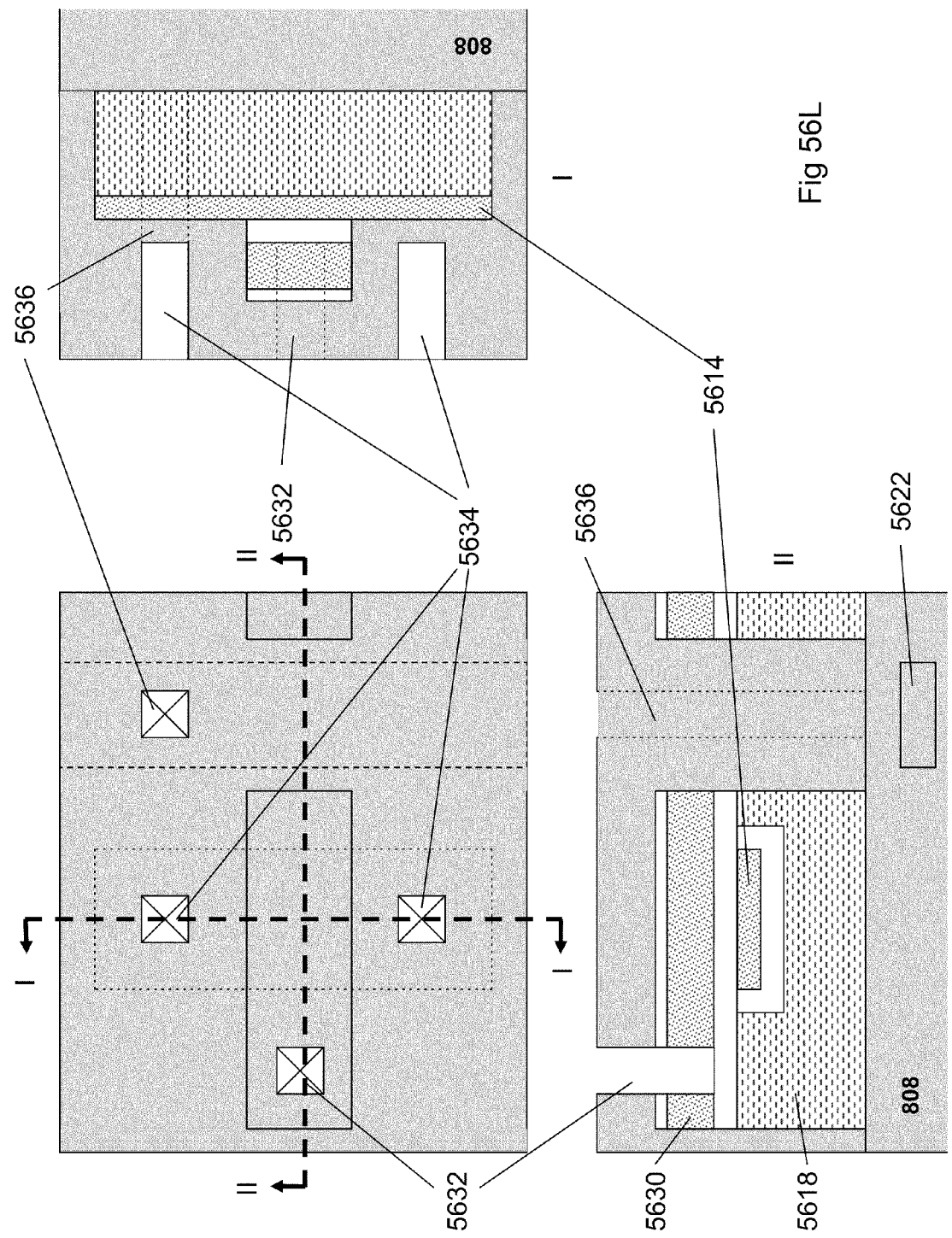

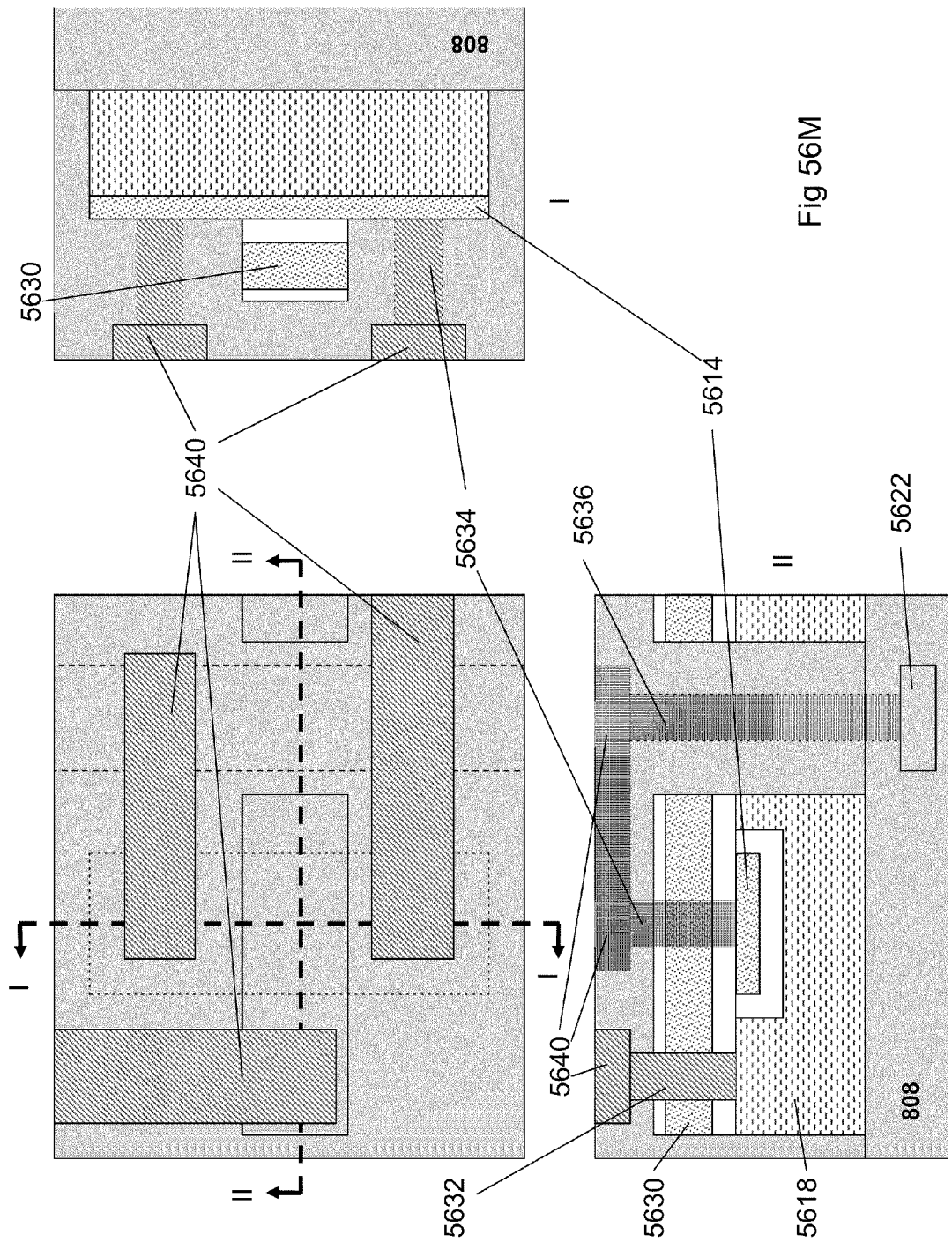

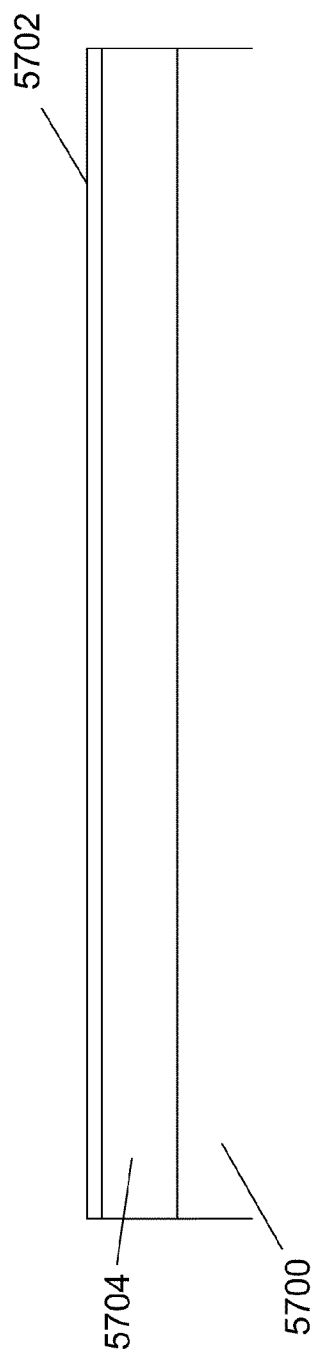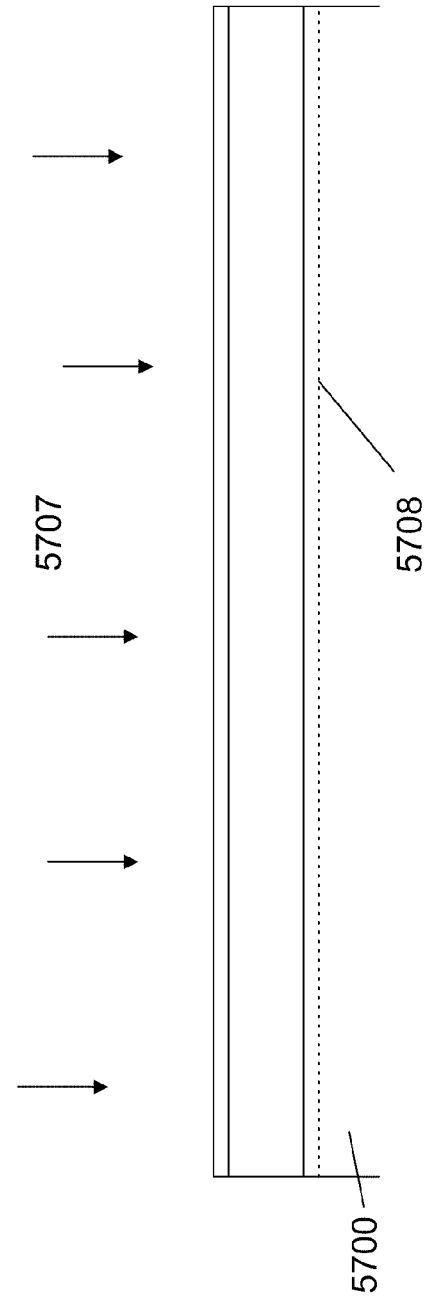

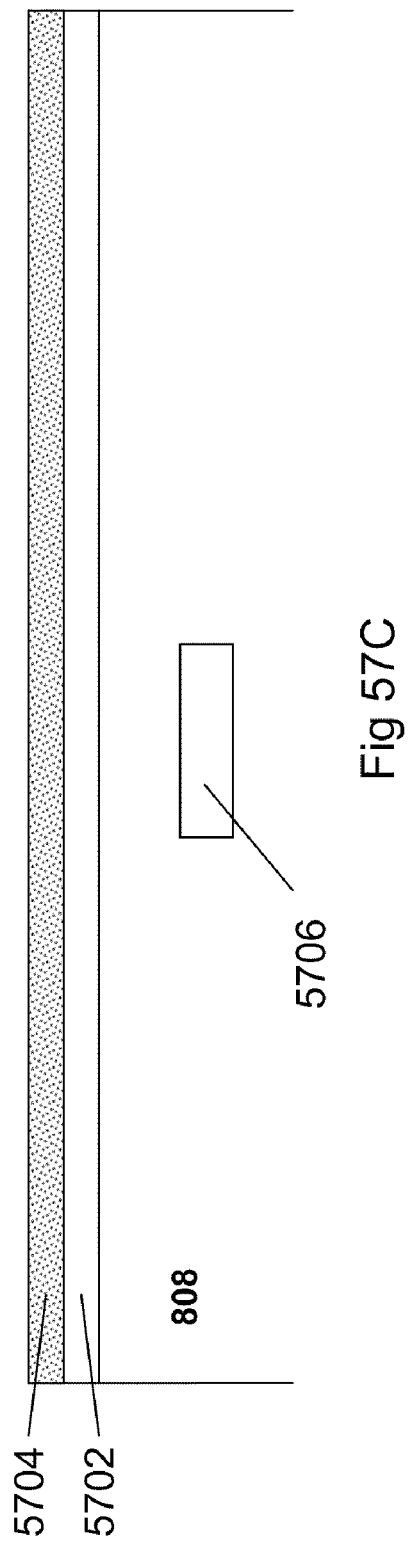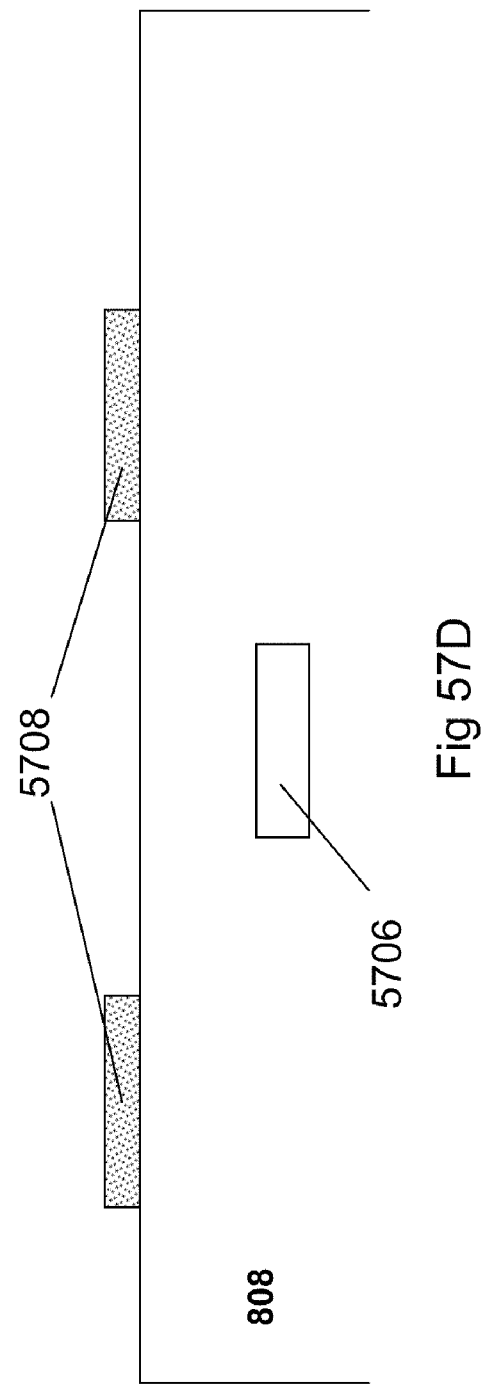

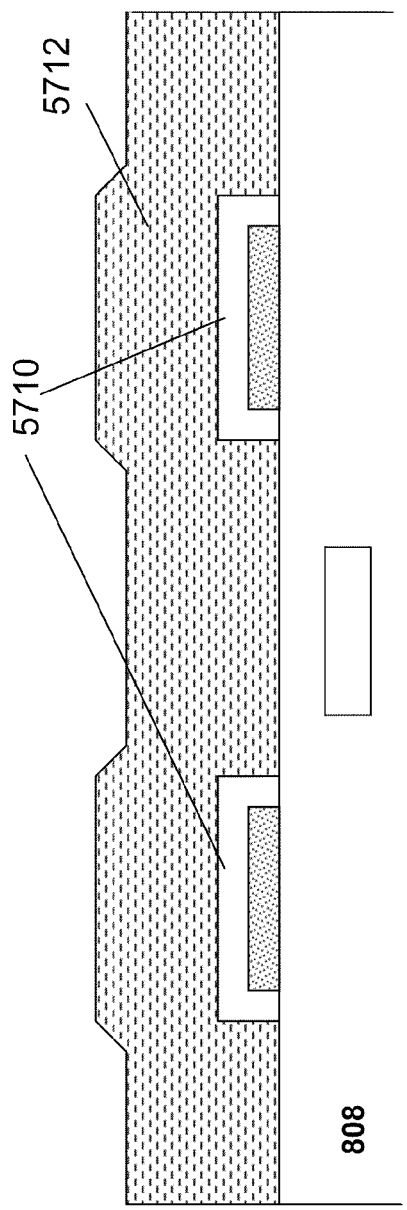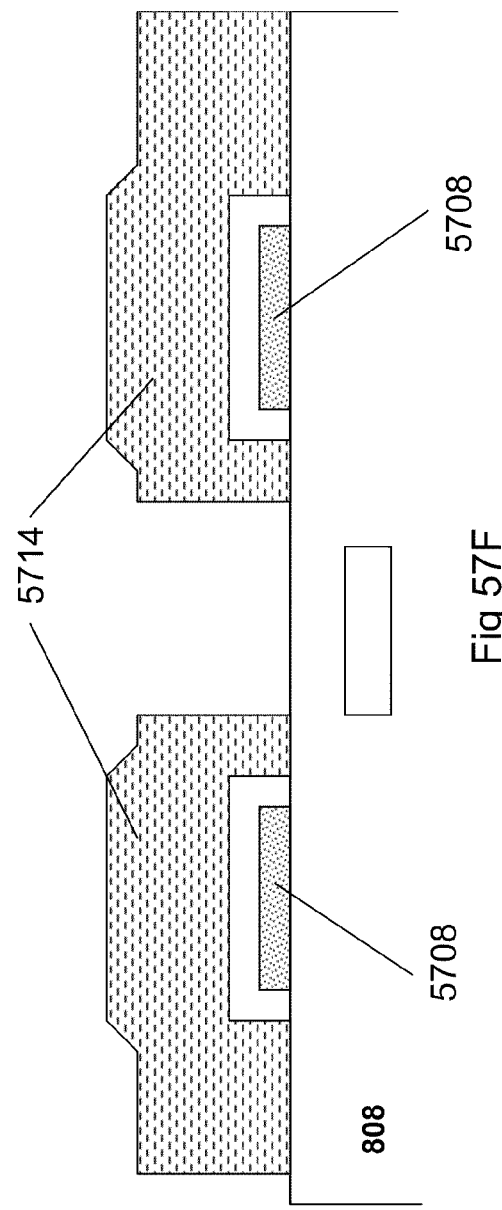

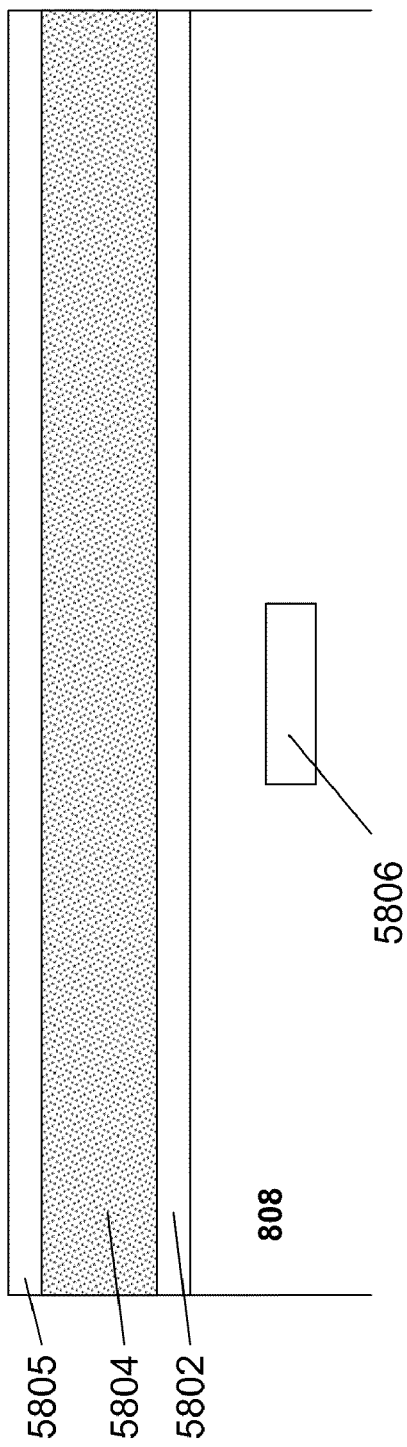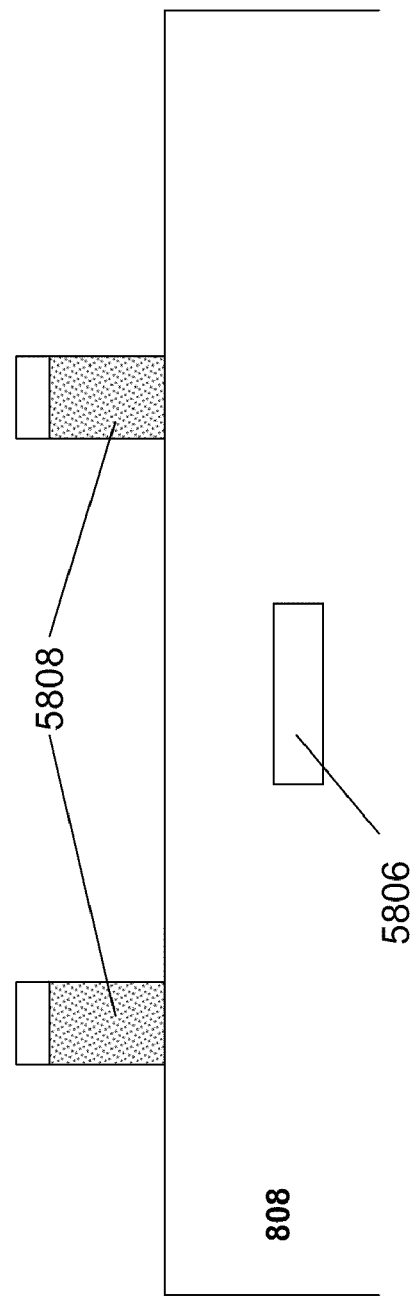

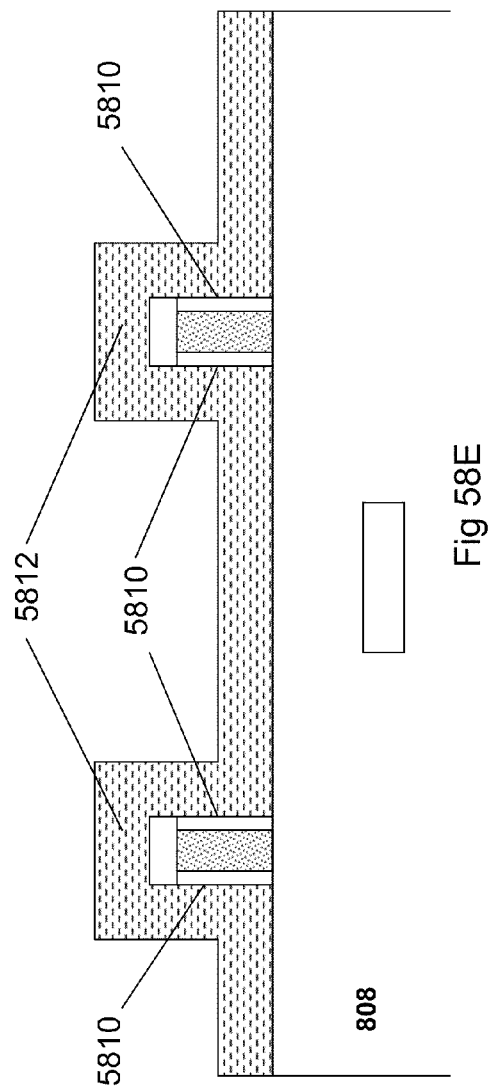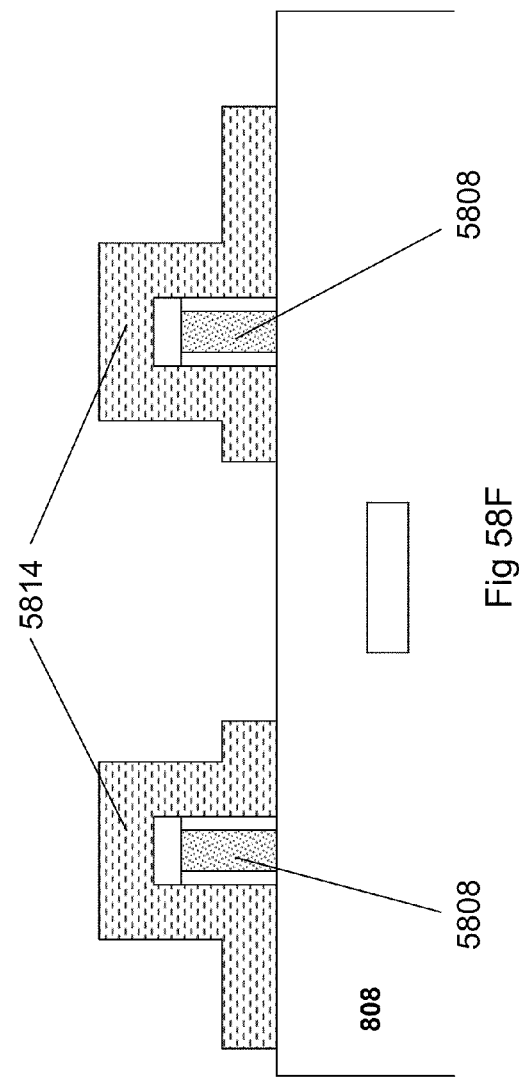

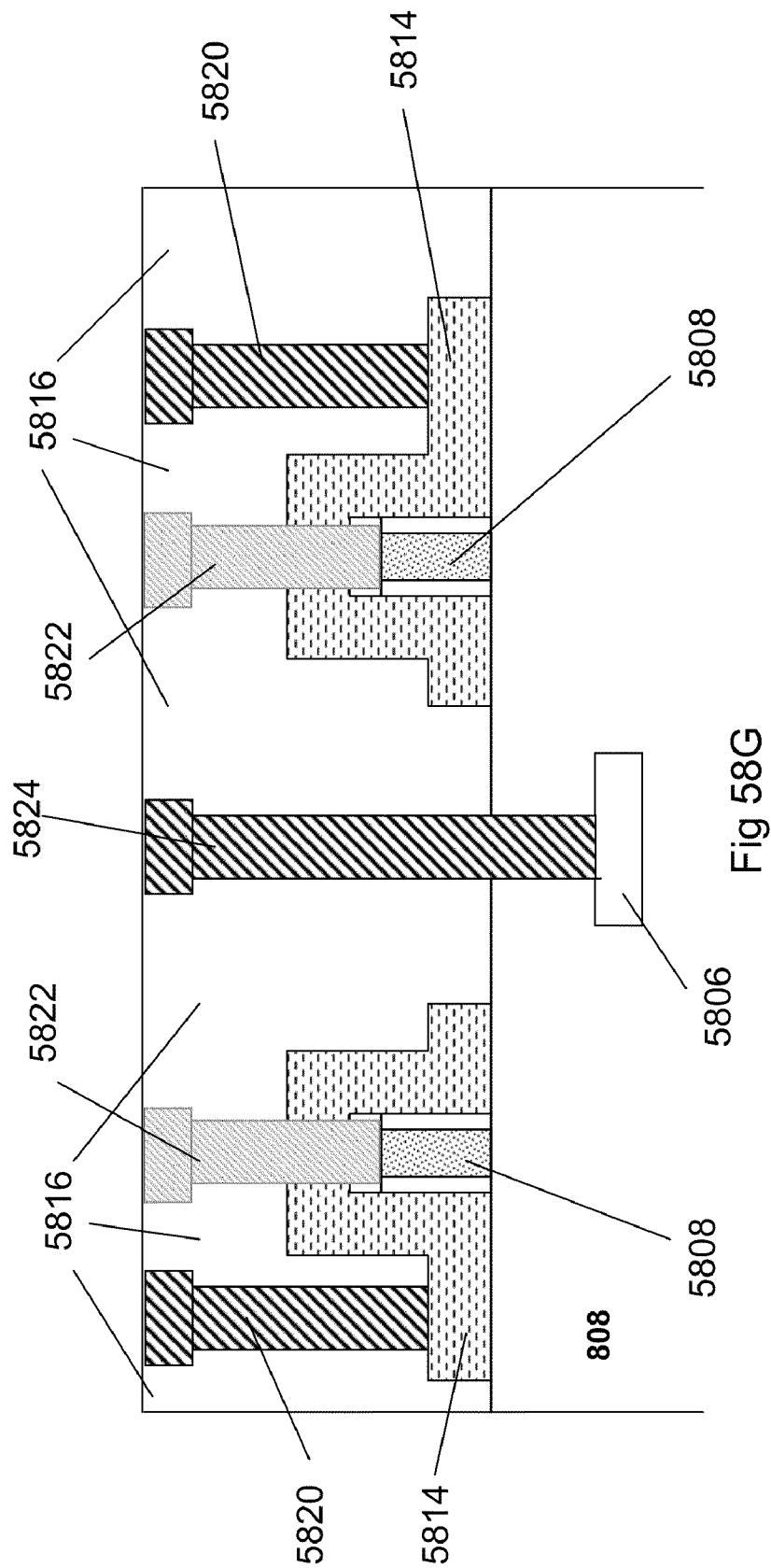

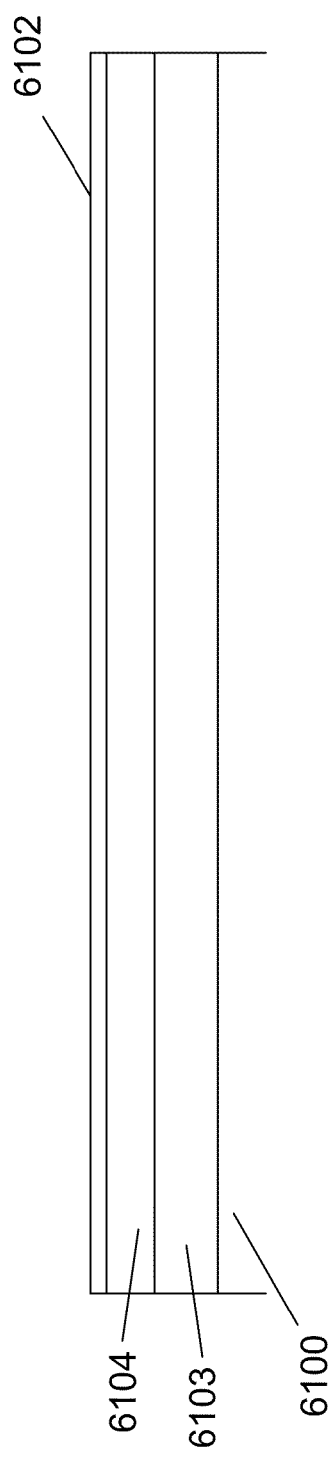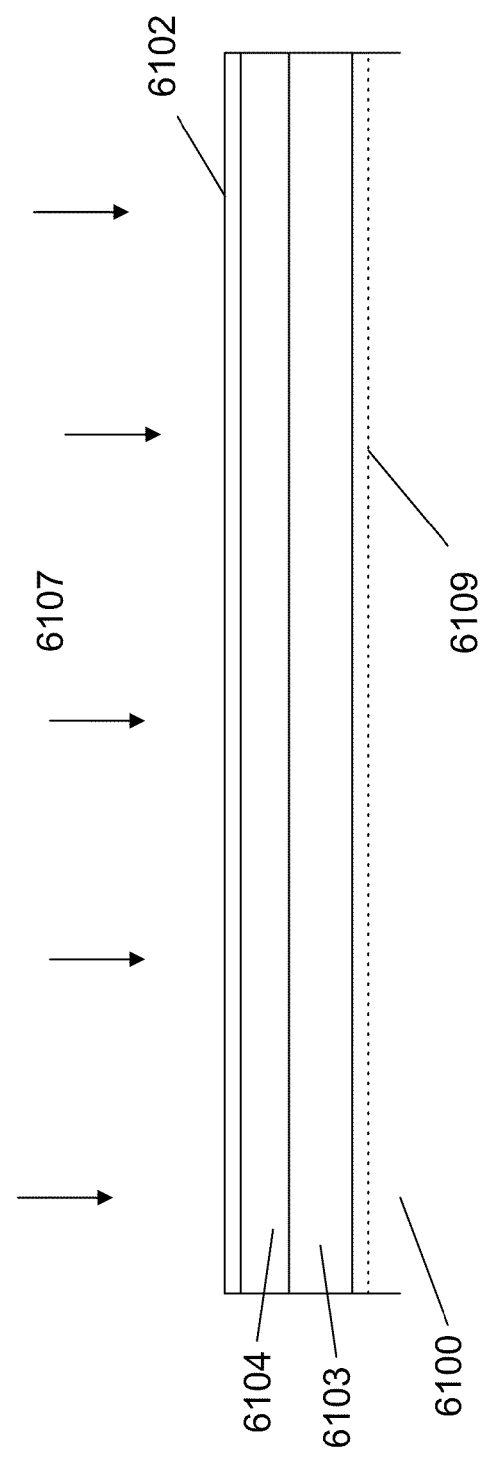

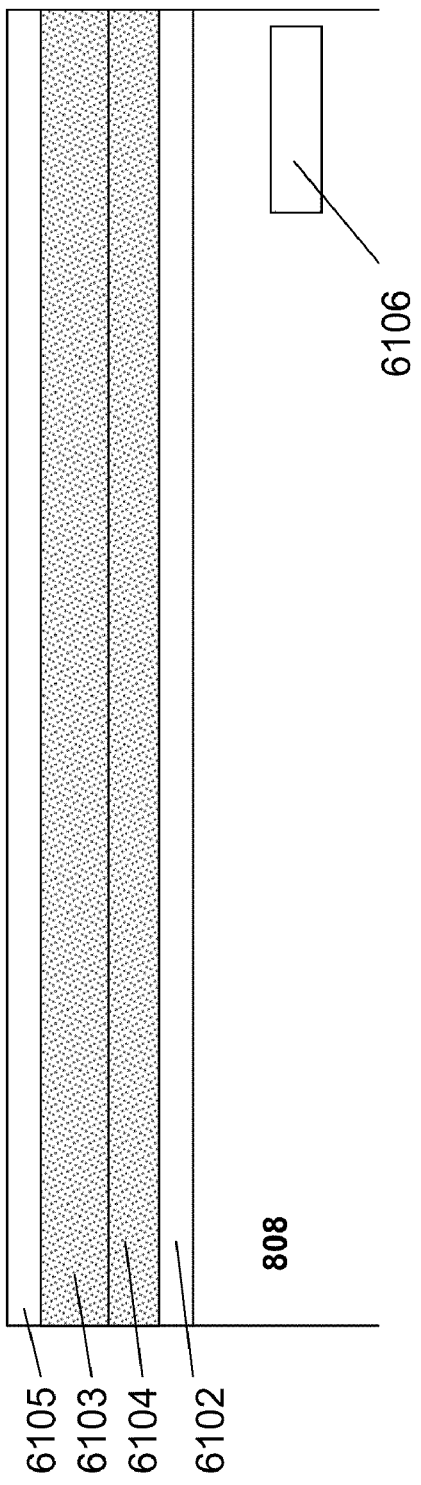
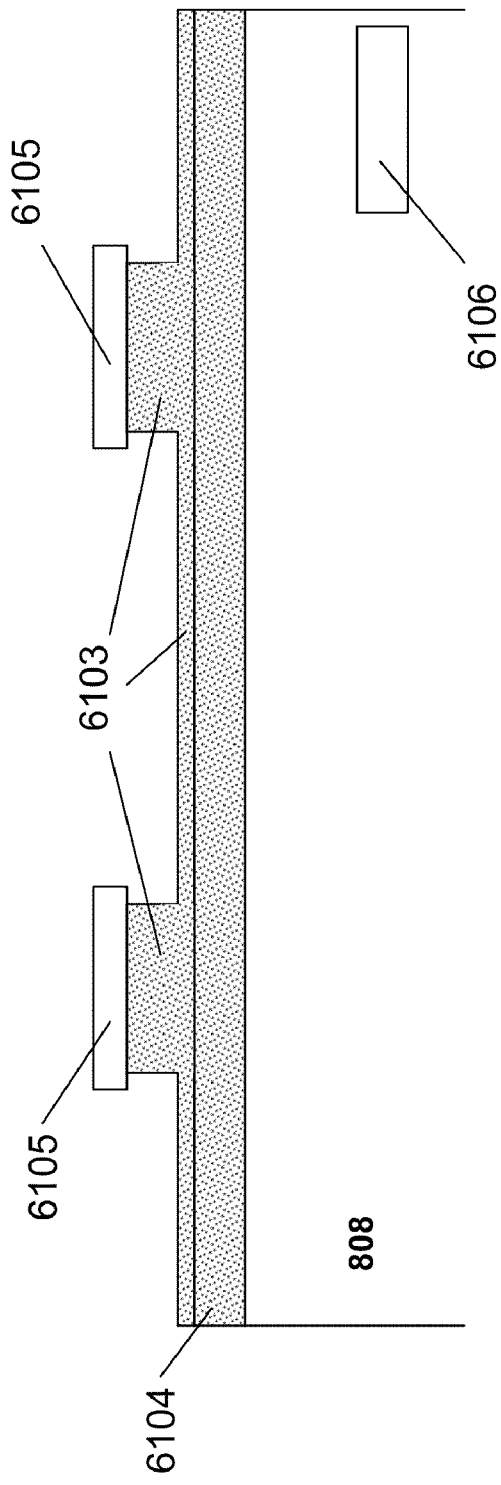

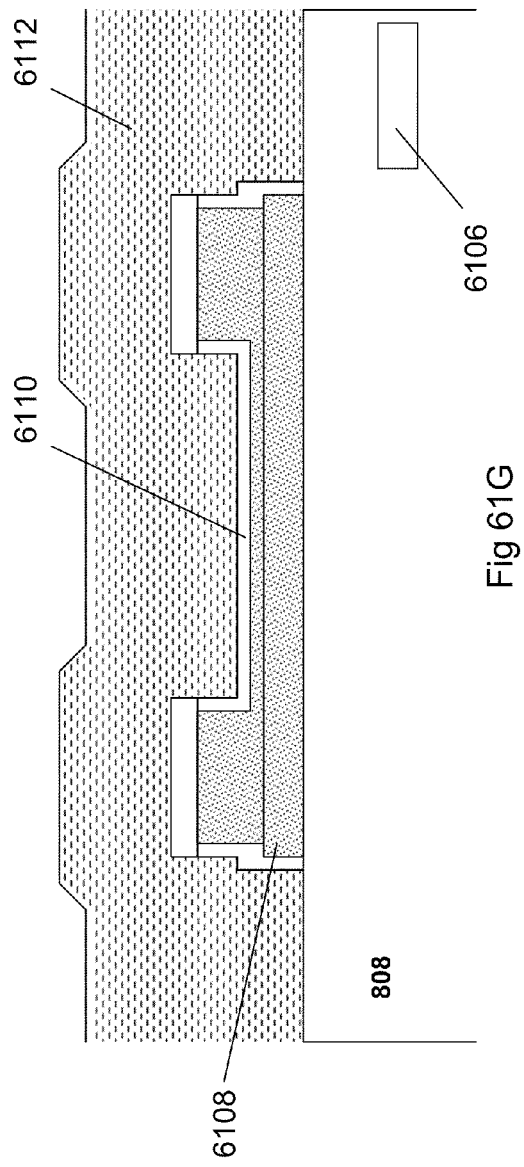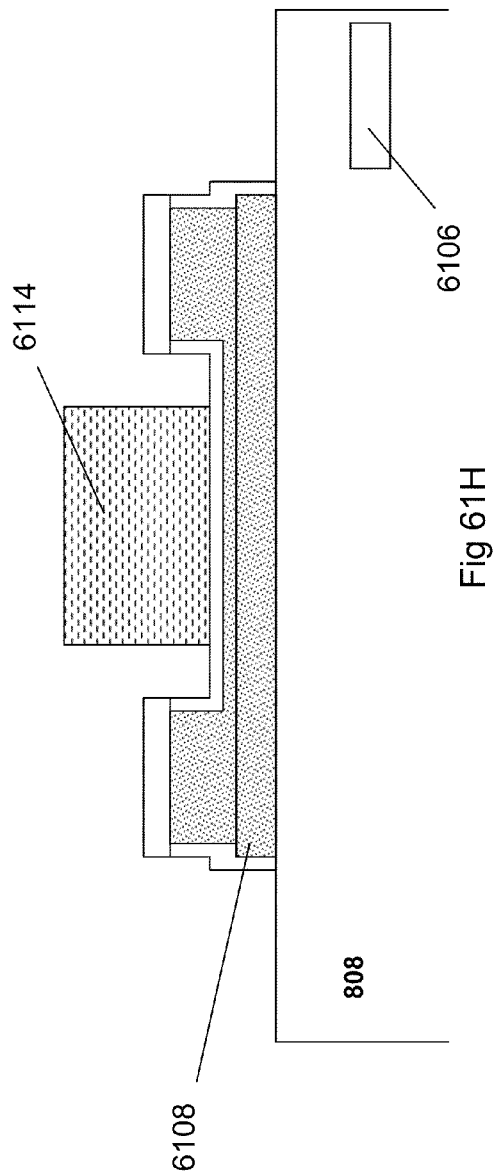

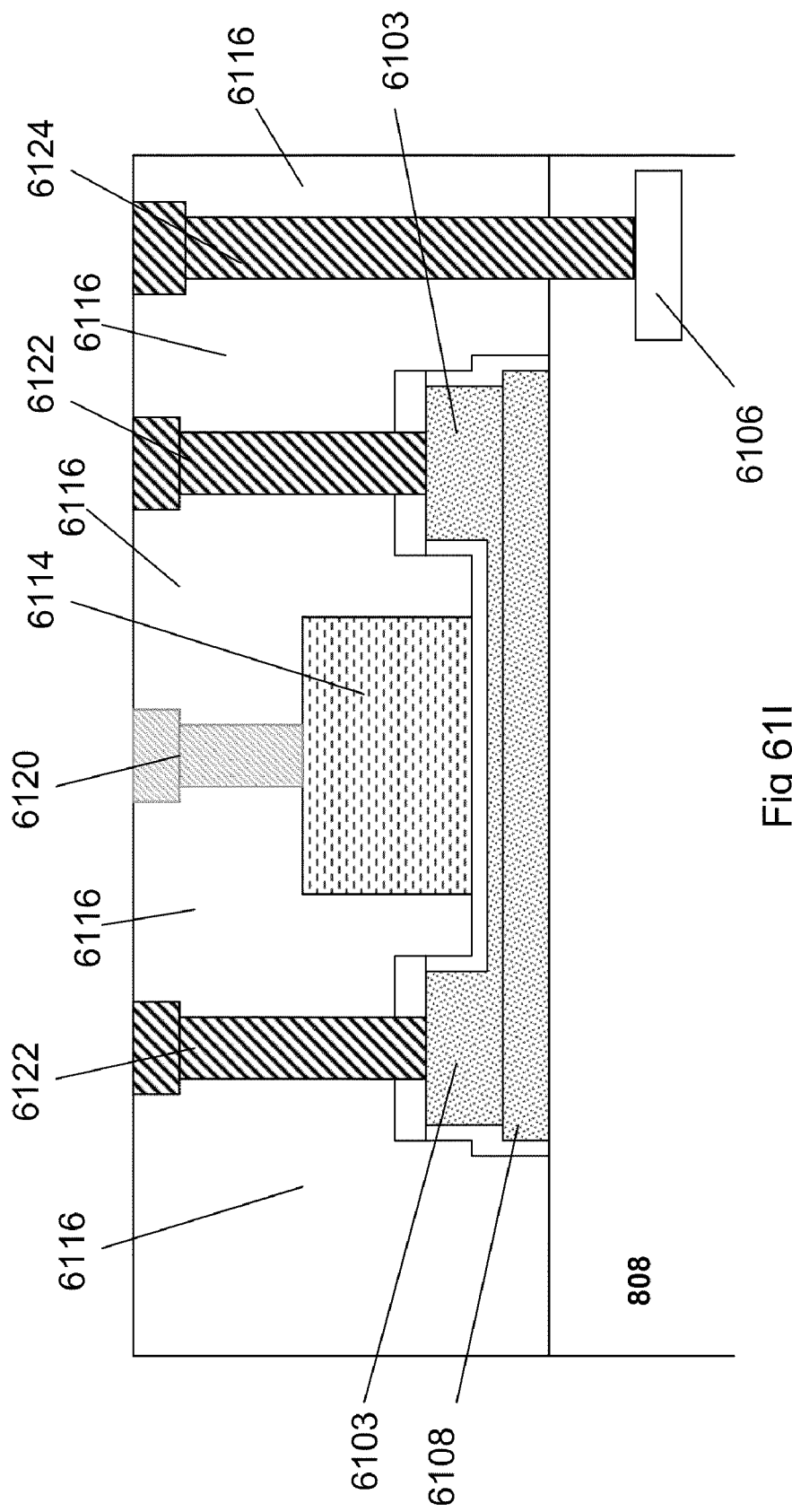

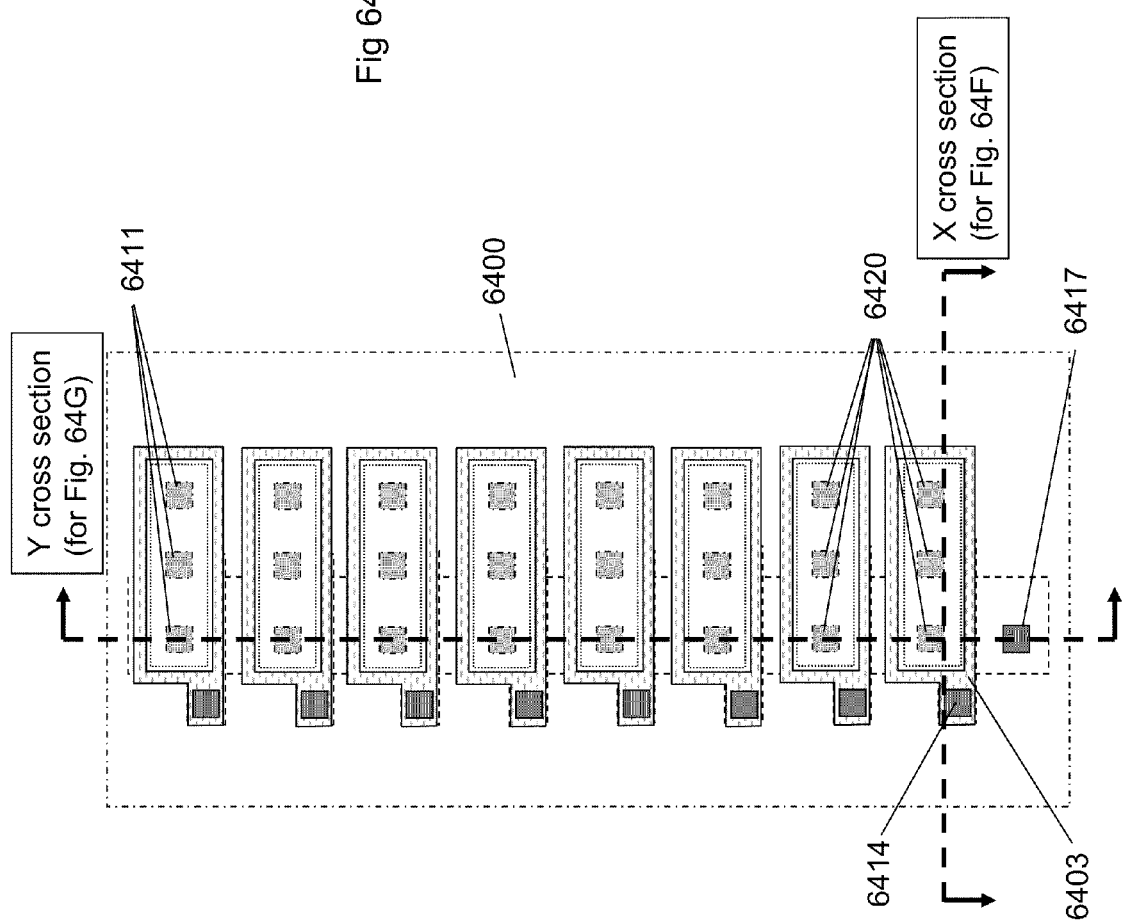

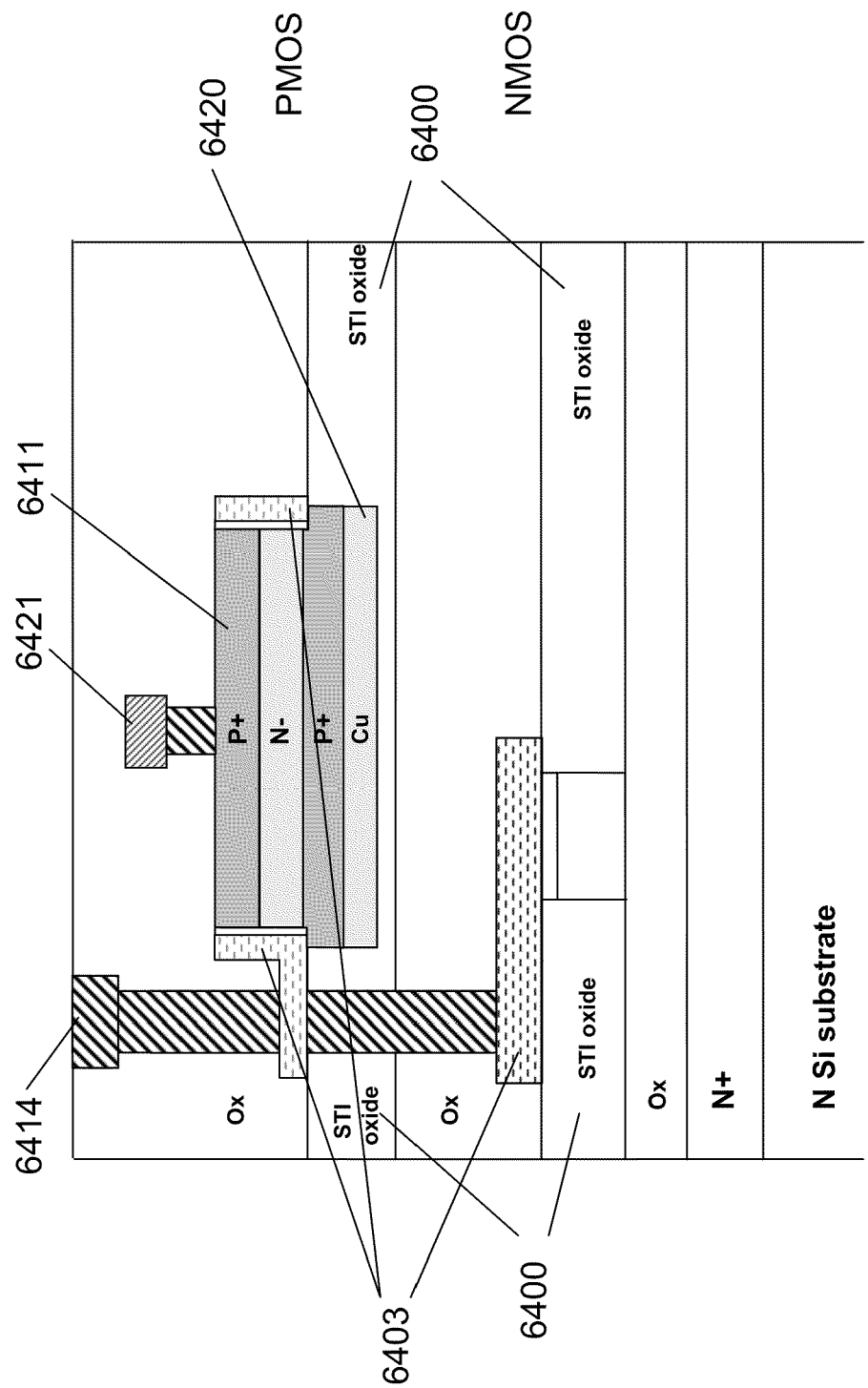

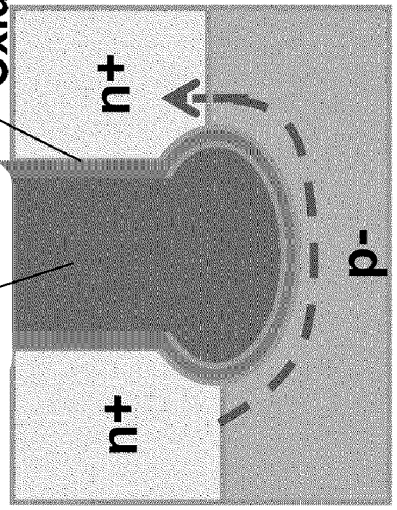
Spherical-RCAT (SRCAT)
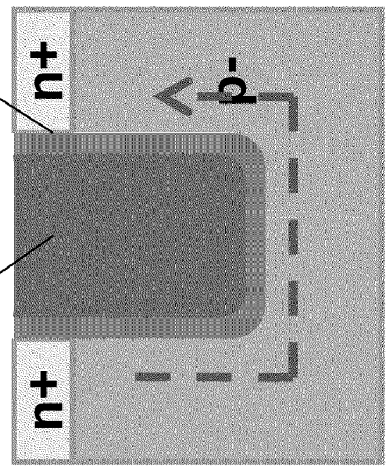
Standard RCAT
Current flow in two dimensional plane, indicated by - - →
Prior Art
Fig. 66

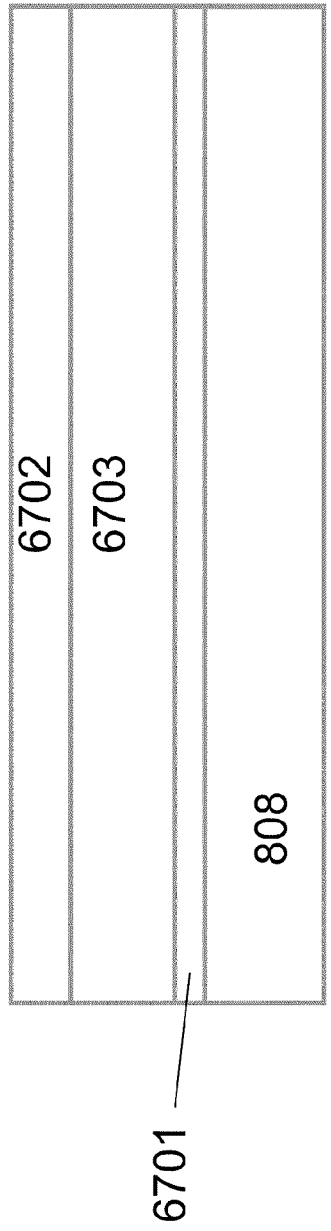
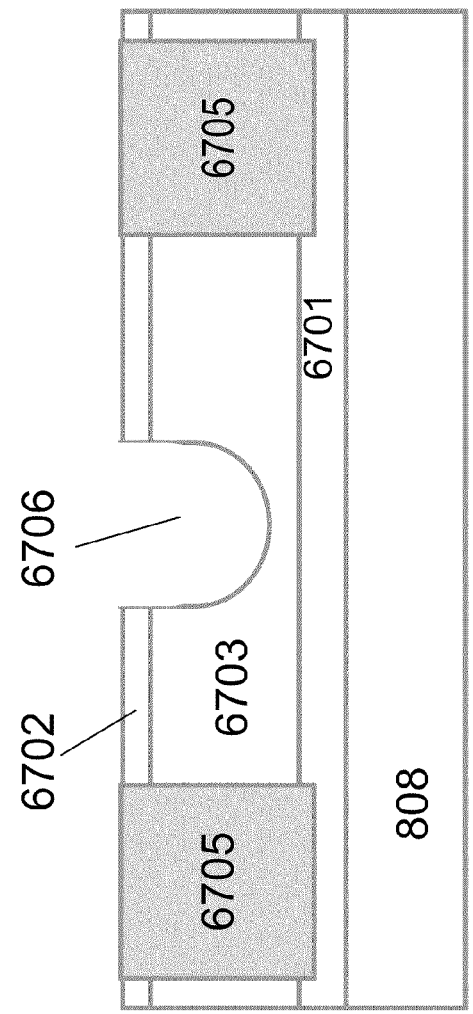
Figure 67C
Figure 67D

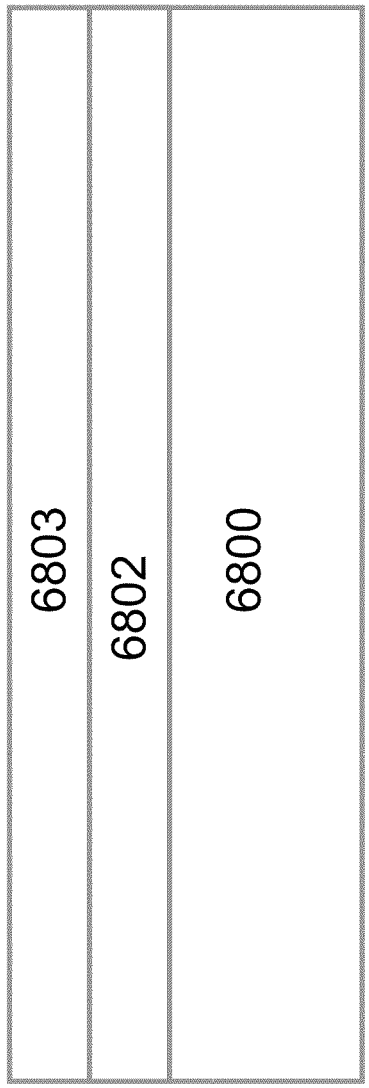
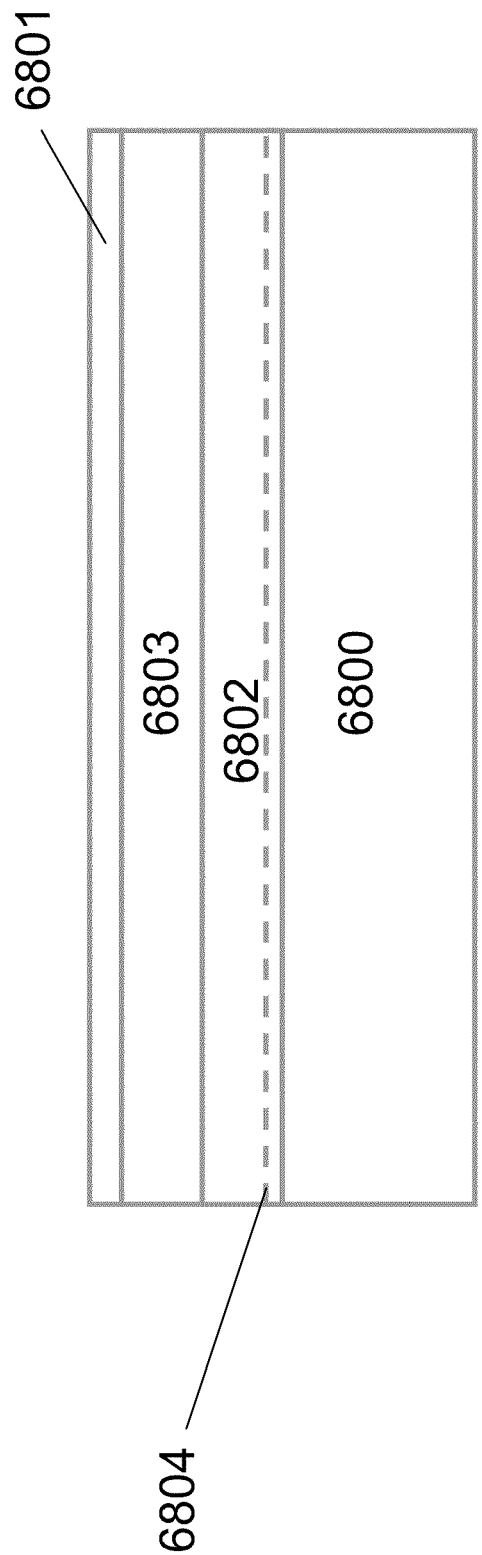

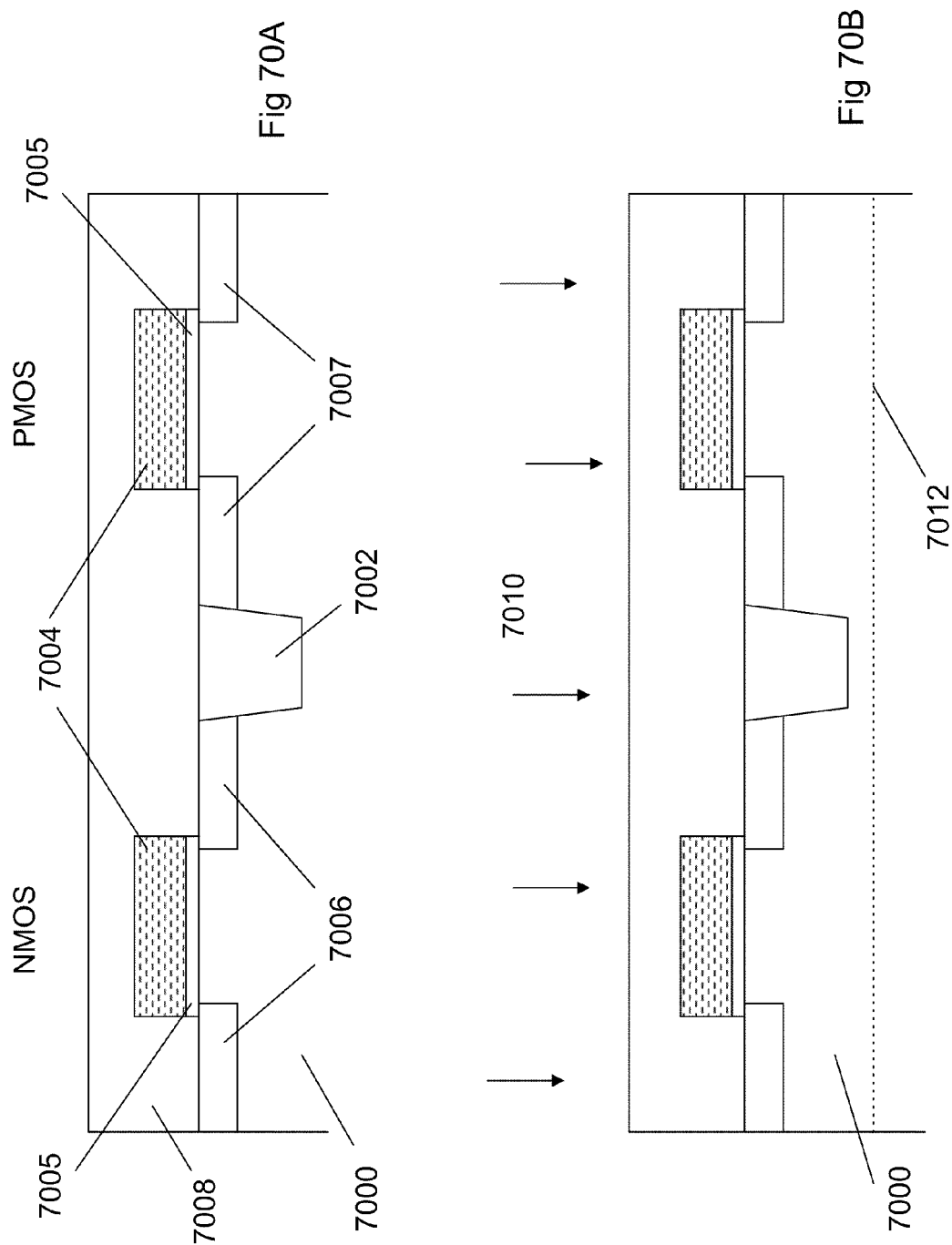

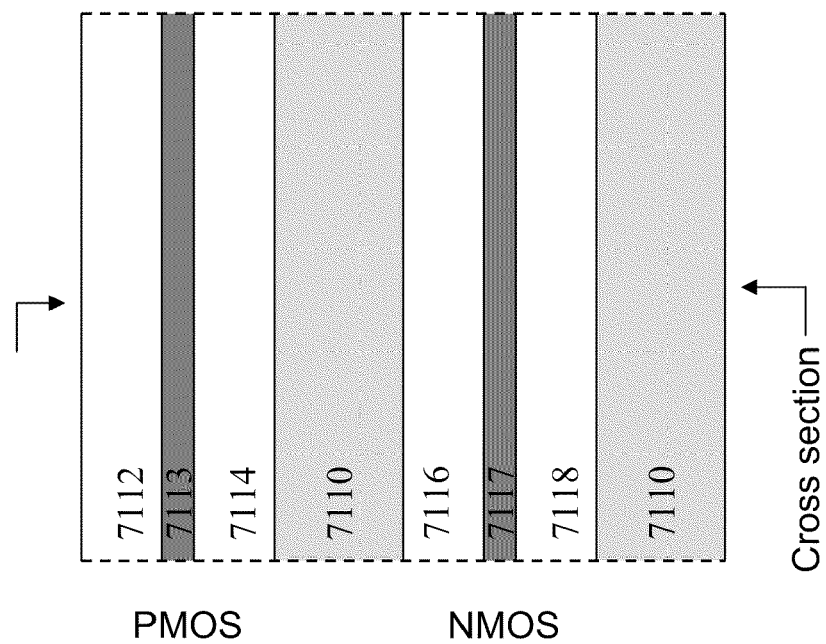
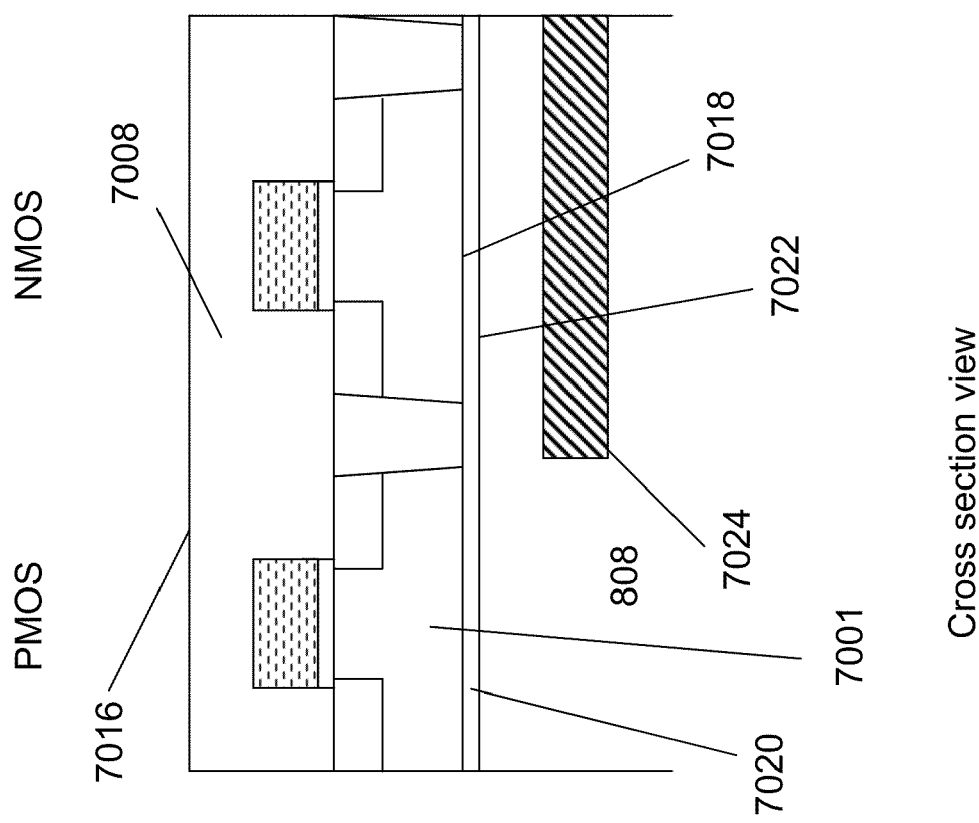
Fig 72A

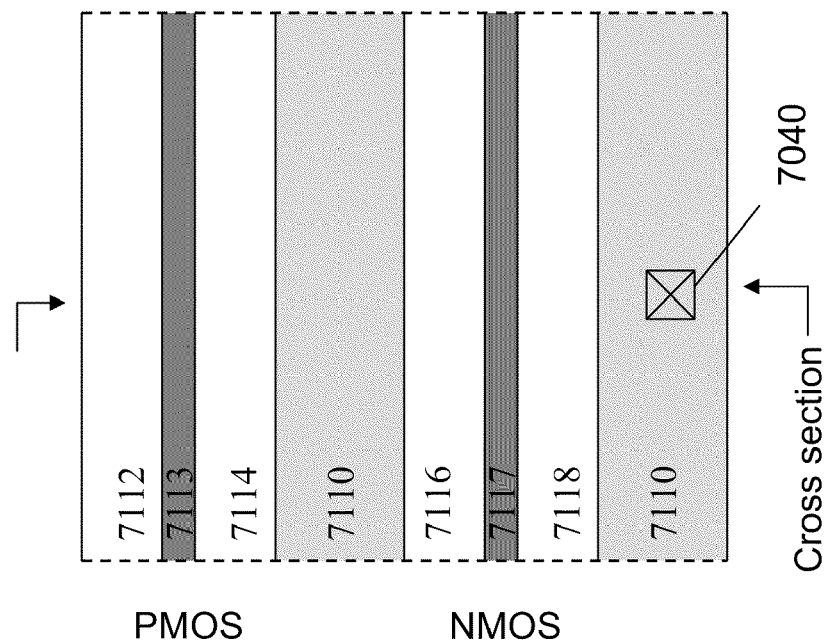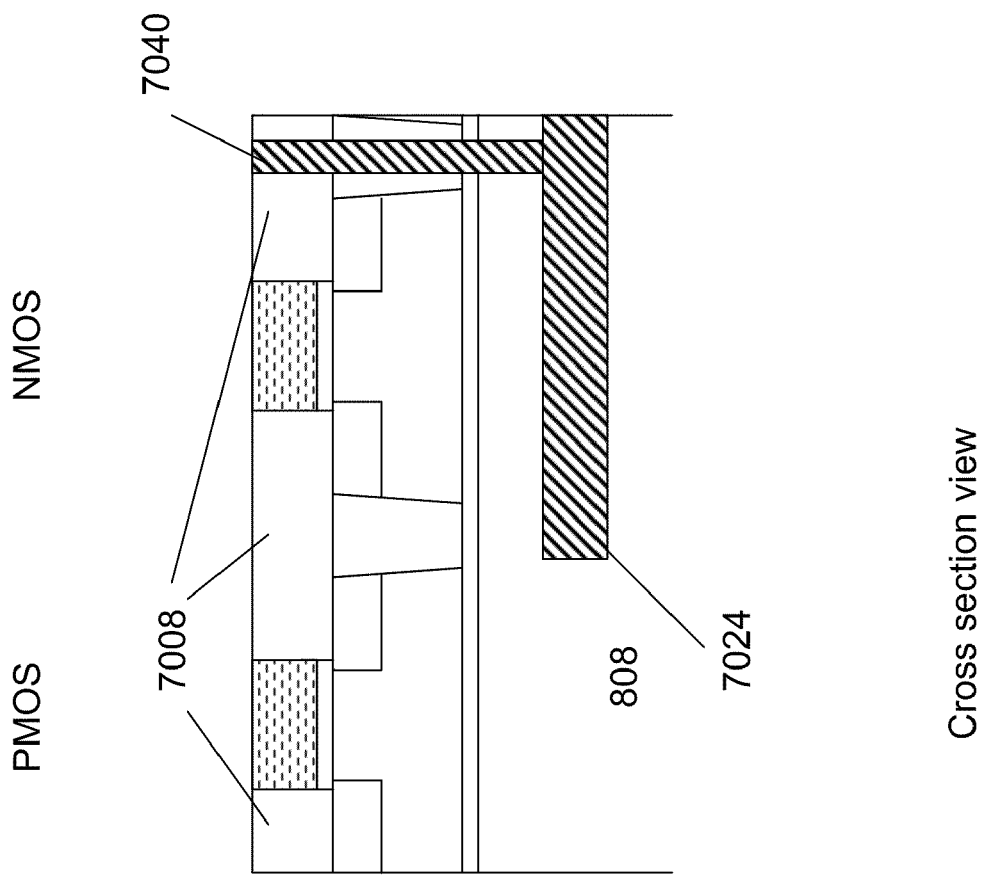
Fig 72B

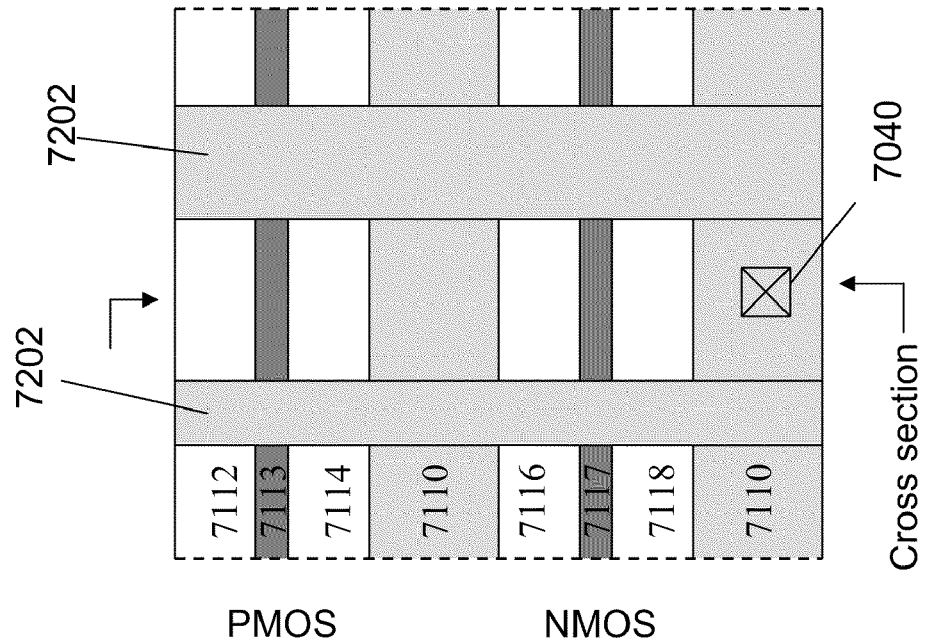
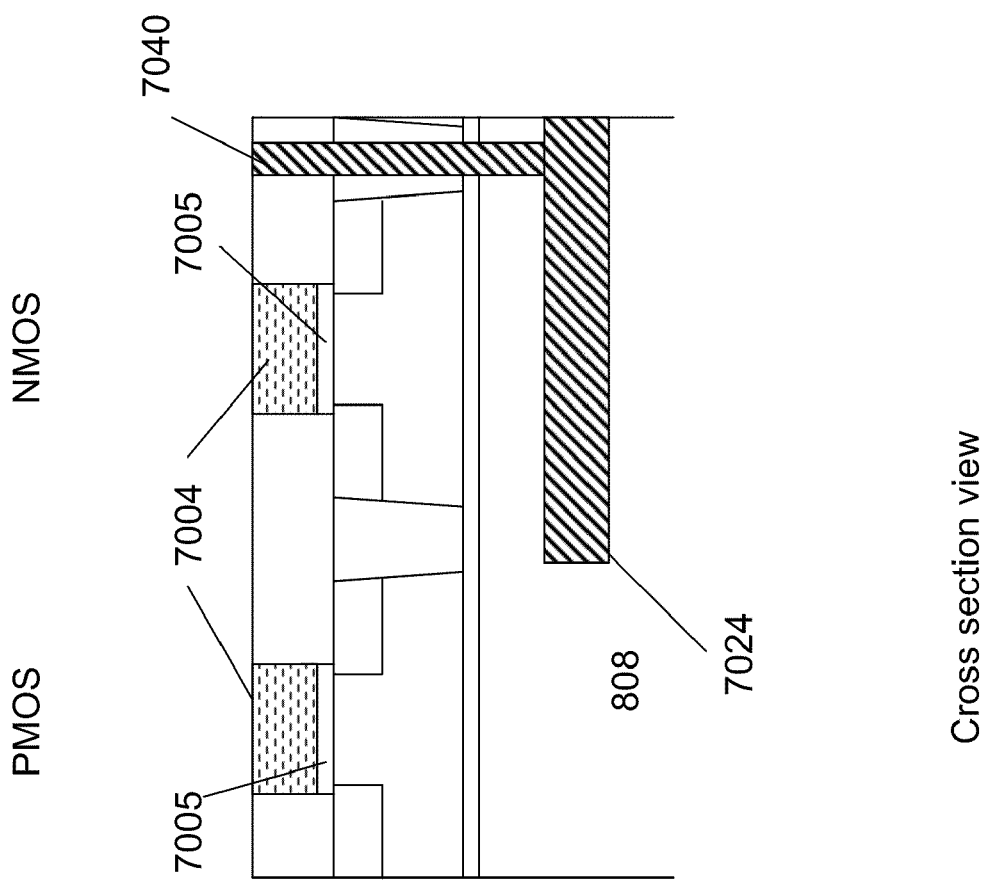
Fig 72C

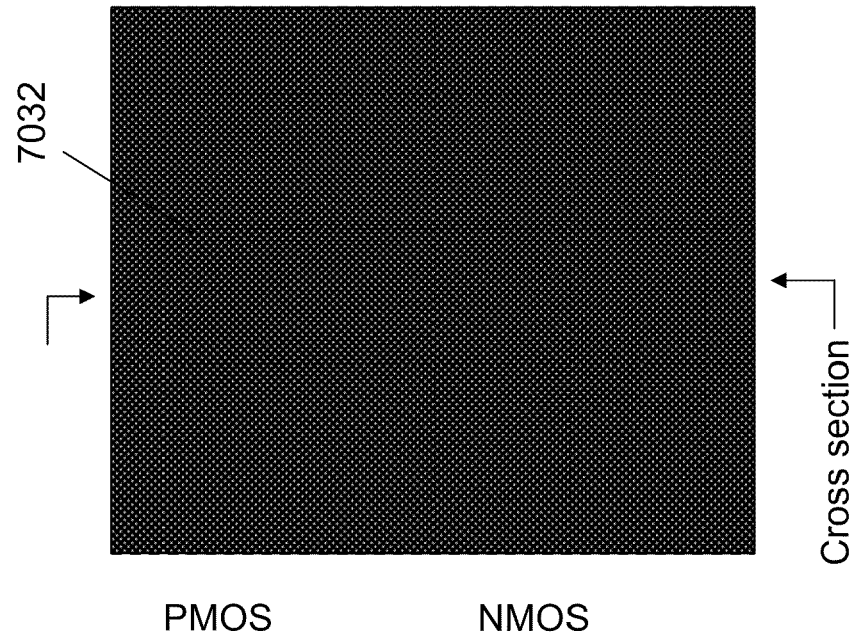
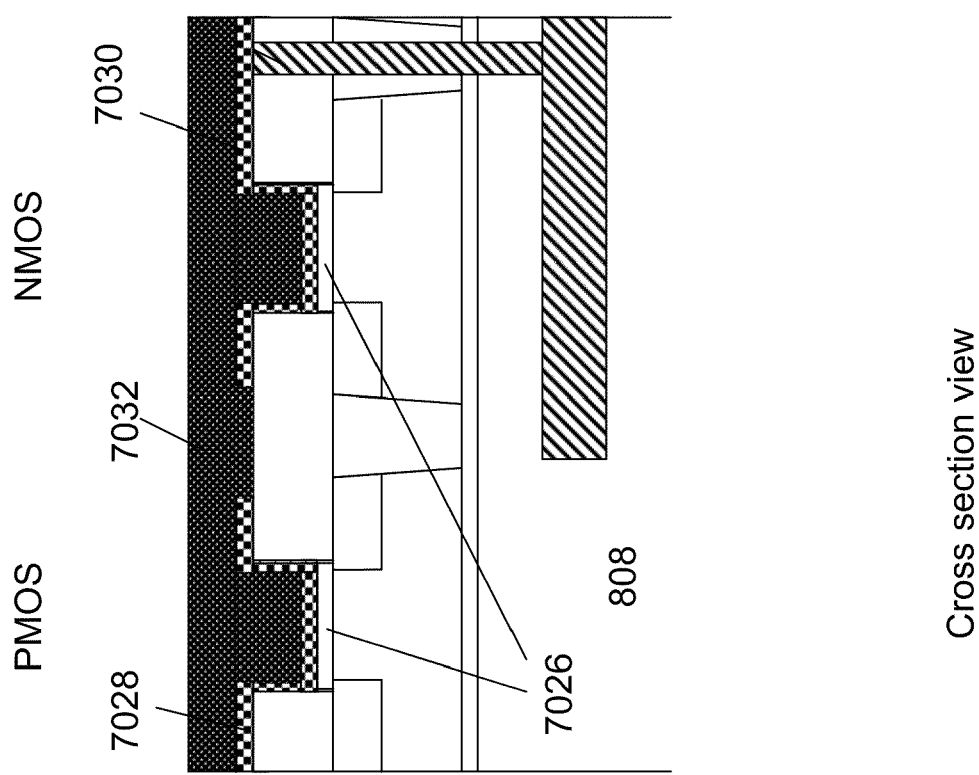
Fig 72D

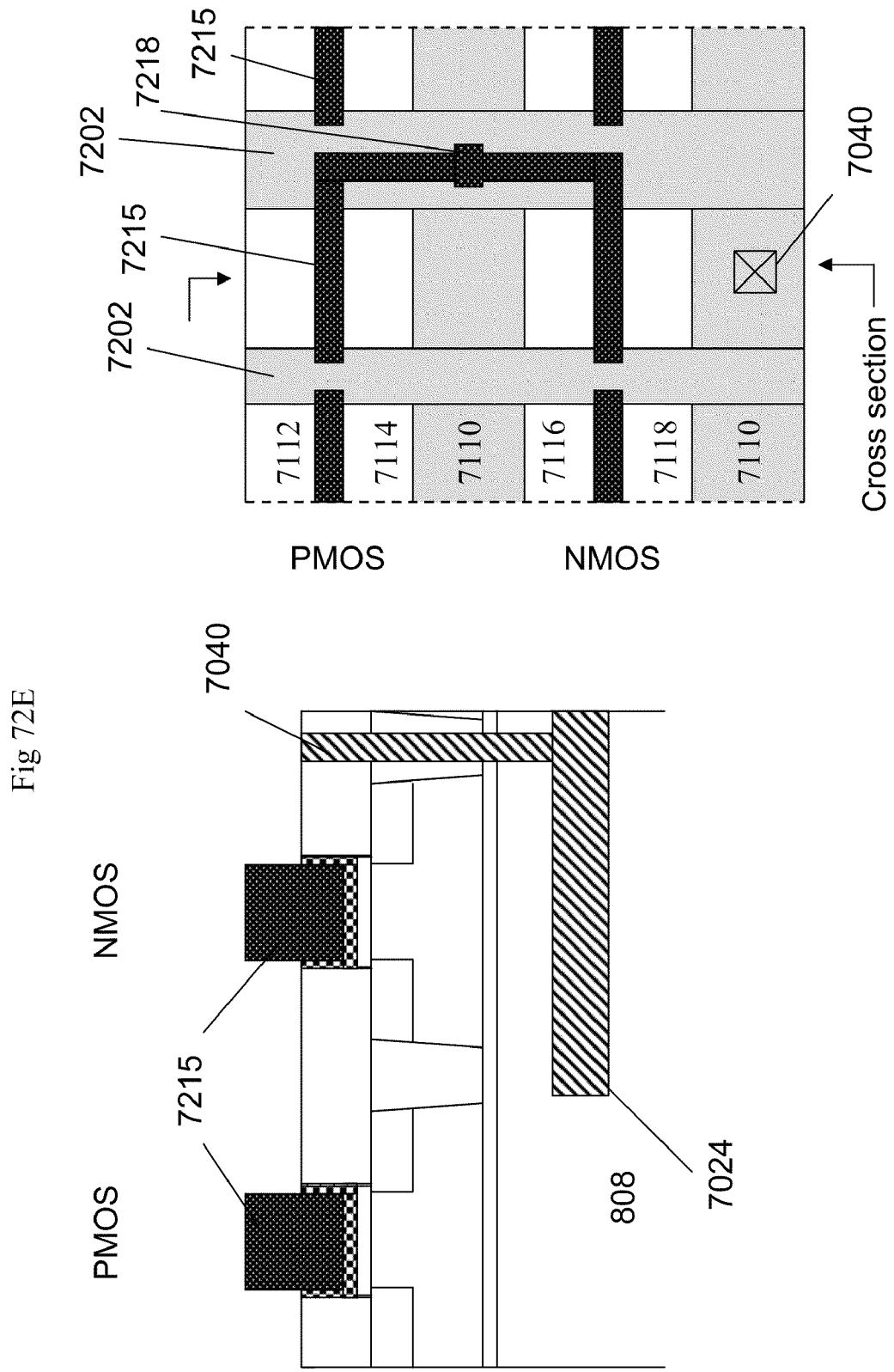

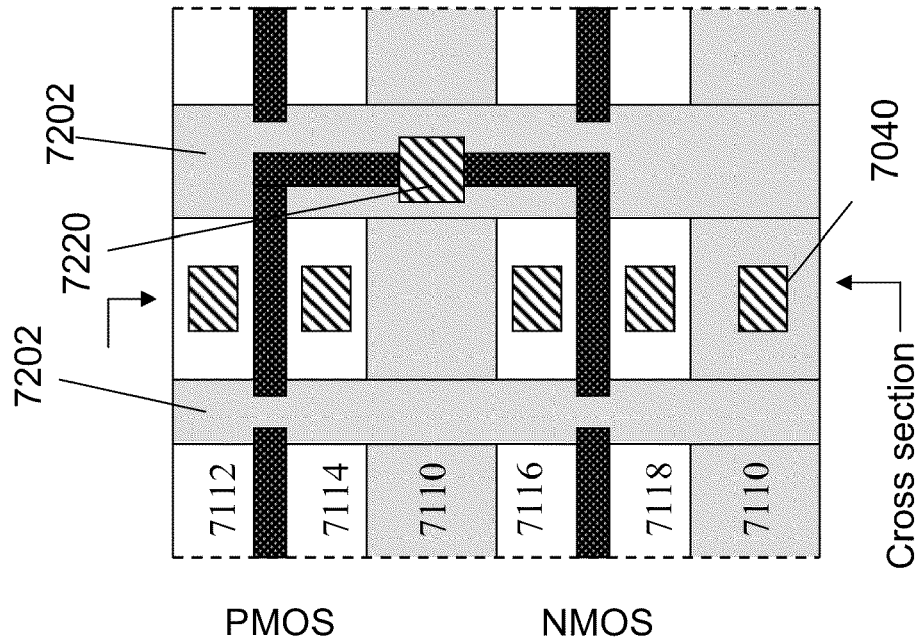
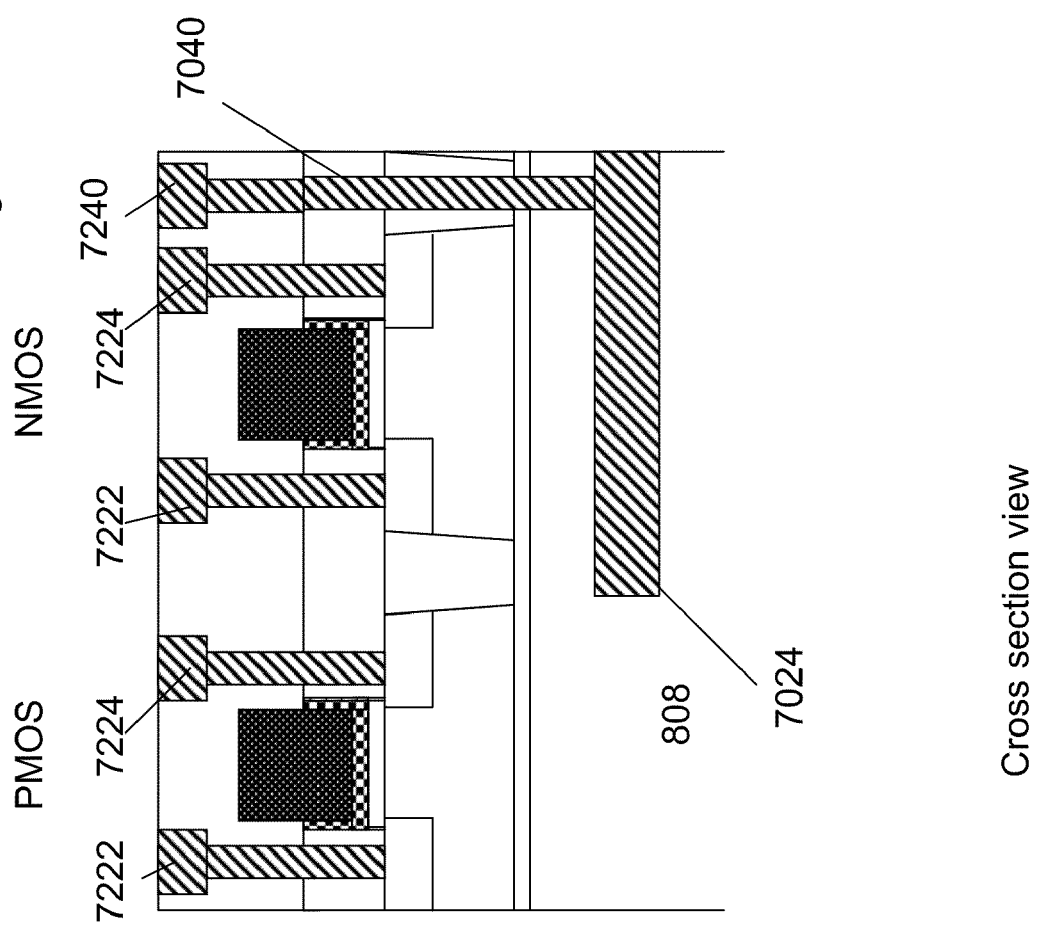
Fig 72F

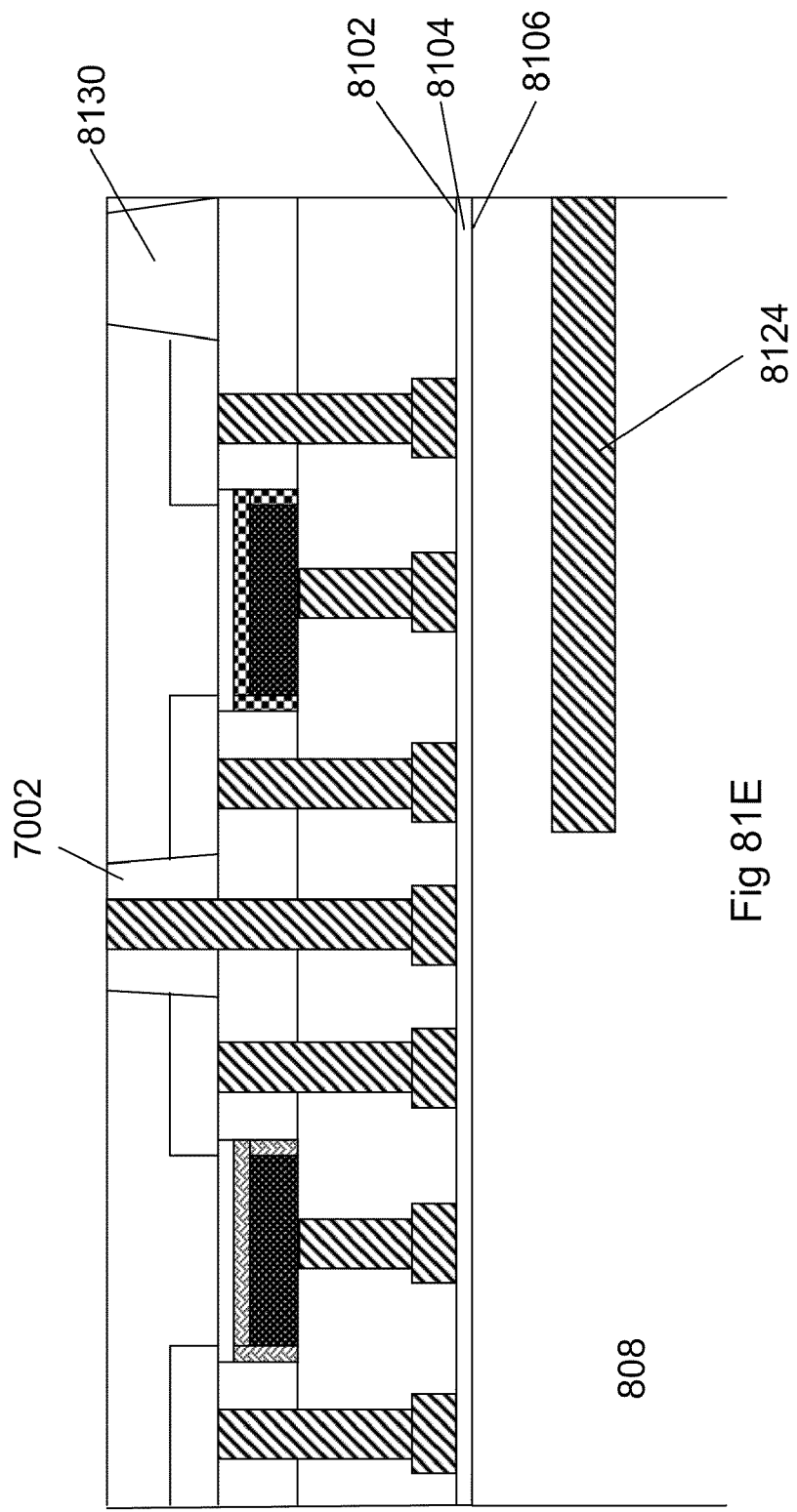

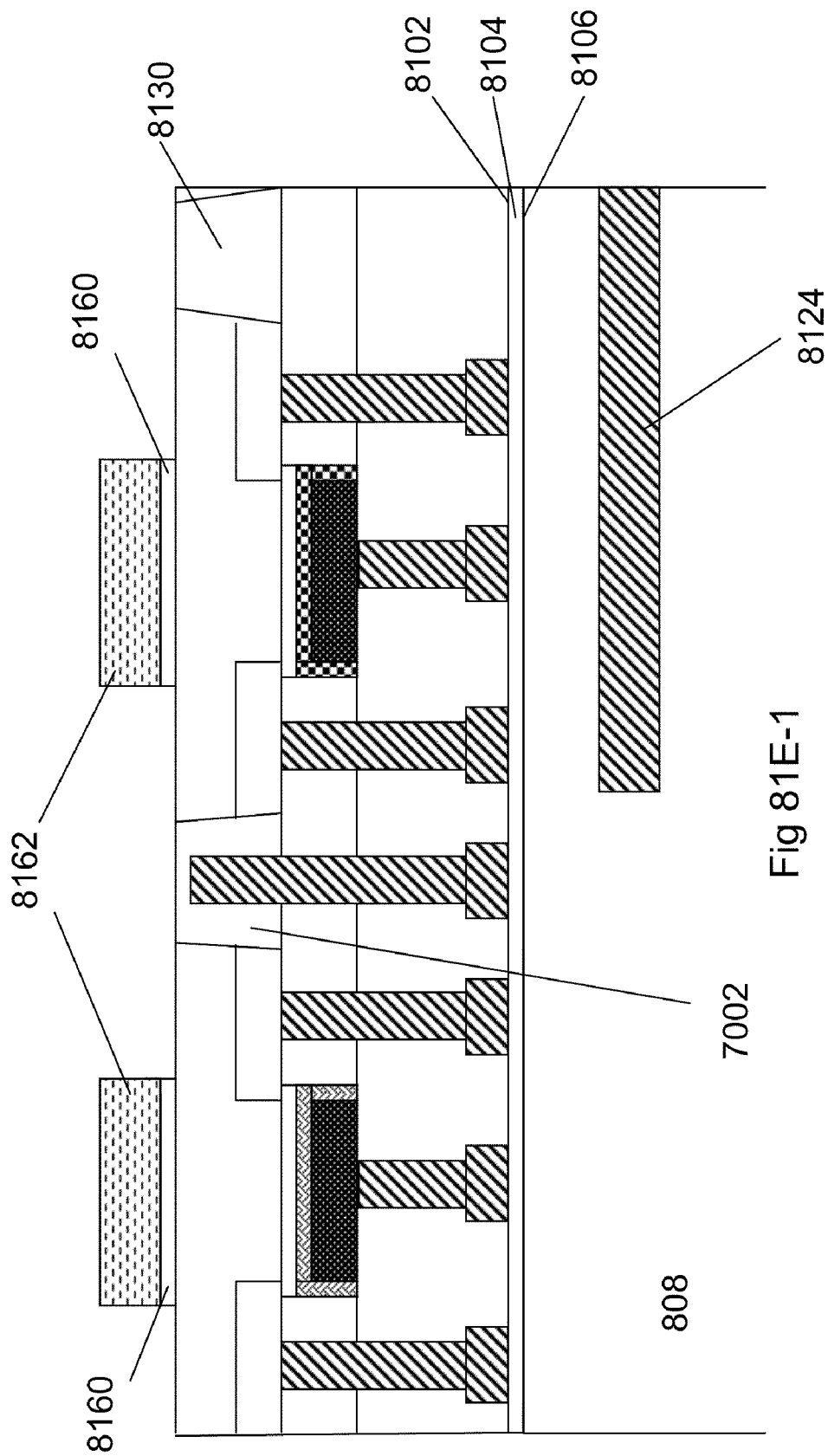

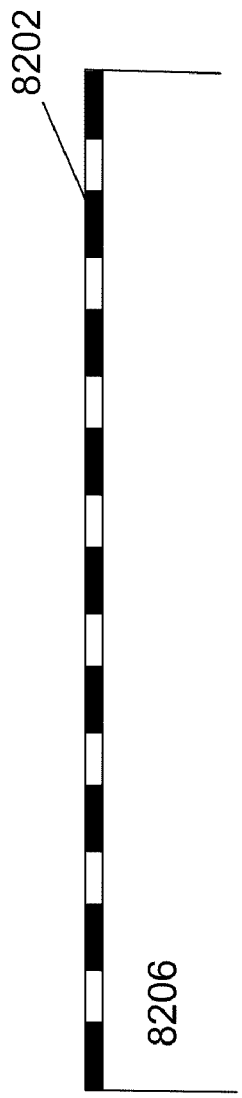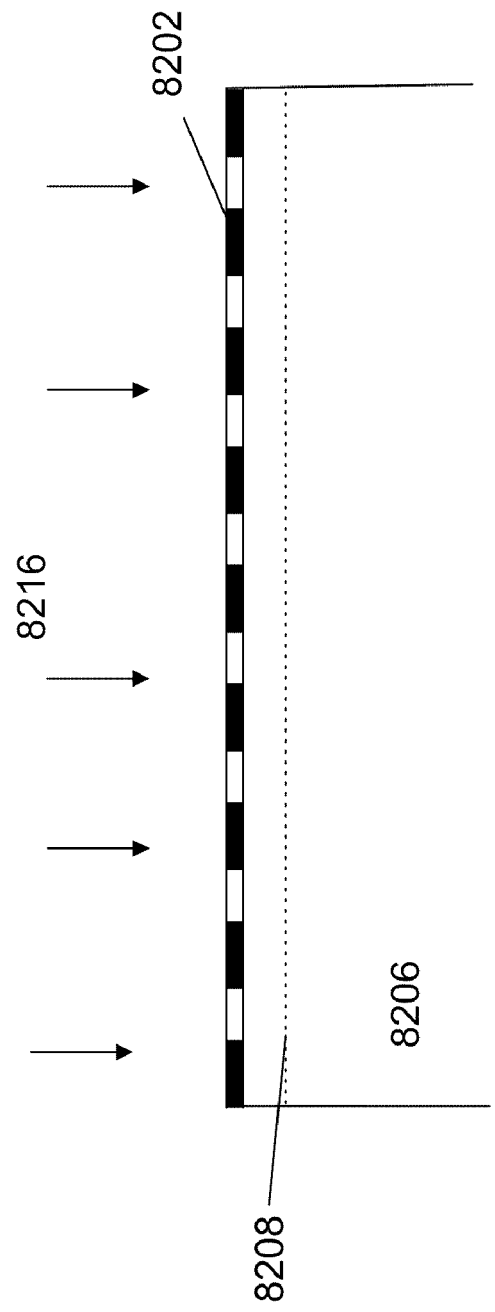

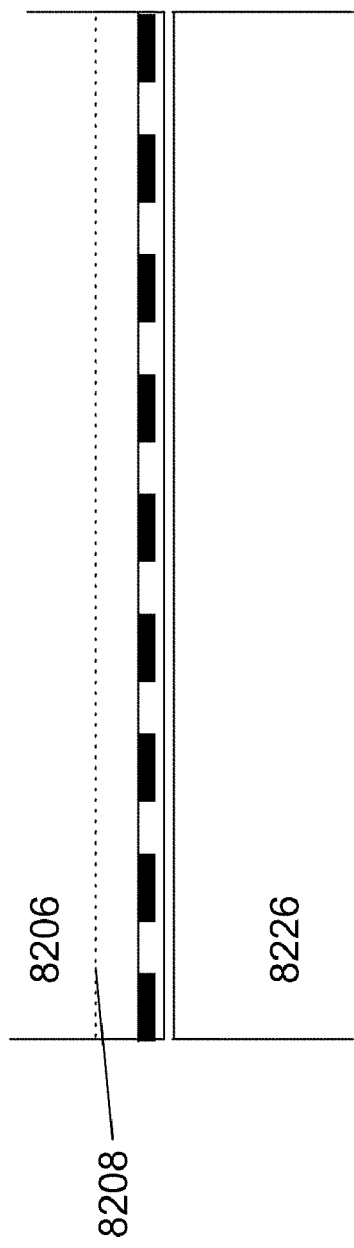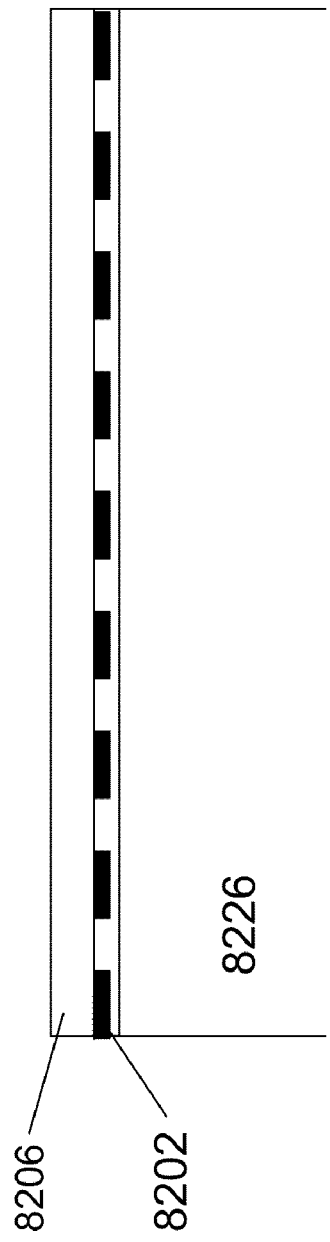

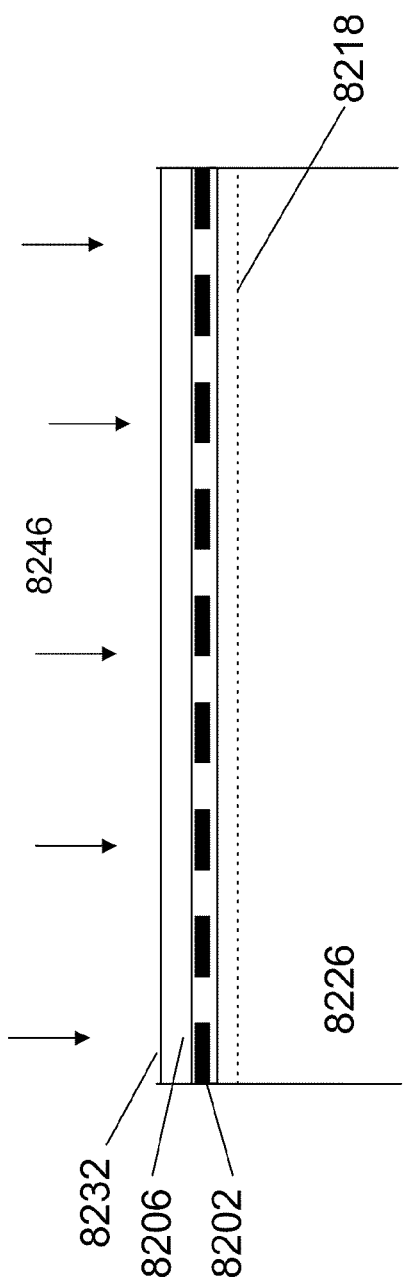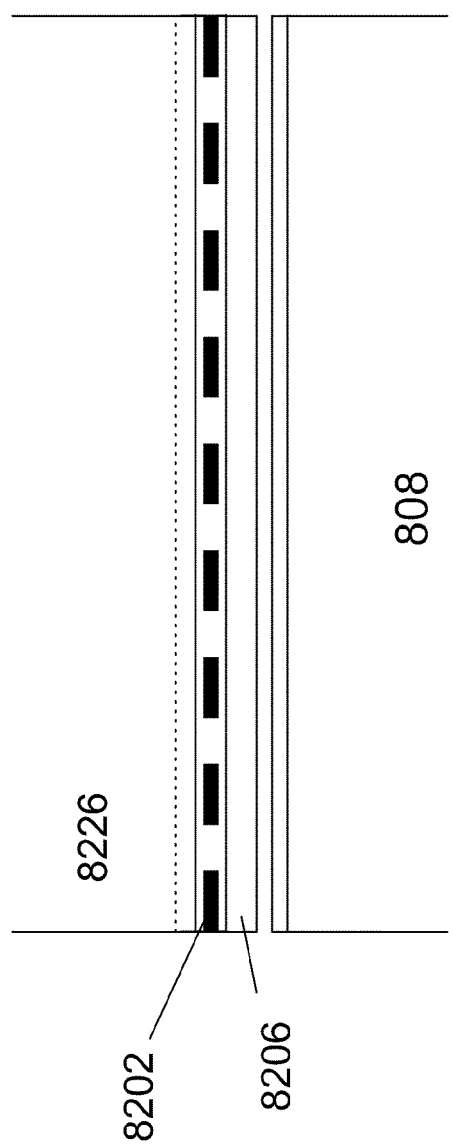

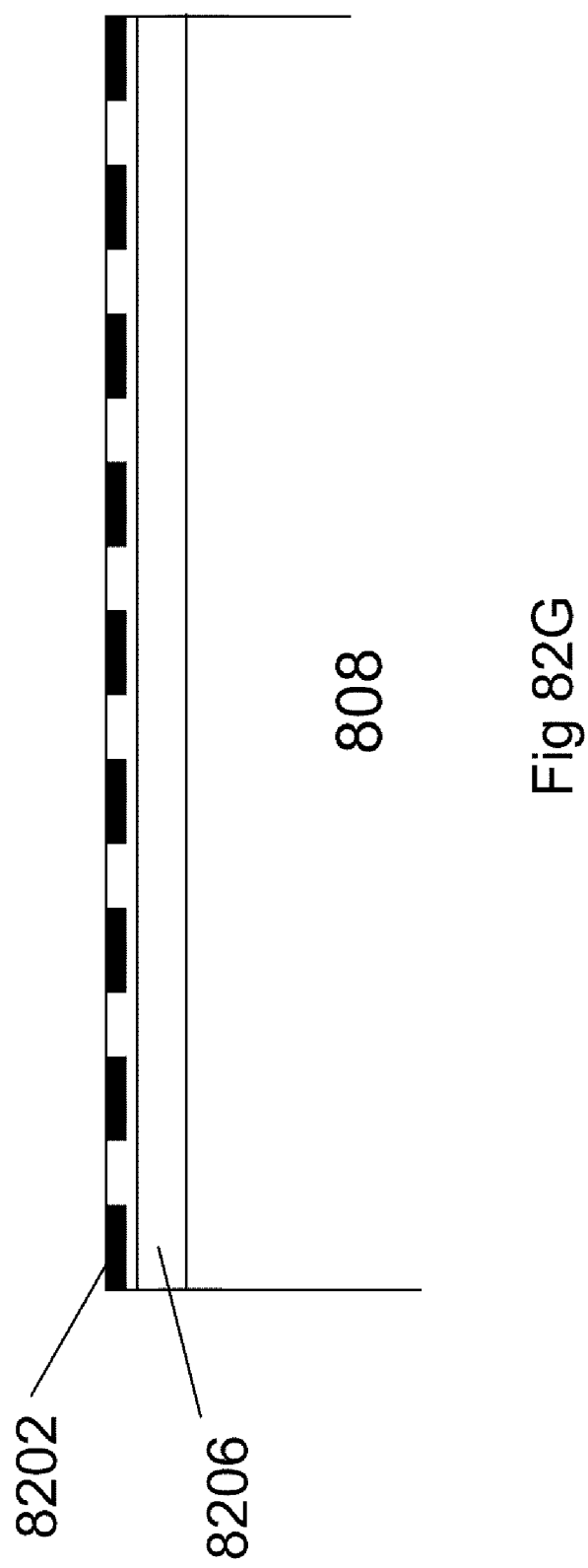

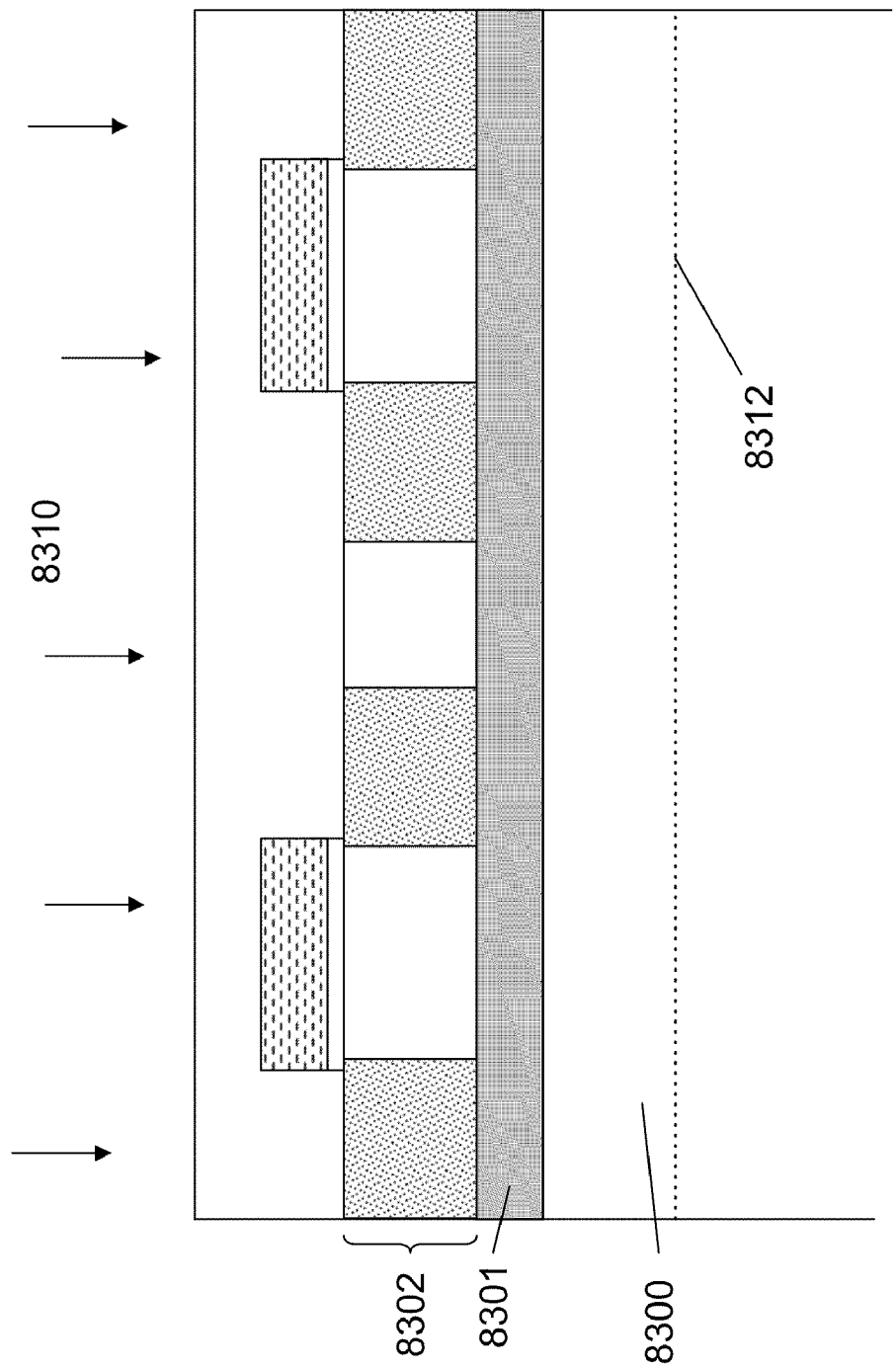

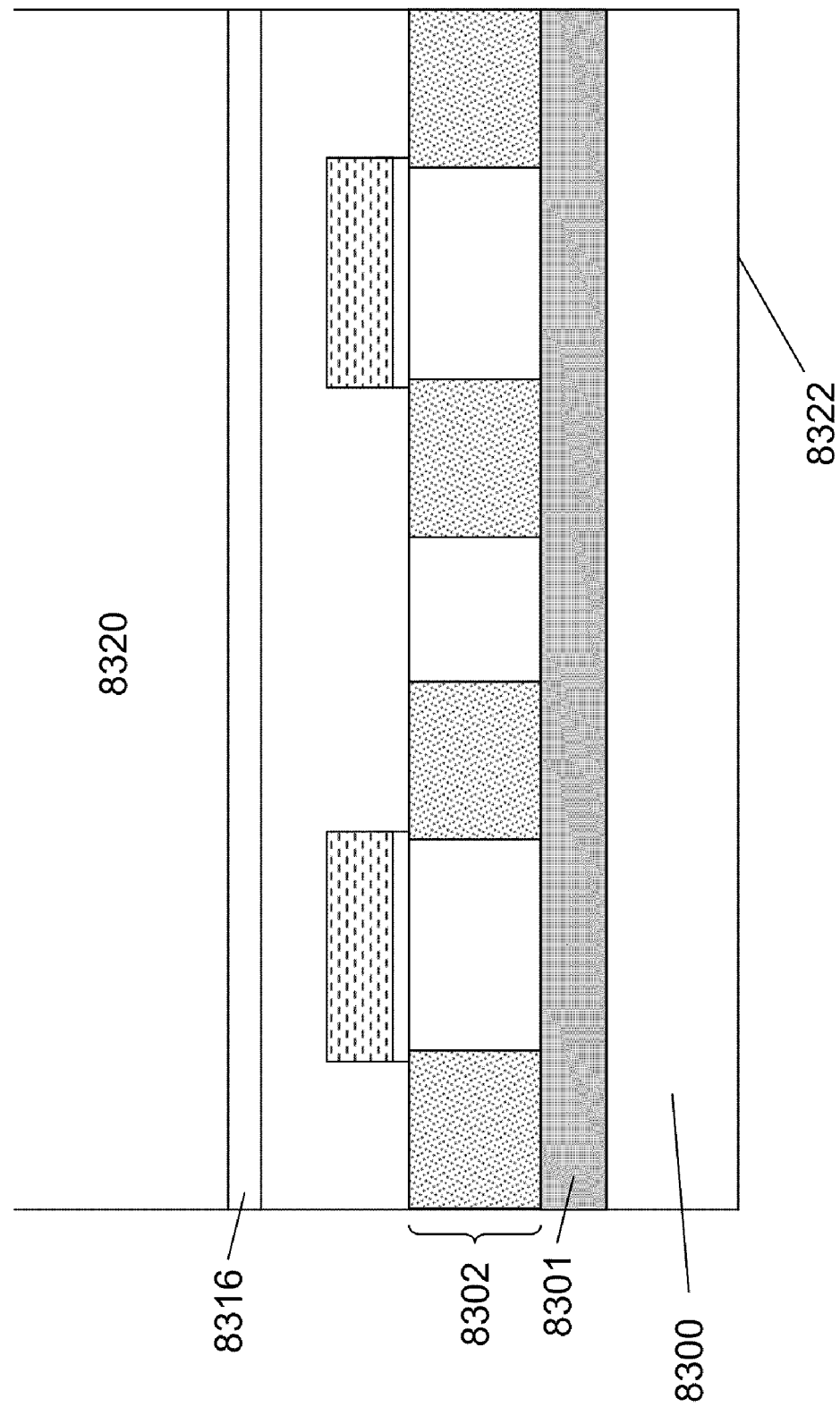

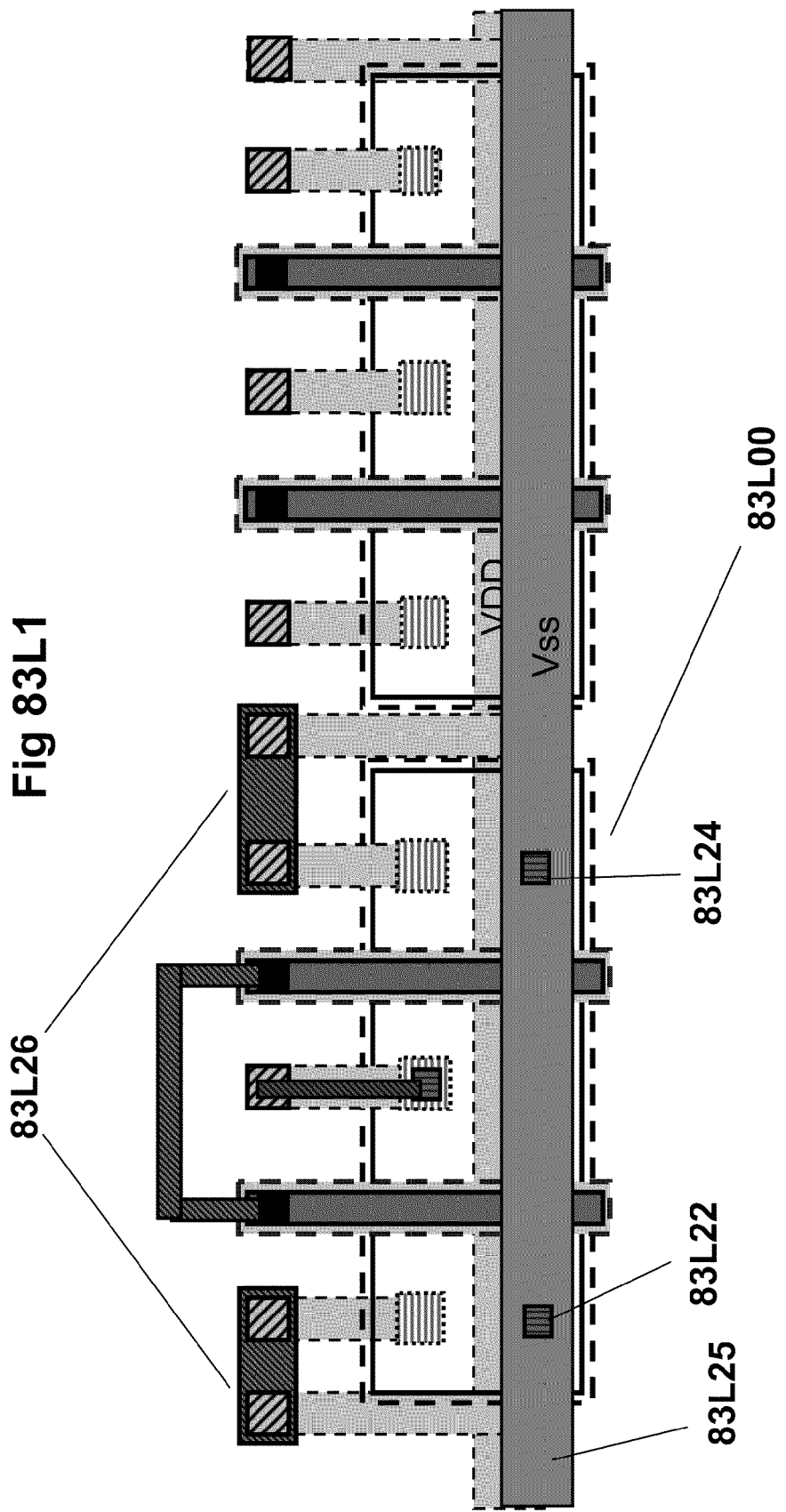
Fig 83L1

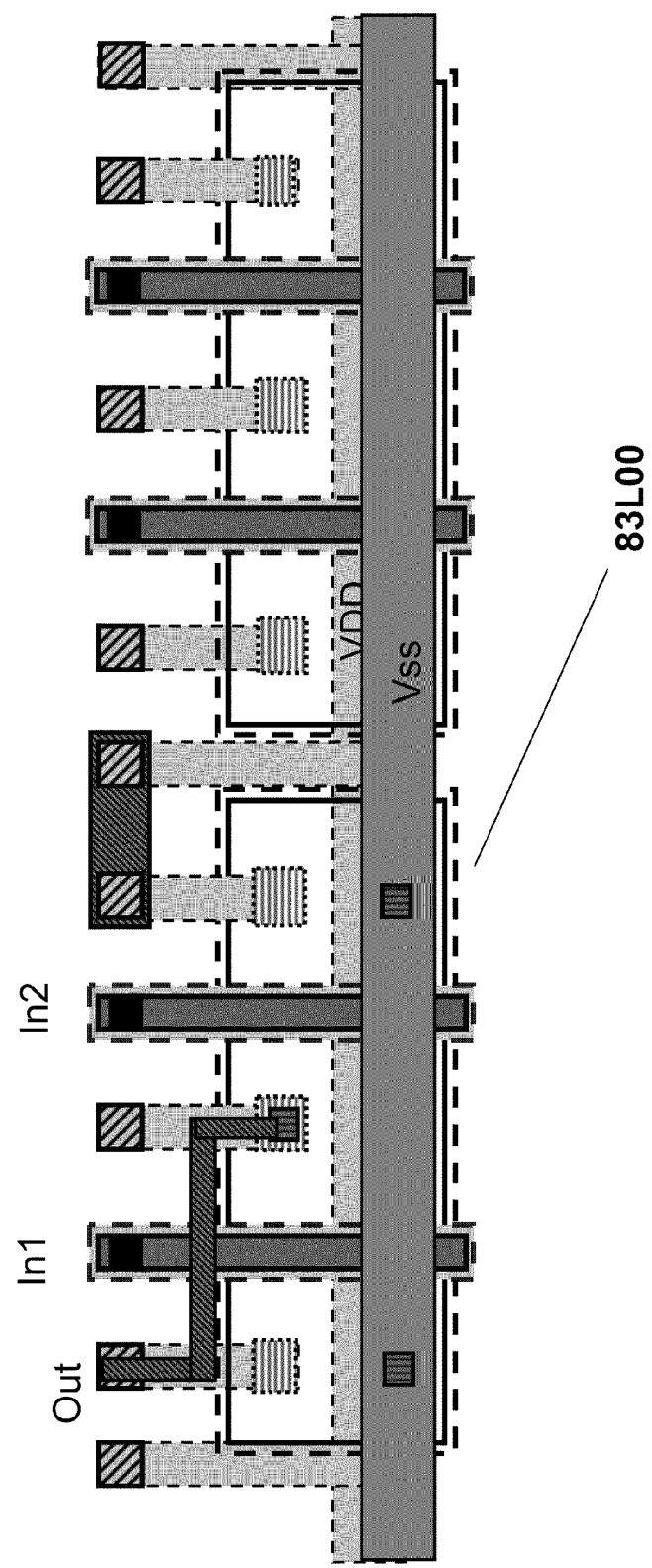
Fig 83L2

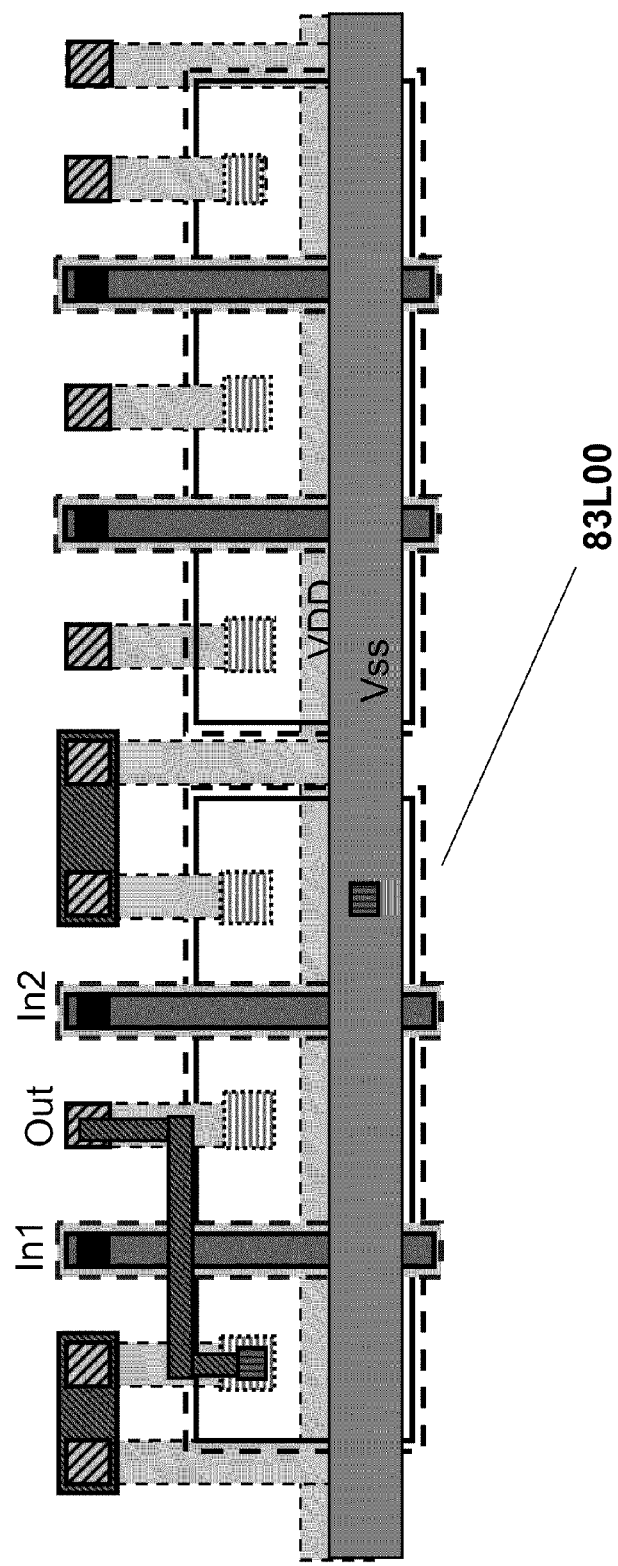
Fig 83L3

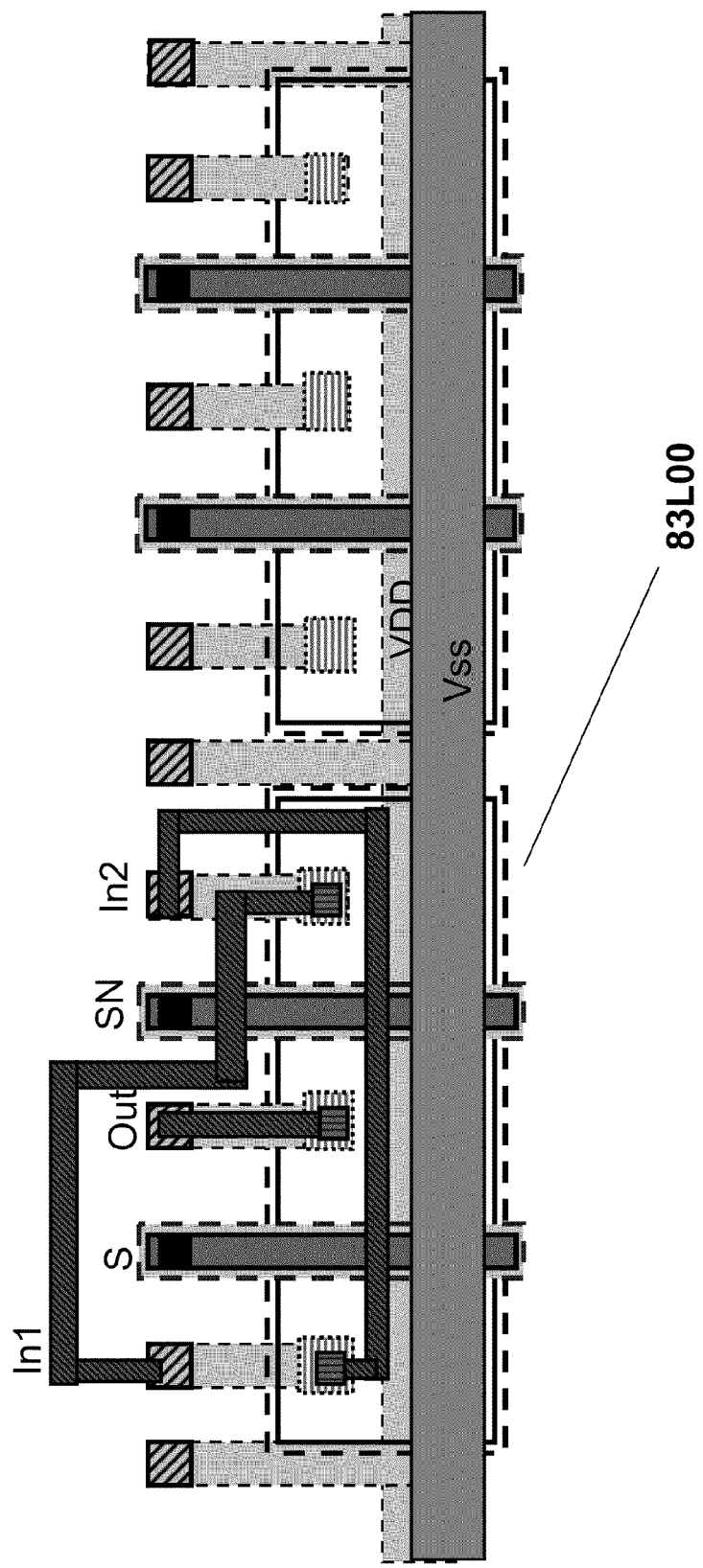
Fig 83L4

8402

8402

Fig 88
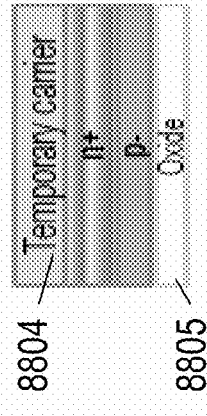
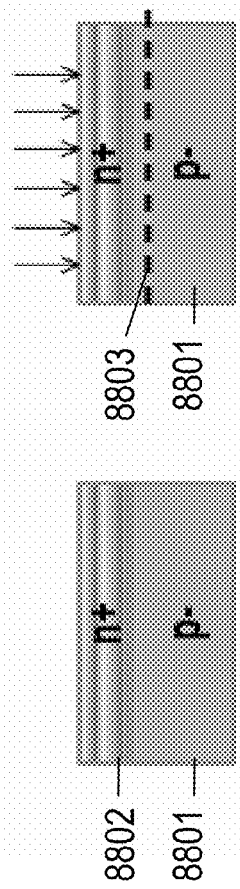
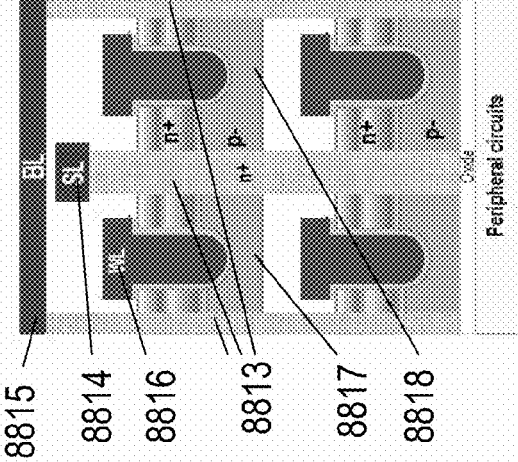
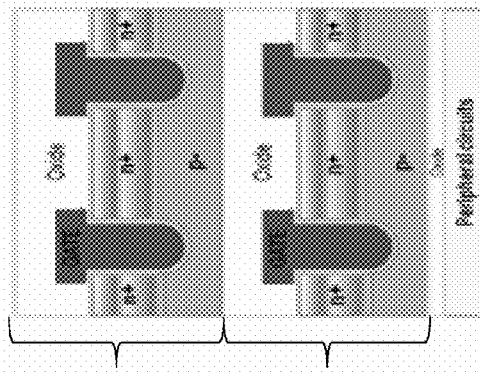
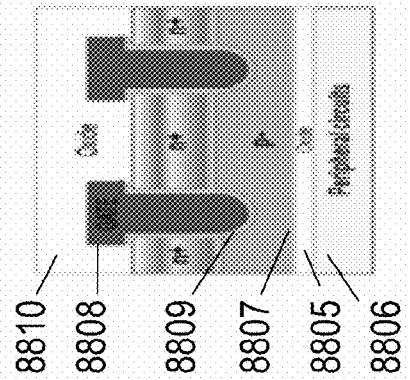

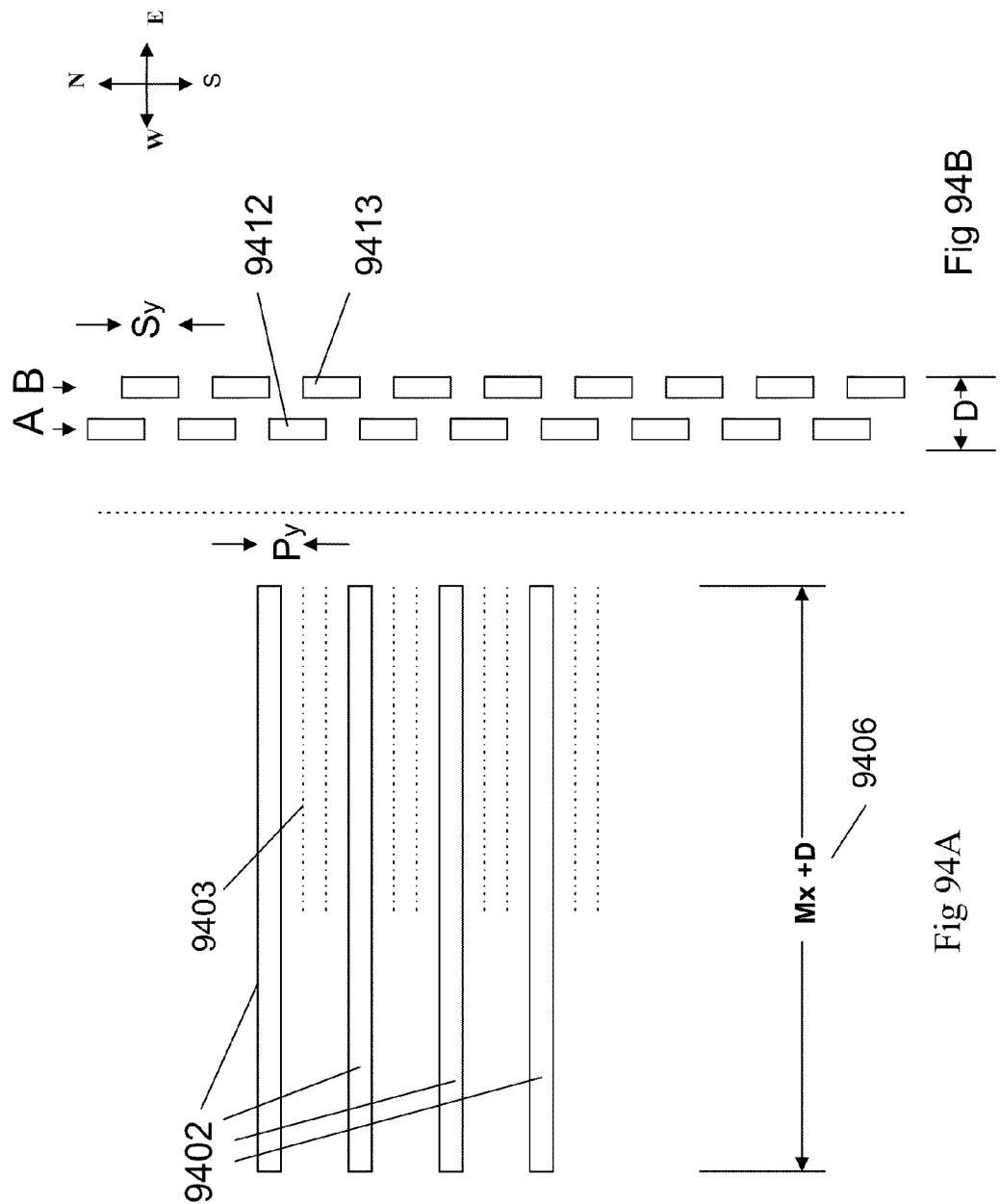

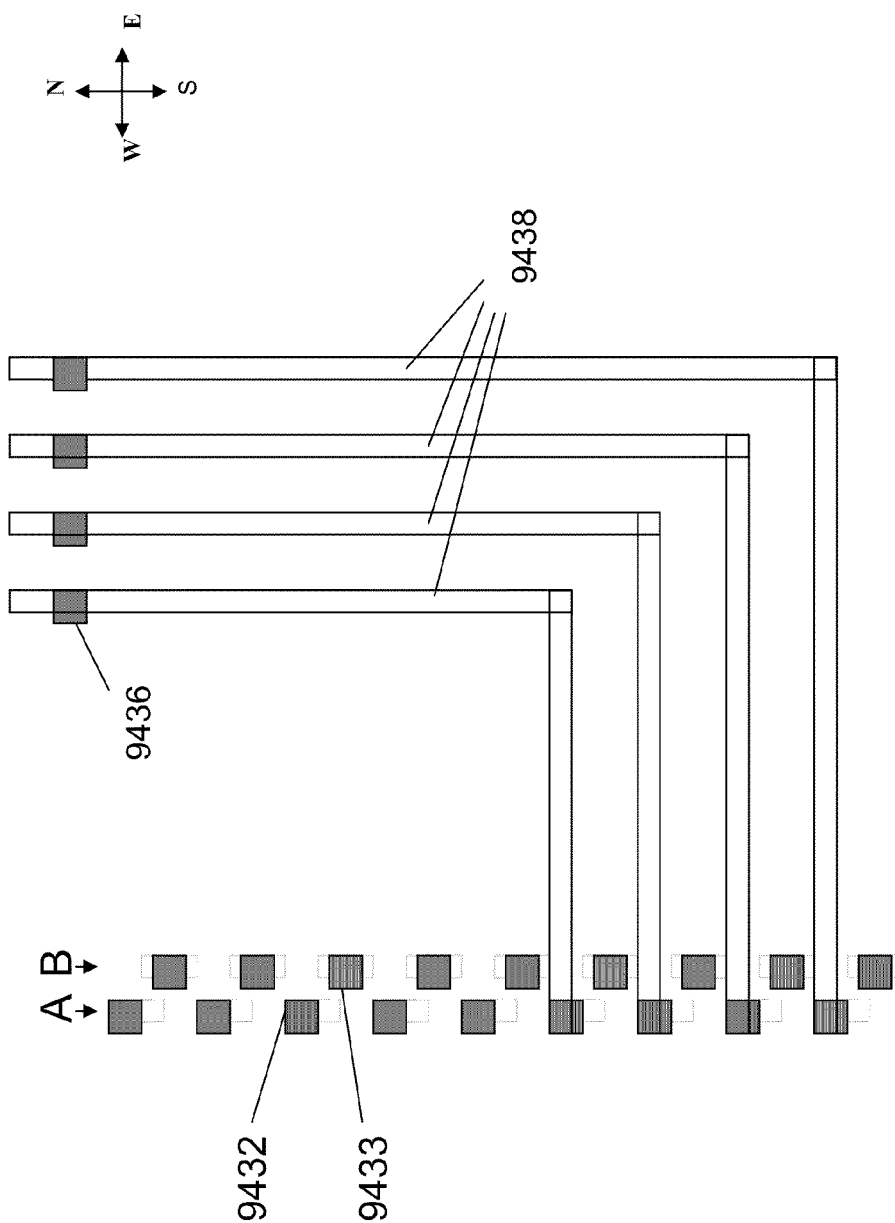

METHOD FOR FABRICATION OF A SEMICONDUCTOR DEVICE AND STRUCTURE

CROSS-REFERENCE OF RELATED APPLICATION

Background of the Invention

1. Field of the Invention

The present invention relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind are Gate Arrays, which use generic layers for all layers up to a contact layer that couples the silicon devices to the metal conductors, and Field Programmable Gate Array (FPGA) devices where all the layers are generic. The generic layers in such devices are mostly a repeating pattern structure in an array form.

The logic array technology is based on a generic fabric that is customized for a specific design during the customization stage. For an FPGA the customization is done through programming by electrical signals. For Gate Arrays, which in their modern form are sometimes called Structured Application Specific Integrated Circuits (or Structured ASICs), the customization is by at least one custom layer, which might be done with Direct Write eBeam or with a custom mask. As designs tend to be highly variable in the amount of logic and memory and type of input & output (I/O) each one needs, vendors of logic arrays create product families with a number of Master Slices covering a range of logic, memory size and I/O options. Yet, it is always a challenge to come up with minimum set of Master Slices that will provide a good fit for the maximal number of designs because it is quite costly if a dedicated mask set is required for each Master Slice.

U.S. Pat. No. 4,733,288 issued to Sato in March 1988 ("Sato"), discloses a method "to provide a gate-array LSI chip which can be cut into a plurality of chips, each of the chips having a desired size and a desired number of gates in accordance with a circuit design." The references cited in Sato present a few alternative methods to utilize a generic structure for different sizes of custom devices.

The array structure fits the objective of variable sizing. The difficulty to provide variable-sized array structure devices is due to the need of providing I/O cells and associated pads to connect the device to the package. To overcome this limitation Sato suggests a method where I/O could be constructed from the transistors that are also used for the general logic gates. Anderson also suggested a similar approach. U.S. Pat. No. 5,217,916 issued to Anderson et al. on Jun. 8, 1993, discloses a borderless configurable gate array free of pre-defined boundaries using transistor gate cells, of the same type of cells used for logic, to serve the input and output function. Accordingly, the input and output functions may be placed to surround the logic array sized for the specific application. This method places a severe limitation on the I/O cell to use the same type of transistors as used for the logic and; hence, would not allow the use of higher operating voltages for the I/O.

U.S. Pat. No. 7,105,871 issued to Or-Bach et al. on Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special serial I/O circuits called SerDes (Serializer/Deserializer) transceivers. These circuits are complex and require a far larger silicon area than conventional I/Os. Consequently, the variations needed are combinations of various amounts of logic, various amounts and types of memories, and various amounts and types of I/O. This implies that even the use of the borderless logic array of the prior art will still require multiple expensive mask sets.

The most common FPGAs in the market today are based on Static Random Access Memory (SRAM) as the programming element. Floating-Gate Flash programmable elements are also utilized to some extent. Less commonly, FPGAs use an antifuse as the programming element. The first generation of antifuse FPGAs used antifuses that were built directly in contact with the silicon substrate itself. The second generation moved the antifuse to the metal layers to utilize what is called the Metal to Metal Antifuse. These antifuses function like programmable vias. However, unlike vias that are made with the same metal that is used for the interconnection, these antifuses generally use amorphous silicon and some additional interface layers. While in theory antifuse technology could support a higher density than SRAM, the SRAM FPGAs are dominating the market today. In fact, it seems that no one is advancing Antifuse FPGA devices anymore. One of the severe disadvantages of antifuse technology has been their lack of re-programmability. Another disadvantage has been the special silicon manufacturing process required for the antifuse technology which results in extra development costs and the associated time lag with respect to baseline IC technology scaling.

The general disadvantage of common FPGA technologies is their relatively poor use of silicon area. While the end customer only cares to have the device perform his desired function, the need to program the FPGA to any function requires the use of a very significant portion of the silicon area for the programming and programming check functions.

Some embodiments of the current invention seek to overcome the prior-art limitations and provide some additional benefits by making use of special types of transistors that are fabricated above or below the antifuse configurable interconnect circuits and thereby allow far better use of the silicon area.

One type of such transistors is commonly known in the art as Thin Film Transistors or TFT. Thin Film Transistors has been proposed and used for over three decades. One of the better-known usages has been for displays where the TFT are fabricated on top of the glass used for the display. Other type of transistors that could be fabricated above the antifuse configurable interconnect circuits are called Vacuum Field Effect Transistor (FET) and was introduced three decades ago such as in U.S. Pat. No. 4,721,885.

Other techniques could also be used such as employing Silicon On Insulator (SOI) technology. In U.S. Pat. Nos. 6,355,501 and 6,821,826, both assigned to IBM, a multilayer three-dimensional Complementary Metal-Oxide-Semiconductor (CMOS) Integrated Circuit is proposed. It suggests bonding an additional thin SOI wafer on top of another SOI wafer forming an integrated circuit on top of another integrated circuit and connecting them by the use of a through-silicon-via. Substrate supplier Soitec SA, of Bernin, France is now offering a technology for stacking of a thin layer of a processed wafer on top of a base wafer.

Integrating top layer transistors above an insulation layer is not common in an IC because the quality and density of prior art top layer transistors are inferior to those formed in the base (or substrate) layer. The substrate may be formed of crystallized silicon and may be ideal for producing high density and high quality transistors, and hence preferable. There are some applications where it has been suggested to build memory cells using such transistors as in U.S. Pat. Nos. 6,815,781, 7,446,563 and a portion of an SRAM based FPGA such as in U.S. Pat. Nos. 6,515,511 and 7,265,421.

Embodiments of the current invention seek to take advantage of the top layer transistor to provide a much higher density antifuse-based programmable logic. An additional advantage for such use will be the option to further reduce cost in high volume production by utilizing custom mask(s) to replace the antifuse function, thereby eliminating the top layer(s) anti-fuse programming logic altogether.

Additionally some embodiments of the invention may provide innovative alternatives for multi layer 3D IC technology. As on-chip interconnects are becoming the limiting factor for performance and power enhancement with device scaling, 3D IC may be an important technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. The current invention may provide multiple alternatives for 3D IC with an order of magnitude improvement in vertical connectivity.

Additionally the 3D technology according to some embodiments of the current invention may enable some very innovative IC alternatives with reduced development costs, increased yield, and other important benefits.

SUMMARY

Embodiments of the present invention seek to provide a new method for semiconductor device fabrication that may be highly desirable for custom products. Embodiments of the current invention suggest the use of a Re-programmable anti-fuse in conjunction with 'Through Silicon Via' to construct a new type of configurable logic, or as usually called, FPGA devices. Embodiments of the current invention may provide a solution to the challenge of high mask-set cost and low flexibility that exists in the current common methods of semiconductor fabrication. An additional advantage of some embodiments of the invention is that it could reduce the high cost of manufacturing the many different mask sets required in order to provide a commercially viable range of master slices. Embodiments of the current invention may improve upon the prior art in many respects, which may include the way the semiconductor device is structured and methods related to the fabrication of semiconductor devices.

Embodiments of the current invention reflect the motivation to save on the cost of masks with respect to the investment that would otherwise have been required to put in place a commercially viable set of master slices. Embodiments of the current invention also seek to provide the ability to incorporate various types of memory blocks in the configurable device. Embodiments of the current invention provide a method to construct a configurable device with the desired amount of logic, memory, I/Os, and analog functions.

In addition, embodiments of the current invention allow the use of repeating logic tiles that provide a continuous terrain of logic. Embodiments of the current invention show that with Through-Silicon-Via (TSV) a modular approach could be used to construct various configurable systems. Once a standard size and location of TSV has been defined one could build various configurable logic dies, configurable memory dies, configurable I/O dies and configurable analog dies which could be connected together to construct various configurable systems. In fact it may allow mix and match between configurable dies, fixed function dies, and dies manufactured in different processes.

Embodiments of the current invention seek to provide additional benefits by making use of special type of transistors that are placed above or below the antifuse configurable interconnect circuits and thereby allow a far better use of the silicon area. In general an FPGA device that utilizes antifuses to configure the device function may include the electronic circuits to program the antifuses. The programming circuits may be used primarily to configure the device and are mostly an overhead once the device is configured. The programming voltage used to program the antifuse may typically be significantly higher than the voltage used for the operating circuits of the device. The design of the antifuse structure may be designed such that an unused antifuse will not accidentally get fused. Accordingly, the incorporation of the antifuse programming in the silicon substrate may require special attention for this higher voltage, and additional silicon area may, accordingly, be required.

Unlike the operating transistors that are desired to operate as fast as possible, to enable fast system performance, the programming circuits could operate relatively slowly. Accordingly using a thin film transistor for the programming circuits could fit very well with the required function and would reduce the required silicon area.

The programming circuits may, therefore, be constructed with thin film transistors, which may be fabricated after the fabrication of the operating circuitry, on top of the configurable interconnection layers that incorporate and use the antifuses. An additional advantage of such embodiments of the invention is the ability to reduce cost of the high volume production. One may only need to use mask-defined links instead of the antifuses and their programming circuits. This will in most cases require one custom via mask, and this may save steps associated with the fabrication of the antifuse layers, the thin film transistors, and/or the associated connection layers of the programming circuitry.

In accordance with an embodiment of the present invention an Integrated Circuit device is thus provided, comprising; a plurality of antifuse configurable interconnect circuits and plurality of transistors to configure at least one of said antifuse; wherein said transistors are fabricated after said antifuse.

Further provided in accordance with an embodiment of the present invention is an Integrated Circuit device comprising; a plurality of antifuse configurable interconnect circuits and plurality of transistors to configure at least one of said antifuse; wherein said transistors are placed over said antifuse.

Still further in accordance with an embodiment of the present invention the Integrated Circuit device comprises second antifuse configurable logic cells and plurality of second transistors to configure said second antifuse wherein these second transistors are fabricated before said second antifuse.

Still further in accordance with an embodiment of the present invention the Integrated Circuit device comprises also second antifuse configurable logic cells and a plurality of second transistors to configure said second antifuse wherein said second transistors are placed underneath said second antifuse.

Further provided in accordance with an embodiment of the present invention is an Integrated Circuit device comprising; first antifuse layer, at least two metal layers over it and a second antifuse layer over this two metal layers.

In accordance with an embodiment of the present invention a configurable logic device is presented, comprising: antifuse configurable look up table logic interconnected by antifuse configurable interconnect.

In accordance with an embodiment of the present invention a configurable logic device is also provided, comprising: plurality of configurable look up table logic, plurality of configurable programmable logic array (PLA) logic, and plurality of antifuse configurable interconnect.

In accordance with an embodiment of the present invention a configurable logic device is also provided, comprising: plurality of configurable look up table logic and plurality of configurable drive cells wherein the drive cells are configured by plurality of antifuses.

In accordance with an embodiment of the present invention a configurable logic device is additionally provided, comprising: configurable logic cells interconnected by a plurality of antifuse configurable interconnect circuits wherein at least one of the antifuse configurable interconnect circuits is configured as part of a non volatile memory.

Further in accordance with an embodiment of the present invention the configurable logic device comprises at least one antifuse configurable interconnect circuit, which is also configurable to a PLA function.

In accordance with an alternative embodiment of the present invention an integrated circuit system is also provided, comprising a configurable logic die and an I/O die wherein the configurable logic die is connected to the I/O die by the use of Through-Silicon-Via.

Further in accordance with an embodiment of the present invention the integrated circuit system comprises; a configurable logic die and a memory die wherein these dies are connected by the use of Through-Silicon-Via.

Still further in accordance with an embodiment of the present invention the integrated circuit system comprises a first configurable logic die and second configurable logic die wherein the first configurable logic die and the second configurable logic die are connected by the use of Through-Silicon-Via.

Moreover in accordance with an embodiment of the present invention the integrated circuit system comprises an I/O die that was fabricated utilizing a different process than the process utilized to fabricate the configurable logic die.

Further in accordance with an embodiment of the present invention the integrated circuit system comprises at least two logic dies connected by the use of Through-Silicon-Via and wherein some of the Through-Silicon-Vias are utilized to carry the system bus signal.

Moreover in accordance with an embodiment of the present invention the integrated circuit system comprises at least one configurable logic device.

Further in accordance with an embodiment of the present invention the integrated circuit system comprises, an antifuse configurable logic die and programmer die and these dies are connected by the use of Through-Silicon-Via.

Additionally there is a growing need to reduce the impact of inter-chip interconnects. In fact interconnects are now dominating IC performance and power. One solution to shorten interconnect may be to use 3D IC. Currently, the only known way for general logic 3D IC is to integrate finished device one on top of the other by utilizing Through-Silicon-Vias as now called TSVs. The problem with TSVs is that their large size, usually a few microns each, may lead to severely limitations. Some embodiments of the current invention may provide multiple alternatives to constructing 3D IC wherein many connections may be made less than one micron in size, thus enabling the use of 3D IC for most device applications.

Additionally some embodiments of this invention may offer new device alternatives by utilizing the proposed 3D IC technology.

BRIEF DESCRIPTION OF THE DRAWINGS

Various embodiments of the present invention will be understood and appreciated more fully from the following detailed description, taken in conjunction with the drawings in which:

FIG. 29A-29G are drawing illustrations of formations of top planar transistors;

FIG. 32 is a drawing illustration of a measured alignment offset;

FIG. 33A, 33B is a drawing illustration of a connection strip;

FIG. 34A-34E are drawing illustrations of pre-processed wafers used for a layer transfer;

FIG. 35A-35G are drawing illustrations of formations of top planar transistors;

FIG. 39A-39C are drawing illustration of pre-processed wafers used for vertical transistors;

FIG. 40A-40I are drawing illustrations of a vertical n-MOSFET top transistor;

FIG. 52A, 52B are device simulations of a junction-less transistor;

FIG. 54 A-C are drawing illustrations of the formation of a junction-less transistor;

FIG. 57A-G are drawing illustrations of the formation of a junction-less transistor;

FIG. 66 are drawing illustrations of recessed channel array transistors;

FIG. 67A-F are drawing illustrations of formation of recessed channel array transistors;

FIG. 68A-F are drawing illustrations of formation of spherical recessed channel array transistors;

FIG. 72 A-F are drawing illustrations of formation of top planar transistors;

FIG. 82 A-G are drawing illustrations of a formation of top planar transistors;

FIG. 83 L1-L4 are drawing illustrations of a formation of top planar transistors;

FIG. 88 A-F are drawing illustrations of a formation of 3D DRAM;

Figure 1:
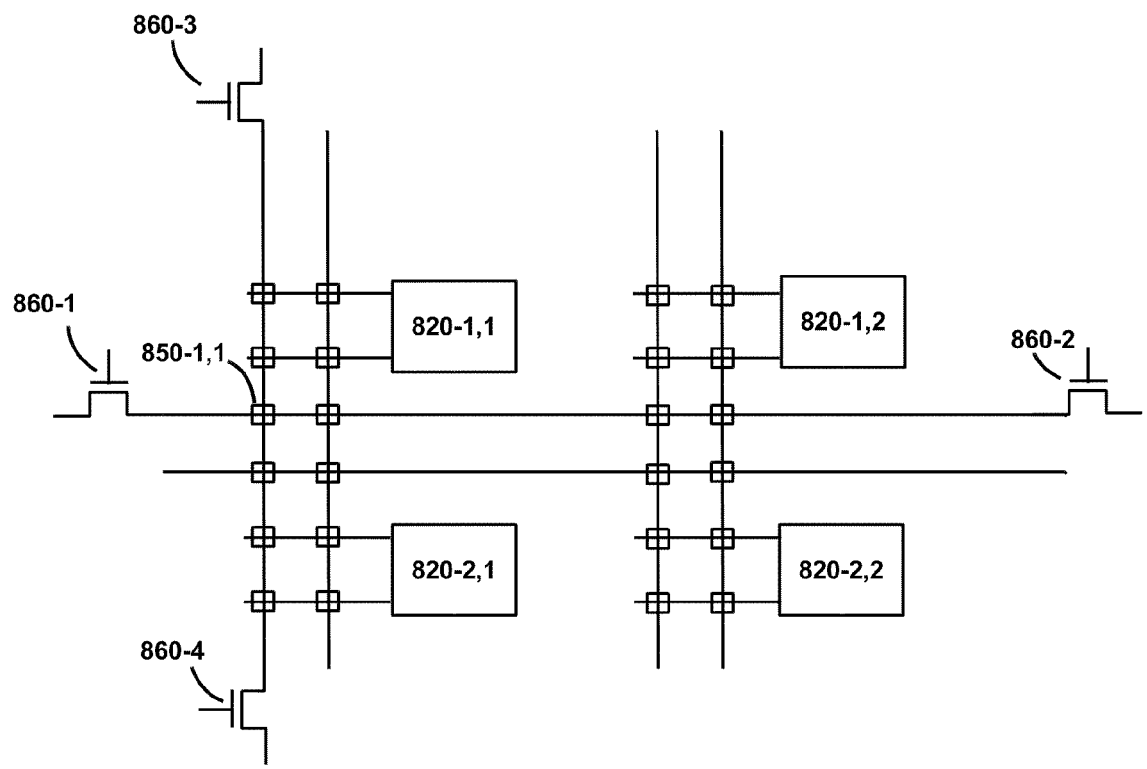
FIG. 1 is a circuit diagram illustration of a prior art.

FIG. 93 A-D are drawing illustrations of an advanced TSV flow; and

FIG. 94 A-C are drawing illustrations of an advanced TSV multi-connections flow.

DETAILED DESCRIPTION

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

FIG. 1 illustrates a circuit diagram illustration of a prior art, where, for example, 860-1 to 860-4 are the programming transistors to program antifuse 850-1,1.

Figure 81A:
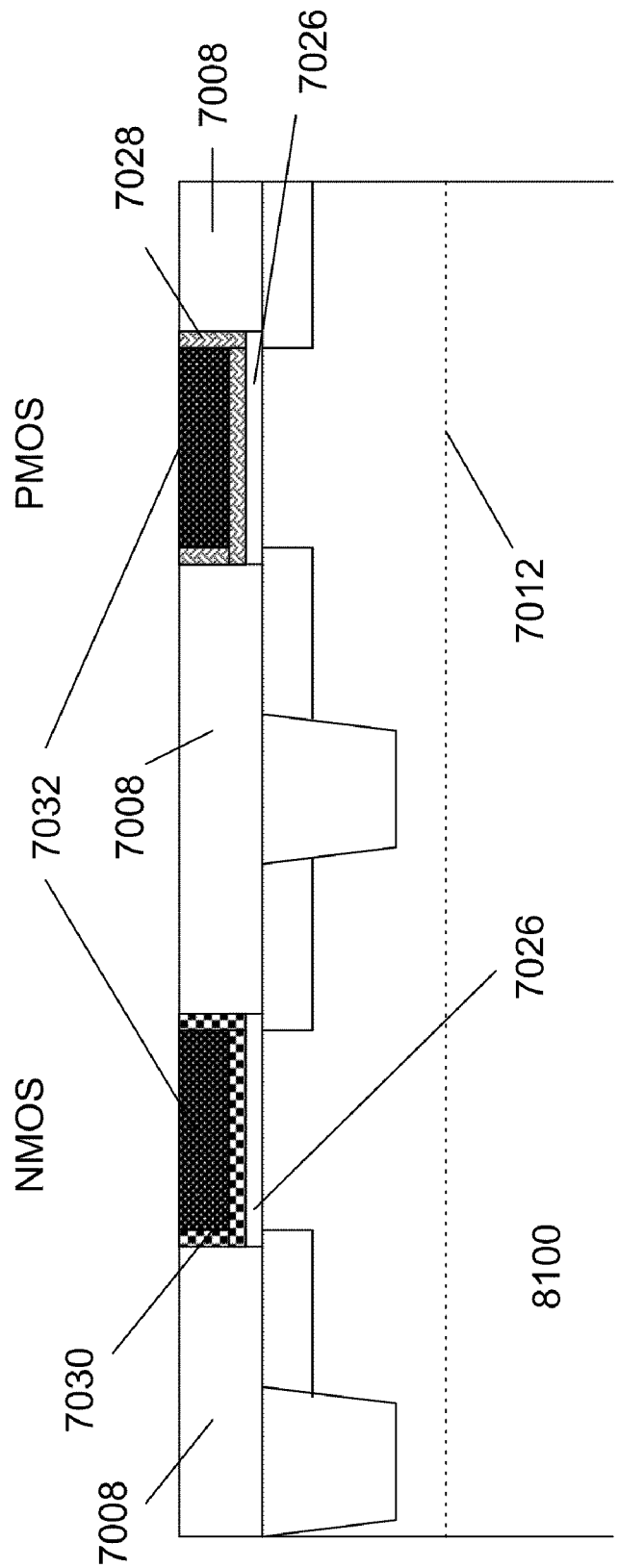
FIG. 81 A-F are drawing illustrations of a formation of top planar transistors.
Figure 81B:
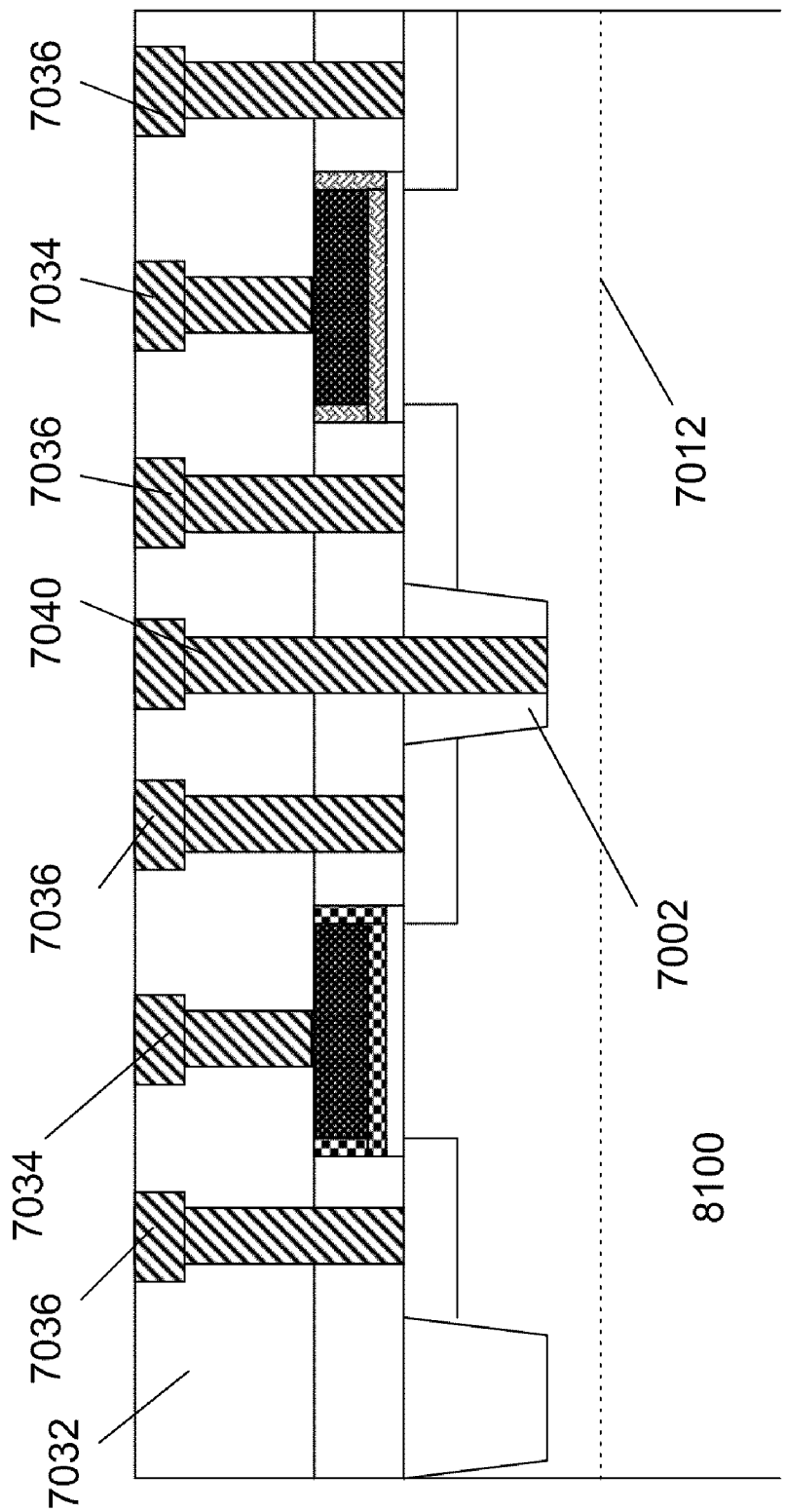
Figure 81C:
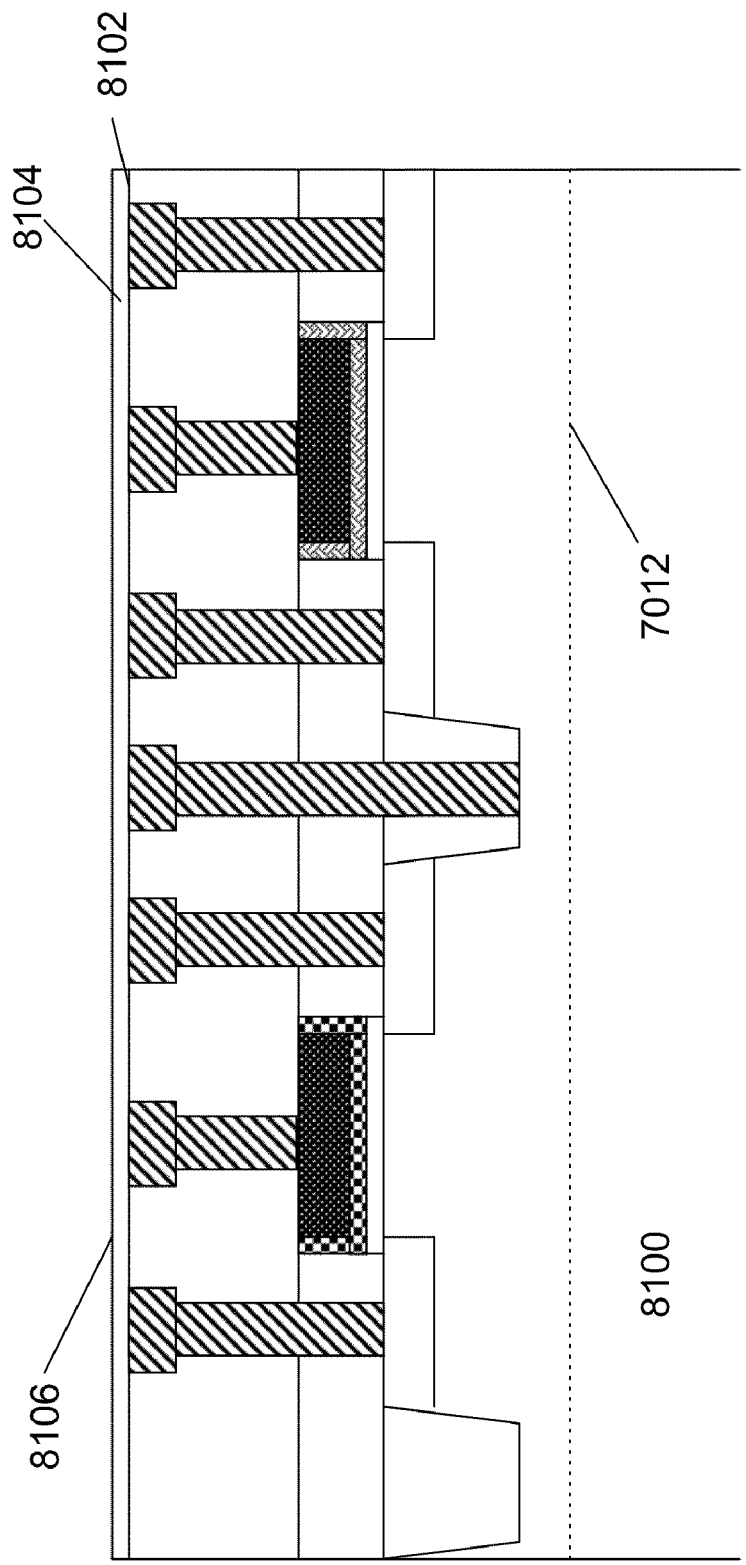
Figure 81D:
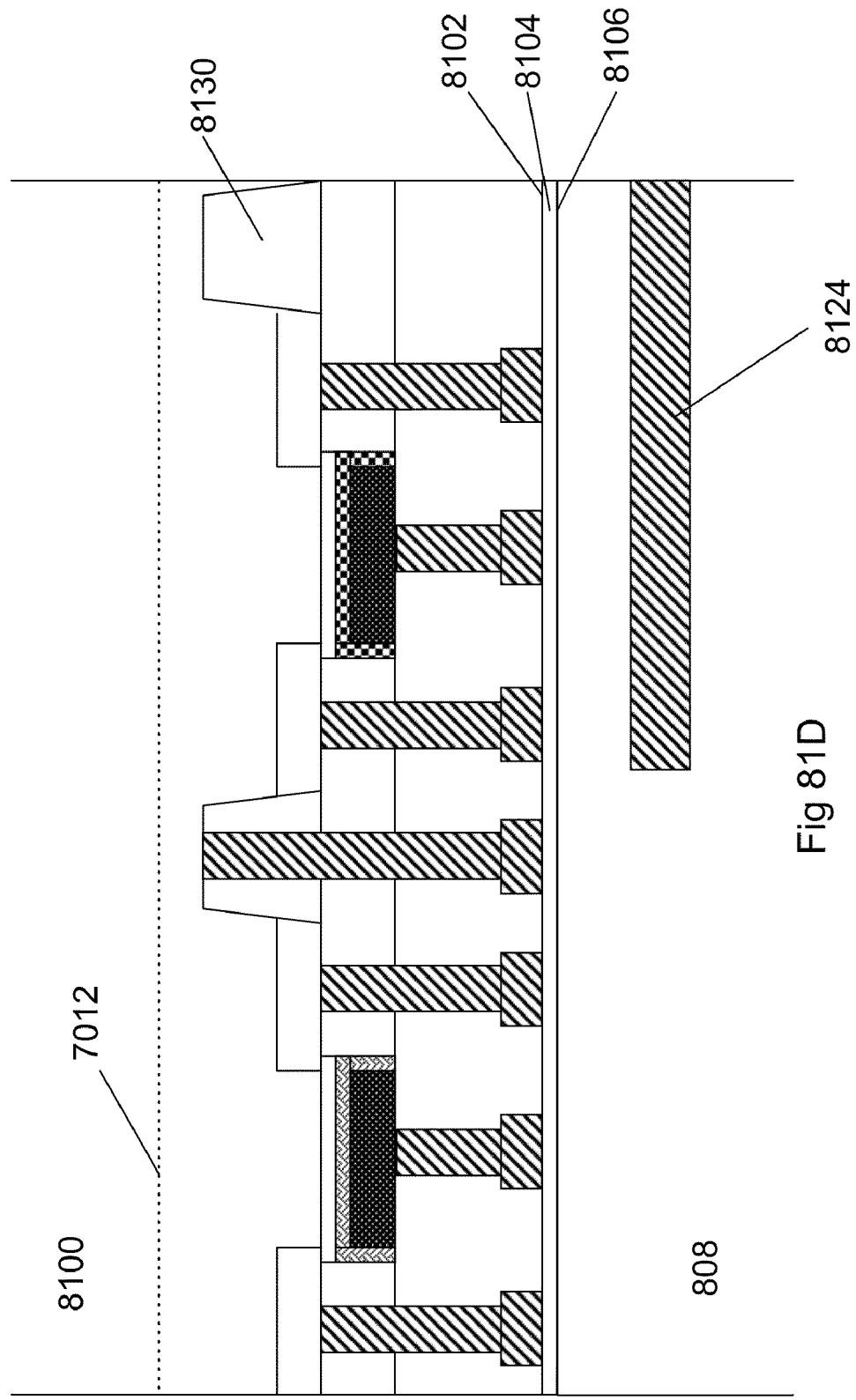
Figure 81F:
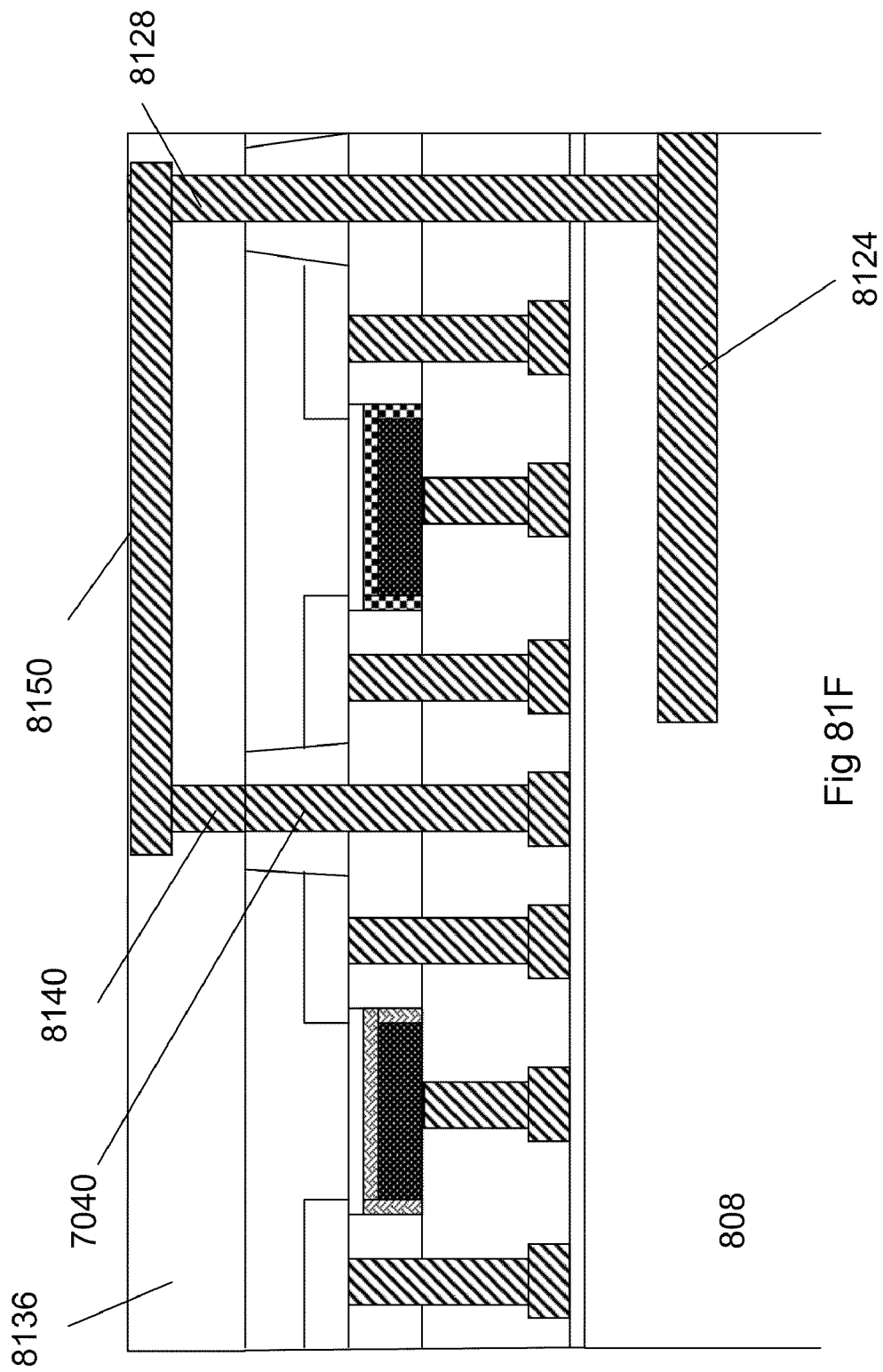
Figures 1, 81F:
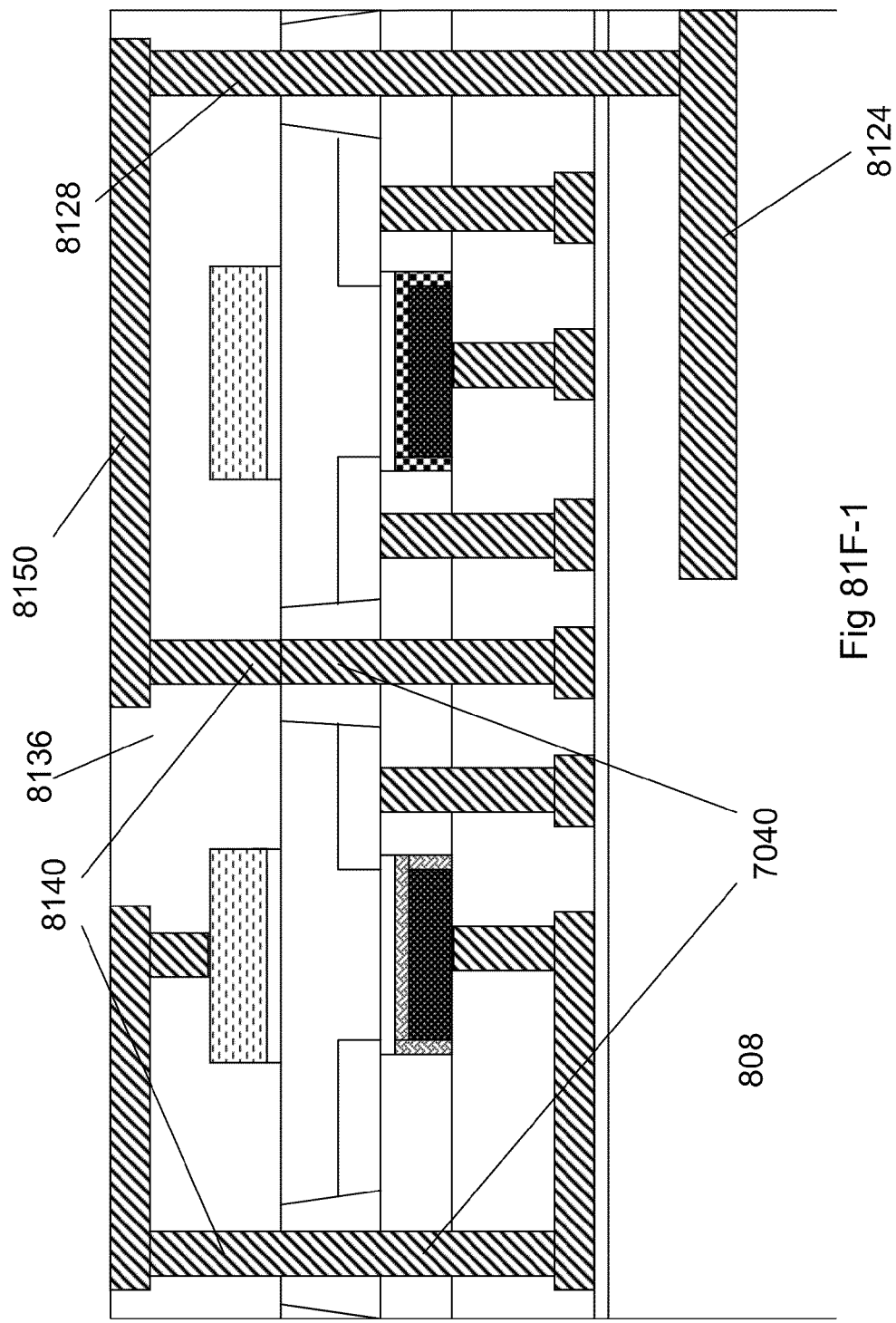
Figures 2, 81F:
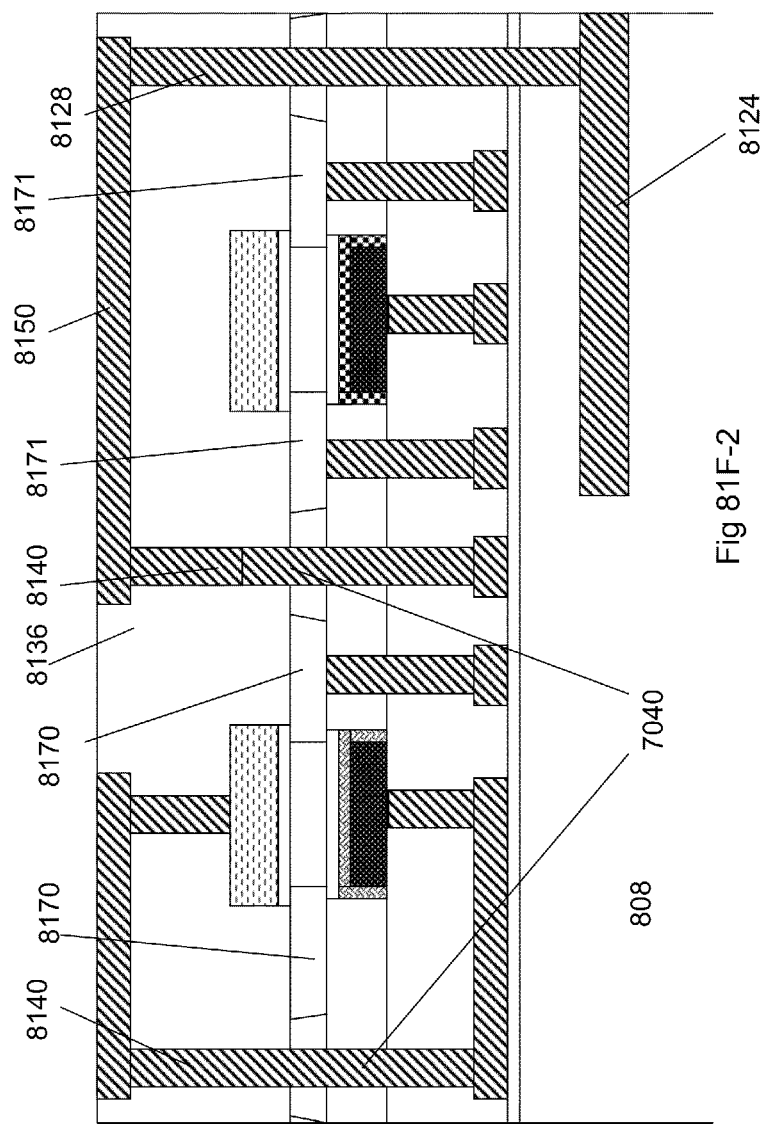
FIG. 2 is a cross-section illustration of a portion of a prior art represented by the circuit diagram of FIG. 1.

FIG. 2 is a cross-section illustration of a portion of a prior art represented by the circuit diagram of FIG. 1 showing the programming transistor 860-1 built as part of the silicon substrate.

Figure 3A:
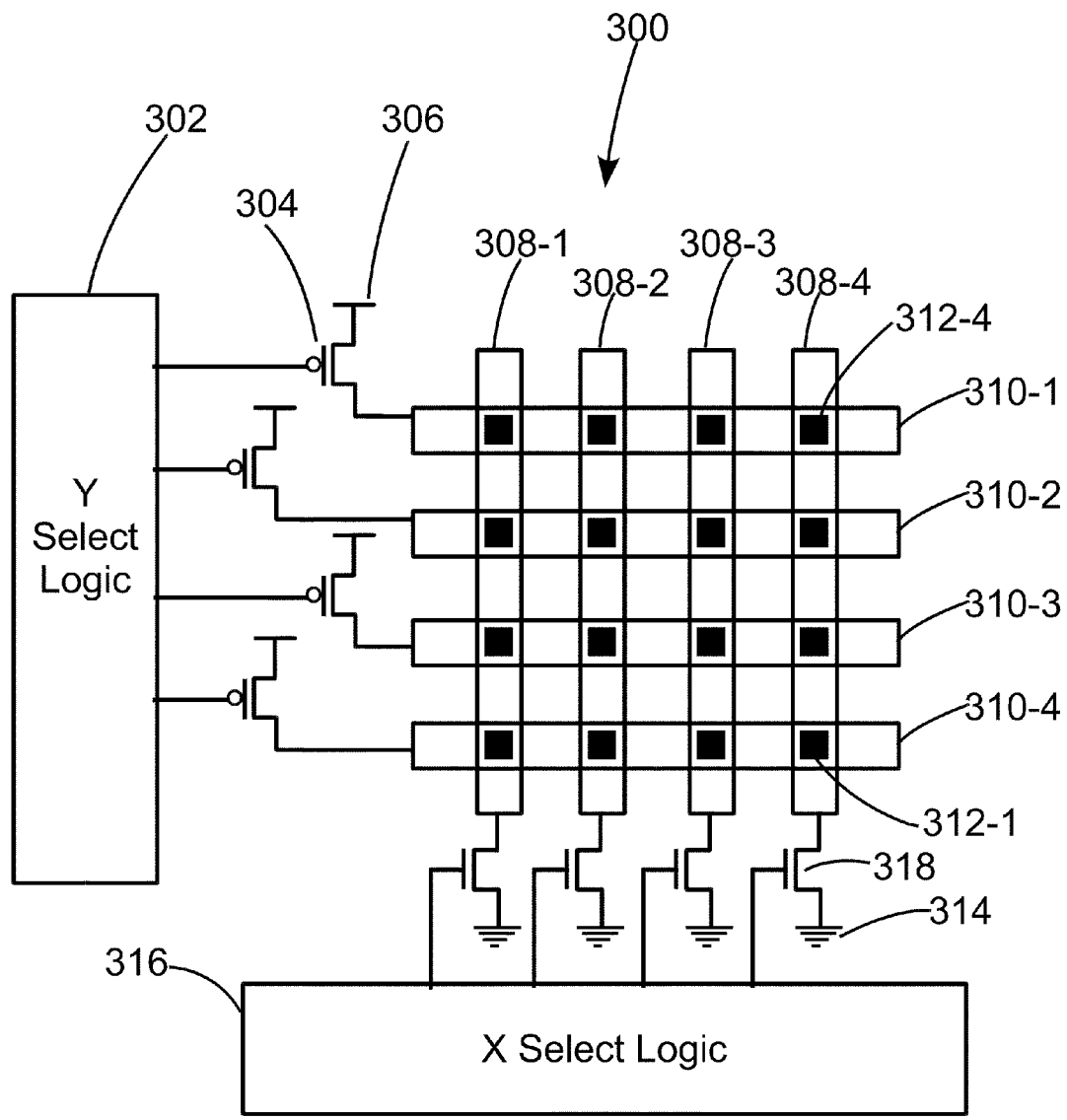
FIG. 3A is a drawing illustration of a programmable interconnect structure.

FIG. 3A is a drawing illustration of a programmable interconnect tile. 310-1 is one of 4 horizontal metal strips, which form a band of strips. The typical IC today has many metal layers. In a typical programmable device the first two or three metal layers will be used to construct the logic elements. On top of them metal 4 to metal 7 will be used to construct the interconnection of those logic elements. In an FPGA device the logic elements are programmable, as well as the interconnects between the logic elements. The configurable interconnect of the current invention is constructed from 4 metal layers or more. For example, metal 4 and 5 could be used for long strips and metal 6 and 7 would comprise short strips. Typically the strips forming the programmable interconnect have mostly the same length and are oriented in the same direction, forming a parallel band of strips as 310-1, 310-2, 310-3 and 310-4. Typically one band will comprise 10 to 40 strips. Typically the strips of the following layer will be oriented perpendicularly as illustrated in FIG. 3A, wherein strips 310 are of metal 6 and strips 308 are of metal 7. In this example the dielectric between metal 6 and metal 7 comprises antifuse positions at the crossings between the strips of metal 6 and metal 7. Tile 300 comprises 16 such antifuses. 312-1 is the antifuse at the cross of strip 310-4 and 308-4. If activated, it will connect strip 310-4 with strip 308-4. FIG. 3A was made simplified, as the typical tile will comprise 10-40 strips in each layer and multiplicity of such tiles, which comprises the antifuse configurable interconnect structure.

304 is one of the Y programming transistors connected to strip 310-1. 318 is one of the X programming transistors connected to strip 308-4. 302 is the Y select logic which at the programming phase allows the selection of a Y programming transistor. 316 is the X select logic which at the programming phase allows the selection of an X programming transistor. Once 304 and 318 are selected the programming voltage 306 will be applied to strip 310-1 while strip 308-4 will be grounded causing the antifuse 312-4 to be activated.

Figure 3B:
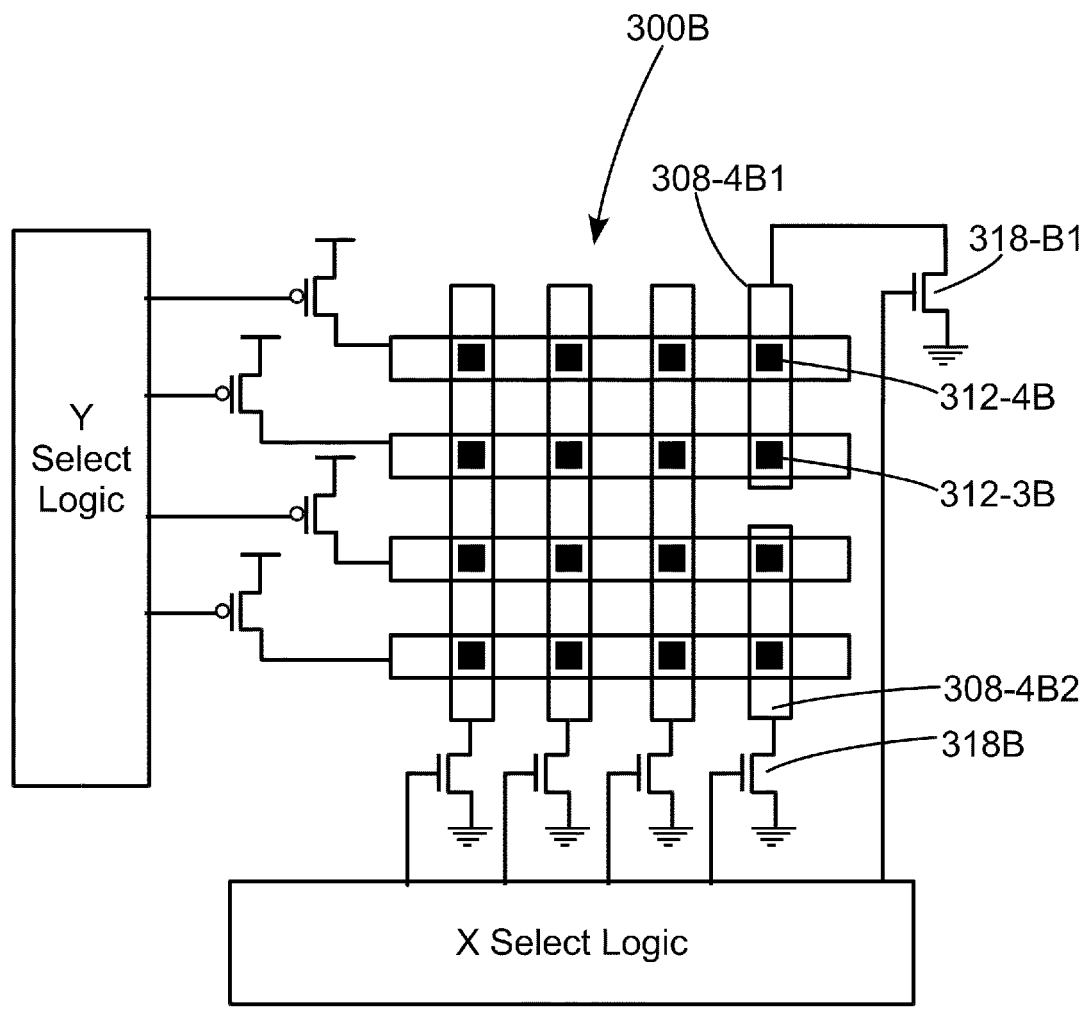
FIG. 3B is a drawing illustration of a programmable interconnect structure.

FIG. 3B is a drawing illustration of a programmable interconnect structure 300B. 300B is variation of 300A wherein some strips in the band are of a different length. Instead of strip 308-4 in this variation there are two shorter strips 308-4B1 and 308-4B2. This might be useful for bringing signals in or out of the programmable interconnect structure 300B in order to reduce the number of strips in the tile, that are dedicated to bringing signals in and out of the interconnect structure versus strips that are available to perform the routing. In such variation the programming circuit needs to be augmented to support the programming of antifuses 312-3B and 312-4B.

Unlike the prior art, various embodiments of the current invention suggest constructing the programming transistors not in the base silicon diffusion layer but rather above or below the antifuse configurable interconnect circuits. The programming voltage used to program the antifuse is typically significantly higher than the voltage used for the operational circuits of the device. This is part of the design of the antifuse structure so that the antifuse will not become accidentally activated. In addition, extra attention, design effort, and silicon resources might be needed to make sure that the programming phase will not damage the operating circuits. Accordingly the incorporation of the antifuse programming transistors in the silicon substrate may require attention and extra silicon area.

Unlike the operational transistors that are desired to operate as fast as possible and so to enable fast system performance, the programming circuits could operate relatively slowly. Accordingly, a thin film transistor for the programming circuits could fit the required function and could reduce the require silicon area.

Alternatively other type of transistors, such as Vacuum FET, bipolar, etc., could be used for the programming circuits and may be placed not in the base silicon but rather above or below the antifuse configurable interconnect.

Yet in another alternative the programming transistors and the programming circuits could be fabricated on SOI wafers which may then be bonded to the configurable logic wafer and connected to it by the use of through—silicon-via. An advantage of using an SOI wafer for the antifuse programming function is that the high voltage transistors that could be built on it are very efficient and could be used for the programming circuit including support function such as the programming controller function. Yet as an additional variation, the programming circuits could be fabricated on an older process on SOI wafers to further reduce cost. Or some other process technology and/or wafer fab located anywhere in the world.

Also there are advanced technologies to deposit silicon or other semiconductors layers that could be integrated on top of the antifuse configurable interconnect for the construction of the antifuse programming circuit. As an example, a recent technology proposed the use of a plasma gun to spray semiconductor grade silicon to form semiconductor structures including, for example, a p-n junction. The sprayed silicon may be doped to the respective semiconductor type. In addition there are more and more techniques to use graphene and Carbon Nano Tubes (CNT) to perform a semiconductor function. For the purpose of this invention we will use the term "Thin-Film-Transistors" as general name for all those technologies, as well as any similar technologies, known or yet to be discovered.

A common objective is to reduce cost for high volume production without redesign and with minimal additional mask cost. The use of thin-film-transistors, for the programming transistors, enables a relatively simple and direct volume cost reduction. Instead of embedding antifuses in the isolation layer a custom mask could be used to define vias on all the locations that used to have their respective antifuse activated. Accordingly the same connection between the strips that used to be programmed is now connected by fixed vias. This may allow saving the cost associated with the fabrication of the antifuse programming layers and their programming circuits. It should be noted that there might be differences between the antifuse resistance and the mask defined via resistance. A conventional way to handle it is by providing the simulation models for both options so the designer could validate that the design will work properly in both cases.

An additional objective for having the programming circuits above the antifuse layer is to achieve better circuit density. Many connections are needed to connect the programming transistors to their respective metal strips. If those connections are going upward they could reduce the circuit overhead by not blocking interconnection routes on the connection layers underneath.

While FIG. 3A shows an interconnection structure of 4×4 strips, the typical interconnection structure will have far more strips and in many cases more than 20×30. For a 20×30 tile there is needed about 20+30=50 programming transistors. The 20×30 tile area is about 20 hp×30 vp where 'hp' is the horizontal pitch and 'vp' is the vertical pitch. This may result in a relatively large area for the programming transistor of about 12 hp×vp (20 hp×30 vp/50=12 hp×vp). Additionally, the area available for each connection between the programming layer and the programmable interconnection fabric needs to be handled. Accordingly, one or two redistribution layers might be needed in order to redistribute the connection within the available area and then bring those connections down, preferably aligned so to create minimum blockage as they are routed to the underlying strip 310 of the programmable interconnection structure.

Figure 4A:
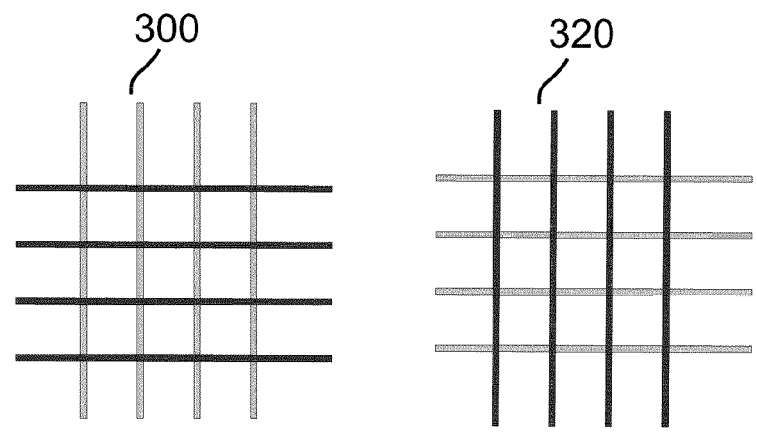
FIG. 4A is a drawing illustration of a programmable interconnect tile.
Figure 4B:
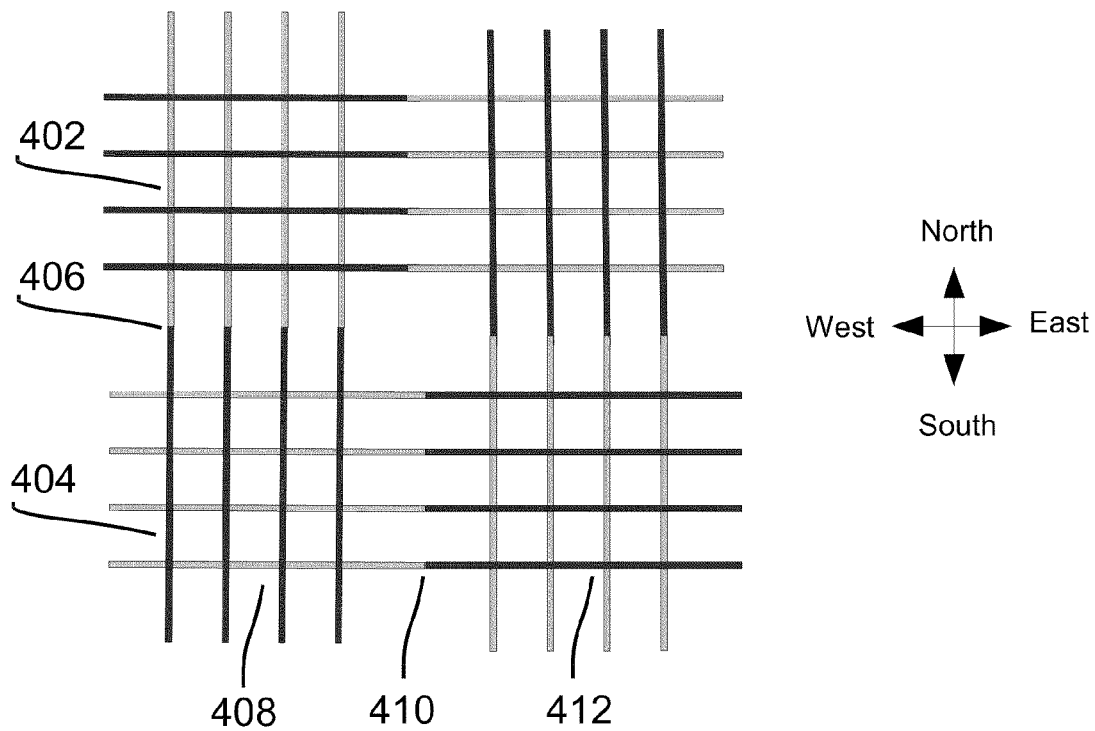
FIG. 4B is a drawing illustration of a programmable interconnect of 2×2 tiles.

FIG. 4A is a drawing illustration, of a programmable interconnect tile 300 and another programmable interface tile 320. As a higher silicon density is achieved it becomes desirable to construct the configurable interconnect in the most compact fashion. FIG. 4B is a drawing illustration of a programmable interconnect of 2×2 tiles. It comprises checkerboard style of tiles 300 and tiles 320 which is a tile 300 rotated by 90 degrees. For a signal to travel South to North, south to north strips need to be connected with antifuses such as 406. 406 and 410 are antifuses that are positioned at the end of a strip to allow it to connect to another strip in the same direction. The signal traveling from South to North is alternating from metal 6 to metal 7. Once the direction needs to change, an antifuse such as 312-1 is used.

The configurable interconnection structure function may be used to interconnect the output of logic cells to the input of logic cells to construct the desired semi-custom logic. The logic cells themselves are constructed by utilizing the first few metal layers to connect transistors that are built in the silicon substrate. Usually the metal 1 layer and metal 2 layer are used for the construction of the logic cells. Sometimes it is effective to also use metal 3 or a part of it.

Figure 5A:
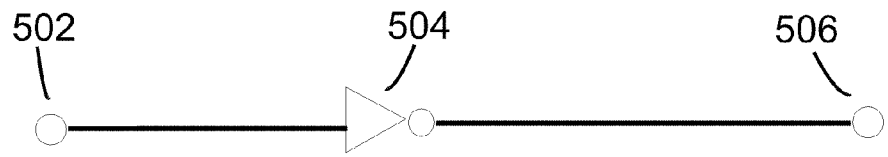
FIG. 5A is a drawing illustration of an inverter logic cell.

FIG. 5A is a drawing illustration of inverter 504 with an input 502 and an output 506. An inverter is the simplest logic cell. The input 502 and the output 506 might be connected to strips in the configurable interconnection structure.

Figure 5B:
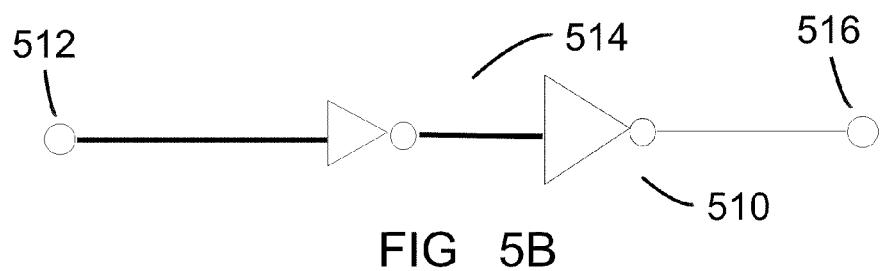
FIG. 5B is a drawing illustration of a buffer logic cell.

FIG. 5B is a drawing illustration of a buffer 514 with an input 512 and an output 516. The input 512 and the output 516 might be connected to strips in the configurable interconnection structure.

Figure 5C:
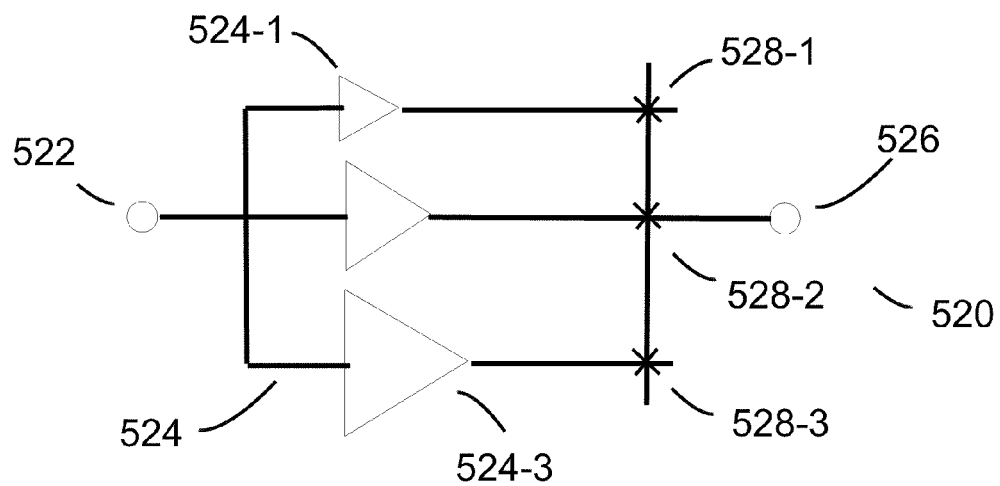
FIG. 5C is a drawing illustration of a configurable strength buffer logic cell.

FIG. 5C is a drawing illustration of a configurable strength buffer 524 with an input 522 and an output 526. The input 522 and the output 526 might be connected to strips in the configurable interconnection structure. 524 is configurable by means of antifuses 528-1, 528-2 and 528-3 constructing an antifuse configurable drive cell.

Figure 5D:
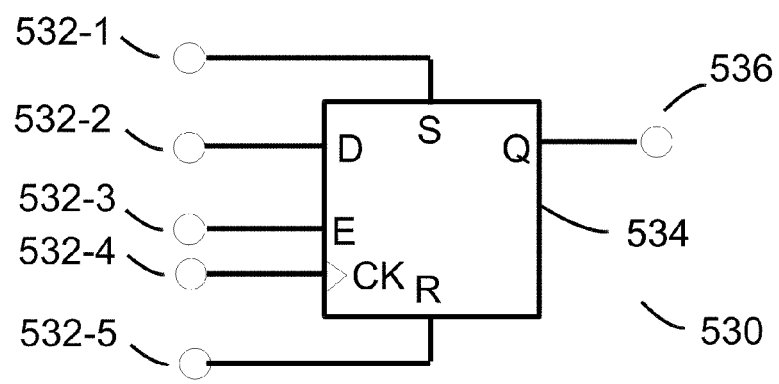
FIG. 5D is a drawing illustration of a D-Flip Flop logic cell.

FIG. 5D is a drawing illustration of D-Flip Flop 534 with inputs 532-2, and output 536 with control inputs 532-1, 532-3, 532-4 and 532-5. The control signals could be connected to the configurable interconnects or to local or global control signals.

Figure 6:
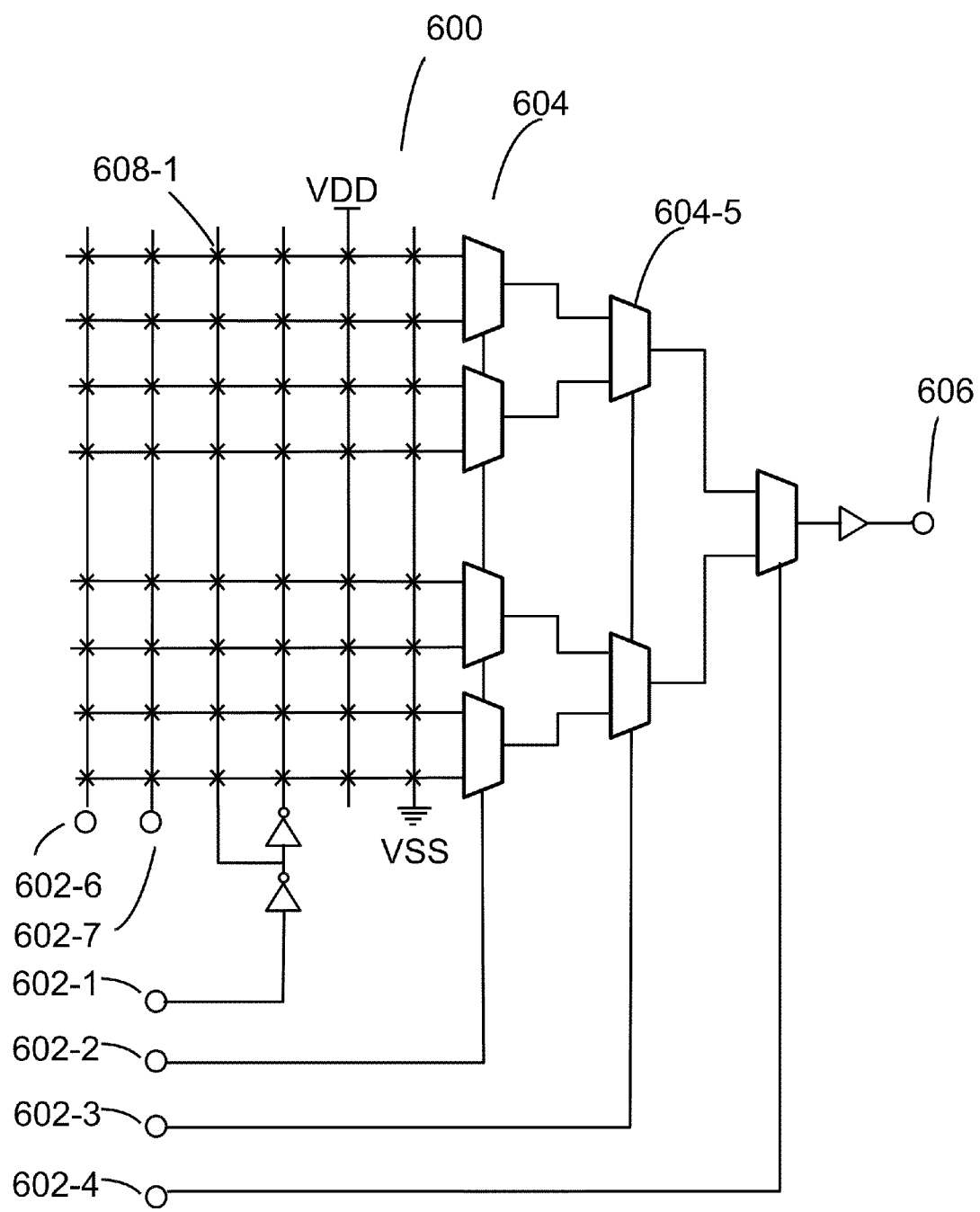
FIG. 6 is a drawing illustration of a LUT 4 logic cell.

FIG. 6 is a drawing illustration of a LUT 4. LUT4 604 is a well-known logic element in the FPGA art called a 16 bit Look-Up-Table or in short LUT4. It has 4 inputs 602-1, 602-2, 602-3 and 602-4. It has an output 606. In general a LUT4 can be programmed to perform any logic function of 4 inputs or less. The LUT function of FIG. 6 may be implemented by 32 antifuses such as 608-1. 604-5 is a two to one multiplexer. The common way to implement a LUT4 in FPGA is by using 16 SRAM bit-cells and 15 multiplexers. The illustration of FIG. 6 demonstrates an antifuse configurable look-up-table implementation of a LUT4 by 32 antifuses and 7 multiplexers. The programmable cell of FIG. 6 may comprise additional inputs 602-6, 602-7 with additional 8 antifuse for each input to allow some functionality in addition to just LUT4.

Figure 6A:
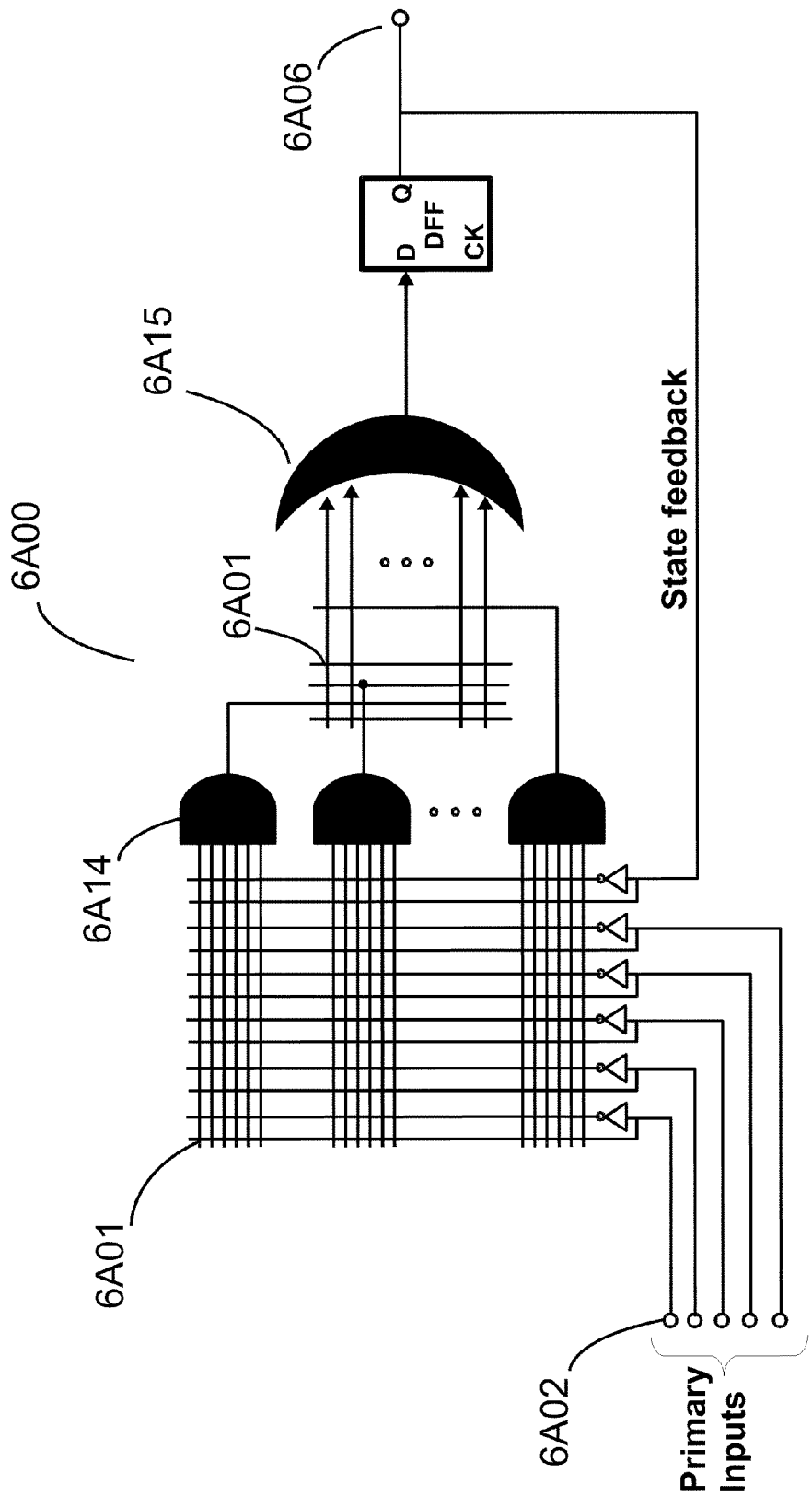
FIG. 6A is a drawing illustration of a PLA logic cell.

FIG. 6A is a drawing illustration of a PLA logic cell 6A00. This used to be the most popular programmable logic primitive until LUT logic took the leadership. Other acronyms used for this type of logic are PLD and PAL. 6A01 is one of the antifuses that enables the selection of the signal fed to the multi-input AND 6A14. In this drawing any cross between vertical line and horizontal line comprises an antifuse to allow the connection to be made according to the desired end function. The large AND cell 6A14 constructs the product term by performing the AND function on the selection of inputs 6A02 or their inverted replicas. A multi-input OR 6A15 performs the OR function on a selection of those product terms to construct an output 6A06. FIG. 6A illustrates an antifuse configurable PLA logic.

The logic cells presented in FIG. 5, FIG. 6 and FIG. 6A are just representatives. There exist many options for construction of programmable logic fabric including additional logic cells such as AND, MUX and many others, and variations on those cells. Also, in the construction of the logic fabric there might be variation with respect to which of their inputs and outputs are connected by the configurable interconnect fabric and which are connected directly in a non-configurable way.

Figure 7:
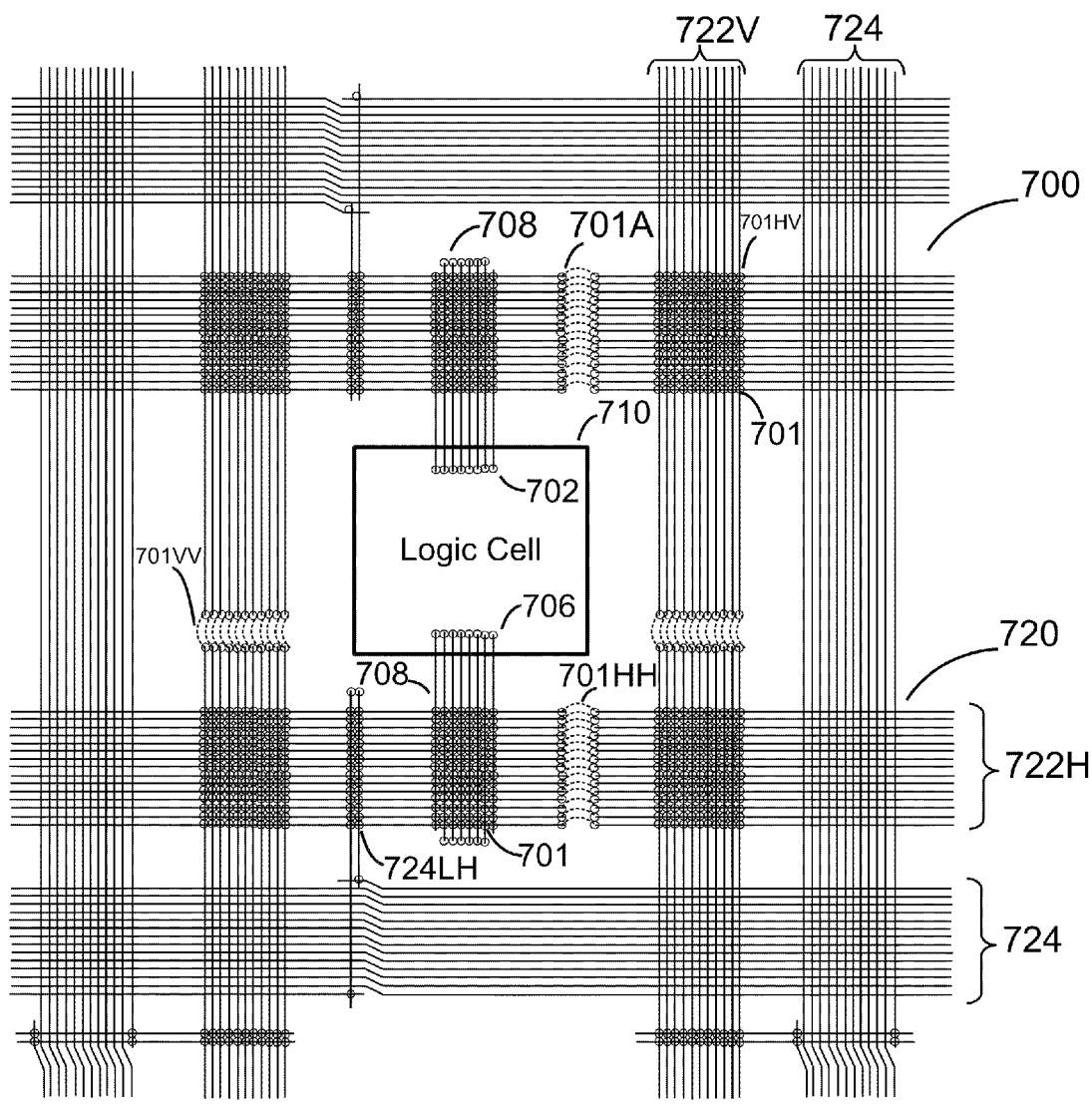
FIG. 7 is a drawing illustration of a programmable cell.

FIG. 7 is a drawing illustration of a programmable cell 700. By tiling such cells a programmable fabric is constructed. The tiling could be of the same cell being repeated over and over to form a homogenous fabric. Alternatively, a blend of different cells could be tiled for heterogeneous fabric. The logic cell 700 could be any of those presented in FIGS. 5 and 6, a mix and match of them or other primitives as discussed before. The logic cell 710 inputs 702 and output 706 are connected to the configurable interconnection fabric 720 with input and output strips 708 with associated antifuses 701. The short interconnects 722 are comprising metal strips that are the length of the tile, they comprise horizontal strips 722H, on one metal layer and vertical strips 722V on another layer, with antifuse 701HV in the cross between them, to allow selectively connecting horizontal strip to vertical strip. The connection of a horizontal strip to another horizontal strip is with antifuse 701HH that functions like antifuse 410 of FIG. 4. The connection of a vertical strip to another vertical strip is with antifuse 701VV that functions like fuse 406 of FIG. 4. The long horizontal strips 724 are used to route signals that travel a longer distance, usually the length of 8 or more tiles. Usually one strip of the long bundle will have a selective connection by antifuse 724LH to the short strips, and similarly, for the vertical long strips 724. FIG. 7 illustrates the programmable cell 700 as a two dimensional illustration. In real life 700 is a three dimensional construct where the logic cell 710 utilizes the base silicon with Metal 1, Metal 2, and sometimes Metal 3. The programmable interconnect fabric including the associated antifuses will be constructed on top of it.

Figure 8:
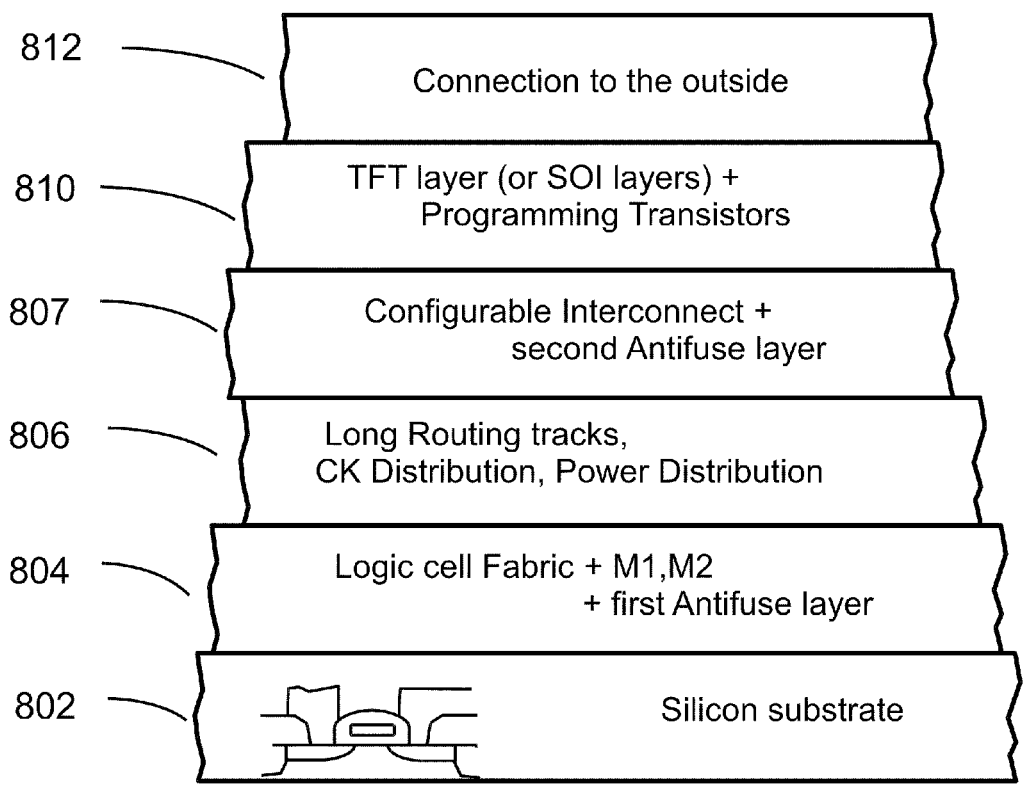
FIG. 8 is a drawing illustration of a programmable device layers structure.

FIG. 8 is a drawing illustration of a programmable device layers structure according to an alternative of the current invention. In this alternative there are two layers comprising antifuses. The first is designated to configure the logic terrain and, in some cases, to also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 8 starts with the semiconductor substrate 802 comprising the transistors used for the logic cells and also the first antifuse layer programming transistors. Then comes layers 804 comprising Metal 1, dielectric, Metal 2, and sometimes Metal 3. These layers are used to construct the logic cells and often I/O and other analog cells. In this alternative of the current invention a plurality of first antifuses are incorporated in the isolation layer between metal 1 and metal 2 or in the isolation layer between metal 2 and metal 3 and their programming transistors could be embedded in the silicon substrate 802 being underneath the first antifuses. These first antifuses could be used to program logic cells such as 520, 600 and 700 and to connect individual cells to construct larger logic functions. These first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

The following few layers 806 could comprise long interconnection tracks for power distribution and clock networks, or a portion of these, in addition to what was fabricated in the first few layers 804.

The following few layers 807 could comprise the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric 810. The programming element could be a thin film transistor or other alternatives for over oxide transistors as was mentioned previously. In such case the antifuse programming transistors are placed over the antifuse layer, which may thereby enable the configurable interconnect 808 or 804. It should be noted that in some cases it might be useful to construct part of the control logic for the second antifuse programming circuits, in the base layers 802 and 804.

The final step is the connection to the outside 812. These could be pads for wire bonding, soldering balls for flip chip, optical, or other connection structures such as those required for TSV.

In another alternative of the current invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 8A:
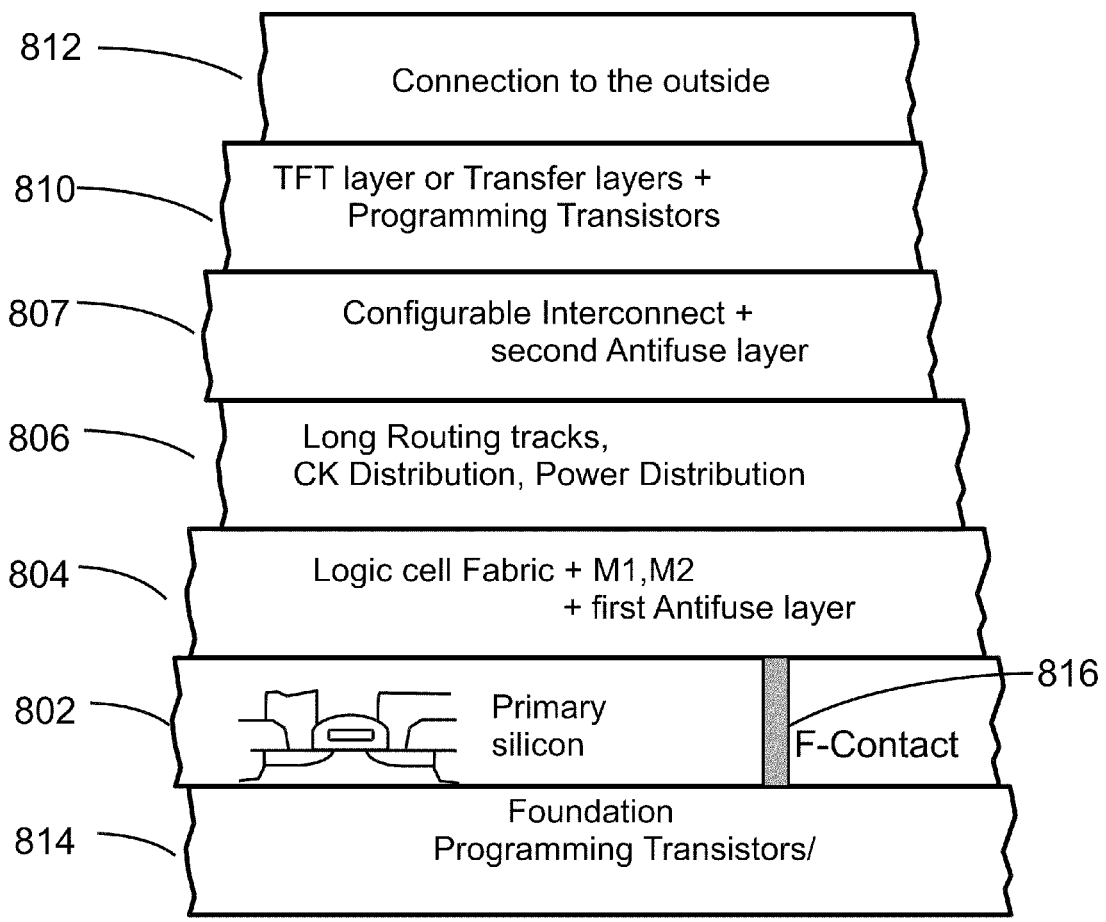
FIG. 8A is a drawing illustration of a programmable device layers structure.

FIG. 8A is a drawing illustration of a programmable device layers structure according to another alternative of the current invention. In this alternative there is additional circuit 814 connected by contact connection 816 to the first antifuse layer 804. This underlying device is providing the programming transistor for the first antifuse layer 804. In this way, the programmable device substrate diffusion layer 816 does not suffer the cost penalty of the programming transistors required for the first antifuse layer 804. Accordingly the programming connection of the first antifuse layer 804 will be directed downward to connect to the underlying programming device 814 while the programming connection to the second antifuse layer 807 will be directed upward to connect to the programming circuits 810. This could provide less congestion of the circuit internal interconnection routes.

The reference 808 in subsequent figures can be any one of a vast number of combinations of possible preprocessed wafers or layers containing many combinations of transfer layers that fall within the scope of the invention. The term "preprocessed wafer or layer" may be generic and reference number 808 when used in a drawing figure to illustrate an embodiment of the present invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, preprocessed circuitry, a preprocessed circuitry acceptor wafer, a base wafer layer, a lower layer, an underlying main wafer, a foundation layer, an attic layer, or a house wafer.

Figure 8B:
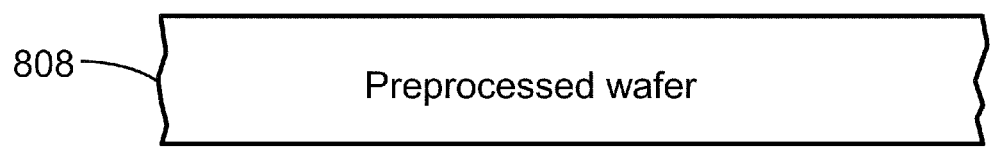
FIGS. 8B-8I are drawing illustrations of the preprocessed wafers and layers and generalized layer transfer.

FIG. 8B is a drawing illustration of a generalized preprocessed wafer or layer 808. The wafer or layer 808 may have preprocessed circuitry, such as, for example, logic circuitry, microprocessors, circuitry comprising transistors of various types, and other types of digital or analog circuitry including, but not limited to, the various embodiments described herein. Preprocessed wafer or layer 808 may have preprocessed metal interconnects. The preprocessed metal interconnects may be designed and prepared for layer transfer and electrical coupling from preprocessed wafer or layer 808 to the layer or layers to be transferred.

Figure 8C:
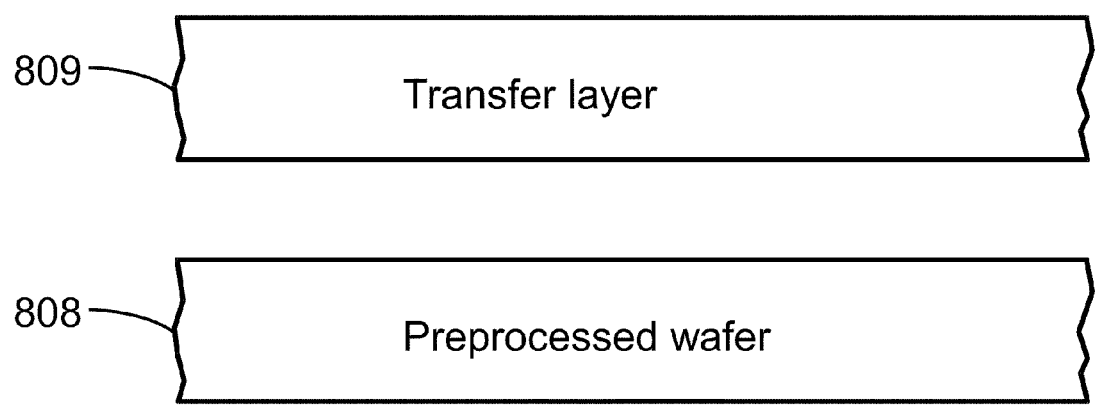

FIG. 8C is a drawing illustration of a generalized transfer layer 809 prior to being attached to preprocessed wafer or layer 808. Transfer layer 809 may be attached to a carrier wafer or substrate during layer transfer. Transfer layer 809 may have metal interconnects designed and prepared for layer transfer and electrical coupling to preprocessed wafer or layer 808.

Figure 8D:
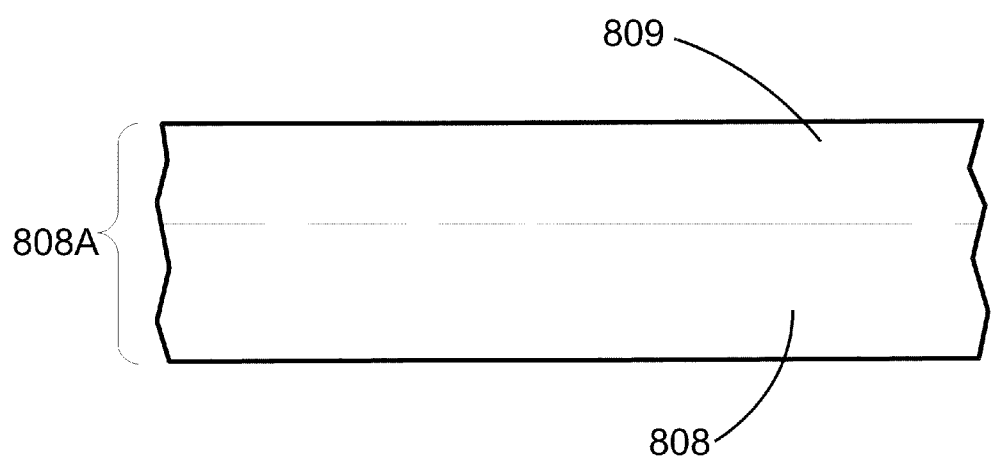

FIG. 8D is a drawing illustration of a preprocessed wafer or layer 808A created by the layer transfer of transfer layer 809 on top of preprocessed wafer or layer 808. The top of preprocessed wafer or layer 808A may be further processed with metal interconnects designed and prepared for layer transfer and electrical coupling from preprocessed wafer or layer 808A to the next layer or layers to be transferred.

Figure 8E:
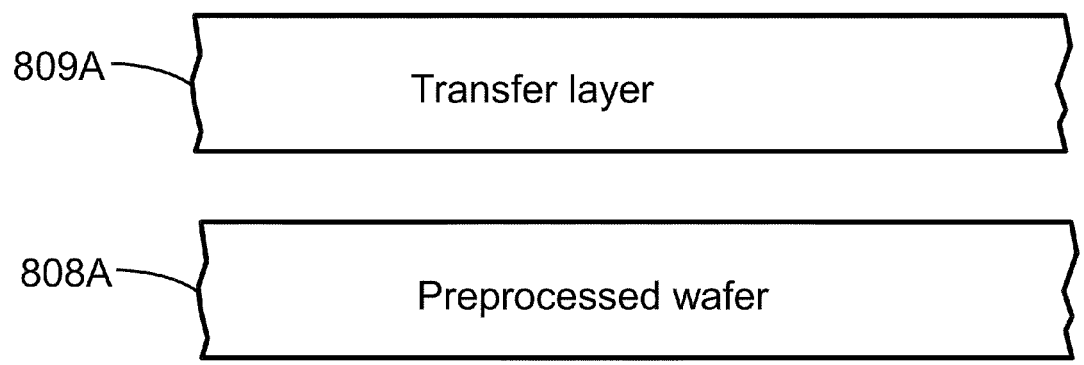

FIG. 8E is a drawing illustration of a generalized transfer layer 809A prior to being attached to preprocessed wafer or layer 808A. Transfer layer 809A may be attached to a carrier wafer or substrate during layer transfer. Transfer layer 809A may have metal interconnects designed and prepared for layer transfer and electrical coupling to preprocessed wafer or layer 808A.

Figure 8F:
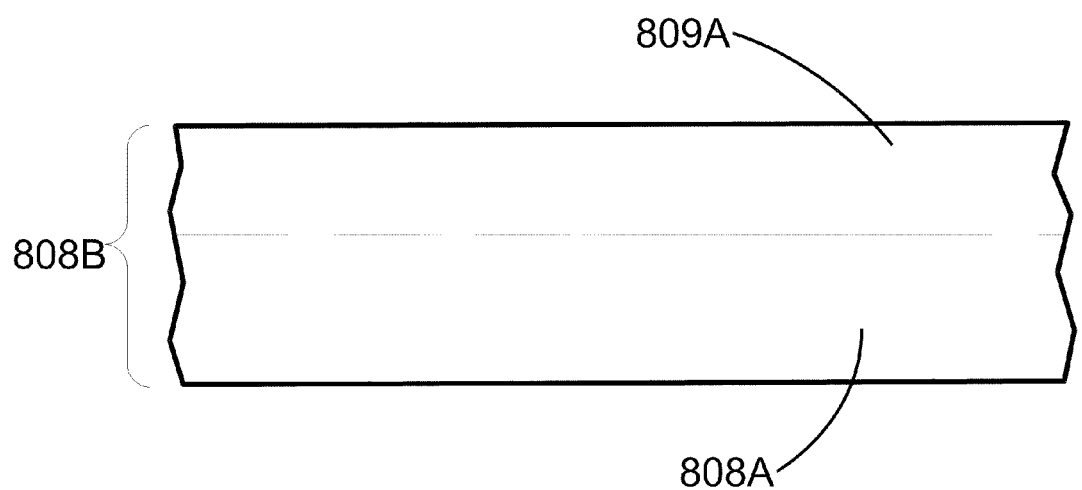

FIG. 8F is a drawing illustration of a preprocessed wafer or layer 808B created by the layer transfer of transfer layer 809A on top of preprocessed wafer or layer 808A. The top of preprocessed wafer or layer 808B may be further processed with metal interconnects designed and prepared for layer transfer and electrical coupling from preprocessed wafer or layer 808B to the next layer or layers to be transferred.

Figure 8G:
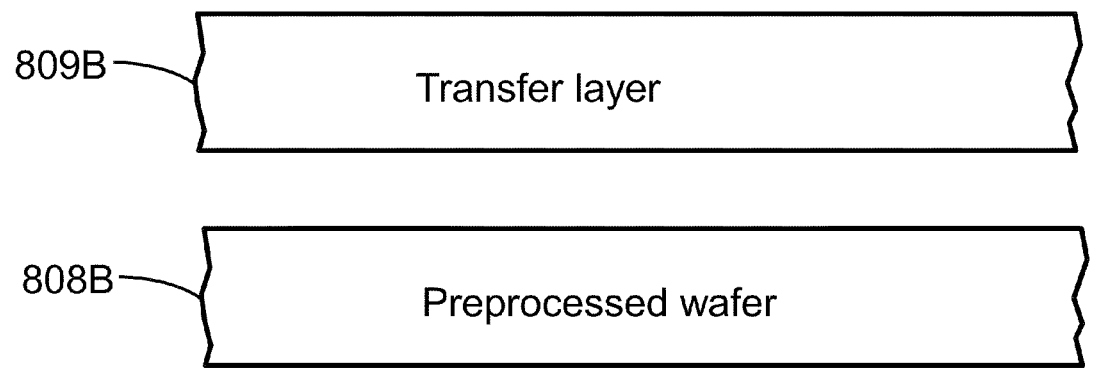

FIG. 8G is a drawing illustration of a generalized transfer layer 809B prior to being attached to preprocessed wafer or layer 808B. Transfer layer 809B may be attached to a carrier wafer or substrate during layer transfer. Transfer layer 809B may have metal interconnects designed and prepared for layer transfer and electrical coupling to preprocessed wafer or layer 808B.

Figure 8H:

FIG. 8H is a drawing illustration of preprocessed wafer layer 808C created by the layer transfer of transfer layer 809B on top of preprocessed wafer or layer 808B. The top of preprocessed wafer or layer 808C may be further processed with metal interconnect designed and prepared for layer transfer and electrical coupling from preprocessed wafer or layer 808C to the next layer or layers to be transferred.

Figure 8I:
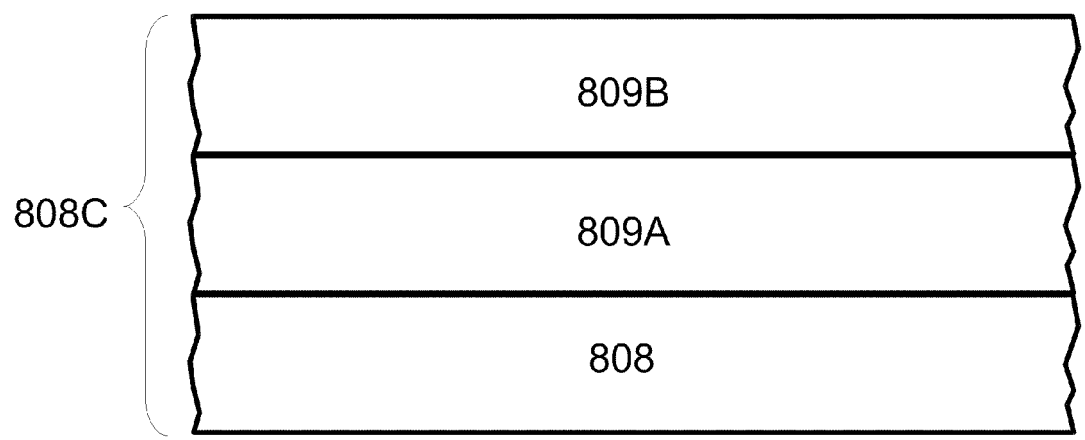

FIG. 8I is a drawing illustration of preprocessed wafer or layer 808C, a 3D IC stack, which may comprise transferred layers 809A and 809B on top of the original preprocessed wafer or layer 808. Transferred layers 809A and 809B and the original preprocessed wafer or layer 808 may comprise transistors of one or more types in one or more layers, metallization in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors. Transferred layers 809A and 809B and the original preprocessed wafer or layer 808 may further comprise semiconductor devices such as resistors and capacitors and inductors, one or more programmable interconnects, memory structures and devices, sensors, radio frequency devices, or optical interconnect with associated transceivers.

This layer transfer process can be repeated many times, thereby creating preprocessed wafers comprising many different transfer layers which, when combined, can then become preprocessed wafers or layers for future transfers. This layer transfer process may be sufficiently flexible and preprocessed wafers and transfer layers, if properly prepared, can be flipped over and processed on either side with further transfers in either direction as a matter of design choice.

Persons of ordinary skill in the art will appreciate that the illustrations in FIGS. 8 through 8I are exemplary only and are not drawn to scale. Such skilled persons will further appreciate that many variations are possible such as, for example, the preprocessed wafer or layer 808 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

An alternative technology for such underlying circuitry is to use the "SmartCut" process. The "SmartCut" process is a well understood technology used for fabrication of SOI wafers. The "SmartCut" process, together with wafer bonding technology, enables a "Layer Transfer" whereby a thin layer of a silicon wafer is transferred from one wafer to another wafer. The "Layer Transfer" could be done at less than 400° C. and the resultant transferred layer could be even less than 100 nm thick. The process with some variations and under different names is commercially available by two companies, namely, Soitec (Crolles, France) and SiGen—Silicon Genesis Corporation (San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

Alternatively, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is performed, and then thru bond via connections are made. Additionally, epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRaNsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 14:
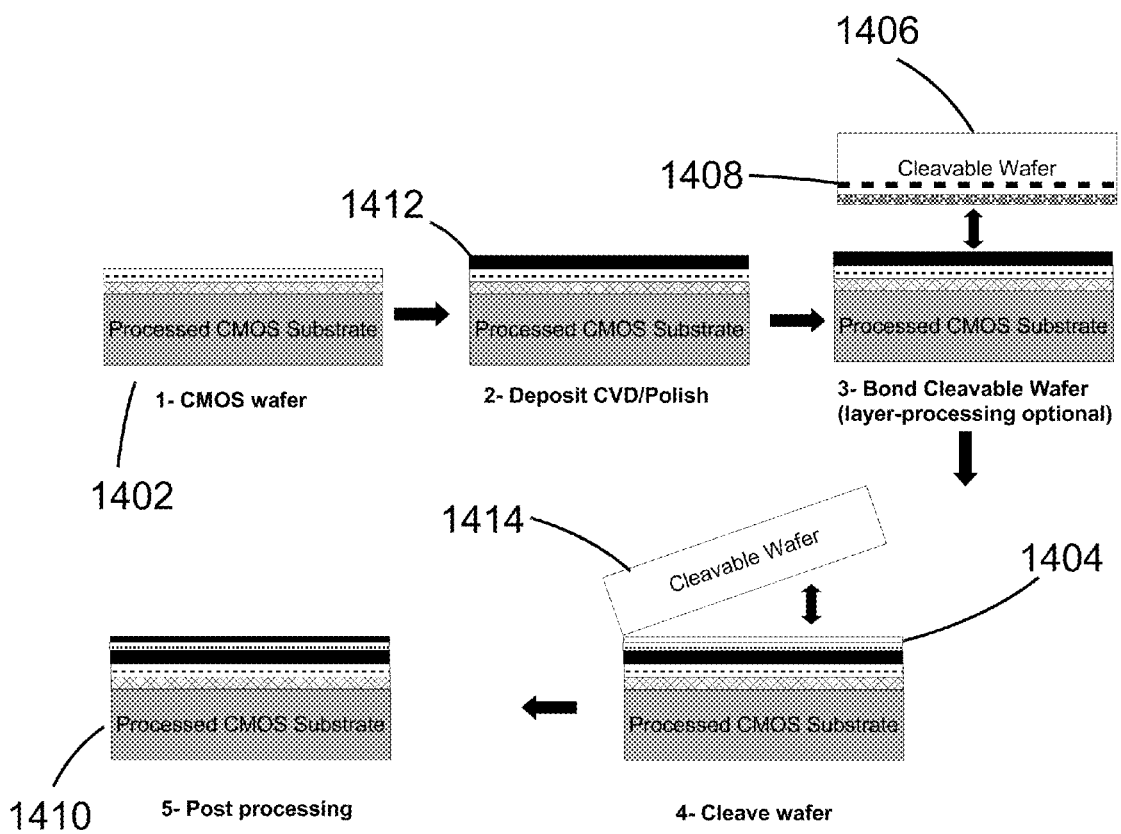
FIG. 14 is a drawing illustration of a layer transfer process flow.

FIG. 14 is a drawing illustration of a layer transfer process flow. In another alternative of the invention, "Layer-Transfer" is used for construction of the underlying circuitry 814. 1402 is a wafer that was processed to construct the underlying circuitry. The wafer 1402 could be of the most advanced process or more likely a few generations behind. It could comprise the programming circuits 814 and other useful structures. An oxide layer 1412 is then deposited on top of the wafer 1402 and then is polished for better planarization and surface preparation. A donor wafer 1406 is then brought in to be bonded to 1402. The surfaces of both donor wafer 1406 and wafer 1402 may have a plasma pretreatment to enhance the bond strength. The donor wafer 1406 is pre-prepared for "SmartCut" by an ion implant of an atomic species, such as H+ ions, at the desired depth to prepare the SmartCut line 1408. After bonding the two wafers a SmartCut step is performed to cleave and remove the top portion 1414 of the donor wafer 1406 along the cut layer 1408. The result is a 3D wafer 1410 which comprises wafer 1402 with an added layer 1404 of crystallized silicon. Layer 1404 could be quite thin at the range of 50-200 nm as desired. The described flow is called "layer transfer". Layer transfer is commonly utilized in the fabrication of SOI—Silicon On Insulator—wafers. For SOI wafers the upper surface is oxidized so that after "layer transfer" a buried oxide—BOX—provides isolation between the top thin crystallized silicon layer and the bulk of the wafer.

Now that a "layer transfer" process is used to bond a thin crystallized silicon layer 1404 on top of the preprocessed wafer 1402, a standard process could ensue to construct the rest of the desired circuits as is illustrated in FIG. 8A, starting with layer 802 on the transferred layer 1404. The lithography step will use alignment marks on wafer 1402 so the following circuits 802 and 816 and so forth could be properly connected to the underlying circuits 814. An aspect that should be accounted for is the high temperature that would be needed for the processing of circuits 802. The pre-processed circuits on wafer 1402 would need to withstand this high temperature needed for the activation of the semiconductor transistors 802 fabricated on the 1404 layer. Those foundation circuits on wafer 1402 will comprise transistors and local interconnects of poly-silicon and some other type of interconnection that could withstand high temperature such as tungsten. An advantage of using layer transfer for the construction of the underlying circuits is having the layer transferred 1404 be very thin which enables the through silicon via connections 816 to have low aspect ratios and be more like normal contacts, which could be made very small and with minimum area penalty. The thin transferred layer also allows conventional direct thru-layer alignment techniques to be performed, thus increasing the density of silicon via connections 816.

Figure 15:
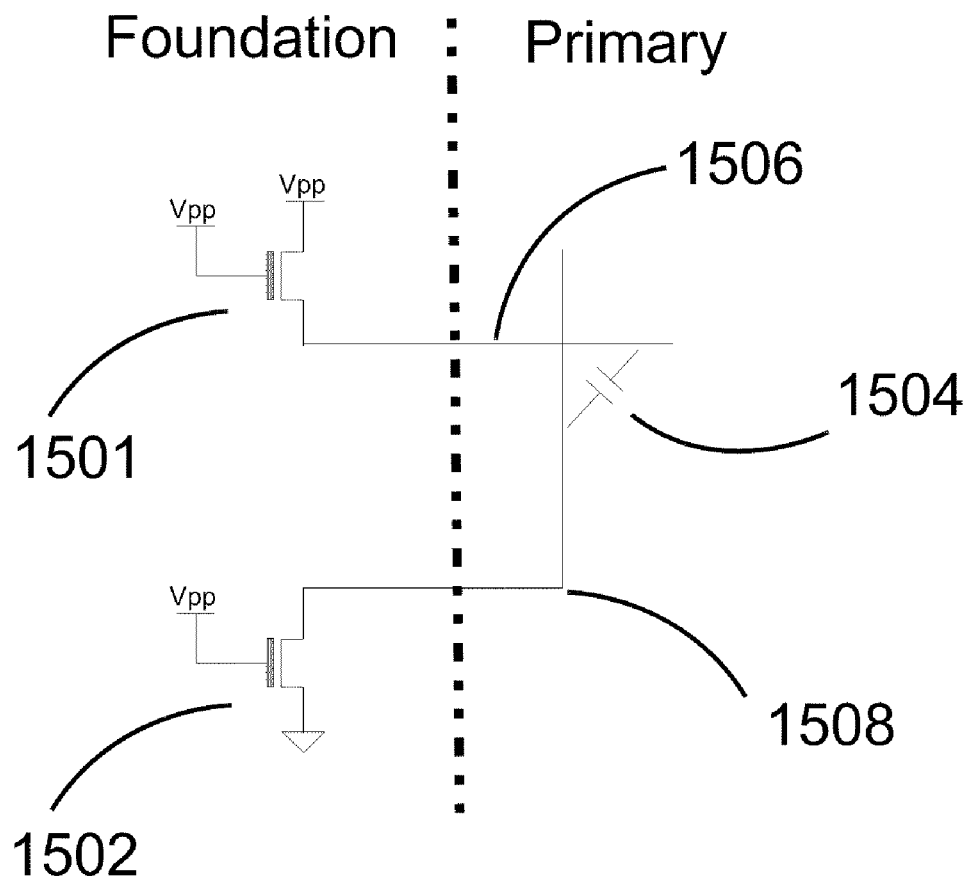
FIG. 15 is a drawing illustration of an underlying programming circuits.

FIG. 15 is a drawing illustration of an underlying programming circuit. Programming Transistors 1501 and 1502 are pre-fabricated on the foundation wafer 1402 and then the programmable logic circuits and the antifuse 1504 are built on the transferred layer 1404. The programming connections 1506, 1508 are connected to the programming transistors by contact holes through layer 1404 as illustrated in FIG. 8A by 816. The programming transistors are designed to withstand the relatively higher programming voltage required for the antifuse 1504 programming.

Figure 16:
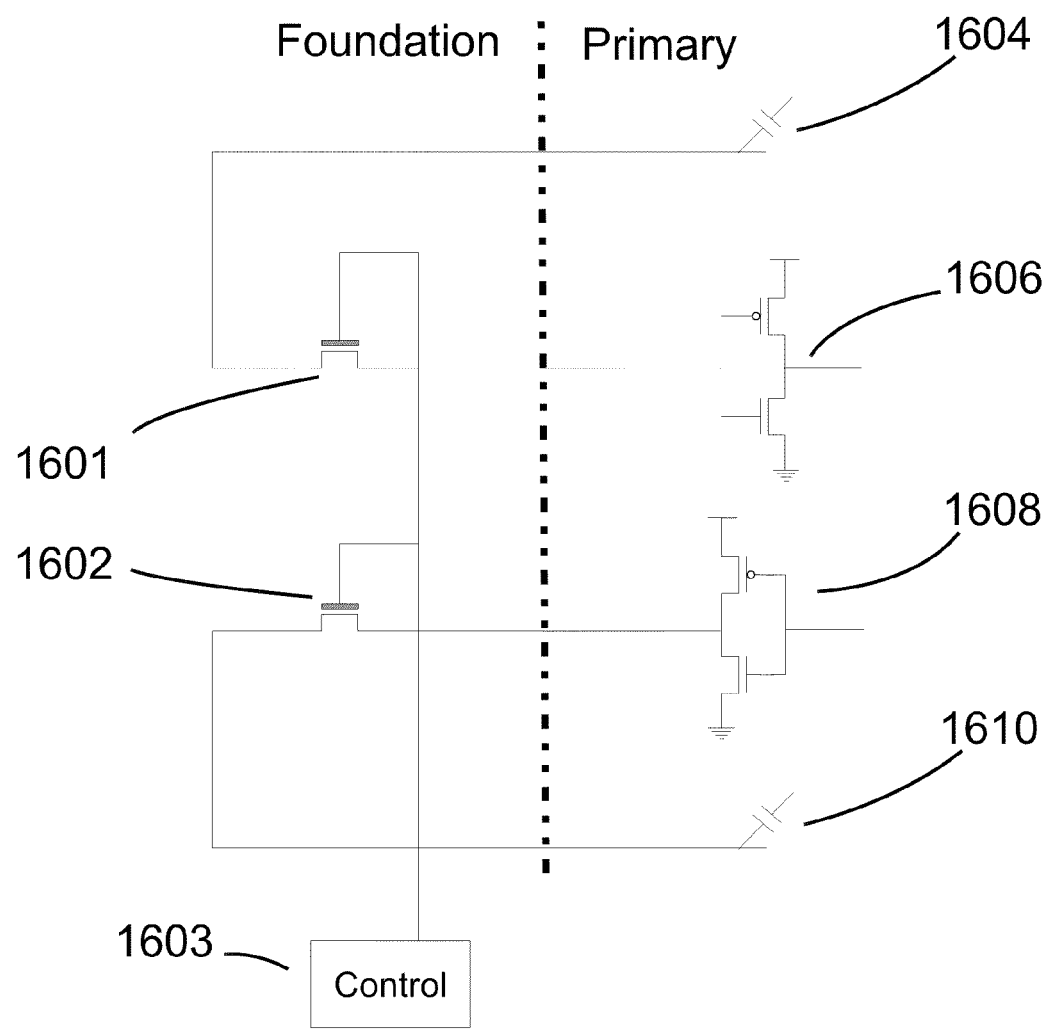
FIG. 16 is a drawing illustration of an underlying isolation transistors circuits.

FIG. 16 is a drawing illustration of an underlying isolation transistor circuit. The higher voltage used to program the antifuse 1604 might damage the logic transistors 1606, 1608. To protect the logic circuits, isolation transistors 1601, 1602, which are designed to withstand higher voltage, are used. The higher programming voltage is only used at the programming phase at which time the isolation transistors are turned off by the control circuit 1603. The underlying wafer 1402 could also be used to carry the isolation transistors. Having the relatively large programming transistors and isolation transistor on the foundation silicon 1402 allows far better use of the primary silicon 802 (1404). Usually the primary silicon will be built in an advanced process to provide high density and performance. The foundation silicon could be built in a less advanced process to reduce costs and support the higher voltage transistors. It could also be built with other than CMOS transistors such as Double Diffused Metal Oxide Semiconductor (DMOS) or bi-polar junction transistors when such is advantageous for the programming and the isolation function. In many cases there is a need to have protection diodes for the gate input that are called Antennas. Such protection diodes could be also effectively integrated in the foundation alongside the input related Isolation Transistors. On the other hand the isolation transistors 1601, 1602 would provide the protection for the antenna effect so no additional diodes would be needed.

An additional alternative embodiment of the invention is where the foundation layer 1402 is pre-processed to carry a plurality of back bias voltage generators. A known challenge in advanced semiconductor logic devices is die-to-die and within-a-die parameter variations. Various sites within the die might have different electrical characteristics due to dopant variations and such. The most critical of these parameters that affect the variation is the threshold voltage of the transistor. Threshold voltage variability across the die is mainly due to channel dopant, gate dielectric, and critical dimension variability. This variation becomes profound in sub 45 nm node devices. The usual implication is that the design should be done for the worst case, resulting in a quite significant performance penalty. Alternatively complete new designs of devices are being proposed to solve this variability problem with significant uncertainty in yield and cost. A possible solution is to use localized back bias to drive upward the performance of the worst zones and allow better overall performance with minimal additional power. The foundation-located back bias could also be used to minimize leakage due to process variation.

Figure 17A:
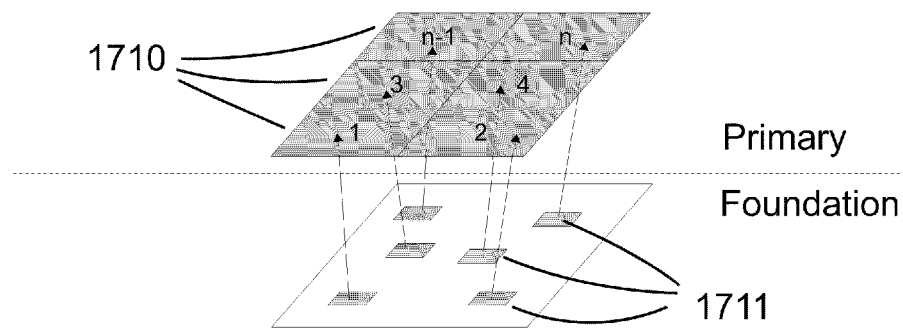
FIG. 17A is a topology drawing illustration of underlying back bias circuitry.

FIG. 17A is a topology drawing illustration of back bias circuitry. The foundation layer 1402 carries back bias circuits 1711 to allow enhancing the performance of some of the zones 1710 on the primary device which otherwise will have lower performance.

Figure 17B:
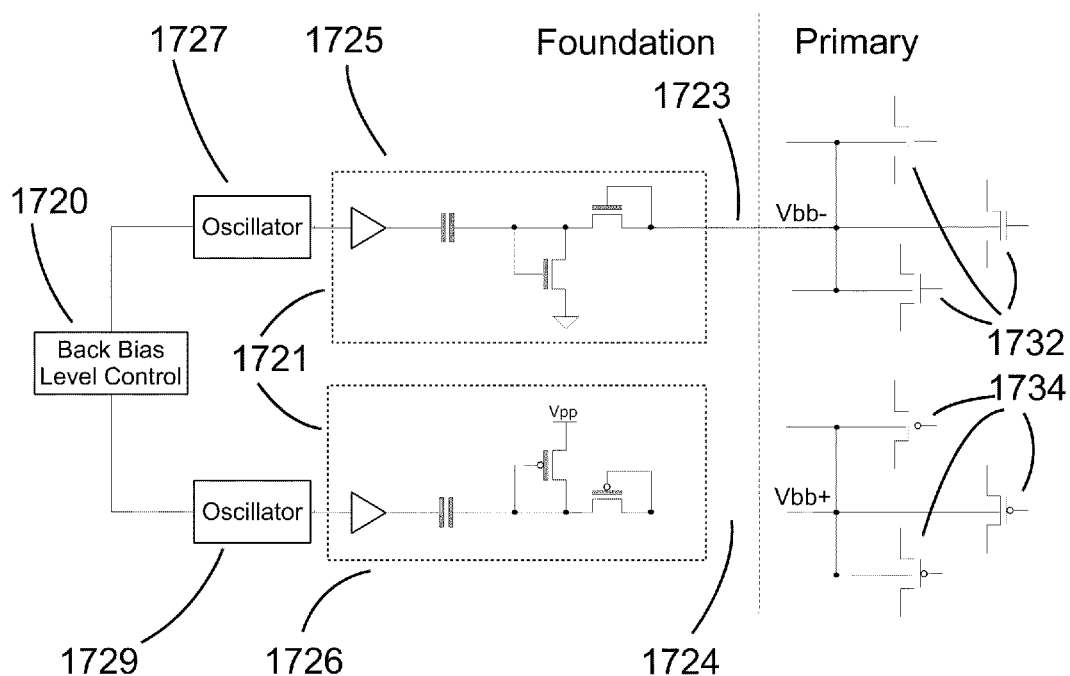
FIG. 17B is a drawing illustration of underlying back bias circuits.

FIG. 17B is a drawing illustration of back bias circuits. A back bias level control circuit 1720 is controlling the oscillators 1727 and 1729 to drive the voltage generators 1721. The negative voltage generator 1725 will generate the desired negative bias which will be connected to the primary circuit by connection 1723 to back bias the N-channel Metal-Oxide-Semiconductor (NMOS) transistors 1732 on the primary silicon 1404. The positive voltage generator 1726 will generate the desired negative bias which will be connected to the primary circuit by connection 1724 to back bias the P-channel Metal-Oxide-Semiconductor (PMOS) transistors 1724 on the primary silicon 1404. The setting of the proper back bias level per zone will be done in the initiation phase. It could be done by using external tester and controller or by on-chip self test circuitry. Preferably a non volatile memory will be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 17C:
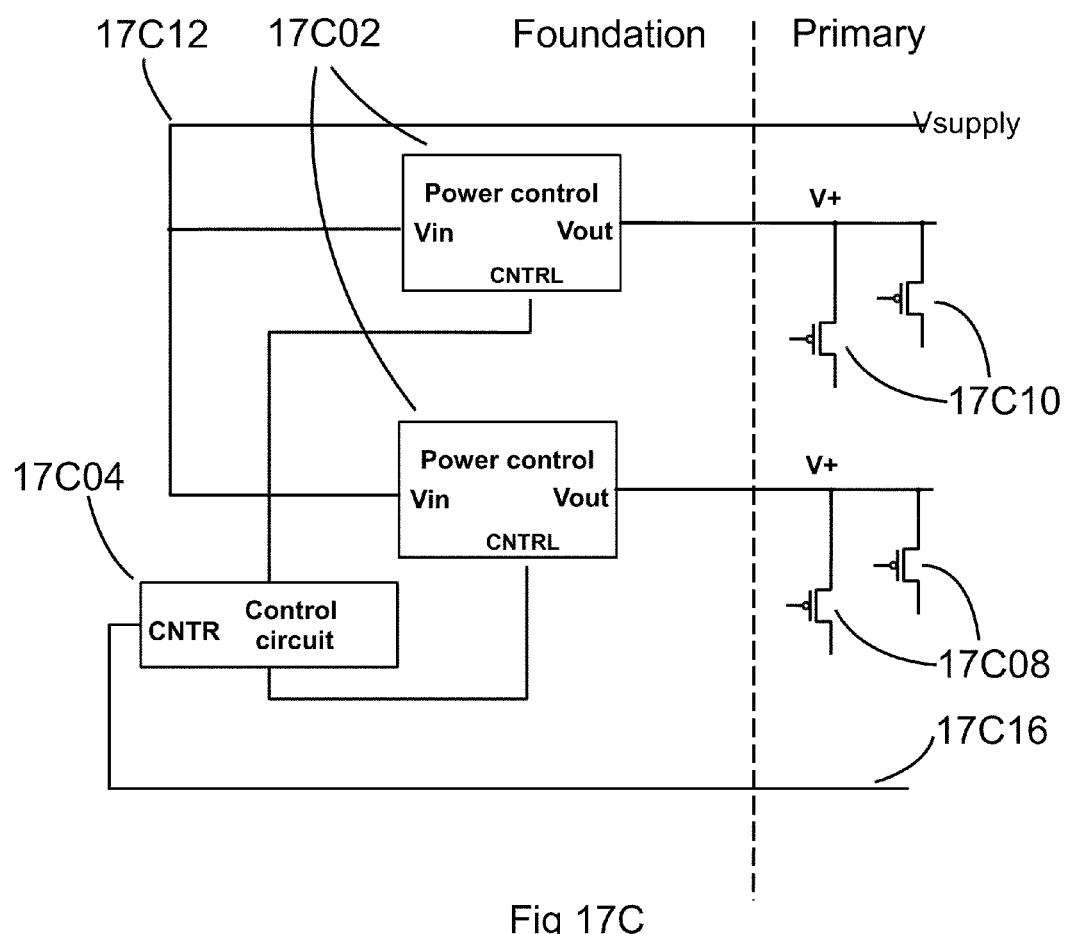
FIG. 17C is a drawing illustration of power control circuits

FIG. 17C illustrates an alternative circuit function that may fit well in the "Foundation." In many IC designs it is desired to integrate power control to reduce either voltage to sections of the device or to totally power off these sections when those sections are not needed or in an almost 'sleep' mode. In general such power control is best done with higher voltage transistors. Accordingly a power control circuit cell 17C02 may be constructed in the Foundation. Such power control 17C02 may have its own higher voltage supply and control or regulate supply voltage for sections 17C10 and 17C08 in the "Primary" device. The control may come from the primary device 17C16 and be managed by control circuit 17C04 in the Foundation.

Figure 17D:
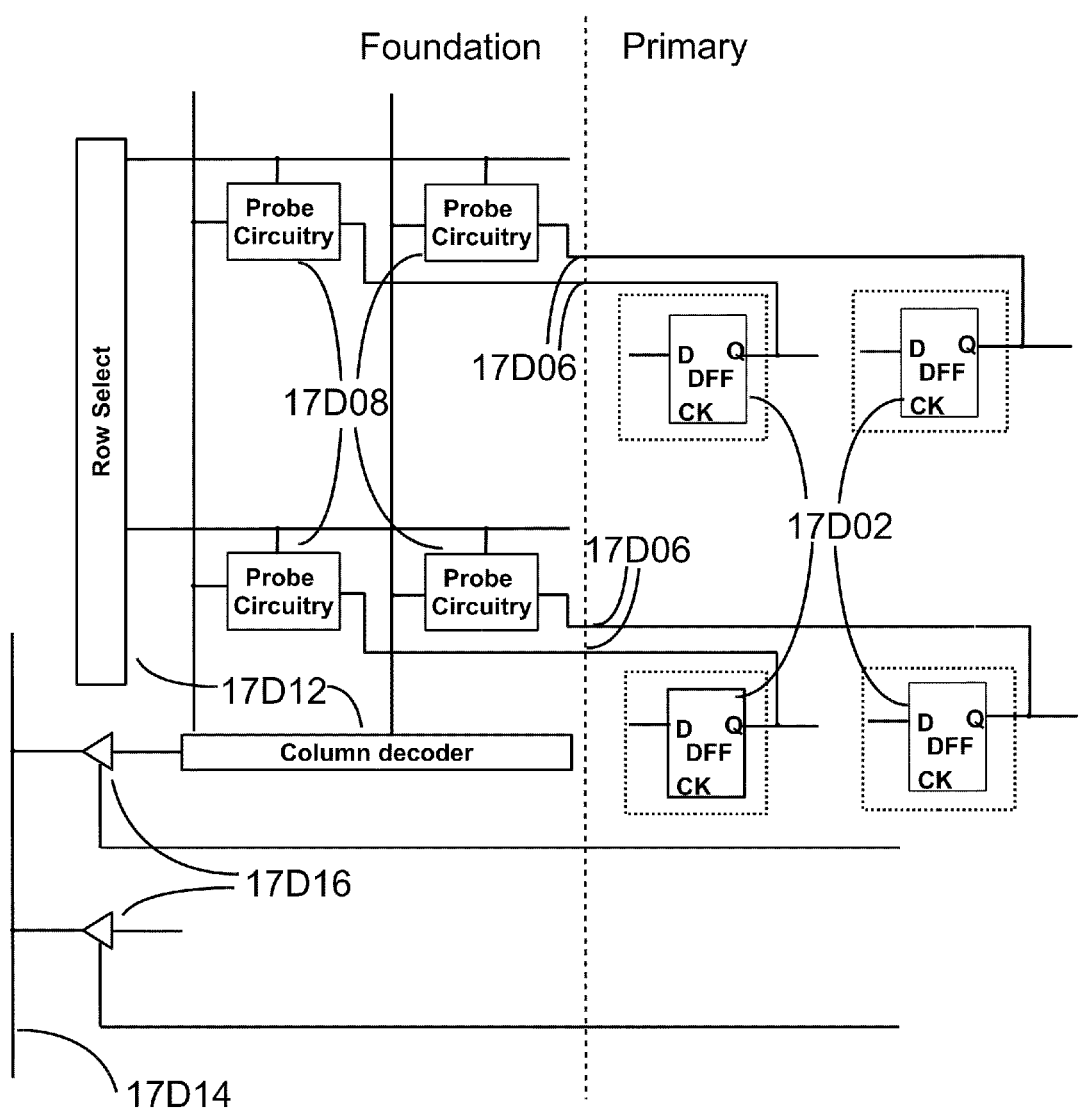
FIG. 17D is a drawing illustration of probe circuits

FIG. 17D illustrates an alternative circuit function that may fit well in the "Foundation." In many IC designs it is desired to integrate a probe auxiliary system that will make it very easy to probe the device in the debugging phase, and to support production testing. Probe circuits have been used in the prior art sharing the same transistor layer as the primary circuit. FIG. 17D illustrates a probe circuit constructed in the Foundation underneath the active circuits in the primary layer. FIG. 17D illustrates that the connections are made to the sequential active circuit elements 17D02. Those connections are routed to the Foundation through interconnect lines 17D06 where high impedance probe circuits 17D08 will be used to sense the sequential element output. A selector circuit 17D12 allows one or more of those sequential outputs to be routed out through one or more buffers 17D16 which may be controlled by signals from the Primary circuit to supply the drive of the sequential output signal to the probed signal output 17D14 for debugging or testing. Persons of ordinary skill in the art will appreciate that other configurations are possible like, for example, having multiple groups of probe circuitry 17D08, multiple probe output signals 17D14, and controlling buffers 17D16 with signals not originating in the primary circuit.

Figure 18:
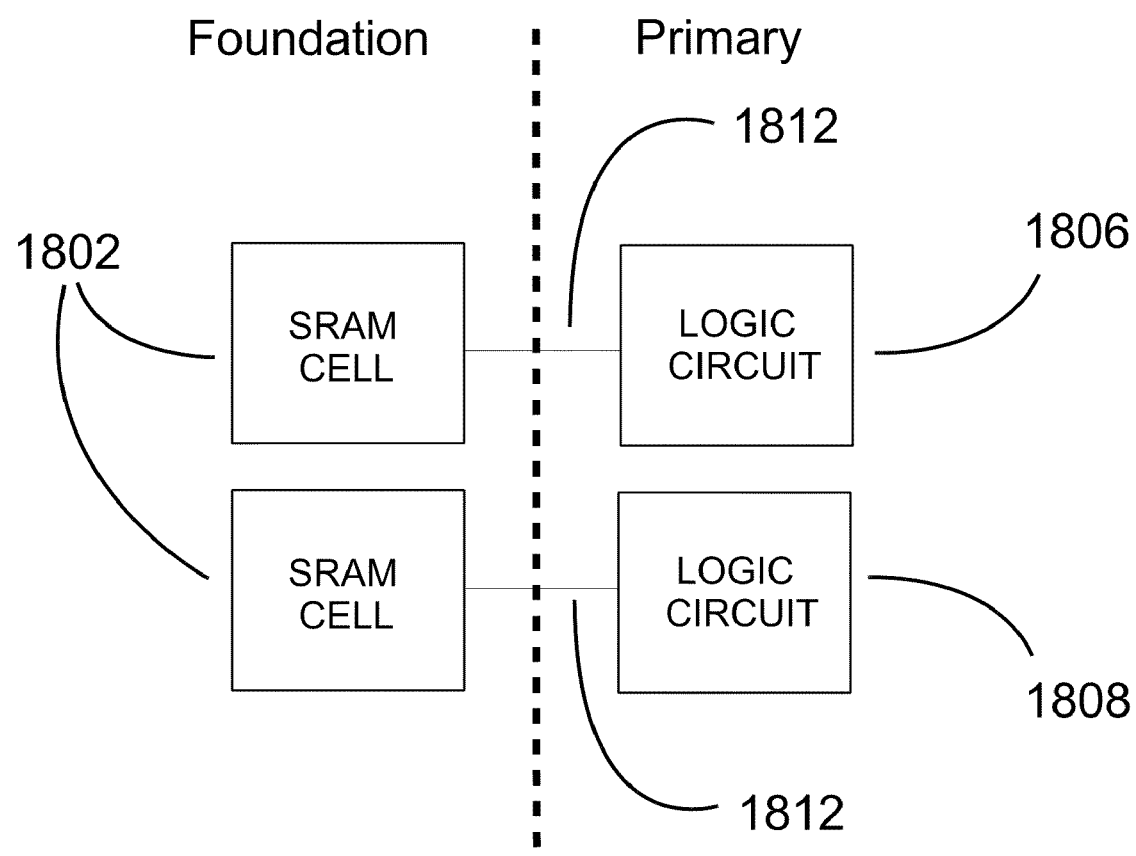
FIG. 18 is a drawing illustration of an underlying SRAM.

In another alternative the foundation substrate 1402 could additionally carry SRAM cells as illustrated in FIG. 18. The SRAM cells 1802 pre-fabricated on the underlying substrate 1402 could be connected 1812 to the primary logic circuit 1806, 1808 built on 1404. As mentioned before, the layers built on 1404 could be aligned to the pre-fabricated structure on the underlying substrate 1402 so that the logic cells could be properly connected to the underlying RAM cells.

Figure 19A:
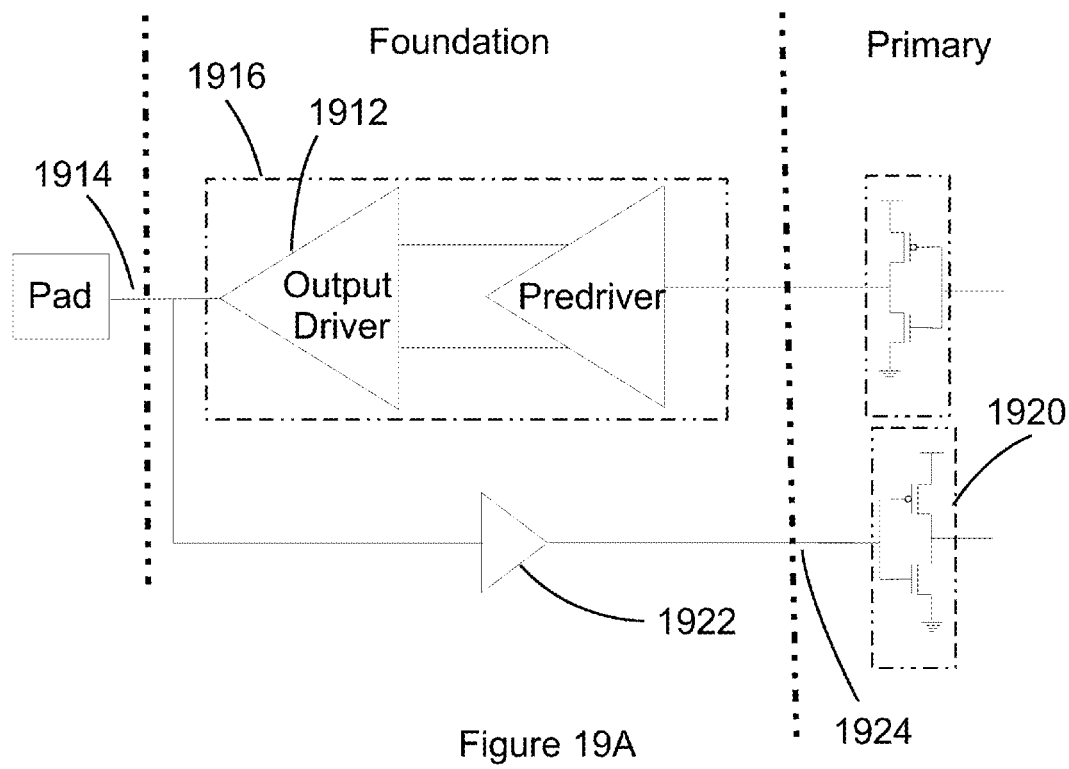
FIG. 19A is a drawing illustration of an underlying I/O.
Figure 19B:
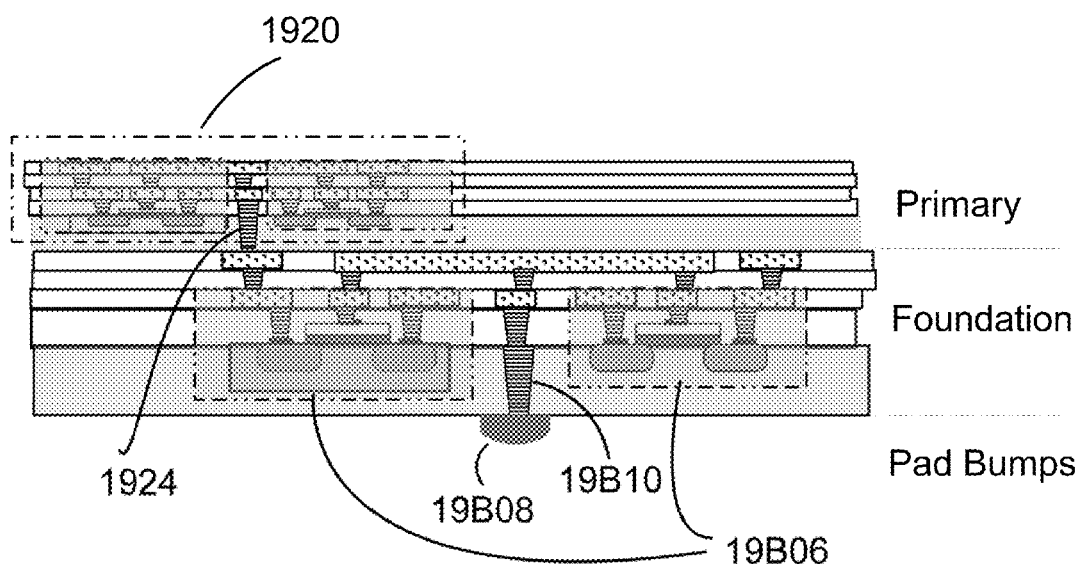
FIG. 19B is a drawing illustration of side "cut"

FIG. 19A is a drawing illustration of an underlying I/O. The foundation 1402 could also be preprocessed to carry the I/O circuits or part of it, such as the relatively large transistors of the output drive 1912. Additionally TSV in the foundation could be used to bring the I/O connection 1914 all the way to the back side of the foundation. FIG. 19B is a drawing illustration of a side "cut" of an integrated device of the present invention. The Output Driver is illustrated by PMOS and NMOS output transistors 19B06 coupled through TSV 19B10 to connect to a backside pad or pad bump 19B08. The connection material used in the foundation 1402 can be selected to withstand the temperature of the following process constructing the full device on 1404 as illustrated in FIG. 8A—802, 804, 806, 807, 810, 812, such as tungsten. The foundation could also carry the input protection circuit 1916 connecting the pad 19B08 to the input logic 1920 in the primary circuits.

An additional embodiment of the present invention may be to use TSVs in the foundation such as TSV 19B10 to connect between wafers to form 3D Integrated Systems. In general each TSV takes a relatively large area, typically a few square microns. When the need is for many TSVs, the overall cost of the required area for these TSVs might be high if the use of that area for high density transistors is precluded. Pre-processing these TSVs on the donor wafer on a relatively older process line will significantly reduce the effective costs of the 3D TSV connections. The connection 1924 to the primary silicon circuitry 1920 could be then made at the minimum contact size of few tens of square nanometers, which is two orders of magnitude lower than the few square microns required by the TSVs. Those of ordinary skill in the art will appreciate that FIG. 19B is for illustration only and is not drawn to scale. Such skilled persons will understand there are many alternate embodiments and component arrangements that could be constructed using the inventive principles shown and that FIG. 19B is not limiting in any way.

Figure 19C:
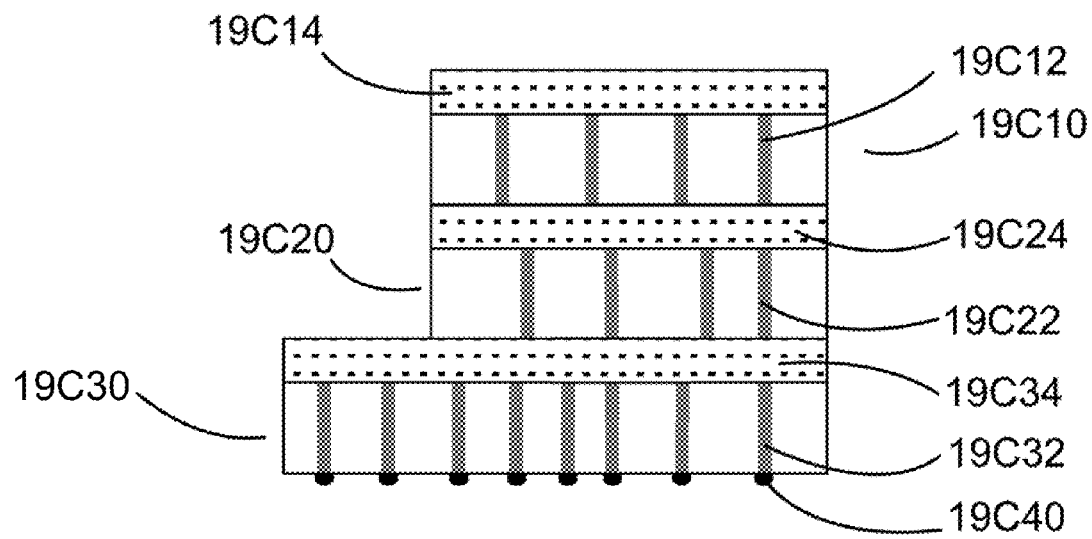
FIG. 19C is a drawing illustration of a 3D IC system.

FIG. 19C demonstrates a 3D system comprising three dice 19C10, 19C20 and 19C30 coupled together with TSVs 19C12, 19C22 and 19C32 similar to TSV 19B10 as described in association with FIG. 19A. The stack of three dice utilize TSV in the Foundations 19C12, 19C22, and 19C32 for the 3D interconnect may allow for minimum effect or silicon area loss of the Primary silicon 19C14, 19C24 and 19C34 connected to their respective Foundations with minimum size via connections. The three die stacks may be connected to a PC Board using bumps 19C40 connected to the bottom die TSVs 19C32. Those of ordinary skill in the art will appreciate that FIG. 19C is for illustration only and is not drawn to scale. Such skilled persons will understand there are many alternate embodiments and component arrangements that could be constructed using the inventive principles shown and that FIG. 19C is not limiting in any way. For example, a die stack could be placed in a package using flip chip bonding or the bumps 19C40 could be replaced with bond pads and the part flipped over and bonded in a conventional package with bond wires.

Figure 19D:
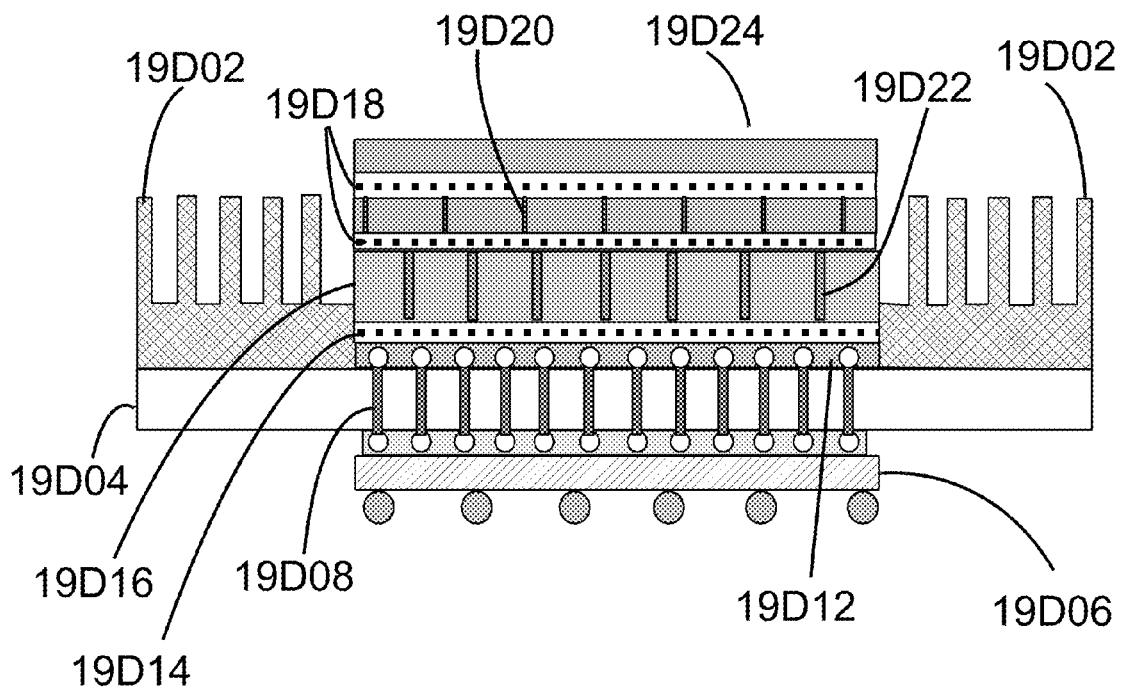
FIG. 19D is a drawing illustration of a 3D IC processor and DRAM system.

FIG. 19D illustrates a 3D IC processor and DRAM system. A well known problem in the computing industry is known as the "memory wall" and relates to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related 'through-DRAM vias" leads to a few severe disadvantages. First, it reduces the usable silicon area of the DRAM by a few percent. Second, it increases the power overhead by a few percent. Third, it requires that the DRAM design be coordinated with the processor design which is very commercially challenging. The embodiment of FIG. 19D illustrates one solution to mitigate the above mentioned disadvantages by having a foundation with TSVs as illustrated in FIGS. 19B and 19C. The use of the foundation and primary structure may enable the connections of the processor without going through the DRAM.

In FIG. 19D the processor I/Os and power may be coupled from the face-down microprocessor active area 19D14—the primary layer, by vias 19D08 through heat spreader substrate 19D04 to an interposer 19D06. A heat spreader 19D12, the heat spreader substrate19D04, and heat sink 19D02 are used to spread the heat generated on the processor active area 19D14. TSVs 19D22 through the Foundation 19D16 are used for the connection of the DRAM stack 19D24. The DRAM stack comprises multiple thinned DRAM 19D18 interconnected by TSV 19D20. Accordingly the DRAM stack does not need to pass through the processor I/O and power planes and could be designed and produced independent of the processor design and layout. The DRAM chip 19D18 that is closest to the Foundation 19D16 may be designed to connect to the Foundation TSVs 19D22, or a separate ReDistribution Layer (or RDL, not shown) may be added in between, or the Foundation 19D16 could serve that function with preprocessed high temperature interconnect layers, such as Tungsten, as described previously. And the processor's active area is not compromised by having TSVs through it as those are done in the Foundation 19D16.

Alternatively the Foundation vias 19D22 could be used to pass the processor I/O and power to the substrate 19D04 and to the interposer 19D06 while the DRAM stack would be coupled directly to the processor active area 19D14. Persons of ordinary skill in the art will appreciate that many more combinations are possible within the scope of the disclosed invention.

Figure 19E:
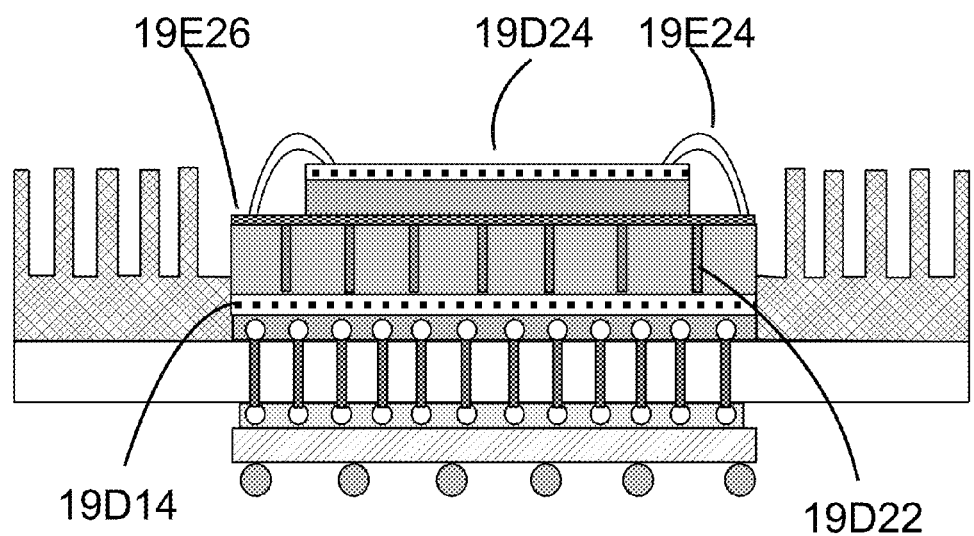
FIG. 19E is a drawing illustration of a 3D IC processor and DRAM system.

FIG. 19E illustrates another embodiment of the present invention wherein the DRAM stack 19D24 may be coupled by wire bonds 19E24 to an RDL (ReDistribution Layer) 19E26 that couples the DRAM to the Foundation vias 19D22, and thus couples them to the face-down processor 19D14.

Figure 19F:
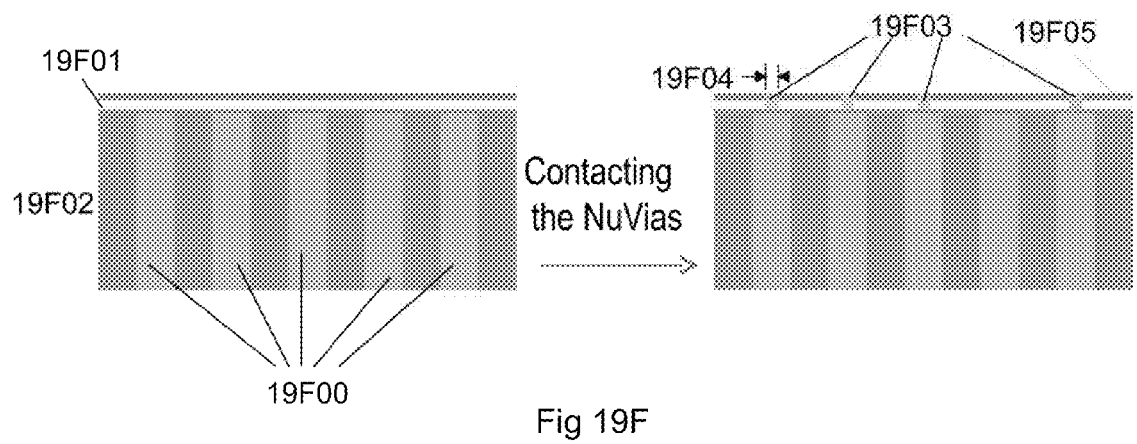
FIG. 19F is a drawing illustration of a custom SOI wafer used to build through-silicon connections.
Figure 19G:
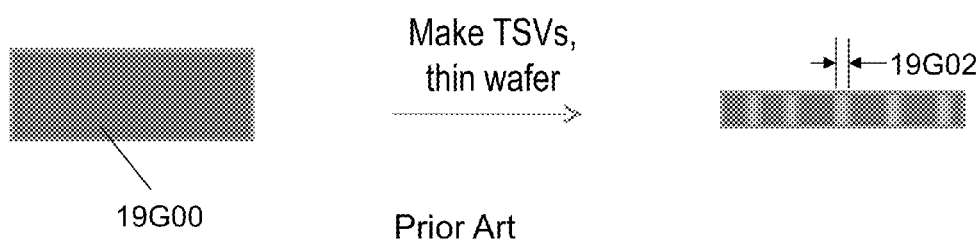
FIG. 19G is a drawing illustration of a prior art method to make through-silicon vias.

In yet another embodiment, custom SOI wafers are used where NuVias 19F00 may be processed by the wafer supplier. NuVias 19F00 may be conventional TSVs that may be 1 micron or larger in diameter and may be preprocessed by an SOI wafer vendor. This is illustrated in FIG. 19F with handle wafer 19F02 and Buried Oxide BOX 19F01. The handle wafer 19F02 may typically be many hundreds of microns thick, and the BOX 19F01 may typically be a few hundred nanometers thick. The Integrated Device Manufacturer (IDM) or foundry then processes NuContacts 19F03 to connect to the NuVias 19F00. NuContacts may be conventionally dimensioned contacts etched thru the thin silicon 19F05 and the BOX 19F01 of the SOI and filled with metal. The NuContact diameter $D_{NuContact}$ 19F04, in FIG. 19F may then be processed into the tens of nanometer range. The prior art of construction with bulk silicon wafers 19G00 as illustrated in FIG. 19G typically has a TSV diameter, $D_{TSV\_prior\_art}$ 19G02, in the micron range. The reduced dimension of NuContact $D_{NuContact}$ 19F04 in FIG. 19F may have important implications for semiconductor designers. The use of NuContacts may provide reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or be based on a commonly agreed industry standard.

Figure 19H:
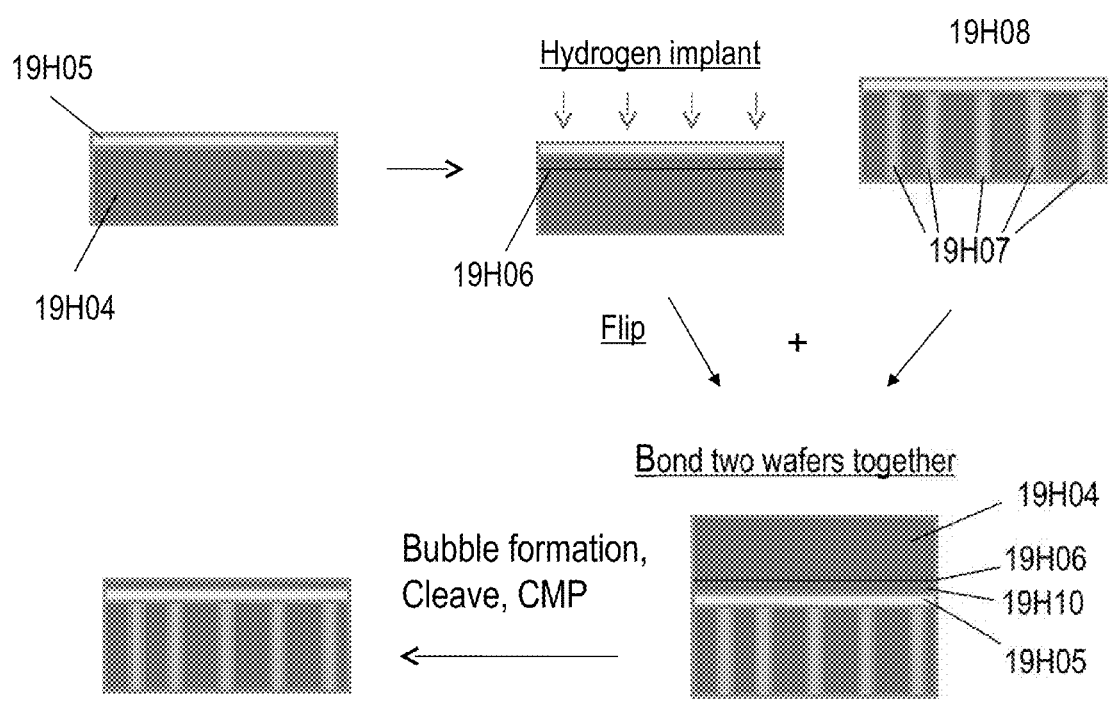
FIG. 19H is a drawing illustration of a process flow for making custom SOI wafers.

A process flow as illustrated in FIG. 19H may be utilized to manufacture these custom SOI wafers. Such a flow may be used by a wafer supplier. A silicon donor wafer 19H04 is taken and its surface 19H05 may be oxidized. An atomic species, such as, for example, hydrogen, may then be implanted at a certain depth 19H06. Oxide-to-oxide bonding as described in other embodiments may then be used to bond this wafer with an acceptor wafer 19H08 having pre-processed NuVias 19H07. The NuVias 19H07 may be constructed with a conductive material, such as tungsten or doped silicon, which can withstand high-temperature processing. An insulating barrier, such as, for example, silicon oxide, may be utilized to electrically isolate the NuVia 19H07 from the silicon of the acceptor wafer 19H08. Alternatively, the wafer supplier may construct NuVias 19H07 with silicon oxide. The integrated device manufacturer or foundry etches out this oxide after the high-temperature (more than 400° C.) transistor fabrication is complete and may replace this oxide with a metal such as copper or aluminum. This process may allow a low-melting point, but highly conductive metal, like copper to be used. Following the bonding, a portion 19H10 of the donor silicon wafer 19H04 may be cleaved at 19H06 and then chemically mechanically polished as described in other embodiments.

Figure 19I:
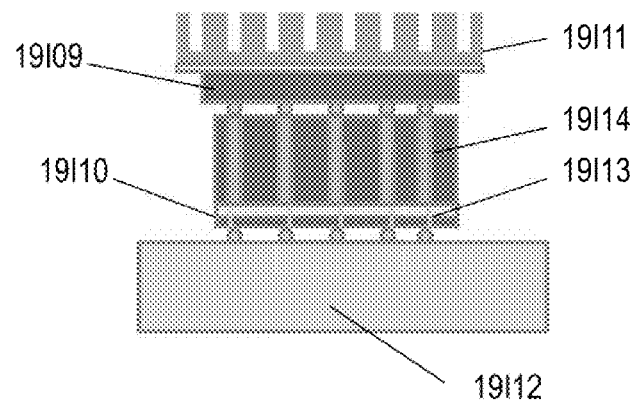
FIG. 19I is a drawing illustration of a processor-DRAM stack.
Figure 19J:
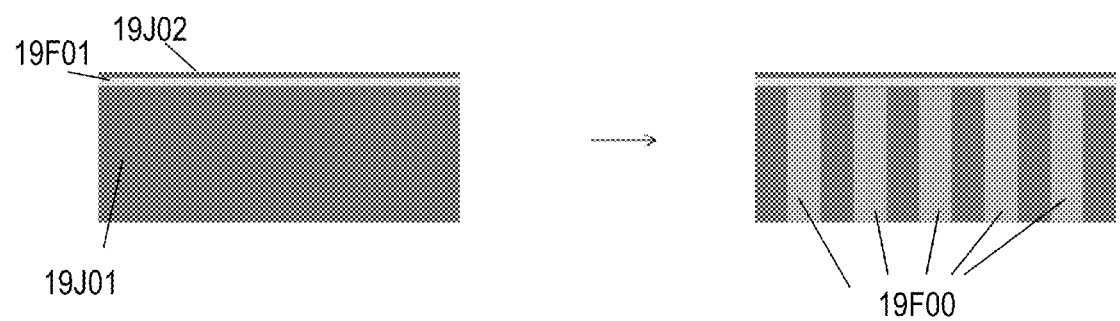
FIG. 19J is a drawing illustration of a process flow for making custom SOI wafers.

FIG. 19J depicts another technique to manufacture custom SOI wafers. A standard SOI wafer with substrate 19J01, box 19F01, and top silicon layer 19J02 may be taken and NuVias 19F00 may be formed from the back-side up to the oxide layer. This technique might require a thicker buried oxide 19F01 than a standard SOI process.

FIG. 19I depicts how a custom SOI wafer may be used for 3D stacking of a processor 19I09 and a DRAM 19I10. In this configuration, a processor's power distribution and I/O connections have to pass from the substrate 19I12, go through the DRAM 19I10 and then connect onto the processor 19I09. The above described technique in FIG. 19F may result in a small contact area on the DRAM active silicon, which is very convenient for this processor-DRAM stacking application. The transistor area lost on the DRAM die due to the through-silicon connection 19I13 and 19I14 is very small due to the tens of nanometer diameter of NuContact 19I13 in the active DRAM silicon. It is difficult to design a DRAM when large areas in its center are blocked by large through-silicon connections. Having small size through-silicon connections may help tackle this issue. Persons of ordinary skill in the art will appreciate that this technique may be applied to building processor-SRAM stacks, processor-flash memory stacks, processor-graphics-memory stacks, any combination of the above, and any other combination of related integrated circuits such as, for example, SRAM-based programmable logic devices and their associated configuration ROM/PROM/EPROM/EEPROM devices, ASICs and power regulators, microcontrollers and analog functions, etc. Additionally, the silicon on insulator (SOI) may be a material such as polysilicon, GaAs, GaN, etc. on an insulator. Such skilled persons will appreciate that the applications of NuVia and NuContact technology are extremely general and the scope of the invention is to be limited only by the appended claims.

In another embodiment of the present invention the foundation substrate 1402 could additionally carry re-drive cells (often called buffers). Re-drive cells are common in the industry for signals which is routed over a relatively long path. As the routing has a severe resistance and capacitance penalty it is helpful to insert re-drive circuits along the path to avoid a severe degradation of signal timing and shape. An advantage of having re-drivers in the foundation 1402 is that these re-drivers could be constructed from transistors who could withstand the programming voltage. Otherwise isolation transistors such as 1601 and 1602 or other isolation scheme may be used at the logic cell input and output.

FIG. 8A is a cut illustration of a programmable device, with two antifuse layers. The programming transistors for the first one 804 could be prefabricated on 814, and then, utilizing "smart-cut", a single crystal silicon layer 1404 is transferred on which the primary programmable logic 802 is fabricated with advanced logic transistors and other circuits. Then multi-metal layers are fabricated including a lower layer of antifuses 804, interconnection layers 806 and second antifuse layer with its configurable interconnects 807. For the second antifuse layer the programming transistors 810 could be fabricated also utilizing a second "smart-cut" layer transfer.

Figure 20:
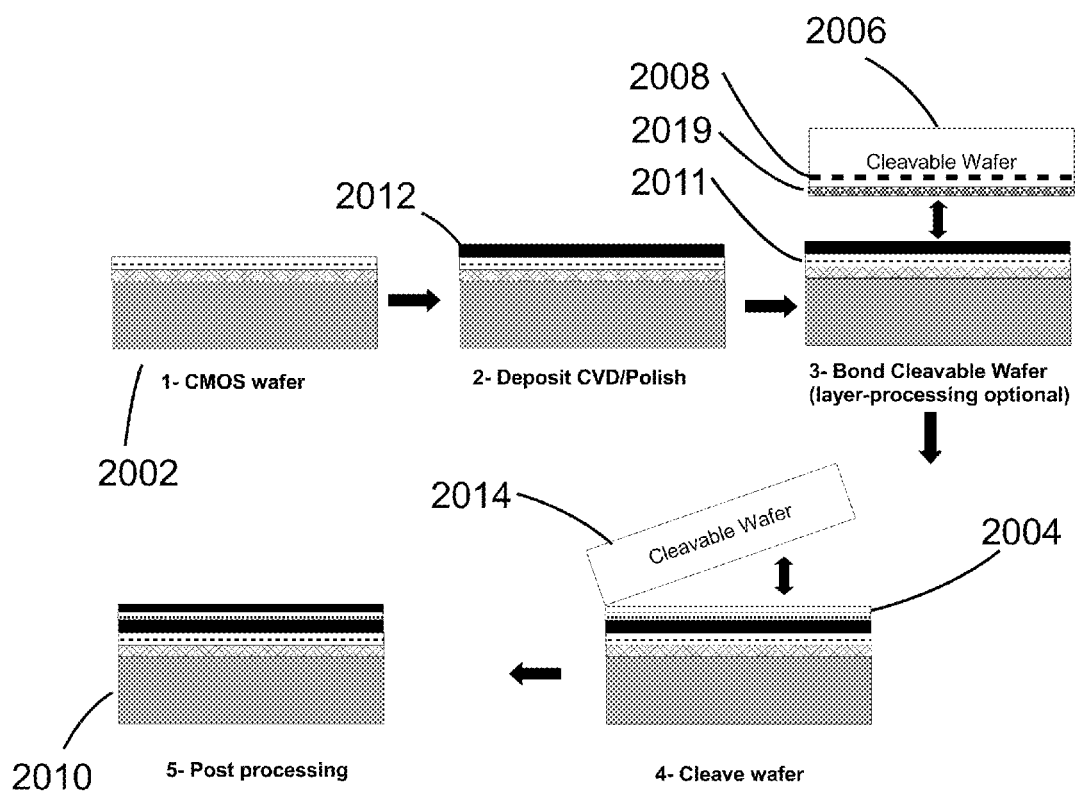
FIG. 20 is a drawing illustration of a layer transfer process flow.

FIG. 20 is a drawing illustration of the second layer transfer process flow. The primary processed wafer 2002 comprises all the prior layers-814, 802, 804, 806, and 807. An oxide layer 2012 is then deposited on top of the wafer 2002 and then polished for better planarization and surface preparation. A donor wafer 2006 (or cleavable wafer as labeled in the drawing) is then brought in to be bonded to 2002. The donor wafer 2006 is pre processed to comprise the semiconductor layers 2019 which will be later used to construct the top layer of programming transistors 810 as an alternative to the TFT transistors. The donor wafer 2006 is also prepared for "Smart-Cut" by ion implant of an atomic species, such as H+, at the desired depth to prepare the SmartCut line 2008. After bonding the two wafers a SmartCut step is performed to pull out the top portion 2014 of the donor wafer 2006 along the cut layer 2008. This donor wafer may now also be processed and reused for more layer transfers. The result is a 3D wafer 2010 which comprises wafer 2002 with an added layer 2004 of single crystal silicon pre-processed to carry additional semiconductor layers. The transferred slice 2004 could be quite thin at the range of 10-200 nm as desired. Utilizing "Smart-Cut" layer transfer provides single crystal semiconductors layer on top of a pre-processed wafer without heating the pre-processed wafer to more than 400° C.

There are a few alternative methods to construct the top transistors precisely aligned to the underlying pre-fabricated layers such as pre-processed wafer or layer 808, utilizing "SmartCut" layer transfer and not exceeding the temperature limit of the underlying pre-fabricated structure. As the layer transfer is less than 200 nm thick, then the transistors defined on it could be aligned precisely to the top metal layer of the pre-processed wafer or layer 808 as required and those transistors have less than 40 nm misalignment.

One alternative method is to have a thin layer transfer of single crystal silicon which will be used for epitaxial Ge crystal growth using the transferred layer as the seed for the germanium. Another alternative method is to use the thin layer transfer of crystallized silicon for epitaxial growth of $Ge_xSi_{1-x}$. The percent Ge in Silicon of such layer would be determined by the transistor specifications of the circuitry. Prior art have presented approaches whereby the base silicon is used to epi-crystallize the germanium on top of the oxide by using holes in the oxide to drive seeding from the underlying silicon crystal. However, it is very hard to do such on top of multiple interconnection layers. By using layer transfer we can have the silicon crystal on top and make it relatively easy to seed and epi-crystallize an overlying germanium layer. Amorphous germanium could be conformally deposited by CVD at 300° C. and pattern aligned to the underlying layer, such as the pre-processed wafer or layer 808, and then encapsulated by a low temperature oxide. A short μs-duration heat pulse melts the Ge layer while keeping the underlying structure below 400° C. The Ge/Si interface will start the epi-growth to crystallize the germanium or $Ge_xSi_{1-x}$ layer. Then implants are made to form Ge transistors and activated by laser pulses without damaging the underlying structure taking advantage of the low melting temperature of germanium.

Figure 21A:
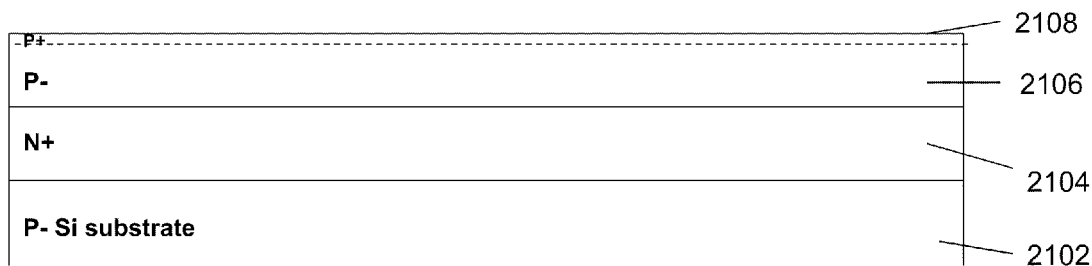
FIG. 21A is a drawing illustration of a pre-processed wafer used for a layer transfer.
Figure 21B:
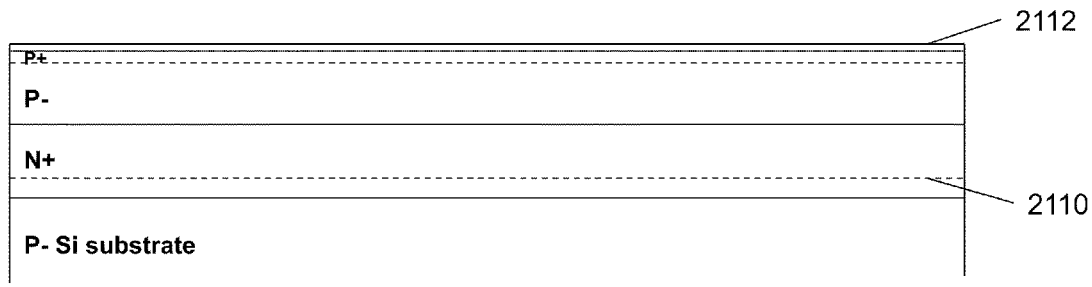
FIG. 21B is a drawing illustration of a pre-processed wafer ready for a layer transfer.

Another alternative method is to preprocess the wafer used for layer transfer as illustrated in FIG. 21. FIG. 21A is a drawing illustration of a pre-processed wafer used for a layer transfer. A lightly doped P-type wafer (P− wafer) 2102 may be processed to have a "buried" layer of highly doped N-type silicon (N+) 2104, by implant and activation, or by shallow N+ implant and diffusion followed by a P− epi growth (epitaxial growth) 2106. Optionally, if a substrate contact is needed for transistor performance, an additional shallow P+ layer 2108 is implanted and activated. FIG. 21B is a drawing illustration of the pre-processed wafer made ready for a layer transfer by an implant of an atomic species, such as H+, preparing the SmartCut "cleaving plane" 2110 in the lower part of the N+ region and an oxide deposition or growth 2112 in preparation for oxide to oxide bonding. Now a layer-transfer-flow should be performed to transfer the pre-processed single crystal P− silicon with N+ layer, on top of pre-processed wafer or layer 808. The top of pre-processed wafer or layer 808 may be prepared for bonding by deposition of an oxide, or surface treatments, or both. Persons of ordinary skill in the art will appreciate that the processing methods presented above are illustrative only and that other embodiments of the inventive principles described herein are possible and thus the scope if the invention is only limited by the appended claims.

Figure 22A:
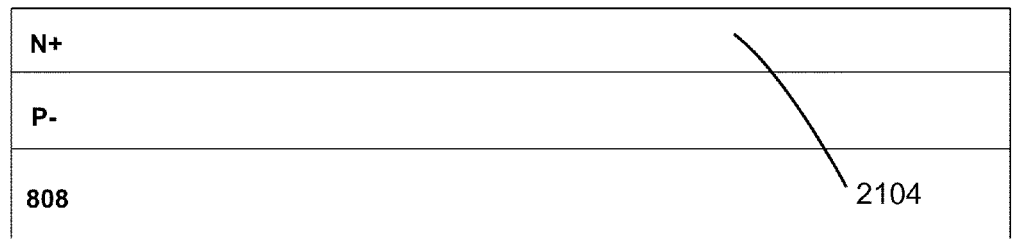
FIG. 22A-22H are drawing illustrations of formation of top planar transistors.
Figure 22B:
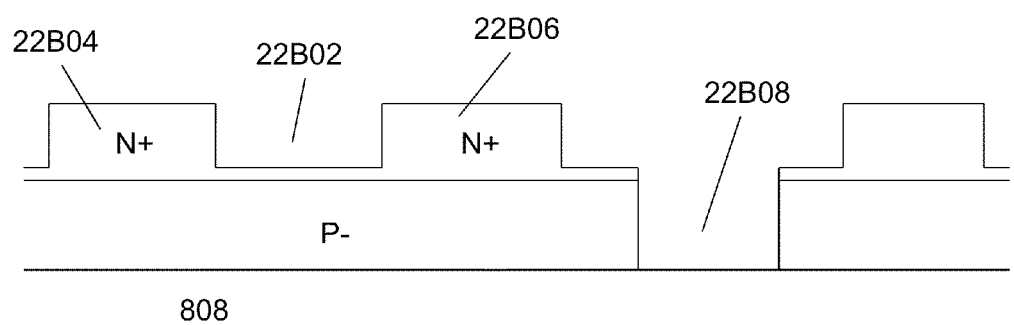
Figure 22C:
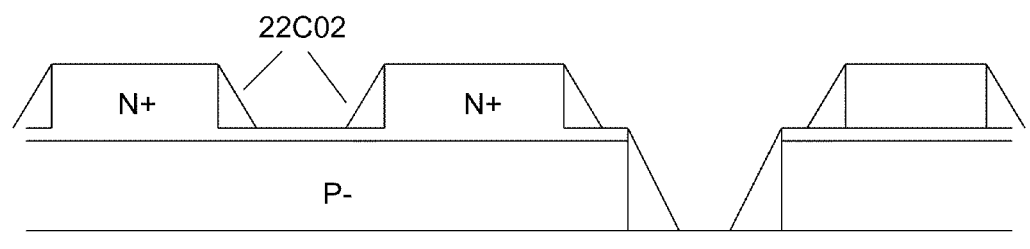
Figure 22D:
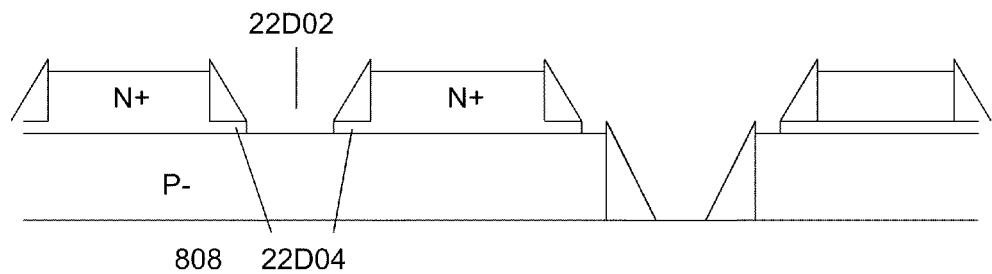
Figure 22E:
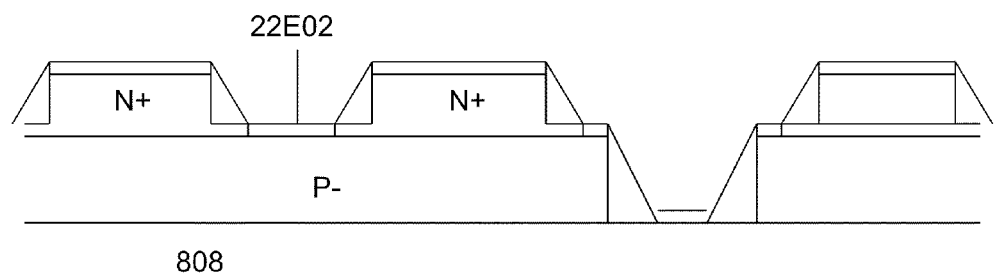

FIGS. 22A-22H are drawing illustrations of the formation of planar top source extension transistors. FIG. 22A illustrates the layer transferred on top of preprocessed wafer or layer 808 after the smart cut wherein the N+ 2104 is on top. Then the top transistor source 22B04 and drain 22B06 are defined by etching away the N+ from the region designated for gates 22B02, leaving a thin more lightly doped N+ layer for the future source and drain extensions, and the isolation region between transistors 22B08. Utilizing an additional masking layer, the isolation region 22B08 is defined by an etch all the way to the top of pre-processed wafer or layer 808 to provide full isolation between transistors or groups of transistors. Etching away the N+ layer between transistors is helpful as the N+ layer is conducting. This step is aligned to the top of the pre-processed wafer or layer 808 so that the formed transistors could be properly connected to metal layers of the pre-processed wafer or layer 808. Then a highly conformal Low-Temperature Oxide 22C02 (or Oxide/Nitride stack) is deposited and etched resulting in the structure illustrated in FIG. 22C. FIG. 22D illustrates the structure following a self aligned etch step preparation for gate formation 22D02, thereby forming the source and drain extensions 22D04. FIG. 22E illustrates the structure following a low temperature microwave oxidation technique, such as the TEL SPA (Tokyo Electron Limited Slot Plane Antenna) oxygen radical plasma, that grows or deposits a low temperature Gate Dielectric 22E02 to serve as the MOSFET gate oxide, or an atomic layer deposition (ALD) technique may be utilized. Alternatively, the gate structure may be formed by a high k metal gate process flow as follows. Following an industry standard HF/SC1/SC2 clean to create an atomically smooth surface, a high-k dielectric 22E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of approximately 4.2 eV for the device to operate properly and at the right threshold voltage. Alternatively, a metal replacing P+ poly as the gate electrode needs to have a work function of approximately 5.2 eV to operate properly. The TiAl and TiAlN based family of metals, for example, could be used to tune the work function of the metal from 4.2 eV to 5.2 eV.

Figure 22F:
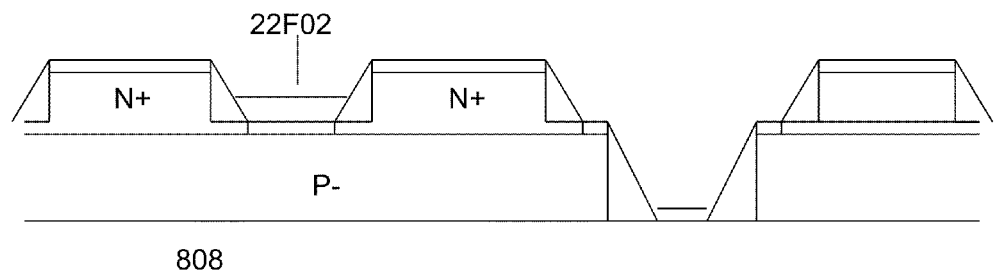

FIG. 22F illustrates the structure following deposition, mask, and etch of metal gate 22F02. Optionally, to improve transistor performance, a targeted stress layer to induce a higher channel strain may be employed. A tensile nitride layer may be deposited at low temperature to increase channel stress for the NMOS devices illustrated in FIG. 22. A PMOS transistor may be constructed via the above process flow by changing the initial P– wafer or epi-formed P– on N+ layer 2104 to an N– wafer or an N– on P+ epi layer; and the N+ layer 2104 to a P+ layer. Then a compressively stressed nitride film would be deposited post metal gate formation to improve the PMOS transistor performance.

Figure 22G:
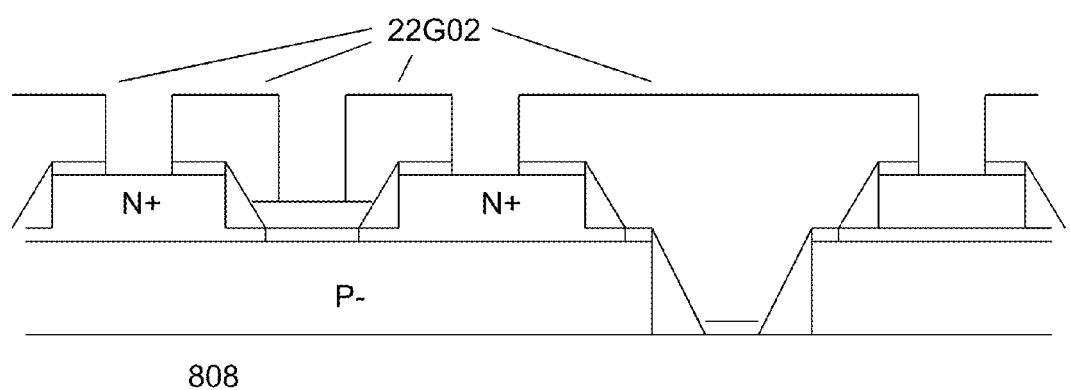
Figure 22H:
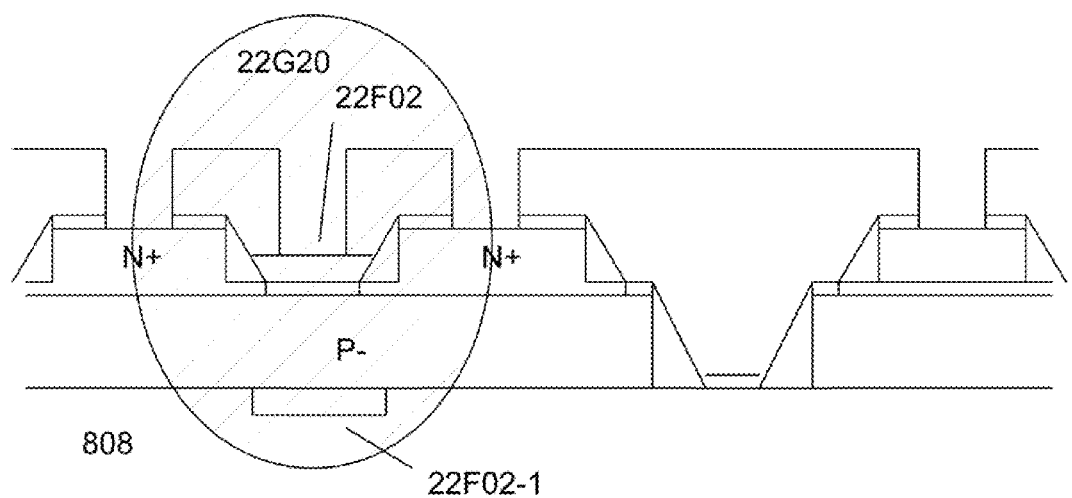

Finally a thick oxide 22G02 may be deposited and contact openings may be masked and etched preparing the transistors to be connected as illustrated in FIG. 22G. This thick or any low-temperature oxide in this document may be deposited via Chemical Vapor Deposition (CVD), Physical Vapor Deposition (PVD), or Plasma Enhanced Chemical Vapor Deposition (PECVD) techniques. This flow enables the formation of fully crystallized top MOS transistors that could be connected to the underlying multi-metal layer semiconductor device without exposing the underlying devices and interconnects metals to high temperature. These transistors could be used as programming transistors of the Antifuse on layer 807, coupled to the pre-processed wafer or layer 808 to create a monolithic 3D circuit stack, or for other functions in a 3D integrated circuit. These transistors can be considered "planar MOSFET transistors," meaning that current flow in the transistor channel is in the horizontal direction. These transistors can also be referred to as horizontal transistors or lateral transistors. An additional advantage of this flow is that the SmartCut H+, or other atomic species, implant step is done prior to the formation of the MOS transistor gates avoiding potential damage to the gate function. If needed the top layer of the pre-processed wafer or layer 808 could comprise a 'back-gate' 22F02-1 whereby gate 22F02 may be aligned to be directly on top of the back-gate 22F02-1 as illustrated in FIG. 22H. The back gate 22F02-1 may be formed from the top metal layer in the pre-processed wafer or layer 808 and may utilize the oxide layer deposited on top of the metal layer for the wafer bonding (not shown) to act as a gate oxide for the back gate.

According to some embodiments of the current invention, during a normal fabrication of the device layers as illustrated in FIG. 8, every new layer is aligned to the underlying layers using prior alignment marks. Sometimes the alignment marks of one layer could be used for the alignment of multiple layers on top of it and sometimes the new layer will also have alignment marks to be used for the alignment of additional layers put on top of it in the following fabrication step. So layers of 804 are aligned to layers of 802, layers of 806 are aligned to layers of 804 and so forth. An advantage of the described process flow is that the layer transferred is thin enough so that during the following patterning step as described in connection to FIG. 22B, the transferred layer may be aligned to the alignment marks of the pre-processed wafer or layer 808 or those of underneath layers such as layers 806, 804, 802, or other layers as required, to form the 3D IC. Therefore the 'back-gate' 22F02-1 which is part of the top metal layer of the pre-processed wafer or layer 808 would be precisely underneath gate 22F02 as all the layers are patterned as being aligned to each other. In this context alignment precision may be highly dependent on the equipment used for the patterning steps. For processes of 45 nm and below, overlay alignment of better than 5 nm is usually required. The alignment requirement only gets tighter with scaling where modern steppers now can do better than 2 nm. This alignment requirement is orders of magnitude better than what could be achieved for TSV based 3D IC systems as described below in relation to FIG. 12 where even 0.5 micron overlay alignment is extremely hard to achieve. Connection between top-gate and back-gate would be made through a top layer via. This may allow further reduction of leakage as both the gate 22F02 and the back-gate 22F02-1 could be connected together to better shut off the transistor 22G20. As well, one could create a sleep mode, a normal speed mode, and fast speed mode by dynamically changing the threshold voltage of the top gated transistor by independently changing the bias of the 'back-gate' 22F02-1. Additionally, an accumulation mode (fully depleted) MOSFET transistor could be constructed via the above process flow by changing the initial P– wafer 2102 or epi-formed P-2106 on N+ layer 2104 to an N– wafer or an N– epi layer on N+.

An additional aspect of this technique for forming top transistors is the size of the via used to connect the top transistors 22G20 to the metal layers in pre-processed wafer and layer 808 underneath. The general rule of thumb is that the size of a via should be larger than one tenth the thickness of the layer that the via is going through. Since the thickness of the layers in the structures presented in FIG. 12 is usually more than 50 micron, the TSV used in such structures are about 10 micron on the side. The thickness of the transferred layer in FIG. 22A is less than 100 nm and accordingly the vias to connect top transistors 22G20 to the metal layers in pre-processed wafer and layer 808 underneath could be less than 50 nm on the side. As the process is scaled to smaller feature sizes, the thickness of the transferred layer and accordingly the size of the via to connect to the underlying structures could be scaled down. For some advanced processes, the end thickness of the transferred layer could be made below 10 nm.

Another alternative for forming the planar top transistors with source and drain extensions is to process the prepared wafer of FIG. 21B as shown in FIGS. 29A-29G. FIG. 29A illustrates the layer transferred on top of pre-processed wafer or layer 808 after the smart cut wherein the N+ 2104 is on top, the P– 2106, and P+ 2108. The oxide layers used to facilitate the wafer to wafer bond are not shown. Then the substrate P+ source 29B04 contact opening and transistor isolation 29B02 is masked and etched as shown in FIG. 29B. Utilizing an additional masking layer, the isolation region 29C02 is defined by etch all the way to the top of the pre-processed wafer or layer 808 to provide full isolation between transistors or groups of transistors in FIG. 29C. Etching away the P+ layer between transistors is helpful as the P+ layer is conducting. Then a Low-Temperature Oxide 29C04 is deposited and chemically mechanically polished. Then a thin polish stop layer 29C06 such as low temperature silicon nitride is deposited resulting in the structure illustrated in FIG. 29C. Source 29D02, drain 29D04 and self-aligned Gate 29D06 may be defined by masking and etching the thin polish stop layer 29C06 and then a sloped N+ etch as illustrated in FIG. 29D. The sloped (30-90 degrees, 45 is shown) etch or etches may be accomplished with wet chemistry or plasma etching techniques. This process forms angular source and drain extensions 29D08. FIG. 29E illustrates the structure following deposition and densification of a low temperature based Gate Dielectric 29E02, or alternately a low temperature microwave plasma oxidation of the silicon surfaces, or an atomic layer deposited (ALD) gate dielectric, to serve as the MOSFET gate oxide, and then deposition of a gate material 29E04, such as aluminum or tungsten.

Alternatively, a high-k metal gate structure may be formed as follows. Following an industry standard HF/SC1/SC2 cleaning to create an atomically smooth surface, a high-k dielectric 29E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of approximately 4.2 eV for the device to operate properly and at the right threshold voltage. Alternatively, a metal replacing $P^+$ poly as the gate electrode needs to have a work function of approximately 5.2 eV to operate properly. The TiAl and TiAlN based family of metals, for example, could be used to tune the work function of the metal from 4.2 eV to 5.2 eV.

FIG. 29F illustrates the structure following a chemical mechanical polishing of the metal gate 29E04 utilizing the nitride polish stop layer 29C06. A PMOS transistor could be constructed via the above process flow by changing the initial P− wafer or epi-formed P− on N+ layer 2104 to an N− wafer or an N− on P+ epi layer; and the N+ layer 2104 to a P+ layer. Similarly, layer 2108 would change from P+ to N+ if the substrate contact option was used.

Finally a thick oxide 29G02 is deposited and contact openings are masked and etched preparing the transistors to be connected as illustrated in FIG. 29G. This figure also illustrates the layer transfer silicon via 29G04 masked and etched to provide interconnection of the top transistor wiring to the lower layer 808 interconnect wiring 29G06. This flow enables the formation of fully crystallized top MOS transistors that may be connected to the underlying multi-metal layer semiconductor device without exposing the underlying devices and interconnects metals to high temperature. These transistors may be used as programming transistors of the antifuse on layer 807, to couple with the pre-processed wafer or layer 808 to form monolithic 3DICs, or for other functions in a 3D integrated circuit. These transistors can be considered to be "planar MOSFET transistors", where current flow in the transistor channel is in the horizontal direction. These transistors can also be referred to as horizontal transistors or lateral transistors. An additional advantage of this flow is that the SmartCut H+, or other atomic species, implant step is done prior to the formation of the MOS transistor gates avoiding potential damage to the gate function. Additionally, an accumulation mode (fully depleted) MOSFET transistor may be constructed via the above process flow by changing the initial P− wafer or epi-formed P− on N+ layer 2104 to an N− wafer or an N− epi layer on N+. Additionally, a back gate similar to that shown in FIG. 22H may be utilized.

Figure 23A:
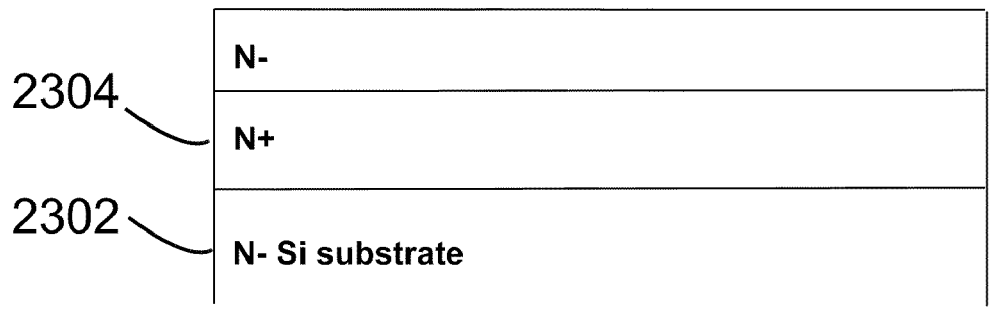
FIG. 23A, 23B is a drawing illustration of a pre-processed wafer used for a layer transfer.
Figure 23B:
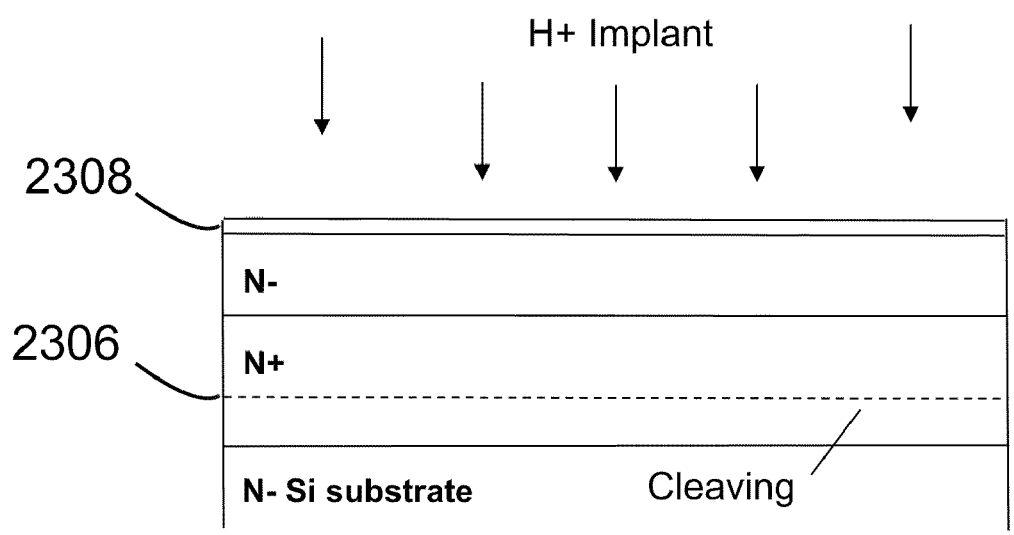

Another alternative method is to preprocess the wafer used for layer transfer as illustrated in FIG. 23. FIG. 23A is a drawing illustration of a pre-processed wafer used for a layer transfer. An N− wafer 2302 is processed to have a "buried" layer of N+ 2304, by implant and activation, or by shallow N+ implant and diffusion followed by an N− epi growth (epitaxial growth). FIG. 23B is a drawing illustration of the pre-processed wafer made ready for a layer transfer by a deposition or growth of an oxide 2308 and by an implant of an atomic species, such as H+, preparing the SmartCut cleaving plane 2306 in the lower part of the N+ region. Now a layer-transfer flow should be performed to transfer the pre-processed crystallized N− silicon with N+ layer, on top of the pre-processed wafer or layer 808.

Figure 24A:
FIG. 24A-24F are drawing illustrations of formation of top planar transistors.
Figure 24B:
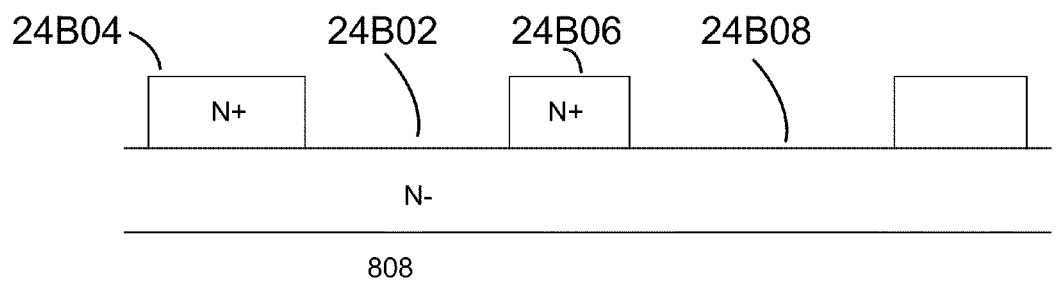
Figure 24C:
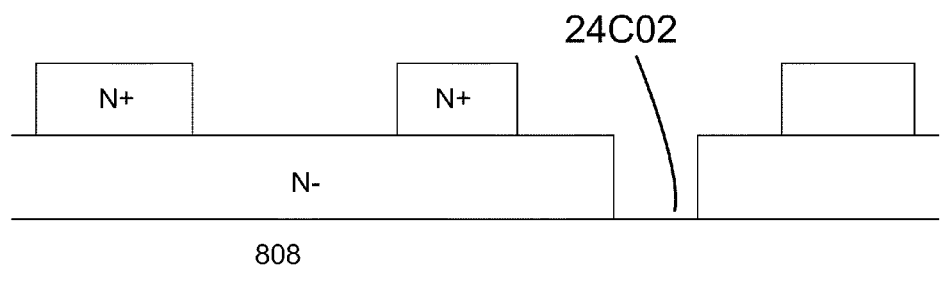
Figure 24D:
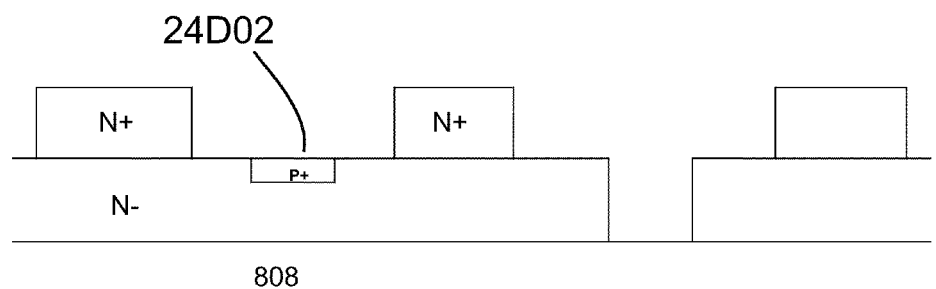
Figure 24E:
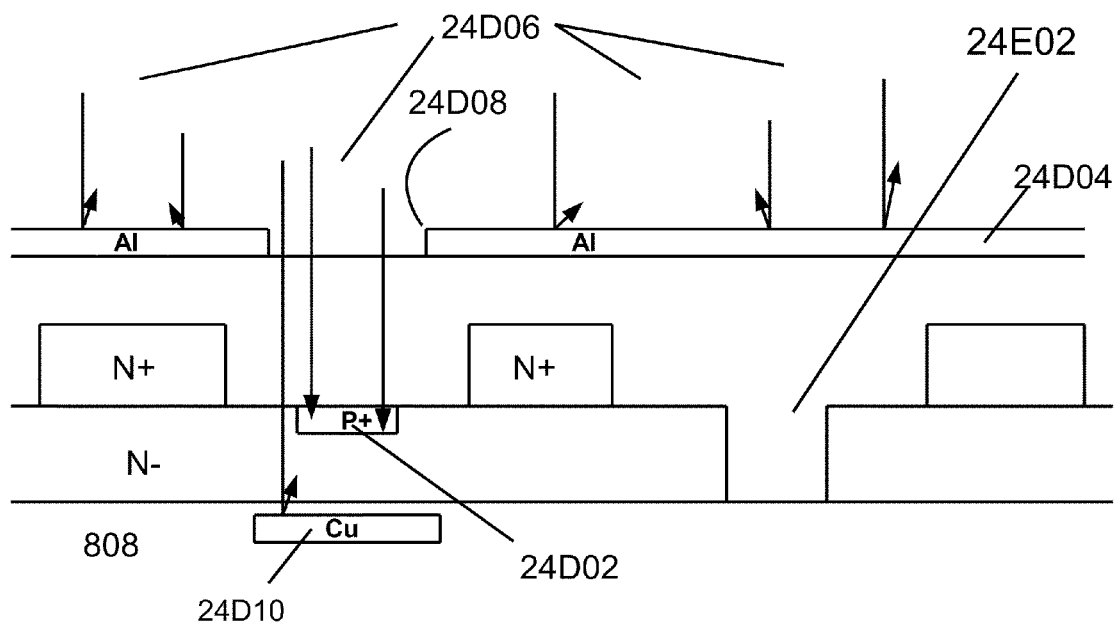
Figures 1, 24E:
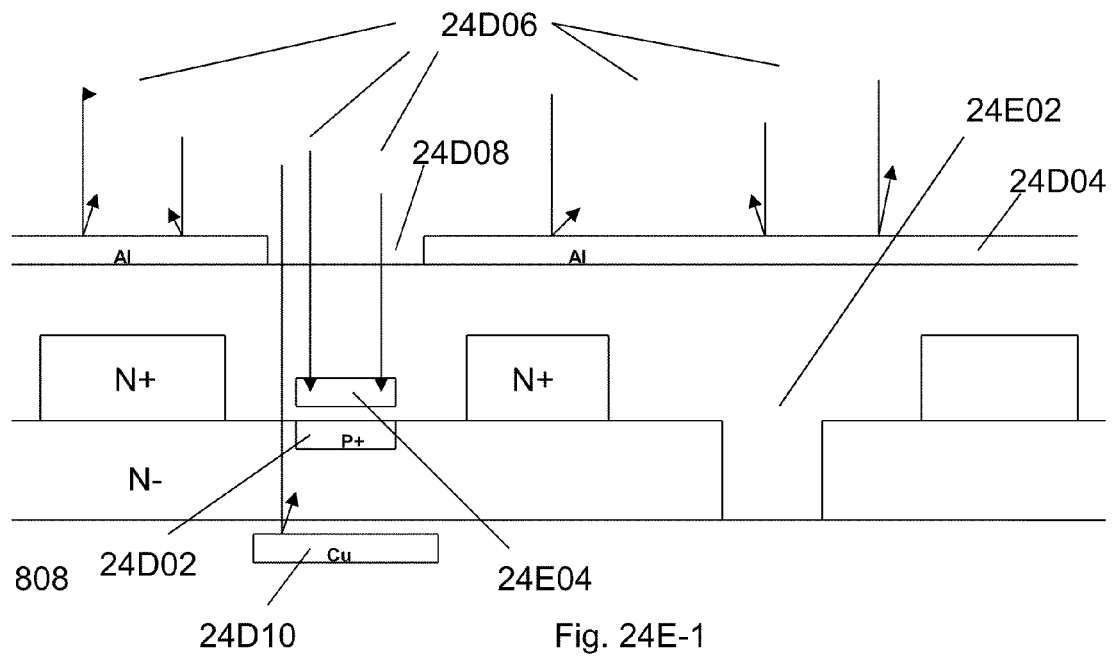

FIGS. 24A-24F are drawing illustrations of the formation of planar Junction Gate Field Effect Transistor (JFET) top transistors. FIG. 24A illustrates the structure after the layer is transferred on top of the pre-processed wafer or layer 808. So, after the smart cut, the N+ 2304 is on top and now marked as 24A04. Then the top transistor source 24B04 and drain 24B06 are defined by etching away the N+ from the region designated for gates 24B02 and the isolation region between transistors 24B08. This step is aligned to the pre-processed wafer or layer 808 so the formed transistors could be properly connected to the underlying layers of pre-processed wafer or layer 808. Then an additional masking and etch step is performed to remove the N− layer between transistors, shown as 24C02, thus providing better transistor isolation as illustrated in FIG. 24C. FIG. 24D illustrates an optional formation of shallow P+ region 24D02 for the JFET gate formation. In this option there might be a need for laser or other method of optical annealing to activate the P+. FIG. 24E illustrates how to utilize the laser anneal and minimize the heat transfer to pre-processed wafer or layer 808. After the thick oxide deposition 24E02, a layer of Aluminum 24D04, or other light reflecting material, is applied as a reflective layer. An opening 24D08 in the reflective layer is masked and etched, allowing the laser light 24D06 to heat the P+ 24D02 implanted area, and reflecting the majority of the laser energy 24D06 away from pre-processed wafer or layer 808. Normally, the open area 24D08 is less than 10% of the total wafer area. Additionally, a copper layer 24D10, or, alternatively, a reflective Aluminum layer or other reflective material, may be formed in the pre-processed wafer or layer 808 that will additionally reflect any of the unwanted laser energy 24D06 that might travel to pre-processed wafer or layer 808. Layer 24D10 could also be utilized as a ground plane or backgate electrically when the formed devices and circuits are in operation. Certainly, openings in layer 24D10 would be made through which later thru vias connecting the second top transferred layer to the pre-processed wafer or layer 808 may be constructed. This same reflective laser anneal or other methods of optical anneal technique might be utilized on any of the other illustrated structures to enable implant activation for transistor gates in the second layer transfer process flow. In addition, absorptive materials may, alone or in combination with reflective materials, also be utilized in the above laser or other method of optical annealing techniques. As shown in FIG. 24E-1, a photonic energy absorbing layer 24E04, such as amorphous carbon, may be deposited or sputtered at low temperature over the area that needs to be laser heated, and then masked and etched as appropriate. This allows the minimum laser or other optical energy to be employed to effectively heat the area to be implant activated, and thereby minimizes the heat stress on the reflective layers 24D04 & 24D10 and the base layer of pre-processed wafer or layer 808. The laser annealing could be done to cover the complete wafer surface or be directed to the specific regions where the gates are to further reduce the overall heat and further guarantee that no damage has been caused to the underlying layers.

Figure 24F:
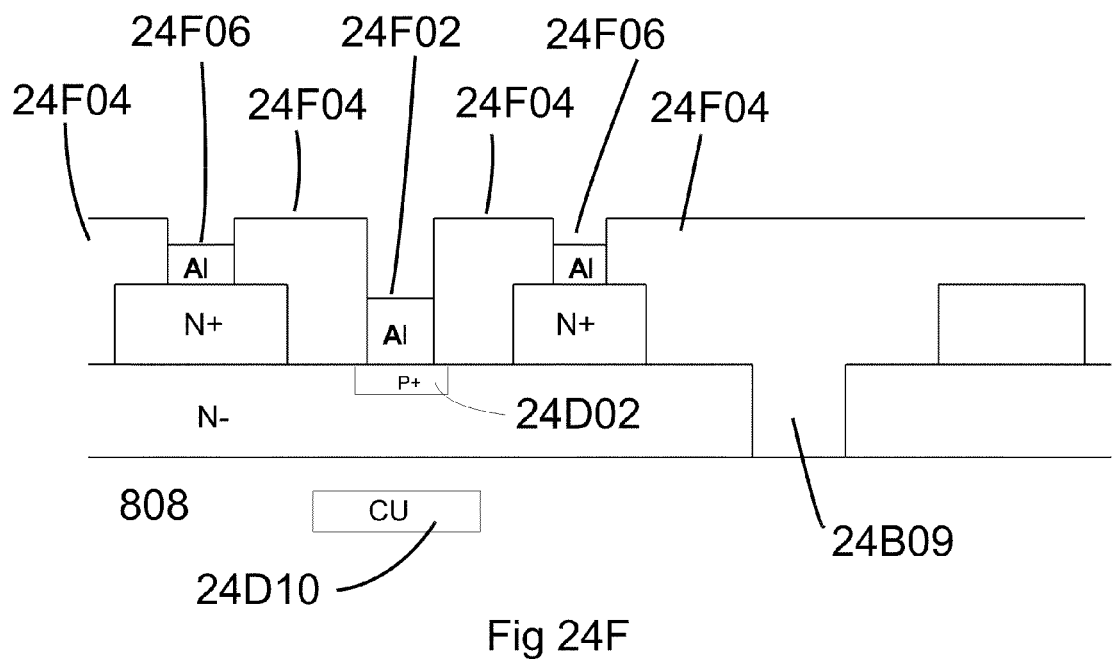

FIG. 24F illustrates the structure, following etching away of the laser reflecting layer 24D04, and the deposition, masking, and etch of a thick oxide 24F04 to open contacts 24F06 and 24F02, and deposition and partial etch-back (or Chemical Mechanical Polishing (CMP)) of aluminum (or other metal as required to obtain an optimal Schottky or ohmic contact at 24F02) to form contacts 24F06 and gate 24F02. If necessary, N+ contacts 24F06 and gate contact 24F02 can be masked and etched separately to allow a different metal to be deposited in each to create a Schottky or ohmic contact in the gate 24F02 and ohmic connections in the N+ contacts 24F06. The thick oxide 24F04 is a non conducting dielectric material also filling the etched space 24B08 and 24B09 between the top transistors and could comprise other isolating material such as silicon nitride. The top transistors will therefore end up being surrounded by isolating dielectric unlike conventional bulk integrated circuits transistors that are built in single crystal silicon wafer and only get covered by non conducting isolating material. This flow enables the formation of fully crystallized top JFET transistors that could be connected to the underlying multi-metal layer semiconductor device without exposing the underlying device to high temperature.

Another variation of the previous flow could be in utilizing a transistor technology called pseudo-MOSFET utilizing a molecular monolayer that is covalently grafted onto the channel region between the drain and source. This is a process that can be done at relatively low temperatures (less than 400° C.).

Figure 25A:
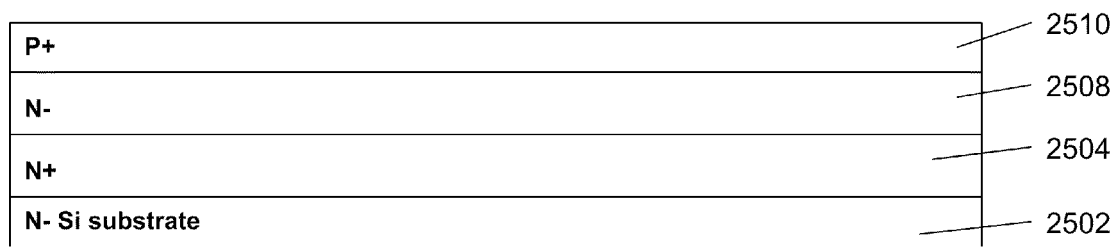
FIG. 25A, 25B is a drawing illustration of a pre-processed wafer used for a layer transfer.
Figure 25B:
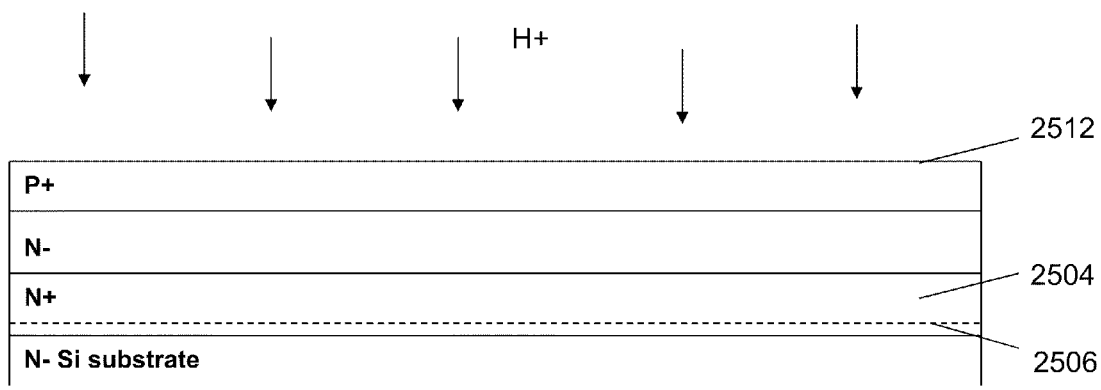

Another variation is to preprocess the wafer used for layer transfer as illustrated in FIG. 25. FIG. 25A is a drawing illustration of a pre-processed wafer used for a layer transfer. An N− wafer 2502 is processed to have a "buried" layer of N+ 2504, by implant and activation, or by shallow N+ implant and diffusion followed by an N− epi growth (epitaxial growth) 2508. An additional P+ layer 2510 is processed on top. This P+ layer 2510 could again be processed, by implant and activation, or by P+ epi growth. FIG. 25B is a drawing illustration of the pre-processed wafer made ready for a layer transfer by a deposition or growth of an oxide 2512 and by an implant of an atomic species, such as H+, preparing the SmartCut cleaving plane 2506 in the lower part of the N+ 2504 region. Now a layer-transfer-flow should be performed to transfer the pre-processed single crystal silicon with N+ and N− layers, on top of the pre-processed wafer or layer 808.

Figure 26A:
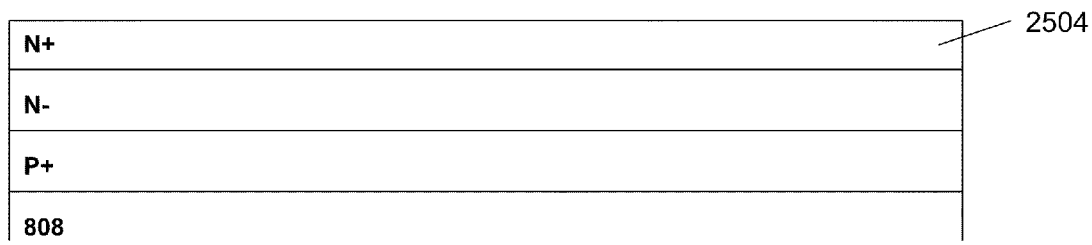
FIG. 26A-26E are drawing illustrations of formation of top planar transistors.
Figure 26B:
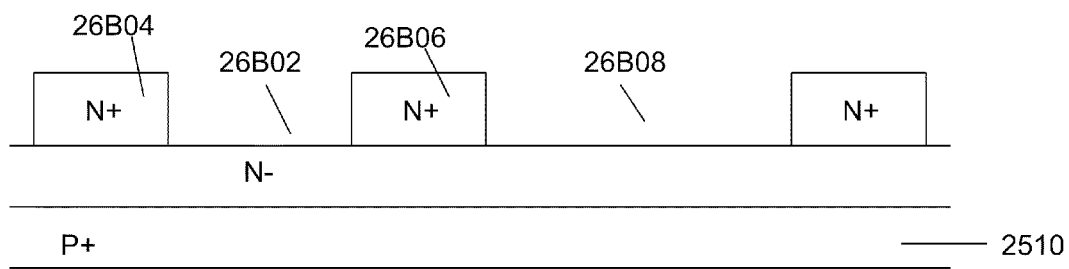
Figure 26C:
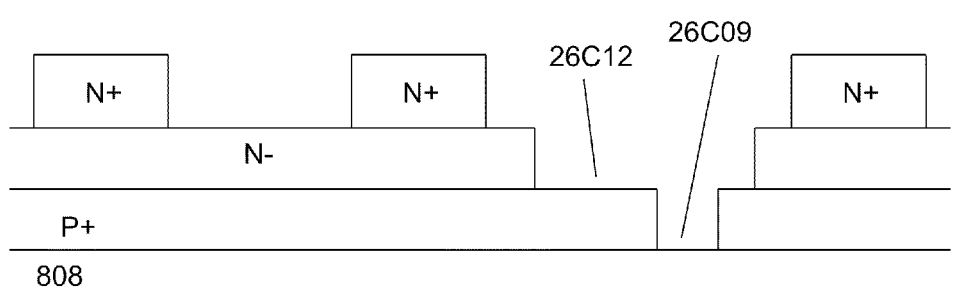
Figure 26D:
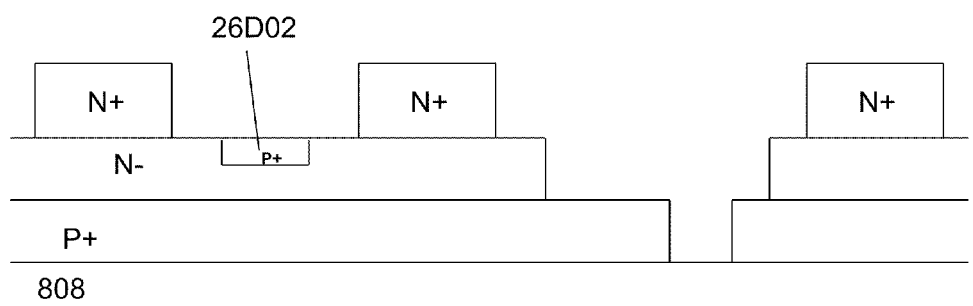
Figure 26E:
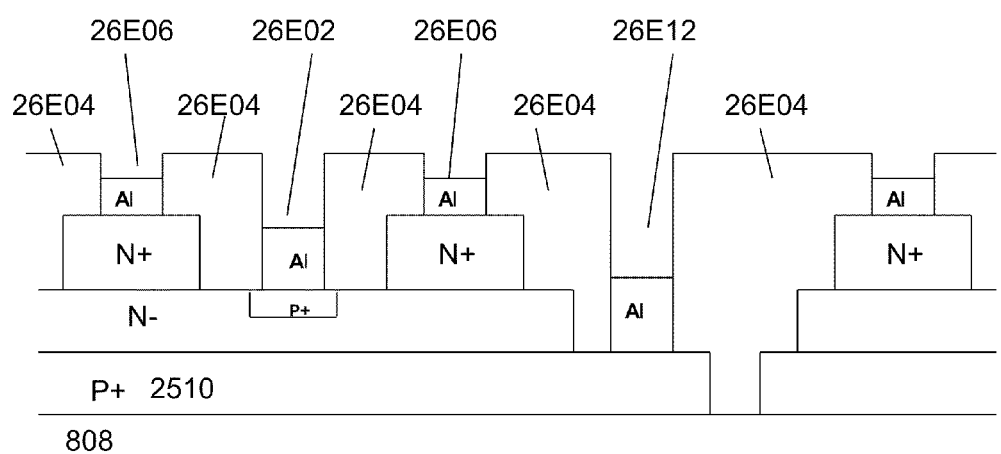

FIGS. 26A-26E are drawing illustrations of the formation of top planar JFET transistors with back bias or double gate. FIG. 26A illustrates the layer transferred on top of the pre-processed wafer or layer 808 after the smart cut wherein the N+ 2504 is on top. Then the top transistor source 26B04 and drain 26B06 are defined by etching away the N+ from the region designated for gates 26B02 and the isolation region between transistors 26B08. This step is aligned to the pre-processed wafer or layer 808 so that the formed transistors could be properly connected to the underlying layers of pre-processed wafer or layer 808. Then a masking and etch step is performed to remove the N− between transistors 26C12 and to allow contact to the now buried P+ layer 2510. And then a masking and etch step is performed to remove in between transistors 26C09 the buried P+ layer 2510 for full isolation as illustrated in FIG. 26C. FIG. 26D illustrates an optional formation of a shallow P+ region 26D02 for gate formation. In this option there might be a need for laser anneal to activate the P+. FIG. 26E illustrates the structure, following deposition and etch or CMP of a thick oxide 26E04, and deposition and partial etch-back of aluminum (or other metal as required to obtain an optimal Schottky or ohmic contact at 26E02) contacts 26E06, 26E12 and gate 26E02. If necessary, N+ contacts 26E06 and gate contact 26E02 can be masked and etched separately to allow a different metal to be deposited in each to create a Schottky or ohmic contact in the gate 26E02 and Schottky or ohmic connections in the N+ contacts 26E06 & 26E12. The thick oxide 26E04 is a non conducting dielectric material also filling the etched space 26B08 and 26C09 between the top transistors and could be comprised from other isolating material such as silicon nitride. Contact 26E12 is to allow a back bias of the transistor or can be connected to the gate 26E02 to provide a double gate JFET. Alternatively the connection for back bias could be included in layers of the pre-processed wafer or layer 808 connecting to layer 2510 from underneath. This flow enables the formation of fully crystallized top ultra thin body planar JFET transistors with back bias or double gate capabilities that may be connected to the underlying multi-metal layer semiconductor device without exposing the underlying device to high temperature.

Figure 27A:
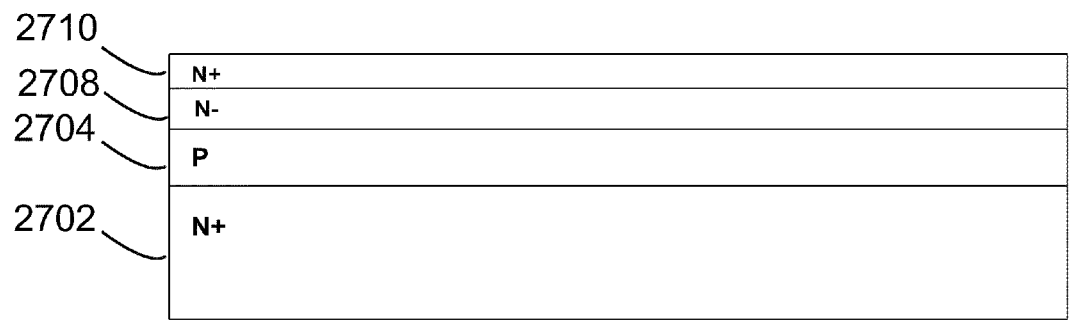
FIG. 27A, 27B is a drawing illustration of a pre-processed wafer used for a layer transfer.
Figure 27B:
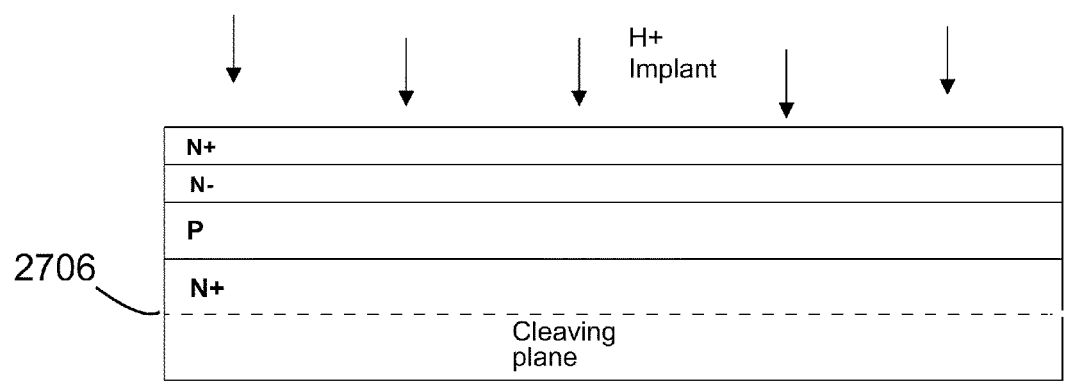

Another alternative is to preprocess the wafer used for layer transfer as illustrated in FIG. 27. FIG. 27A is a drawing illustration of a pre-processed wafer used for a layer transfer. An N+ wafer 2702 is processed to have "buried" layers either by ion implantation and activation anneals, or by diffusion to create a vertical structure to be the building block for NPN (or PNP) bipolar junction transistors. Multi layer epitaxial growth of the layers may also be utilized to create the doping layered structure. Starting with P layer 2704, then N− layer 2708, and finally N+ layer 2710 and then activating these layers by heating to a high activation temperature. FIG. 27B is a drawing illustration of the pre-processed wafer made ready for a layer transfer by a deposition or growth of an oxide 2712 and by an implant of an atomic species, such as H+, preparing the SmartCut cleaving plane 2706 in the N+ region. Now a layer-transfer-flow should be performed to transfer the pre-processed layers, on top of pre-processed wafer or layer 808.

Figure 28A:
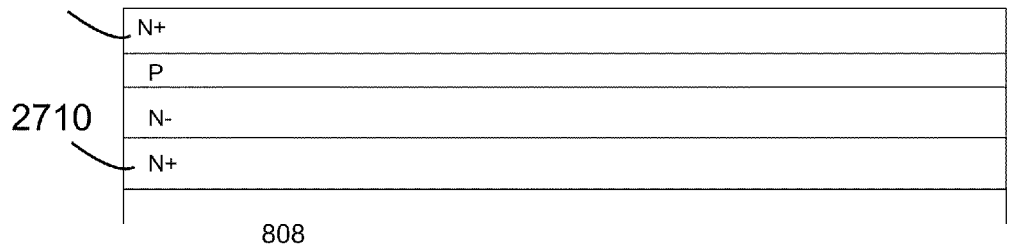
FIG. 28A-28E are drawing illustrations of formations of top transistors.
Figure 28B:
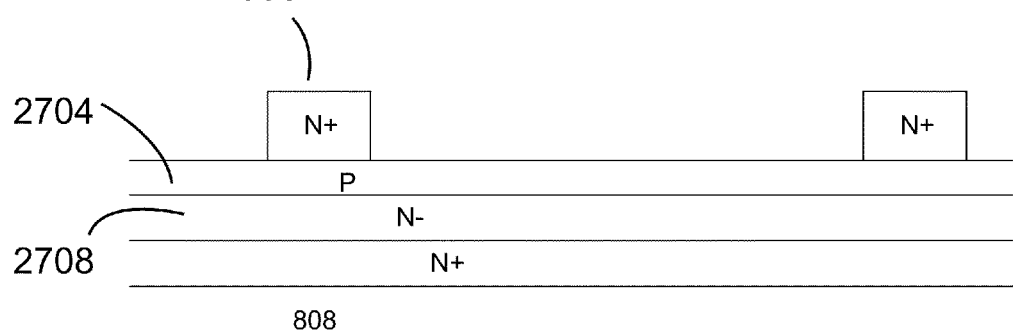
Figure 28C:
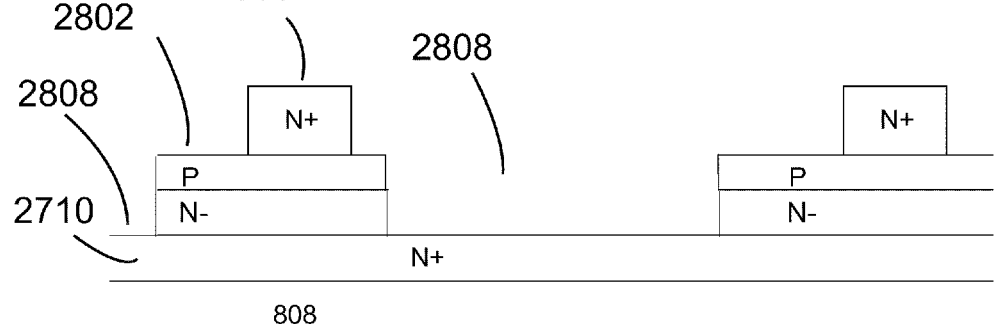
Figure 28D:
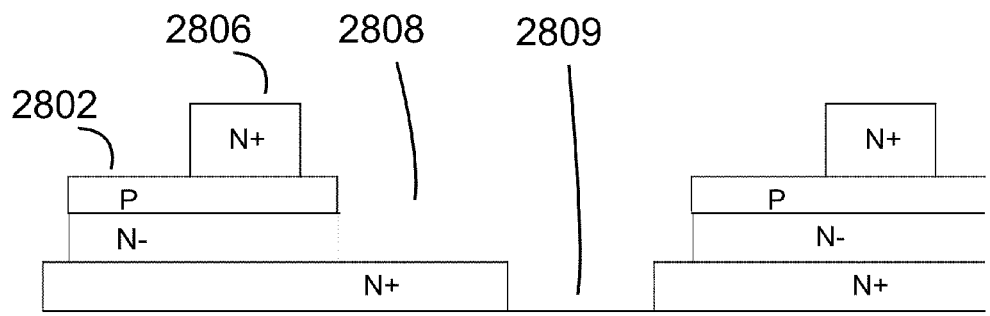
Figure 28E:
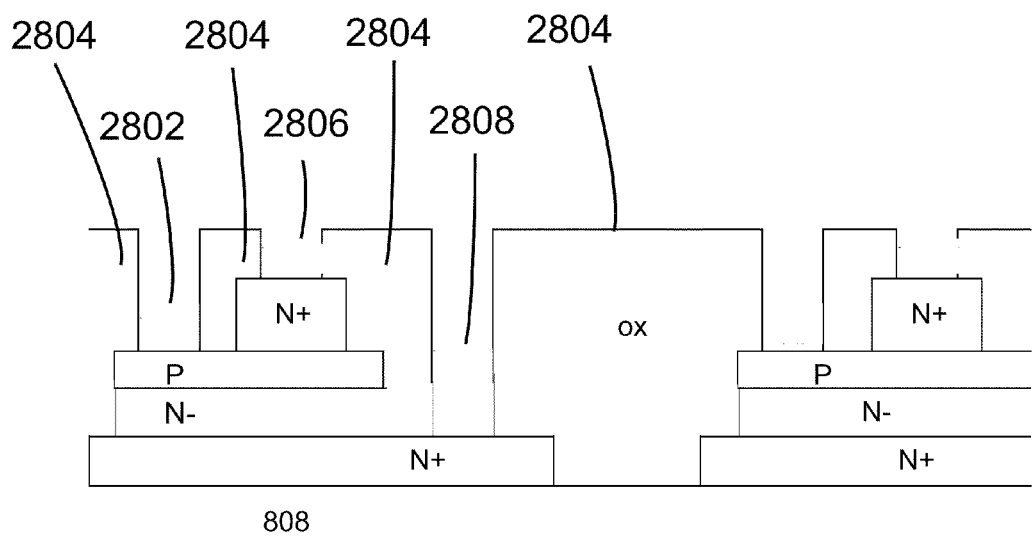

FIGS. 28A-28E are drawing illustrations of the formation of top layer bipolar junction transistors. FIG. 28A illustrates the layer transferred on top of wafer or layer 808 after the smart cut wherein the N+ 28A02 which was part of 2702 is now on top. Effectively at this point there is a giant transistor overlaying the entire wafer. The following steps are multiple etch steps as illustrated in FIG. 28B to 28D where the giant transistor is cut and defined as needed and aligned to the underlying layers of pre-processed wafer or layer 808. These etch steps also expose the different layers comprising the bipolar transistors to allow contacts to be made with the emitter 2806, base 2802 and collector 2808, and etching all the way to the top oxide of pre-processed wafer or layer 808 to isolate between transistors as 2809 in FIG. 28D. The top N+ doped layer 28A02 may be masked and etched as illustrated in FIG. 28B to form the emitter 2806. Then the p 2704 and N− 2706 doped layers may be masked and etched as illustrated in FIG. 28C to form the base 2802. Then the collector layer 2710 may be masked and etched to the top oxide of pre-processed wafer or layer 808, thereby creating isolation 2809 between transistors as illustrated in FIG. 28D. Then the entire structure may be covered with a Low Temperature Oxide 2804, the oxide planarized with CMP, and then masked and etched to form contacts to the emitter 2806, base 2802 and collector 2808 as illustrated in FIG. 28E. The oxide 2804 is a non conducting dielectric material also filling the etched space 2809 between the top transistors and could be comprised from other isolating material such as silicon nitride. This flow enables the formation of fully crystallized top bipolar transistors that could be connected to the underlying multi-metal layer semiconductor device without exposing the underlying device to high temperature.

The bipolar transistors formed with reference to FIGS. 27 and 28 may be used to form analog or digital BiCMOS circuits where the CMOS transistors are on the substrate primary layer 802 with pre-processed wafer or layer 808 and the bipolar transistors may be formed in the transferred top layer.

Another class of devices that may be constructed partly at high temperature before layer transfer to a substrate with metal interconnects and then completed at low temperature after layer transfer is a junction-less transistor. For example, in deep sub micron processes copper metallization is utilized, so a high temperature would be above approximately 400° C., whereby a low temperature would be approximately 400° C. and below. The junction-less transistor structure avoids the sharply graded junctions required as silicon technology scales, and provides the ability to have a thicker gate oxide for an equivalent performance when compared to a traditional MOSFET transistor. The junction-less transistor is also known as a nanowire transistor without junctions, or gated resistor, or nanowire transistor as described in a paper by Jean-Pierre Colinge, et. al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include the nanowire channel must be thin and narrow enough to allow for full depletion of the carriers when the device is turned off, and the channel doping must be high enough to allow a reasonable current to flow when the device is on. These considerations may lead to tight process variation boundaries for channel thickness, width, and doping for a reasonably obtainable gate work function and gate oxide thickness.

One of the challenges of a junction-less transistor device is turning the channel off with minimal leakage at a zero gate bias. To enhance gate control over the transistor channel, the channel may be doped unevenly; whereby the heaviest doping is closest to the gate or gates and the channel doping is lighter the farther away from the gate electrode. One example would be where the center of a 2, 3, or 4 gate sided junction-less transistor channel is more lightly doped than the edges. This may enable much lower off currents for the same gate work function and control. FIGS. 52 A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the nm channel portion doped at 1E17 is farthest away from the gate electrode. In FIG. 52 A, curves 5202 and 5204 correspond to doping patterns of D=1E18/1E17 and D=1E17/1E18, respectively. According to FIG. 52A, at a Vg of 0 volts, the off current for the doping pattern of D=1E18/1E17 is approximately 50 times lower than that of the reversed doping pattern of D=1E17/1E18. Likewise, in FIG. 52 B, curves 5206 and 5208 correspond to doping patterns of D=1E18/1E17 and D=1E17/1E18, respectively. FIG. 52B shows that at a Vg of 1 volt, the Ids of both doping patterns are within a few percent of each other.

The junction-less transistor channel may be constructed with even, graded, or discrete layers of doping. The channel may be constructed with materials other than doped single crystal silicon, such as polysilicon, or other semi-conducting, insulating, or conducting material, and may be in combination with other layers of similar or different material. For example, the center of the channel may comprise a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Figure 56G:
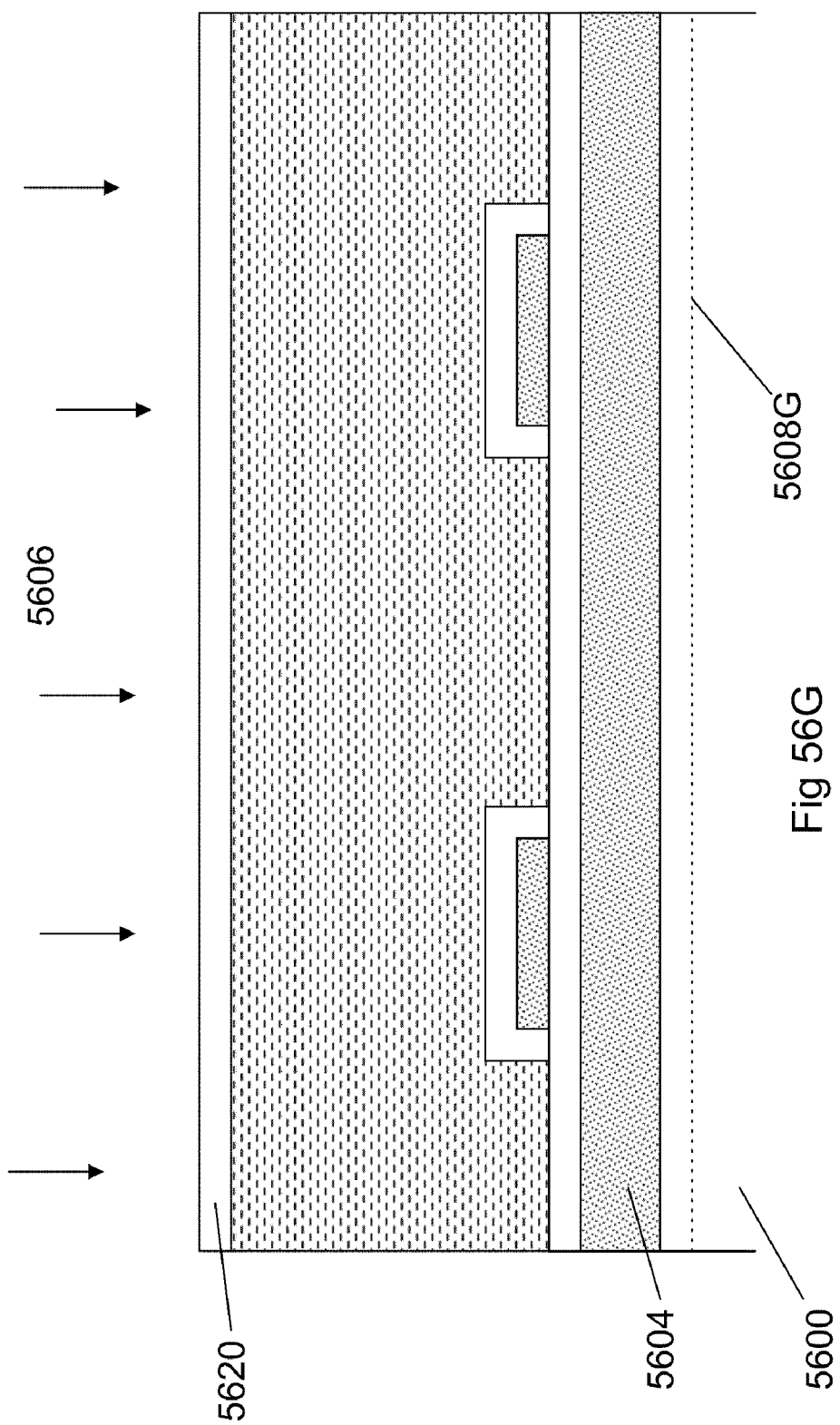
FIG. 56 A-M are drawing illustrations of the formation of a junction-less transistor.

To construct an n-type 4-sided gate junction-less transistor a silicon wafer is preprocessed to be used for layer transfer as illustrated in FIG. 56A-56G. These processes may be at temperatures above 400 degree Centigrade as the layer transfer to the processed substrate with metal interconnects has yet to be done. As illustrated in FIG. 56A, an N− wafer 5600A is processed to have a layer of N+ 5604A, by implant and activation, by an N+ epitaxial growth, or may be a deposited layer of heavily N+ doped polysilicon. A gate oxide 5602A may be grown before or after the implant, to a thickness approximately half of the desired final top-gate oxide thickness. FIG. 56B is a drawing illustration of the pre-processed wafer made ready for a layer transfer by an implant 5606 of an atomic species, such as H+, preparing the "cleaving plane" 5608 in the N− region 5600A of the substrate and plasma or other surface treatments to prepare the oxide surface for wafer oxide to oxide bonding. Another wafer is prepared as above without the H+ implant and the two are bonded as illustrated in FIG. 56C, to transfer the pre-processed single crystal N− silicon with N+ layer and half gate oxide, on top of a similarly pre-processed, but not cleave implanted, N− wafer 5600 with N+ layer 5604 and oxide 5602. The top wafer is cleaved and removed from the bottom wafer. This top wafer may now also be processed and reused for more layer transfers to form the resistor layer. The remaining top wafer N− and N+ layers are chemically and mechanically polished to a very thin N+ silicon layer 5610 as illustrated in FIG. 56D. This thin N+ doped silicon layer 5610 is on the order of 5 to 40 nm thick and will eventually form the resistor that will be gated on four sides. The two 'half' gate oxides 5602, 5602A may now be atomically bonded together to form the gate oxide 5612, which will eventually become the top gate oxide of the junction-less transistor in FIG. 56E. A high temperature anneal may be performed to remove any residual oxide or interface charges.

Alternatively, the wafer that becomes the bottom wafer in FIG. 56C may be constructed wherein the N+ layer 5604 may be formed with heavily doped polysilicon and the half gate oxide 5602 is deposited or grown prior to layer transfer. The bottom wafer N+ silicon or polysilicon layer 5604 will eventually become the top-gate of the junction-less transistor.

Figure 56H:
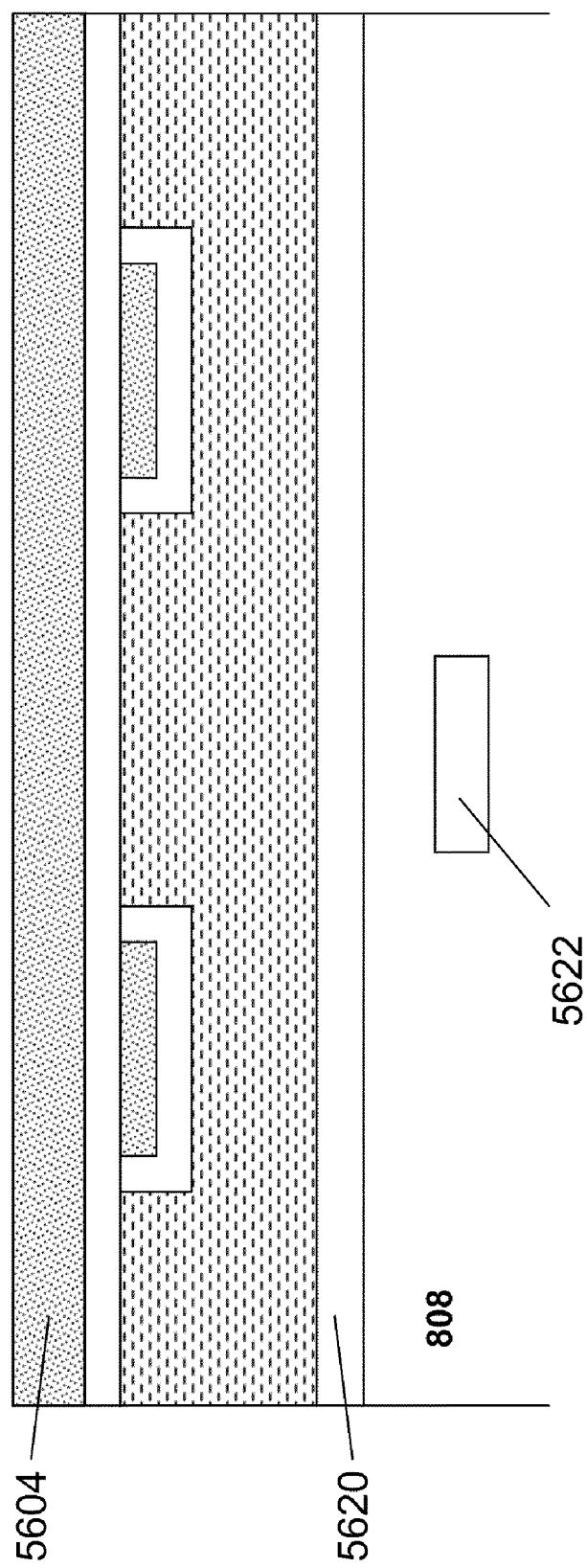

As illustrated in FIGS. 56E to 56G, the wafer is conventionally processed, at temperatures higher than 400° C. as necessary, in preparation to layer transfer the junction-less transistor structure to the processed 'house' wafer 808. A thin oxide may be grown to protect the thin resistor silicon 5610 layer top, and then parallel wires 5614 of repeated pitch of the thin resistor layer may be masked and etched as illustrated in FIG. 56E and then the photoresist is removed. The thin oxide, if present, may be striped in a dilute hydrofluoric acid (HF) solution and a conventional gate oxide 5616 is grown and polysilicon 5618, doped or undoped, is deposited as illustrated in FIG. 56F. The polysilicon is chemically and mechanically polished (CMP'ed) flat and a thin oxide 5620 is grown or deposited to facilitate a low temperature oxide to oxide wafer bonding in the next step. The polysilicon 5618 may be implanted for additional doping either before or after the CMP. This polysilicon will eventually become the bottom and side gates of the junction-less transistor. FIG. 56G is a drawing illustration of the wafer being made ready for a layer transfer by an implant 5606 of an atomic species, such as H+, preparing the "cleaving plane" 5608G in the N− region 5600 of the substrate and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 56H. The top donor wafer is cleaved and removed from the bottom acceptor wafer 808 and the top N− substrate is removed by CMP (chemical mechanical polish). A metal interconnect strip 5622 in the house 808 is also illustrated in FIG. 56H.

FIG. 56I is a top view of a wafer at the same step as FIG. 56H with two cross-sectional views I and II. The N+ layer 5604, which will eventually form the top gate of the resistor, and the top gate oxide 5612 will gate one side of the resistor line 5614, and the bottom and side gate oxide 5616 with the polysilicon bottom and side gates 5618 will gate the other three sides of the resistor 5614. The logic house wafer 808 has a top oxide layer 5624 that also encases the top metal interconnect strip 5622, extent shown as dotted lines in the top view.

Figure 56J:
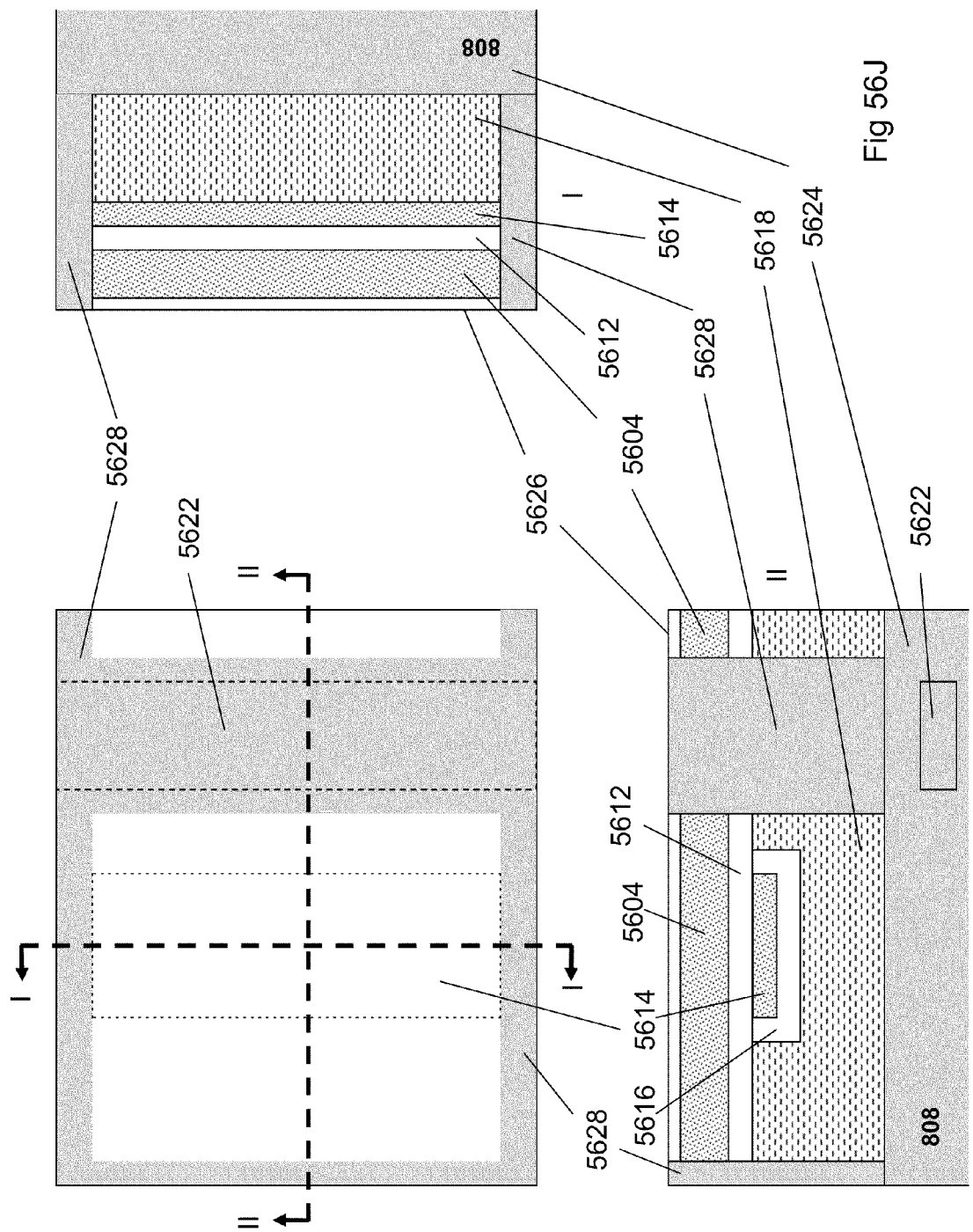

In FIG. 56J, a polish stop layer 5626 of a material such as oxide and silicon nitride is deposited on the top surface of the wafer, and isolation openings 5628 are masked and etched to the depth of the house 808 oxide 5624 to fully isolate transistors. The isolation openings 5628 are filled with a low temperature gap fill oxide, and chemically and mechanically polished (CMP'ed) flat. The top gate 5630 is masked and etched as illustrated in FIG. 56K, and then the etched openings 5629 are filled with a low temperature gap fill oxide deposition, and chemically and mechanically (CMP'ed) polished flat, then an additional oxide layer is deposited to enable interconnect metal isolation.

The contacts are masked and etched as illustrated in FIG. 56L. The gate contact 5632 is masked and etched, so that the contact etches through the top gate layer 5630, and during the metal opening mask and etch process the gate oxide is etched and the top 5630 and bottom 5618 gates are connected together. The contacts 5634 to the two terminals of the resistor layer 5614 are masked and etched. And then the thru vias 5636 to the house wafer 808 and metal interconnect strip 5622 are masked and etched.

As illustrated in FIG. 56M, the metal lines 5640 are mask defined and etched, filled with barrier metals and copper interconnect, and CMP'ed in a normal metal interconnect scheme, thereby completing the contact via 5632 simultaneous coupling to the top 5630 and bottom 5618 gates, the two terminals 5634 of the resistor layer 5614, and the thru via to the house wafer 808 metal interconnect strip 5622. This flow enables the formation of a fully crystallized 4-sided gate junction-less transistor that could be connected to the underlying multi-metal layer semiconductor device without exposing the underlying devices to high temperature.

Figure 57G:
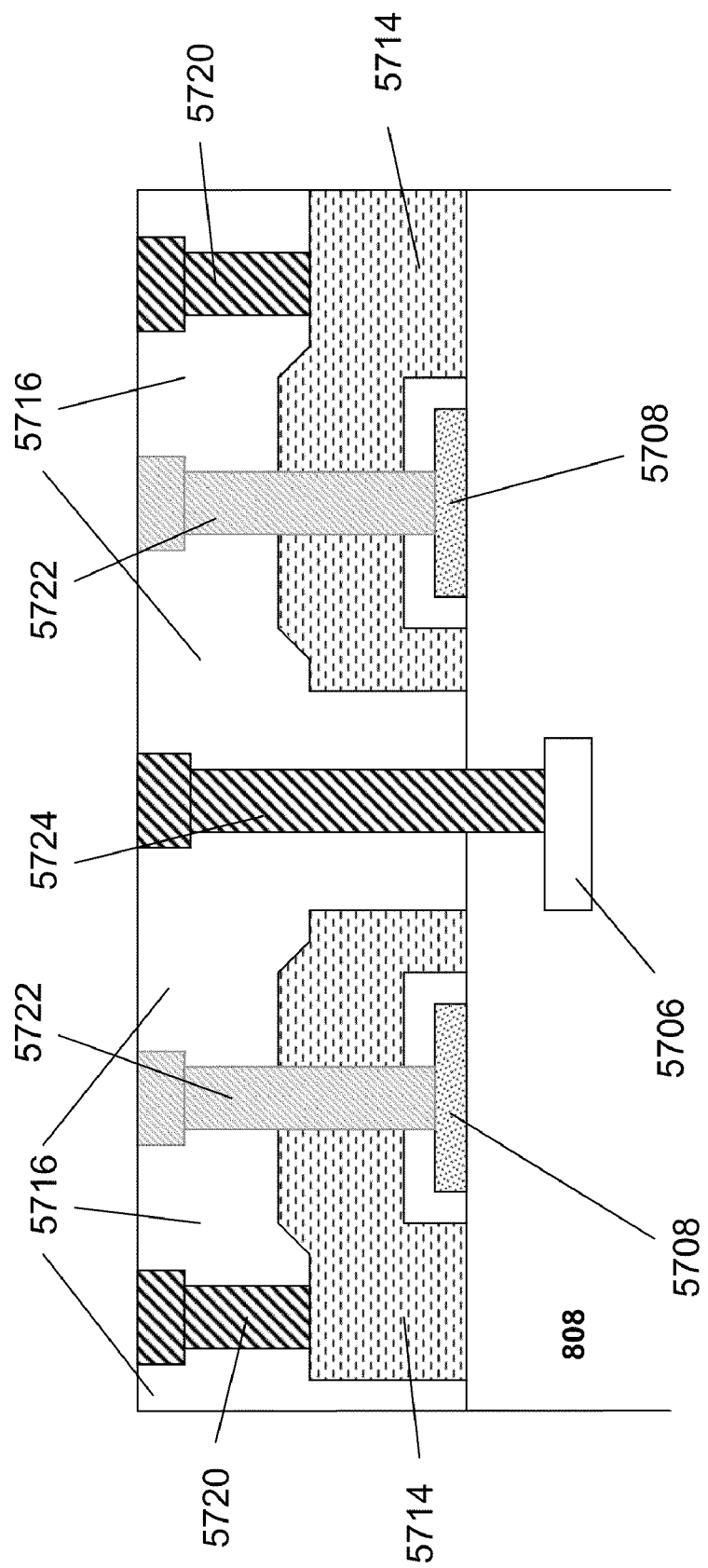

Alternatively, an n-type 3-sided gate junction-less transistor may be constructed as illustrated in FIGS. 57A to 57G. A silicon wafer is preprocessed to be used for layer transfer as illustrated in FIGS. 57A and 57B. These processes may be at temperatures above 400° C. as the layer transfer to the processed substrate with metal interconnects has yet to be done. As illustrated in FIG. 57A, an N− wafer 5700 is processed to have a layer of N+ 5704, by implant and activation, by an N+ epitaxial growth, or may be a deposited layer of heavily N+ doped polysilicon. A screen oxide 5702 may be grown before the implant to protect the silicon from implant contamination and to provide an oxide surface for later wafer to wafer bonding. FIG. 57B is a drawing illustration of the pre-processed wafer made ready for a layer transfer by an implant 5707 of an atomic species, such as H+, preparing the "cleaving plane" 5708 in the N− region 5700 of the donor substrate and plasma or other surface treatments to prepare the oxide surface for wafer oxide to oxide bonding. The acceptor wafer or house 808 with logic transistors and metal interconnects is prepared for a low temperature oxide to oxide wafer bond with surface treatments of the top oxide and the two are bonded as illustrated in FIG. 57C. The top donor wafer is cleaved and removed from the bottom acceptor wafer 808 and the top N− substrate is chemically and mechanically polished (CMP'ed) into the N+ layer 5704 to form the top gate layer of the junction-less transistor. A metal interconnect layer 5706 in the acceptor wafer or house 808 is also illustrated in FIG. 57C. For illustration simplicity and clarity, the donor wafer oxide layer 5702 will not be drawn independent of the acceptor wafer or house 808 oxides in FIGS. 57D through 57G.

A thin oxide may be grown to protect the thin transistor silicon 5704 layer top, and then the transistor channel elements 5708 are masked and etched as illustrated in FIG. 57D and then the photoresist is removed. The thin oxide is striped in a dilute HF solution and a low temperature based Gate Dielectric may be deposited and densified to serve as the junction-less transistor gate oxide 5710. Alternatively, a low temperature microwave plasma oxidation of the silicon surfaces may serve as the junction-less transistor gate oxide 5710 or an atomic layer deposition (ALD) technique may be utilized.

Then deposition of a low temperature gate material 5712, such as doped or undoped amorphous silicon as illustrated in FIG. 57E, may be performed. Alternatively, a high-k metal gate structure may be formed as described previously. The gate material 5712 is then masked and etched to define the top and side gates 5714 of the transistor channel elements 5708 in a crossing manner, generally orthogonally as shown in FIG. 57F.

Then the entire structure may be covered with a Low Temperature Oxide 5716, the oxide planarized with chemical mechanical polishing, and then contacts and metal interconnects may be masked and etched as illustrated FIG. 57G. The gate contact 5720 connects to the gate 5714. The two transistor channel terminal contacts 5722 independently connect to transistor element 5708 on each side of the gate 5714. The thru via 5724 connects the transistor layer metallization to the acceptor wafer or house 808 at interconnect 5706. This flow enables the formation of fully crystallized 3-sided gate junction-less transistor that may be formed and connected to the underlying multi-metal layer semiconductor device without exposing the underlying devices to a high temperature.

Figure 58A:
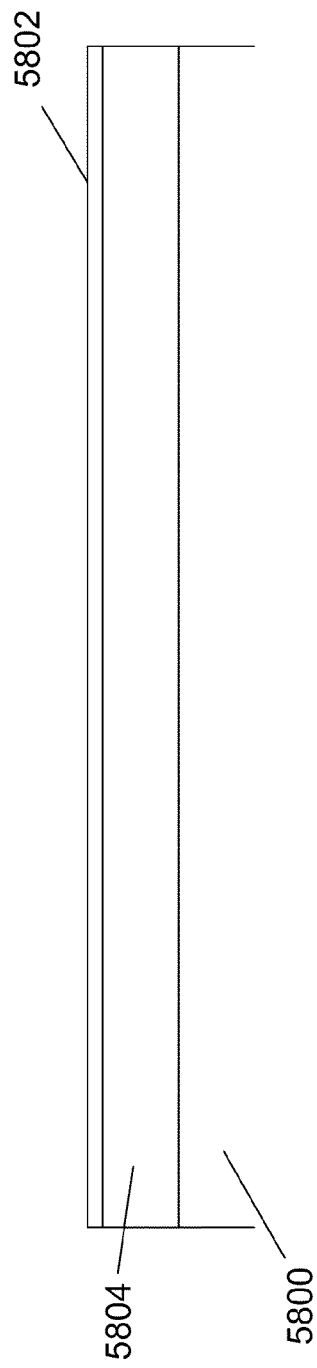
FIG. 58 A-G are drawing illustrations of the formation of a junction-less transistor.
Figure 58B:
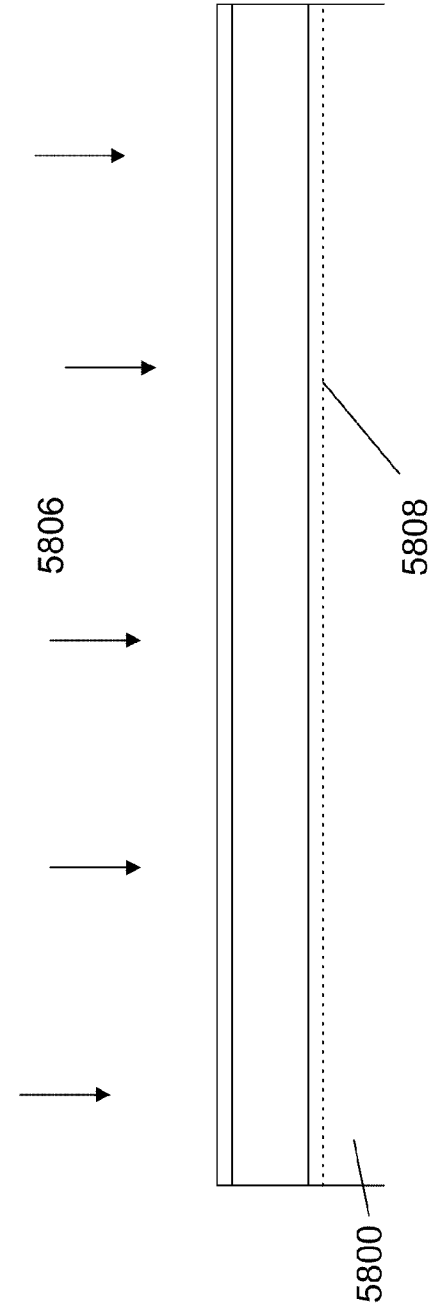

Alternatively, an n-type 3-sided gate thin-side-up junction-less transistor may be constructed as follows in FIGS. 58A to 58G. A thin-side-up junction-less transistor may have the thinnest dimension of the channel cross-section facing up (oriented horizontally), that face being parallel to the silicon base substrate surface. Previously and subsequently described junction-less transistors may have the thinnest dimension of the channel cross section oriented vertically and perpendicular to the silicon base substrate surface. A silicon wafer is preprocessed to be used for layer transfer, as illustrated in FIGS. 58A and 58B. These processes may be at temperatures above 400° C. as the layer transfer to the processed substrate with metal interconnects has yet to be done.

As illustrated in FIG. 58A, an N− wafer 5800 may be processed to have a layer of N+ 5804, by ion implantation and activation, by an N+ epitaxial growth, or may be a deposited layer of heavily N+ doped polysilicon. A screen oxide 5802 may be grown before the implant to protect the silicon from implant contamination and to provide an oxide surface for later wafer to wafer bonding. FIG. 58B is a drawing illustration of the pre-processed wafer made ready for a layer transfer by an implant 5806 of an atomic species, such as H+, preparing the "cleaving plane" 5808 in the N− region 5800 of the donor substrate, and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 58C. The top donor wafer is cleaved and removed from the bottom acceptor wafer 808 and the top N− substrate is chemically and mechanically polished (CMP'ed) into the N+ layer 5804 to form the junction-less transistor channel layer. FIG. 58C also illustrates the deposition of a CMP and plasma etch stop layer 5805, such as low temperature SiN on oxide, on top of the N+ layer 5804. A metal interconnect layer 5806 in the acceptor wafer or house 808 is also shown in FIG. 58C. For illustration simplicity and clarity, the donor wafer oxide layer 5802 will not be drawn independent of the acceptor wafer or house 808 oxide in FIGS. 58D through 58G.

The transistor channel elements 5808 are masked and etched as illustrated in FIG. 58D and then the photoresist is removed. As illustrated in FIG. 58E, a low temperature based Gate Dielectric may be deposited and densified to serve as the junction-less transistor gate oxide 5810. Alternatively, a low temperature microwave plasma oxidation of the silicon surfaces may serve as the junction-less transistor gate oxide 5810 or an atomic layer deposition (ALD) technique may be utilized. Then deposition of a low temperature gate material 5812, such as P+ doped amorphous silicon may be performed. Alternatively, a high-k metal gate structure may be formed as described previously. The gate material 5812 is then masked and etched to define the top and side gates 5814 of the transistor channel elements 5808. As illustrated in FIG. 58G, the entire structure may be covered with a Low Temperature Oxide 5816, the oxide planarized with chemical mechanical polishing (CMP), and then contacts and metal interconnects may be masked and etched. The gate contact 5820 connects to the resistor gate 5814 (i.e., in front of and behind the plane of the other elements shown in FIG. 58G). The two transistor channel terminal contacts 5822 per transistor independently connect to the transistor channel element 5808 on each side of the gate 5814. The thru via 5824 connects the transistor layer metallization to the acceptor wafer or house 808 interconnect 5806. This flow enables the formation of fully crystallized 3-gate sided thin-side-up junction-less transistor that may be formed and connected to the underlying multi-metal layer semiconductor device without exposing the underlying devices to a high temperature. Persons of ordinary skill in the art will appreciate that the illustrations in FIGS. 57A through 57G and FIGS. 58A through 58G are exemplary only and are not drawn to scale. Such skilled persons will further appreciate that many variations are possible like, for example, the process described in conjunction with FIGS. 57A through 57G could be used to make a junction-less transistor where the channel is taller than its width or that the process described in conjunction with FIGS. 58A through 58G could be used to make a junction-less transistor that is wider than its height. Many other modifications within the scope of the invention will suggest themselves to such skilled persons after reading this specification. Thus the invention is to be limited only by the appended claims.

Figure 61E:
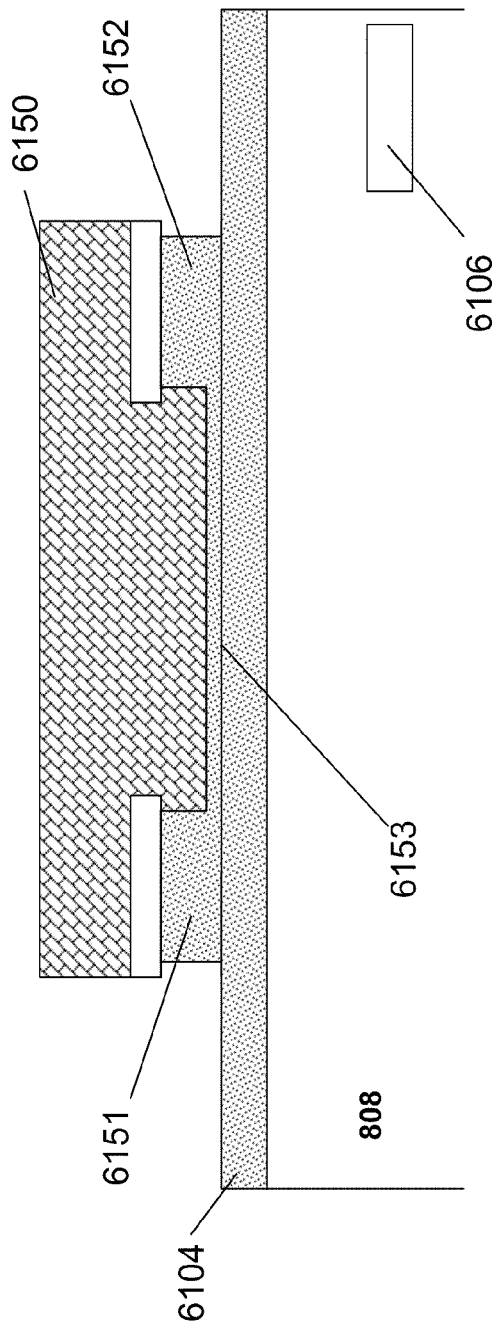
FIG. 61 A-I are drawing illustrations of a junction-less transistor.

Alternatively, a two layer n-type 3-sided gate junction-less transistor may be constructed as shown in FIGS. 61A to 61I. This structure may improve the source and drain contact resistance by providing for a higher doping at the contact surface than the channel. Additionally, this structure may be utilized to create a two layer channel wherein the layer closest to the gate is more highly doped. A silicon wafer may be preprocessed for layer transfer as illustrated in FIGS. 61A and 61B. These preprocessings may be performed at temperatures above 400° C. as the layer transfer to the processed substrate with metal interconnects has yet to be done. As illustrated in FIG. 61A, an N− wafer 6100 is processed to have two layers of N+, the top layer 6104 with a lower doping concentration than the bottom N+ layer 6103, by an implant and activation, or an N+ epitaxial growth, or combinations thereof. One or more depositions of in-situ doped amorphous silicon may also be utilized to create the vertical dopant layers or gradients. A screen oxide 6102 may be grown before the implant to protect the silicon from implant contamination and to provide an oxide surface for later wafer-to-wafer bonding. FIG. 61B is a drawing illustration of the pre-processed wafer for a layer transfer by an implant 6107 of an atomic species, such as H+, preparing the "cleaving plane" 6109 in the N− region 6100 of the donor substrate and plasma or other surface treatments to prepare the oxide surface for wafer oxide to oxide bonding.

The acceptor wafer or house 808 with logic transistors and metal interconnects is prepared for a low temperature oxide-to-oxide wafer bond with surface treatments of the top oxide and the two are bonded as illustrated in FIG. 61C. The top donor wafer is cleaved and removed from the bottom acceptor wafer 808 and the top N− substrate is chemically and mechanically polished (CMP'ed) into the more highly doped N+ layer 6103. An etch hard mask layer of low temperature silicon nitride 6105 may be deposited on the surface of 6103, including a thin oxide stress buffer layer. A metal interconnect metal pad or strip 6106 in the acceptor wafer or house 808 is also illustrated in FIG. 61C. For illustration simplicity and clarity, the donor wafer oxide layer 6102 will not be drawn independent of the acceptor wafer or house 808 oxide in subsequent FIGS. 61D through 61I.

The source and drain connection areas may be masked, the silicon nitride 6105 layer may be etched, and the photoresist may be stripped. A partial or full silicon plasma etch may be performed, or a low temperature oxidation and then Hydrofluoric Acid etch of the oxide may be performed, to thin layer 6103. FIG. 61D illustrates a two-layer channel, as described and simulated above in conjunction with FIGS. 52A and 52B, formed by thinning layer 6103 with the above etch process to almost complete removal, leaving some of layer 6103 remaining on top of 6104 and the full thickness of 6103 still remaining underneath 6105. A complete removal of the top channel layer 6103 may also be performed. This etch process may also be utilized to adjust for wafer-to-wafer CMP variations of the remaining donor wafer layers, such as 6100 and 6103, after the layer transfer cleave to provide less variability in the channel thickness.

FIG. 61E illustrates the photoresist 6150 definition of the source 6151 (one full thickness 6103 region), drain 6152 (the other full thickness 6103 region), and channel 5153 (region of partial 6130 thickness and full 6104 thickness) of the junction-less transistor.

Figure 61F:
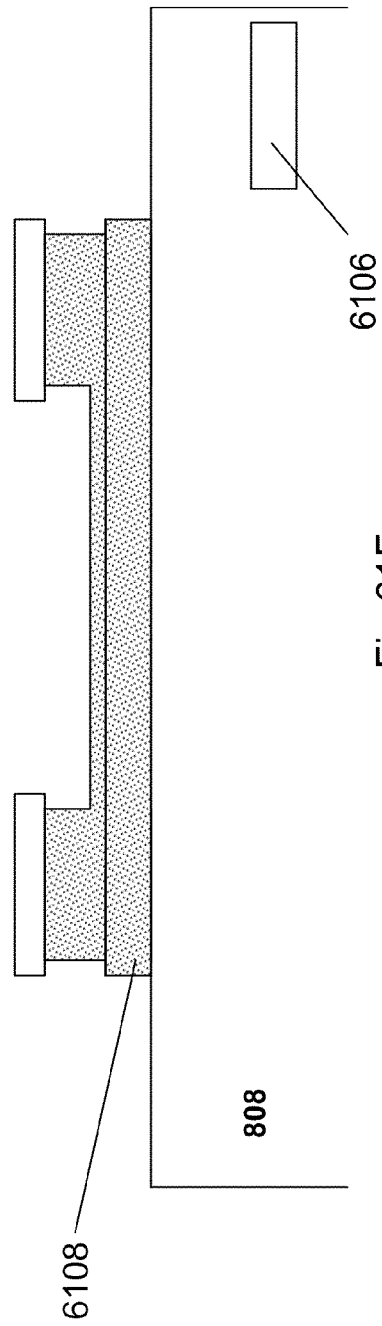

The exposed silicon remaining on layer 6104, as illustrated in FIG. 61F, may be plasma etched and the photoresist 6150 may be removed. This process may provide for an isolation between devices and may define the channel width of the junction-less transistor channel 6108.

A low temperature based Gate Dielectric may be deposited and densified to serve as the junction-less transistor gate oxide 6110 as illustrated in FIG. 61G. Alternatively, a low temperature microwave plasma oxidation of the silicon surfaces may provide the junction-less transistor gate oxide 6110 or an atomic layer deposition (ALD) technique may be utilized. Then deposition of a low temperature gate material 6112, such as, for example, doped amorphous silicon, may be performed, as illustrated in FIG. 61G. Alternatively, a high-k metal gate structure may be formed as described previously.

The gate material 6112 may then be masked and etched to define the top and side gates 6114 of the transistor channel elements 6108 in a crossing manner, generally orthogonally, as illustrated in FIG. 61H. Then the entire structure may be covered with a Low Temperature Oxide 6116, the oxide may be planarized by chemical mechanical polishing.

Then contacts and metal interconnects may be masked and etched as illustrated FIG. 61I. The gate contact 6120 may be connected to the gate 6114. The two transistor source/drain terminal contacts 6122 may be independently connected to the heavier doped layer 6103 and then to transistor channel element 6108 on each side of the gate 6114. The thru via 6124 may connect the junction-less transistor layer metallization to the acceptor wafer or house 808 at interconnect pad or strip 6106. The thru via 6124 may be independently masked and etched to provide process margin with respect to the other contacts 6122 and 6120. This flow may enable the formation of fully crystallized two layer 3-sided gate junction-less transistor that may be formed and connected to the underlying multi-metal layer semiconductor device without exposing the underlying devices to a high temperature.

Figure 65A:
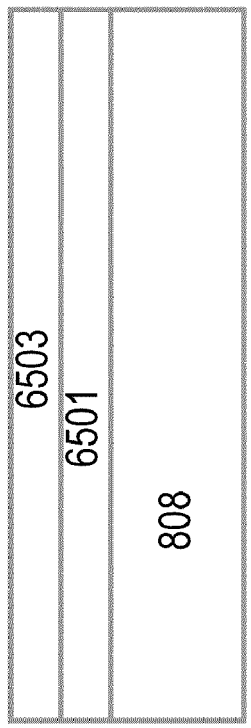
FIG. 65A-C are drawing illustrations of the formation of a junction-less transistor.
Figure 65B:
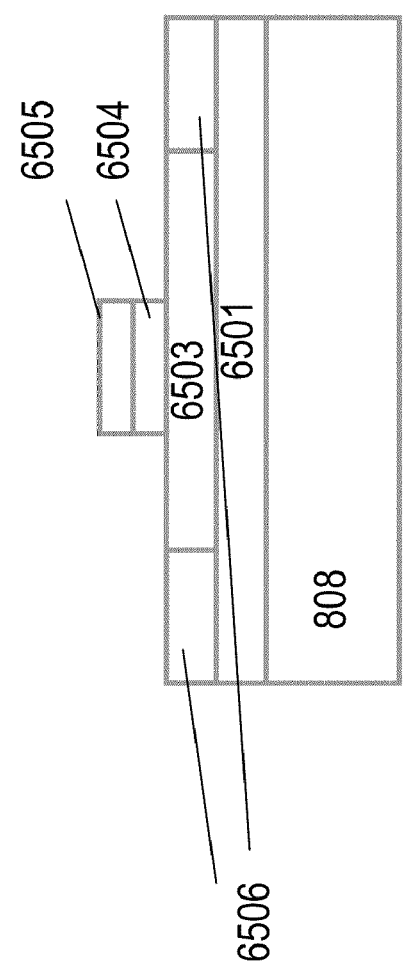
Figure 65C:
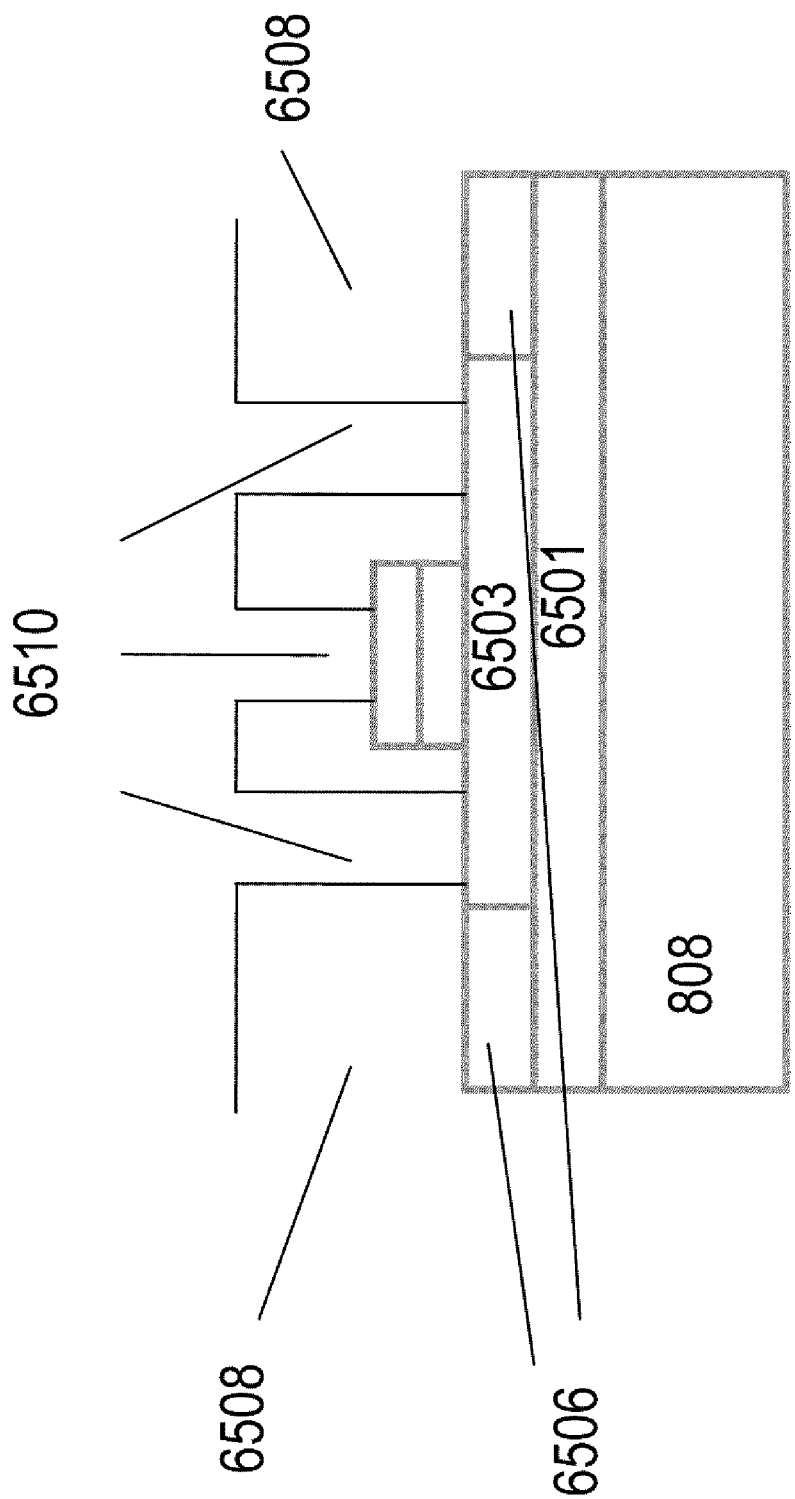

Alternatively, a 1-sided gate junction-less transistor can be constructed as shown in FIG. 65A-C. A thin layer of heavily doped silicon 6503 may be transferred on top of the acceptor wafer or house 808 using layer transfer techniques described previously wherein the donor wafer oxide layer 6501 may be utilized to form an oxide to oxide bond with the top of the acceptor wafer or house 808. The transferred doped layer 6503 may be N+ doped for an n-channel junction-less transistor or may be P+ doped for a p-channel junction-less transistor. As illustrated in FIG. 65B, oxide isolation 6506 may be formed by masking and etching the N+ layer 6503 and subsequent deposition of a low temperature oxide which may be chemical mechanically polished to the channel silicon 6503 thickness. The channel thickness 6503 may also be adjusted at this step. A low temperature gate dielectric 6504 and gate metal 6505 are deposited or grown as previously described and then photo-lithographically defined and etched. As shown in FIG. 65C, a low temperature oxide 6508 may then be deposited, which also may provide a mechanical stress on the channel for improved carrier mobility. Contact openings 6510 may then be opened to various terminals of the junction-less transistor. Persons of ordinary skill in the art will appreciate that the processing methods presented above are illustrative only and that other embodiments of the inventive principles described herein are possible and thus the scope if the invention is only limited by the appended claims.

A family of vertical devices can also be constructed as top transistors that are precisely aligned to the underlying pre-fabricated acceptor wafer or house 808. These vertical devices have implanted and annealed single crystal silicon layers in the transistor by utilizing the "SmartCut" layer transfer process that does not exceed the temperature limit of the underlying pre-fabricated structure. For example, vertical style MOSFET transistors, floating gate flash transistors, floating body DRAM, thyristor, bipolar, and Schottky gated JFET transistors, as well as memory devices, can be constructed. Junction-less transistors may also be constructed in a similar manner. The gates of the vertical transistors or resistors may be controlled by memory or logic elements such as MOSFET, DRAM, SRAM, floating flash, anti-fuse, floating body devices, etc. that are in layers above or below the vertical device, or in the same layer. As an example, a vertical gate-all-around n-MOSFET transistor construction is described below.

The donor wafer preprocessed for the general layer transfer process is illustrated in FIG. 39. A P− wafer 3902 is processed to have a "buried" layer of N+ 3904, by either implant and activation, or by shallow N+ implant and diffusion. This process may be followed by depositing an P− epi growth (epitaxial growth) layer 3906 and finally an additional N+ layer 3908 may be processed on top. This N+ layer 2510 could again be processed, by implant and activation, or by N+ epi growth.

FIG. 39B is a drawing illustration of the pre-processed wafer made ready for a conductive bond layer transfer by a deposition of a conductive barrier layer 3910 such as TiN or TaN on top of N+ layer 3908 and an implant of an atomic species, such as H+, preparing the SmartCut cleaving plane 3912 in the lower part of the N+ 3904 region.

As shown in FIG. 39C, the acceptor wafer may be prepared with an oxide pre-clean and deposition of a conductive barrier layer 3916 and Al—Ge layers 3914. Al—Ge eutectic layer 3914 may form an Al—Ge eutectic bond with the conductive barrier 3910 during a thermo-compressive wafer to wafer bonding process as part of the layer-transfer-flow, thereby transferring the pre-processed single crystal silicon with N+ and P− layers. Thus, a conductive path is made from the house 808 top metal layers 3920 to the now bottom N+ layer 3908 of the transferred donor wafer. Alternatively, the Al—Ge eutectic layer 3914 may be made with copper and a copper-to-copper or copper-to-barrier layer thermo-compressive bond is formed Likewise, a conductive path from donor wafer to house 808 may be made by house top metal lines 3920 of copper with barrier metal thermo-compressively bonded with the copper layer 3910 directly, where a majority of the bonded surface is donor copper to house oxide bonds and the remainder of the surface is donor copper to house 808 copper and barrier metal bonds.

Figure 40A:
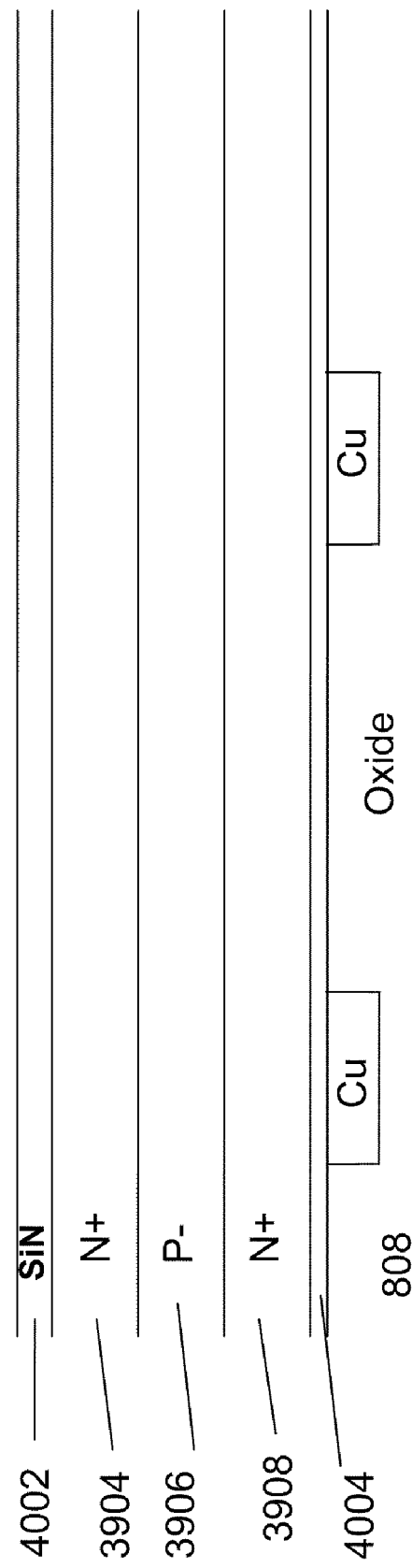

FIGS. 40A-40I are drawing illustrations of the formation of a vertical gate-all-around n-MOSFET top transistor. FIG. 40A illustrates the first step. After the conductive path layer transfer described above, a deposition of a CMP and plasma etch stop layer 4002, such as low temperature SiN, may be deposited on top of the top N+ layer 3904. For simplicity, the conductive barrier clad Al—Ge eutectic layers 3910, 3914, and 3916 are represented by conductive layer 4004 in FIG. 40A.

FIGS. 40B-H are drawn as orthographic projections (i.e., as top views with horizontal and vertical cross sections) to illustrate some process and topographical details. The transistor illustrated is square shaped when viewed from the top, but may be constructed in various rectangular shapes to provide different transistor widths and gate control effects. In addition, the square shaped transistor illustrated may be intentionally formed as a circle when viewed from the top and hence form a vertical cylinder shape, or it may become that shape during processing subsequent to forming the vertical towers. Turning now to FIG. 40B, vertical transistor towers 4006 are mask defined and then plasma/Reactive-ion Etching (RIE) etched thru the Chemical Mechanical Polishing (CMP) stop layer 4004, N+ layers 3904 and 3908, the P− layer 3906, the conductive metal bonding layer 4004, and into the house 808 oxide, and then the photoresist is removed as illustrated in FIG. 40B. This definition and etch now creates N-P-N stacks where the bottom N+ layer 3908 is electrically coupled to the house metal layer 3920 through conductive layer 4004.

Figure 40C:
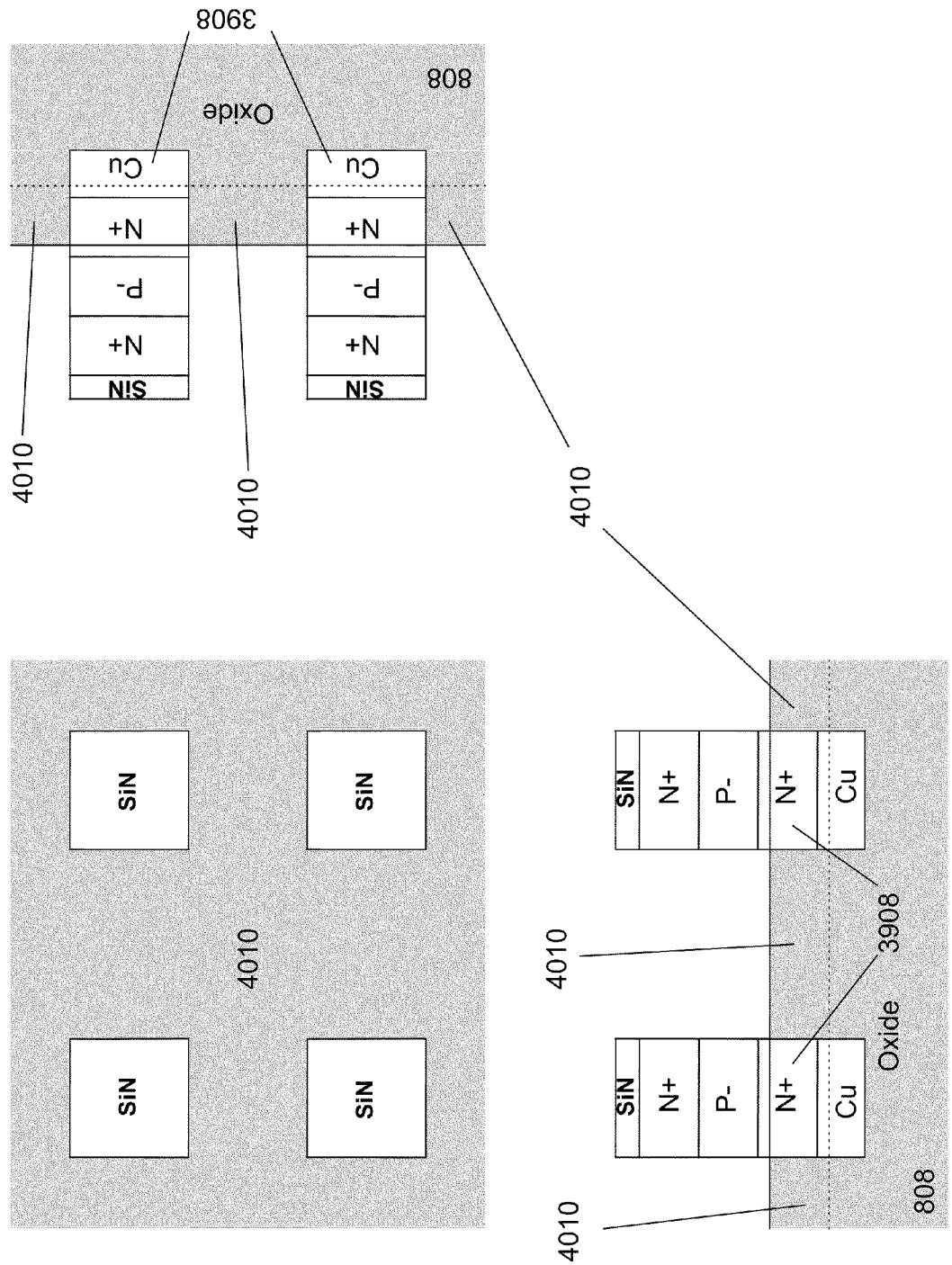

The area between the towers is partially filled with oxide 4010 via a Spin On Glass (SPG) spin, cure, and etch back sequence as illustrated in FIG. 40C. Alternatively, a low temperature CVD gap fill oxide may be deposited, then Chemically Mechanically Polished (CMP'ed) flat, and then selectively etched back to achieve the same oxide shape 4010 as shown in FIG. 40C. The level of the oxide 4010 is constructed such that a small amount of the bottom N+ tower layer 3908 is not covered by oxide. Alternatively, this step may also be accomplished by a conformal low temperature oxide CVD deposition and etch back sequence, creating a spacer profile coverage of the bottom N+ tower layer 3908.

Next, the sidewall gate oxide 4014 is formed by a low temperature microwave oxidation technique, such as the TEL SPA (Tokyo Electron Limited Slot Plane Antenna) oxygen radical plasma, stripped by wet chemicals such as dilute HF, and grown again 4014 as illustrated in FIG. 40D.

The gate electrode is then deposited, such as a conformal doped amorphous silicon layer 4018, as illustrated in FIG. 40E. The gate mask photoresist 4020 may then be defined.

As illustrated in FIG. 40F, the gate layer 4018 is etched such that a spacer shaped gate electrode 4022 remains in regions not covered by the photoresist 4020. The full thickness of gate layer 4018 remains under area covered by the resist 4020 and the gate layer 4020 is also fully cleared from between the towers. Finally the photoresist 4020 is stripped. This approach minimizes the gate to drain overlap and eventually provides a clear contact connection to the gate electrode.

Figure 40G:
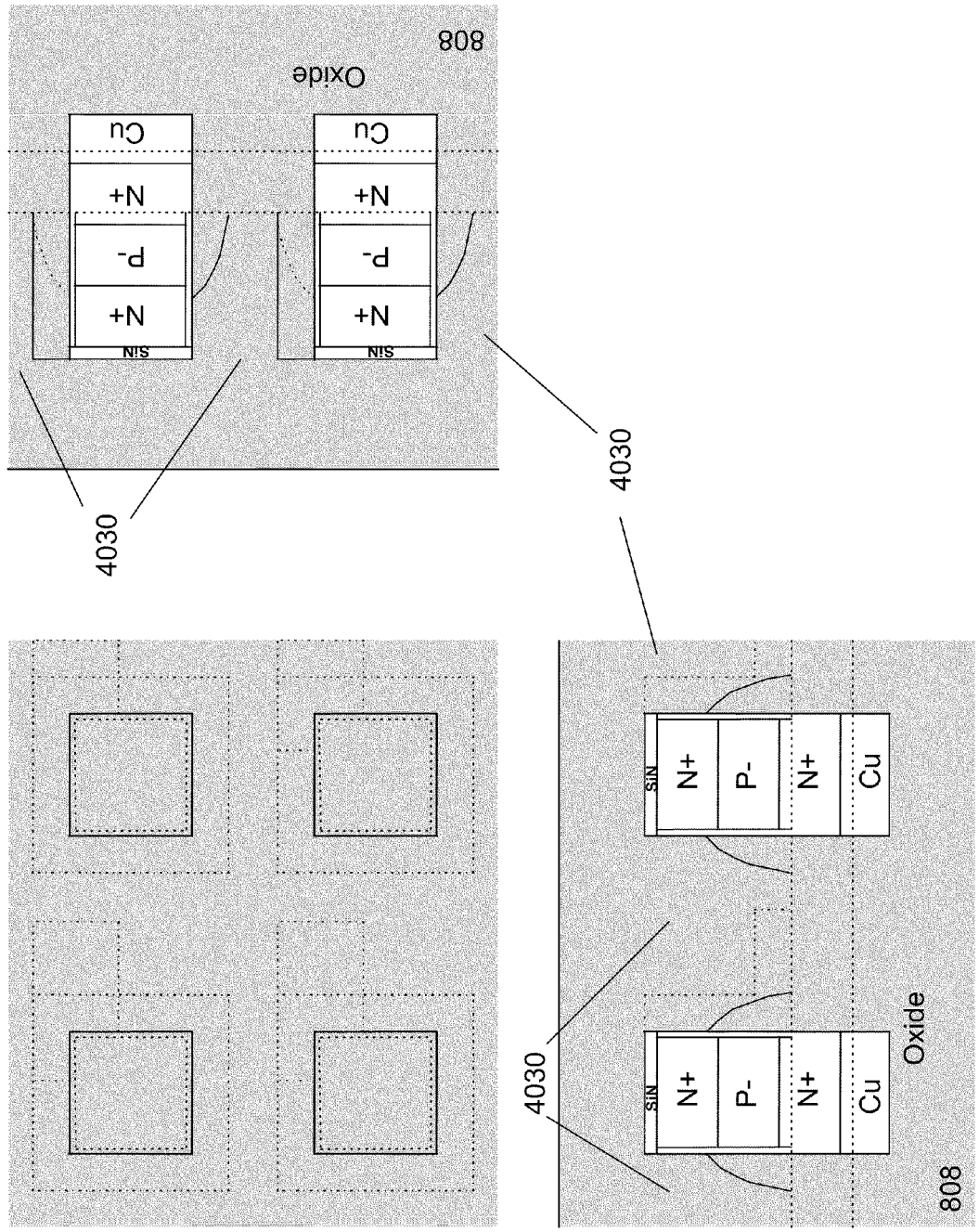

As illustrated in FIG. 40G, the spaces between the towers are filled and the towers are covered with oxide 4030 by low temperature gap fill deposition and CMP.

Figure 40H:
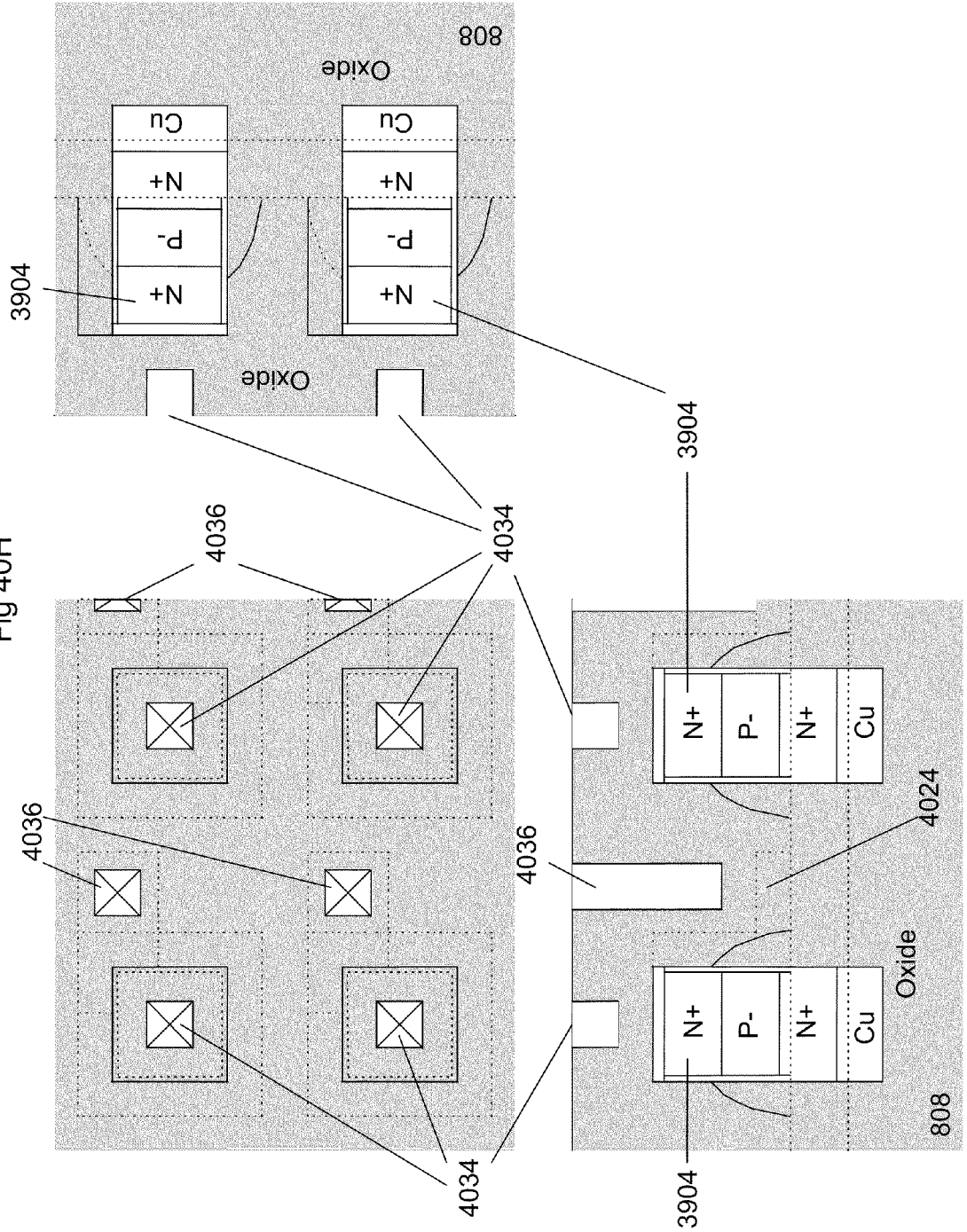

In FIG. 40H, the via contacts 4034 to the tower N+ layer 3904 are masked and etched, and then the via contacts 4036 to the gate electrode poly 4024 are masked and etch.

Figure 40I:
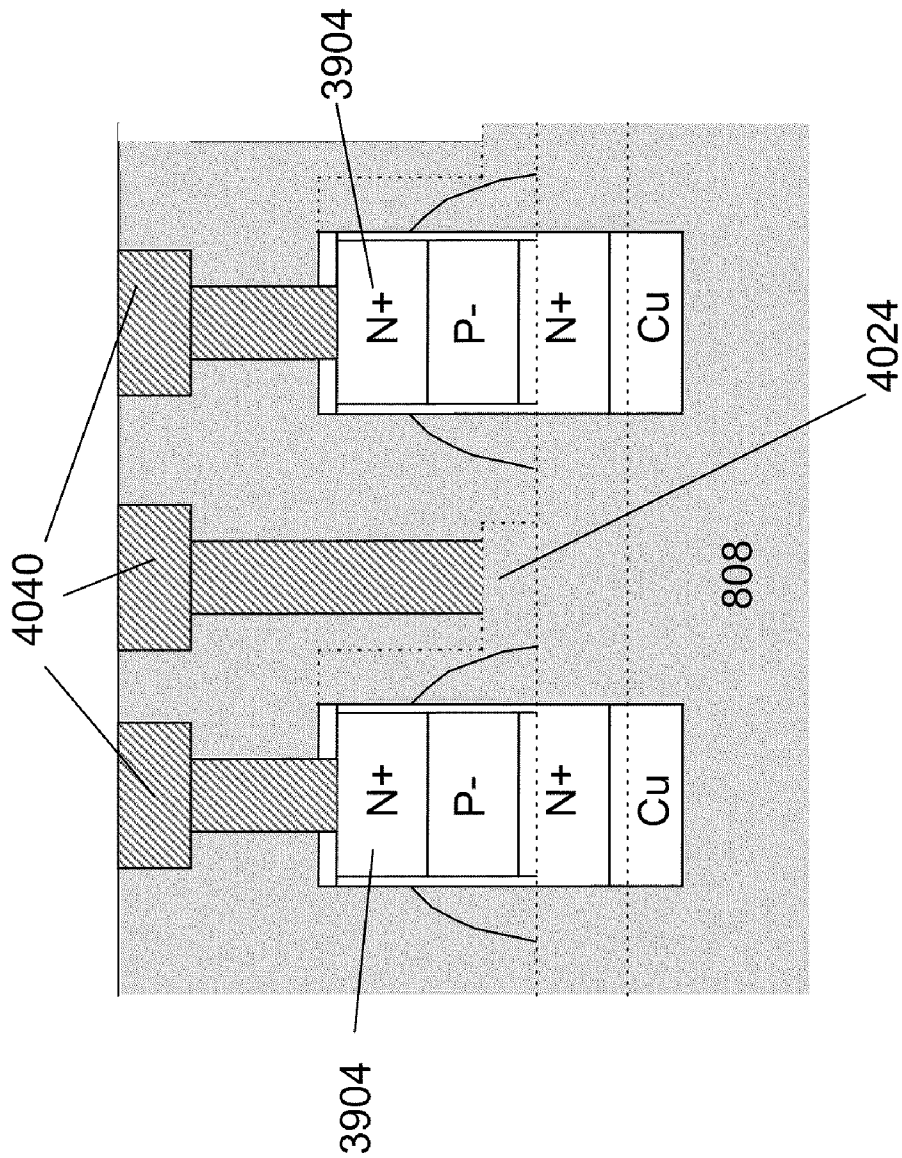

The metal lines 4040 are mask defined and etched, filled with barrier metals and copper interconnect, and CMP'd in a normal interconnect scheme, thereby completing the contact via connections to the tower N+ 3904 and the gate electrode 4024 as illustrated in FIG. 40I.

This flow enables the formation of fully crystallized silicon top MOS transistors that are connected to the underlying multi-metal layer semiconductor device without exposing the underlying devices and interconnect metals to high temperature. These transistors could be used as programming transistors of the Antifuse on layer 807, or be coupled to metal layers in wafer or layer 808 to form monolithic 3D ICs, as a pass transistor for logic on wafer or layer 808, or FPGA use, or for additional uses in a 3D semiconductor device.

Additionally, a vertical gate all around junction-less transistor may be constructed as illustrated in FIGS. 54 and 55. The donor wafer preprocessed for the general layer transfer process is illustrated in FIG. 54. FIG. 54A is a drawing illustration of a pre-processed wafer used for a layer transfer. An N− wafer 5402 is processed to have a layer of N+ 5404, by ion implantation and activation, or an N+ epitaxial growth. FIG. 54B is a drawing illustration of the pre-processed wafer made ready for a conductive bond layer transfer by a deposition of a conductive barrier layer 5410 such as TiN or TaN and by an implant of an atomic species, such as H+, preparing the SmartCut cleaving plane 5412 in the lower part of the N+ 5404 region.

The acceptor wafer or house 808 is also prepared with an oxide pre-clean and deposition of a conductive barrier layer 5416 and Al and Ge layers to form a Ge—Al eutectic bond 5414 during a thermo-compressive wafer to wafer bonding as part of the layer-transfer-flow, thereby transferring the pre-processed single crystal silicon of FIG. 54B with an N+ layer 5404, on top of acceptor wafer or house 808, as illustrated in FIG. 54C. The N+ layer 5404 may be polished to remove damage from the cleaving procedure. Thus, a conductive path is made from the acceptor wafer or house 808 top metal layers 5420 to the N+ layer 5404 of the transferred donor wafer. Alternatively, the Al—Ge eutectic layer 5414 may be made with copper and a copper-to-copper or copper-to-barrier layer thermo-compressive bond is formed. Likewise, a conductive path from donor wafer to acceptor wafer or house 808 may be made by house top metal lines 5420 of copper with associated barrier metal thermo-compressively bonded with the copper layer 5410 directly, where a majority of the bonded surface is donor copper to house oxide bonds and the remainder of the surface is donor copper to acceptor wafer or house 808 copper and barrier metal bonds.

Figure 55E:
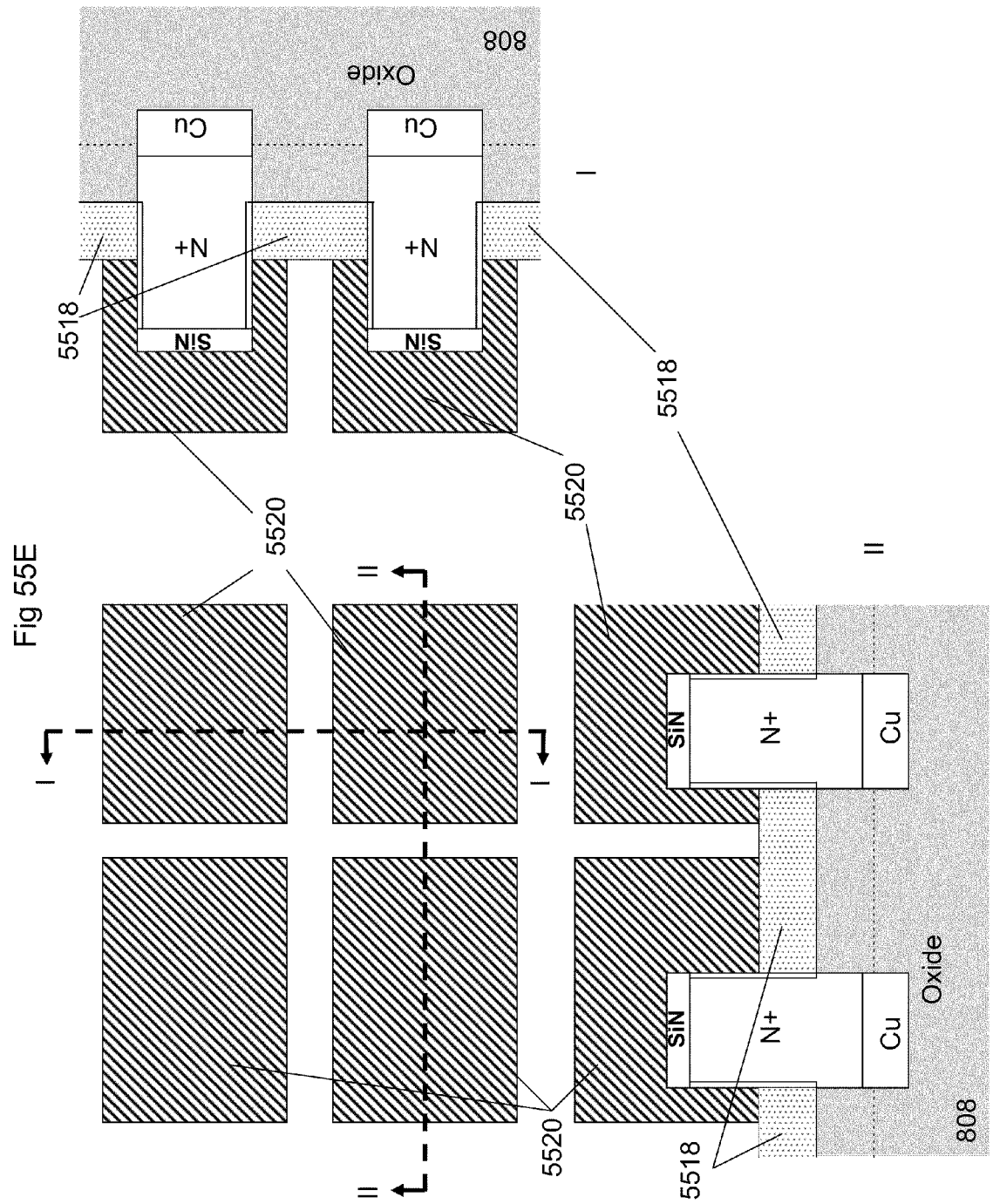
FIG. 55 A-I are drawing illustrations of the formation of a junction-less transistor.

FIGS. 55A-55I are drawing illustrations of the formation of a vertical gate-all-around junction-less transistor utilizing the above preprocessed acceptor wafer or house 808 of FIG. 54C. FIG. 55A illustrates the deposition of a CMP and plasma etch stop layer 5502, such as low temperature SiN, on top of the N+ layer 5504. For simplicity, the barrier clad Al—Ge eutectic layers 5410, 5414, and 5416 of FIG. 54C are represented by one illustrated layer 5500.

Similarly, FIGS. 55B-H are drawn as an orthographic projection to illustrate some process and topographical details. The junction-less transistor illustrated is square shaped when viewed from the top, but may be constructed in various rectangular shapes to provide different transistor channel thicknesses, widths, and gate control effects. In addition, the square shaped transistor illustrated may be intentionally formed as a circle when viewed from the top and hence form a vertical cylinder shape, or it may become that shape during processing subsequent to forming the vertical towers. The vertical transistor towers 5506 are mask defined and then plasma/Reactive-ion Etching (RIE) etched thru the Chemical Mechanical Polishing (CMP) stop layer 5502, N+ transistor channel layer 5504, the metal bonding layer 5500, and down to the acceptor wafer or house 808 oxide, and then the photoresist is removed, as illustrated in FIG. 55B. This definition and etch now creates N+ transistor channel stacks that are electrically isolated from each other yet the bottom of N+ layer 5404 is electrically connected to the house metal layer 5420.

The area between the towers is then partially filled with oxide 5510 via a Spin On Glass (SPG) spin, low temperature cure, and etch back sequence as illustrated in FIG. 55C. Alternatively, a low temperature CVD gap fill oxide may be deposited, then Chemically Mechanically Polished (CMP'ed) flat, and then selectively etched back to achieve the same shaped 5510 as shown in FIG. 55C. Alternatively, this step may also be accomplished by a conformal low temperature oxide CVD deposition and etch back sequence, creating a spacer profile coverage of the N+ resistor tower layer 5504.

Next, the sidewall gate oxide 5514 is formed by a low temperature microwave oxidation technique, such as the TEL SPA (Tokyo Electron Limited Slot Plane Antenna) oxygen radical plasma, stripped by wet chemicals such as dilute HF, and grown again 5514 as illustrated in FIG. 55D.

The gate electrode is then deposited, such as a P+ doped amorphous silicon layer 5518, then Chemically Mechanically Polished (CMP'ed) flat, and then selectively etched back to achieve the shape 5518 as shown in FIG. 55E, and then the gate mask photoresist 5520 may be defined as illustrated in FIG. 55E.

The gate layer 5518 is etched such that the gate layer is fully cleared from between the towers and then the photoresist is stripped as illustrated in FIG. 55F.

The spaces between the towers are filled and the towers are covered with oxide 5530 by low temperature gap fill deposition, CMP, then another oxide deposition as illustrated in FIG. 55G.

In FIG. 55H, the contacts 5534 to the transistor channel tower N+ 5504 are masked and etched, and then the contacts 5518 to the gate electrode 5518 are masked and etch. The metal lines 5540 are mask defined and etched, filled with barrier metals and copper interconnect, and CMP'ed in a normal Dual Damascene interconnect scheme, thereby completing the contact via connections to the transistor channel tower N+ 5504 and the gate electrode 5518 as illustrated in FIG. 55I.

This flow enables the formation of fully crystallized silicon top vertical junction-less transistors that are connected to the underlying multi-metal layer semiconductor device without exposing the underlying devices and interconnect metals to high temperature. These junction-less transistors may be used as programming transistors of the Antifuse on acceptor wafer or house 808 or as a pass transistor for logic or FPGA use, or for additional uses in a 3D semiconductor device.

Recessed Channel Array Transistors (RCATs) may be another transistor family that can utilize layer transfer and etch definition to construct a low-temperature monolithic 3D Integrated Circuit. Two types of RCAT device structures are shown in FIG. 66. These were described by J. Kim, et al. at the Symposium on VLSI Technology, in 2003 and 2005. Note that this prior art from Kim, et al. are for a single layer of transistors and did not use any layer transfer techniques. Their work also used high-temperature processes such as source-drain activation anneals, wherein the temperatures were above 400° C. In contrast, some embodiments of the current invention employ this transistor family in a two-dimensional plane. All transistors (junction-less, recessed channel or depletion, etc.) with the source and the drain in the same two dimensional planes may be considered planar transistors.

Figure 67A:
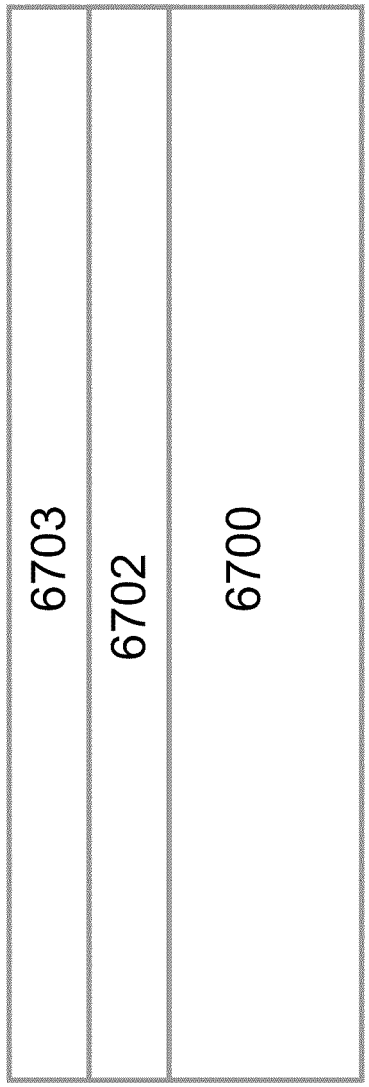

A layer stacking approach to construct 3D integrated circuits with standard RCATs is illustrated in FIG. 67A-F. For an n-channel MOSFET, a p− silicon wafer 6700 may be the starting point. A buried layer of n+ Si 6702 may then be implanted as shown in FIG. 67A, resulting in a layer of p-6703 that is at the surface of the donor wafer. An alternative is to implant a shallow layer of n+ Si and then epitaxially deposit a layer of p− Si 6703. To activate dopants in the n+ layer 6702, the wafer may be annealed, with standard annealing procedures such as thermal, or spike, or laser anneal.

Figure 67B:
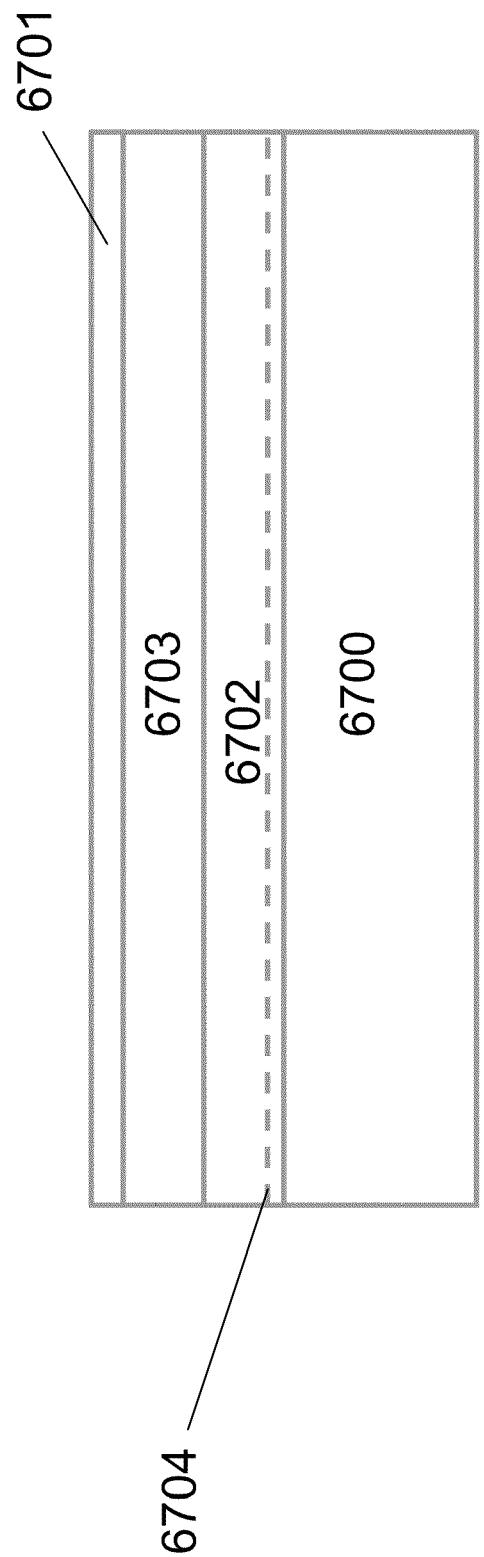

An oxide layer 6701 may be grown or deposited, as illustrated in FIG. 67B. Hydrogen is implanted into the wafer 6704 to enable "smart cut" process, as indicated in FIG. 67B.

A layer transfer process may be conducted to attach the donor wafer in FIG. 67B to a pre-processed circuits acceptor wafer 808 as illustrated in FIG. 67C. The implanted hydrogen layer 6704 may now be utilized for cleaving away the remainder of the wafer 6700.

After the cut, chemical mechanical polishing (CMP) may be performed. Oxide isolation regions 6705 may be formed and an etch process may be conducted to form the recessed channel 6706 as illustrated in FIG. 67D. This etch process may be further customized so that corners are rounded to avoid high field issues.

Figure 67E:
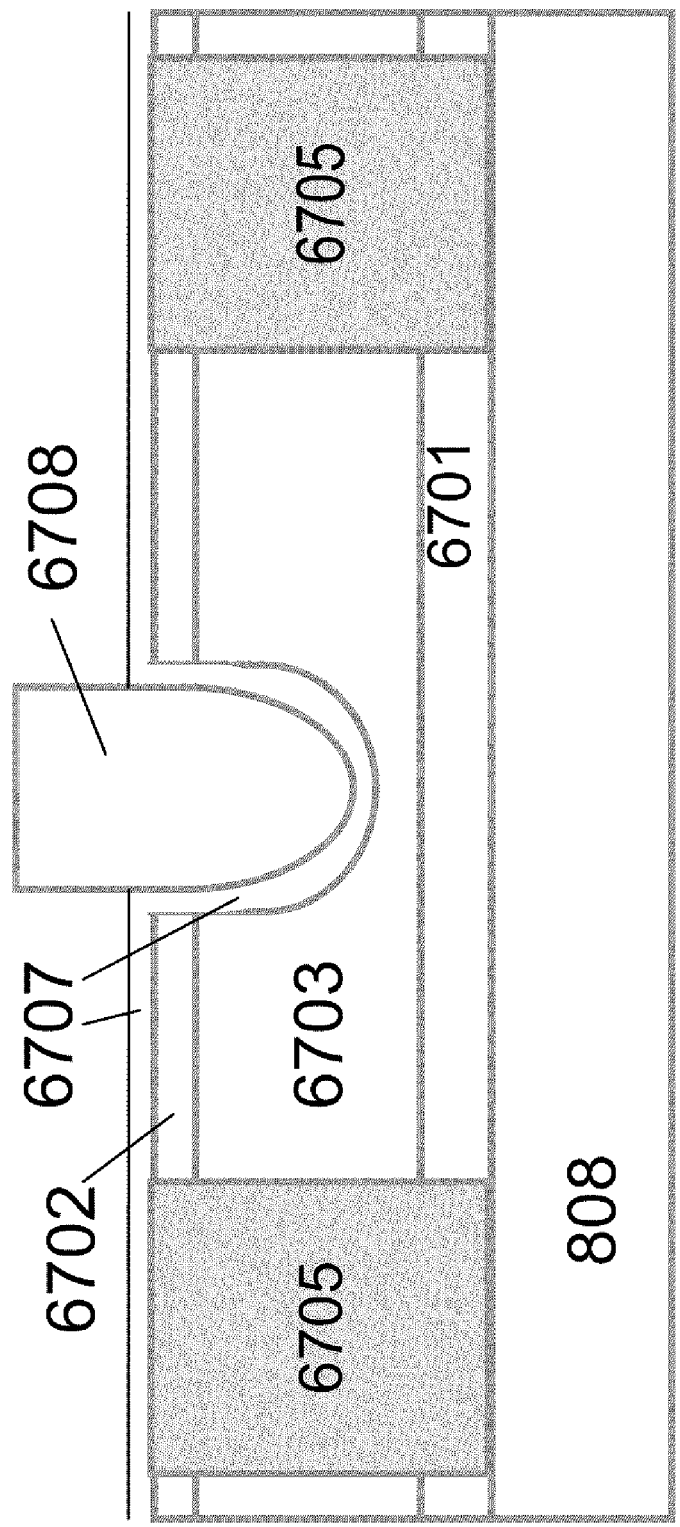

A gate dielectric 6707 may then be deposited, either through atomic layer deposition or through other low-temperature oxide formation procedures described previously. A metal gate 6708 may then be deposited to fill the recessed channel, followed by a CMP and gate patterning as illustrated in FIG. 67E.

Figure 67F:
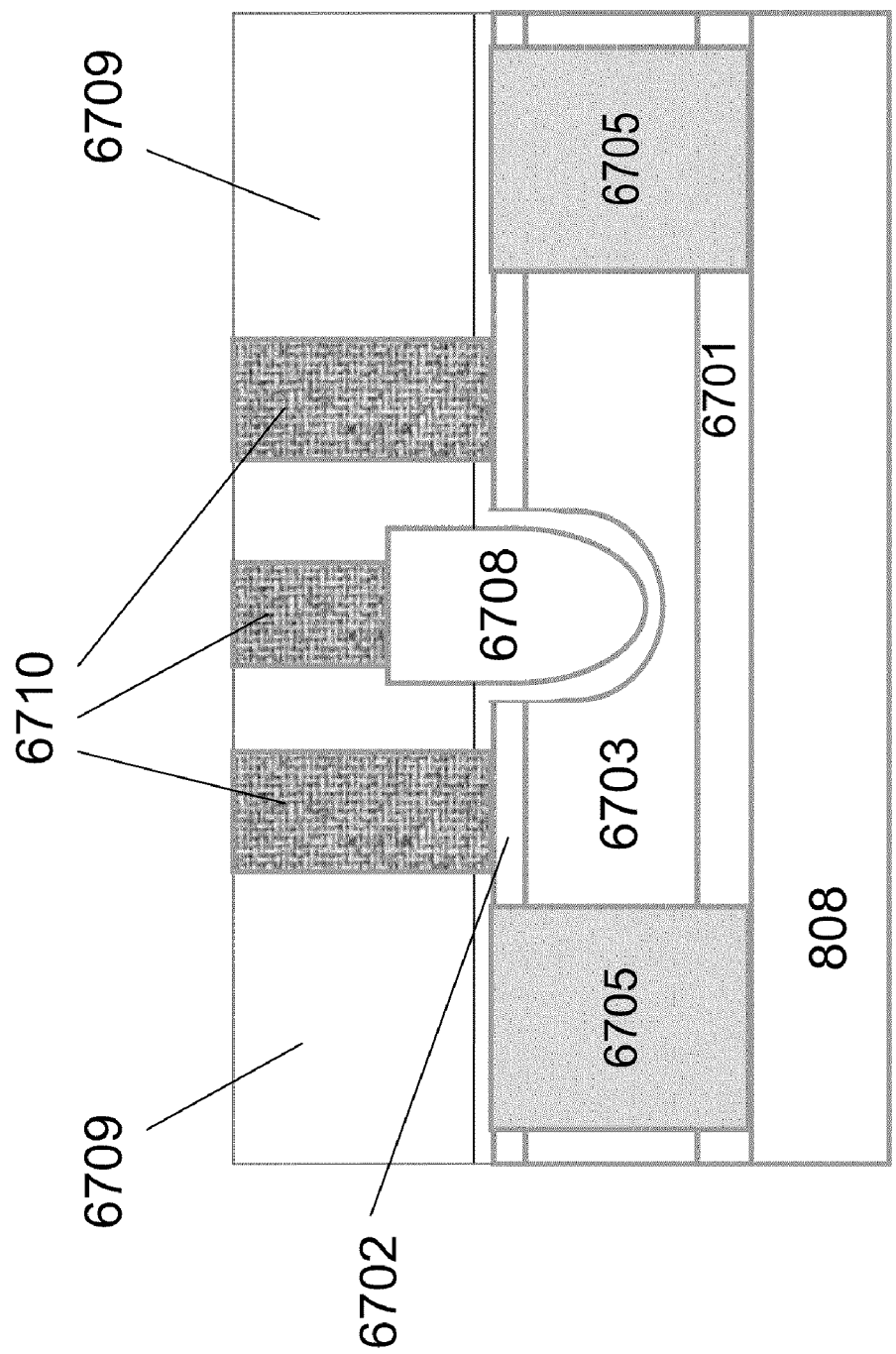

A low temperature oxide 6709 may be deposited and planarized by CMP. Contacts 6710 may be formed to connect to all electrodes of the transistor as illustrated in FIG. 67F. This flow enables the formation of a low temperature RCAT monolithically on top of pre-processed circuitry 808. A p-channel MOSFET may be formed with an analogous process. The p and n channel RCATs may be utilized to form a monolithic 3D CMOS circuit library as described later.

Figure 68C:
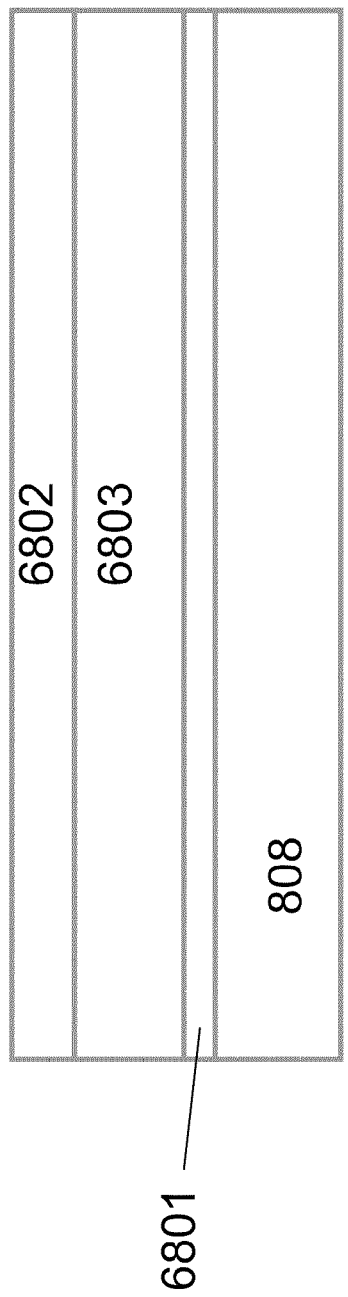

A layer stacking approach to construct 3D integrated circuits with spherical-RCATs (S-RCATs) is illustrated in FIG. 68A-F. For an n-channel MOSFET, a p− silicon wafer 6800 may be the starting point. A buried layer of n+ Si 6802 may then implanted as shown in FIG. 68A, resulting in a layer of p-6803 at the surface of the donor wafer. An alternative is to implant a shallow layer of n+ Si and then epitaxially deposit a layer of p− Si 6803. To activate dopants in the n+ layer 6802, the wafer may be annealed, with standard annealing procedures such as thermal, or spike, or laser anneal.

An oxide layer 6801 may be grown or deposited, as illustrated in FIG. 68B. Hydrogen may be implanted into the wafer 6804 to enable "smart cut" process, as indicated in FIG. 68B.

A layer transfer process may be conducted to attach the donor wafer in FIG. 68B to a pre-processed circuits acceptor wafer 808 as illustrated in FIG. 68C. The implanted hydrogen layer 6804 may now be utilized for cleaving away the remainder of the wafer 6800. After the cut, chemical mechanical polishing (CMP) may be performed.

Figure 68D:
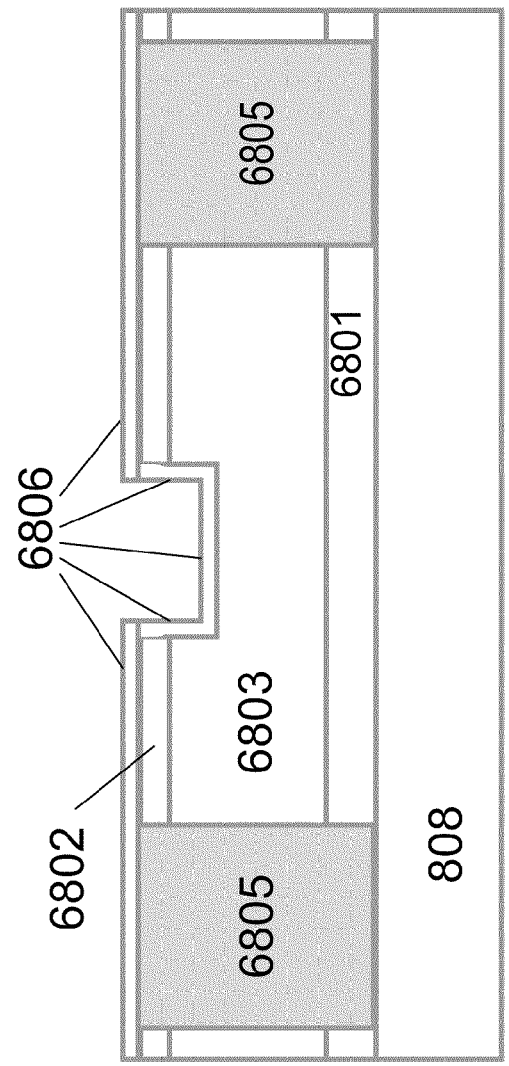

Oxide isolation regions 6805 may be formed as illustrated in FIG. 68D. The eventual gate electrode recessed channel may be masked and partially etched, and a spacer deposition 6806 may be performed with a conformal low temperature deposition such as silicon oxide or silicon nitride or a combination.

Figure 68E:
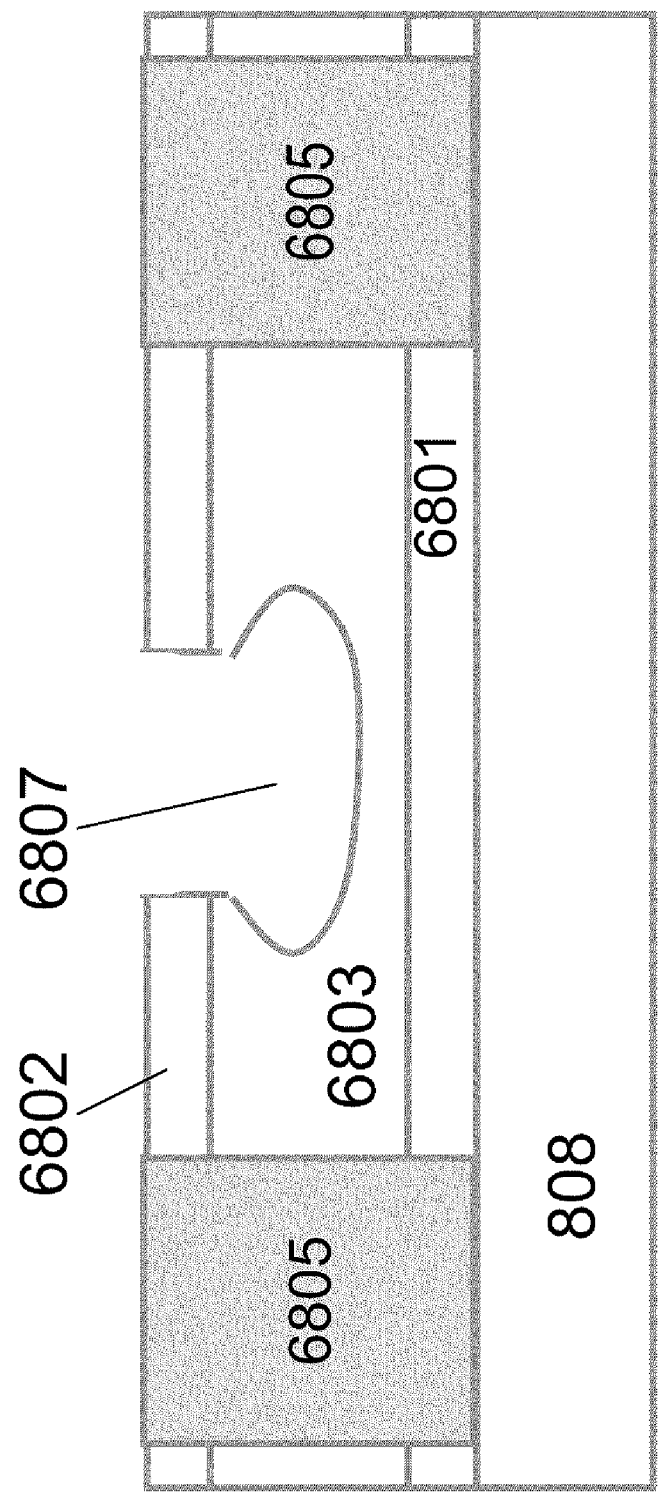

An anisotropic etch of the spacer may be performed to leave spacer material only on the vertical sidewalls of the recessed gate channel opening. An isotropic silicon etch may then be conducted to form the spherical recess 6807 as illustrated in FIG. 68E. The spacer on the sidewall may be removed with a selective etch.

Figure 68F:
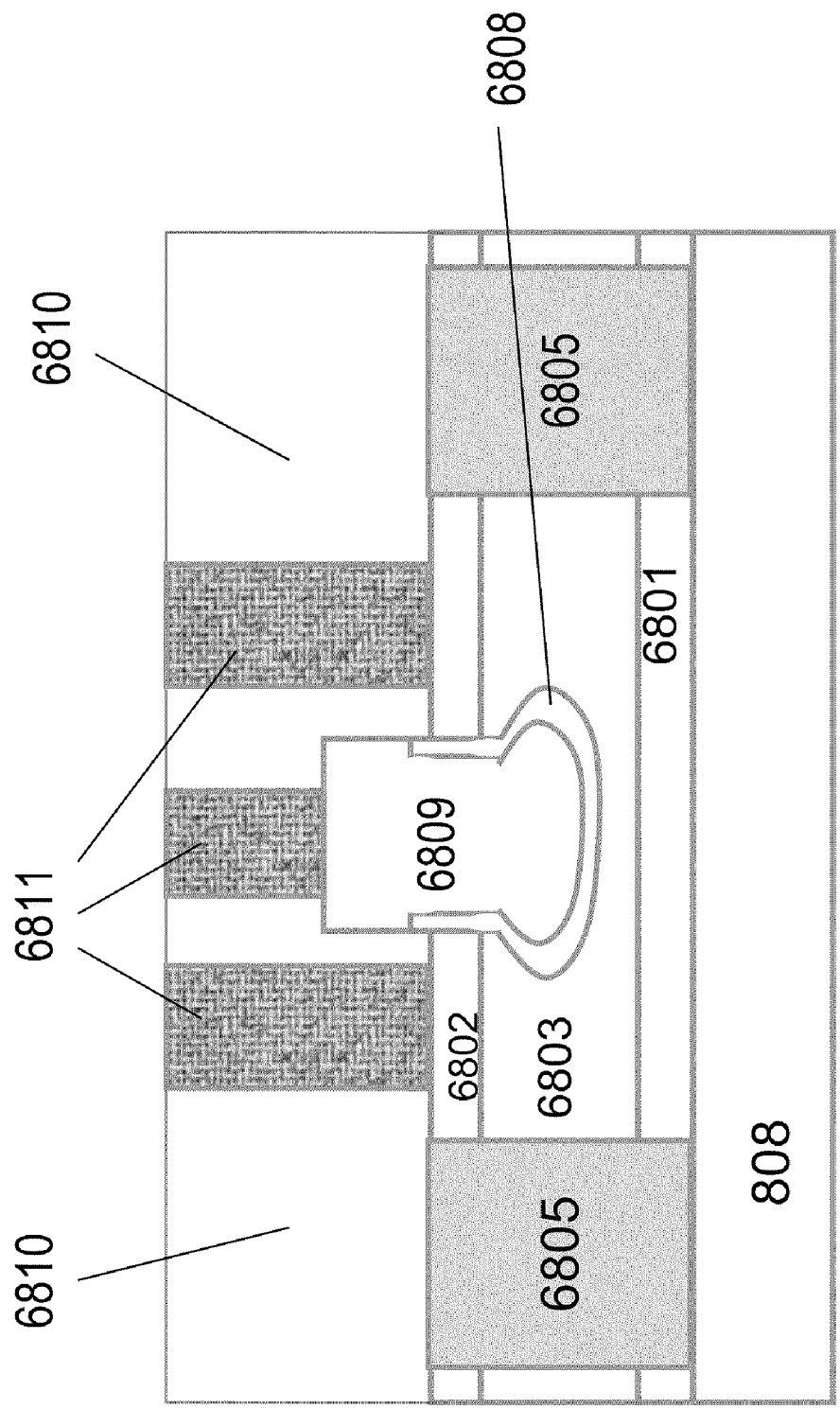

A gate dielectric 6808 may then be deposited, either through atomic layer deposition or through other low-temperature oxide formation procedures described previously. A metal gate 6809 may be deposited to fill the recessed channel, followed by a CMP and gate patterning as illustrated in FIG. 68F. The gate material may also be doped amorphous silicon or other low temperature conductor with the proper work function. A low temperature oxide 6810 may be deposited and planarized by the CMP. Contacts 6811 may be formed to connect to all electrodes of the transistor as illustrated in FIG. 68F.

This flow enables the formation of a low temperature S-RCAT monolithically on top of pre-processed circuitry 808. A p-channel MOSFET may be formed with an analogous process. The p and n channel S-RCATs may be utilized to form a monolithic 3D CMOS circuit library as described later. In addition, SRAM circuits constructed with RCATs may have different trench depths compared to logic circuits. The RCAT and S-RCAT devices may be utilized to form BiCMOS inverters and other mixed circuitry when the house 808 layer has conventional Bipolar Junction Transistors and the transferred layer or layers may be utilized to form the RCAT devices monolithically.

Floating-body DRAM is a next generation DRAM being developed by many companies such as Innovative Silicon, Hynix, and Toshiba. These floating-body DRAMs store data as charge in the floating body of an SOI MOSFET or a multi-gate MOSFET. Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939, besides other literature. A monolithic 3D integrated DRAM can be constructed with floating-body transistors. Prior art for constructing monolithic 3D DRAMs used planar transistors where crystalline silicon layers were formed with either selective epi technology or laser recrystallization. Both selective epi technology and laser recrystallization may not provide perfectly single crystal silicon and often require a high thermal budget. A description of these processes is given in the book entitled "Integrated Interconnect Technologies for 3D Nanoelectronic Systems" by Bakir and Meindl.

An alternative embodiment of this invention may be a monolithic 3D DRAM we call NuDRAM. It may utilize layer transfer and cleaving methods described in this document. It may provide high-quality single crystal silicon at low effective thermal budget, leading to considerable advantage over prior art.

One embodiment of this invention may be constructed with the process flow depicted in FIG. 88(A)-(F). FIG. 88(A) describes the first step in the process. A p– wafer 8801 may be implanted with n type dopant to form an n+ layer 8802, following which an RTA may be performed. Alternatively, the n+ layer 8802 may be formed by epitaxy.

FIG. 88(B) shows the next step in the process. Hydrogen may be implanted into the wafer at a certain depth in the p– region 8801. Final position of the hydrogen is depicted by the dotted line 8803.

FIG. 88(C) describes the next step in the process. The wafer may be attached to a temporary carrier wafer 8804 using an adhesive. For example, one could use a polyimide adhesive from Dupont for this purpose along with a temporary carrier wafer 8804 made of glass. The wafer may then be cleaved at the hydrogen plane 8803 using any cleave method described in this document. After cleave, the cleaved surface is polished with CMP and an oxide 8805 is deposited on this surface. The structure of the wafer after all these processes are carried out is shown in FIG. 88(C).

Figure 89:
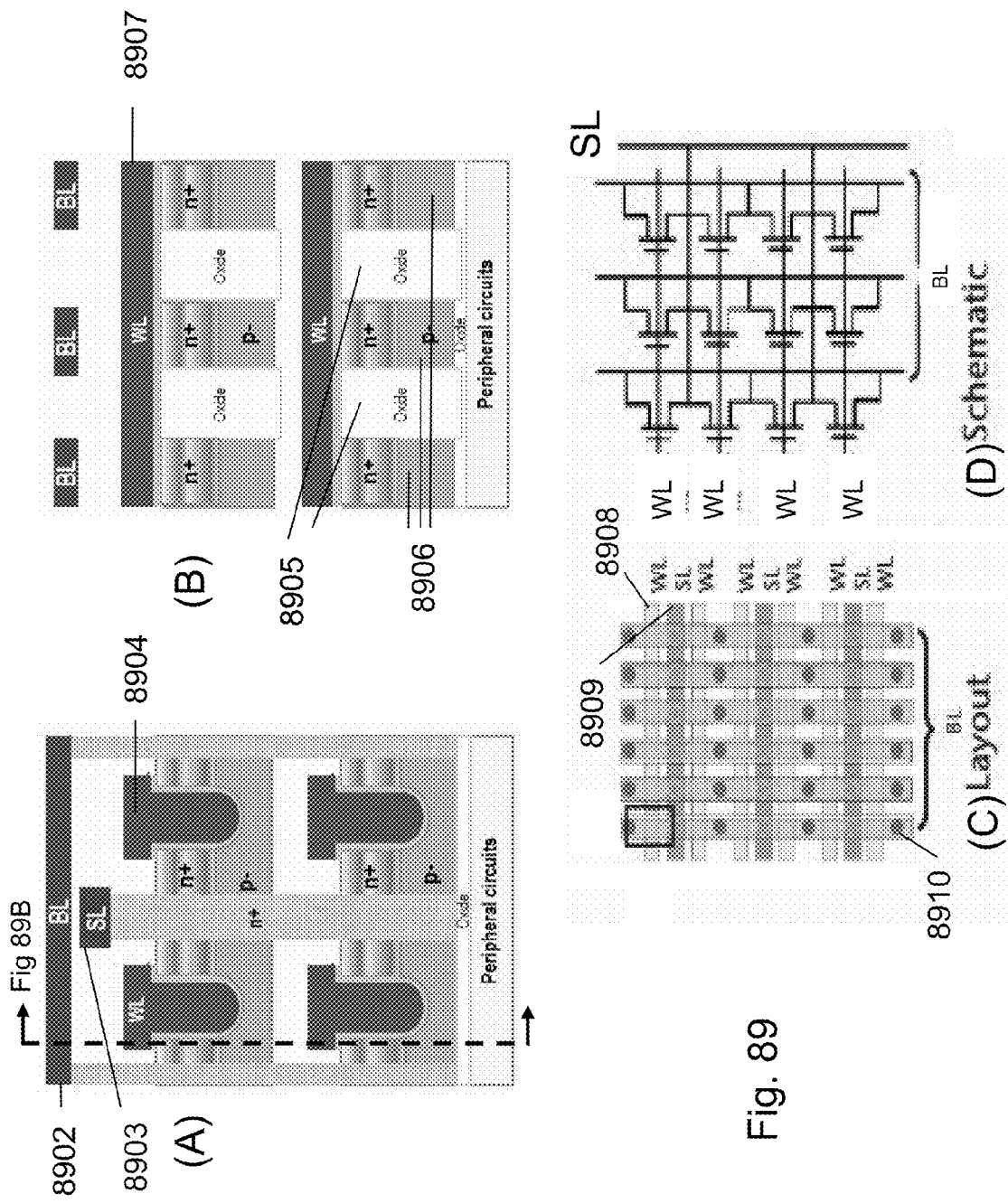
FIG. 89 A-D are drawing illustrations of a formation of 3D DRAM.

FIG. 88(D) illustrates the next step in the process. A wafer with DRAM peripheral circuits 8806 such as sense amplifiers, row decoders, etc. may now be used as a base on top of which the wafer in FIG. 88(C) is bonded, using oxide-to-oxide bonding at surface 8807. The temporary carrier 8804 may then be removed. Then, a step of masking, etching, and oxidation may be performed, to define rows of diffusion, isolated by oxide similarly to 8905 of FIG. 89 (B). The rows of diffusion and isolation may be aligned with the underlying peripheral circuits 8806. After forming isolation regions, RCATs may be constructed by etching, and then depositing gate dielectric 8809 and gate electrode 8808. This procedure is further explained in the descriptions for FIG. 67. The gate electrode mask may be aligned to the underlying peripheral circuits 8806. An oxide layer 8810 may be deposited and polished with CMP.

FIG. 88(E) shows the next step of the process. A second RCAT layer 8812 may be formed atop the first RCAT layer 8811 using steps similar to FIG. 88(A)-(D). These steps could be repeated multiple times to form the desired multilayer 3D DRAM.

The next step of the process is described with respect to FIG. 88(F). Via holes may be etched to source 8814 and drain 8815 through all of the layers of the stack. As this step is also performed in alignment with the peripheral circuits 8806, an etch stop could be designed or no vulnerable element should be placed underneath the designated etch locations. This is similar to a conventional DRAM array wherein the gates 8816 of multiple RCAT transistors are connected by poly line or metal line perpendicular to the plane of the illustration in FIG. 88. This connection of gate electrodes may form the word-line, similar to that illustrated in FIG. 89A-D. The layout may spread the word-lines of the multilayer DRAM structure so that for each layer there may be one vertical contact hole connection to allow peripheral circuits 8806 to control each layer's word-line independently. Via holes may then be filled with heavily doped polysilicon 8813. The heavily doped polysilicon 8813 may be constructed using a low temperature (below 400° C.) process such as PECVD. The heavily doped polysilicon 8813 may not only improve the contact of multiple sources, drains, and word-lines of the 3D DRAM, but also serve the purpose of separating adjacent p– layers 8817 and 8818. Alternatively, oxide may be utilized for isolation. Multiple layers of interconnects and vias may then be constructed to form Bit-Lines 8815 and Source-Lines 8814 to complete the DRAM array. While RCAT transistors are shown in FIG. 88, a process flow similar to FIG. 88A-F can be developed for other types of low-temperature processed stackable transistors as well. For example, V-groove transistors and other transistors described in other embodiments of the current invention can be developed.

FIG. 89(A)-(D) show the side-views, layout, and schematic of one part of the NuDRAM array described in FIG. 88(A)-(F). FIG. 89(A) shows one particular cross-sectional view of the NuDRAM array. The Bit-Lines (BL) 8902 may run in a direction perpendicular to the word-lines (WL) 8904 and source-lines (SL) 8903.

A cross-sectional view taken along the plane indicated by the broken line as shown in FIG. 89(B). Oxide isolation regions 8905 may separate p– layers 8906 of adjacent transistors. WL 8907 may essentially comprise of gate electrodes of each transistor connected together.

A layout of this array is shown in FIG. 89(C). The WL wiring 8908 and SL wiring 8909 may be perpendicular to the BL wiring 8910. A schematic of the NuDRAM array (FIG. 89(D)) reveals connections for WLs, BLs and SLs at the array level.

Another variation embodiment of the current invention is described in FIG. 90(A)-(F). FIG. 90(A) describes the first step in the process. A p– wafer 9001 may include an n+ epi layer 9002 and a p– epi layer 9003 grown over the n+ epi layer. Alternatively, these layers could be formed with implant. An oxide layer 9004 may be grown or deposited over the wafer as well.

FIG. 90(B) shows the next step in the process. Hydrogen H+, or other atomic species, may be implanted into the wafer at a certain depth in the n+ region 9002. The final position of the hydrogen is depicted by the dotted line 9005.

FIG. 90(C) describes the next step in the process. The wafer may be flipped and attached to a wafer with DRAM peripheral circuits 9006 using oxide-to-oxide bonding. The wafer may then be cleaved at the hydrogen plane 9005 using low temperature (less than 400° C.) cleave methods described in this document. After cleave, the cleaved surface may be polished with CMP.

As shown in FIG. 90(D), a step of masking, etching, and low temperature oxide deposition may be performed, to define rows of diffusion, isolated by said oxide. Said rows of diffusion and isolation may be aligned with the underlying peripheral circuits 9006. After forming isolation regions, RCATs may be constructed with masking, etch, gate dielectric 9009 and gate electrode 9008 deposition. The procedure for this is explained in the description for FIG. 67. Said gates may be aligned to the underlying peripheral circuits 9006. An oxide layer 9010 may be deposited and polished with CMP.

FIG. 90(E) shows the next step of the process. A second RCAT layer 9012 may be formed atop the first RCAT layer 9011 using steps similar to FIG. 90(A)-(D). These steps could be repeated multiple times to form the desired multilayer 3D DRAM.

Figure 90:
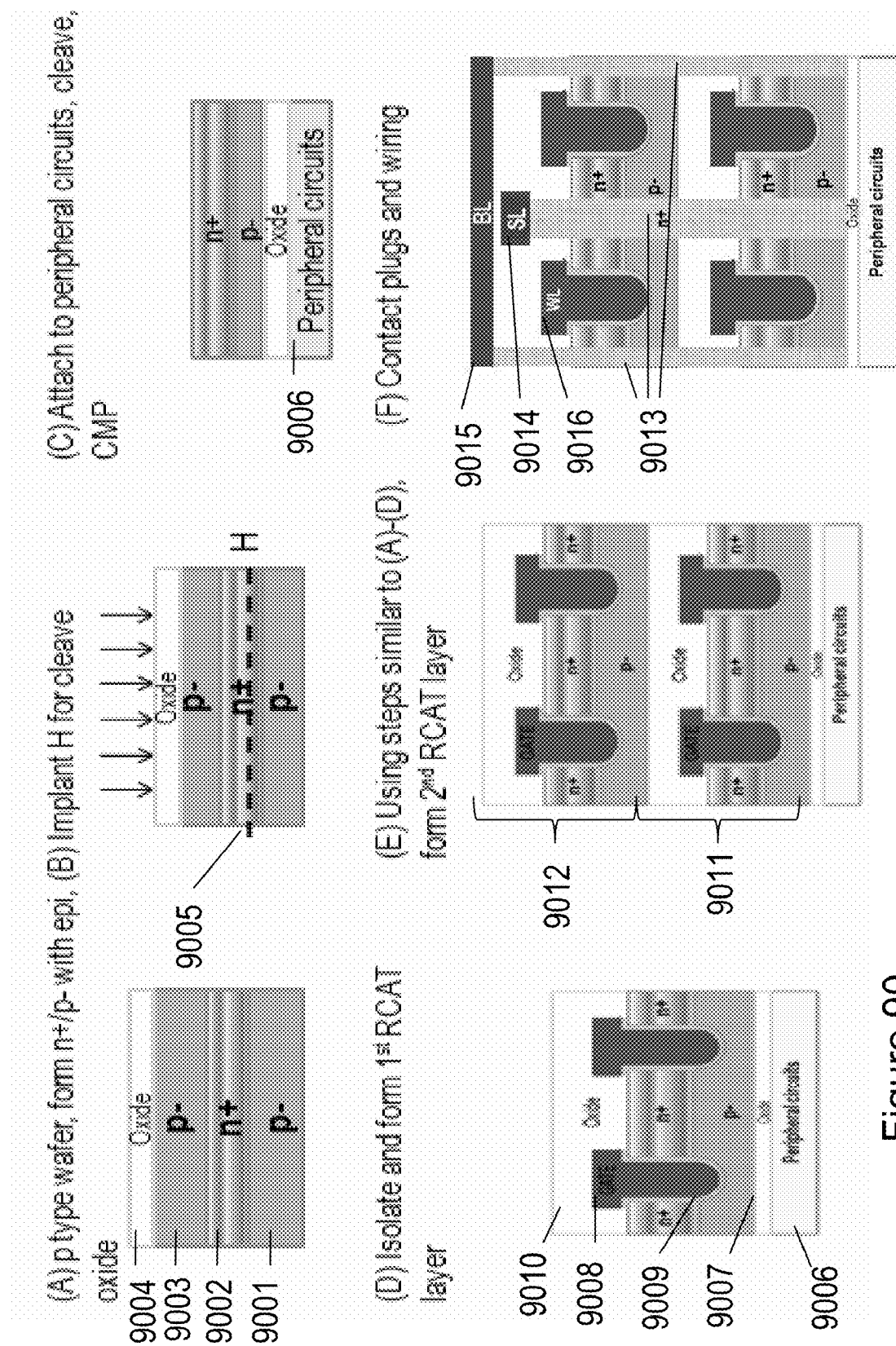
FIG. 90 A-F are drawing illustrations of a formation of 3D DRAM.

The next step of the process is described in FIG. 90(F). Via holes may be etched to the source and drain connections through all of the layers in the stack, similar to a conventional DRAM array wherein the gate electrodes 9016 of multiple RCAT transistors are connected by poly line perpendicular to the plane of the illustration in FIG. 90. This connection of gate electrodes may form the word-line. The layout may spread the word-lines of the multilayer DRAM structure so that for each layer there may be one vertical hole to allow the peripheral circuit 9006 to control each layer word-line independently. Via holes may then be filled with heavily doped polysilicon 9013. The heavily doped silicon 9013 may be constructed using a low temperature process below 400° C. such as PECVD. Multiple layers of interconnects and vias may then be constructed to form bit-lines 9015 and source-lines 9014 to complete the DRAM array. Array organization of the NuDRAM described in FIG. 90 is similar to FIG. 89. While RCAT transistors are shown in FIG. 90, a process flow similar to FIG. 90 can be developed for other types of low-temperature processed stackable transistors as well. For example, V-groove transistors and other transistors previously described in other embodiments of this invention can be developed.

Yet another flow for constructing NuDRAMs is shown in FIG. 91A-L. The process description begins in FIG. 91A with forming shallow trench isolation 9102 in an SOI p– wafer 9101. The buried oxide layer is indicated as 9119.

Figure 91A:
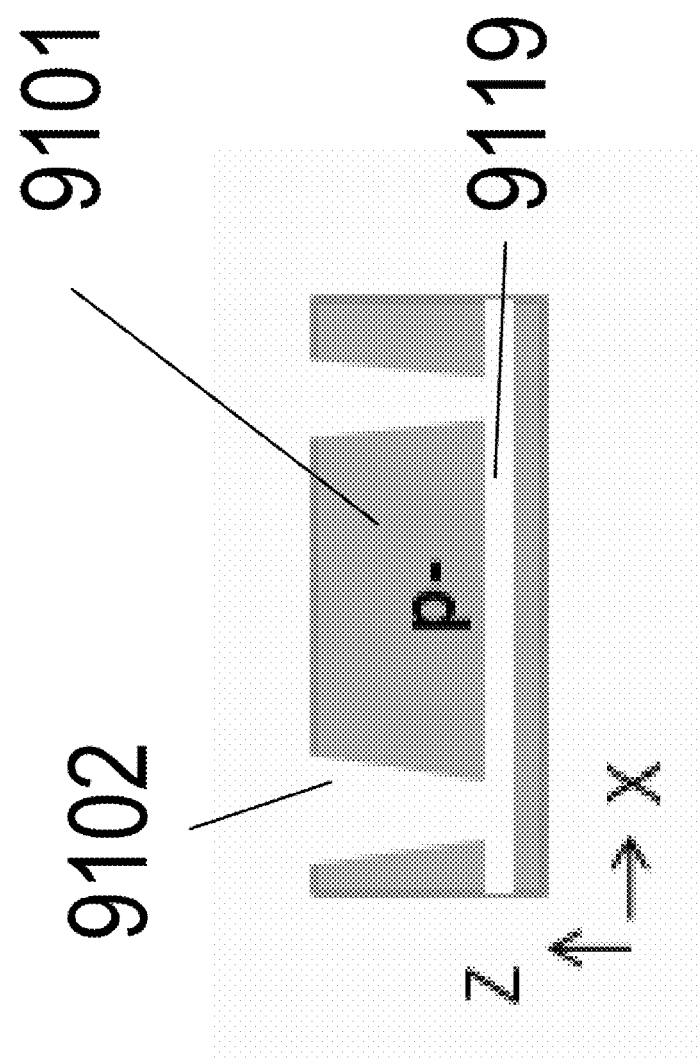
FIG. 91 A-L are drawing illustrations of a formation of 3D DRAM.
Figure 91B:
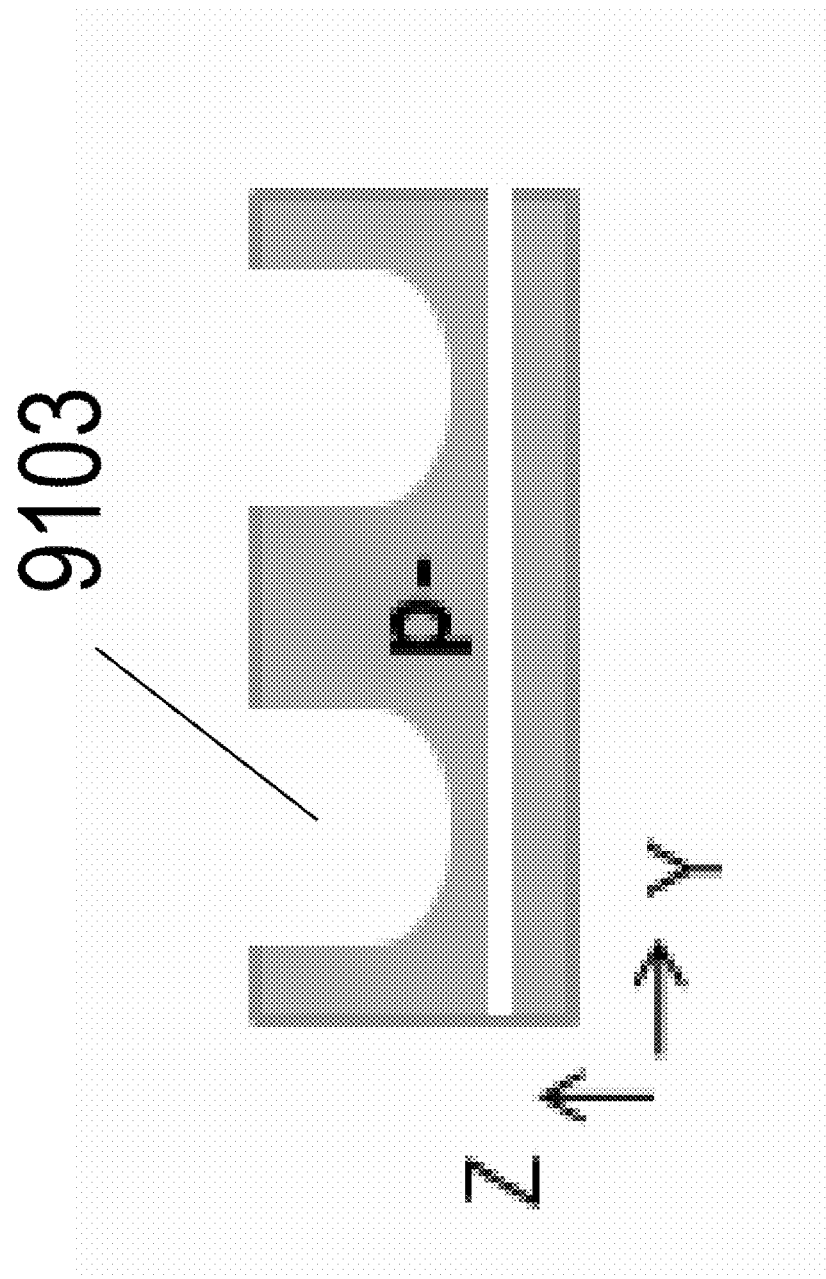

Following this, a gate trench etch 9103 may be performed as illustrated in FIG. 91B. FIG. 91B shows a cross-sectional view of the NuDRAM in the YZ plane, compared to the XZ plane for FIG. 91A (therefore the shallow trench isolation 9102 is not shown in FIG. 91B).

Figure 91C:
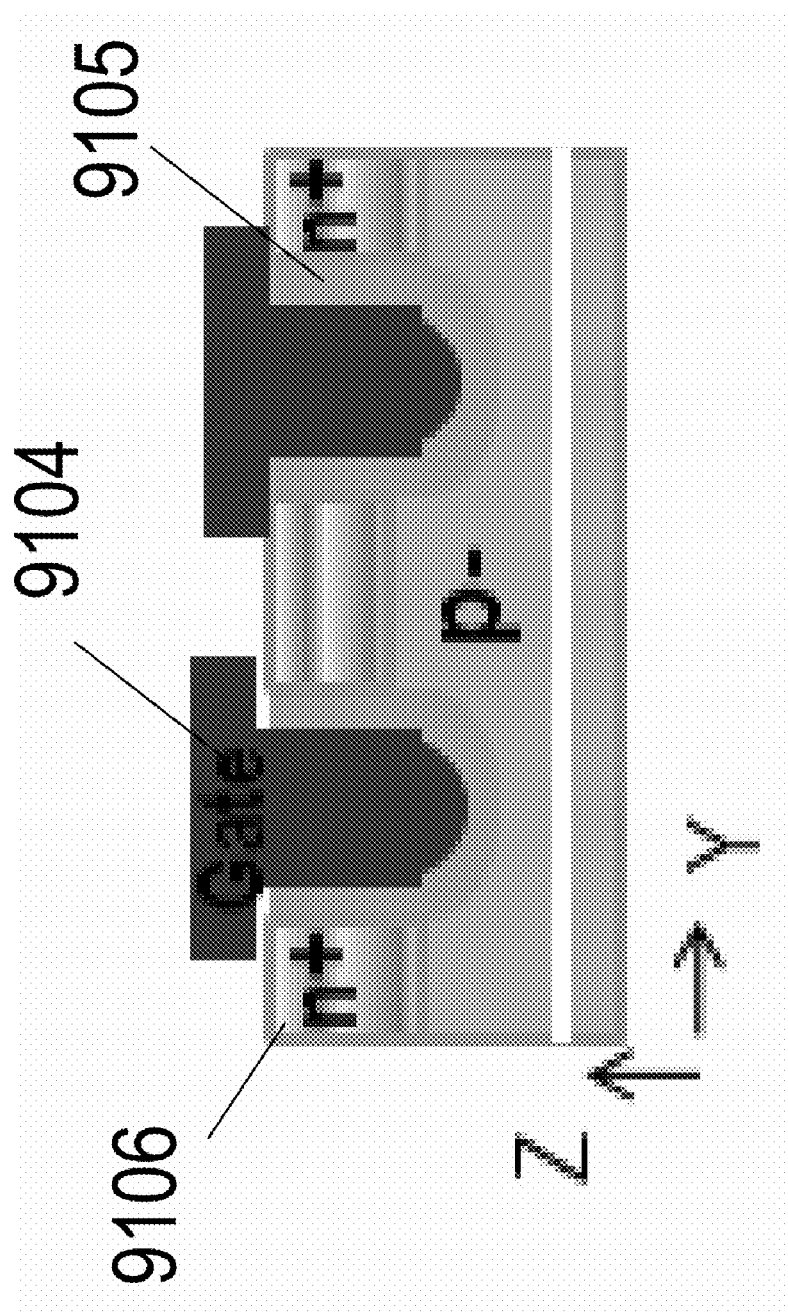

The next step in the process is illustrated in FIG. 91C. A gate dielectric layer 9105 may be formed and the RCAT gate electrode 9104 may be formed using procedures similar to FIG. 67E. Ion implantation may then be carried out to form source and drain n+ regions 9106.

Figure 91D:
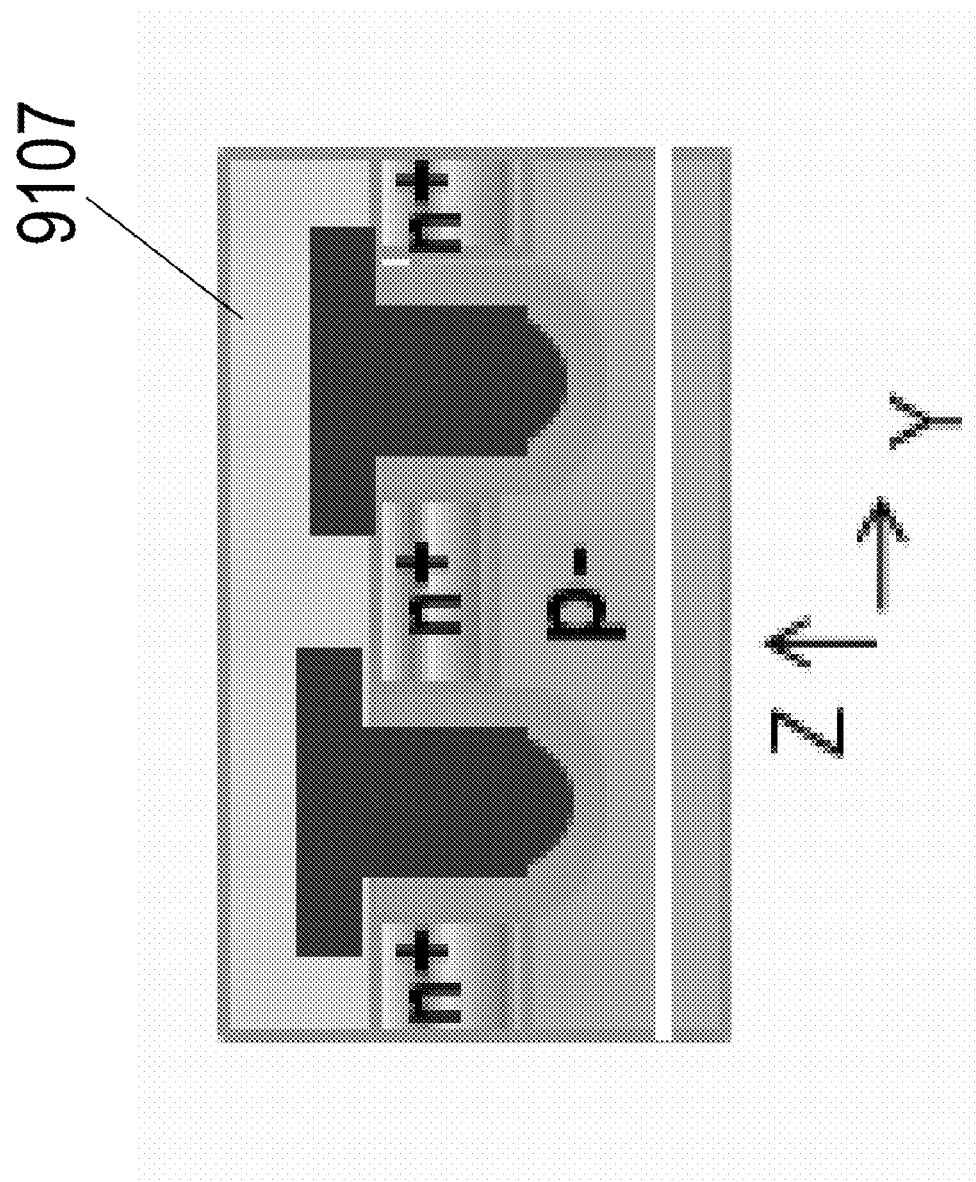

FIG. 91D shows an inter-layer dielectric 9107 formed and polished.

Figure 91E:
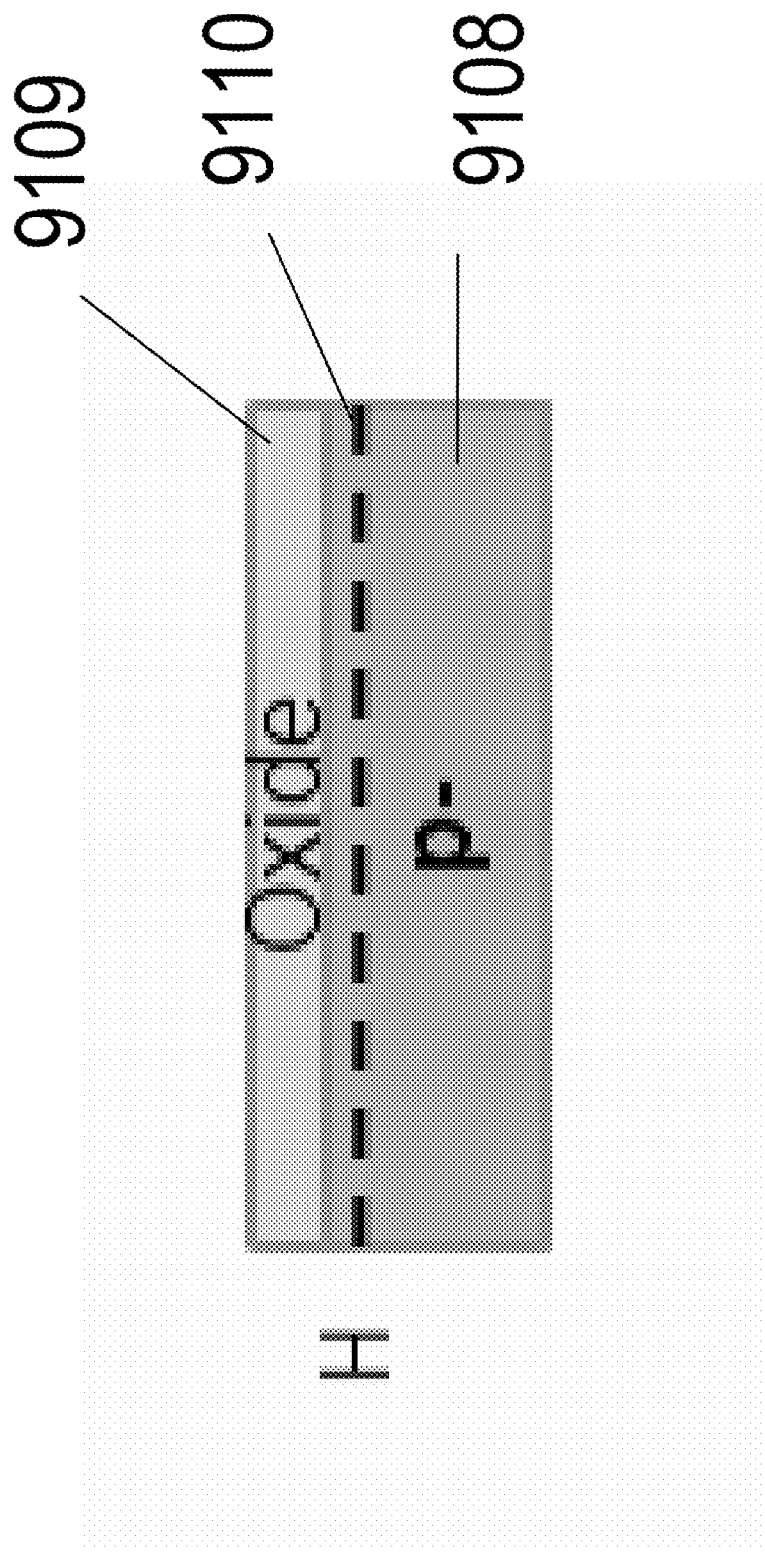

FIG. 91E reveals the next step in the process. Another p– wafer 9108 may be taken, an oxide 9109 may be grown on p– wafer 9108 following which hydrogen H+, or other atomic species, may be implanted at a certain depth 9110 for cleave purposes.

This "higher layer" 9108 may then be flipped and bonded to the lower wafer 9101 using oxide-to-oxide bonding. A cleave may then be performed at the hydrogen plane 9110, following which a CMP may be performed resulting in the structure as illustrated in FIG. 91F.

Figure 91F:
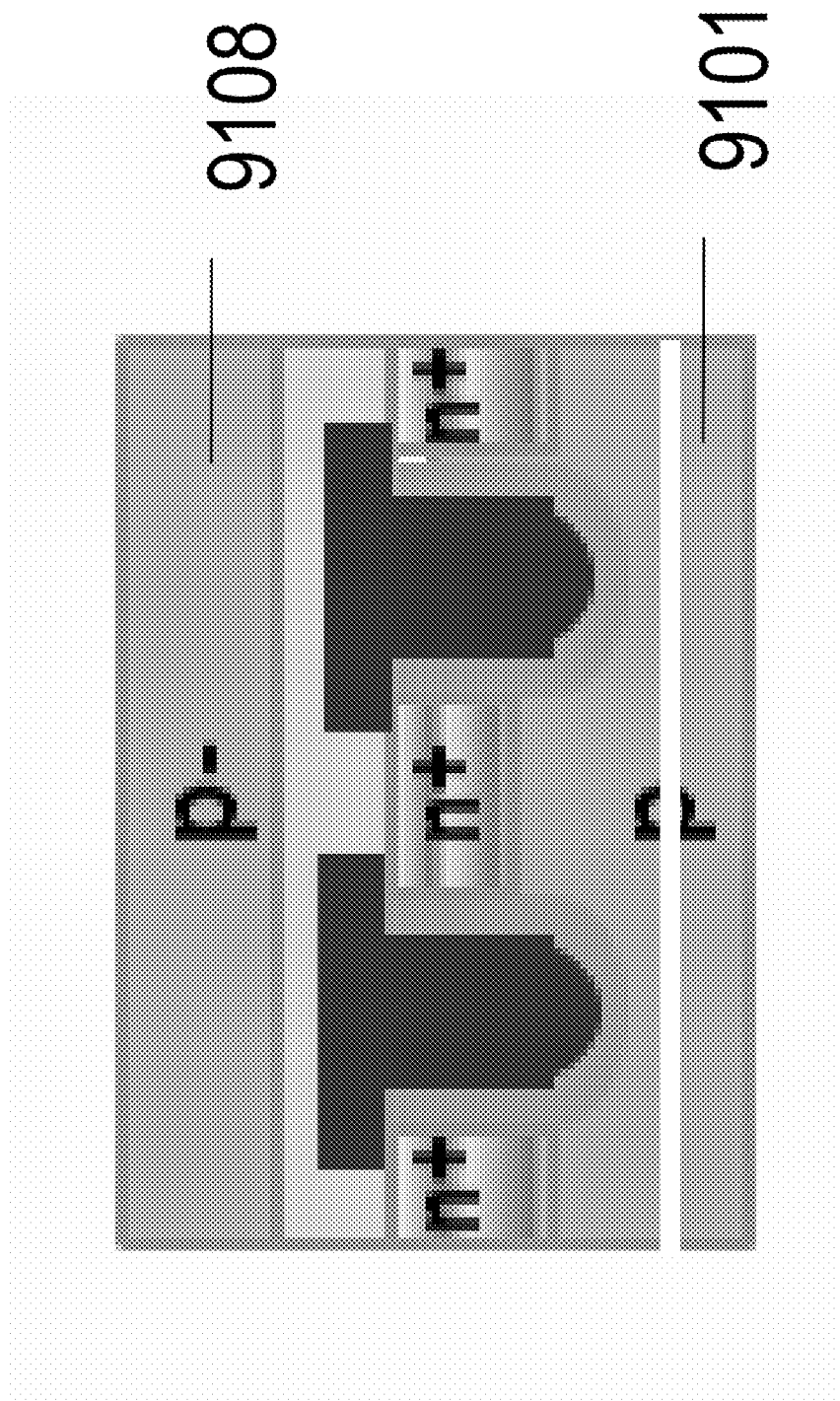
Figure 91G:
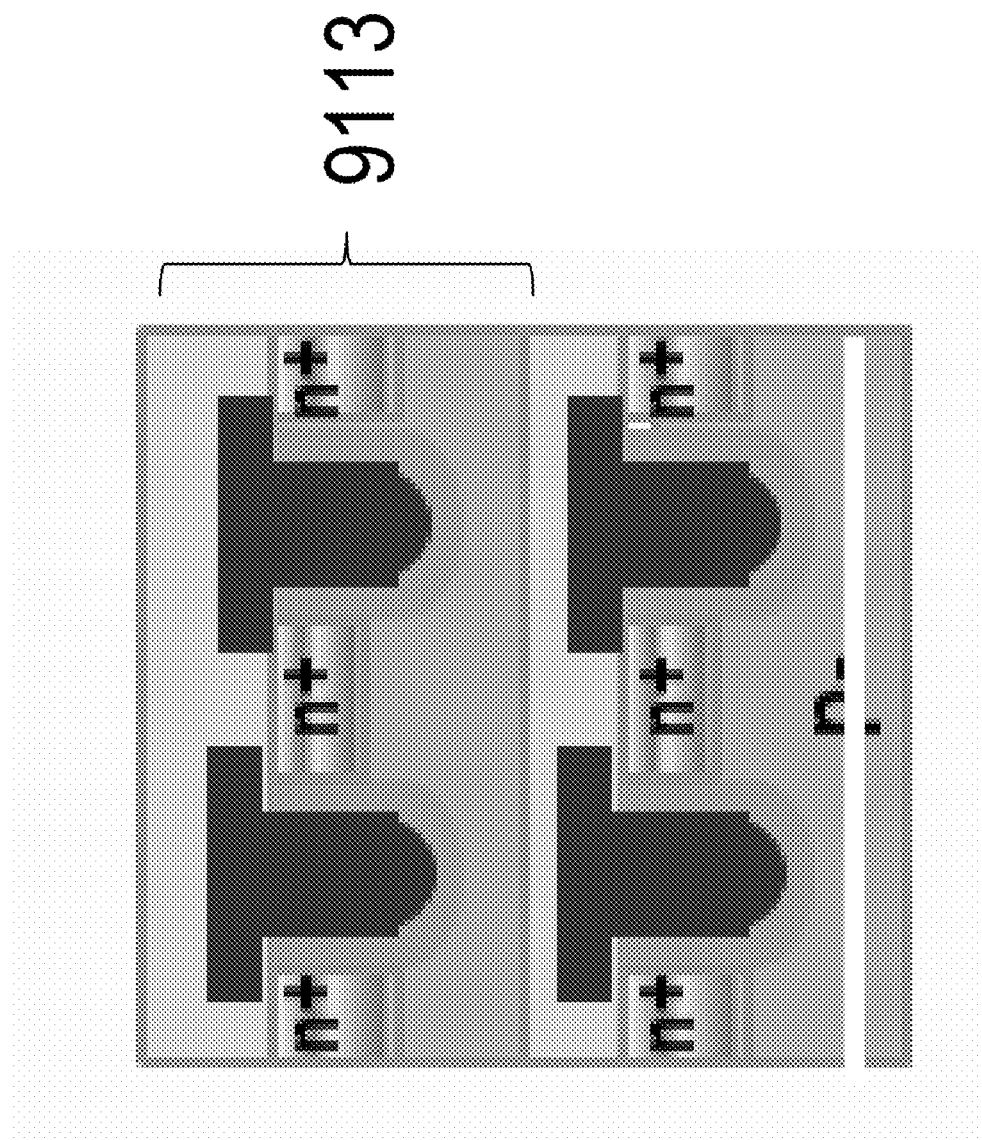

FIG. 91G shows the next step in the process. Another layer of RCATs 9113 may be constructed using procedures similar to those shown in FIG. 91B-D. This layer of RCATs may be aligned to features in the bottom wafer 9101.

Figure 91H:
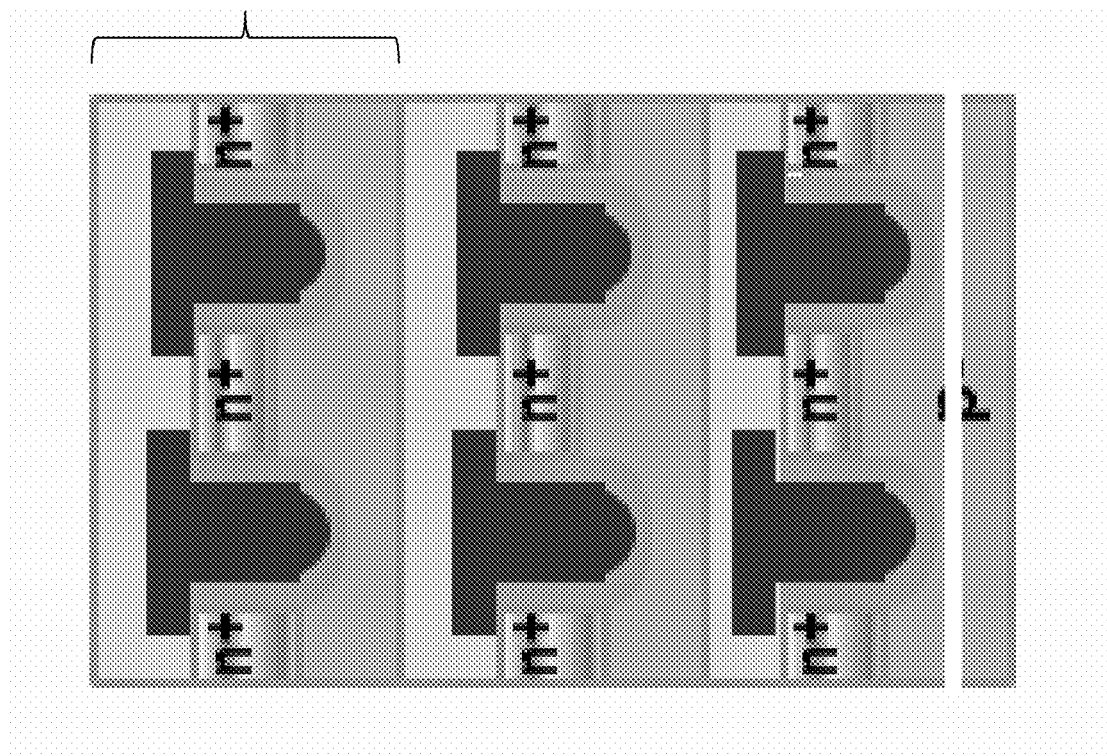

As shown in FIG. 91H, one or more layers of RCATs 9114 can then be constructed using procedures similar to those shown in FIG. 91E-G.

Figure 91I:
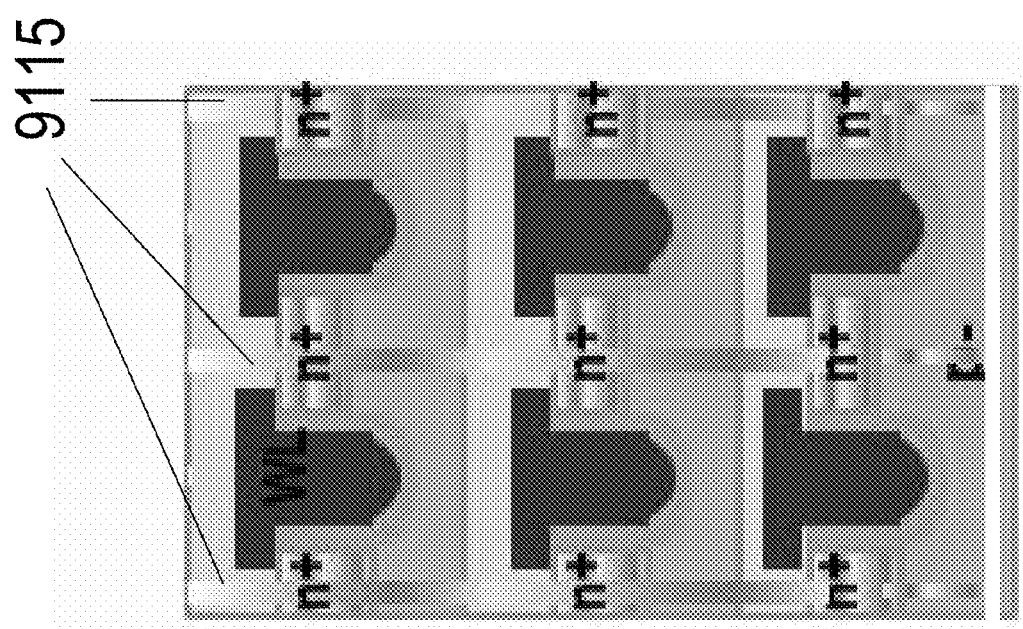

FIG. 91I illustrates vias 9115 being formed to different n+ regions and also to WL layers. These vias 9115 may be constructed with heavily doped polysilicon.

Figure 91J:
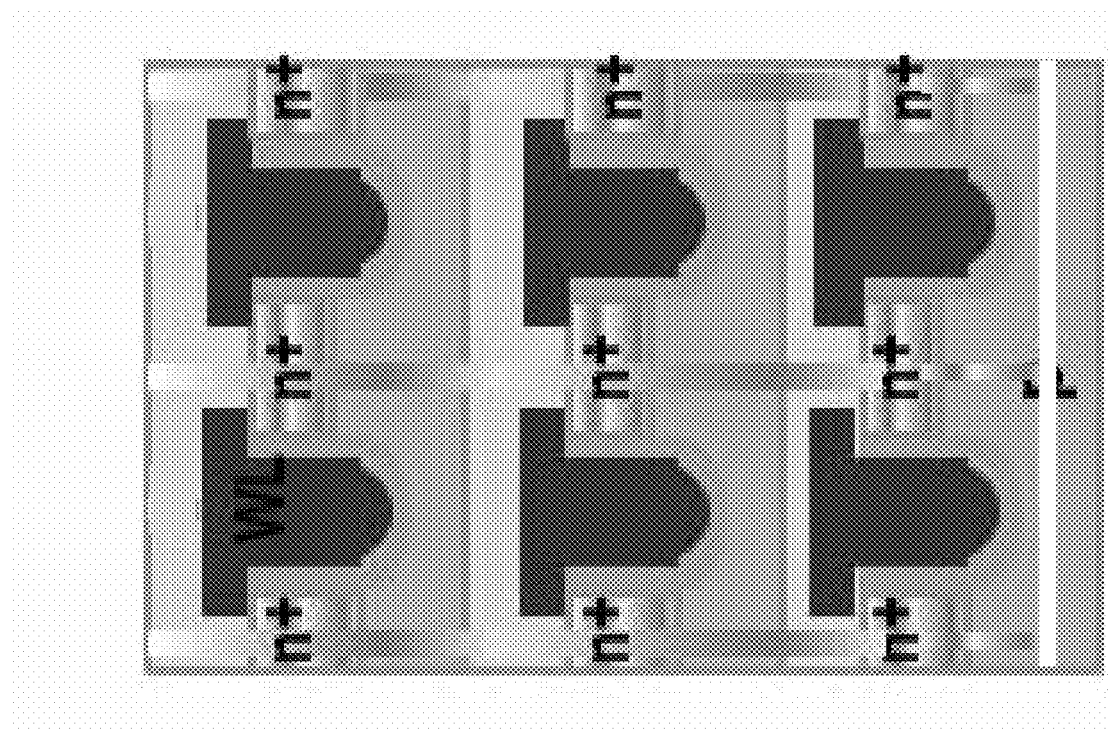

FIG. 91J shows the next step in the process where a Rapid Thermal Anneal (RTA) may be done to activate implanted dopants and to crystallize poly Si regions of all layers.

Figure 91K:
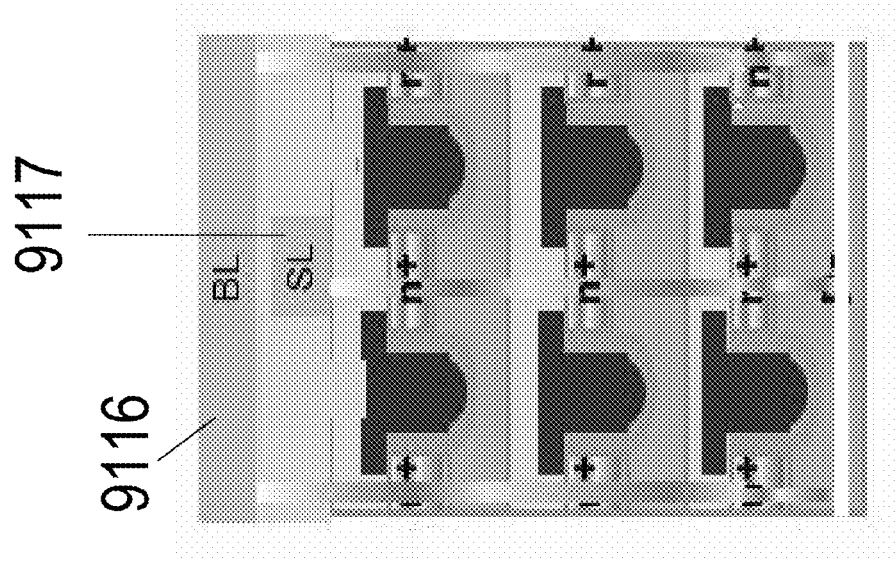

FIG. 91K illustrates bit-lines BLs 9116 and source-lines SLs 9117 being formed.

Figure 91L:
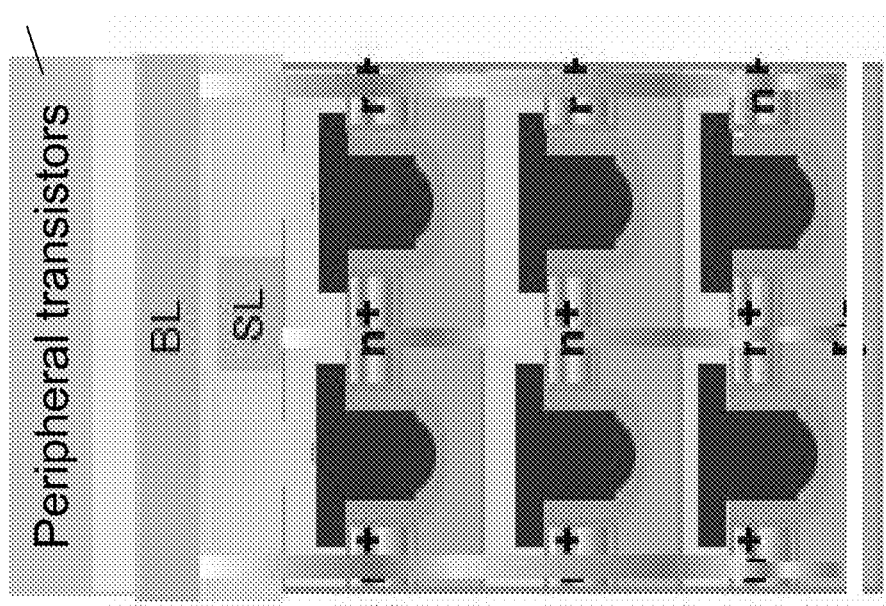

Following the formations of BLs 9116 and SL 9117, FIG. 91L shows a new layer of transistors and vias for DRAM peripheral circuits 9118 formed using procedures described previously (e.g., V-groove MOSFETs can be formed as described in FIG. 29A-G). These peripheral circuits 9118 may be aligned to the DRAM transistor layers below. DRAM transistors for this embodiment can be of any type (either high temperature (i.e., >400° C.) processed or low temperature (i.e., <400° C.) processed transistors), while peripheral circuits may be low temperature processed transistors since they are constructed after Aluminum or Copper wiring layers 9116 and 9117. Array architecture for the embodiment shown in FIG. 91 may be similar to the one indicated in FIG. 89.

A variation of the flow shown in FIG. 91A-L may be used as an alternate process for fabricating NuDRAMs. Peripheral circuit layers may first be constructed with all steps complete for transistors except the RTA. One or more levels of tungsten metal may be used for local wiring of these peripheral circuits. Following this, multiple layers of RCATs may be constructed with layer transfer as described in FIG. 91, after which an RTA may be conducted. Highly conductive copper or aluminum wire layers may then be added for the completion of the DRAM flow. This flow reduces the fabrication cost by sharing the RTA, the high temperature steps, doing them once for all crystallized layers and also allows the use of similar design for the 3D NuDRAM peripheral circuit as used in conventional 2D DRAM. For this process flow, DRAM transistors may be of any type, and are not restricted to low temperature etch-defined transistors such as RCAT or V-groove transistors.

Figure 92:
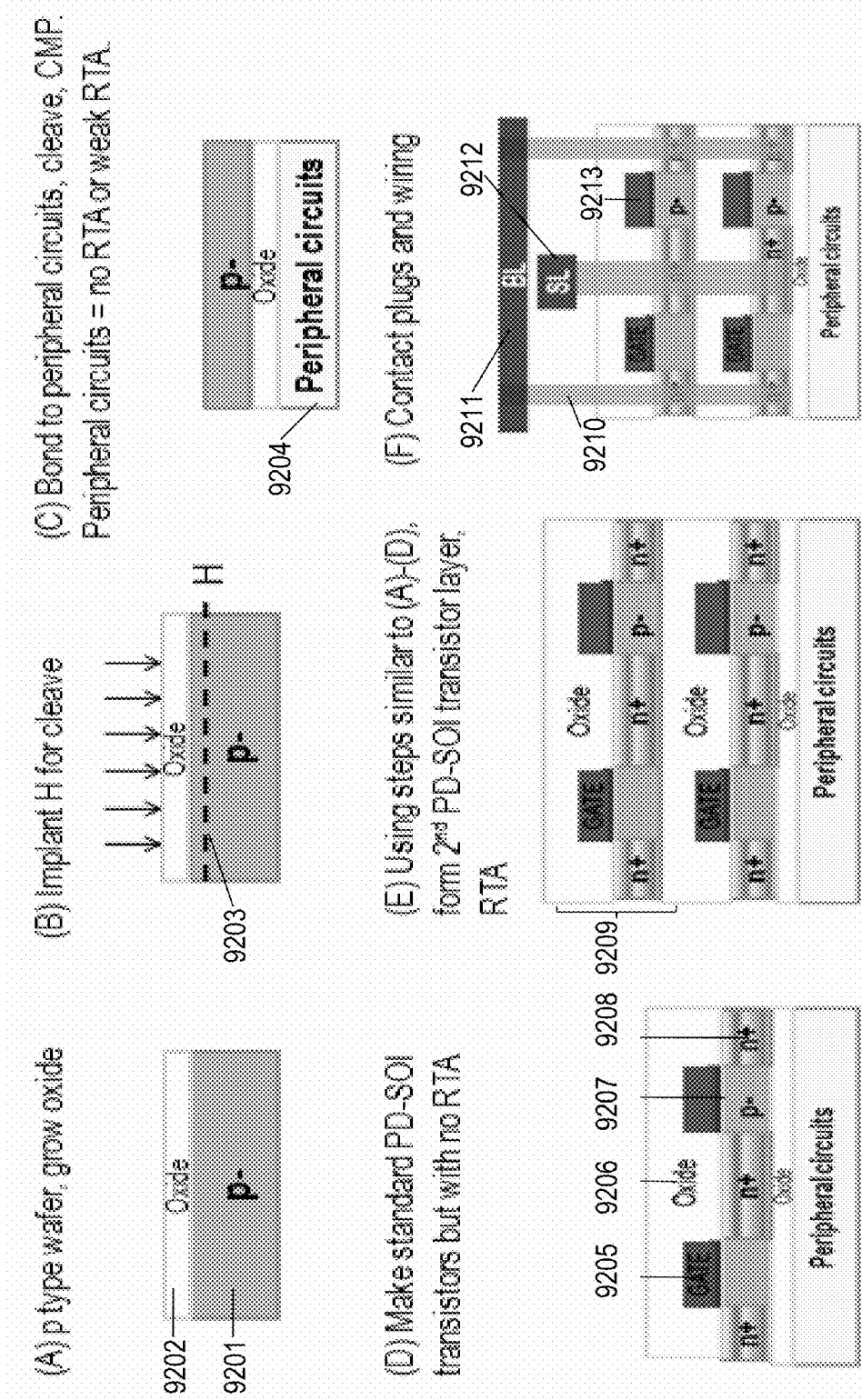
FIG. 92 A-F are drawing illustrations of a formation of 3D DRAM.

An illustration of a NuDRAM constructed with partially depleted SOI transistors is given in FIG. 92A-F. FIG. 92A describes the first step in the process. A p– wafer 9201 may have an oxide layer 9202 grown over it. FIG. 92B shows the next step in the process. Hydrogen H+ may be implanted into the wafer at a certain depth in the p– region 9201. The final position of the hydrogen is depicted by the dotted line 9203. FIG. 92C describes the next step in the process. A wafer with DRAM peripheral circuits 9204 may be prepared. This wafer may have transistors that have not seen RTA processes. Alternately, a weak or partial RTA for the peripheral circuits may be used. Multiple levels of tungsten interconnect to connect together transistors in 9204 are prepared. The wafer from FIG. 92B may be flipped and attached to the wafer with DRAM peripheral circuits 9204 using oxide-to-oxide bonding. The wafer may then be cleaved at the hydrogen plane 9203 using any cleave method described in this document. After cleave, the cleaved surface may be polished with CMP. FIG. 92D shows the next step in the process. A step of masking, etching, and low temperature oxide deposition may be performed, to define rows of diffusion, isolated by said oxide. Said rows of diffusion and isolation may be aligned with the underlying peripheral circuits 9204. After forming isolation regions, partially depleted SOI (PD-SOI) transistors may be constructed with formation of a gate dielectric 9207, a gate electrode 9205, and then patterning and etch of 9207 and 9205 followed by formation of ion implanted source/drain regions 9208. Note that no RTA may be done at this step to activate the implanted source/drain regions 9208. The masking step in FIG. 92D may be aligned to the underlying peripheral circuits 9204. An oxide layer 9206 may be deposited and polished with CMP. FIG. 92E shows the next step of the process. A second PD-SOI transistor layer 9209 may be formed atop the first PD-SOI transistor layer using steps similar to FIG. 92A-D. These may be repeated multiple times to form the desired multilayer 3D DRAM. An RTA to activate dopants and crystallize polysilicon regions in all the transistor layers may then be conducted. The next step of the process is described in FIG. 92F. Via holes 9210 may be masked and may be etched to word-lines and source and drain connections through all of the layers in the stack. Note that the gates of transistors 9213 are connected together to form word-lines in a similar fashion to FIG. 89. Via holes may then be filled with a metal such as tungsten. Alternately, heavily doped polysilicon may be used. Multiple layers of interconnects and vias may be constructed to form Bit-Lines 9211 and Source-Lines 9212 to complete the DRAM array. Array organization of the NuDRAM described in FIG. 92 is similar to FIG. 89.

For the purpose of programming transistors, a single type of top transistor could be sufficient. Yet for logic type circuitry two complementing transistors might be helpful to allow CMOS type logic. Accordingly the above described various mono-type transistor flows could be performed twice. First perform all the steps to build the 'n' type, and than do an additional layer transfer to build the 'p' type on top of it.

Figure 30:
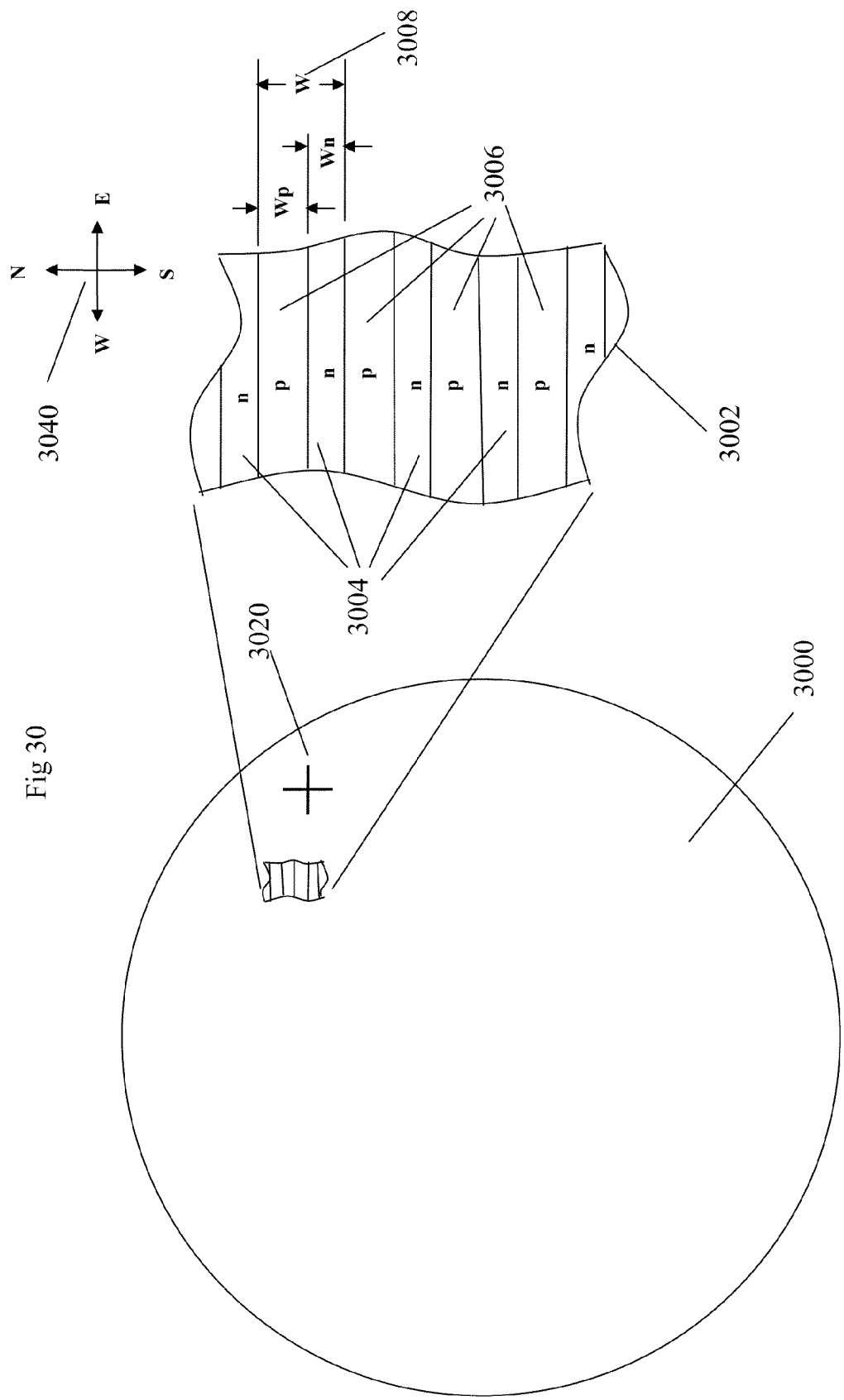
FIG. 30 is a drawing illustration of a donor wafer.

An additional alternative is to build both 'n' type and 'p' type transistors on the same layer. The challenge is to form these transistors aligned to the underlying layers 808. The innovative solution is described with the help of FIGS. 30 to 33. The flow could be applied to any transistor constructed in a manner suitable for wafer transfer including, but not limited to horizontal or vertical MOSFETs, JFETs, horizontal and vertical junction-less transistors, RCATs, Spherical-RCATs, etc. The main difference is that now the donor wafer 3000 is pre-processed to build not just one transistor type but both types by comprising alternating rows throughout donor wafer 3000 for the build of rows of 'n' type transistors 3004 and rows of 'p' type transistors 3006 as illustrated in FIG. 30. FIG. 30 also includes a four cardinal directions indicator 3040, which will be used through FIG. 33 to assist the explanation. The width of the n-type rows 3004 is Wn and the width of the p-type rows 3006 is Wp and their sum W 3008 is the width of the repeating pattern. The rows traverse from East to West and the alternating repeats all the way from North to South. The donor wafer rows 3004 and 3006 may extend in length East to West by the acceptor die width plus the maximum donor wafer to acceptor wafer misalignment, or alternatively, may extend the entire length of a donor wafer East to West. In fact the wafer could be considered as divided into reticle projections which in most cases may contain a few dies per image or step field. In most cases, the scribe line designed for future dicing of the wafer to individual dies may be more than 20 microns wide. The wafer to wafer misalignment may be about 1 micron. Accordingly, extending patterns into the scribe line may allow full use of the patterns within the die boundaries with minimal effect on the dicing scribe lines. Wn and Wp could be set for the minimum width of the corresponding transistor plus its isolation in the selected process node. The wafer 3000 also has an alignment mark 3020 which is on the same layers of the donor wafer as the n 3004 and p 3006 rows and accordingly could be used later to properly align additional patterning and processing steps to said n 3004 and p 3006 rows.

The donor wafer 3000 will be placed on top of the main wafer 3100 for a layer transfer as described previously. The state of the art allows for very good angular alignment of this bonding step but it is difficult to achieve a better than approximately 1 μm position alignment.

Persons of ordinary skill in the art will appreciate that the directions North, South, East and West are used for illustrative purposes only, have no relationship to true geographic directions, that the North-South direction could become the East-West direction (and vice versa) by merely rotating the wafer 90° and that the rows of 'n' type transistors 3004 and rows of 'p' type transistors 3006 could also run North-South as a matter of design choice with corresponding adjustments to the rest of the fabrication process. Such skilled persons will further appreciate that the rows of 'n' type transistors 3004 and rows of 'p' type transistors 3006 can have many different organizations as a matter of design choice. For example, the rows of 'n' type transistors 3004 and rows of 'p' type transistors 3006 can each comprise a single row of transistors in parallel, multiple rows of transistors in parallel, multiple groups of transistors of different dimensions and orientations and types (either individually or in groups), and different ratios of transistor sizes or numbers between the rows of 'n' type transistors 3004 and rows of 'p' type transistors 3006, etc. Thus the scope of the invention is to be limited only by the appended claims.

Figure 31:
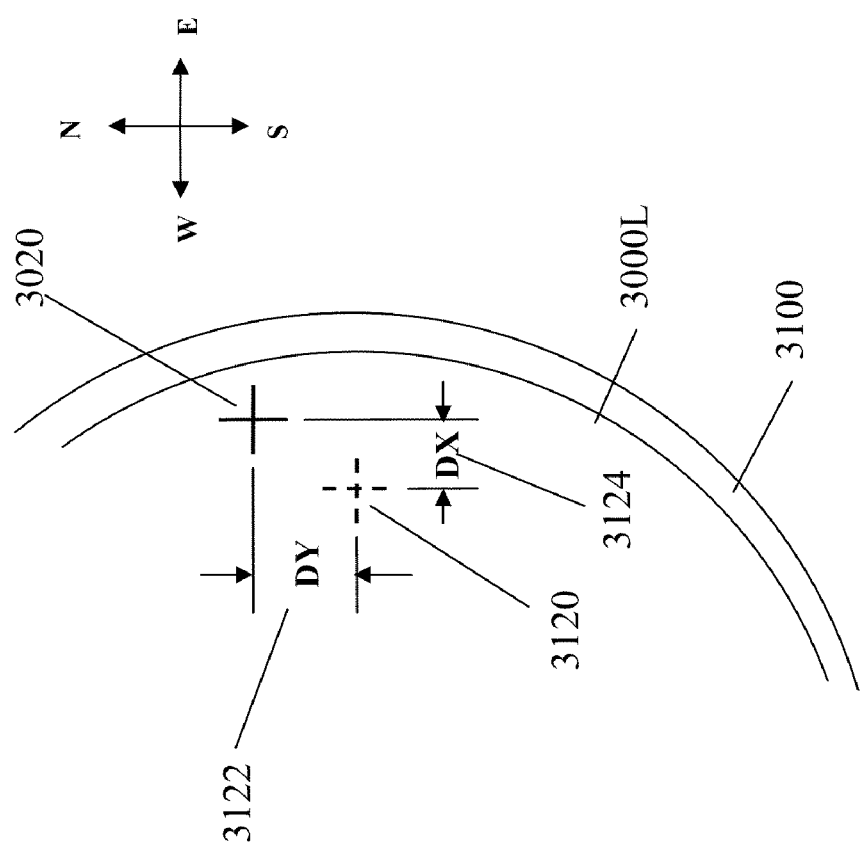
FIG. 31 is a drawing illustration of a transferred layer on top of a main wafer.

FIG. 31 illustrates the main wafer 3100 with its alignment mark 3120 and the transferred layer 3000L of the donor wafer 3000 with its alignment mark 3020. The misalignment in the East-West direction is DX 3124 and the misalignment in the North-South direction is DY 3122. For simplicity of the following explanations, the alignment marks 3120 and 3020 may be assumed set so that the alignment mark of the transferred layer 3020 is always north of the alignment mark of the base wafer 3120, though the cases where alignment mark 3020 is either perfectly aligned with (within tolerances) or south of alignment mark 3120 are handled in an appropriately similar manner. In addition, these alignment marks may be placed in only a few locations on each wafer, within each step field, within each die, within each repeating pattern W, or in other locations as a matter of design choice.

In the construction of this described monolithic 3D Integrated Circuits the objective is to connect structures built on layer 3000L to the underlying main wafer 3100 and to structures on 808 layers at about the same density and accuracy as the connections between layers in 808, which requires alignment accuracies on the order of tens of nm or better.

In the direction East-West the approach will be the same as was described before with respect to FIGS. 21 through 29. The pre-fabricated structures on the donor wafer 3000 are the same regardless of the misalignment DX 3124. Therefore just like before, the pre-fabricated structures may be aligned using the underlying alignment mark 3120 to form the transistors out of the rows of 'n' type transistors 3004 and rows of 'p' type transistors 3006 by etching and additional processes as described regardless of DX. In the North-South direction it is now different as the pattern does change. Yet the advantage of the proposed structure of the repeating pattern in the North-South direction of alternating rows illustrated in FIG. 30 arises from the fact that for every distance W 3008, the pattern repeats. Accordingly the effective alignment uncertainty may be reduced to W 3008 as the pattern in the North-South direction keeps repeating every W.

So the effective alignment uncertainty may be calculated as to how many Ws-full patterns of 'n' 3004 and 'p' 3006 row pairs would fit in DY 3122 and what would be the residue Rdy 3202 (remainder of DY modulo W, 0<=Rdy<W) as illustrated in FIG. 32. Accordingly, to properly align to the nearest n 3004 and p 3006 in the North-South direction, the alignment will be to the underlying alignment mark 3120 offset by Rdy 3202. Accordingly, the alignment may be done based on the misalignment between the alignment marks of the acceptor wafer alignment mark 3120 and the donor wafer alignment marks 3020 by taking into account the repeating distance W 3008 and calculating the resultant required of offset Rdy 3202. Alignment mark 3120, covered by the wafer 3000L during alignment, may be visible and usable to the stepper or lithographic tool alignment system when infra-red (IR) light and optics are being used.

Figure 69:
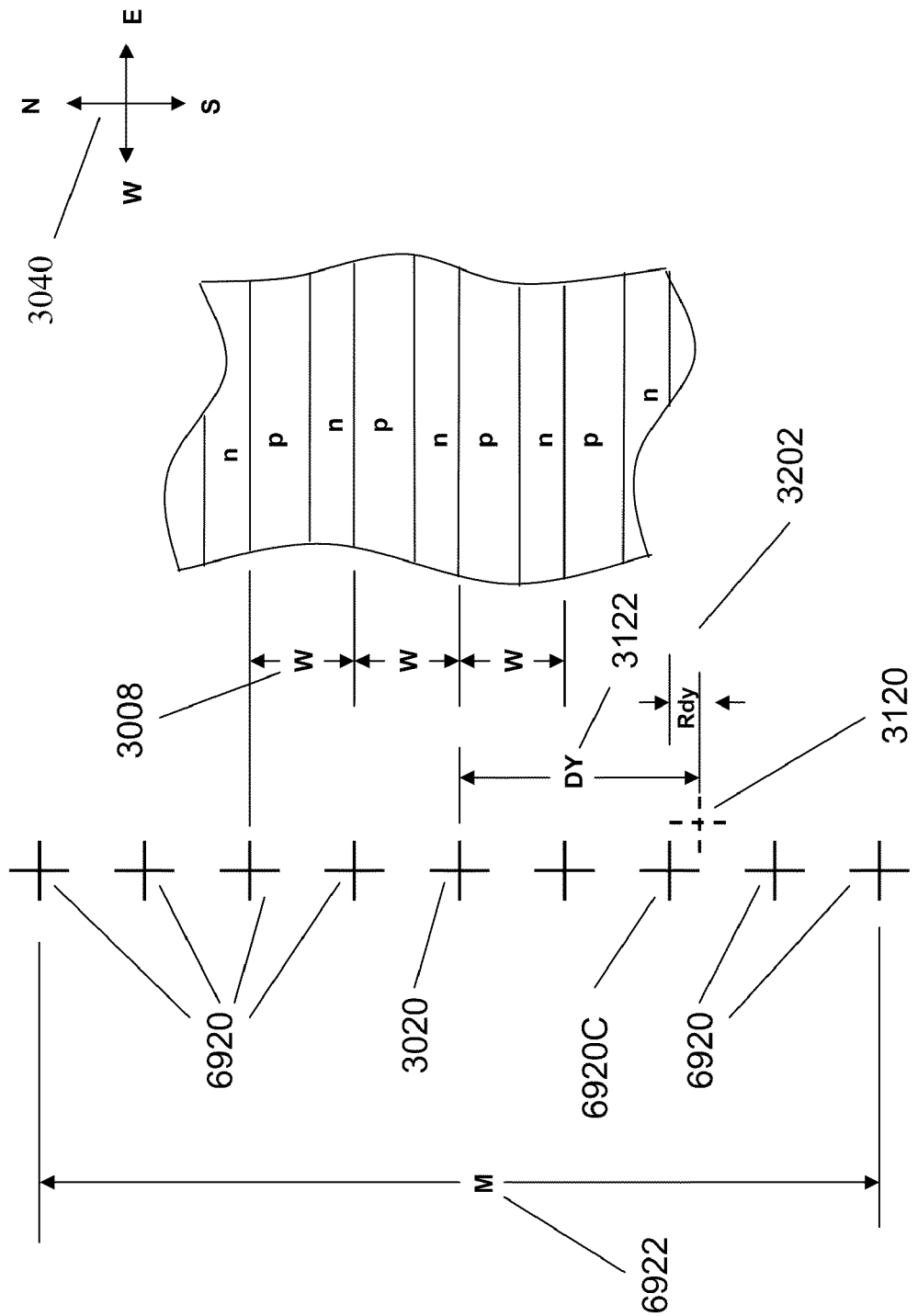
FIG. 69 is a drawing illustration of a donor wafer.

Alternatively, multiple alignment marks on the donor wafer could be used as illustrated in FIG. 69. The donor wafer alignment mark 3020 may be replicated precisely every W 6920 in the North to South direction for a distance to cover the full extent of potential North to South misalignment M 6922 between the donor wafer and the acceptor wafer. The residue Rdy 3202 may therefore be the North to South misalignment between the closest donor wafer alignment mark 6920C and the acceptor wafer alignment mark 3120. Accordingly, instead of alignment to the underlying alignment mark 3120 offset by Rdy 3202, alignment can be to the donor layer's closest alignment mark 6920C. Accordingly, the alignment may be done based on the misalignment between the alignment marks of the acceptor wafer alignment mark 3120 and the donor wafer alignment marks 6920 by choosing the closest alignment mark 6920C on the donor wafer.

The illustration in FIG. 69 was made to simplify the explanation, and in actual usage the alignment marks might take a larger area than W×W. In such a case, to avoid having the alignment marks 6920 overlapping each other, an offset could be used with proper marking to allow proper alignment.

Each wafer that will be processed accordingly through this flow will have a specific Rdy 3202 which will be subject to the actual misalignment DY 3122. But the masks used for patterning the various patterns need to be pre-designed and fabricated and remain the same for all wafers (processed for the same end-device) regardless of the actual misalignment. In order to improve the connection between structures on the transferred layer 3000L and the underlying main wafer 3100, the underlying wafer 3100 is designed to have a landing zone of a strip 33A04 going North-South of length W 3008 plus any extension required for the via design rules, as illustrated in FIG. 33A. The landing zone extension, in length or width, for via design rules may include compensation for angular misalignment due to the wafer to wafer bonding that is not compensated for by the stepper overlay algorithms, and may include uncompensated donor wafer bow and warp. The strip 33A04 may be part of the base wafer 3100 and accordingly aligned to its alignment mark 3120. Via 33A02 going down and being part of a top layer 3000L pattern (aligned to the underlying alignment mark 3120 with Rdy offset) will be connected to the landing zone 33A04.

Alternatively a North-South landing strip 33B04 with at least W length, plus extensions per the via design rules and other compensations described above, may be made on the upper layer 3000L and accordingly aligned to the underlying alignment mark 3120 with Rdy offset, thus connected to the via 33B02 coming 'up' and being part of the underlying pattern aligned to the underlying alignment mark 3120 (with no offset).

Figure 34A:
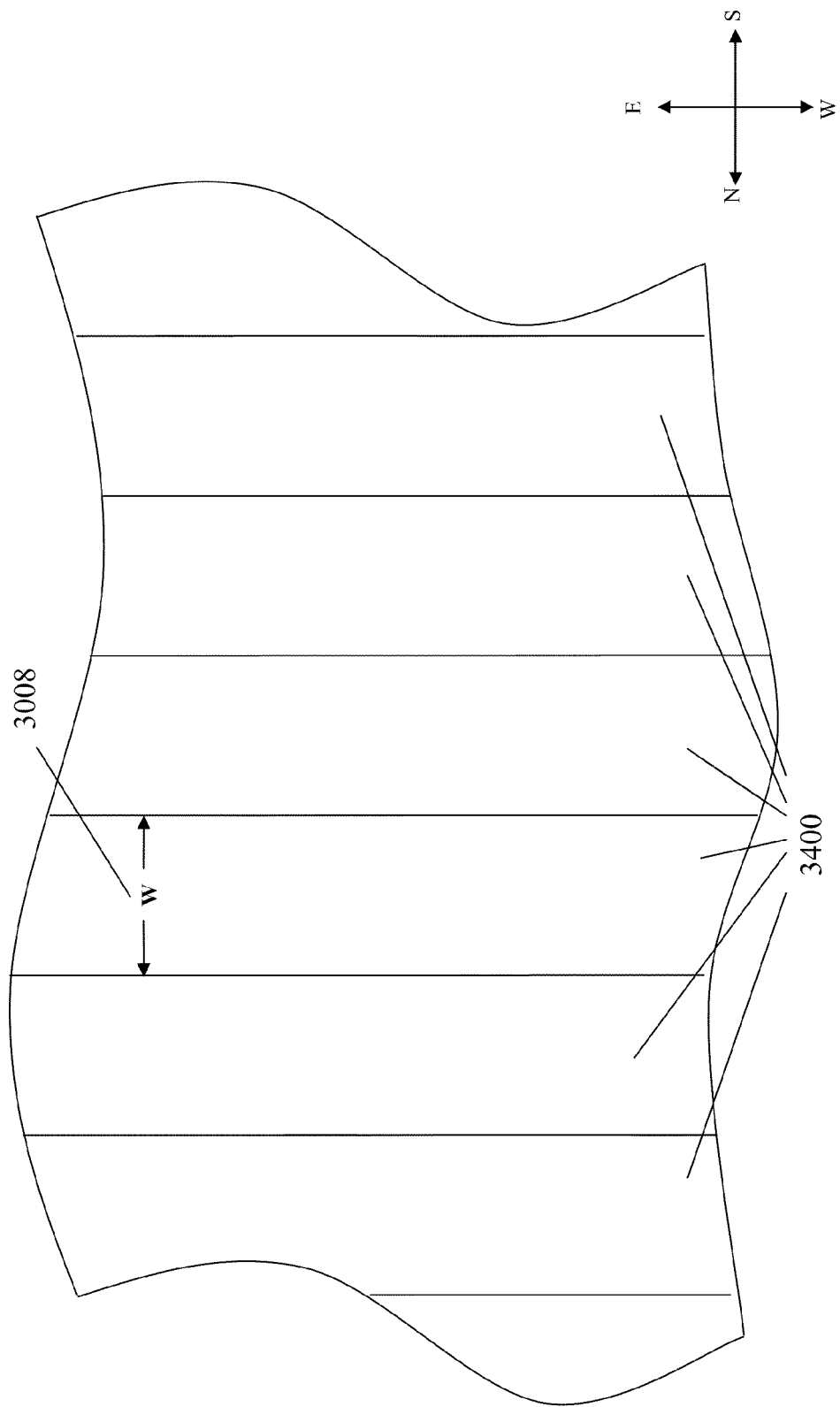

An example of a process flow to create complementary transistors on a single transferred layer for CMOS logic is as follows. First, a donor wafer may be preprocessed to be prepared for the layer transfer. This complementary donor wafer may be specifically processed to create repeating rows 3400 of p and n wells whereby their combined widths is W 3008 as illustrated in FIG. 34A. Repeating rows 3400 may be as long as an acceptor die width plus the maximum donor wafer to acceptor wafer misalignment, or alternatively, may extend the entire length of a donor wafer. FIG. 34A may be rotated 90 degrees with respect to FIG. 30 as indicated by the four cardinal directions indicator, to be in the same orientation as subsequent FIGS. 34B through 35G.

FIG. 34B is a cross-sectional drawing illustration of a pre-processed wafer used for a layer transfer. A P– wafer 3402 is processed to have a "buried" layer of N+ 3404 and of P+ 3406 by masking, ion implantation, and activation in repeated widths of W 3008.

This is followed by a P– epi growth (epitaxial growth) 3408 and a mask, ion implantation, and anneal of N– regions 3410 in FIG. 34C.

Next, a shallow P+ 3412 and N+ 3414 are formed by mask, shallow ion implantation, and RTA activation as shown in FIG. 34D.

Figure 34E:
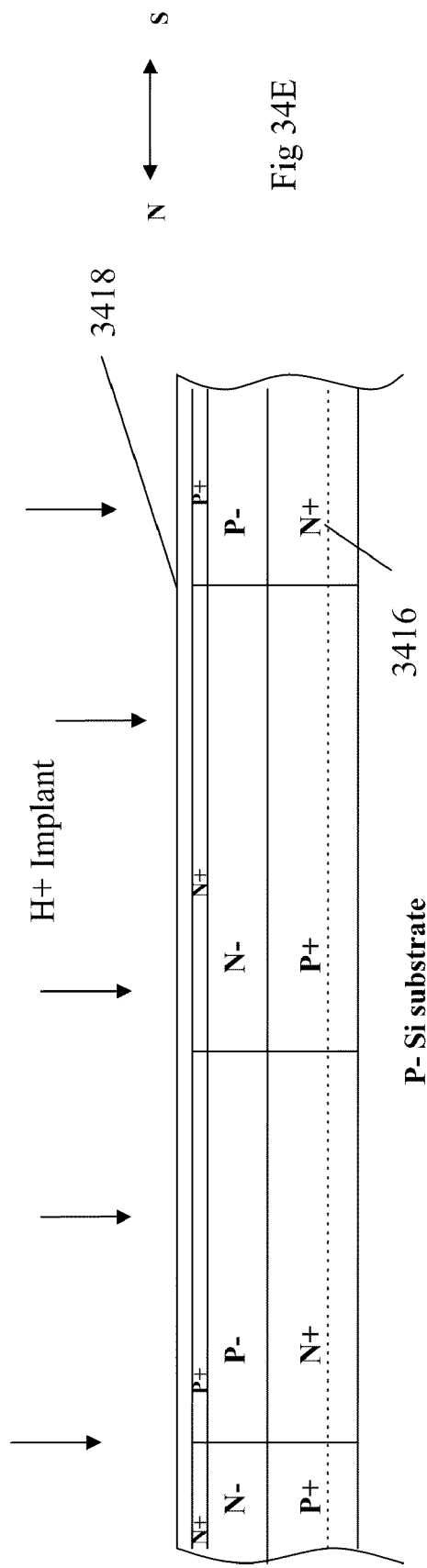

FIG. 34E is a drawing illustration of the pre-processed wafer for a layer transfer by an implant of an atomic species, such as H+, preparing the SmartCut "cleaving plane" 3416 in the lower part of the deep N+ & P+ regions. A thin layer of oxide 3418 may be deposited or grown to facilitate the oxide-oxide bonding to the layer 808. This oxide 3418 may be deposited or grown before the H+ implant, and may comprise differing thicknesses over the P+ 3412 and N+ 3414 regions so as to allow an even H+ implant range stopping to facilitate a level and continuous Smart Cut cleave plane 3416. Adjusting the depth of the H+ implant if needed could be achieved in other ways including different implant depth setting for the P+ 3412 and N+ 3414 regions.

Now a layer-transfer-flow is performed, as illustrated in FIG. 20, to transfer the pre-processed striped multi-well single crystal silicon wafer on top of 808 as shown in FIG. 35A. The cleaved surface 3502 may or may not be smoothed by a combination of CMP and chemical polish techniques.

A variation of the p & n well stripe donor wafer preprocessing above is to also preprocess the well isolations with shallow trench etching, dielectric fill, and CMP prior to the layer transfer.

The step by step low temperature formation side views of the planar CMOS transistors on the complementary donor wafer (FIG. 34) is illustrated in FIGS. 35A to 35G. FIG. 35A illustrates the layer transferred on top of wafer or layer 808 after the smart cut 3502 wherein the N+ 3404 & P+ 3406 are on top running in the East to West direction (i.e., perpendicular to the plane of the drawing) and repeating widths in the North to South direction as indicated by cardinal 3500.

Then the substrate P+ 35B06 and N+ 35B08 source and 808 metal layer 35B04 access openings, as well as the transistor isolation 35B02 are masked and etched in FIG. 35B. This and all subsequent masking layers are aligned as described and shown above in FIG. 30-32 and is illustrated in FIG. 35B where the layer alignment mark 3020 is aligned with offset Rdy to the base wafer layer 808 alignment mark 3120.

Utilizing an additional masking layer, the isolation region 35C02 is defined by etching all the way to the top of preprocessed wafer or layer 808 to provide full isolation between transistors or groups of transistors in FIG. 35C. Then a Low-Temperature Oxide 35C04 is deposited and chemically mechanically polished. Then a thin polish stop layer 35C06 such as low temperature silicon nitride is deposited resulting in the structure illustrated in FIG. 35C.

The n-channel source 35D02, drain 35D04 and self-aligned gate 35D06 are defined by masking and etching the thin polish stop layer 35C06 and then a sloped N+ etch as illustrated in FIG. 35D. The above is repeated on the P+ to form the p-channel source 35D08, drain 35D10 and self-aligned gate 35D12 to create the complementary devices and form Complimentary Metal Oxide Semiconductor (CMOS). Both sloped (35-90 degrees, 45 is shown) etches may be accomplished with wet chemistry or plasma etching techniques. This etch forms N+ angular source and drain extensions 35D12 and P+ angular source and drain extension 35D14.

FIG. 35E illustrates the structure following deposition and densification of a low temperature based Gate Dielectric 35E02, or alternately a low temperature microwave plasma oxidation of the silicon surfaces, to serve as the n & p MOSFET gate oxide, and then deposition of a gate material 35E04, such as aluminum or tungsten. Alternatively, a high-k metal gate structure may be formed as follows. Following an industry standard HF/SC1/SC2 clean to create an atomically smooth surface, a high-k dielectric 35E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of approximately 4.2 eV for the device to operate properly and at the right threshold voltage. Alternatively, a metal replacing $P^+$ poly as the gate electrode needs to have a work function of approximately 5.2 eV to operate properly. The TiAl and TiAlN based family of metals, for example, could be used to tune the work function of the metal from 4.2 eV to 5.2 eV. The gate oxides and gate metals may be different between the n and p channel devices, and is accomplished with selective removal of one type and replacement of the other type.

FIG. 35F illustrates the structure following a chemical mechanical polishing of the metal gate 35E04 utilizing the nitride polish stop layer 35C06. Finally a thick oxide 35G02 is deposited and contact openings are masked and etched preparing the transistors to be connected as illustrated in FIG. 35G. This figure also illustrates the layer transfer silicon via 35G04 masked and etched to provide interconnection of the top transistor wiring to the lower layer 808 interconnect wiring 35B04. This flow enables the formation of fully crystallized top CMOS transistors that could be connected to the underlying multi-metal layer semiconductor device without exposing the underlying devices and interconnects metals to high temperature. These transistors could be used as programming transistors of the antifuse on layer 807 or for other functions such as logic or memory in a 3D integrated circuit that may be electrically coupled to metal layers in preprocessed wafer or layer 808. An additional advantage of this flow is that the SmartCut H+, or other atomic species, implant step is done prior to the formation of the MOS transistor gates avoiding potential damage to the gate function.

Persons of ordinary skill in the art will appreciate that while the transistors fabricated in FIGS. 34A through 35G are shown with their conductive channels oriented in a north-south direction and their gate electrodes oriented in an east-west direction for clarity in explaining the simultaneous fabrication of P-channel and N-channel transistors, that other orientations and organizations are possible. Such skilled persons will further appreciate that the transistors may be rotated 90° with their gate electrodes oriented in a north-south direction. For example, it will be evident to such skilled persons that transistors aligned with each other along an east-west row can either be electrically isolated from each other with Low-Temperature Oxide 35C04 or share source and drain regions and contacts as a matter of design choice. Such skilled persons will also realize that rows of 'n' type transistors 3004 may contain multiple N-channel transistors aligned in a north-south direction and rows of 'p' type transistors 3006 may contain multiple P-channel transistors aligned in a north-south direction, specifically to form back-to-back sub-rows of P-channel and N-channel transistors for efficient logic layouts in which adjacent sub-rows of the same type share power supply lines and connections. Many other design choices are possible within the scope of the invention and will suggest themselves to such skilled persons, thus the invention is to be limited only by the appended claims.

An alternative method whereby to build both 'n' type and 'p' type transistors on the same layer may be to partially process the first phase of transistor formation on the donor wafer with normal CMOS processing including a 'dummy gate', a process known as gate-last transistors. In this embodiment of the invention, a layer transfer of the monocrystalline silicon may be performed after the dummy gate is completed and before the formation of a replacement gate. Processing prior to layer transfer may have no temperature restrictions and the processing during and after layer transfer may be limited to low temperatures, generally, for example, below 400° C. The dummy gate and the replacement gate may include various materials such as silicon and silicon dioxide, or metal and low k materials such as TiAlN and HfO2. An example may be the high-k metal gate (HKMG) CMOS transistors that have been developed for the 45 nm, 32 nm, 22 nm, and future CMOS generations. Intel and TSMC have shown the advantages of a 'gate-last' approach to construct high performance HKMG CMOS transistors (C, Auth et al., VLSI 2008, pp 128-129 and C. H. Jan et al, 2009 IEDM p. 647).

Figures 1, 70B:
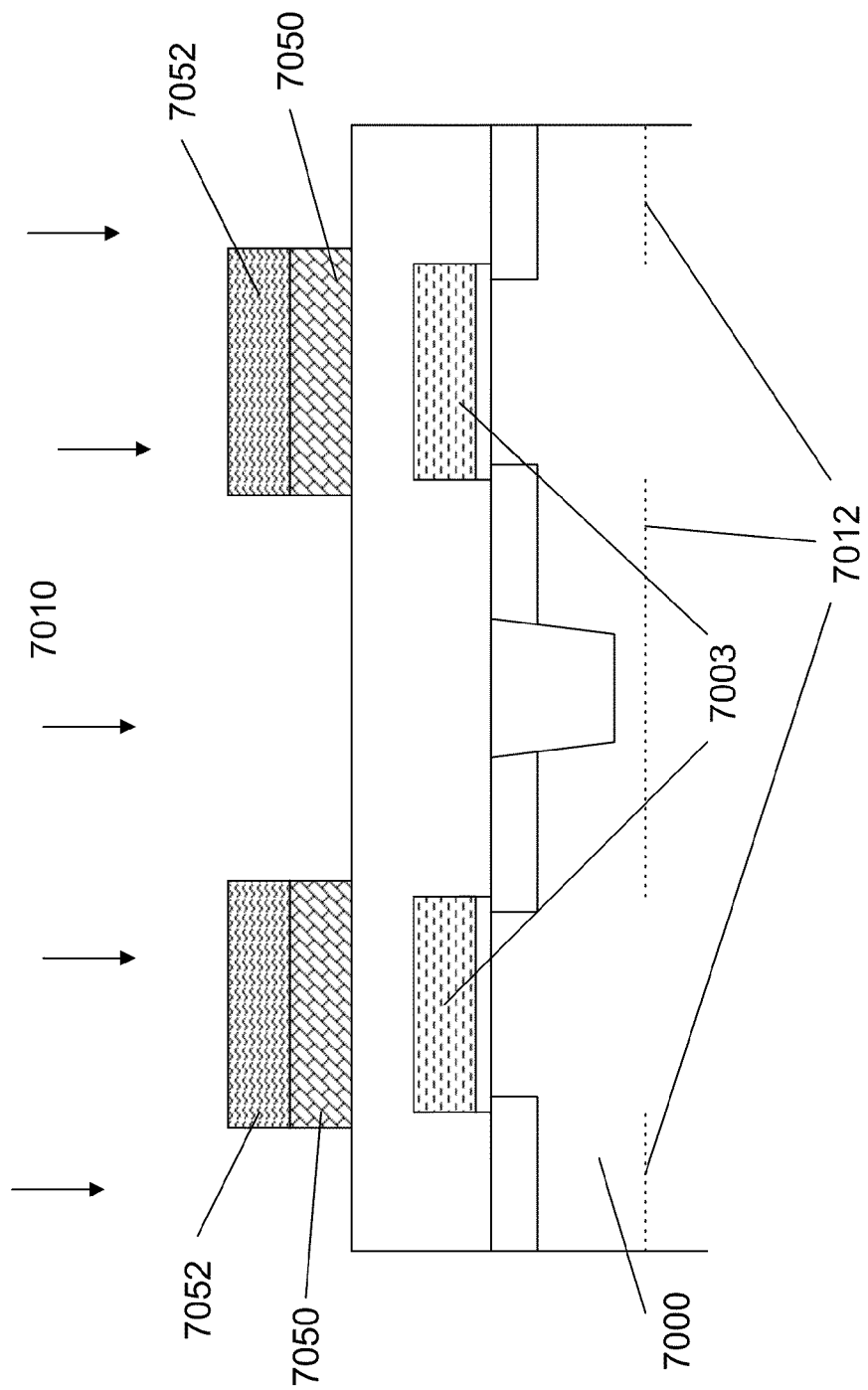

As illustrated in FIG. 70A, a bulk silicon donor wafer 7000 may be processed in the normal state of the art HKMG gate-last manner up to the step prior to where CMP exposure of the polysilicon dummy gates takes place. FIG. 70A illustrates a cross section of the bulk silicon donor wafer 7000, the isolation 7002 between transistors, the polysilicon 7004 and gate oxide 7005 of both n-type and p-type CMOS dummy gates, their associated source and drains 7006 for NMOS and 7007 for PMOS, and the interlayer dielectric (ILD) 7008. These structures of FIG. 70A illustrate completion of the first phase of transistor formation. At this step, or alternatively just after a CMP of layer 7008 to expose the polysilicon dummy gates or to planarize the oxide layer 7008 and not expose the dummy gates, an implant of an atomic species 7010, such as, for example, H+, may prepare the cleaving plane 7012 in the bulk of the donor substrate for layer transfer suitability, as illustrated in FIG. 70B.

Figure 70C:
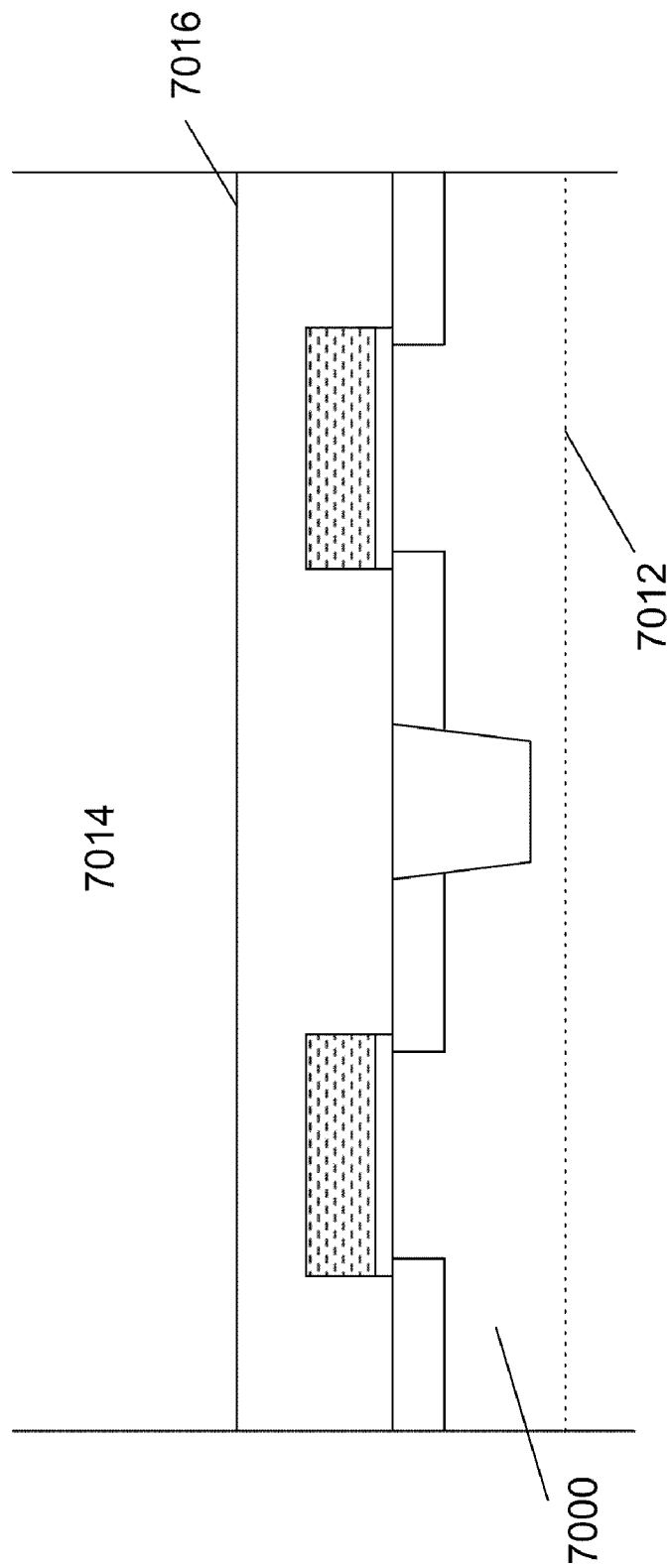
FIG. 70 A, B, B-1, and C-H are drawing illustrations of formation of top planar transistors.

The donor wafer 7000 may be now temporarily bonded to carrier substrate 7014 at interface 7016 as illustrated in FIG. 70C with a low temperature process that may facilitate a low temperature release. The carrier substrate 7014 may be a glass substrate to enable state of the art optical alignment with the acceptor wafer. A temporary bond between the carrier substrate 7014 and the donor wafer 7000 at interface 7016 may be made with a polymeric material, such as polyimide DuPont HD3007, which can be released at a later step by laser ablation, Ultra-Violet radiation exposure, or thermal decomposition. Alternatively, a temporary bond may be made with unipolar or bi-polar electrostatic technology such as, for example, the Apache tool from Beam Services Inc.

Figure 70D:
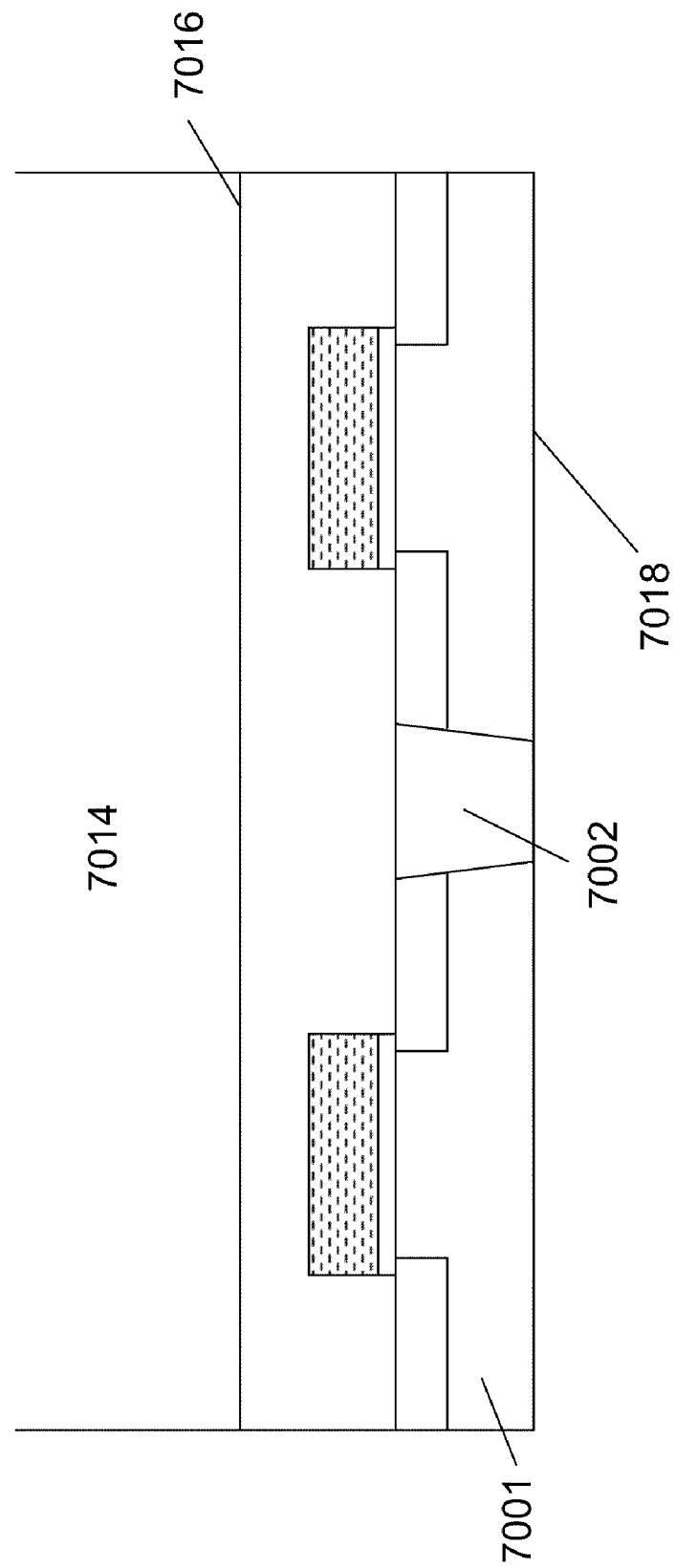

The donor wafer 7000 may then be cleaved at the cleaving plane 7012 and may be thinned by chemical mechanical polishing (CMP) so that the transistor isolation 7002 may be exposed at the donor wafer face 7018 as illustrated in FIG. 70D. Alternatively, the CMP could continue to the bottom of the junctions to create a fully depleted SOI layer.

Figure 70E:
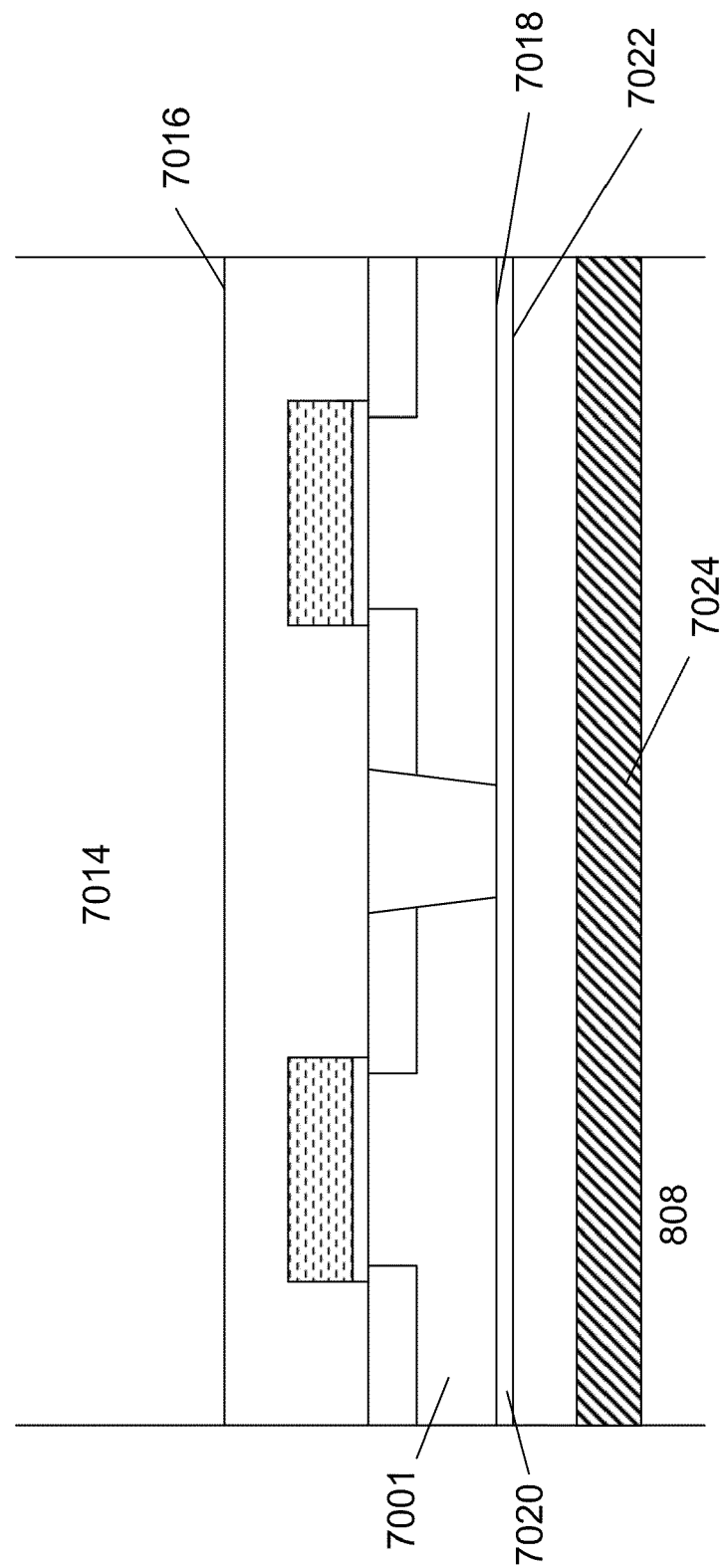

As shown in FIG. 70E, the thin monocrystalline donor layer face 7018 may be prepared for layer transfer by a low temperature oxidation or deposition of an oxide 7020, and plasma or other surface treatments to prepare the oxide surface 7022 for wafer oxide-to-oxide bonding. Similar surface preparation may be performed on the 808 acceptor wafer in preparation for oxide-to-oxide bonding.

A low temperature (for example, less than 400° C.) layer transfer flow may be performed, as illustrated in FIG. 70E, to transfer the thinned and first phase of transistor formation pre-processed HKMG silicon layer 7001 with attached carrier substrate 7014 to the acceptor wafer 808 with a top metallization comprising metal strips 7024 to act as landing pads for connection between the circuits formed on the transferred layer with the underlying circuits—layers 808.

Figure 70F:
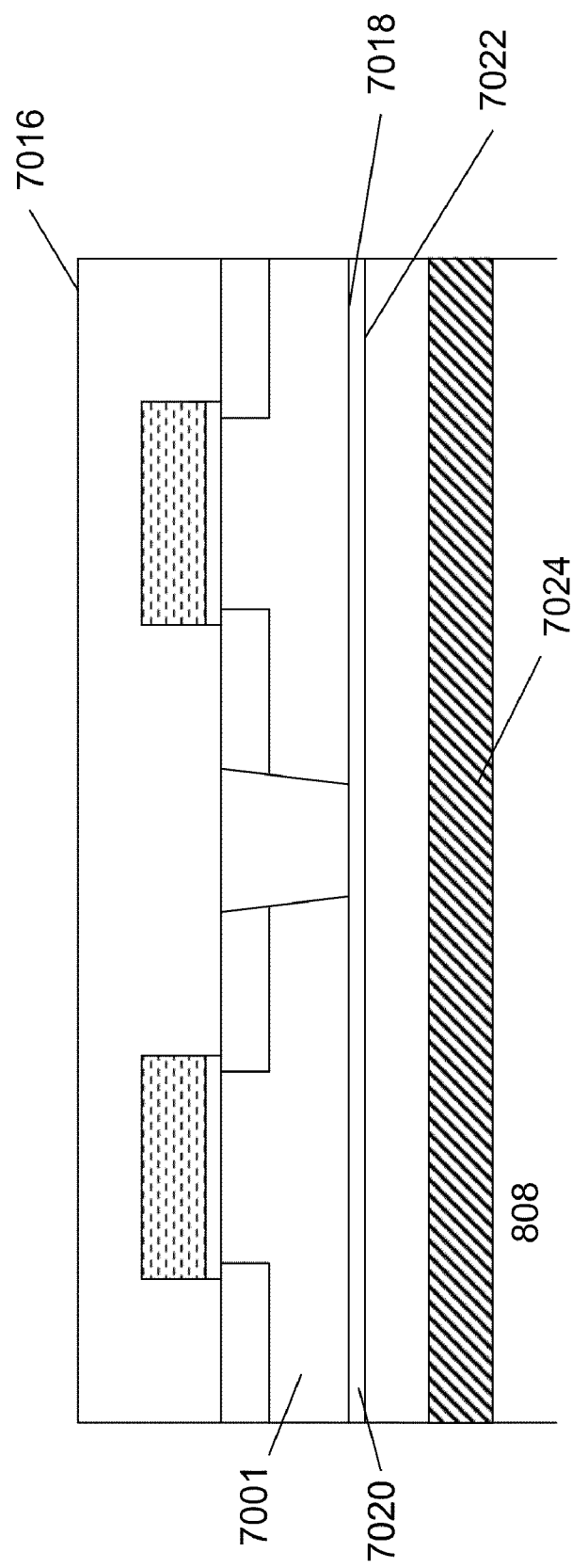

As illustrated in FIG. 70F, the carrier substrate 7014 may then be released using a low temperature process such as laser ablation.

Figure 70G:
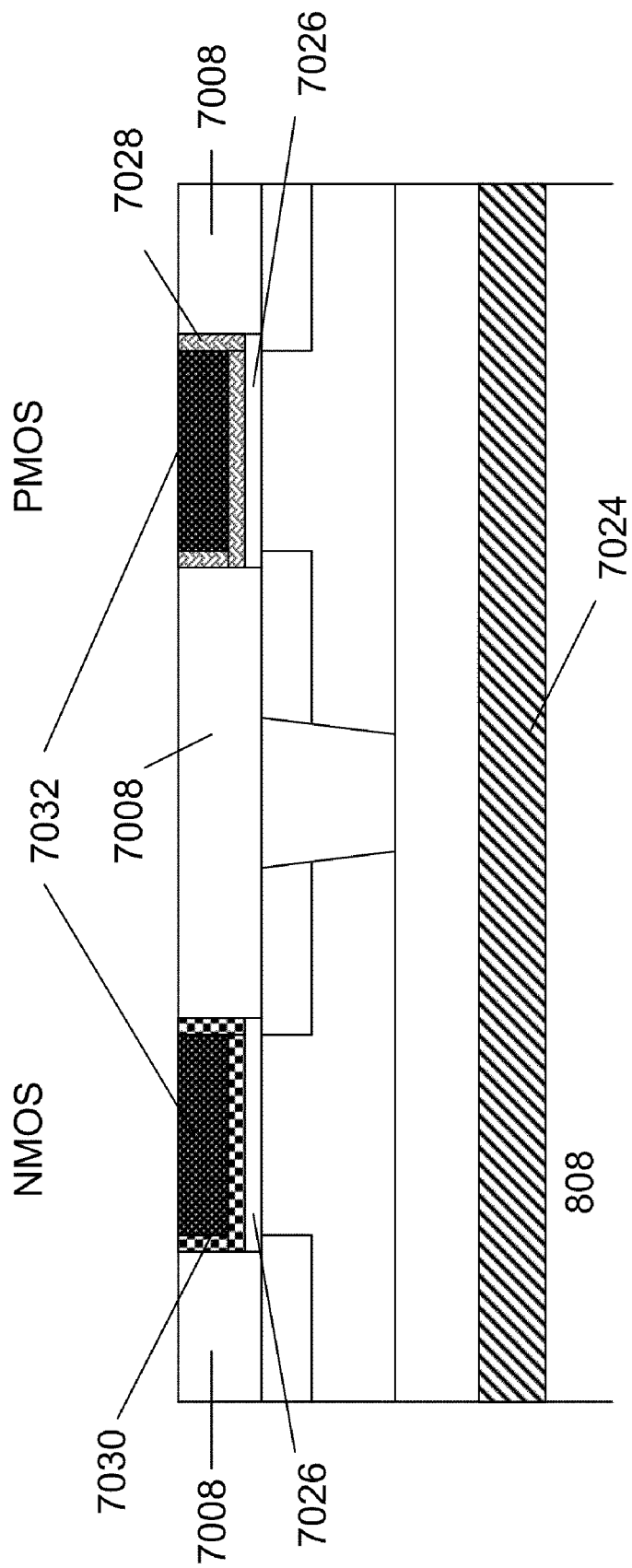

The bonded combination of acceptor wafer 808 and HKMG transistor silicon layer 7001 may now be ready for normal state of the art gate-last transistor formation completion. As illustrated in FIG. 70G, the inter layer dielectric 7008 may be chemical mechanically polished to expose the top of the polysilicon dummy gates. The dummy polysilicon gates may then be removed by etching and the hi-k gate dielectric 7026 and the PMOS specific work function metal gate 7028 may be deposited. The PMOS work function metal gate may be removed from the NMOS transistors and the NMOS specific work function metal gate 7030 may be deposited. An aluminum fill 7032 may be performed on both NMOS and PMOS gates and the metal CMP'ed.

Figure 70H:
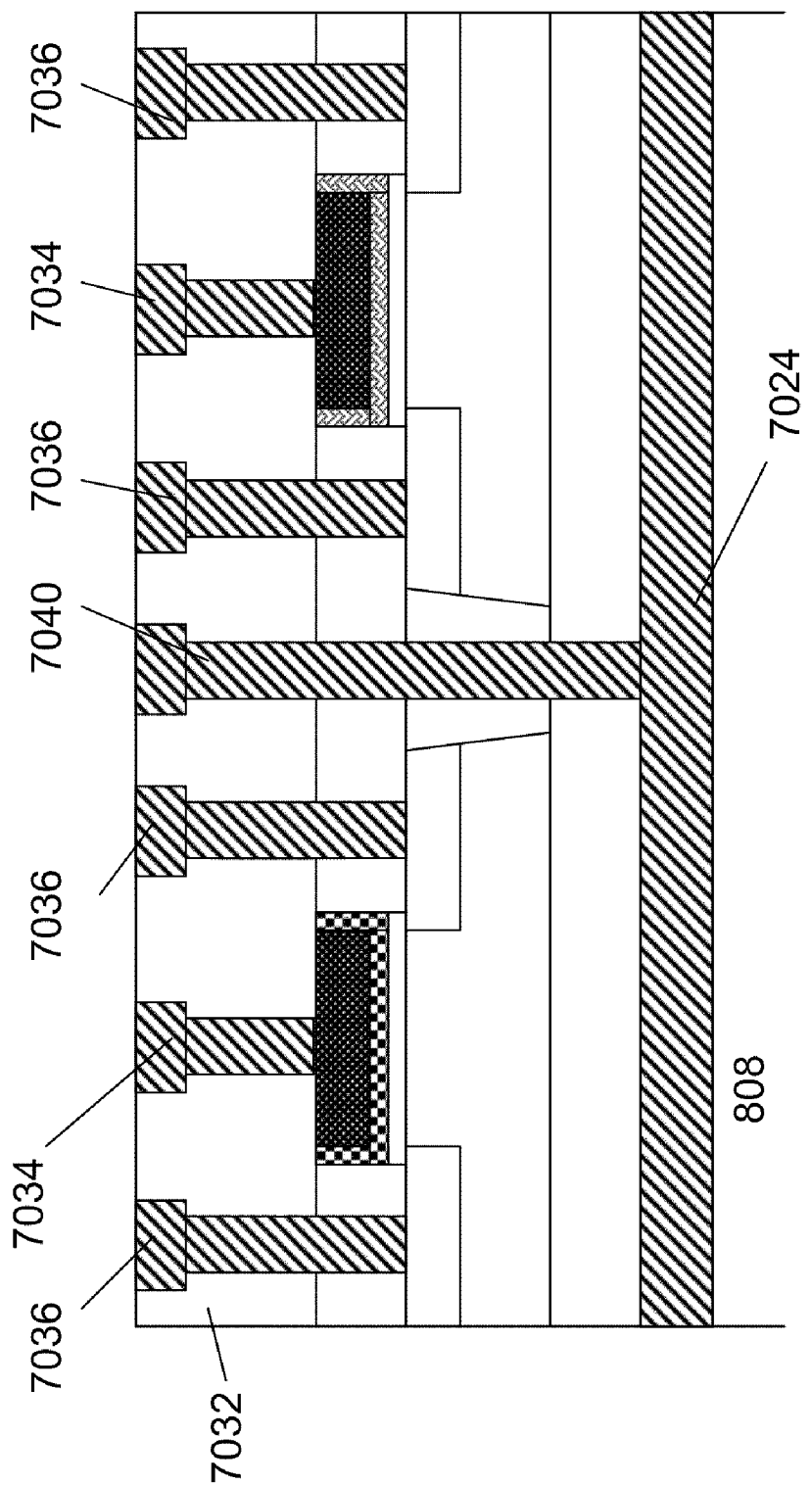

As illustrated in FIG. 70H, a dielectric layer 7032 may be deposited and the normal gate 7034 and source/drain 7036 contact formation and metallization may now be performed to connect the transistors on that monocrystalline layer and to connect to the acceptor wafer 808 top metallization strip 7024 with through via 7040 providing connection through the transferred layer from the donor wafer to the acceptor wafer. The top metal layer may be formed to act as the acceptor wafer landing strips for a repeat of the above process flow to stack another preprocessed thin monocrystalline layer of two-phase formed transistors. The above process flow may also be utilized to construct gates of other types, such as, for example, doped polysilicon on thermal oxide, doped polysilicon on oxynitride, or other metal gate configurations, as 'dummy gates,' perform a layer transfer of the thin monocrystalline layer, replace the gate electrode and gate oxide, and then proceed with low temperature interconnect processing.

Alternatively, the carrier substrate 7014 may be a silicon wafer, and infra red light and optics could be utilized for alignments. FIGS. 82A-G are used to illustrate the use of a carrier wafer. FIG. 82A illustrates the first step of preparing transistors with dummy gates 8202 on first donor wafer 8206. The first step may complete the first phase of transistor formation.

FIG. 82B illustrates forming a cleave line 8208 by implant 8216 of atomic particles such as H+.

FIG. 82C illustrates permanently bonding the first donor wafer 8206 to a second donor wafer 8226. The permanent bonding may be oxide-to-oxide wafer bonding as described previously.

FIG. 82D illustrates the second donor wafer 8226 acting as a carrier wafer after cleaving the first donor wafer off; leaving a thin layer 8206 with the now buried dummy gate transistors 8202.

FIG. 82E illustrates forming a second cleave line 8218 in the second donor wafer 8226 by implant 8246 of atomic species such as, for example, H+.

FIG. 82F illustrates the second layer transfer step to bring the dummy gate transistors 8202 ready to be permanently bonded to the house 808. For simplicity of the explanation, the steps of surface layer preparation done for each of these bonding steps have been left out.

FIG. 82G illustrates the house 808 with the dummy gate transistor 8202 on top after cleaving off the second donor wafer and removing the layers on top of the dummy gate transistors. Now the flow may proceed to replace the dummy gates with the final gates, form the metal interconnection layers, and continue the 3D fabrication process.

An interesting alternative is available when using the carrier wafer flow. In this flow we can use the two sides of the transferred layer to build NMOS on one side and PMOS on the other side. Timing properly the replacement gate step in such a flow could enable full performance transistors properly aligned to each other. Compact 3D library cells may be constructed from this process flow.

Figure 83A:
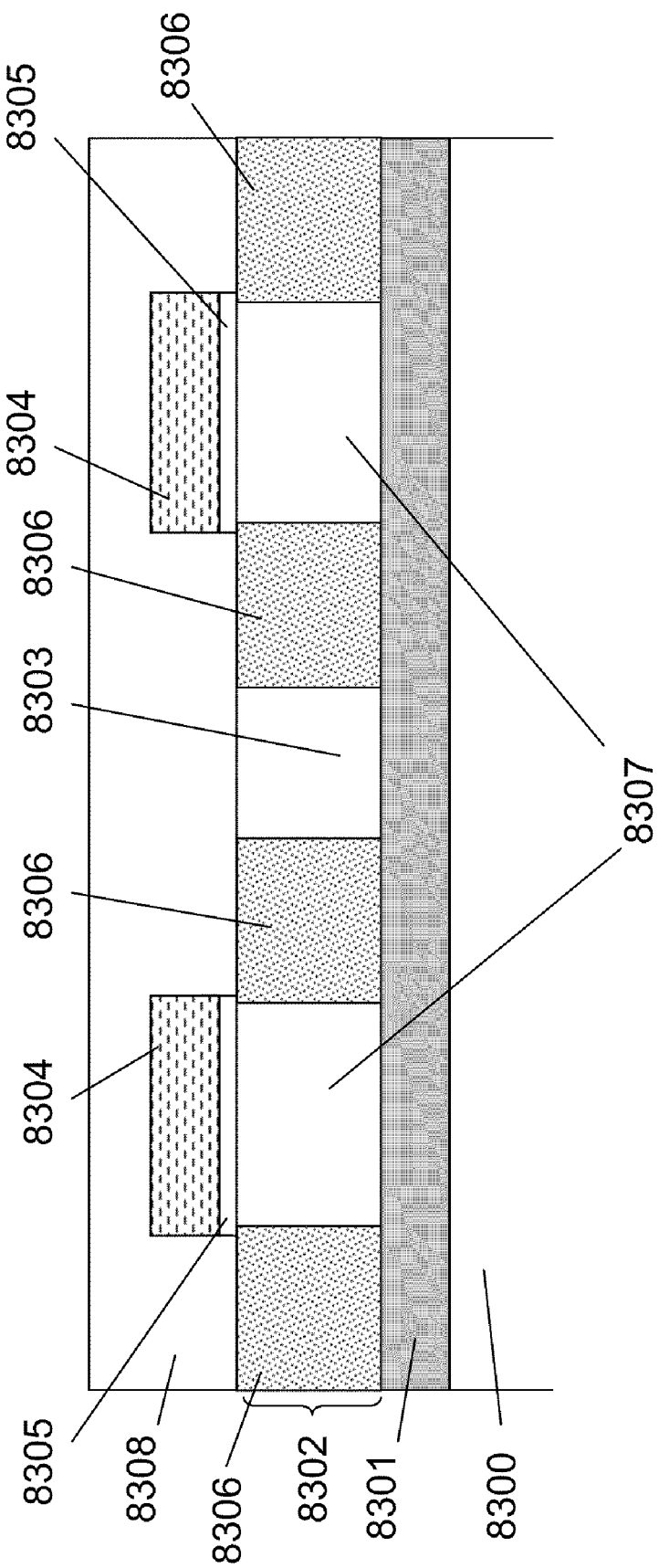
FIG. 83 A-L are drawing illustrations of a formation of top planar transistors.

As illustrated in FIG. 83A, an SOI (Silicon On Insulator) donor wafer 8300 may be processed according to normal state of the art using, e.g., a HKMG gate-last process, with adjusted thermal cycles to compensate for later thermal processing, up to the step prior to where CMP exposure of the polysilicon dummy gates takes place. Alternatively, the donor wafer 8300 may start as a bulk silicon wafer and utilize an oxygen implantation and thermal anneal to form a buried oxide layer, such as the SIMOX process (i.e., separation by implantation of oxygen). FIG. 83A illustrates a cross section of the SOI donor wafer substrate 8300, the buried oxide (i.e., BOX) 8301, the thin silicon layer 8302 of the SOI wafer, the isolation 8303 between transistors, the polysilicon 8304 and gate oxide 8305 of n-type CMOS dummy gates, their associated source and drains 8306 for NMOS, the NMOS transistor channel 8307, and the NMOS interlayer dielectric (ILD) 8308. Alternatively, PMOS devices or full CMOS devices may be constructed at this stage. This stage may complete the first phase of transistor formation.

At this step, or alternatively just after a CMP of layer 8308 to expose the polysilicon dummy gates or to planarize the oxide layer 8308 and not expose the dummy gates, an implant of an atomic species 8310, such as, for example, H+, may prepare the cleaving plane 8312 in the bulk of the donor substrate for layer transfer suitability, as illustrated in FIG. 83B.

Figure 83C:
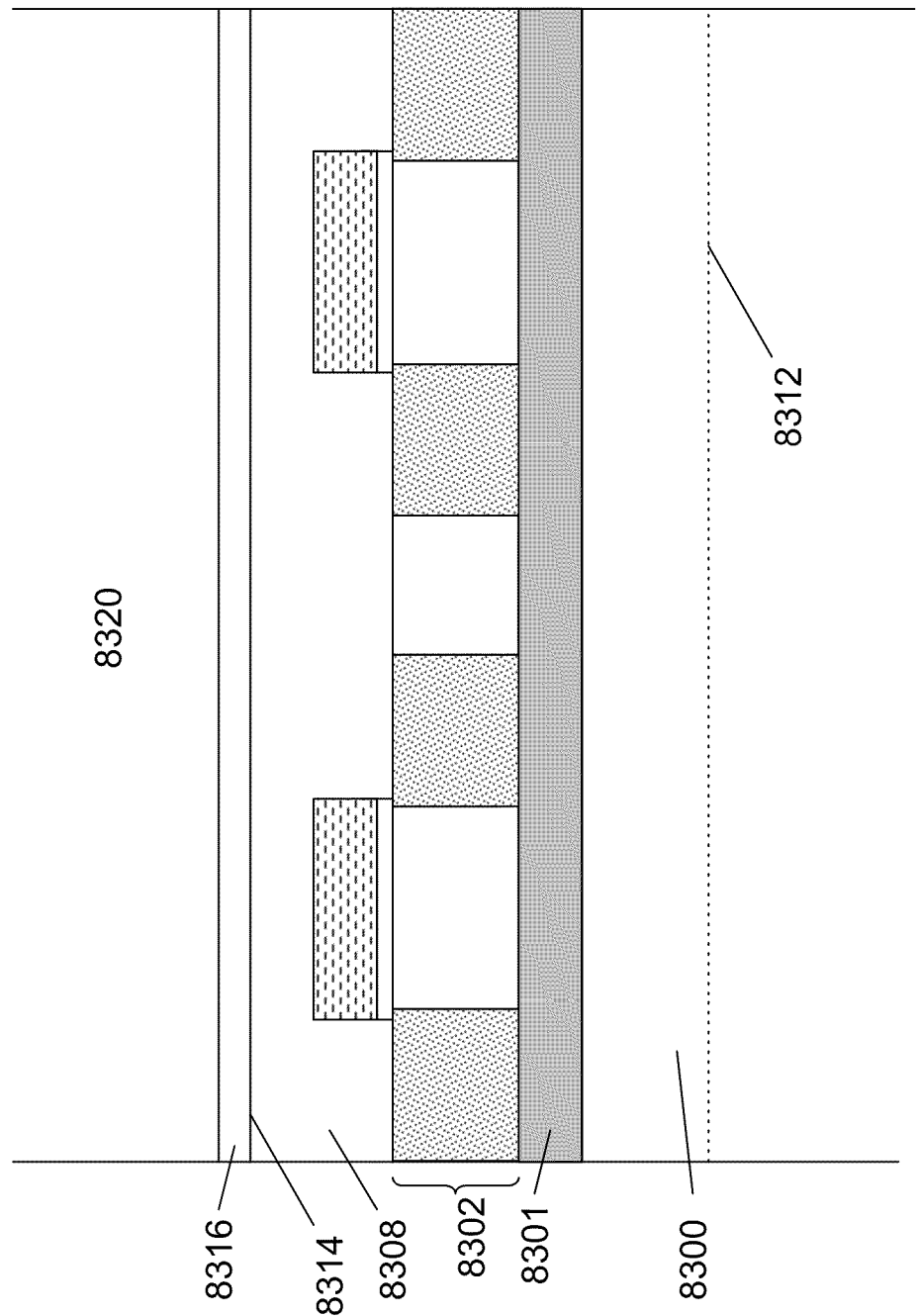

The SOI donor wafer 8300 may now be permanently bonded to a carrier wafer 8320 that has been prepared with an oxide layer 8316 for oxide-to-oxide bonding to the donor wafer surface 8314 as illustrated in FIG. 83C.

As illustrated in FIG. 83D, the donor wafer 8300 may then be cleaved at the cleaving plane 8312 and may be thinned by chemical mechanical polishing (CMP) and surface 8322 may be prepared for transistor formation.

Figure 83E:
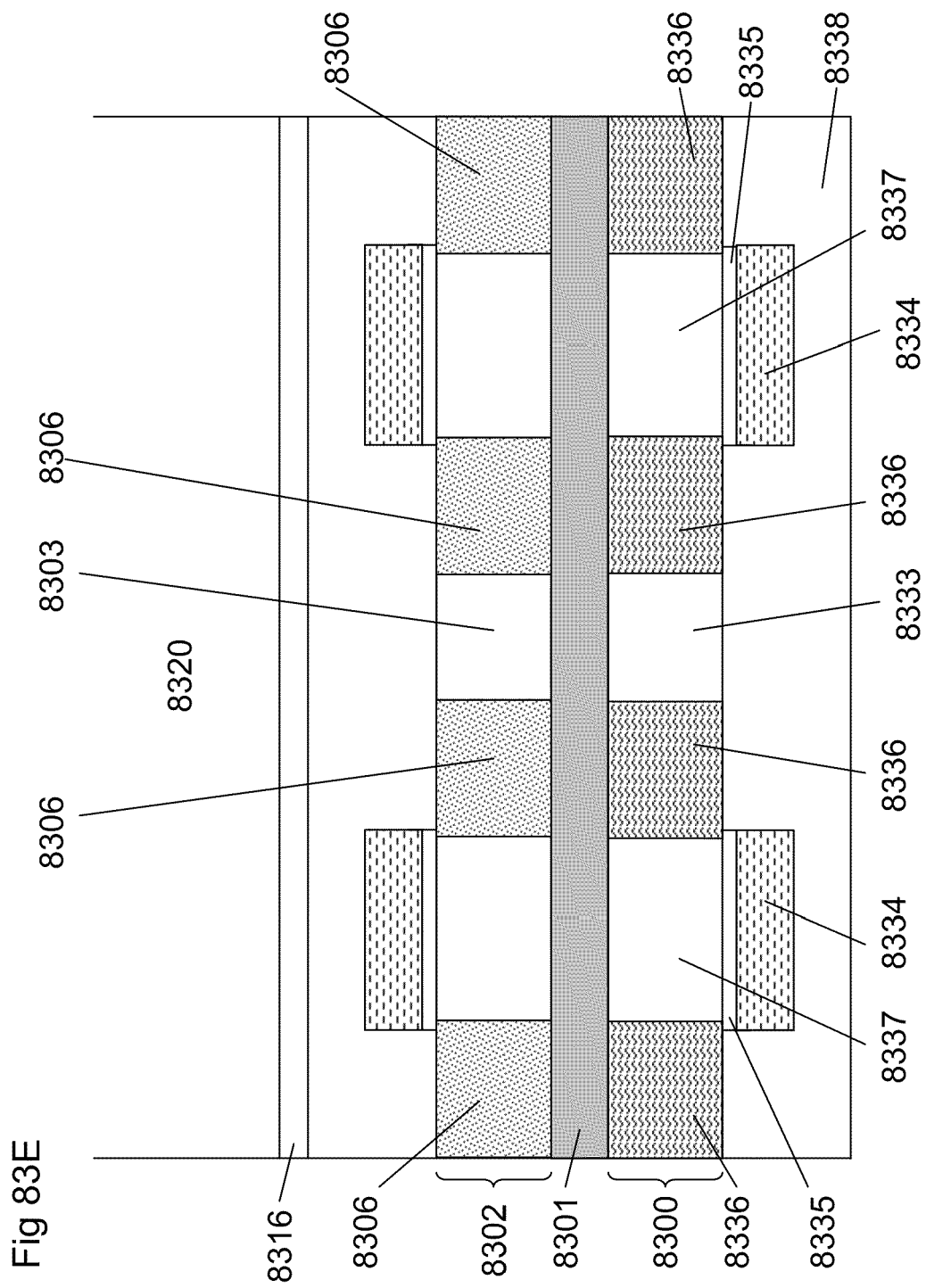

The donor wafer layer 8300 at surface 8322 may be processed in the normal state of the art gate last processing to form the PMOS transistors with dummy gates. FIG. 83E illustrates the cross section after the PMOS devices are formed showing the buried oxide (BOX) 8301, the now thin silicon layer 8300 of the SOI substrate, the isolation 8333 between transistors, the polysilicon 8334 and gate oxide 8335 of p-type CMOS dummy gates, their associated source and drains 8336 for PMOS, the PMOS transistor channel 8337, and the PMOS interlayer dielectric (ILD) 8338. The PMOS transistors may be precisely aligned at state of the art tolerances to the NMOS transistors due to the shared substrate 8300 possessing the same alignment marks. At this step, or alternatively just after a CMP of layer 8338, the processing flow may proceed to expose the PMOS polysilicon dummy gates or to planarize the oxide layer 8338 and not expose the dummy gates. Now the wafer could be put into a high temperature anneal to activate both the NMOS and the PMOS transistors.

Figure 83F:
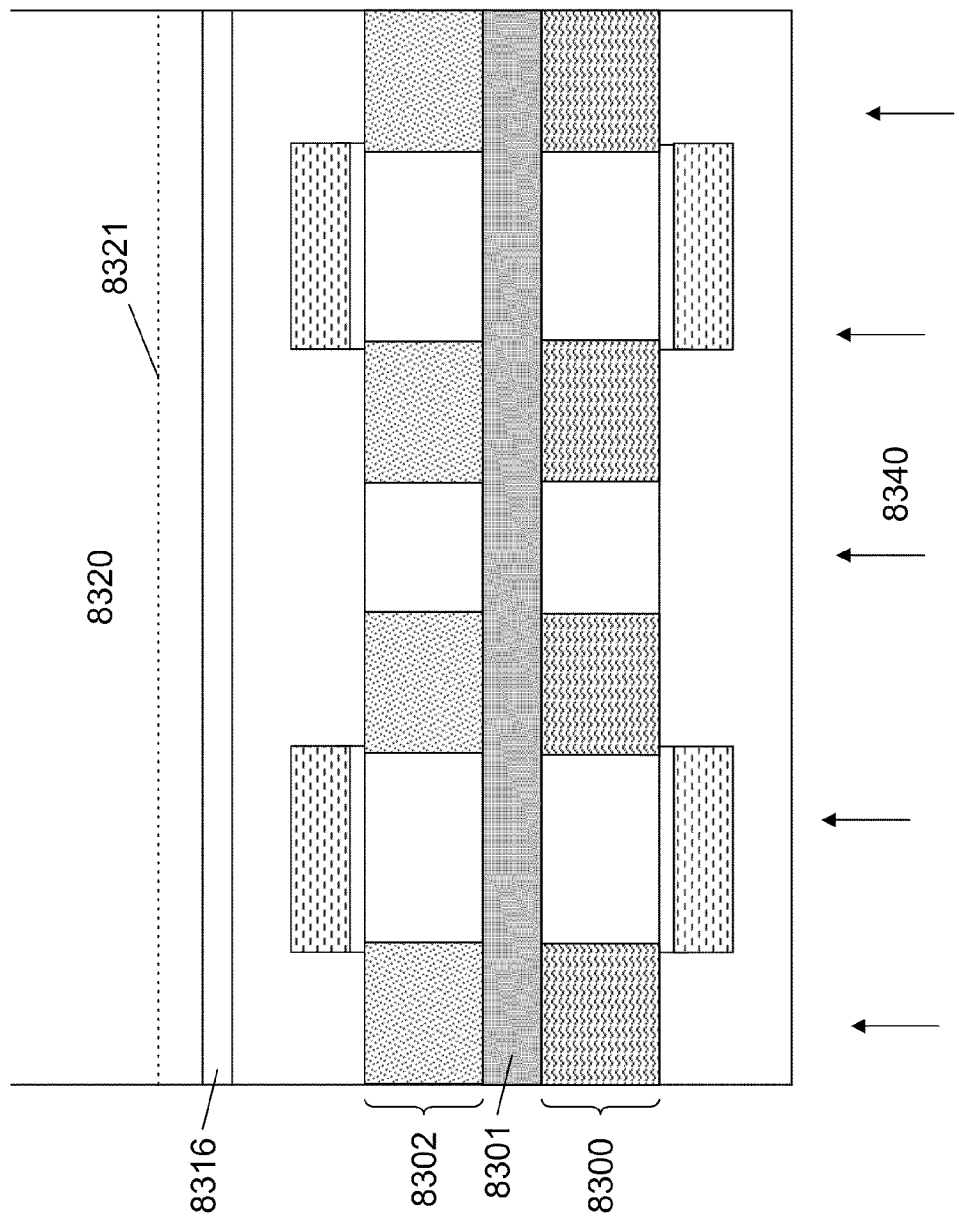

Then an implant of an atomic species 8340, such as, for example, H+, may prepare the cleaving plane 8321 in the bulk of the carrier wafer substrate 8320 for layer transfer suitability, as illustrated in FIG. 83F.

Figure 83G:
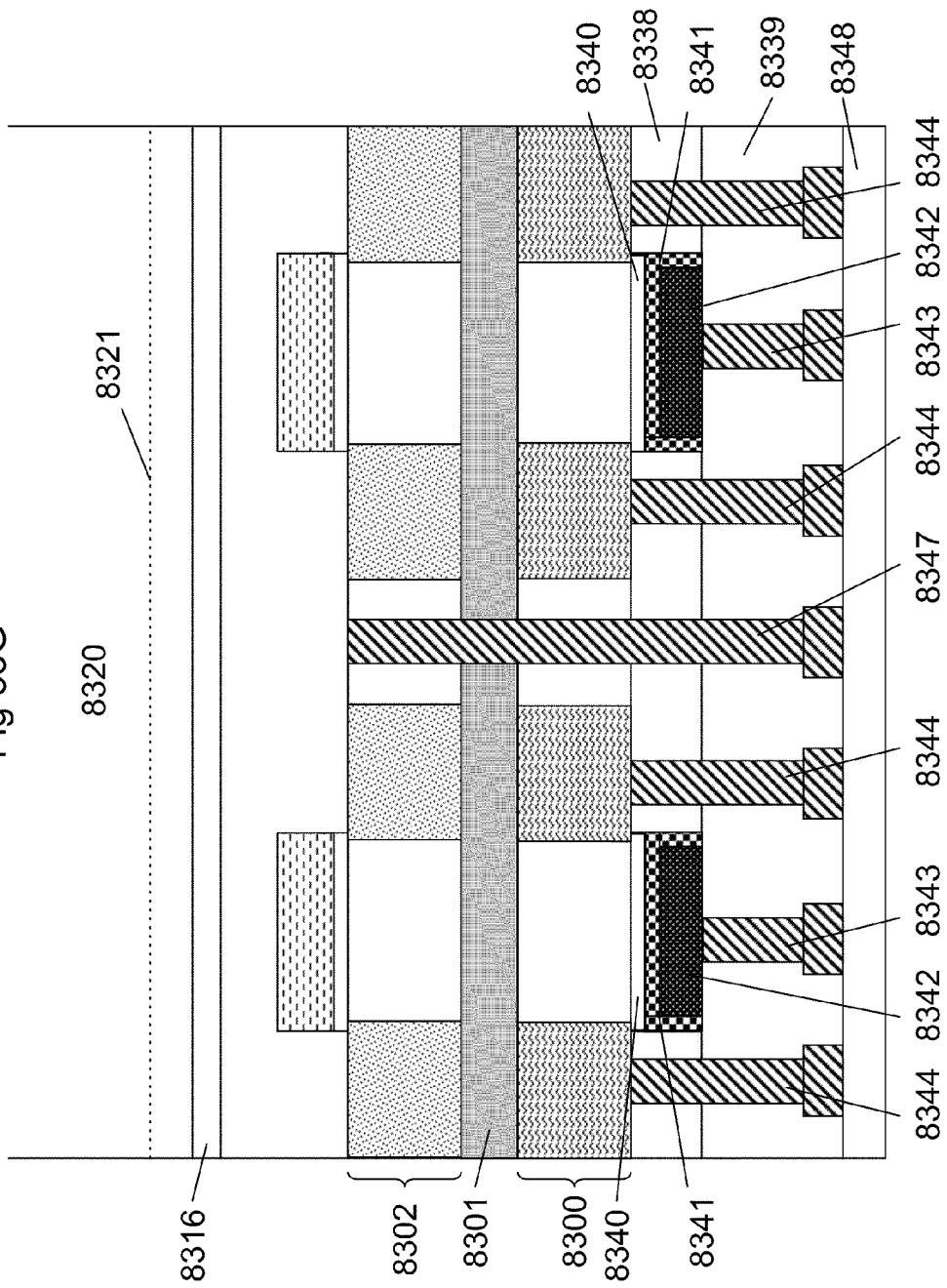

The PMOS transistors may now be ready for normal state of the art gate-last transistor formation completion. As illustrated in FIG. 83G, the inter layer dielectric 8338 may be chemical mechanically polished to expose the top of the polysilicon dummy gates. The dummy polysilicon gates may then be removed by etch and the PMOS hi-k gate dielectric 8340 and the PMOS specific work function metal gate 8341 may be deposited. An aluminum fill 8342 may be performed on the PMOS gates and the metal CMP'ed. A dielectric layer 8339 may be deposited and the normal gate 8343 and source/drain 8344 contact formation and metallization. The PMOS layer to NMOS layer via 8347 and metallization may be partially formed as illustrated in FIG. 83G and an oxide layer 8348 may be deposited to prepare for bonding.

Figure 83H:
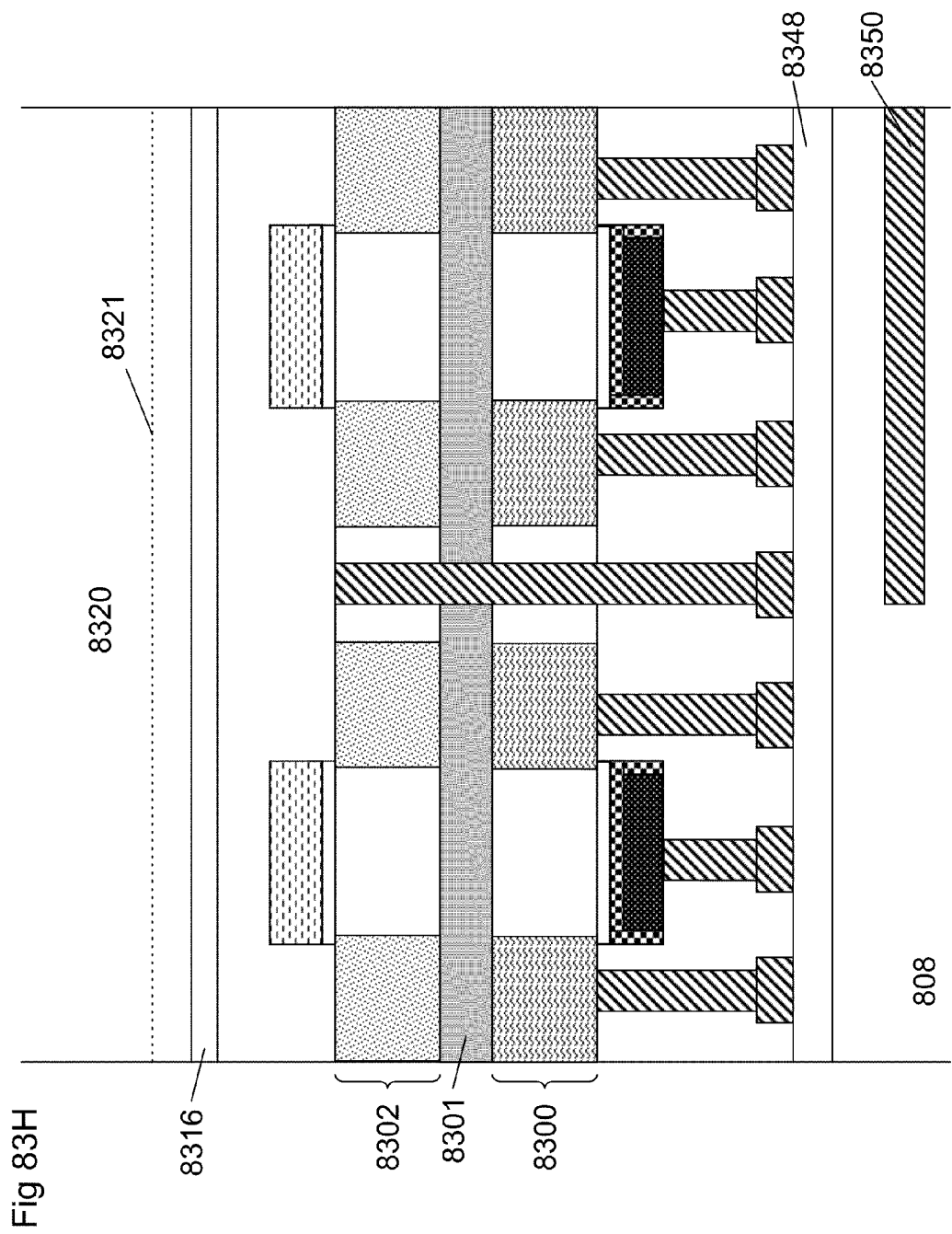

The carrier wafer and two sided n/p layer may then be aligned and permanently bonded to House acceptor wafer 808 with associated metal landing strip 8350 as illustrated in FIG. 83H.

Figure 83I:
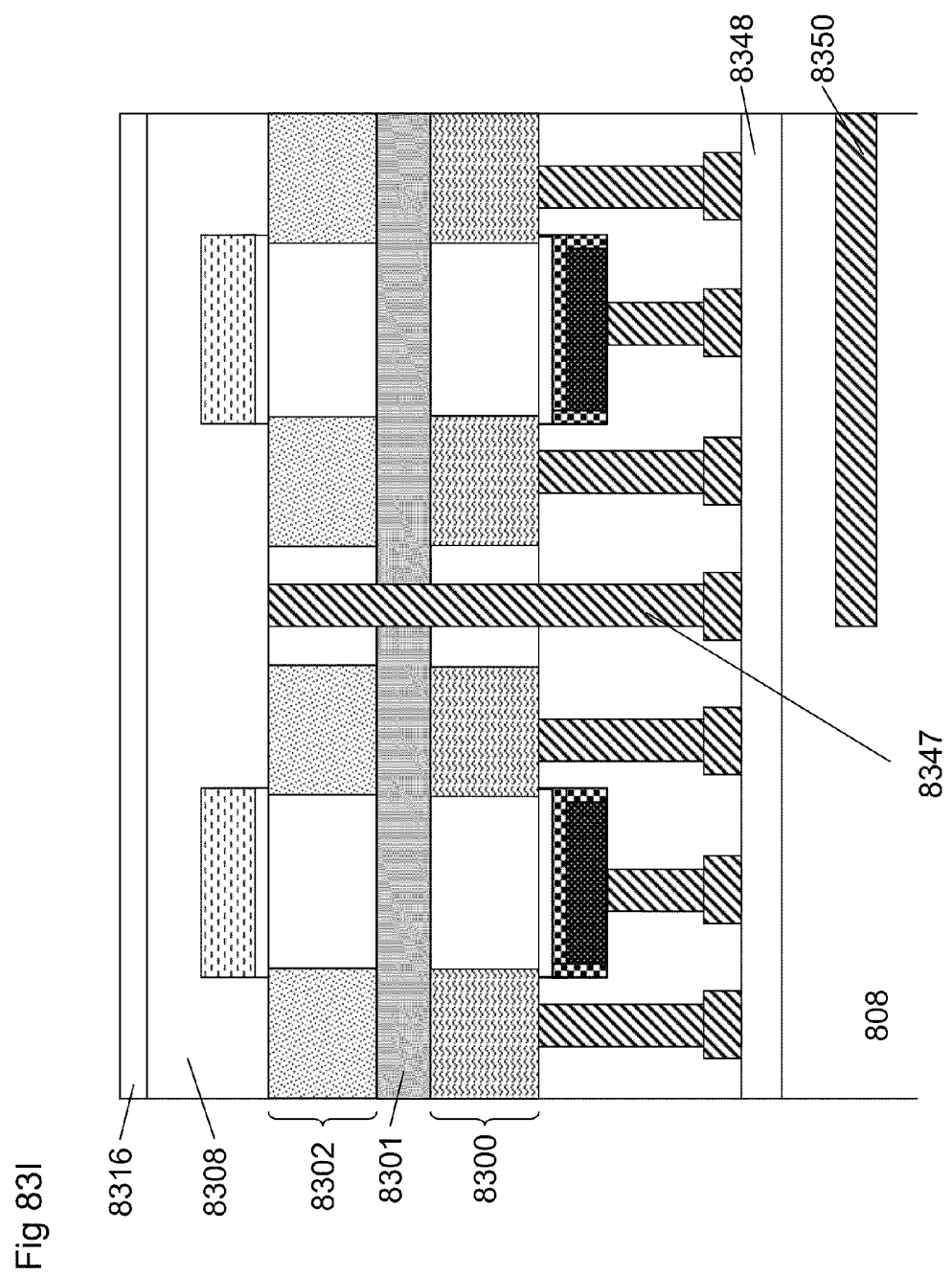

The carrier wafer 8320 may then be cleaved at the cleaving plane 8321 and may be thinned by chemical mechanical polishing (CMP) to oxide layer 8316 as illustrated in FIG. 83I.

Figure 83J:
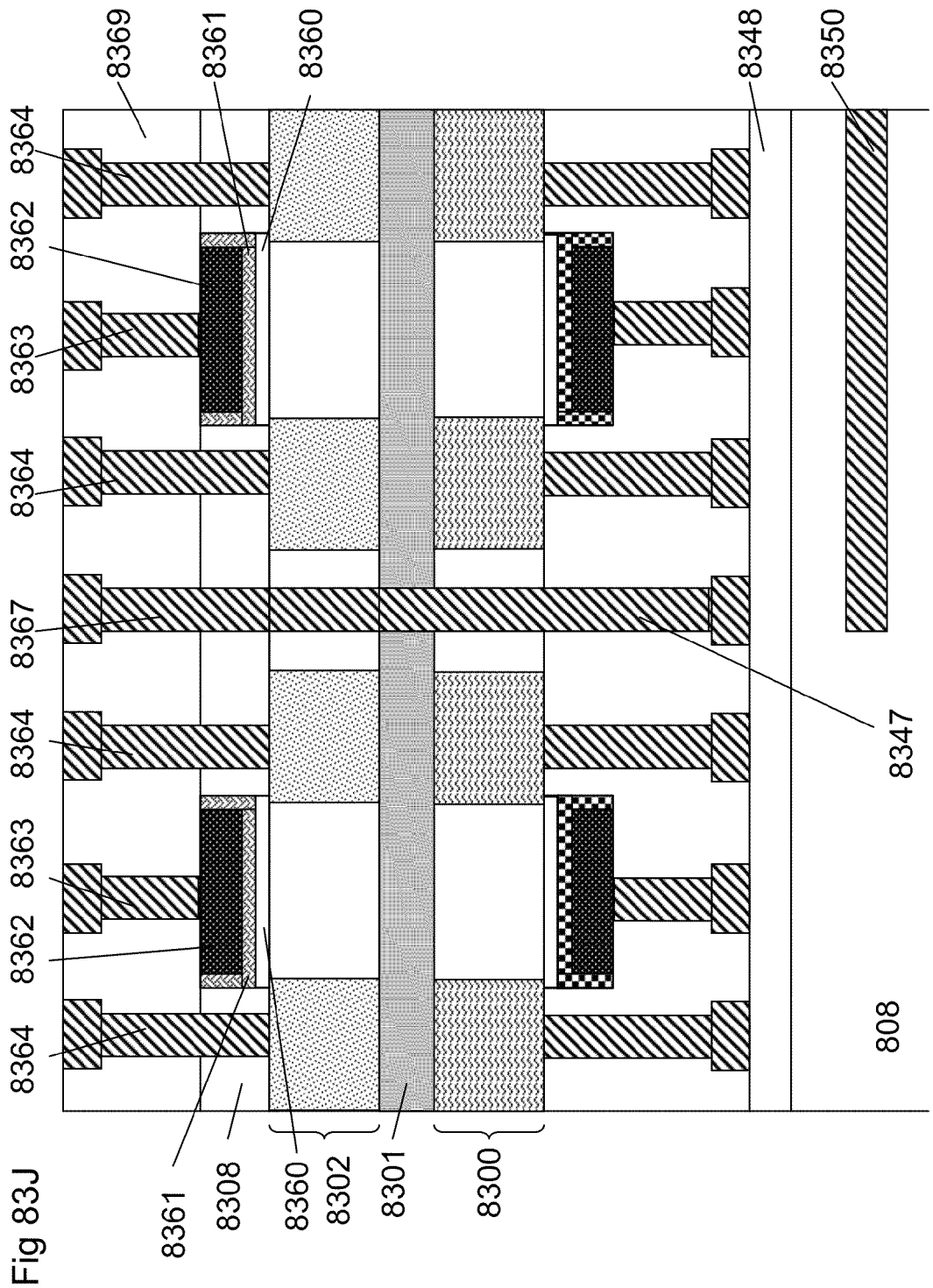

The NMOS transistors are now ready for normal state of the art gate-last transistor formation completion. As illustrated in FIG. 83J, the NMOS inter layer dielectric 8308 may be chemical mechanically polished to expose the top of the NMOS polysilicon dummy gates. The dummy polysilicon gates may then be removed by etching and the NMOS hi-k gate dielectric 8360 and the NMOS specific work function metal gate 8361 may be deposited. An aluminum fill 8362 may be performed on the NMOS gates and the metal CMP'ed. A dielectric layer 8369 may be deposited and the normal gate 8363 and source/drain 8364 contacts may be formed and metalized. The NMOS layer to PMOS layer via 8367 to connect to 8347 and the metallization of via 8367 may be formed.

Figure 83K:
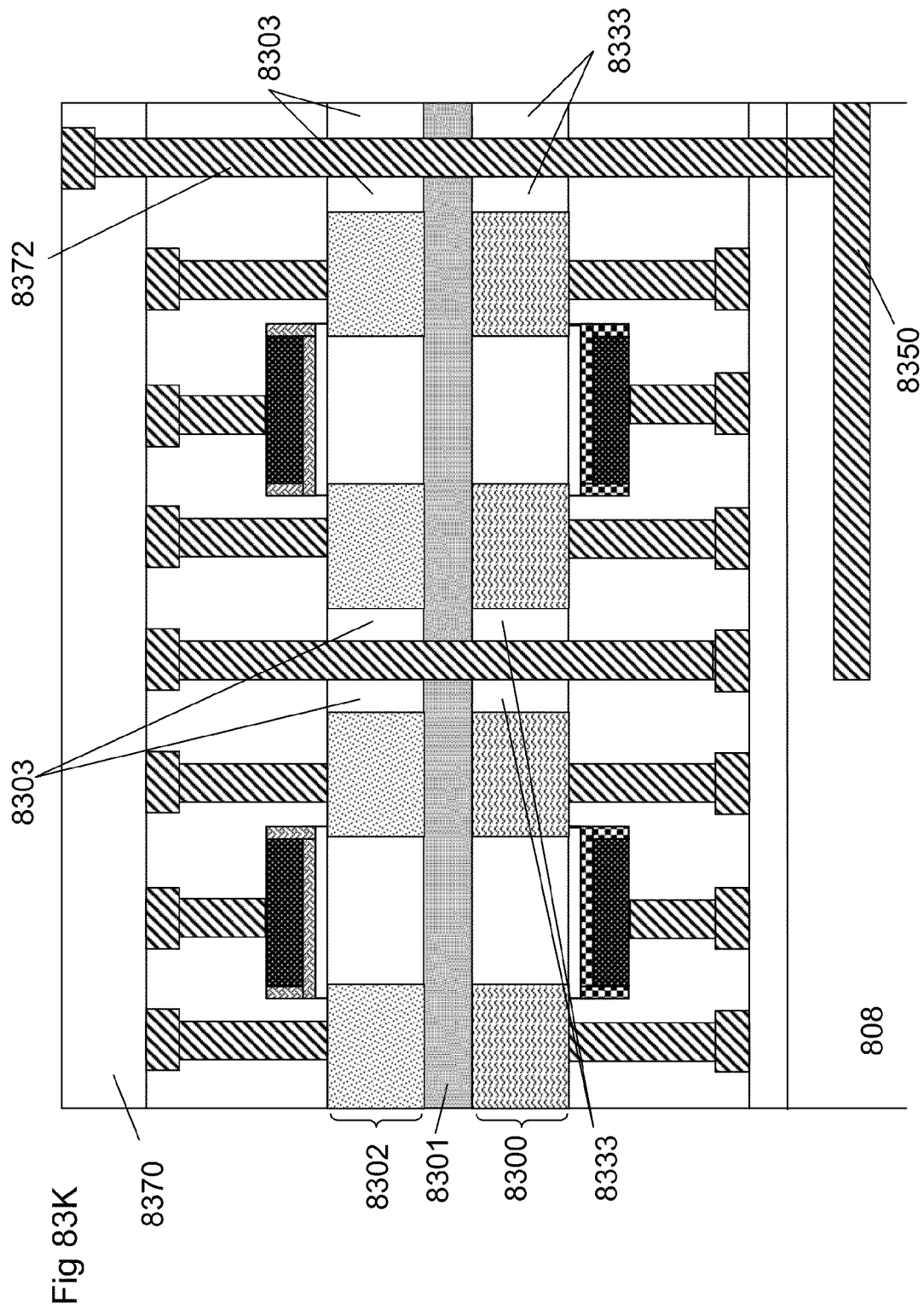

As illustrated in FIG. 83K, a dielectric layer 8370 may be deposited. Layer-to-layer through via 8372 may then be aligned, masked, etched, and metalized to electrically connect to the acceptor wafer 808 and metal-landing strip 8350. A topmost metal layer of the layer stack illustrated in FIG. 83K may be formed to act as the acceptor wafer landing strips for a repeat of the above process flow to stack another preprocessed thin monocrystalline layer of transistors. Persons of ordinary skill in the art will appreciate that the illustrations in FIGS. 83A through 83K are exemplary only and are not drawn to scale. Such skilled persons will further appreciate that many variations are possible such as, for example, the transistor layers on each side of box 8301 may comprise full CMOS, or one side may be CMOS and the other n-type MOSFET transistors, or other combinations and types of semiconductor devices. Many other modifications within the scope of the invention will suggest themselves to such skilled persons after reading this specification. Thus the invention is to be limited only by the appended claims.

Figure 83L:
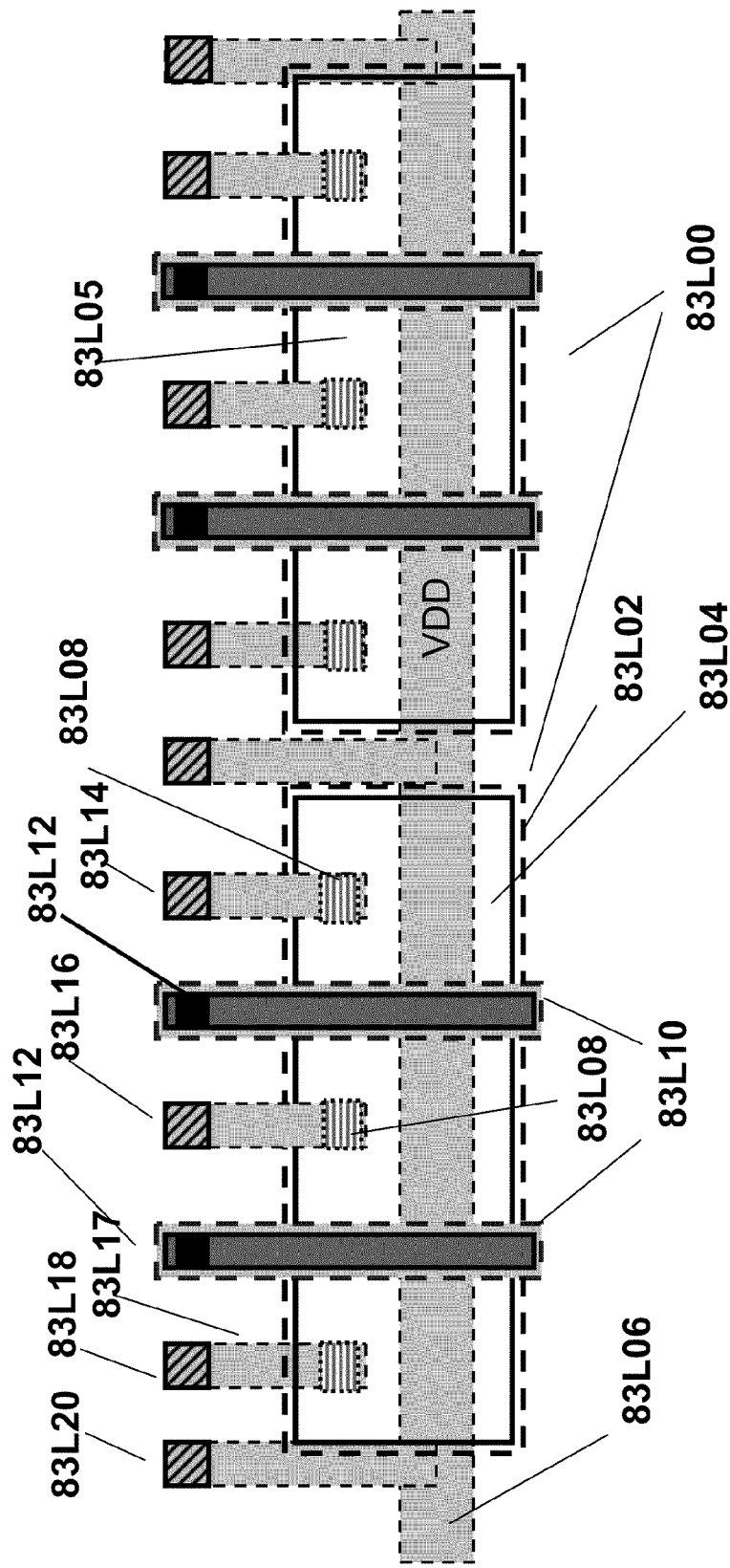

FIG. 83L is a top view drawing illustration of a repeating cell 83L00 as a building block for forming gate array, of two NMOS transistors 83L04 with shared diffusion 83L05 overlaying 'face down' two PMOS transistors 83L02 with shared diffusion. The NMOS transistors gates overlay the PMOS transistors gates 83L10 and the overlayed gates are connected to each other by via 83L12. The Vdd power line 83L06 could run as part of the face down generic structure with connection to the upper layer using vias 83L20. The diffusion connection 83L08 will be using the face down metal generic structure 83L17 and brought up by vias 83L14, 83L16, 83L18.

FIG. 83L1 is a drawing illustration of the generic cell 83L00 customized by custom NMOS transistor contacts 83L22, 83L24 and custom metal 83L26 to form a double inverter. The Vss power line 83L25 may run on top of the NMOS transistors.

FIG. 83L2 is a drawing illustration of the generic cell 83L00 customized to a NOR function, FIG. 83L3 is a drawing illustration of the generic cell 83L00 customized to a NAND function and FIG. 83L3 is a drawing illustration of the generic cell 83L00 customized to a multiplexer function. Accordingly cell 83L00 could be customized to all the required logic function so a generic gate array using array of cells 83L00 could be customized with custom contacts vias and metal layers to any logic function.

Another alternative, with reference to FIG. 70 and description, is illustrated in FIG. 70B-1 whereby the implant of an atomic species 7010, such as, for example, H+, may be screened from the sensitive gate areas 7003 by first masking and etching a shield implant stopping layer of a dense material 7050, for example 5000 angstroms of Tantalum, and may be combined with 5,000 angstroms of photoresist 7052. This may create a segmented cleave plane 7012 in the bulk of the donor wafer silicon wafer and may require additional polishing to provide a smooth bonding surface for layer transfer suitability.

Additional alternatives to the use of an SOI donor wafer may be employed to isolate transistors in the vertical direction. For example, a pn junction may be formed between the vertically stacked transistors and may be biased. Also, oxygen ions may be implanted between the vertically stacked transistors and annealed to form a buried oxide layer. Also, a silicon-on-replacement-insulator technique may be utilized for the first formed dummy transistors wherein a buried SiGe layer is selectively etched out and refilled with oxide, thereby creating islands of electrically isolated silicon.

An alternative embodiment of the above process flow with reference to FIG. 70 is illustrated in FIGS. 81A to 81F and may provide a face down CMOS planar transistor layer on top of a preprocessed House substrate. The CMOS planar transistors may be fabricated with dummy gates and the cleave plane 7012 may be created in the donor wafer as described previously and illustrated in FIGS. 70A and 70B. Then the dummy gates may be replaced as described previously and illustrated in FIG. 81A.

The contact and metallization steps may be performed as illustrated in FIG. 81B to allow future connections to the transistors once they are face down.

The face 8102 of donor wafer 8100 may be prepared for bonding by deposition of an oxide 8104, and plasma or other surface treatments to prepare the oxide surface 8106 for wafer-to-wafer oxide-to-oxide bonding as illustrated in FIG. 81C.

Similar surface preparation may be performed on the 808 acceptor wafer in preparation for the oxide-to-oxide bonding. Now a low temperature (e.g., less than 400° C.) layer transfer flow may be performed, as illustrated in FIG. 81D, to transfer the prepared donor wafer 8100 with top surface 8106 to the acceptor wafer 808. Acceptor wafer 808 may be preprocessed with transistor circuitry and metal interconnect and may have a top metallization comprising metal strips 8124 to act as landing pads for connection between the circuits formed on the transferred layer with the underlying circuit layers in house 808. For FIG. 81D to FIG. 81F, an additional STI (shallow trench isolation) isolation 8130 without via 7040 may be added to the illustration.

The donor wafer 8100 may then be cleaved at the cleaving plane 7012 and may be thinned by chemical mechanical polishing (CMP) so that the transistor isolations 7002 and 8130 may be exposed as illustrated in FIG. 81E. Alternatively, the CMP could continue to the bottom of the junctions to create a fully depleted SOI layer.

As illustrated in FIG. 81F, a low-temperature oxide or low-k dielectric 8136 may be deposited and planarized. The through via 8128 to house 808 acceptor wafer landing strip 8124 and contact 8140 to thru via 7040 may be etched, metalized, and connected by metal line 8150 to provide electrical connection from the donor wafer transistors to the acceptor wafer. The length of landing strips 8124 may be at least the repeat width W plus margin per the proper via design rules as shown in FIGS. 32 and 33A. The landing zone strip extension for proper via design rules may include angular misalignment of the wafer-to-wafer bonding that is not compensated for by the stepper overlay algorithms, and may include uncompensated donor wafer bow and warp.

The face down flow has some advantages such as, for example, enabling double gate transistors, back biased transistors, or access to the floating body in memory applications. For example, a back gate for a double gate transistor may be constructed as illustrated in FIG. 81E-1. A low temperature gate oxide 8160 with gate material 8162 may be grown or deposited and defined by lithographic and etch processes as described previously.

The metal hookup may be constructed as illustrated in FIG. 81F-1.

As illustrated in FIG. 81F-2, fully depleted SOI transistors with junctions 8170 and 8171 may be alternatively constructed in this flow as described in respect to CMP thinning illustrated in FIG. 81E.

An alternative embodiment of the above double gate process flow that may provide a back gate in a face-up flow is illustrated in FIGS. 85A to 85E with reference to FIG. 70. The CMOS planar transistors may be fabricated with the dummy gates and the cleave plane 7012 may be created in the donor wafer, bulk or SOI, as described and illustrated in FIGS. 70A and 70B. The donor wafer may be attached either permanently or temporarily to the carrier substrate as described and illustrated in FIG. 70C and then cleaved and thinned to the STI 7002 as shown in FIG. 70D. Alternatively, the CMP could continue to the bottom of the junctions to create a fully depleted SOI layer.

Figure 85A:
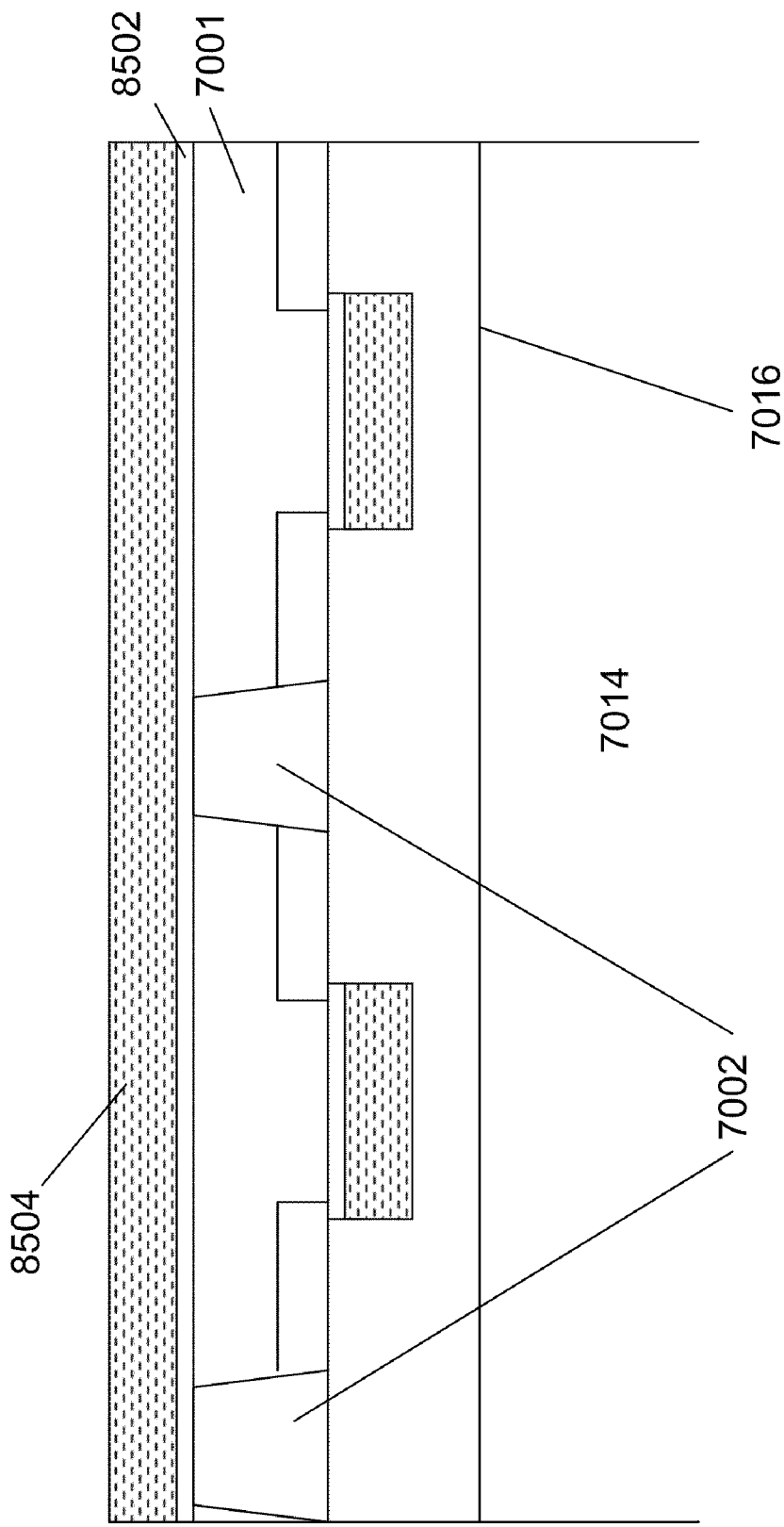
FIG. 85 A-E are drawing illustrations of formation of top planar transistors.

A second gate oxide 8502 may be grown or deposited as illustrated in FIG. 85A and a gate material 8504 may be deposited. The gate oxide 8502 and gate material 8504 may be formed with low temperature (e.g., less than 400° C.) materials and processing, such as previously described TEL SPA gate oxide and amorphous silicon, ALD techniques, or hi-k metal gate stack (HKMG), or may be formed with a higher temperature gate oxide or oxynitride and doped polysilicon if the carrier substrate bond is permanent and the existing planar transistor dopant movement is accounted for.

Figure 85B:
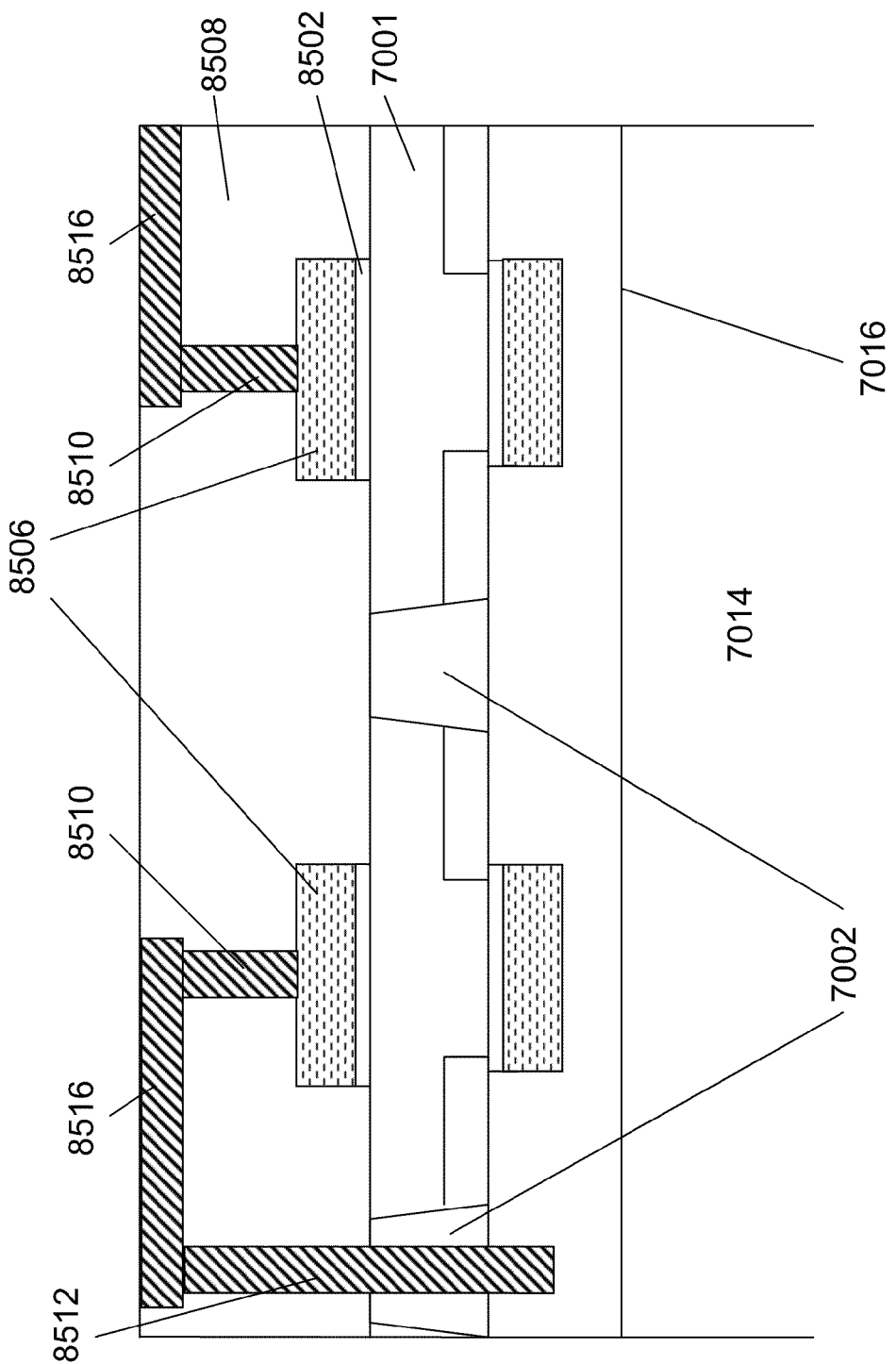

The gate stack 8506 may be defined, a dielectric 8508 may be deposited and planarized, and then local contacts 8510 and layer to layer contacts 8512 and metallization 8516 may be formed as illustrated in FIG. 85B.

Figure 85C:
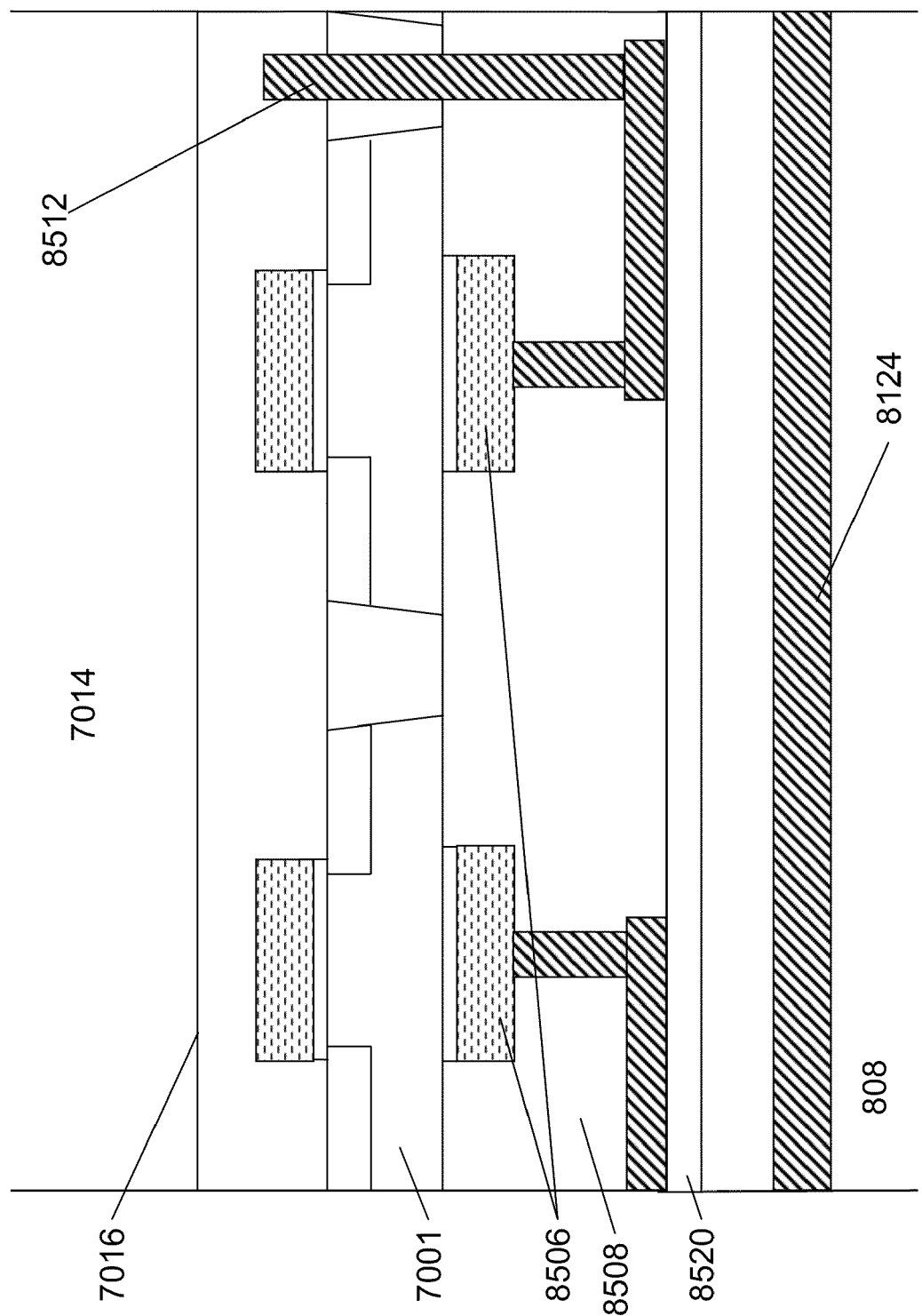

As shown in FIG. 85C, the thin monocrystalline donor and carrier substrate stack may be prepared for layer transfer by methods previously described including oxide layer 8520. Similar surface preparation may be performed on house 808 acceptor wafer in preparation for oxide-to-oxide bonding. Now a low temperature (e.g., less than 400° C.) layer transfer flow may be performed, as illustrated in FIG. 85C, to transfer the thinned and first-phase-transistor-formation-pre-processed HKMG silicon layer 7001 and back gates 8506 with attached carrier substrate 7014 to the acceptor wafer 808. The acceptor wafer 808 may have a top metallization comprising metal strips 8124 to act as landing pads for connection between the circuits formed on the transferred layer with the underlying circuit layers 808.

Figure 85D:
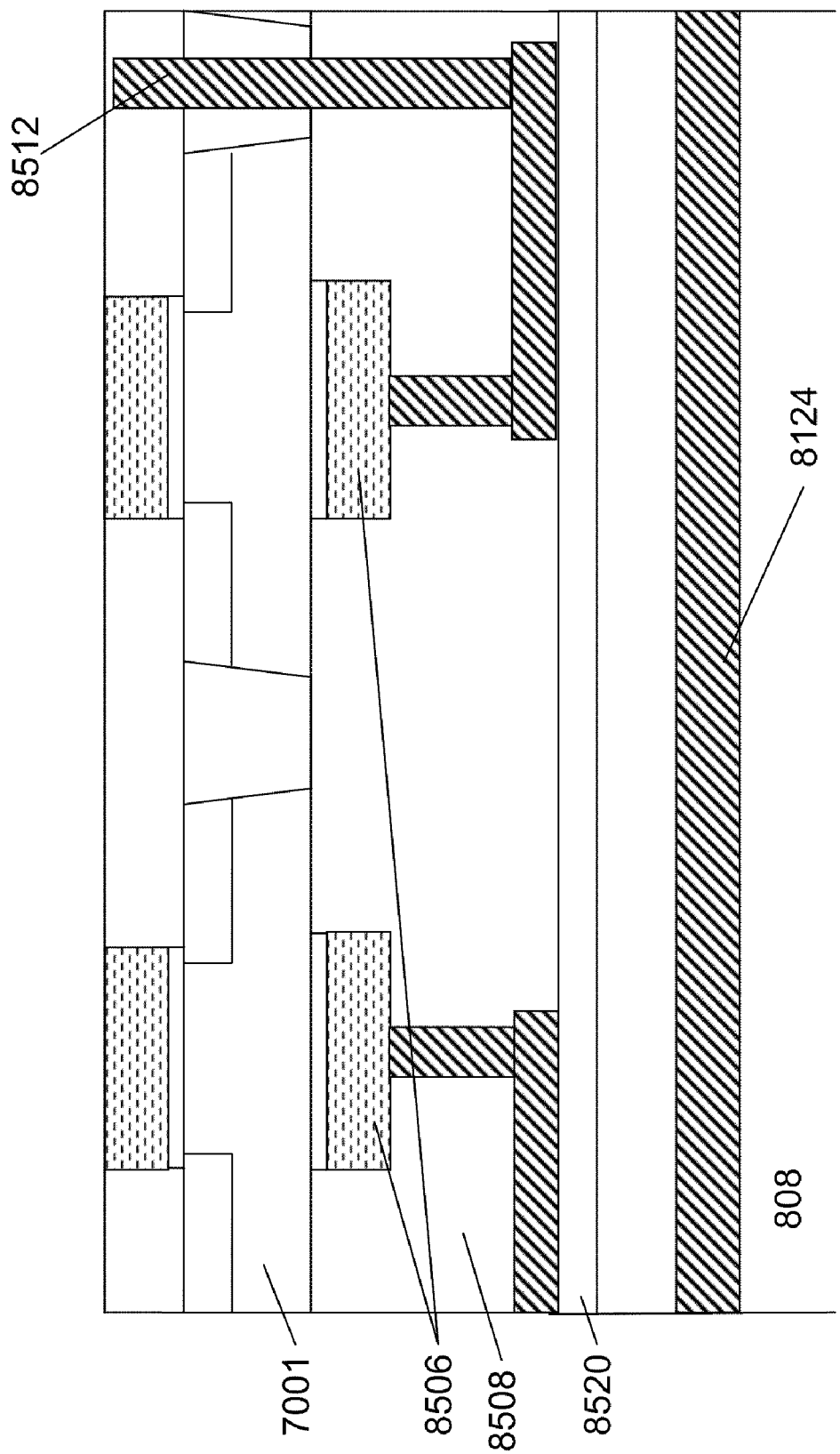

As illustrated in FIG. 85D, the carrier substrate 7014 may then be released at surface 7016 as previously described.

Figure 85E:
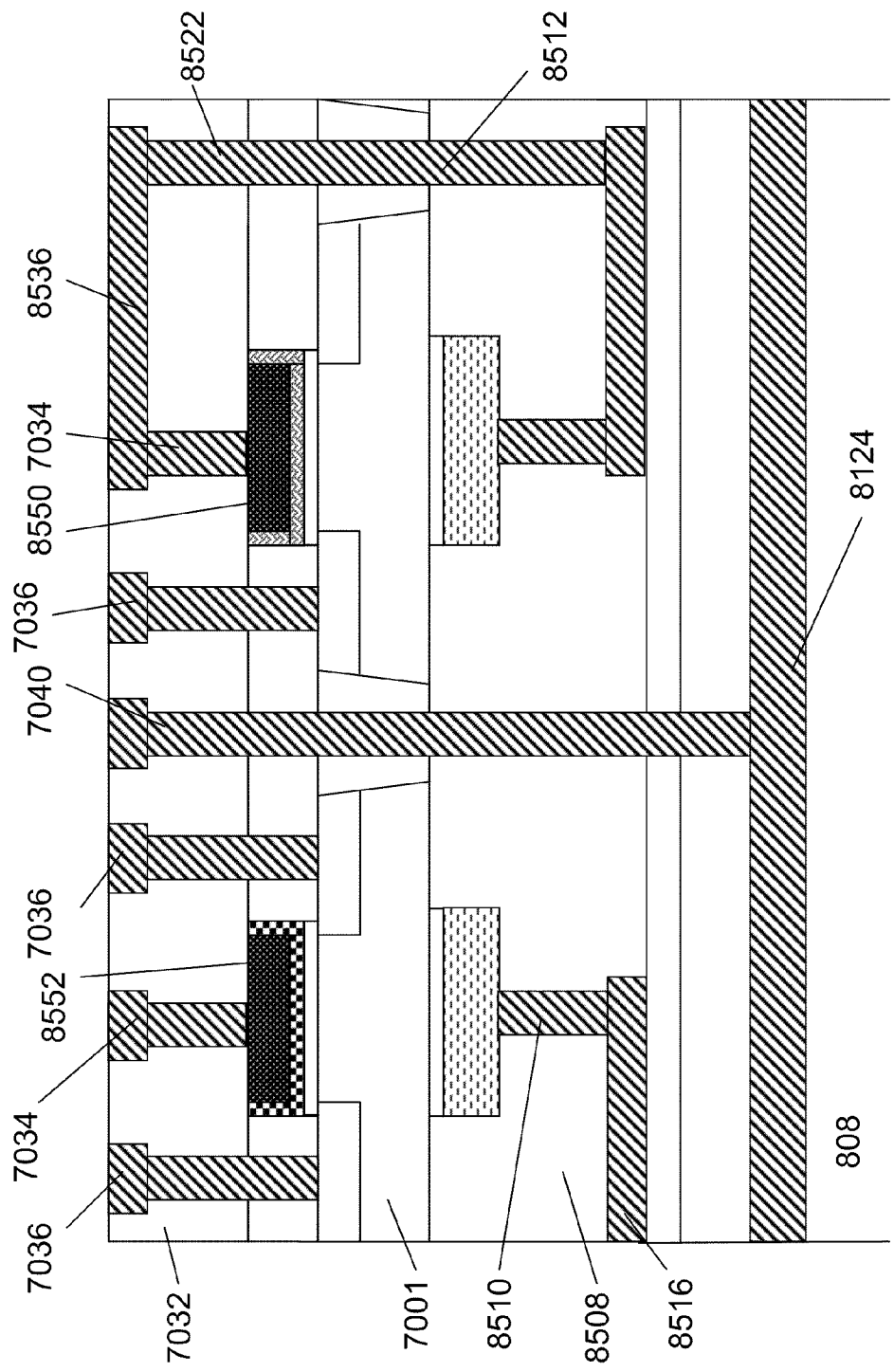

The bonded combination of acceptor wafer 808 and HKMG transistor silicon layer 7001 may now be ready for normal state of the art gate-last transistor formation completion as illustrated in FIG. 85E and connection to the acceptor wafer House 808 thru layer to layer via 7040. The top transistor 8550 may be back gated by connecting the top gate to the bottom gate thru gate contact 7034 to metal line 8536 and to contact 8522 to connect to the donor wafer layer through layer contact 8512. The top transistor 8552 may be back biased by connecting metal line 8516 to a back bias circuit that may be in the top transistor level or in the House 808.

The current invention may overcome the challenge of forming these planar transistors aligned to the underlying layers 808 as described in association with FIGS. 71 to 79 and FIGS. 30 to 33. The general flow may be applied to the transistor constructions described before as relating to FIGS. 70 A-H. In one embodiment, the donor wafer 3000 may be pre-processed to build not just one transistor type but both types by comprising alternating parallel rows that are the die width plus maximum donor wafer to acceptor wafer misalignment in length. Alternatively, the rows may be made wafer long for the first phase of transistor formation of 'n' type 3004 and 'p' type 3006 transistors as illustrated in FIG. 30. FIG. 30 may also include a four cardinal directions 3040 indicator, which will be used through FIGS. 71 to 78. As shown in the blown up projection 3002, the width of the n-type rows 3004 is Wn and the width of the p-type rows 3006 is Wp and their sum W 3008 is the width of the repeating pattern. The rows traverse from East to West and the alternating pattern repeats all the way across the wafer from North to South. Wn and Wp may be set for the minimum width of the corresponding transistor plus its isolation in the selected process node. The wafer 3000 may also have an alignment mark 3020 on the same layers of the donor wafer as the n 3004 and p 3006 rows and accordingly may be used later to properly align additional patterning and processing steps to the n 3004 and p 3006 rows.

Figure 71:
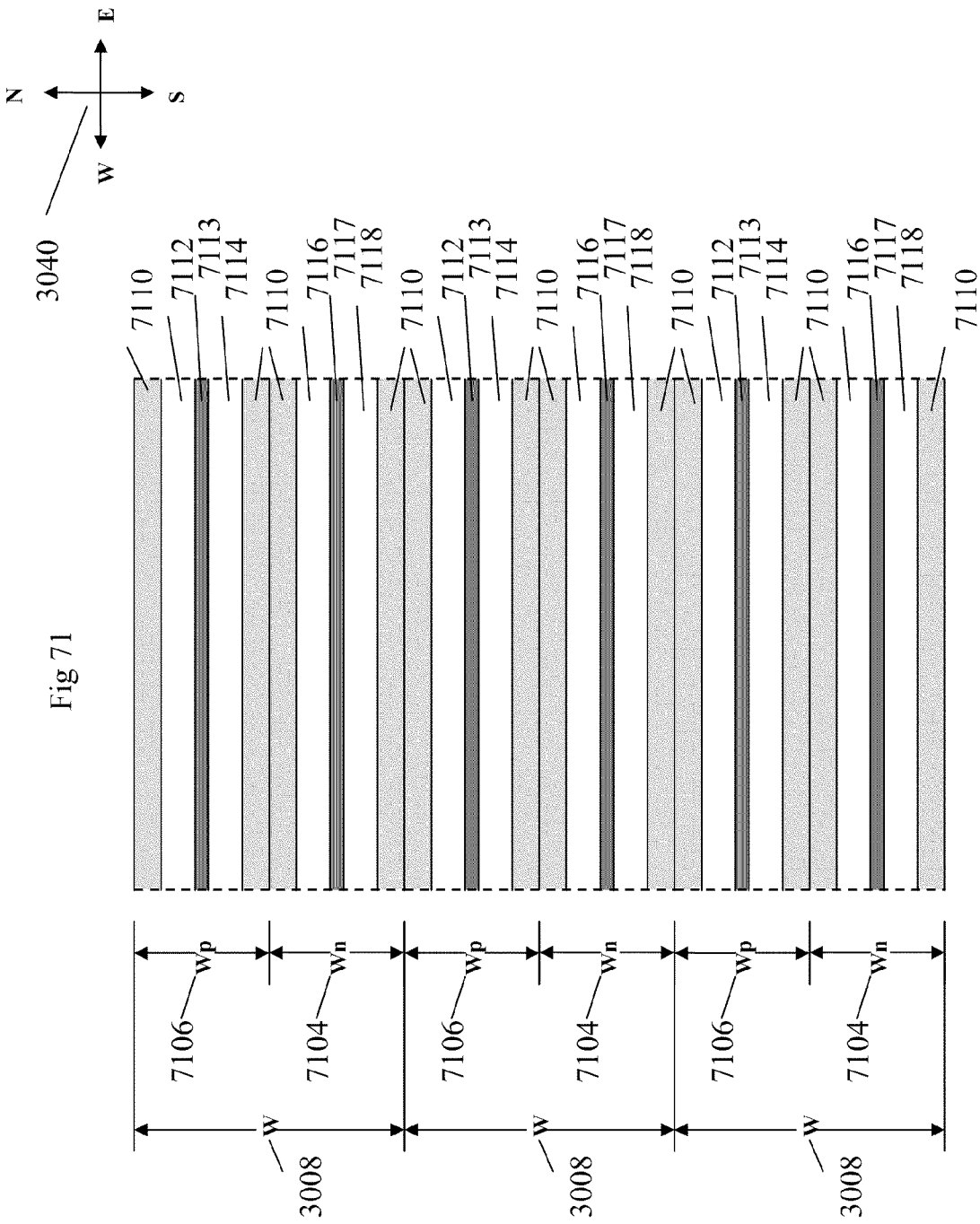
FIG. 71 is a drawing illustration of a layout for a donor wafer.

As illustrated in FIG. 71, the width of the p type transistor row width repeat Wp 7106 may be composed of two transistor isolations 7110 of width 2 F each, plus a transistor source 7112 of width 2.5 F, a PMOS gate 7113 of width F, and a transistor drain 7114 of width 2.5 F. The total Wp may be 10 F, where F is 2 times lambda, the minimum design rule. The width of the n type transistor row width repeat Wn 7104 may be composed of two transistor isolations 7110 of width 2 F each, plus a transistor source 7116 of width 2.5 F, a NMOS gate 7117 of width F, and a transistor drain 7118 of width 2.5 F. The total Wn may be 10 F and the total repeat W 7108 may be 20 F.

The donor wafer layer 3000L, now thinned and the first-phase-transistor-formation pre-processed HKMG silicon layer 7001 with the attached carrier substrate 7014 completed as described previously in relation to FIG. 70E, may be placed on top of the acceptor wafer 3100 as illustrated in FIG. 31. The state of the art alignment methods allow for very good angular alignment of this bonding step but it is difficult to achieve a better than approximately 1 µm position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks 3120 and 3020 may be placed in only a few locations on each wafer, or within each step field, or within each die, or within each repeat W. The alignment approach involving residue Rdy 3202 and the landing zone stripes 33A04 and 33B04 as described previously in respect to FIGS. 32, 33A and 33B may be utilized to improve the density and reliability of the electrical connection from the transferred donor wafer layer to the acceptor wafer.

The low temperature post layer transfer process flow for the donor wafer layout with gates parallel to the source and drains as shown in FIG. 71 is illustrated in FIGS. 72A to 72F.

FIG. 72A illustrates the top view and cross-sectional view of the wafer after layer transfer of the first phase of transistor formation, layer transfer & bonding of the thin monocrystalline preprocessed donor layer to the acceptor wafer, and release of the bonded structure from the carrier substrate, as previously described up to and including FIG. 70F.

The interlayer dielectric (ILD) 7008 may be chemical mechanical polished (CMP'd) to expose the top of the dummy polysilicon and the layer-to-layer via 7040 may be etched, metal filled, and CMP'd flat as illustrated in FIG. 72B.

The long rows of pre-formed transistors may be etched into desired lengths or segments by forming isolation regions 7202 as illustrated in FIG. 72C. A low temperature oxidation may be performed to repair damage to the transistor edge and the regions 7202 may be filled with a dielectric and CMP'd flat so to provide isolation between transistor segments.

Alternatively, regions 7202 may be selectively opened and filled for the PMOS and NMOS transistors separately to provide compressive or tensile stress enhancement to the transistor channels for carrier mobility enhancement.

The polysilicon 7004 and oxide 7005 dummy gates may now be etched out to provide some gate overlap between the isolation 7202 edge and the normal replacement gate deposition of high-k dielectric 7026, PMOS metal gate 7028 and NMOS metal gate 7030. In addition, aluminum overfill 7032 may be performed. The CMP of the Aluminum 7032 may be performed to planarize the surface for the gate definition as illustrated in FIG. 72D.

The replacement gates 7215 may be patterned and etched as illustrated in FIG. 72E and may provide a gate contact landing area 7218.

An interlayer dielectric may be deposited and planarized with CMP, and normal contact formation and metallization may be performed to make gate 7220, source 7222, drain 7224, and interlayer via 7240 connections as illustrated in FIG. 72F.

Figure 73:
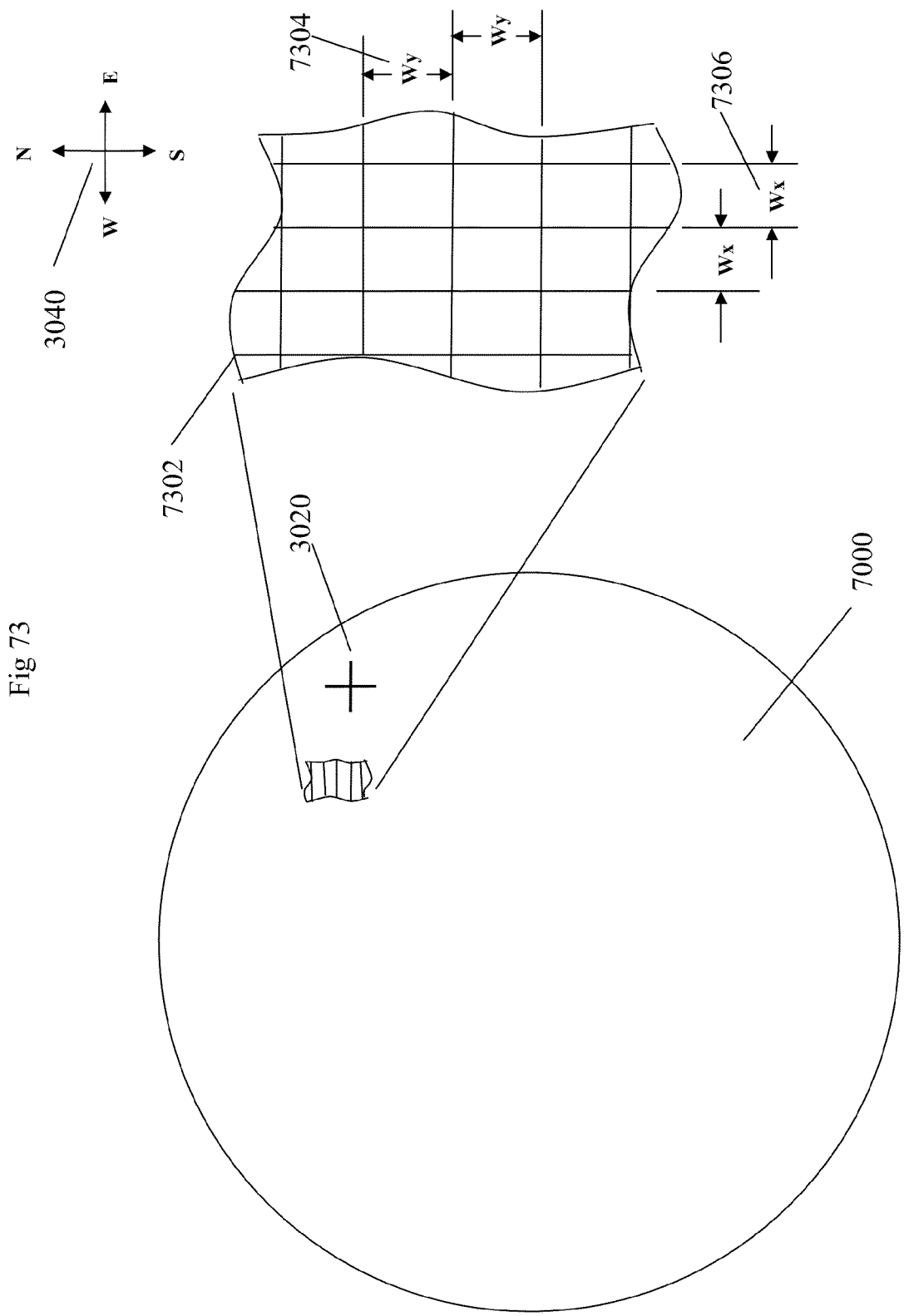
FIG. 73 is a drawing illustration of a donor wafer.
Figure 74:
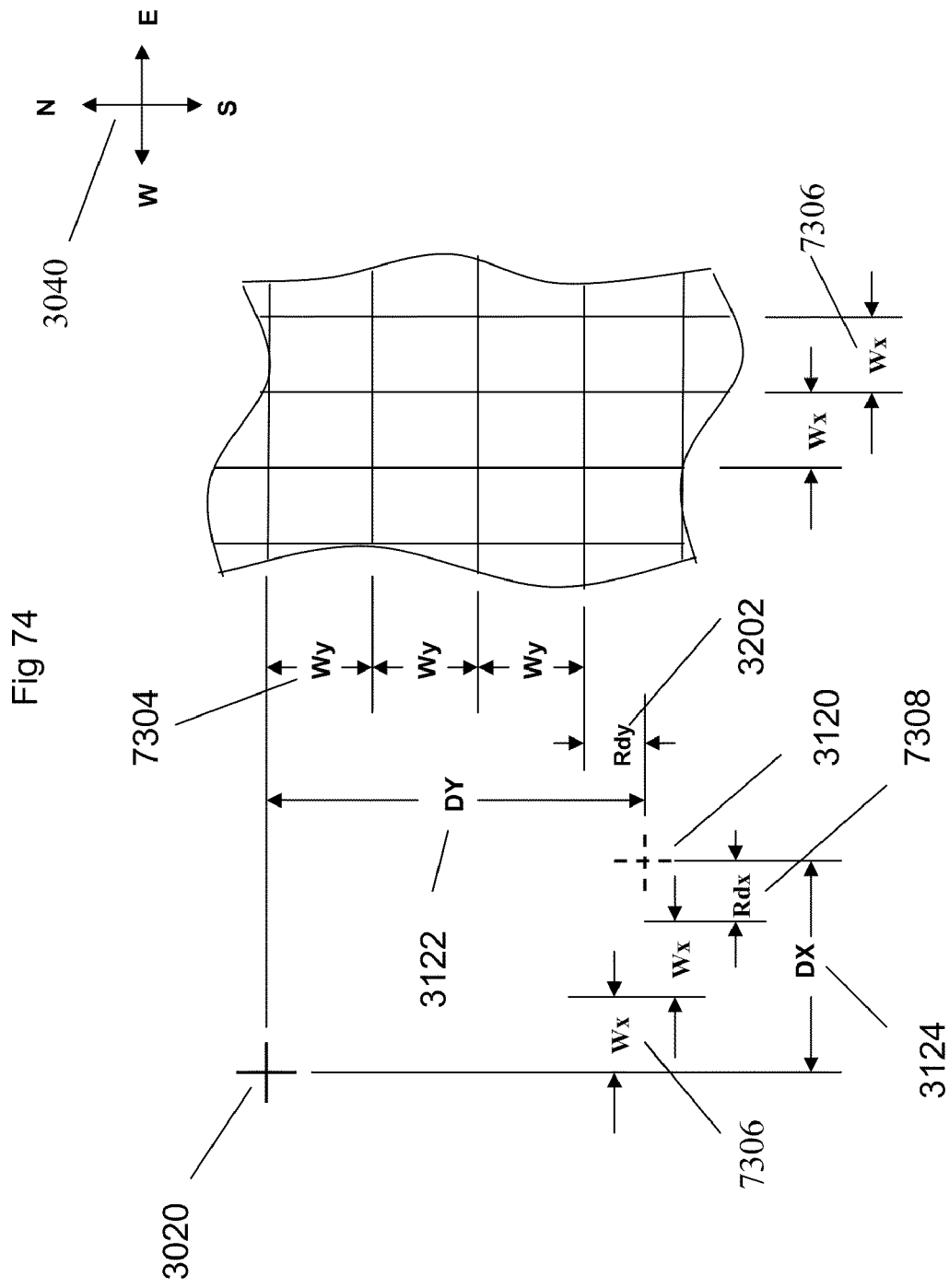
FIG. 74 is a drawing illustration of a measured alignment offset.
Figure 75:
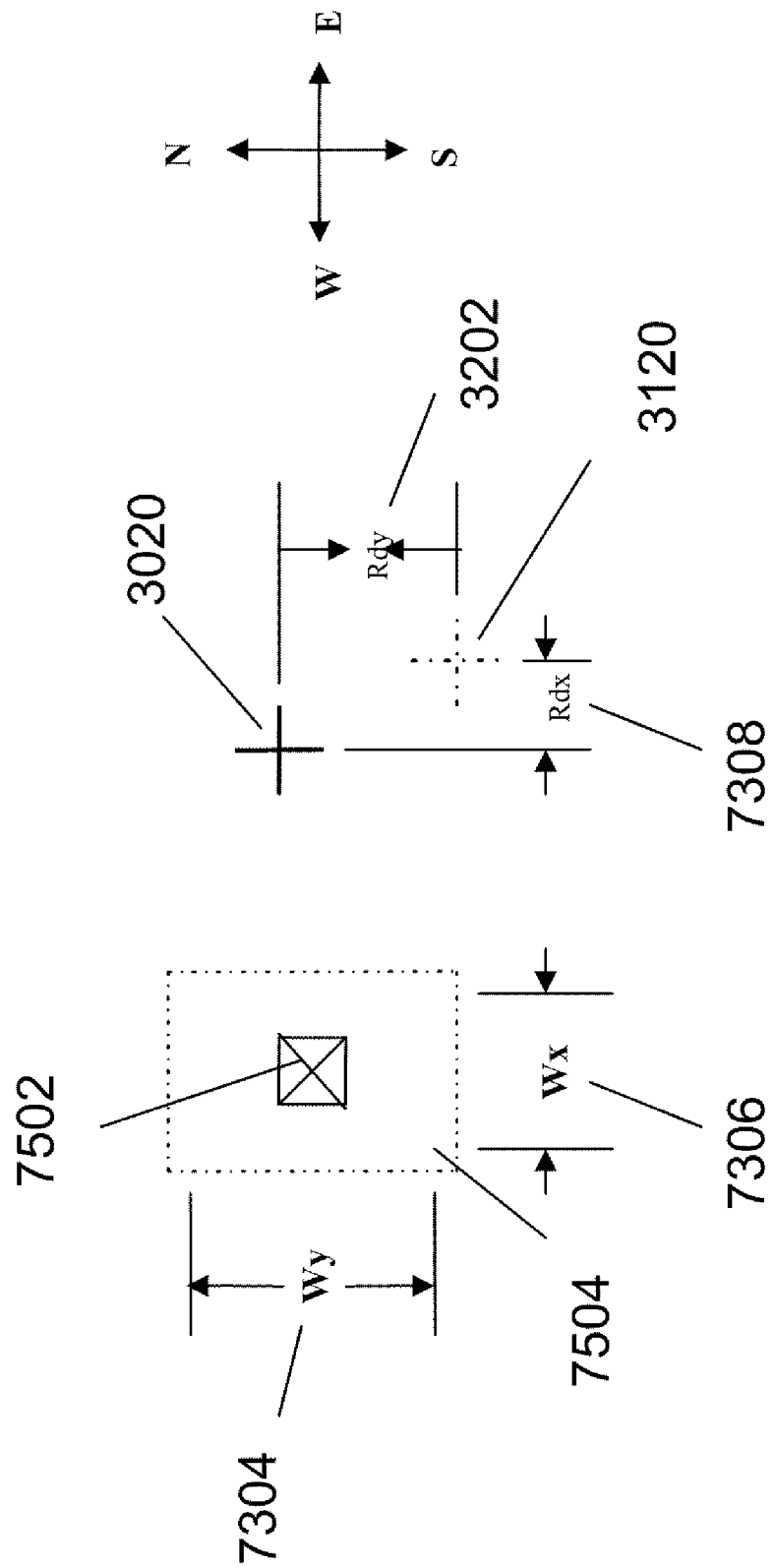
FIG. 75 is a drawing illustration of a connection strip.

In an alternative embodiment, the donor wafer 7000 may be pre-processed for the first phase of transistor formation to build n and p type dummy transistors comprising repeated patterns in both directions. FIGS. 73, 74, 75 include a four cardinal directions 3040 indicator, which may be used to assist the explanation. As illustrated in the blown-up projection 7302 in FIG. 73, the width Wy 7304 corresponds to the repeating pattern rows that may traverse the acceptor die East to West width plus the maximum donor wafer to acceptor wafer misalignment length, or alternatively traverse the length of the donor wafer from East to West, and the repeats may extend all the way across the wafer from North to South. Similarly, the width Wx 7306 corresponds to the repeating pattern rows that may traverse the acceptor die North to South width plus the maximum donor wafer to acceptor wafer misalignment length, or alternatively traverse the length of the donor wafer from North to South, and the repeats may extend all the way across the wafer from East to West. The donor wafer 7000 may also have an alignment mark 3020 on the same layers of the donor wafer as the Wx 7306 and Wy 7304 repeating patterns rows. Accordingly, alignment mark 3020 may be used later to properly align additional patterning and processing steps to said rows.

The donor wafer layer 3000L, now thinned and comprising the first phase of transistor formation pre-processed HKMG silicon layer 7001 with attached carrier substrate 7014 completed as described previously in relation to FIG. 70E, may be placed on top of the acceptor wafer 3100 as illustrated in FIG. 31. The state of the art alignment may allow for very good angular alignment of this bonding step but it is difficult to achieve a better than approximately 1 µm position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks may be placed in only a few locations on each wafer, or within each step field, or within each die, or within each repeat W.

The proposed structure, illustrated in FIG. 74, comprise repeating patterns in both the North-South and East-West direction of alternating rows of parallel transistor bands. The advantage of the proposed structure is that the transistor and the processing could be similar to the acceptor wafer processing, thereby significantly reducing the development cost of 3D integrated devices. Accordingly the effective alignment uncertainty may be reduced to Wy 7304 in the North to South direction and Wx 7306 in the West to East direction. Accordingly, the alignment residue Rdy 3202 (remainder of DY modulo Wy, 0<=Rdy<Wy) in the North to South direction could be calculated. Accordingly, the North-South direction alignment may be to the underlying alignment mark 3120 offset by Rdy 3202 to properly align to the nearest Wy. Similarly, the effective alignment uncertainty may be reduced to Wx 7306 in the East to West direction. The alignment residue Rdx 3708 (remainder of DX modulo Wx, 0<=Rdx<Wx) in the West to East direction could be calculated in a manner similar to that of Rdy 3202. Likewise, the East-West direction alignment may be performed to the underlying alignment mark 3120 offset by Rdx 7308 to properly align to the nearest Wx.

Each wafer to be processed according to this flow may have at least one specific Rdx 7308 and Rdy 3202 which may be subject to the actual misalignment DX 3124 and DY 3122 and Wx and Wy. The masks used for patterning the various circuit patterns may be pre-designed and fabricated and remain the same for all wafers (processed for the same end-device)

regardless of the actual wafer to wafer misalignment. In order to allow the connection between structures on the donor layer 7001 and the underlying acceptor wafer 808, the underlying wafer 808 may be designed to have a landing zone rectangle 7504 extending North-South of length Wy 7304 plus any extension required for the via design rules, and extending East-West of length Wx 7306 plus any extension required for the via design rules, as illustrated in FIG. 75. The landing zone rectangle extension for via design rules may also include angular misalignment of the wafer-to-wafer bonding not compensated by the stepper overlay algorithms, and may include uncompensated donor wafer bow and warp. The rectangle landing zone 7504 may be part of the acceptor wafer 808 and may be accordingly aligned to its alignment mark 3120. Through via 7502 going down and being part of the donor layer 7001 pattern may be aligned to the underlying alignment mark 3120 by offsets Rdx 7308 and Rdy 3202 respectively, providing connections to the landing zone 7504.

Figure 77:
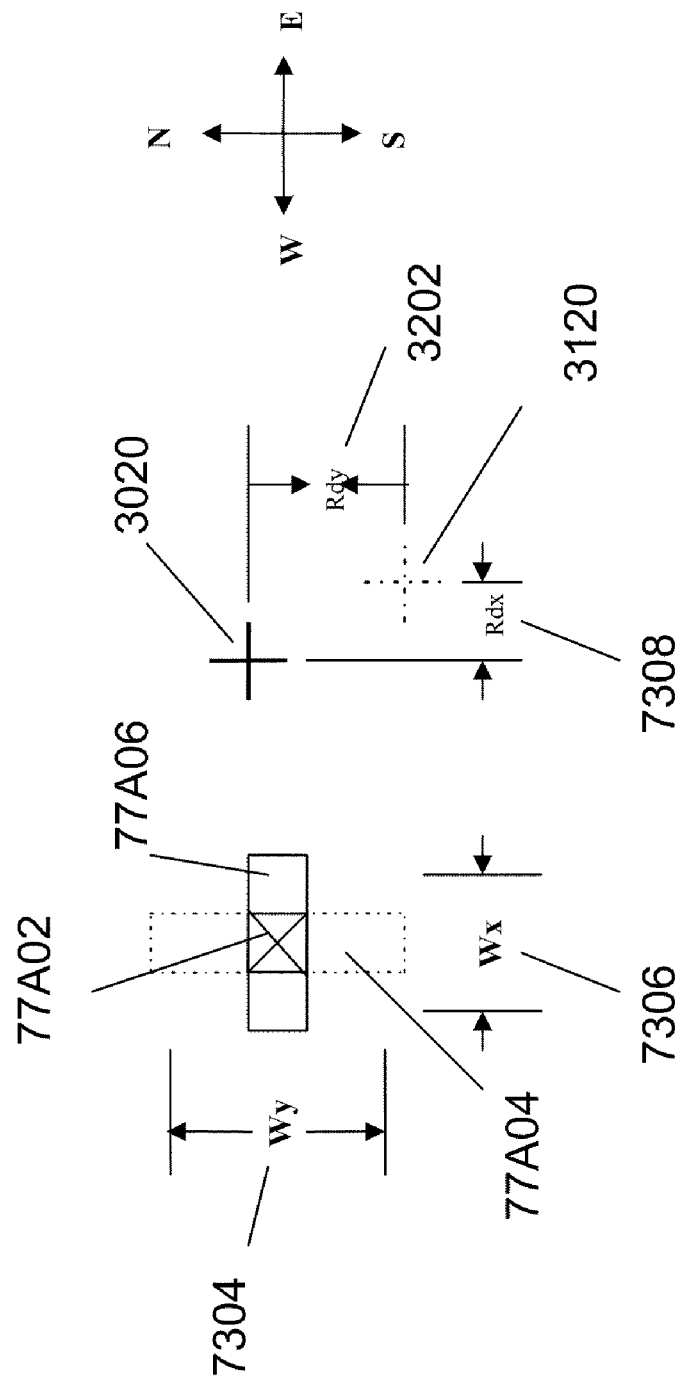
FIG. 77 is a drawing illustration of a connection strip.

In an alternative embodiment, the rectangular landing zone 7504 in acceptor substrate 808 may be replaced by a landing strip 77A04 in the acceptor wafer and an orthogonal landing strip 77A06 in the donor layer as illustrated in FIG. 77. Through via 77A02 going down and being part of the donor layer 7001 pattern may be aligned to the underlying alignment mark 3120 by offsets Rdx 7308 and Rdy 3202 respectively, providing connections to the landing strip 77A06.

Figure 76:
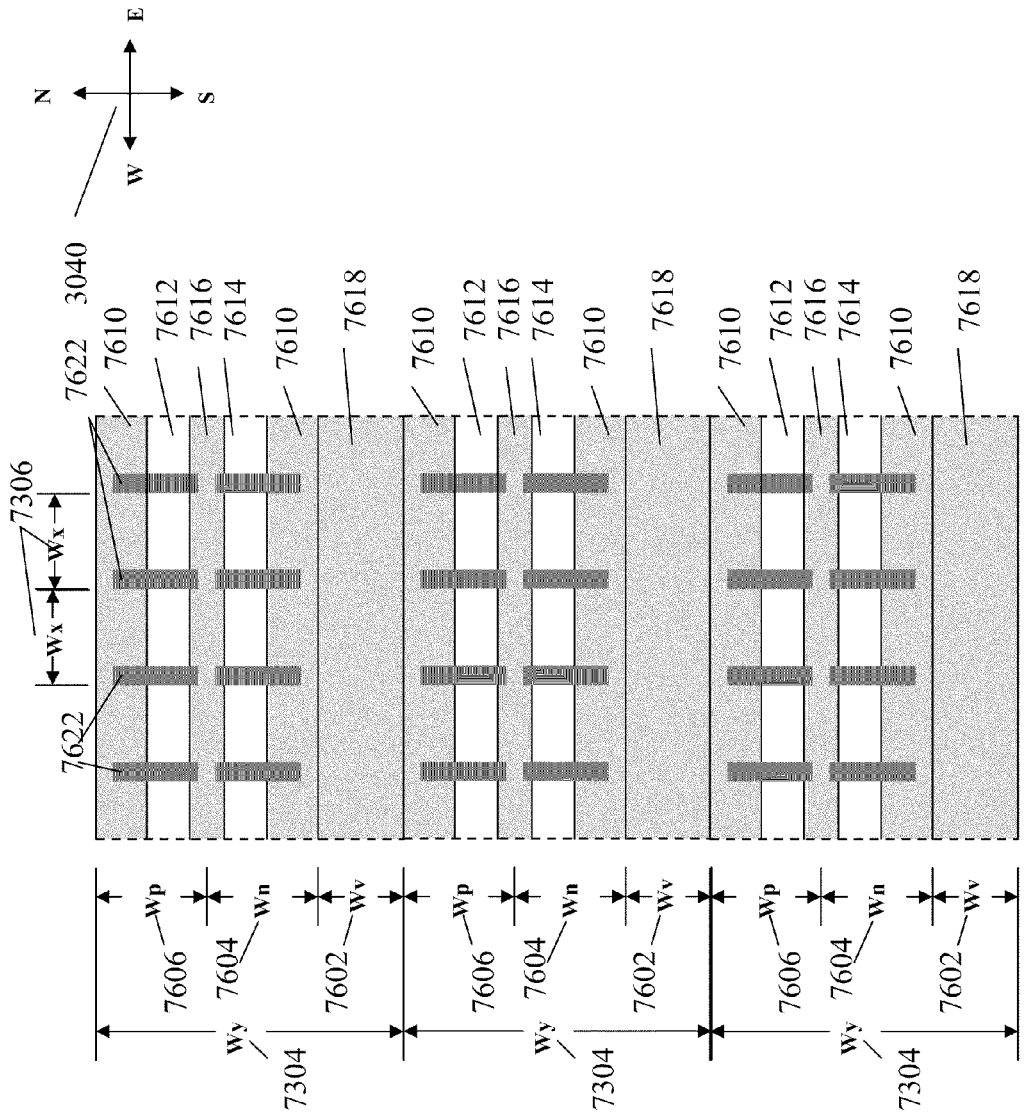
FIG. 76 is a drawing illustration of a layout for a donor wafer.

FIG. 76 illustrates a repeating pattern in both the North-South and East-West direction. This repeating pattern may be a repeating pattern of transistors, of which each transistor has gate 7622, forming a band of transistors along the East-West axis. The repeating pattern in the North-South direction may comprise parallel bands of transistors, of which each transistor has active area 7612 or 7614. The transistors may have their gates 7622 fully defined. The structure may therefore be repeating in East-West with repetitions of Wx 7306. In the North-South direction the structure may repeat every Wy 7304. The width Wv 7602 of the layer to layer via channel 7618 may be 5 F, and the width of the n type transistor row width repeat Wn 7604 may be composed of two transistor isolations 7610 of 3 F width and shared isolation region 7616 of 1 F width, plus a transistor active area 7614 of width 2.5 F. The width of the p type transistor row width repeat Wp 7606 may be composed of two transistor isolations 7610 of 3 F width and shared 7616 of 1 F, plus a transistor active area 7612 of width 2.5 F. The total Wy 7304 may be 18 F, the addition of Wv+Wn+Wp, where F is two times lambda, the minimum design rule. The gates 7622 may be of width F and spaced 4F apart from each other in the East-West direction. The East-West repeat width Wx 7306 may be 5 F. Adjacent transistors in the East-West direction may be electrically isolated from each other by biasing the gate in-between to the appropriate off state; i.e., grounded gate for NMOS and Vdd gate for PMOS.

The donor wafer layer 3000L, now thinned and comprising the first-phase-transistor-formation pre-processed HKMG silicon layer 7001 with attached carrier substrate 7014 completed as described previously in relation to FIG. 70E, may be placed on top of the acceptor wafer 3100 as illustrated in FIG. 31. The DX 3124 and DY 3122 misalignment and, as described previously, the associated Rdx 7308 and Rdy 3202 may be calculated. The connection between structures on the donor layer 7001 and the underlying wafer 808, may be designed to have a landing strip 77A04 going North-South of length Wy 7304 plus any extension required for the via design rules, as illustrated in FIG. 77A. The landing strip extension for via design rules may include angular misalignment of the wafer to wafer bonding not compensated for by the stepper overlay algorithms, and may include uncompensated donor wafer bow and warp. The strip 77A04 may be part of the wafer 808 and may be accordingly aligned to its alignment mark 3120. The landing strip 77A06 may be part of the donor wafer layers and may be oriented in parallel to the transistor bands and accordingly going East-West. Landing strip 77A06 may be aligned to the main wafer alignment mark 3120 with offsets of Rdx and Rdy (i.e., equivalent to alignment to donor wafer alignment mark 3020). Through via 77A02 connecting these two landing strips 77A04 and 77A06 may be part of a top layer 7001 pattern. The via 77A02 may be aligned to the main wafer 808 alignment mark in the West—East direction and to the main wafer alignment mark 3120 with Rdy offset in the North-South direction.

Figure 78A:
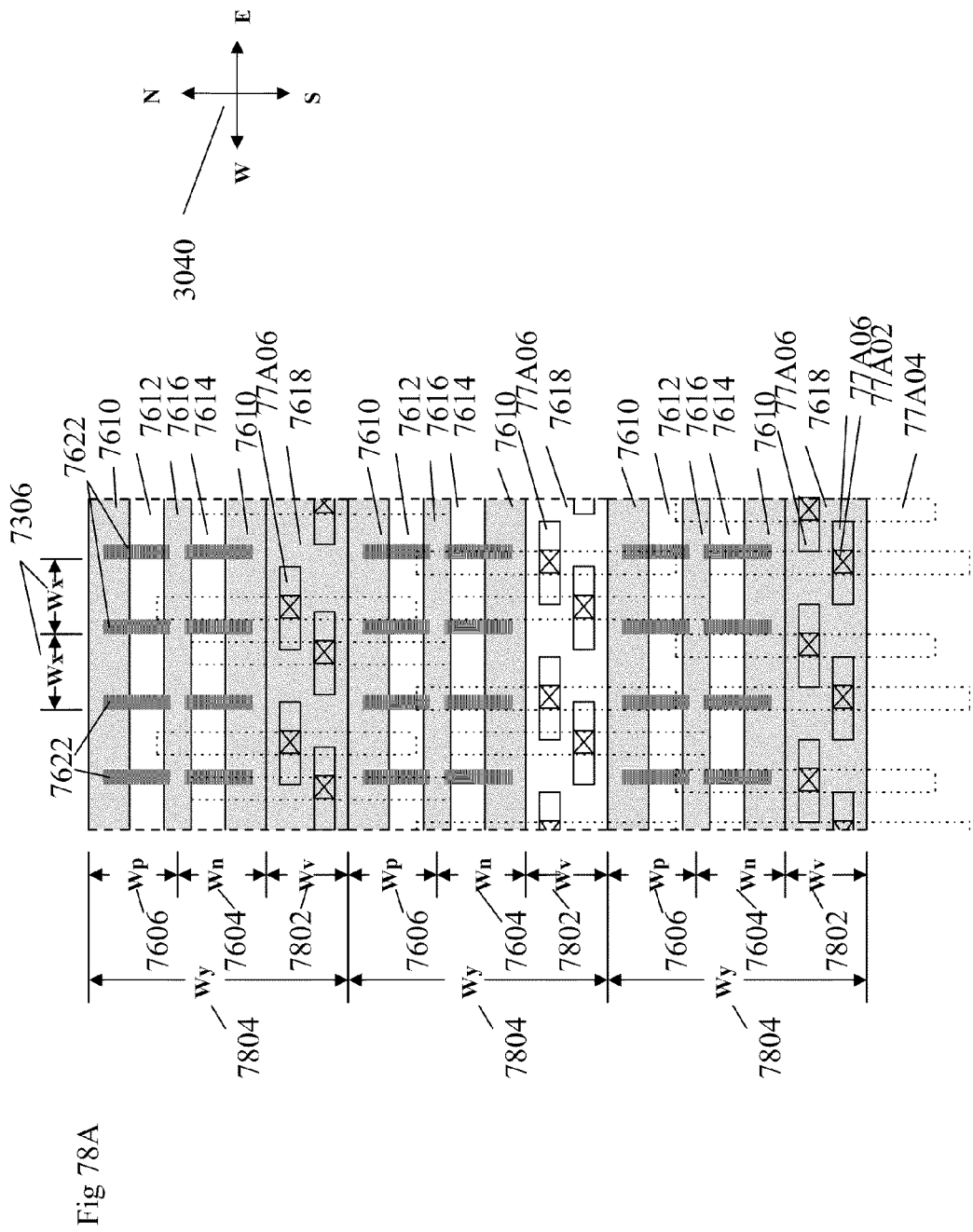
FIG. 78A, 78B are drawing illustrations of a layout for a donor wafer.

Alternatively, the repeating pattern of continuous diffusion sea of gates described in FIG. 76 may have an enlarged Wv 7802 for multiple rows of landing strips 77A06 as illustrated in FIG. 78A. The width Wv 7802 of the layer-to-layer via channel 7618 may be 10 F, and the total Wy 7804 North-South pattern repeat may be 23 F.

Figure 78B:
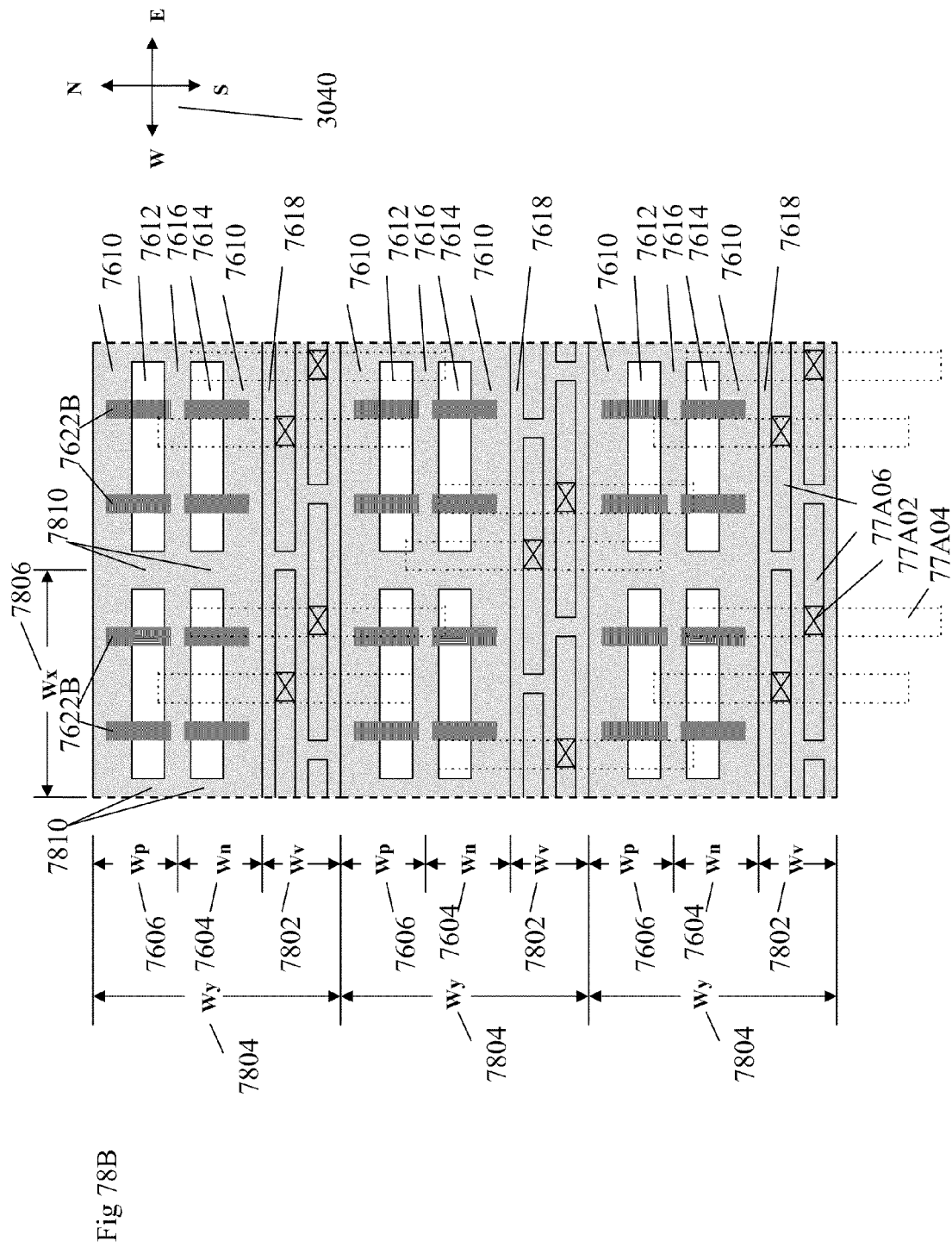

In an alternative embodiment, the gates 7622B may be repeated in the East to West direction as pairs with an additional repeat of isolations 7810 as illustrated in FIG. 78B. This repeating pattern of transistors, of which each transistor has gate 7622B, may form a band of transistors along the East-West axis. The repeating pattern in the North-South direction comprises parallel bands of these transistor, of which each transistor has active area 7612 or 7614. The East-West pattern repeat width Wx 7806 may be 14 F and the length of the donor wafer landing strips 77A06 may be designed of length Wx 7806 plus any extension required by design rules as described previously. The donor wafer landing strip 77A06 may be oriented parallel to the transistor bands and accordingly going East-West.

Figure 79:
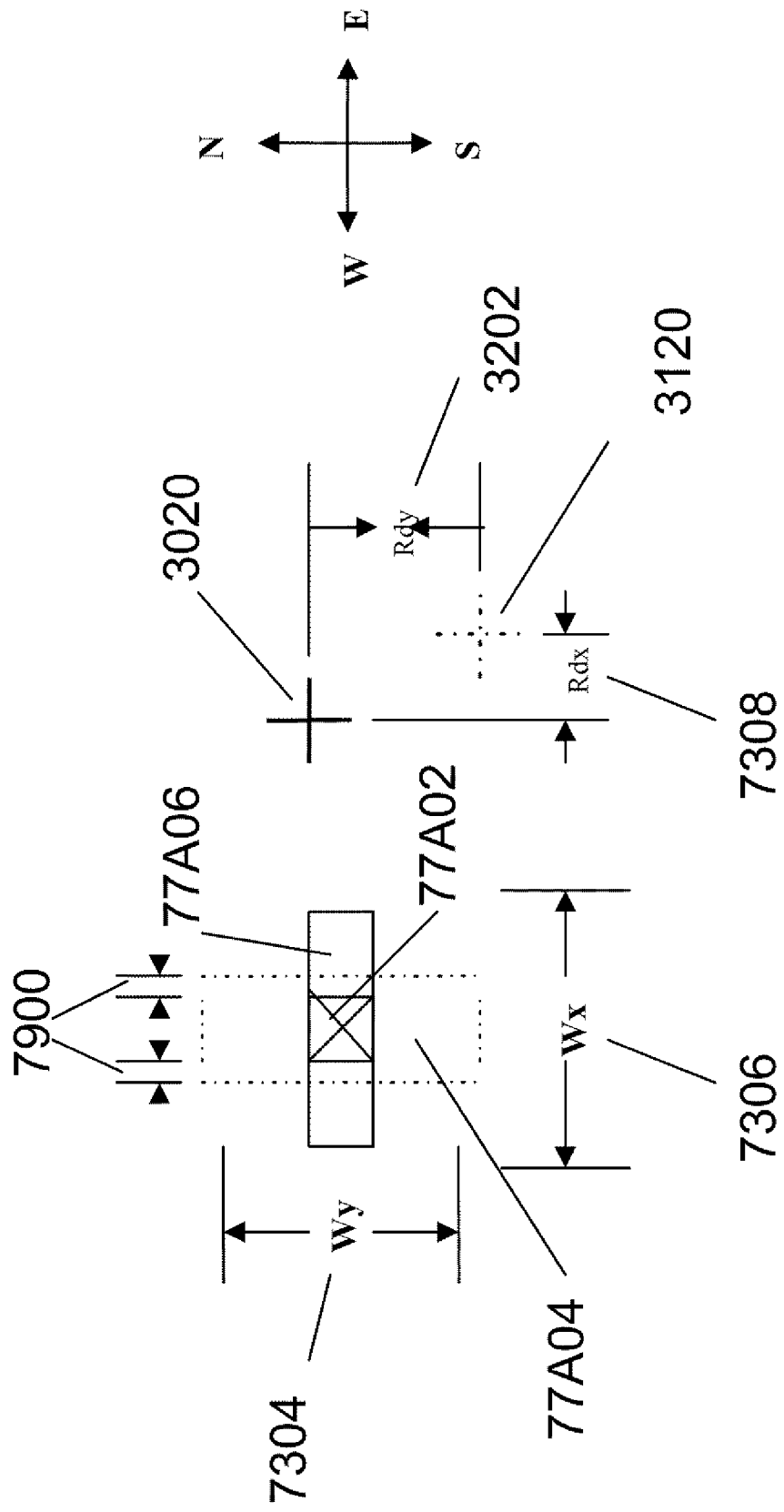
FIG. 79 is a drawing illustration of a connection strip.

Alternatively, to increase the density of thru layer via connections in the donor wafer layer to layer via channel, the donor landing strip 77A06 may be designed to be less than Wx 7306 in length by utilizing increases 7900 in the width of the landing strip in the House 77A04 and offsetting the through layer via 77A02 properly as illustrated in FIG. 79. The landing strips 77A04 and 77A06 may be aligned as described previously. Via 77A02 may be aligned to the main wafer alignment mark 3120 with Rdy offset in the North-South direction, and in the East-West direction to the acceptor wafer 808 alignment mark 3120 as described previously plus an additional shift towards East. The offset size may be equal to the reduction of the donor wafer landing strip 77A06.

In an additional embodiment, a block of a non repeating pattern device structures may be prepared on a donor wafer and layer transferred using the above described techniques. This donor wafer of non-repeating pattern device structure may be a memory block of DRAM, or a block of Input-Output circuits, or any other block. A general connectivity structure 8002 may be used to connect the donor wafer non-repeating pattern device structure 8004 to the acceptor wafer—house wafer die 8000.

Figure 80:
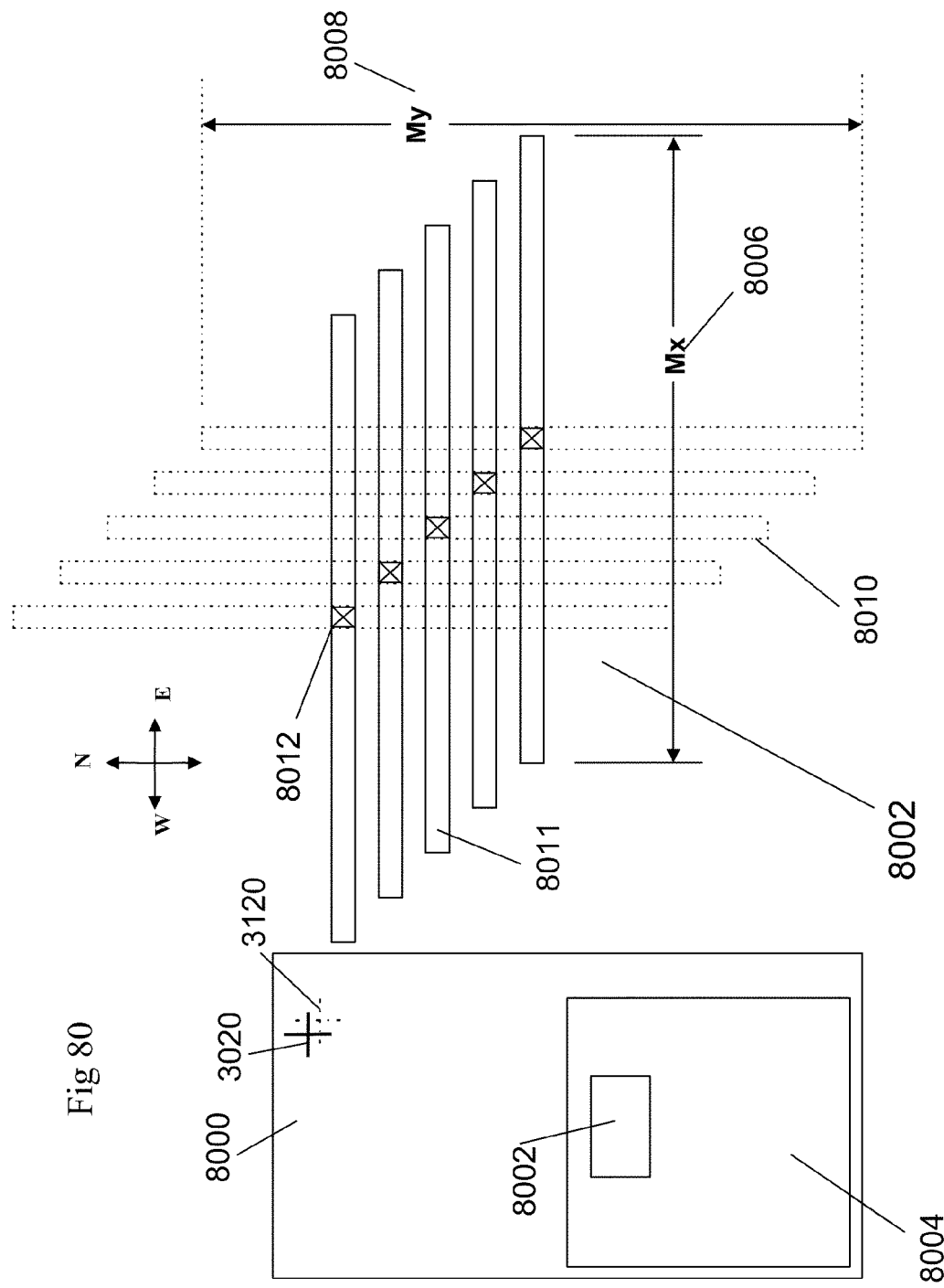
FIG. 80 is a drawing illustration of a connection strip array structure.

House 808 wafer die 8000 is illustrated in FIG. 80. The connectivity structure 8002 may be drawn inside or outside of the non-repeating structure 8004. Mx 8006 may be the maximum donor wafer to acceptor wafer 8000 misalignment plus any extension required by design rules as described previously in the East-West direction and My 8008 may be the maximum donor wafer to acceptor wafer misalignment plus any extension required by design rules as described previously in the North-South direction from the layer transfer process. Mx 8006 and My 8008 may also include incremental misalignment resulting from the angular misalignment of the wafer to wafer bonding not compensated for by the stepper overlay algorithms, and may include uncompensated donor wafer bow and warp. The acceptor wafer North-South landing strip 8010 may have a length of My 8008 aligned to the acceptor wafer alignment mark 3120. The donor wafer East-West landing strip 8011 may have a length of Mx 8006 aligned to the donor wafer alignment mark 3020. The through layer via 8012 connecting them may be aligned to the acceptor wafer alignment mark 3120 in the East West direction and to the donor wafer alignment mark 3020 in the North-South direction. For the purpose of illustration, the lower metal landing strip of the donor wafer was oriented East-West and the upper metal landing strip of the acceptor was oriented North-South. The orientation of the landing strips could be exchanged.

The donor wafer may comprise sections of repeating device structure elements such as those illustrated in FIG. 76 and FIG. 78B in combination with device structure elements that do not repeat. These two elements, one repeating and the other non-repeating, would be patterned separately since the non-repeating elements pattern should be aligned to the donor wafer alignment mark 3020, while the pattern for the repeating elements would be aligned to the acceptor wafer alignment mark 3120 with an offset (Rdx & Rdy) as was described previously. Accordingly, a variation of the general connectivity structure illustrated in FIG. 80 could be used to connect between to these two elements. The East-West landing strips 8011 could be aligned to the donor wafer alignment marks 3020 together with the non repeating elements and the North-South landing strips 8010 would be aligned to the acceptor wafer alignment mark 3120 with the offset together with the repeating elements pattern. The vias 8012 connecting these strips would need to be aligned in the North-South direction to the donor wafer alignment marks 3020 and in the East-West direction to the acceptor wafer alignment mark 3120 with the offset.

The above flows, whether single type transistor donor wafer or complementary type transistor donor wafer, could be repeated multiple times to build a multi level 3D monolithic integrated system. These flows could also provide a mix of device technologies in a monolithic 3D manner. For example, device I/O or analog circuitry such as, for example, phase-locked loops (PLL), clock distribution, or RF circuits could be integrated with CMOS logic circuits via layer transfer, or bipolar circuits could be integrated with CMOS logic circuits, or analog devices could be integrated with logic, and so on. Prior art shows alternative technologies of constructing 3D devices. The most common technologies are, either using thin film transistors (TFT) to construct a monolithic 3D device, or stacking prefabricated wafers and then using a through silicon via (TSV) to connect the prefabricated wafers. The TFT approach is limited by the performance of thin film transistors while the stacking approach is limited by the relatively large lateral size of the TSV via (on the order of a few microns) due to the relatively large thickness of the 3D layer (about 60 microns) and accordingly the relatively low density of the through silicon vias connecting them. According to many embodiments of the present invention that construct 3D IC based on layer transfer techniques, the transferred layer may be a thin layer of less than 0.4 micron. This 3D IC with transferred layer according to some embodiments of the present invention is in sharp contrast to TSV based 3D ICs in the prior art where the layers connected by TSV are more than 5 microns thick and in most cases more than 50 microns thick.

The alternative process flows presented in FIGS. 20 to 35, 40, 54 to 61, and 65 to 94 provides true monolithic 3D integrated circuits. It allows the use of layers of single crystal silicon transistors with the ability to have the upper transistors aligned to the underlying circuits as well as those layers aligned each to other and only limited by the Stepper capabilities. Similarly the contact pitch between the upper transistors and the underlying circuits is compatible with the contact pitch of the underlying layers. While in the best current stacking approach the stack wafers are a few microns thick, the alternative process flow presented in FIGS. 20 to 35, 40, 54 to 61, and 65 to 94 suggests very thin layers of typically 100 nm, but recent work has demonstrated layers approximately 20 nm thin.

Accordingly the presented alternatives allow for true monolithic 3D devices. This monolithic 3D technology provides the ability to integrate with full density, and to be scaled to tighter features, at the same pace as the semiconductor industry.

Additionally, true monolithic 3D devices allow the formation of various sub-circuit structures in a spatially efficient configuration with higher performance than 2D equivalent structures. Illustrated below are some examples of how a 3D 'library' of cells may be constructed in the true monolithic 3D fashion.

Figure 42:
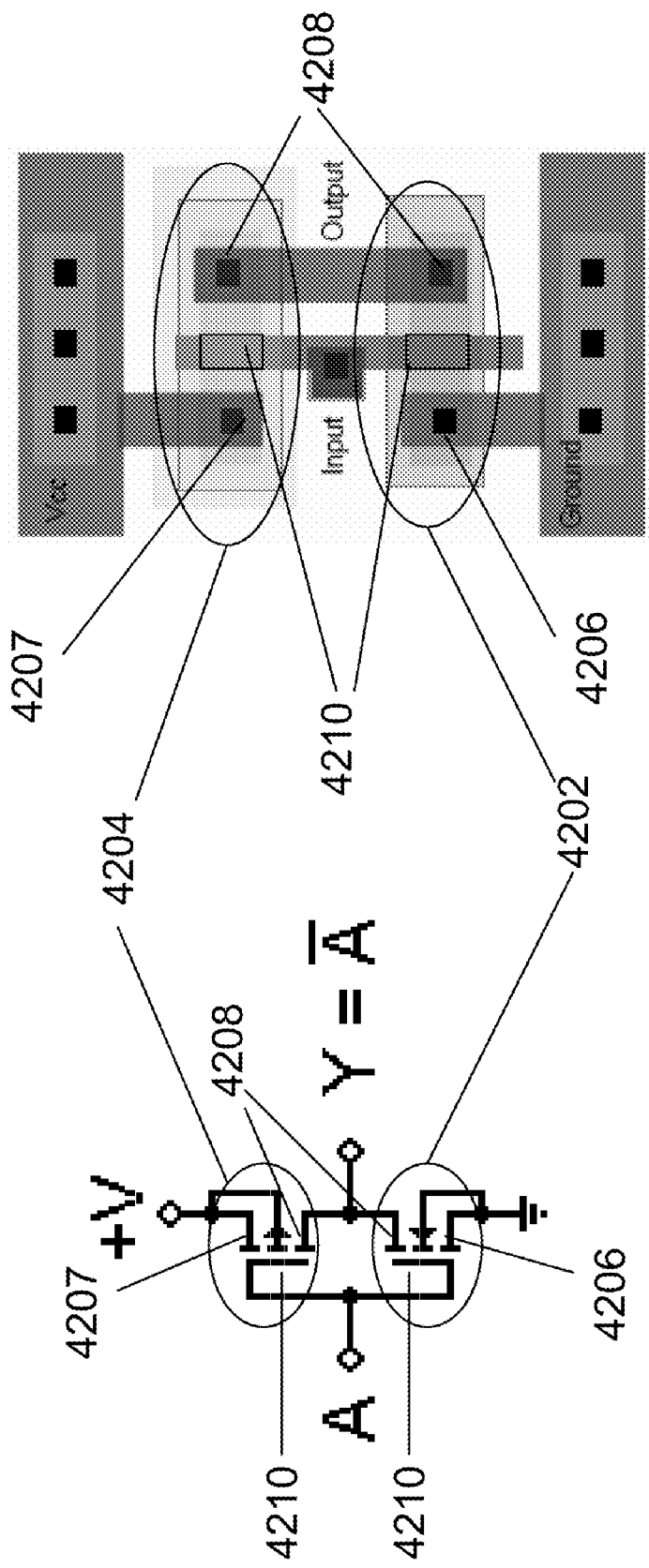
FIG. 42 is a drawing illustration of an inverter cell.

FIG. 42 illustrates a typical 2D CMOS inverter layout and schematic diagram where the NMOS transistor 4202 and the PMOS transistor 4204 are laid out side by side and are in differently doped wells. The NMOS source 4206 is typically grounded, the NMOS and PMOS drains 4208 are electrically tied together, the NMOS & PMOS gates 4210 are electrically tied together, and the PMOS 4207 source is tied to +Vdd. The structure built in 3D described below will take advantage of these connections in the $3^{rd}$ dimension.

Figure 43A:
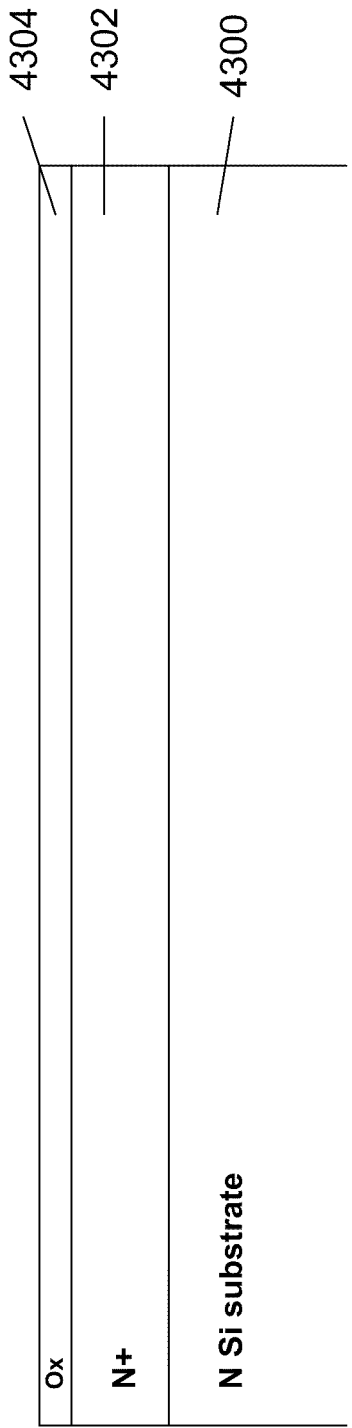
FIG. 43 A-C is a drawing illustration of preparation steps for formation of a 3D cell.
Figure 43B:
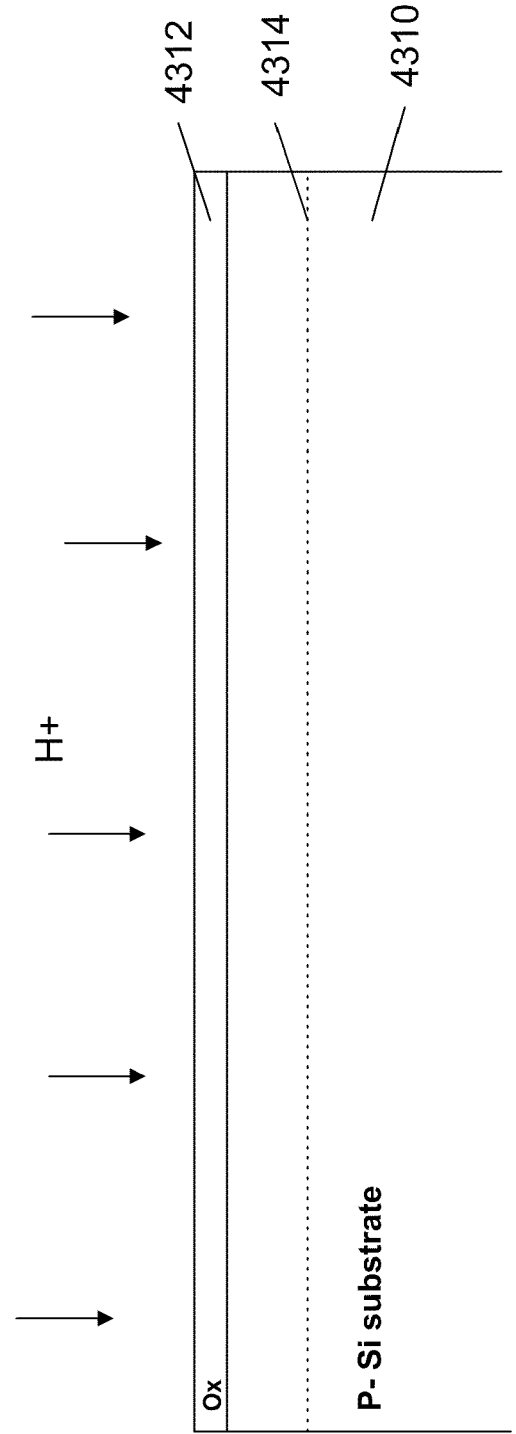
Figure 43C:
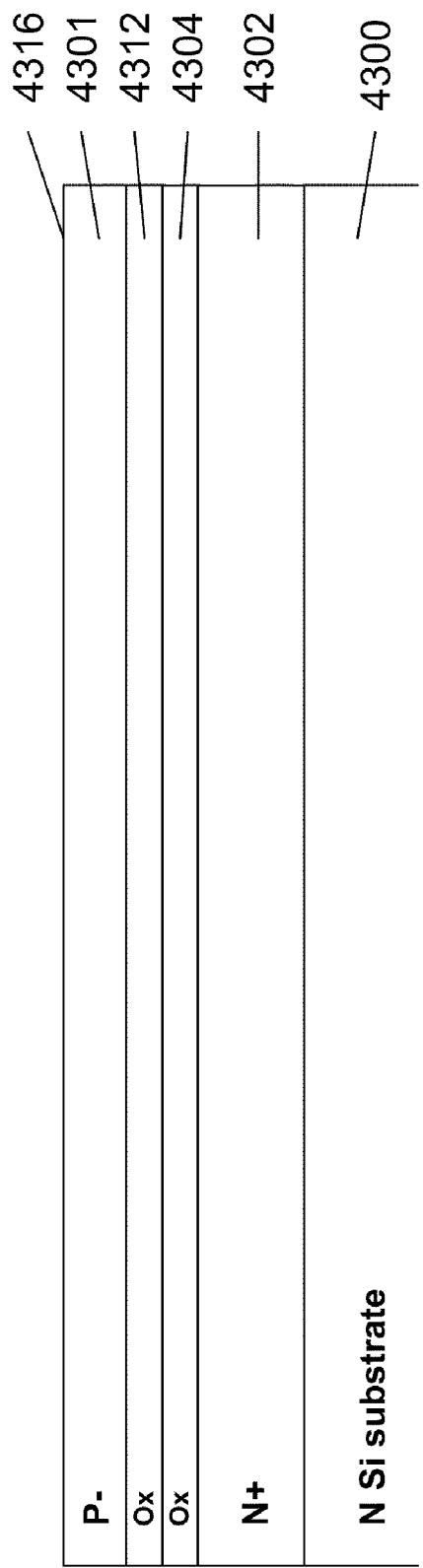

An acceptor wafer is preprocessed as illustrated in FIG. 43A. A heavily doped N single crystal silicon wafer 4300 may be implanted with a heavy dose of N+ species, and annealed to create an even lower resistivity layer 4302. Alternatively, a high temperature resistant metal such as Tungsten may be added as a low resistance interconnect layer, as a sheet layer or as a defined geometry metallization. An oxide 4304 is grown or deposited to prepare the wafer for bonding. A donor wafer is preprocessed to prepare for layer transfer as illustrated in FIG. 43B. FIG. 43B is a drawing illustration of the pre-processed donor wafer used for a layer transfer. A P− wafer 4310 is processed to make it ready for a layer transfer by a deposition or growth of an oxide 4312, surface plasma treatments, and by an implant of an atomic species such as H+ preparing the SmartCut cleaving plane 4314. Now a layer-transfer-flow may be performed to transfer the pre-processed single crystal silicon donor wafer on top of the acceptor wafer as illustrated in FIG. 43C. The cleaved surface 4316 may or may not be smoothed by a combination of CMP, chemical polish, and epitaxial (EPI) smoothing techniques.

Figure 44E:
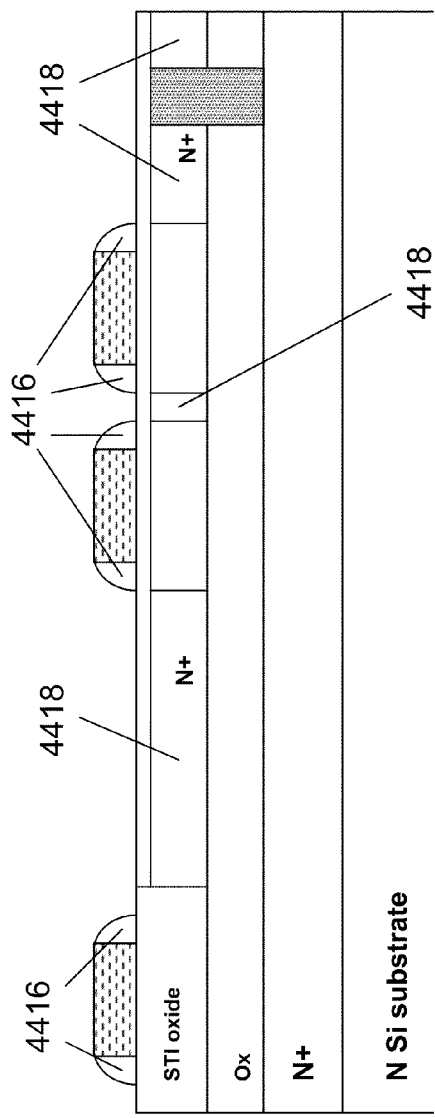
FIG. 44 A-F is a drawing illustration of steps for formation of a 3D cell.

A process flow to create devices and interconnect to build the 3D library is illustrated in FIGS. 44A to G. As illustrated in FIG. 44A, a polish stop layer 4404, such as silicon nitride or amorphous carbon, may be deposited after a protecting oxide layer 4402. The NMOS source to ground connection 4406 is masked and etched to contact the heavily doped N+ layer 4302 that serves as a ground plane. This may be done at typical contact layer size and precision. For the sake of clarity, the two oxide layers, 4304 from the acceptor and 4312 from the donor wafer, are combined and designated as 4400. The NMOS source to ground connection 4406 is filled with a deposition of heavily doped polysilicon or amorphous silicon, or a high melting point metal such as tungsten, and then chemically mechanically polished as illustrated in FIG. 44B to the level of the protecting oxide layer 4404.

Now a standard NMOS transistor formation process flow is performed, with two exceptions. First, no photolithographic masking steps are used for an implant step that differentiates NMOS and PMOS devices, as only the NMOS devices are being formed now. Second, high temperature anneal steps may or may not be done during the NMOS formation, as some or all of the necessary anneals can be done after the PMOS formation described later. A typical shallow trench (STI) isolation region 4410 is formed between the eventual NMOS transistors by masking, plasma etching of the unmasked regions of P− layer 4301 to the oxide layer 4400, stripping the masking layer, depositing a gap-fill oxide, and chemical mechanically polishing the gap-fill oxide flat as illustrated in FIG. 44C. Threshold adjust implants may or may not be performed at this time. The silicon surface is cleaned of remaining oxide with an HF (Hydrofluoric Acid) etch.

A gate oxide 4411 is thermally grown and doped polysilicon is deposited to form the gate stack. The gate stack is lithographically defined and etched, creating NMOS gates 4412 and the poly on STI interconnect 4414 as illustrated in FIG. 44D. Alternatively, a high-k metal gate process sequence may be utilized at this stage to form the gate stacks 4412 and interconnect over STI 4414. Gate stack self aligned LDD (Lightly Doped Drain) and halo punch-thru implants may be performed at this time to adjust junction and transistor breakdown characteristics.

Figure 44F:
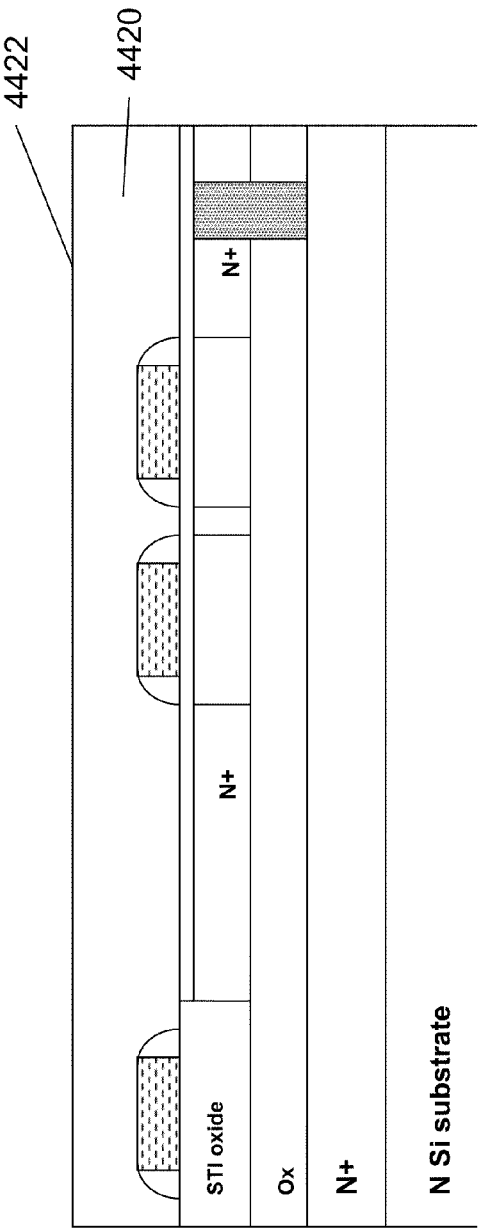

FIG. 44E illustrates a typical spacer deposition of oxide and nitride and a subsequent etchback, to form implant offset spacers 4416 on the gate stacks and then a self aligned N+ source and drain implant is performed to create the NMOS transistor source and drain 4418. High temperature anneal steps may or may not be done at this time to activate the implants and set initial junction depths. A self aligned silicide may then be formed. Additionally, one or more metal interconnect layers with associated contacts and vias (not shown) may be constructed utilizing standard semiconductor manufacturing processes. The metal layer may be constructed at lower temperature using such metals as Copper or Aluminum, or may be constructed with refractory metals such as Tungsten to provide high temperature utility at greater than 400 degrees Centigrade. A thick oxide 4420 may be deposited as illustrated in FIG. 44F and CMP'd (chemical mechanically polished) flat. The wafer surface 4422 may be treated with a plasma activation in preparation to be an acceptor wafer for the next layer transfer.

A donor wafer to create PMOS devices is preprocessed to prepare for layer transfer as illustrated in FIG. 45A. An N− wafer 4502 is processed to make it ready for a layer transfer by a deposition or growth of an oxide 4504, surface plasma treatments, and by an implant of an atomic species, such as H+, preparing the SmartCut cleaving plane 4506.

Now a layer-transfer-flow may be performed to transfer the pre-processed single crystal silicon donor wafer on top of the acceptor wafer as illustrated in FIG. 45B, bonding the acceptor wafer oxide 4420 to the donor wafer oxide 4504. To optimize the PMOS mobility, the donor wafer may be rotated 90 degrees with respect to the acceptor wafer as part of the bonding process to facilitate creation of the PMOS channel in the <110> silicon plane direction. The cleaved surface 4508 may or may not be smoothed by a combination of CMP, chemical polish, and epitaxial (EPI) smoothing techniques.

For the sake of clarity, the two oxide layers, 4420 from the acceptor and 4504 from the donor wafer, are combined and designated as 4500. Now a standard PMOS transistor formation process flow is performed, with one exception. No photolithographic masking steps are used for the implant steps that differentiate NMOS and PMOS devices, as only the PMOS devices are being formed now. An advantage of this 3D cell structure is the independent formation of the PMOS transistors and the NMOS transistors. Therefore, each transistor formation may be optimized independently. This may be accomplished by the independent selection of the crystal orientation, various stress materials and techniques, such as, for example, doping profiles, material thicknesses and compositions, temperature cycles, and so forth.

Figure 45C:
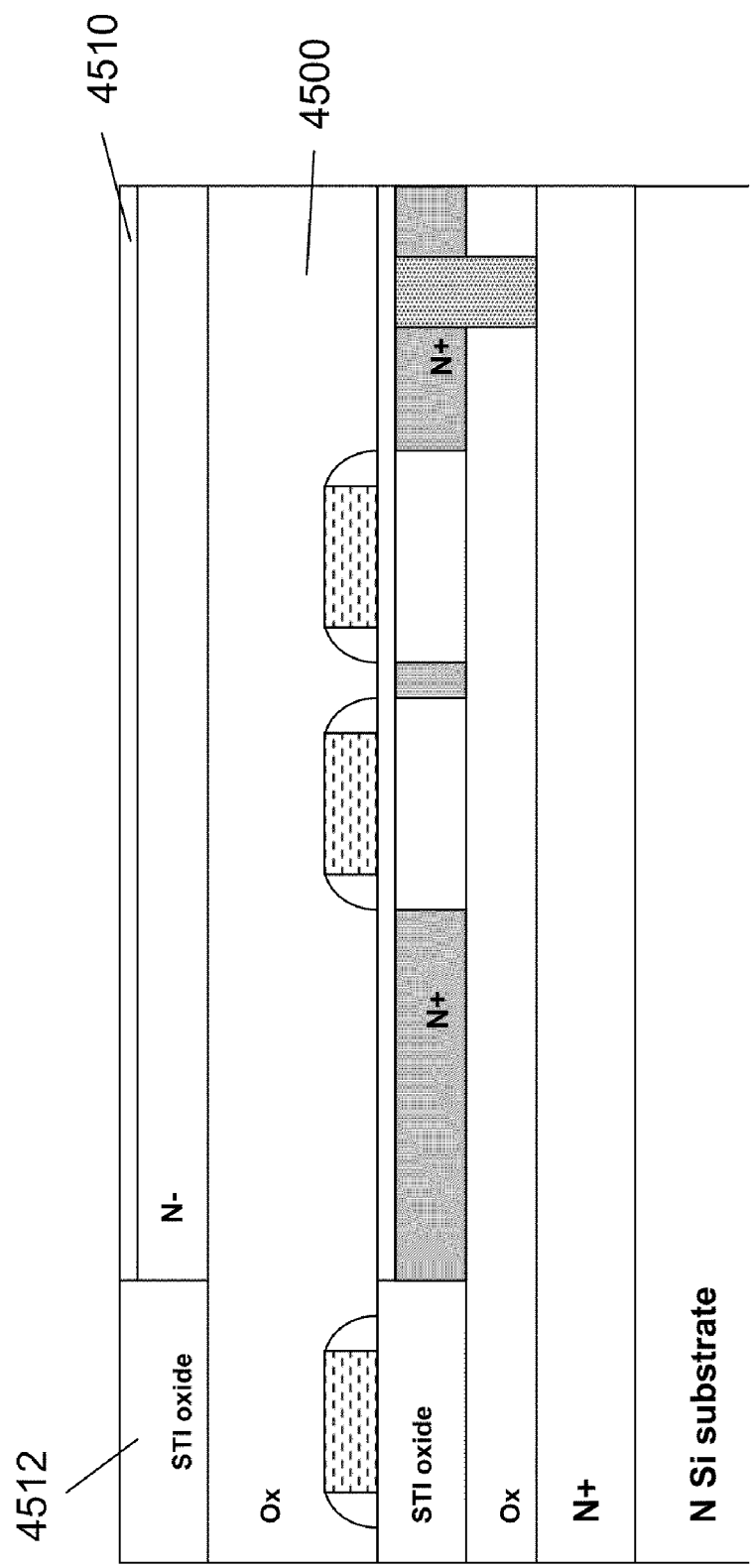
FIG. 45 A-G is a drawing illustration of steps for formation of a 3D cell.

A polishing stop layer, such as silicon nitride or amorphous carbon, may be deposited after a protecting oxide layer 4510. A typical shallow trench (STI) isolation region 4512 is formed between the eventual PMOS transistors by lithographic definition, plasma etching to the oxide layer 4500, depositing a gap-fill oxide, and chemical mechanically polishing flat as illustrated in FIG. 45C. Threshold adjust implants may or may not be performed at this time.

Figure 45D:
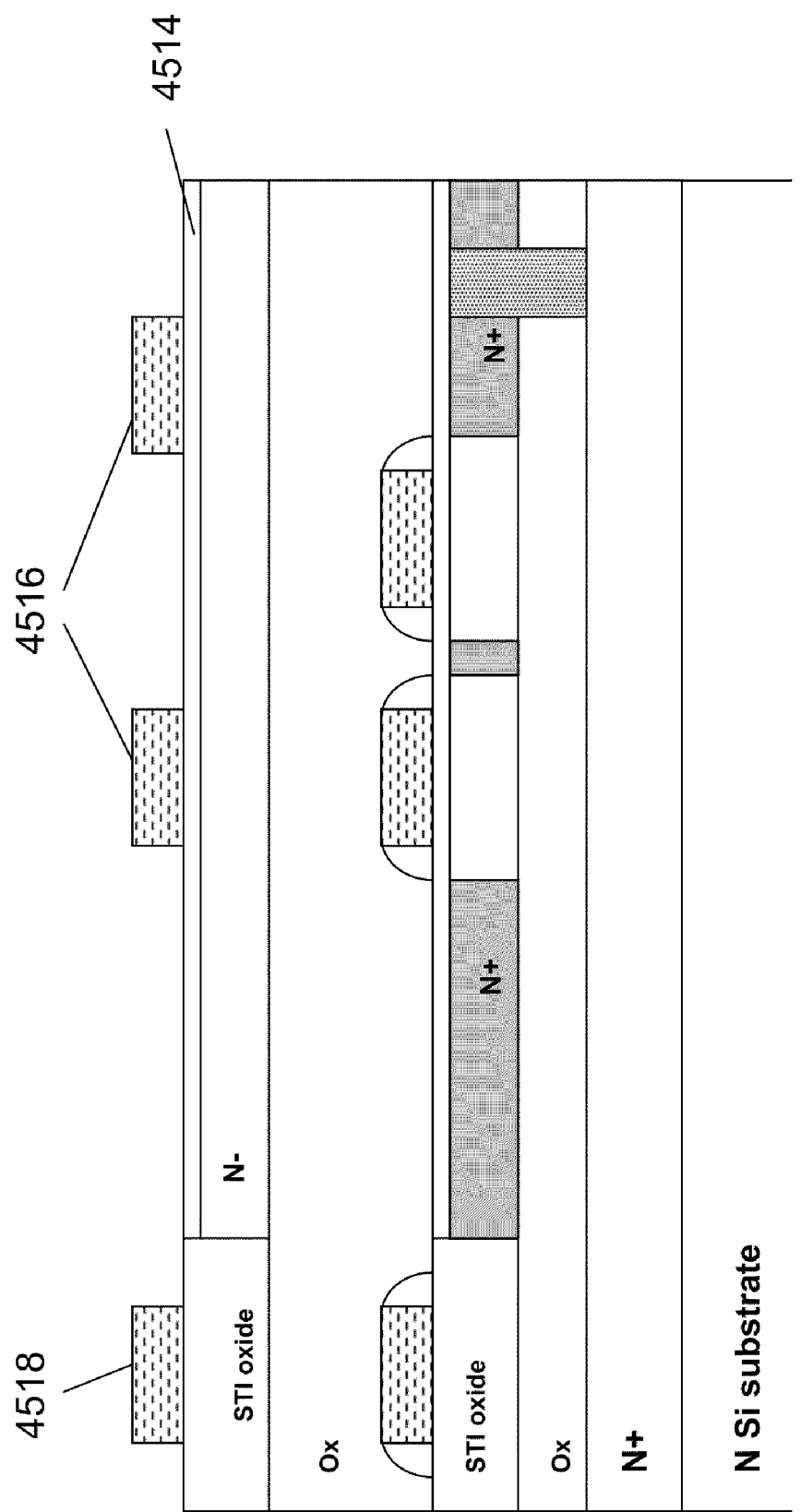

The silicon surface is cleaned of remaining oxide with an HF (Hydrofluoric Acid) etch. A gate oxide 4514 is thermally grown and doped polysilicon is deposited to form the gate stack. The gate stack is lithographically defined and etched, creating PMOS gates 4516 and the poly on STI interconnect 4518 as illustrated in FIG. 45D. Alternatively, a high-k metal gate process sequence may be utilized at this stage to form the gate stacks 4516 and interconnect over STI 4518. Gate stack self aligned LDD (Lightly Doped Drain) and halo punch-thru implants may be performed at this time to adjust junction and transistor breakdown characteristics.

Figure 45E:
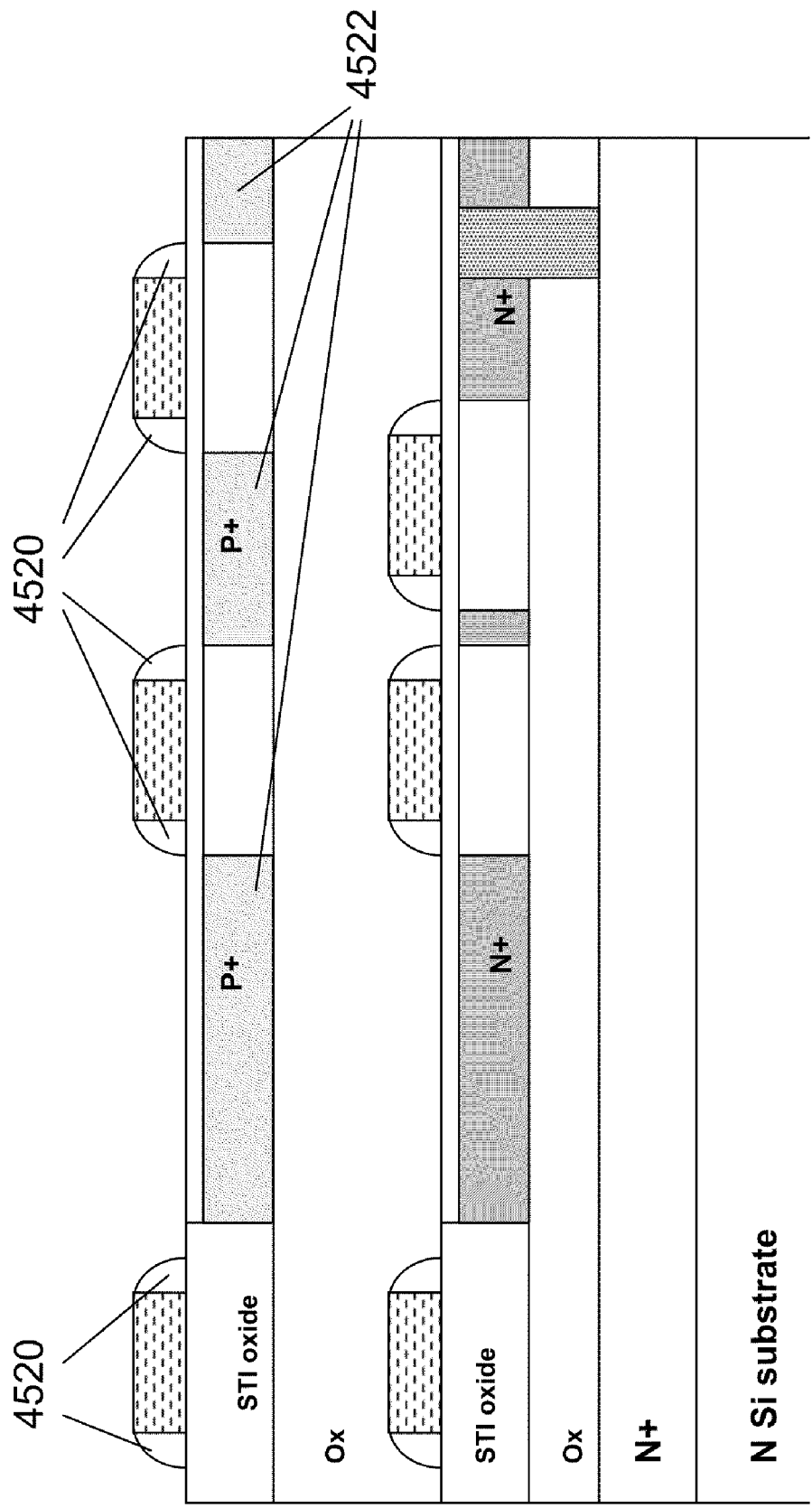

FIG. 45E illustrates a typical spacer deposition of oxide and nitride and a subsequent etchback, to form implant offset spacers 4520 on the gate stacks and then a self aligned P+ source and drain implant is performed to create the PMOS transistor source and drain regions 4522. Thermal anneals to activate implants and set junctions in both the PMOS and NMOS devices may be performed with RTA (Rapid Thermal Anneal) or furnace thermal exposures. Alternatively, laser annealing may be utilized after the NMOS and PMOS sources and drain implants to activate implants and set the junctions. Optically absorptive and reflective layers as described previously may be employed to anneal implants and activate junctions.

Figure 45F:
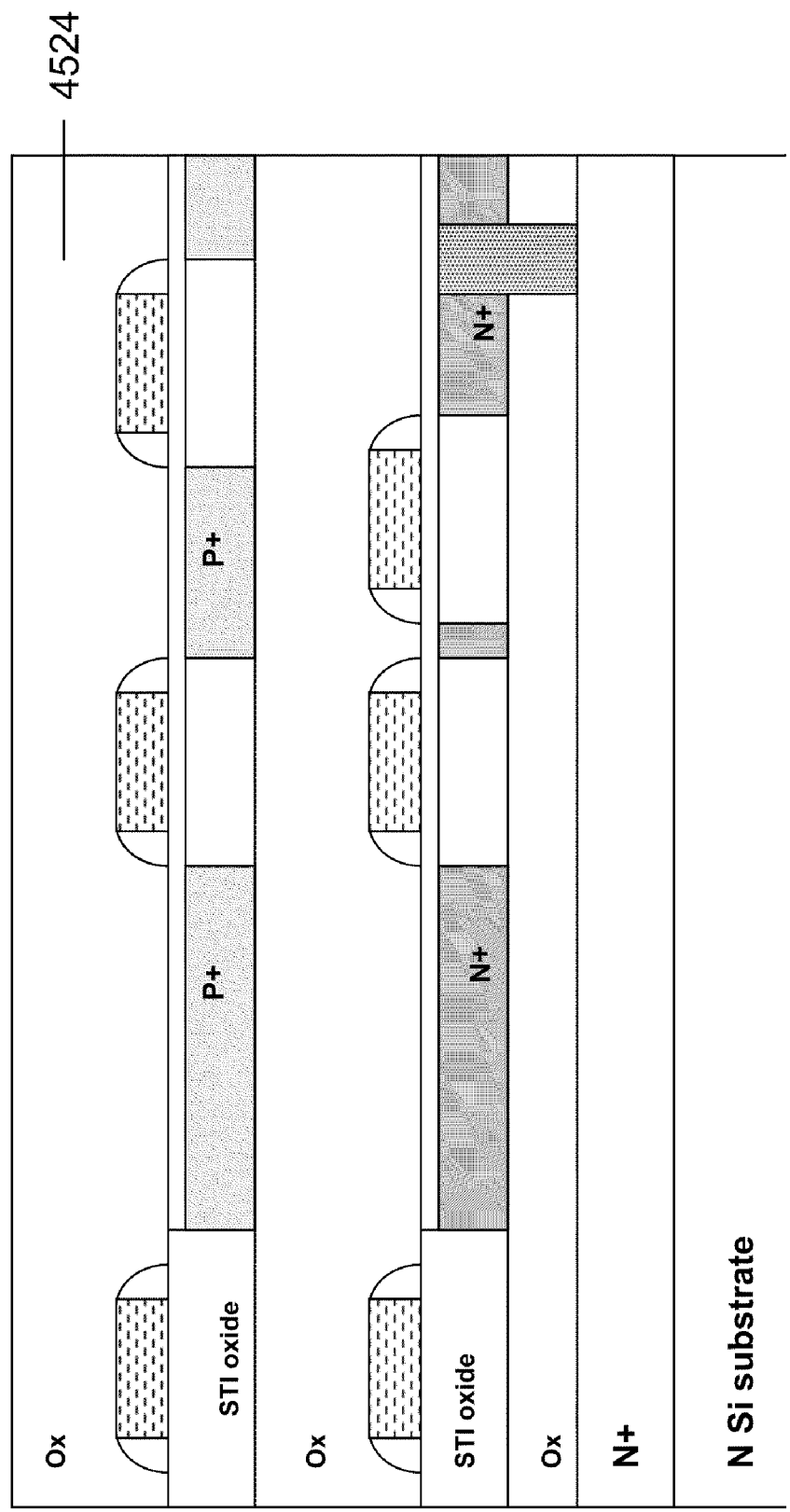

A thick oxide 4524 is deposited as illustrated in FIG. 45F and CMP'ed (chemical mechanically polished) flat.

Figure 45G:
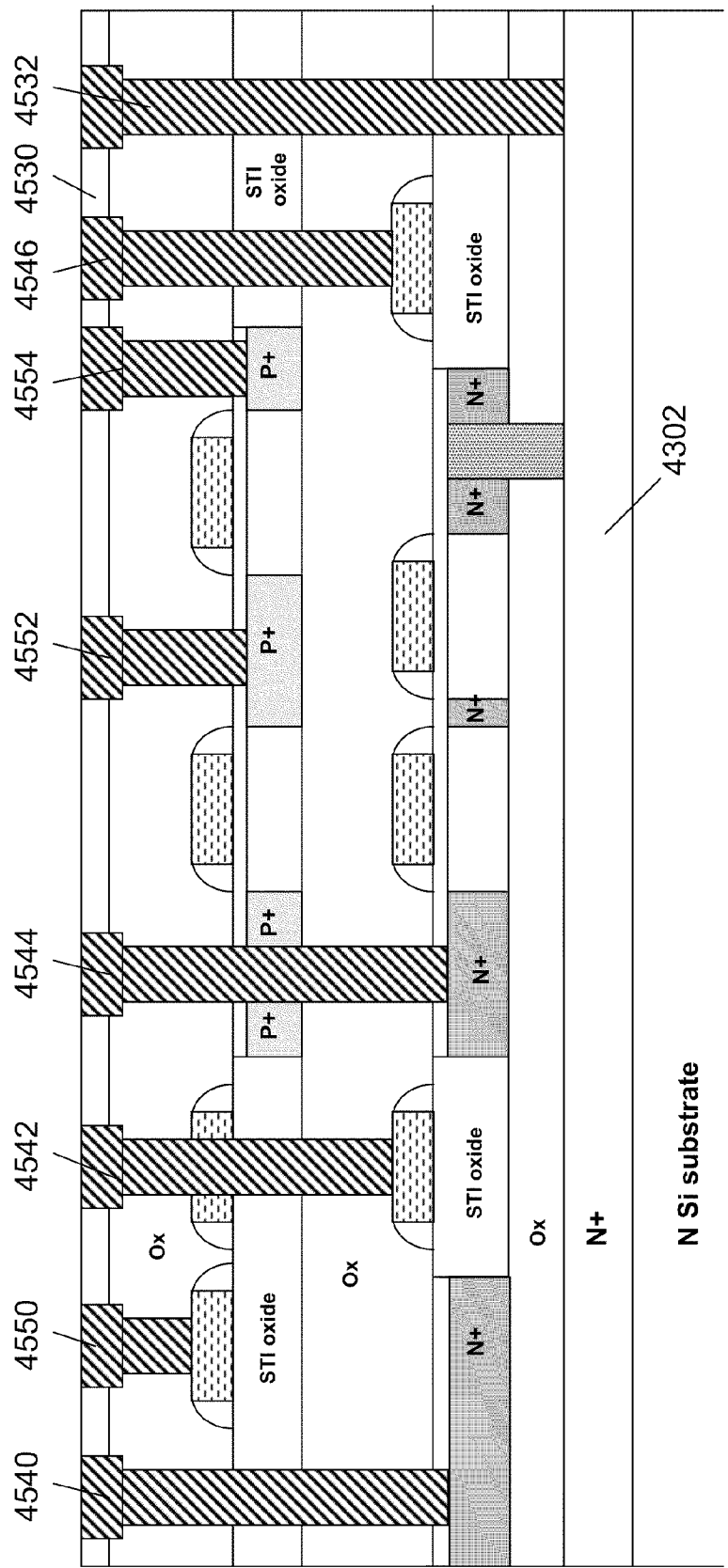

FIG. 45G illustrates the formation of the three groups of eight interlayer contacts. An etch stop and polishing stop layer or layers 4530 may be deposited, such as silicon nitride or amorphous carbon. First, the deepest contact 4532 to the N+ ground plane layer 4302, as well as the NMOS drain only contact 4540 and the NMOS only gate on STI contact 4546 are masked and etched in a first contact step. Then the NMOS & PMOS gate on STI interconnect contact 4542 and the NMOS and PMOS drain contact 4544 are masked and etched in a second contact step. Then the PMOS level contacts are masked and etched: the PMOS gate interconnect on STI contact 4550, the PMOS only source contact 4552, and the PMOS only drain contact 4554 in a third contact step. Alternatively, the shallowest contacts may be masked and etched first, followed by the mid-level, and then the deepest contacts. The metal lines are mask defined and etched, filled with barrier metals and copper interconnect, and CMP'ed in a normal Dual Damascene interconnect scheme, thereby completing the eight types of contact connections.

Figure 46A:
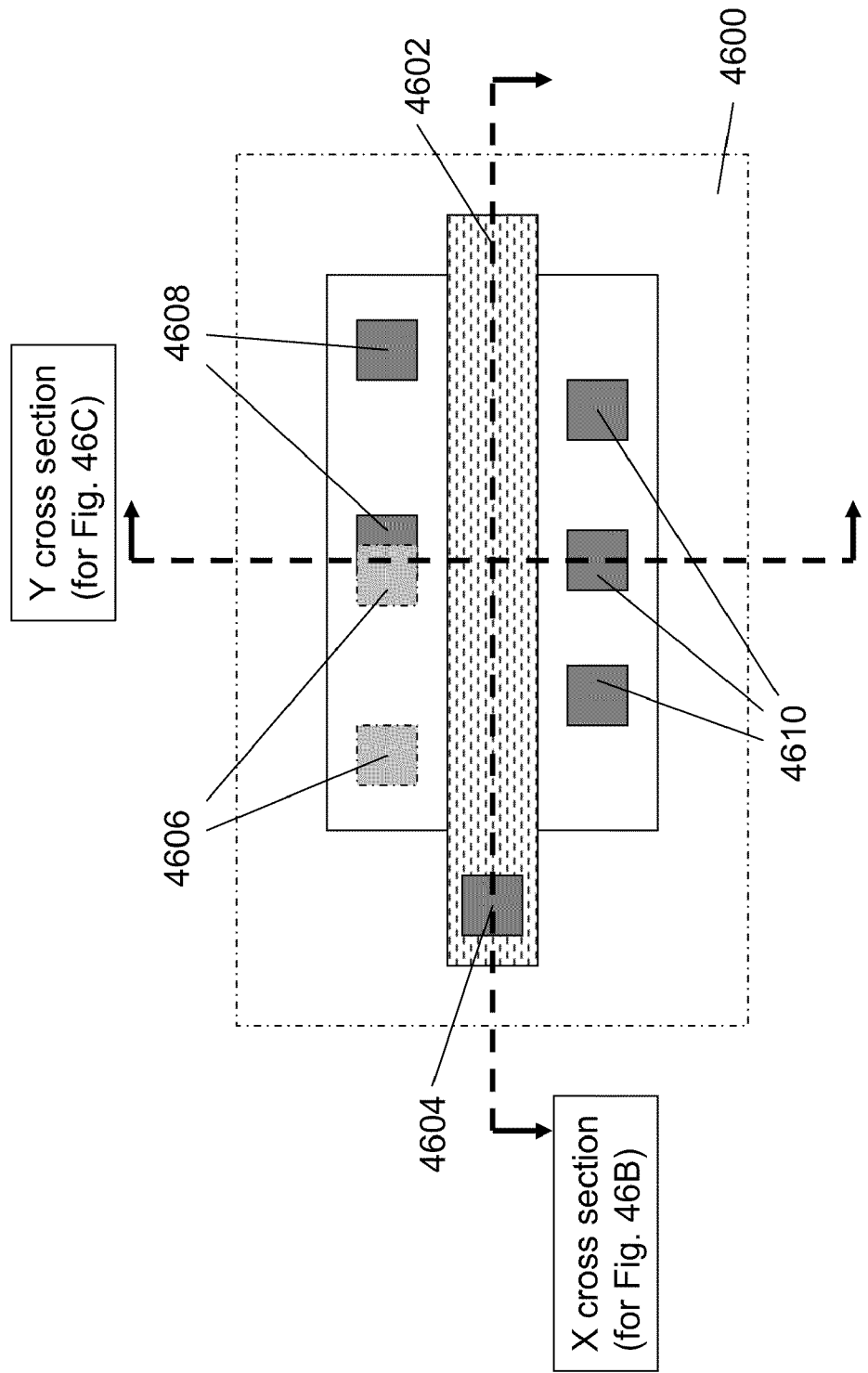
FIG. 46 A-C is a drawing illustration of a layout and cross sections of a 3D inverter cell.
Figure 46B:
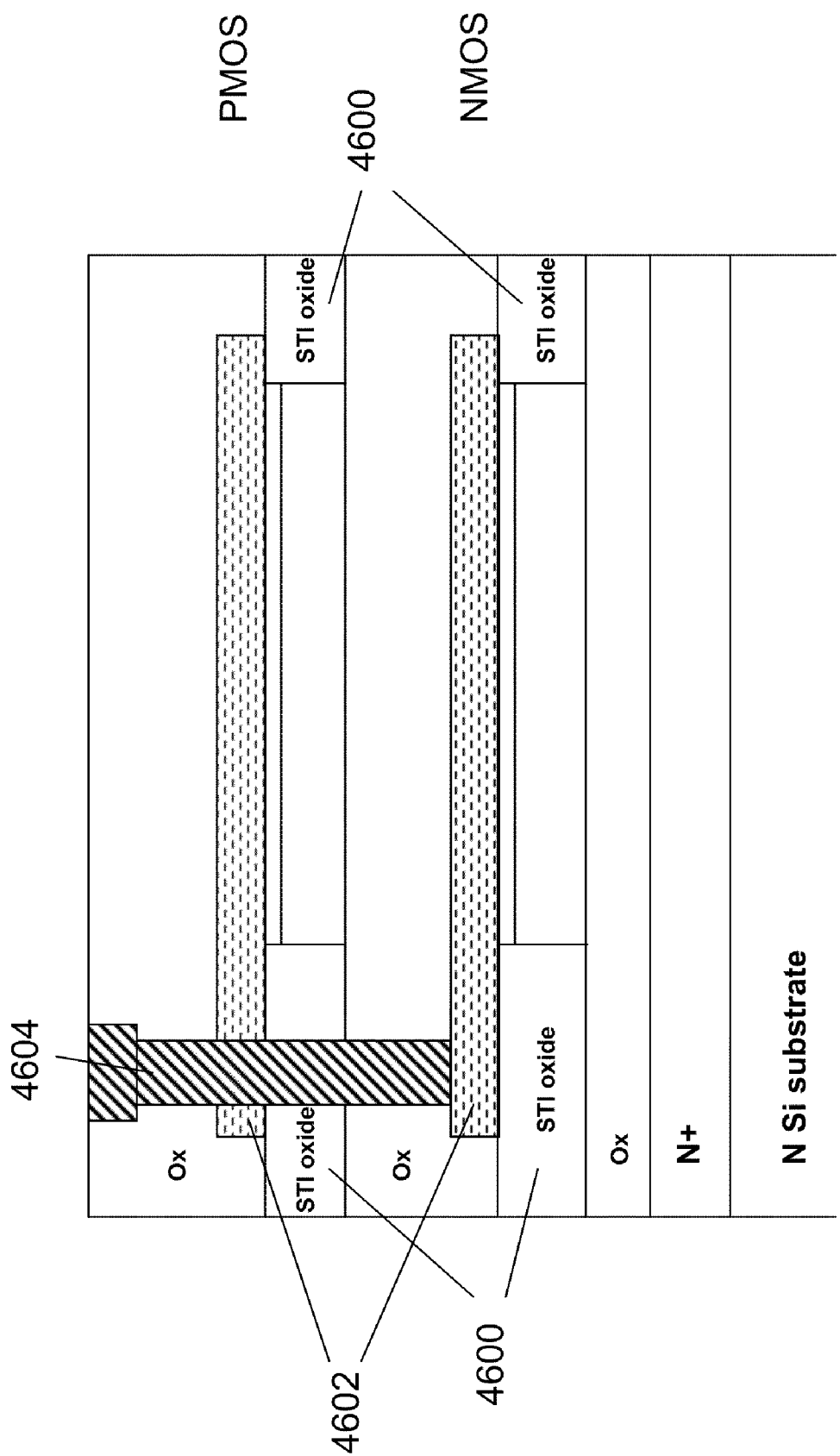
Figure 46C:
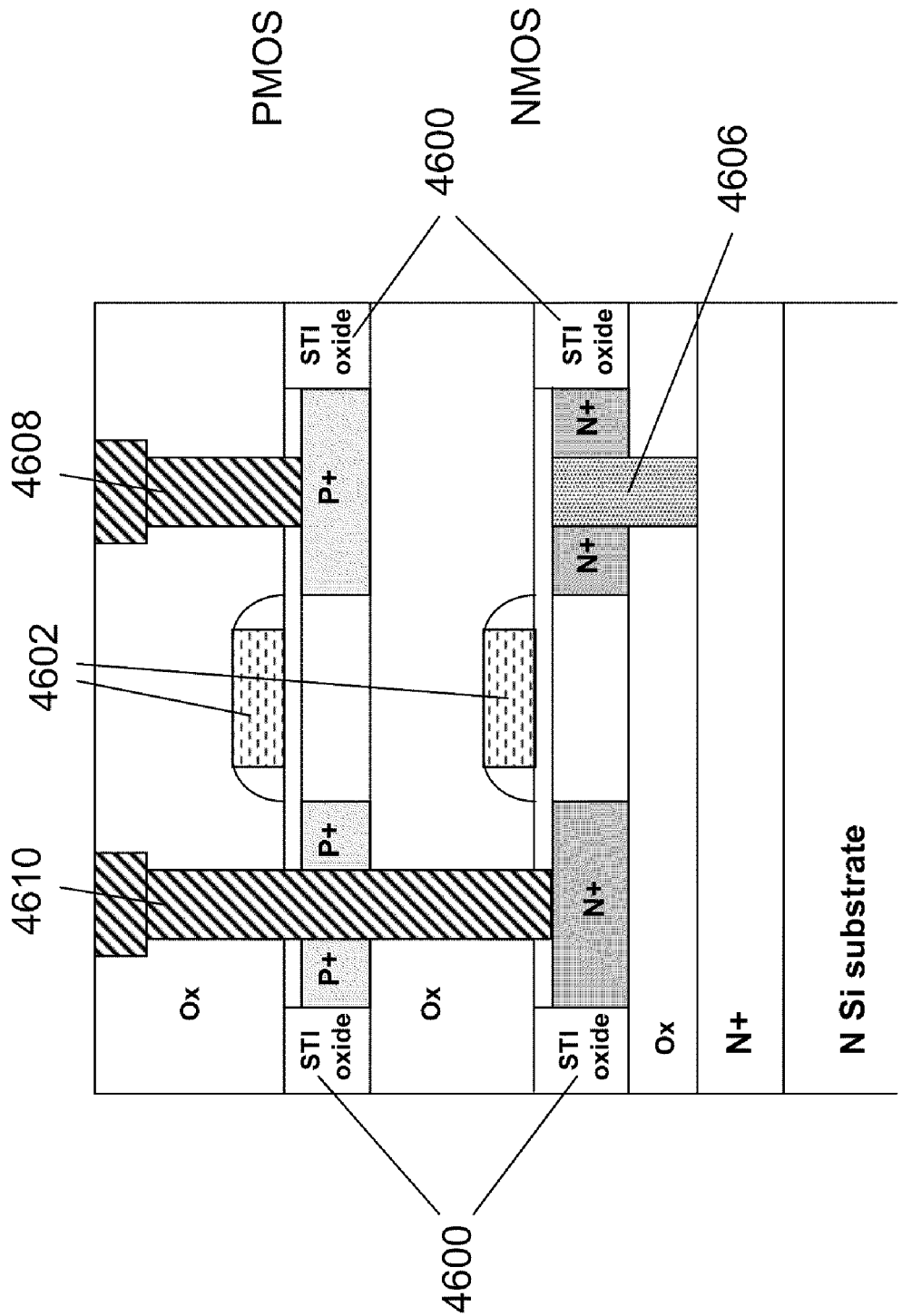

With reference to the 2D CMOS inverter cell schematic and layout illustrated in FIG. 42, the above process flow may be used to construct a compact 3D CMOS inverter cell example as illustrated in FIGS. 46A thru 46C. The topside view of the 3D cell is illustrated in FIG. 46A where the STI (shallow trench isolation) 4600 for both NMOS and PMOS is drawn coincident and the PMOS is on top of the NMOS.

The X direction cross sectional view is illustrated in FIG. 46B and the Y direction cross sectional view is illustrated in FIG. 46C. The NMOS and PMOS gates 4602 are drawn coincident and stacked, and are connected by an NMOS gate on STI to PMOS gate on STI contact 4604, which is similar to contact 4542 in FIG. 45G. This is the connection for inverter input signal A as illustrated in FIG. 42. The N+ source contact to the ground plane 4606, which is similar to contact 4406 in FIG. 44B, in FIGS. 46A & C makes the NMOS source to ground connection 4206 illustrated in FIG. 42. The PMOS source contacts 4608, which are similar to contact 4552 in FIG. 45G, make the PMOS source connection to +V 4207 as shown in FIG. 42. The NMOS and PMOS drain shared contacts 4610, which are similar to contact 4544 in FIG. 45G, make the shared connection 4208 as the output Y in FIG. 42. The ground to ground plane contact, similar to contact 4532 in FIG. 45G, is not shown. This contact may not be needed in every cell and may be shared.

Figure 47:
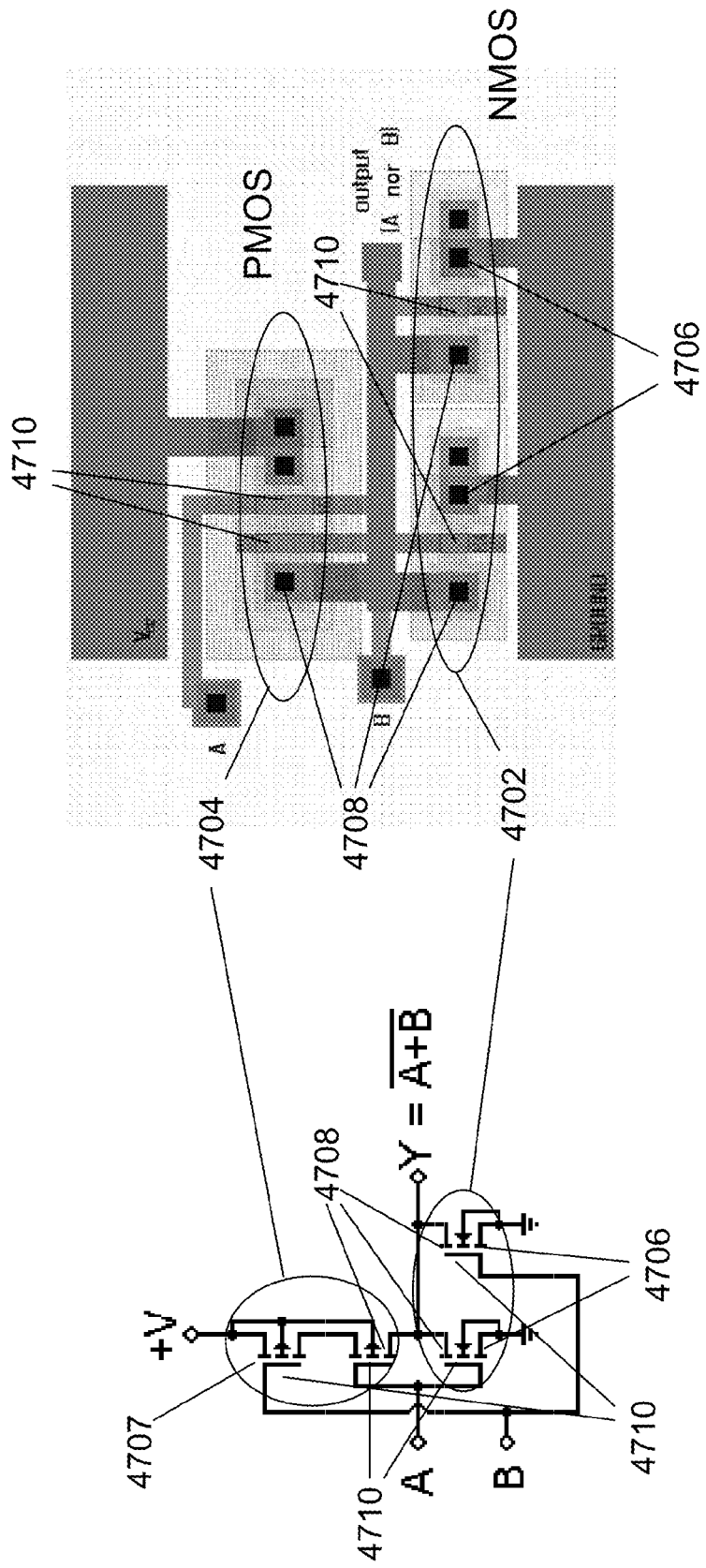
FIG. 47 is a drawing illustration of a 2-input NOR cell.

Other 3D logic or memory cells may be constructed in a similar fashion. An example of a typical 2D 2-input NOR cell schematic and layout is illustrated in FIG. 47. The NMOS transistors 4702 and the PMOS transistors 4704 are laid out side by side and are in differently doped wells. The NMOS sources 4706 are typically grounded, both of the NMOS drains and one of the PMOS drains 4708 are electrically tied together to generate the output Y, and the NMOS & PMOS gates 4710 are electrically paired together for input A or input B. The structure built in 3D described below will take advantage of these connections in the $3^{rd}$ dimension.

Figure 48B:
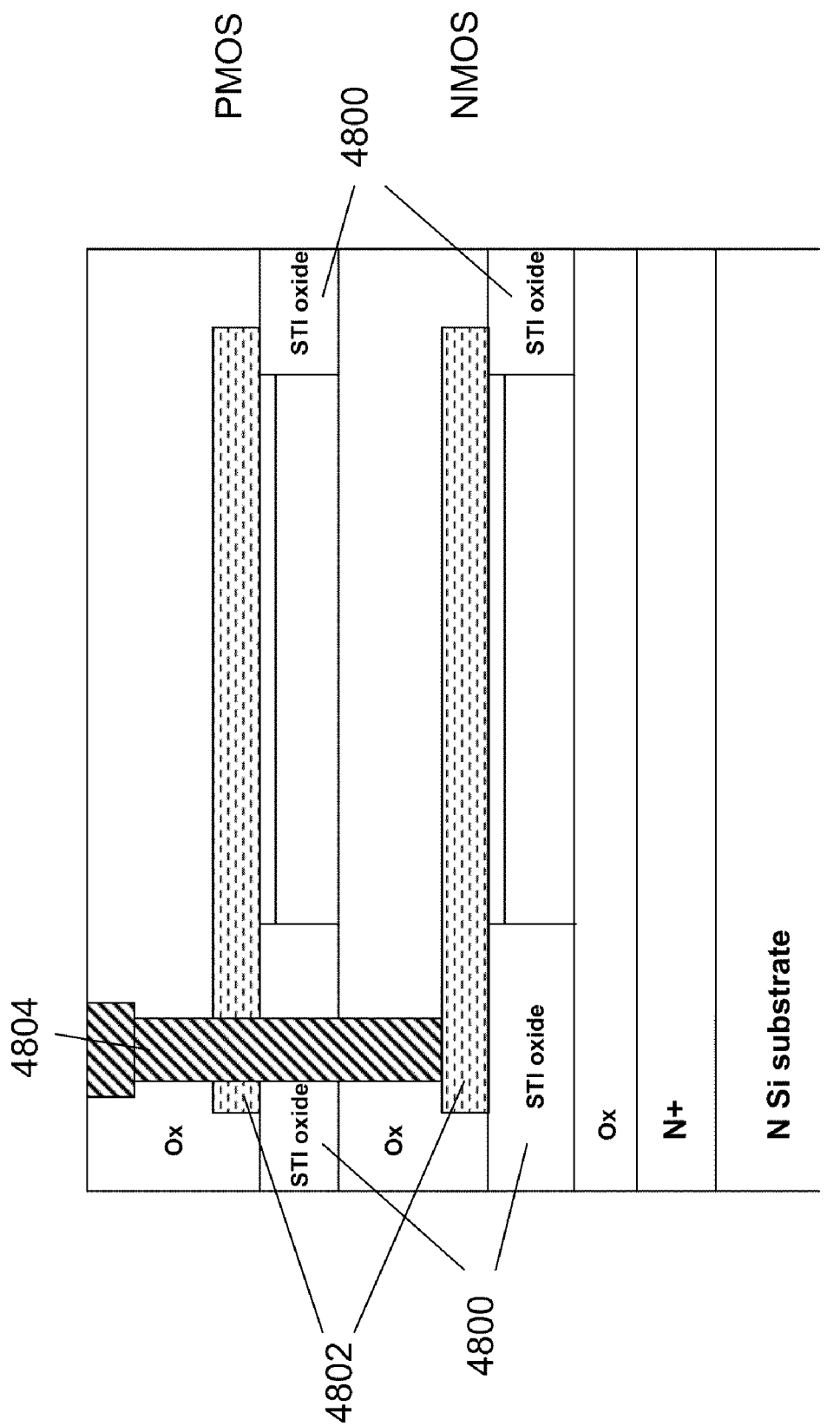
FIG. 48 A-C are drawing illustrations of a layout and cross sections of a 3D 2-input NOR cell.
Figure 48C:
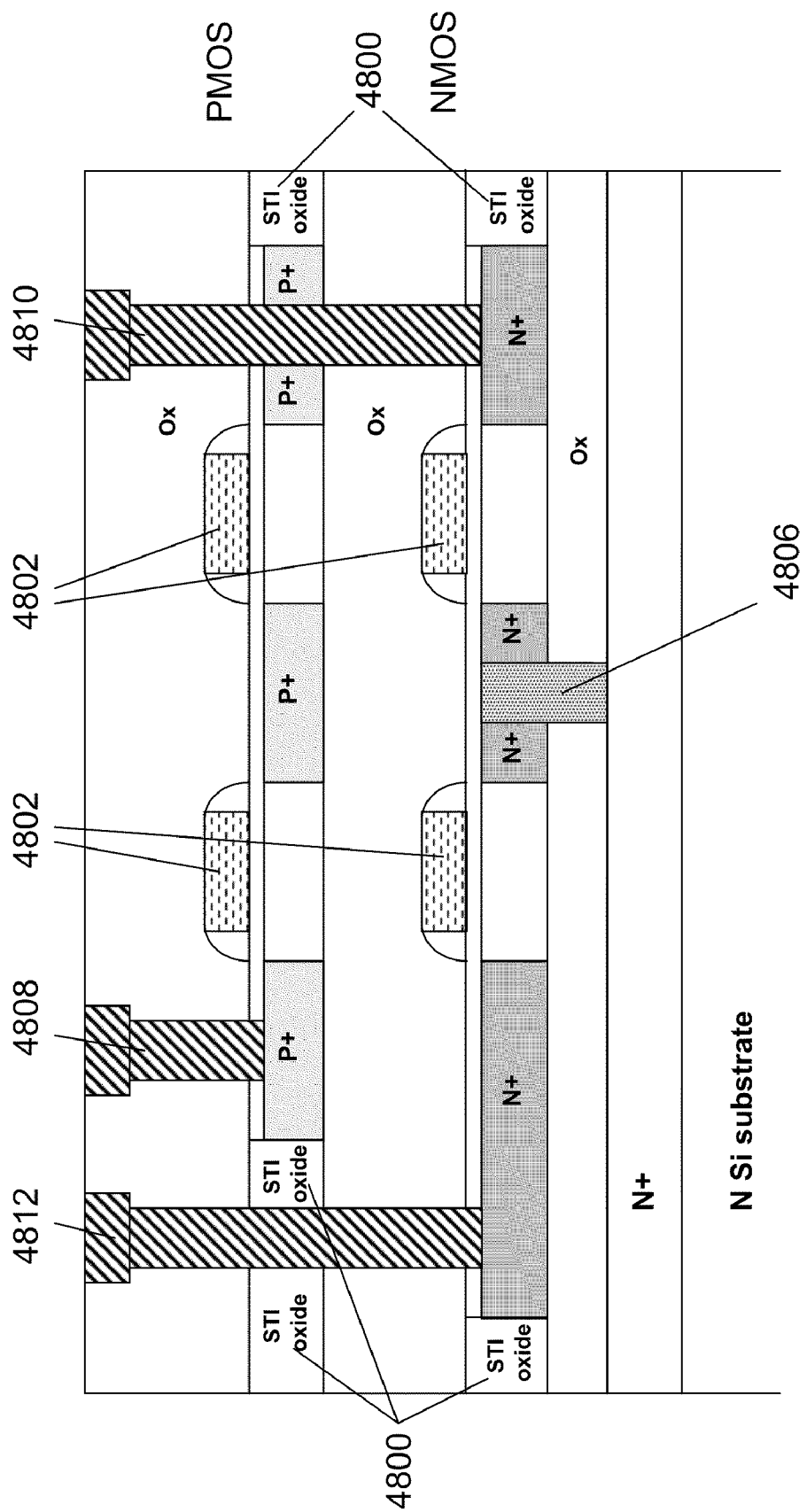

The above process flow may be used to construct a compact 3D 2-input NOR cell example as illustrated in FIGS. 48A thru 48C. The topside view of the 3D cell is illustrated in FIG. 48A where the STI (shallow trench isolation) 4800 for both NMOS and PMOS is drawn coincident on the bottom and sides, and not on the top silicon layer to allow NMOS drain only connections to be made. The cell X cross sectional view is illustrated in FIG. 48B and the Y cross sectional view is illustrated in FIG. 48C.

The NMOS and PMOS gates 4802 are drawn coincident and stacked, and each are connected by a NMOS gate on STI to PMOS gate on STI contact 4804, which is similar to contact 4542 in FIG. 45G. These are the connections for input signals A & B as illustrated in FIG. 47.

The N+ source contact to the ground plane 4806 in FIGS. 48A & C makes the NMOS source to ground connection 4706 illustrated in FIG. 47. The PMOS source contacts 4808, which are similar to contact 4552 in FIG. 45G, make the PMOS source connection to +V 4707 as shown in FIG. 47. The NMOS and PMOS drain shared contacts 4810, which are similar to contact 4544 in FIG. 45G, make the shared connection 4708 as the output Y in FIG. 47. The NMOS source contacts 4812, which are similar to contact 4540 in FIG. 45, make the NMOS connection to Output Y, which is connected to the NMOS and PMOS drain shared contacts 4810 with metal to form output Y in FIG. 47. The ground to ground plane contact, similar to contact 4532 in FIG. 45G, is not shown. This contact may not be needed in every cell and may be shared.

Figure 49A:
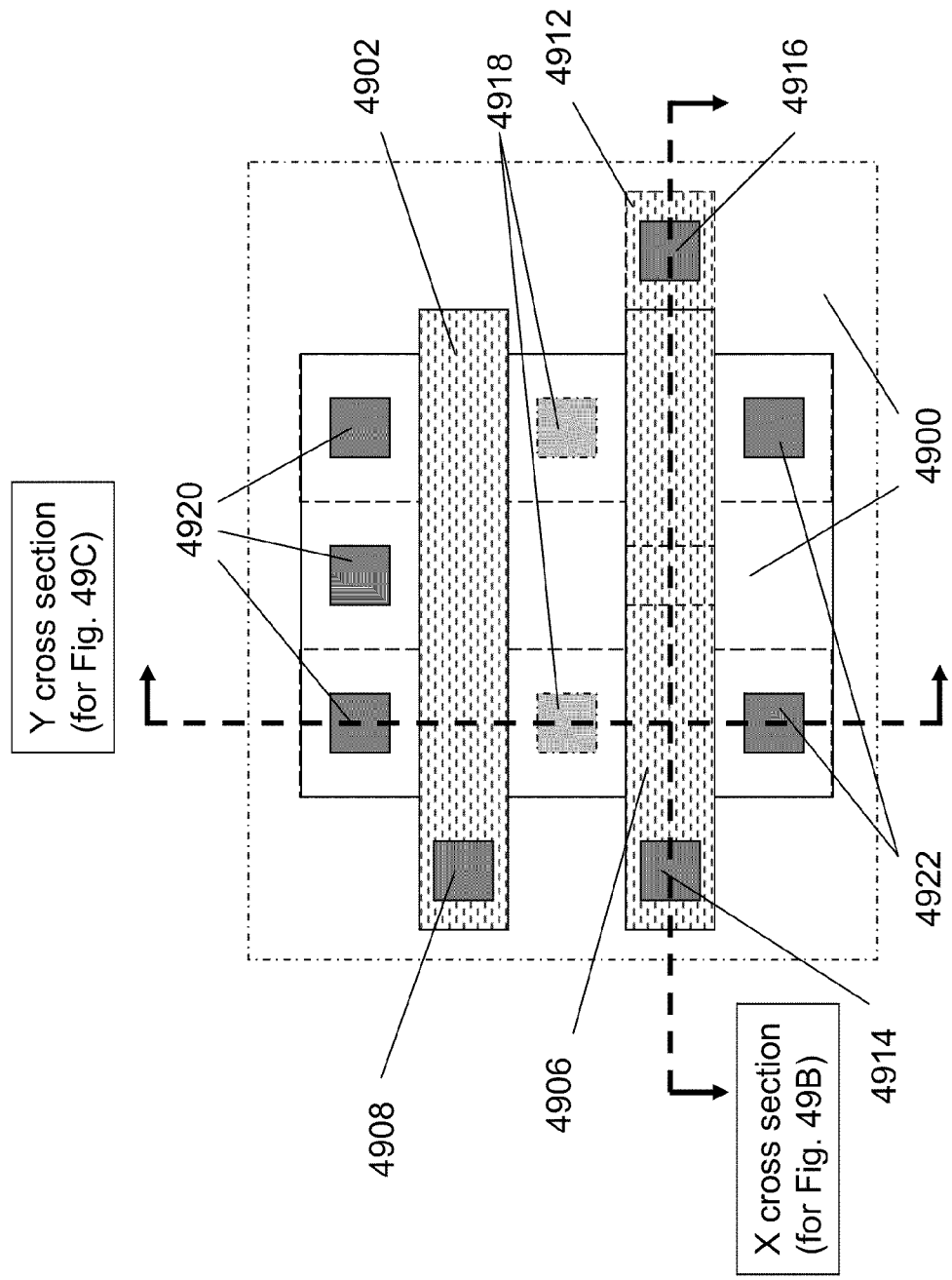
FIG. 49 A-C are drawing illustrations of a 3D 2-input NOR cell.
Figure 49B:
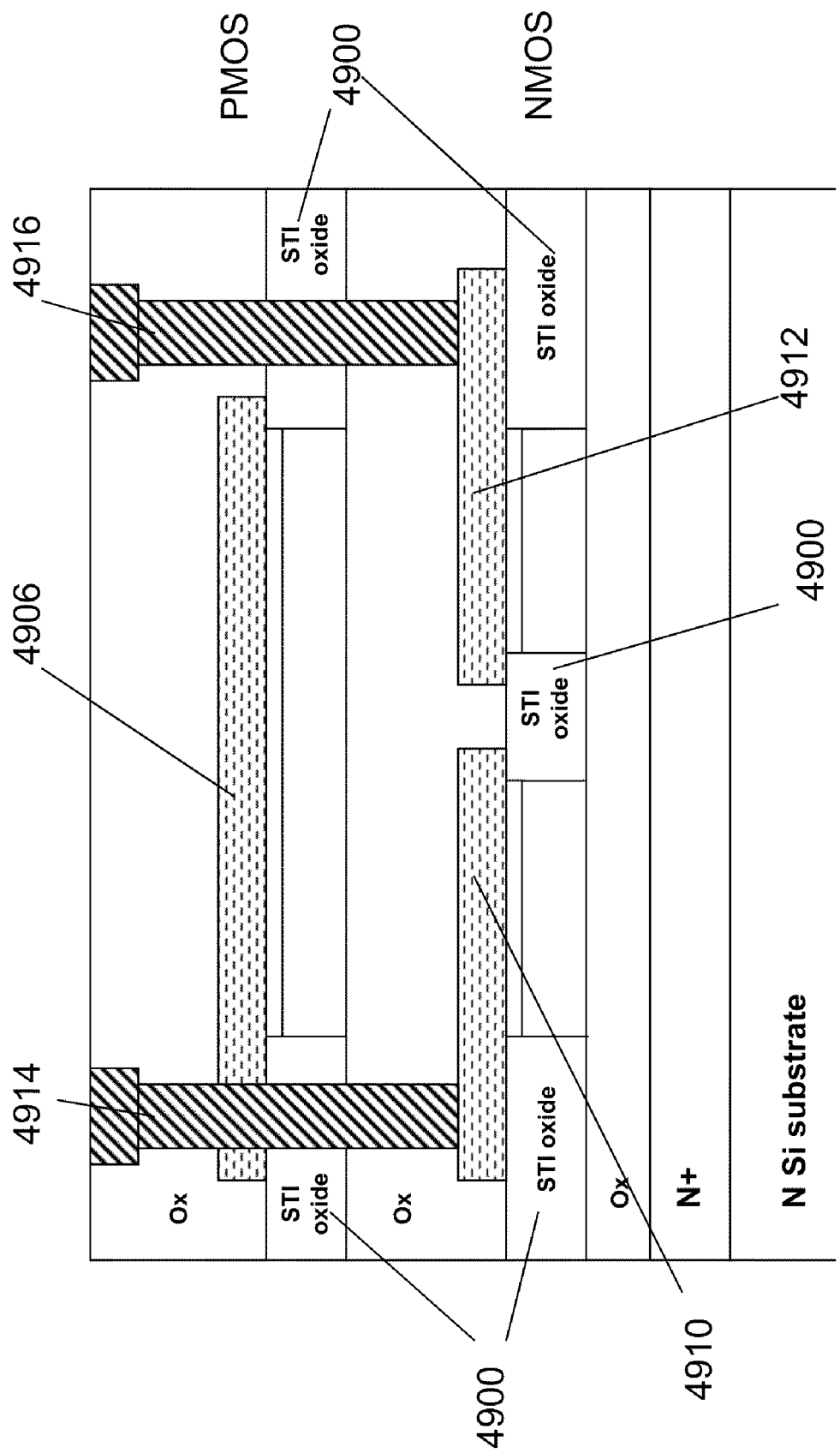
Figure 49C:
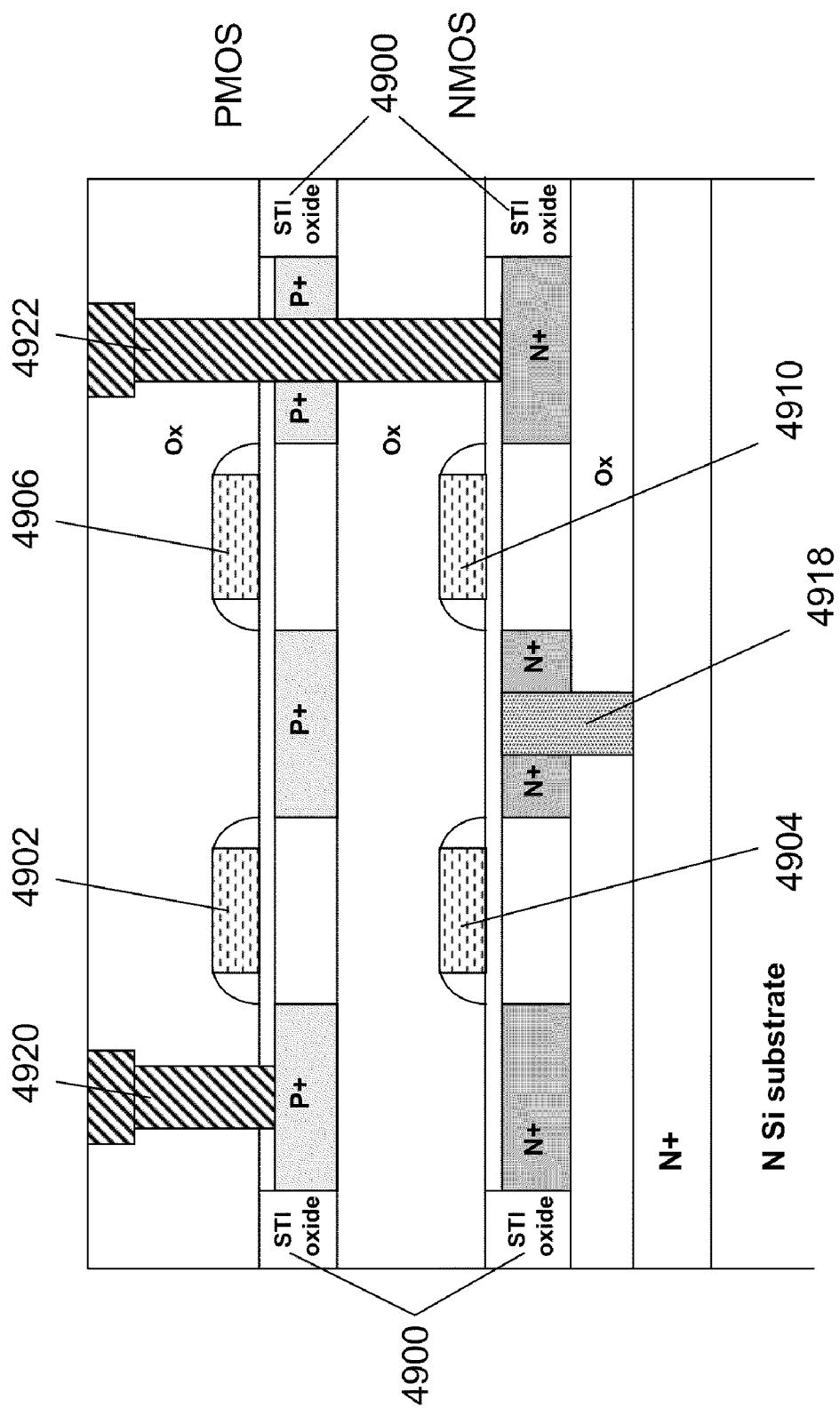

The above process flow may be used to construct an alternative compact 3D 2-input NOR cell example as illustrated in FIGS. 49A thru 49C. The topside view of the 3D cell is illustrated in FIG. 49A where the STI (shallow trench isolation) 4900 for both NMOS and PMOS may be drawn coincident on the top and sides, but not on the bottom silicon layer to allow isolation between the NMOS-A and NMOS-B transistors and allow independent gate connections. The NMOS or PMOS transistors referred to with the letter-A or -B identify which NMOS or PMOS transistor gate is connected to, either the A input or the B input, as illustrated in FIG. 47. The cell X cross sectional view is illustrated in FIG. 49B and the Y cross sectional view is illustrated in FIG. 49C.

The PMOS-B gate 4902 may be drawn coincident and stacked with dummy gate 4904, and the PMOS-B gate 4902 is connected to input B by PMOS gate only on STI contact 4908. Both the NMOS-A gate 4910 and NMOS-B gate 4912 are drawn underneath the PMOS-A gate 4906. The NMOS-A gate 4910 and the PMOS-A gate 4912 are connected together and to input A by NMOS gate on STI to PMOS gate on STI contact 4914, which is similar to contact 4542 in FIG. 45G. The NMOS-B gate 4912 is connected to input B by a NMOS only gate on STI contact 4916, which is similar to contact 4546 illustrated in FIG. 45G. These are the connections for input signals A & B 4710 as illustrated in FIG. 47.

The N+ source contact to the ground plane 4918 in FIGS. 49A & C forms the NMOS source to ground connection 4706 illustrated in FIG. 47 and is similar to ground connection 4406 in FIG. 44B. The PMOS-B source contacts 4920 to Vdd, which are similar to contact 4552 in FIG. 45G, form the PMOS source connection to +V 4707 as shown in FIG. 47. The NMOS-A, NMOS-B, and PMOS-B drain shared contacts 4922, which are similar to contact 4544 in FIG. 45G, form the shared connection 4708 as the output Y in FIG. 47. The ground to ground plane contact, similar to contact 4532 in FIG. 45G, is not shown. This contact may not be needed in every cell and may be shared.

Figure 50A:
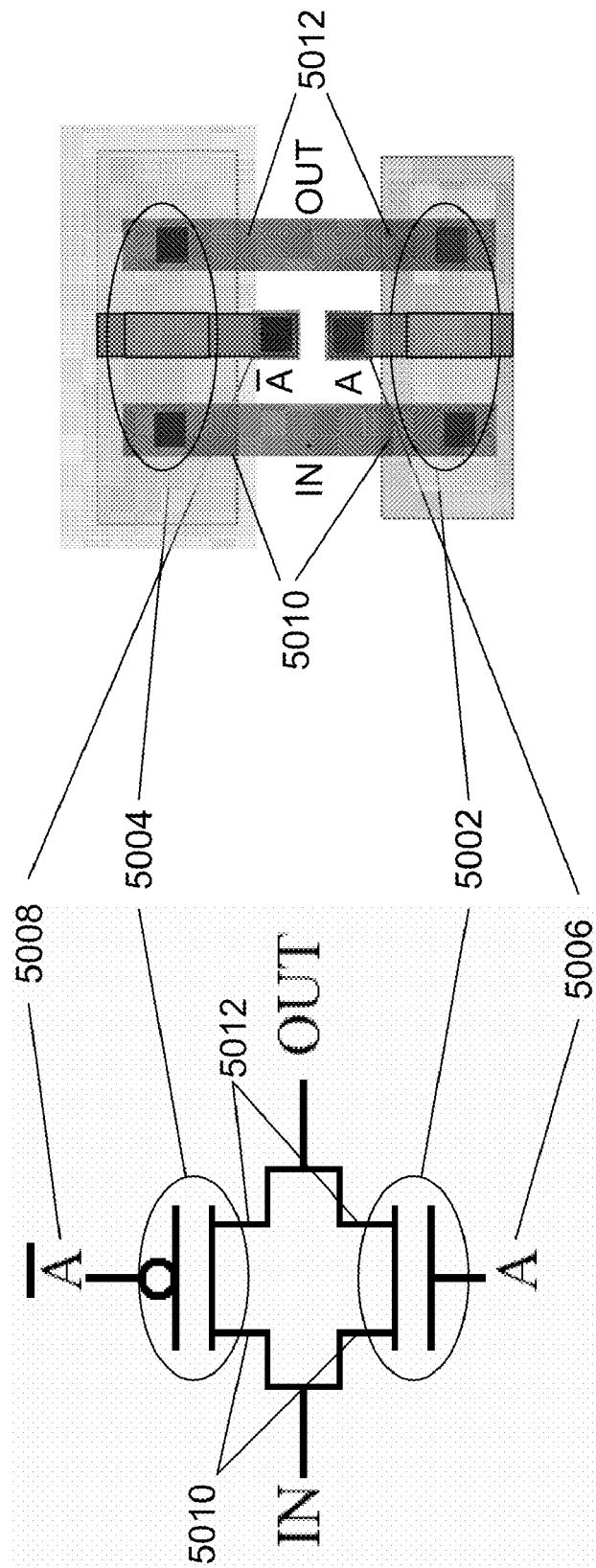
FIG. 50 A-D are drawing illustrations of a 3D CMOS Transmission cell.

The above process flow may also be used to construct a CMOS transmission gate. An example of a typical 2D CMOS transmission gate schematic and layout is illustrated in FIG. 50A. The NMOS transistor 5002 and the PMOS transistor 5004 are laid out side by side and are in differently doped wells. The control signal A as the NMOS gate input 5006 and its compliment A as the PMOS gate input 5008 allow a signal from the input to fully pass to the output when both NMOS and PMOS transistors are turned on (A=1, $\overline{A}$=0), and not to pass any input signal when both are turned off (A=0, $\overline{A}$=1). The NMOS and PMOS sources 5010 are electrically tied together and to the input, and the NMOS and PMOS drains 5012 are electrically tied together to generate the output. The structure built in 3D described below will take advantage of these connections in the $3^{rd}$ dimension.

Figure 50B:
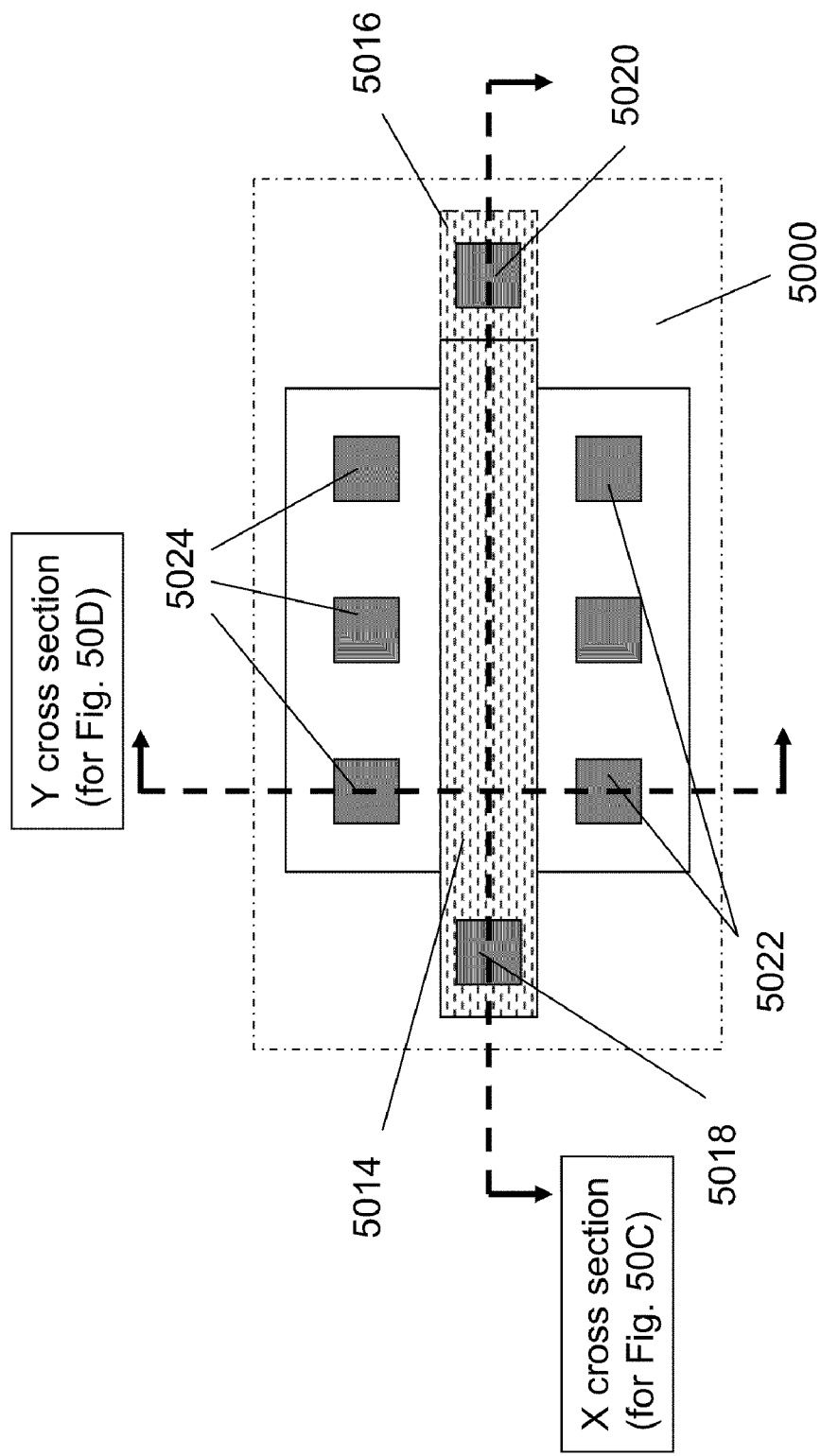
Figure 50C:
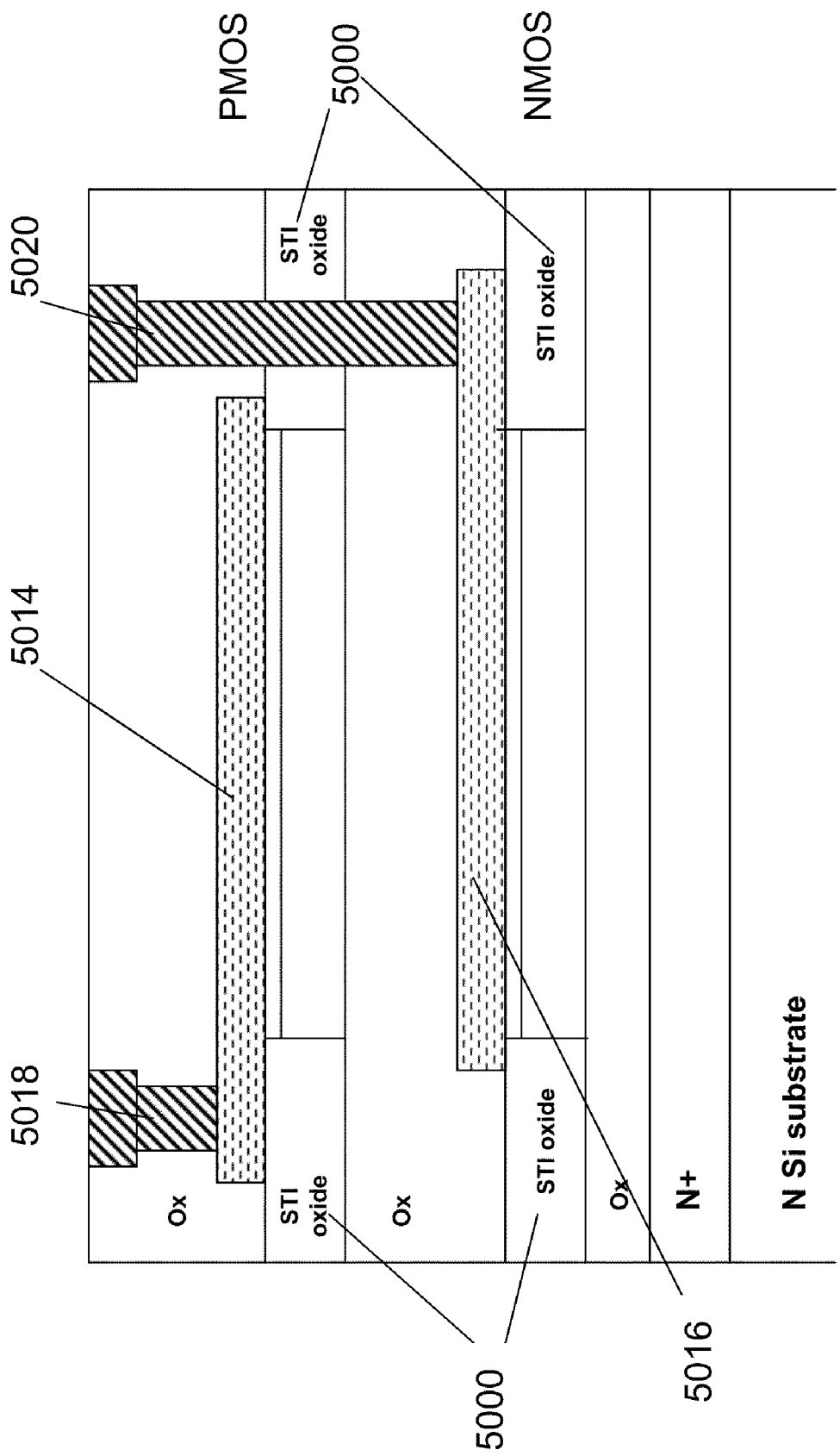
Figure 50D:
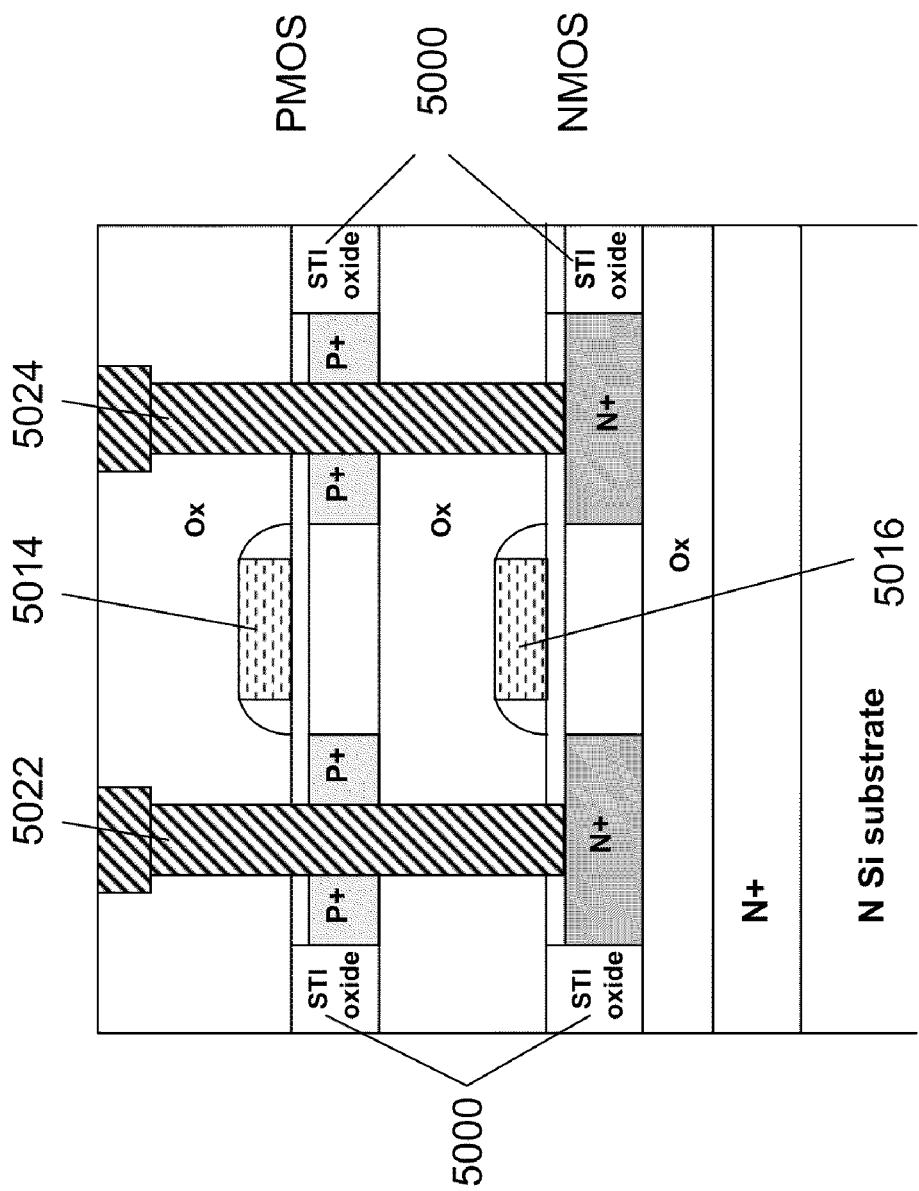

The above process flow may be used to construct a compact 3D CMOS transmission cell example as illustrated in FIGS. 50B thru 50D. The topside view of the 3D cell is illustrated in FIG. 50B where the STI (shallow trench isolation) 5000 for both NMOS and PMOS may be drawn coincident on the top and sides. The cell X cross sectional view is illustrated in FIG. 50C and the Y cross sectional view is illustrated in FIG. 50D. The PMOS gate 5014 may be drawn coincident and stacked with the NMOS gate 5016. The PMOS gate 5014 is connected to control signal A 5008 by PMOS gate only on STI contact 5018. The NMOS gate 5016 is connected to control signal A 5006 by NMOS gate only on STI contact 5020. The NMOS and PMOS source shared contacts 5022 make the shared connection 5010 for the input in FIG. 50A. The NMOS and PMOS drain shared contacts 5024 make the shared connection 5012 for the output in FIG. 50A.

Additional logic and memory cells, such as a 2-input NAND gate, a transmission gate, an MOS driver, a flip-flop, a 6T SRAM, a floating body DRAM, a CAM (Content Addressable Memory) array, etc. may be similarly constructed with this 3D process flow and methodology.

Another more compact 3D library may be constructed whereby one or more layers of metal interconnect may be allowed between the NMOS and PMOS devices. This methodology may allow more compact cell construction especially when the cells are complex; however, the top PMOS devices should now be made with a low-temperature layer transfer and transistor formation process as shown previously, unless the metals between the NMOS and PMOS layers are constructed with refractory metals, such as, for example, Tungsten.

Accordingly, the library process flow proceeds as described above for FIGS. 43 and 44. Then the layer or layers of conventional metal interconnect may be constructed on top of the NMOS devices, and then that wafer is treated as the acceptor wafer or 'House' wafer 808 and the PMOS devices may be layer transferred and constructed in one of the low temperature flows as shown in FIGS. 21, 22, 29, 39, and 40.

Figure 51A:
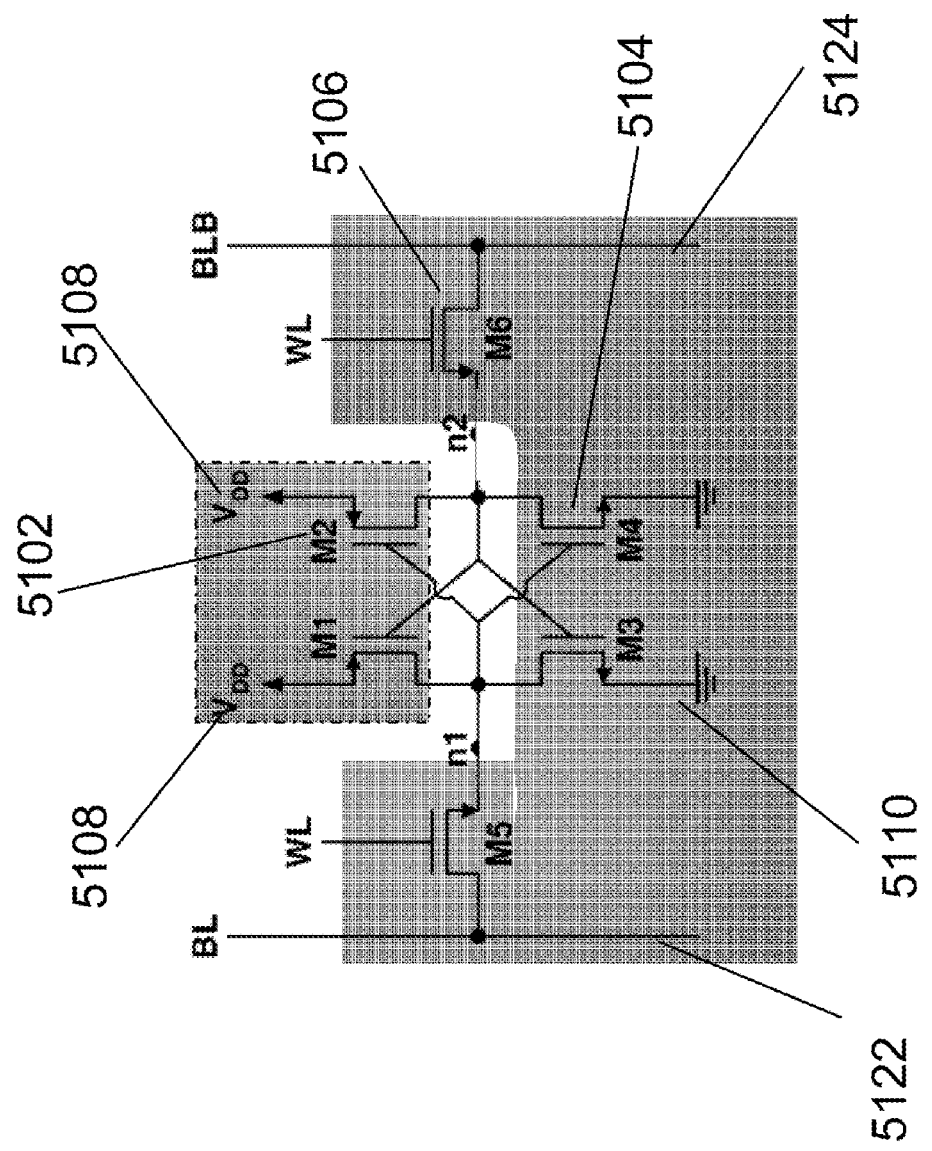
FIG. 51 A-D are drawing illustrations of a 3D CMOS SRAM cell.

The above process flow may be used to construct, for example, a compact 3D CMOS 6-Transistor SRAM (Static Random Access Memory) cell as illustrated, for example, in FIGS. 51A thru 51D. The SRAM cell schematic is illustrated in FIG. 51A. Access to the cell is controlled by the word line transistors M5 and M6 where M6 is labeled as 5106. These access transistors control the connection to the bit line 5122 and the bit line bar line 5124. The two cross coupled inverters M1-M4 are pulled high to Vdd 5108 with M1 or M2 5102, and are pulled to ground 5110 thru transistors M3 or M4 5104.

Figure 51D:
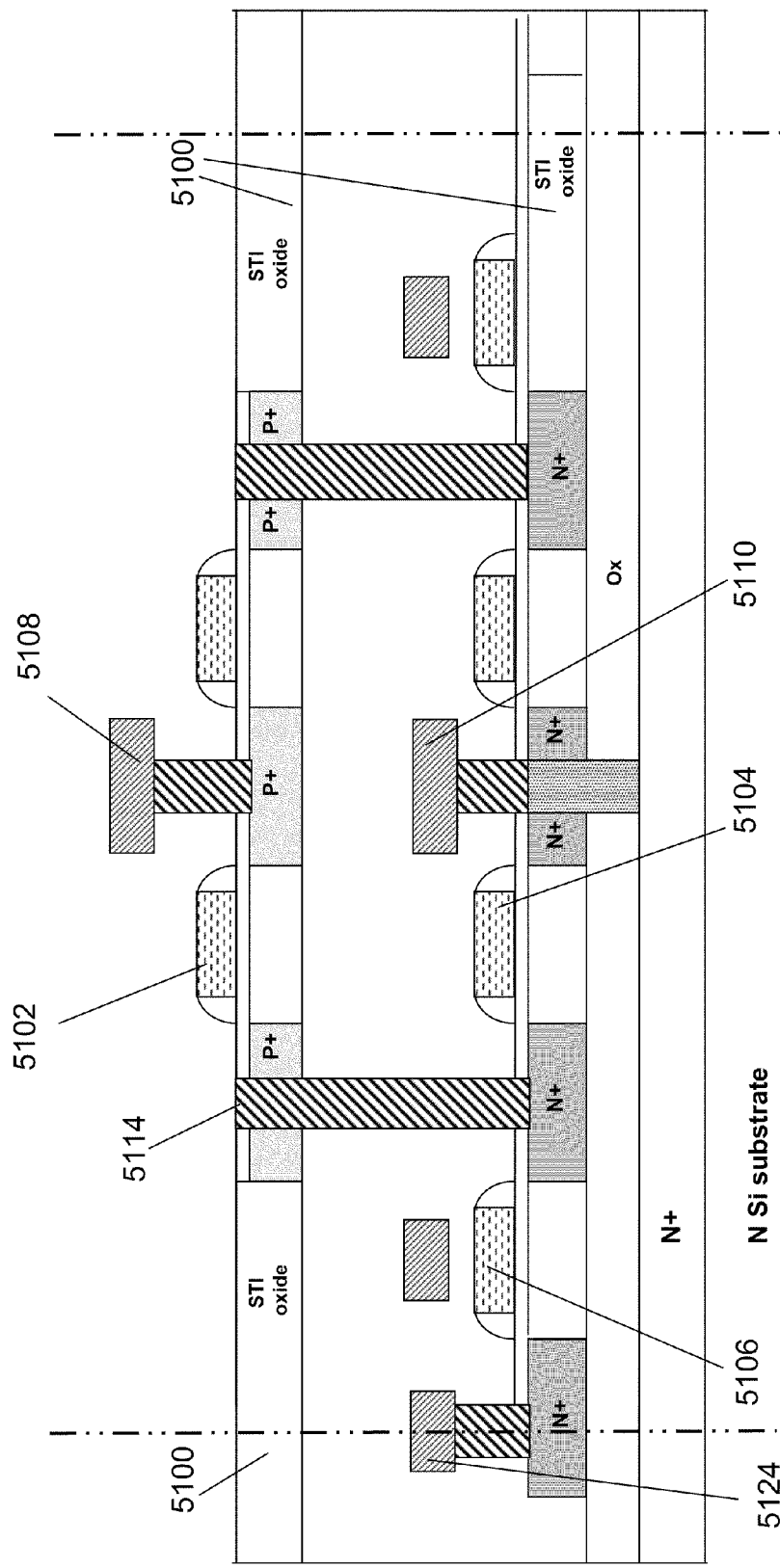

The topside NMOS, with no metal shown, view of the 3D SRAM cell is illustrated in FIG. 51B, the SRAM cell X cross sectional view is illustrated in FIG. 51C, and the Y cross sectional view is illustrated in FIG. 51D. NMOS word line access transistor M6 5106 is connected to the bit line bar 5124 with a contact to NMOS metal 1. The NMOS pull down transistor 5104 is connected to the ground line 5110 by a contact to NMOS metal 1 and to the back plane N+ ground layer. The bit line 5122 in NMOS metal 1 and transistor isolation oxide 5100 are illustrated. The Vdd supply 5108 is brought into the cell on PMOS metal 1 and connected to M2 5102 thru a contact to P+. The PMOS poly on STI to NMOS poly on STI contact 5112 connects the gates of both M2 5102 and M4 5104 to illustrate the 3D cross coupling. The common drain connection of M2 and M4 to the bit bar access transistor M6 is made thru the PMOS P+ to NMOS N+ contact 5114.

Figure 62A:
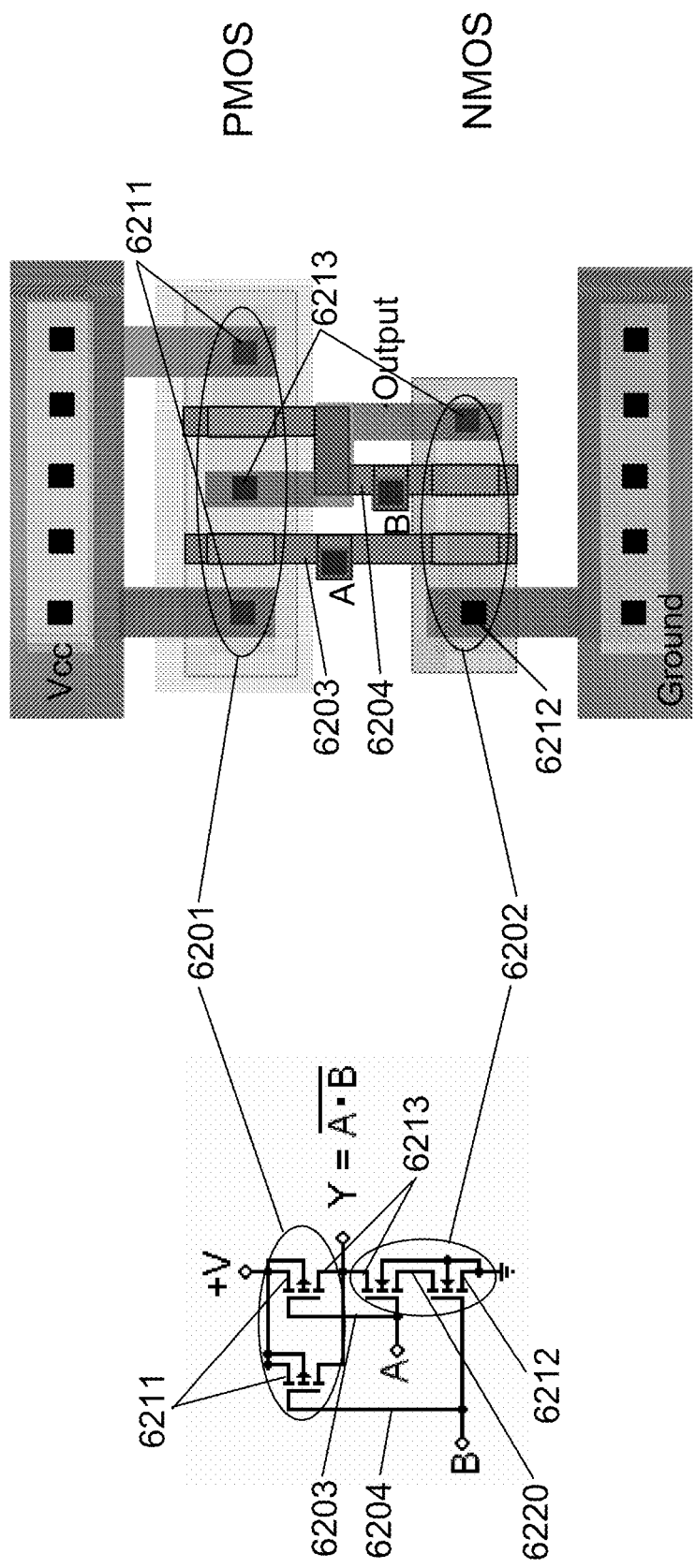
FIG. 62 A-D are drawing illustrations of a 3D NAND2 cell.

The above process flow may also be used to construct a compact 3D CMOS 2 Input NAND cell example as illustrated in FIGS. 62A thru 62D. The NAND-2 cell schematic and 2D layout is illustrated in FIG. 62A. The two PMOS transistor 6201 sources 6211 are tied together and to V+ supply and the PMOS drains are tied together and to one NMOS drain 6213 and to the output Y. Input A 6203 is tied to one PMOS gate and one NMOS gate. Input B 6204 is tied to the other PMOS and NMOS gates. The NMOS A drain is tied 6220 to the NMOS B source, and the PMOS B drain 6212 is tied to ground. The structure built in 3D described below will take advantage of these connections in the 3$^{rd}$ dimension.

Figure 62B:
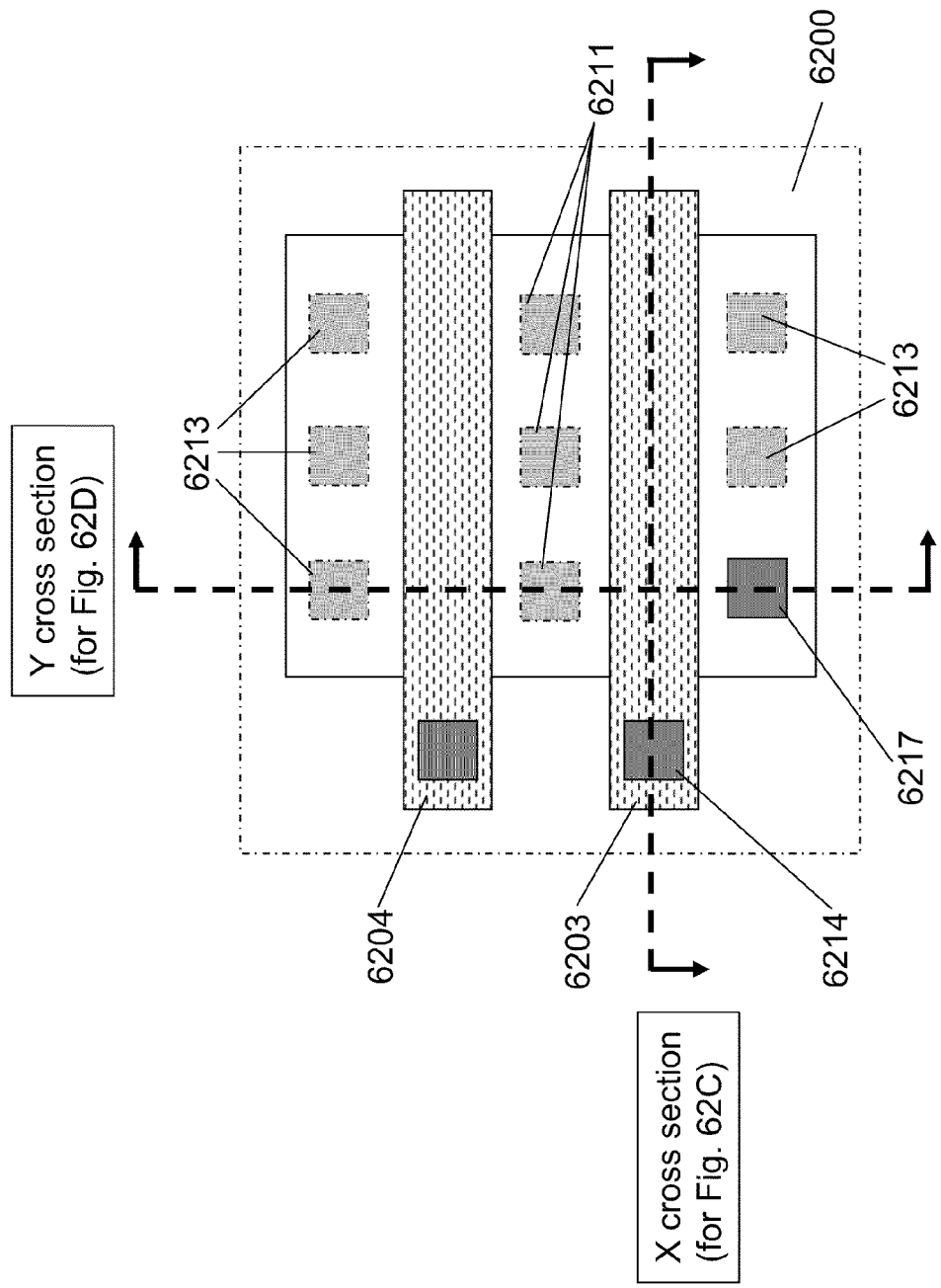
Figure 62C:
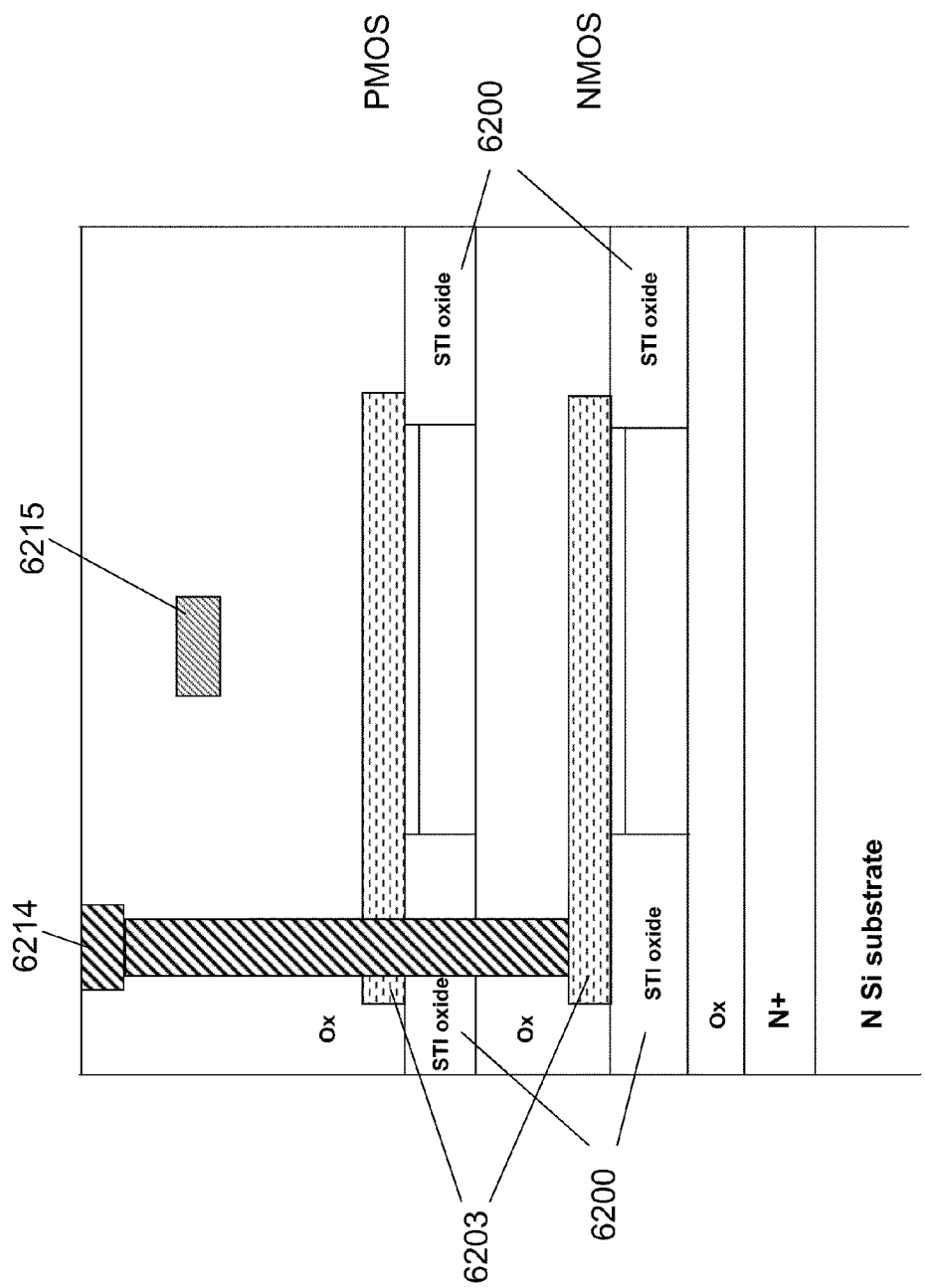
Figure 62D:
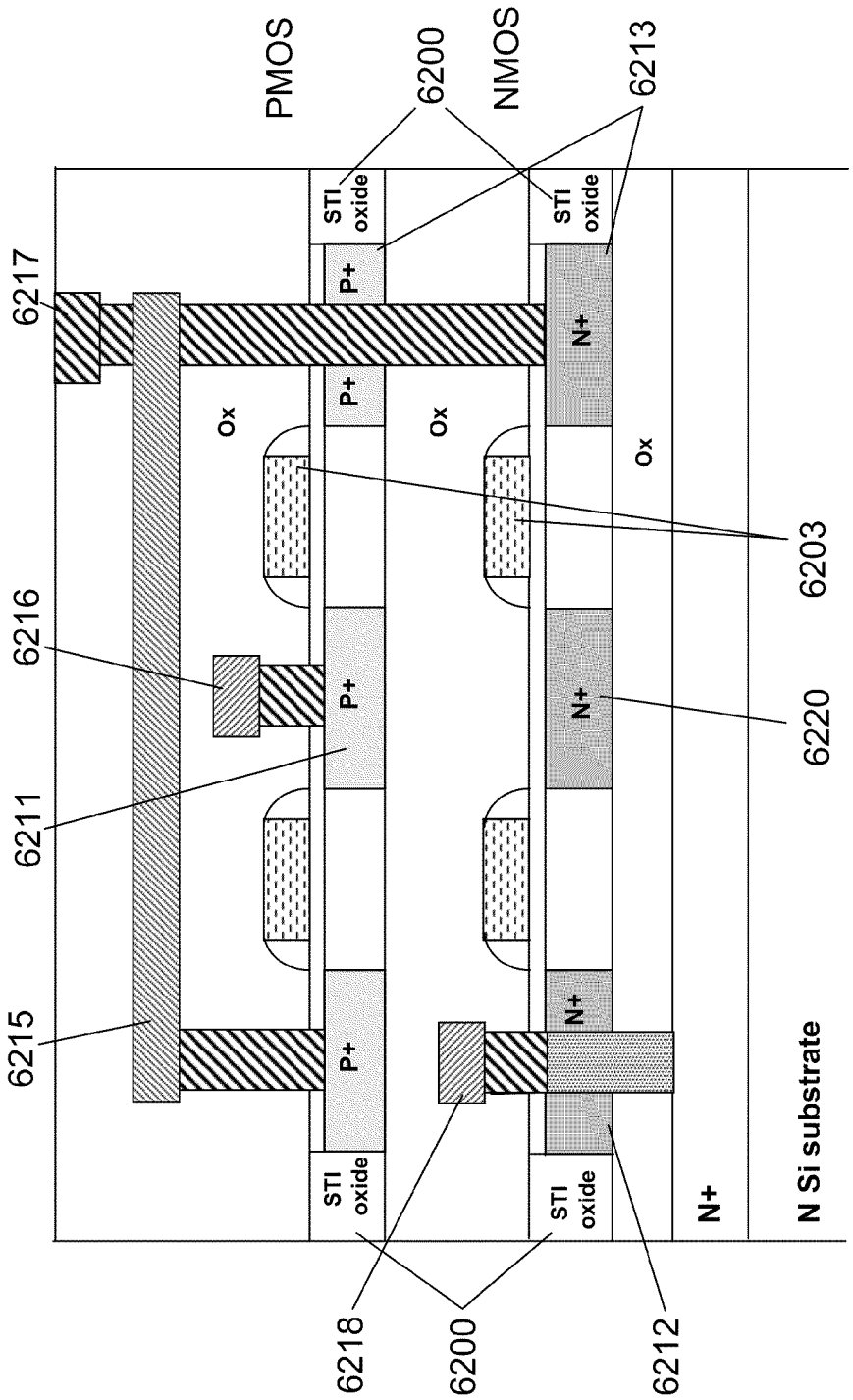

The topside view of the 3D NAND-2 cell, with no metal shown, is illustrated in FIG. 62B, the NAND-2 cell X cross sectional views is illustrated in FIG. 62C, and the Y cross sectional view is illustrated in FIG. 62D. The two PMOS sources 6211 are tied together in the PMOS silicon layer and to the V+ supply metal 6216 in the PMOS metal 1 layer thru a contact. The NMOS A drain and the PMOS A drain are tied 6213 together with a thru P+ to N+ contact and to the Output Y metal 6217 in PMOS metal 2, and also connected to the PMOS B drain contact thru PMOS metal 1 6215. Input A on PMOS metal 2 6214 is tied 6203 to both the PMOS A gate and the NMOS A gate with a PMOS gate on STI to NMOS gate on STI contact. Input B is tied 6204 to the PMOS B gate and the NMOS B using a P+ gate on STI to NMOS gate on STI contact. The NMOS A source and the NMOS B drain are tied together 6220 in the NMOS silicon layer. The NMOS B source 6212 is tied connected to the ground line 6218 by a contact to NMOS metal 1 and to the back plane N+ ground layer. The transistor isolation oxides 6200 are illustrated.

Another compact 3D library may be constructed whereby one or more layers of metal interconnect is allowed between more than two NMOS and PMOS device layers. This methodology allows a more compact cell construction especially when the cells are complex; however, devices above the first NMOS layer should now be made with a low temperature layer transfer and transistor formation process as shown previously.

Accordingly, the library process flow proceeds as described above for FIGS. 43 and 44. Then the layer or layers of conventional metal interconnect may be constructed on top of the NMOS devices, and then that wafer is treated as the acceptor wafer or house 808 and the PMOS devices may be layer transferred and constructed in one of the low temperature flows as shown in FIGS. 21, 22, 29, 39, and 40. And then this low temperature process may be repeated again to form another layer of PMOS or NMOS device, and so on.

Figure 53A:
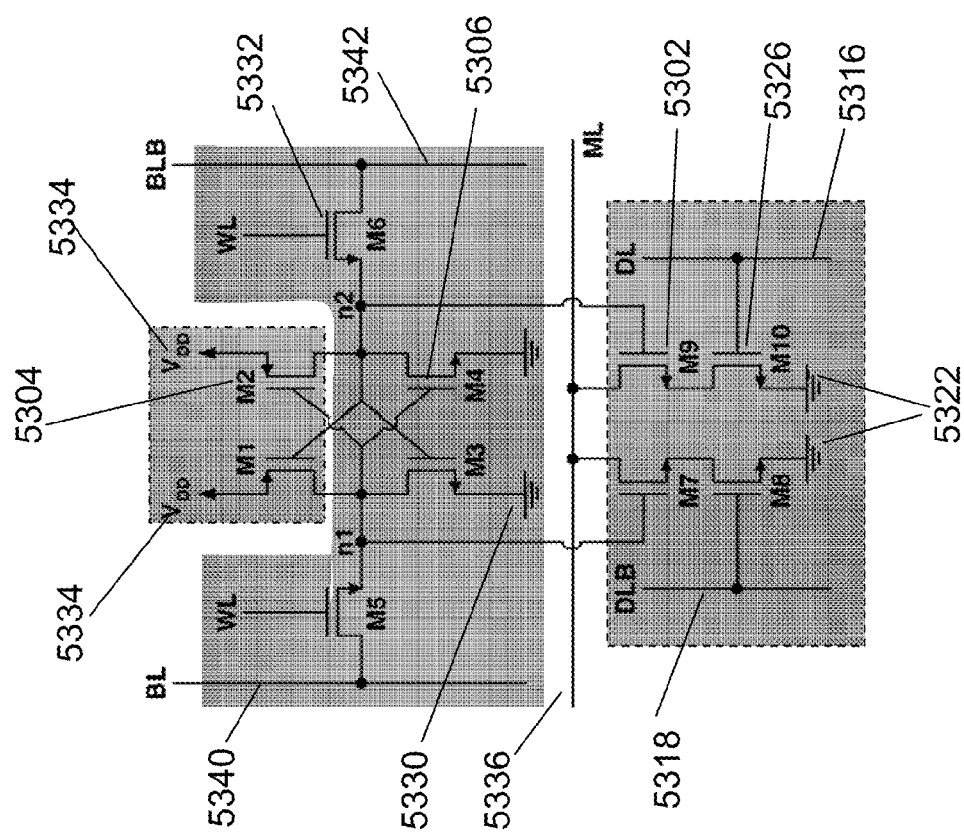
FIG. 53 A-E are drawing illustrations of a 3D CAM cell.

The above process flow may also be used to construct a compact 3D CMOS Content Addressable Memory (CAM) array as illustrated in FIGS. 53A to 53E. The CAM cell schematic is illustrated in FIG. 53A. Access to the SRAM cell is controlled by the word line transistors M5 and M6 where M6 is labeled as 5332. These access transistors control the connection to the bit line 5342 and the bit line bar line 5340. The two cross coupled inverters M1-M4 are pulled high to Vdd 5334 with M1 or M2 5304, and are pulled to ground 5330 thru transistors M3 or M4 5306. The match line 5336 delivers comparison circuit match or mismatch state to the match address encoder. The detect line 5316 and detect line bar 5318 select the comparison circuit cell for the address search and connect to the gates of the pull down transistors M8 and M10 5326 to ground 5322. The SRAM state read transistors M7 and M9 5302 gates are connected to the SRAM cell nodes n1 and n2 to read the SRAM cell state into the comparison cell. The structure built in 3D described below may take advantage of these connections in the 3$^{rd}$ dimension.

Figure 53D:
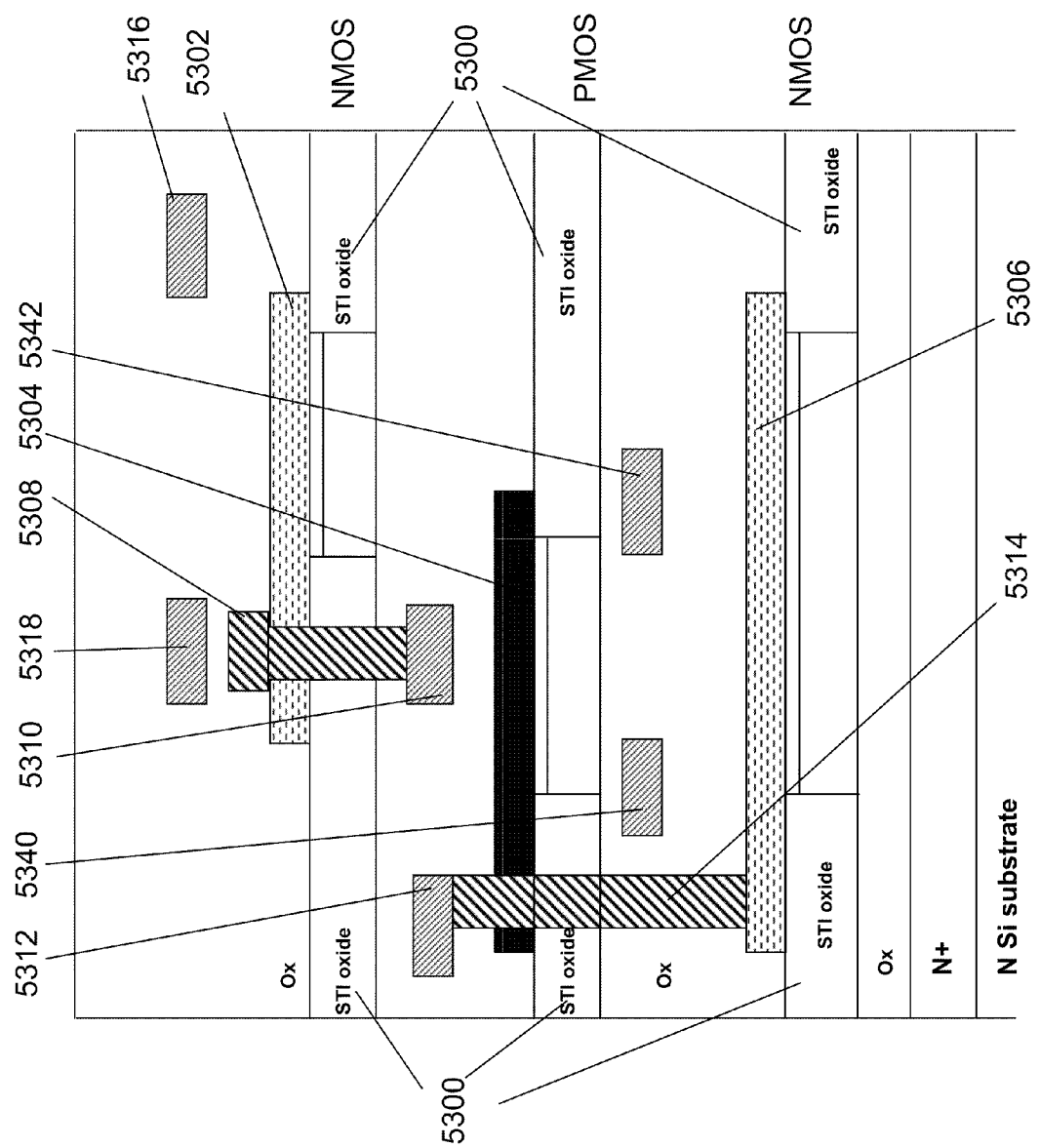
Figure 53E:
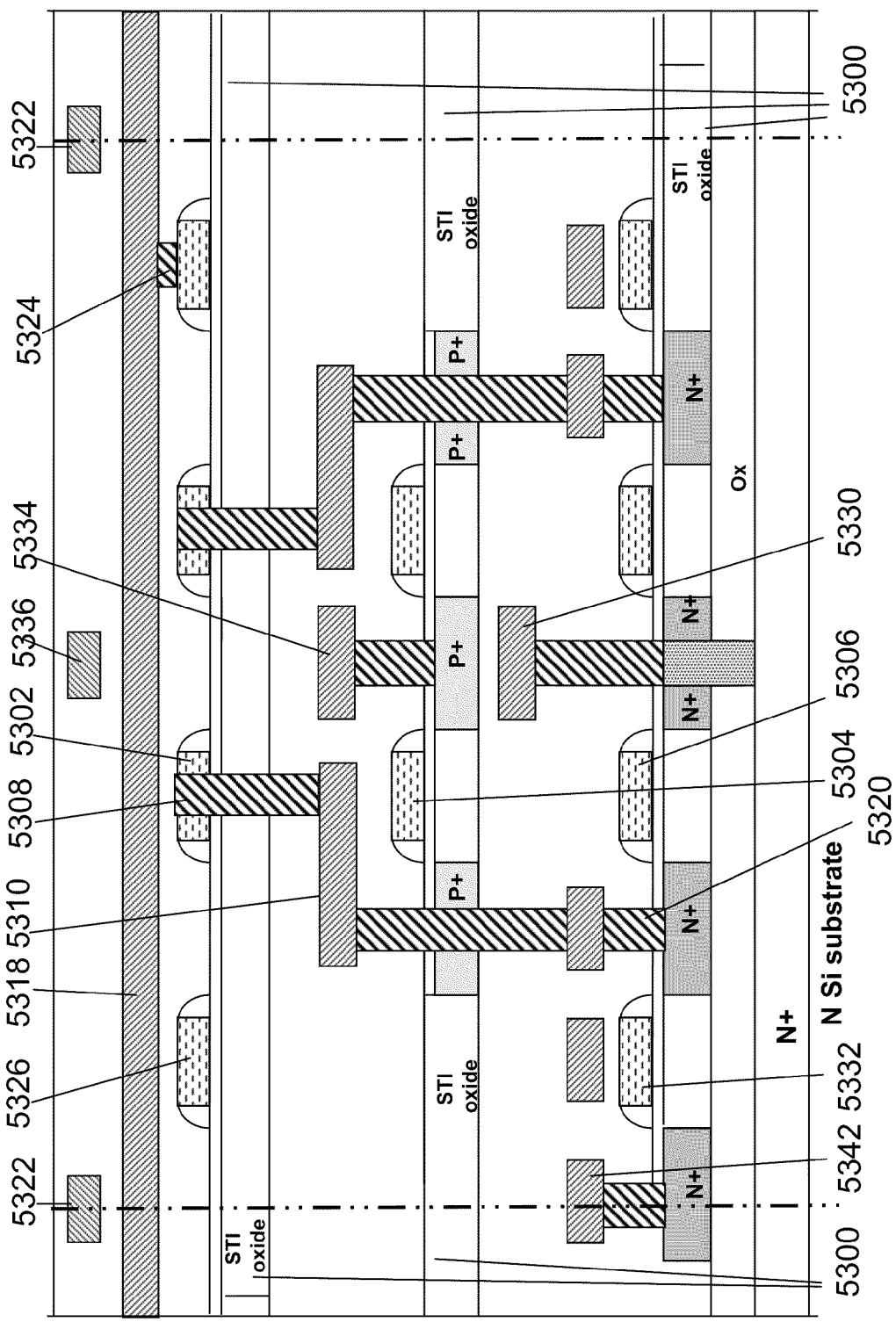

The topside top NMOS view of the 3D CAM cell, without metals shown, is illustrated in FIG. 53B, the topside top NMOS view of the 3D CAM cell, with metal shown, is illustrated in FIG. 53C, the 3DCAM cell X cross sectional view is illustrated in FIG. 53D, and the Y cross sectional view is illustrated in FIG. 53E. The bottom NMOS word line access transistor M6 5332 is connected to the bit line bar 5342 with an N+ contact to NMOS metal 1. The bottom NMOS pull down transistor 5306 is connected to the ground line 5330 by an N+ contact to NMOS metal 1 and to the back plane N+ ground layer. The bit line 5340 is in NMOS metal 1 and transistor isolation oxides 5300 are illustrated. The ground 5322 is brought into the cell on top NMOS metal-2. The Vdd supply 5334 is brought into the cell on PMOS metal-1 5334 and connects to M2 5304 thru a contact to P+. The PMOS poly on STI to bottom NMOS poly on STI contact 5314 connects the gates of both M2 5304 and M4 5306 to illustrate the SRAM 3D cross coupling and connects to the comparison cell node n1 thru PMOS metal-1 5312. The common drain connection of M2 and M4 to the bit bar access transistor M6 is made thru the PMOS P+ to NMOS N+ contact 5320 and connects node n2 to the M9 gate 5302 via PMOS metal-1 5310 and metal to gate on STI contact 5308. Top NMOS comparison cell ground pulldown transistor M10 gate 5326 is connected to detect line 5316 with a NMOS metal-2 to gate poly on STI contact. The detect line bar 5318 in top NMOS metal-2 connects thru contact 5324 to the gate of M8 in the top NMOS layer. The match line 5336 in top NMOS metal-2 connects to the drain side of M9 and M7.

Another compact 3D library may be constructed whereby one or more layers of metal interconnect is allowed between the NMOS and PMOS devices and one or more of the devices is constructed vertically.

Figure 63A:
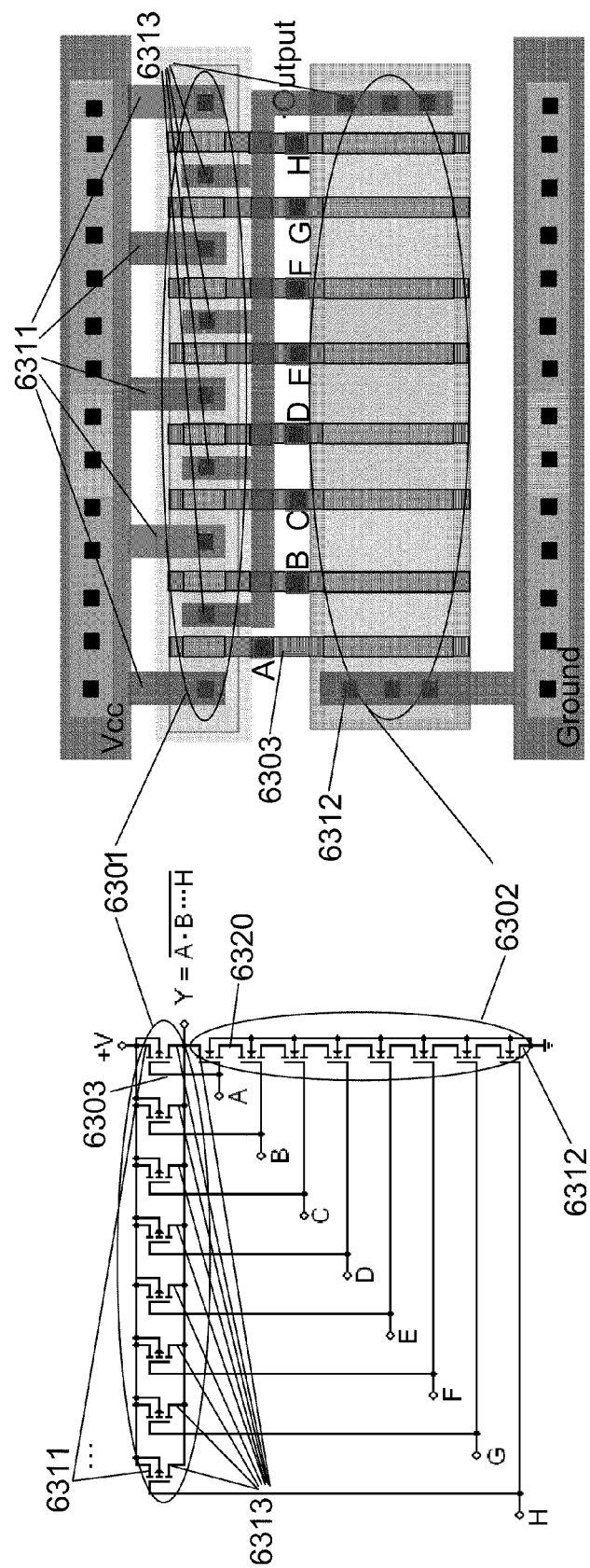
FIG. 63 A-G are drawing illustrations of a 3D NAND8 cell.

A compact 3D CMOS 8 Input NAND cell may be constructed as illustrated in FIGS. 63A thru 63G. The NAND-8 cell schematic and 2D layout is illustrated in FIG. 63A. The eight PMOS transistor 6301 sources 6311 are tied together and to V+ supply and the PMOS drains are tied together 6313 and to the NMOS A drain and to the output Y. Inputs A to H are tied to one PMOS gate and one NMOS gate. Input A is tied to the PMOS A gate and NMOS A gate, input B is tied to the PMOS B gate and NMOS B gate, and so forth through input H is tied to the PMOS H gate and NMOS H gate. The eight NMOS transistors are coupled in series between the output Y and the PMOS drains 6313 and ground. The structure built in 3D described below will take advantage of these connections in the $3^{rd}$ dimension.

Figure 63B:
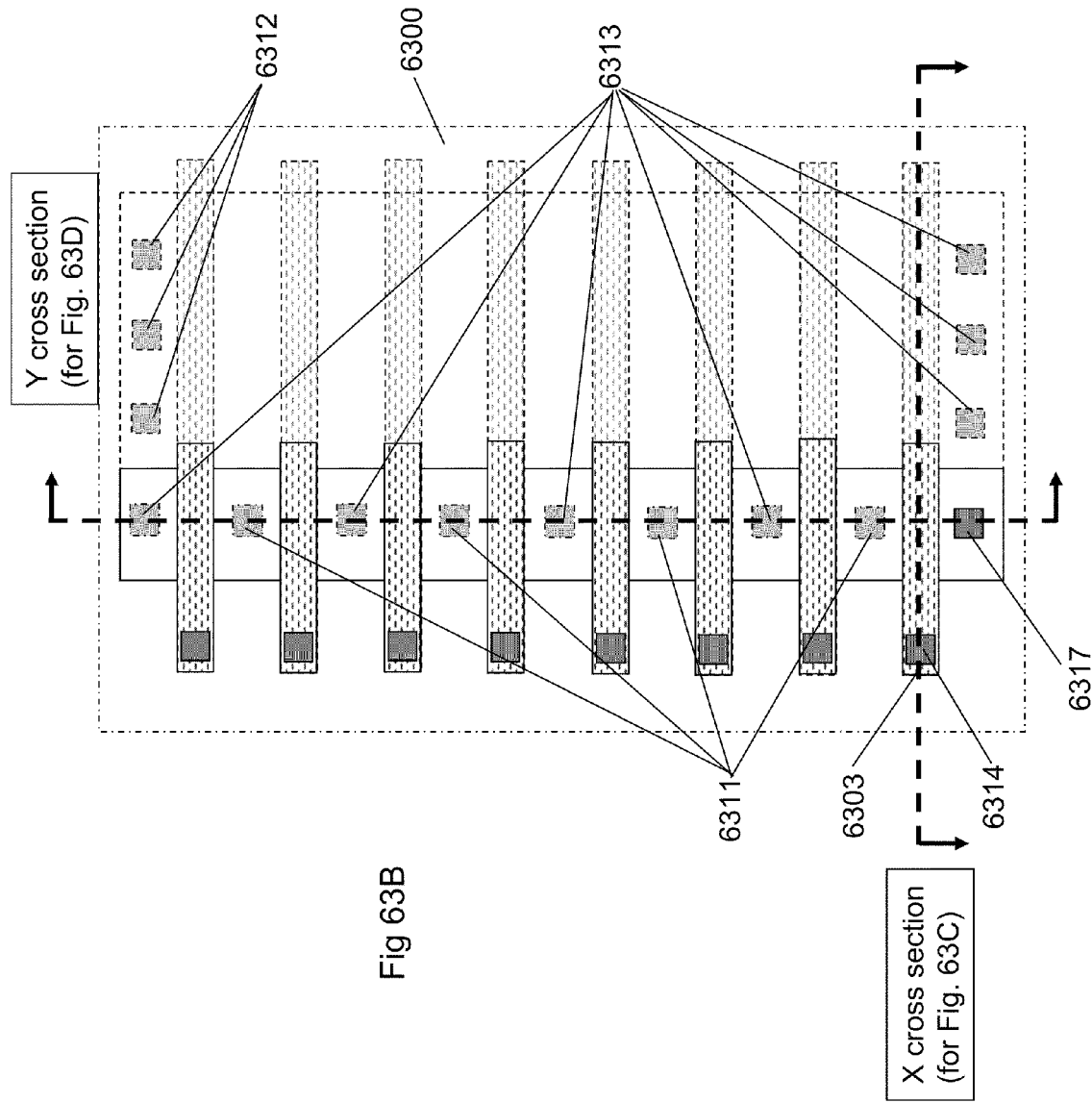
Figure 63C:
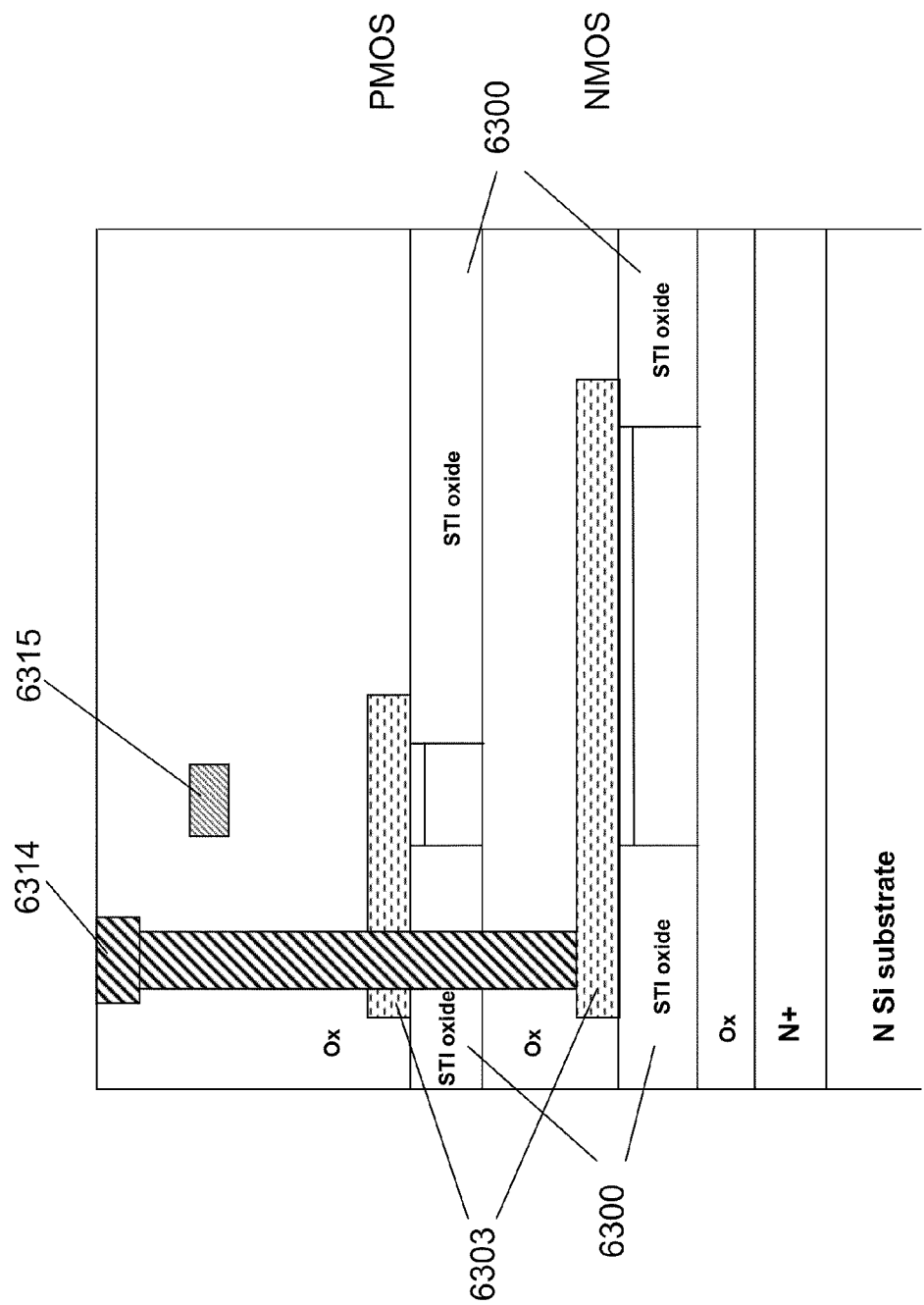
Figure 63D:
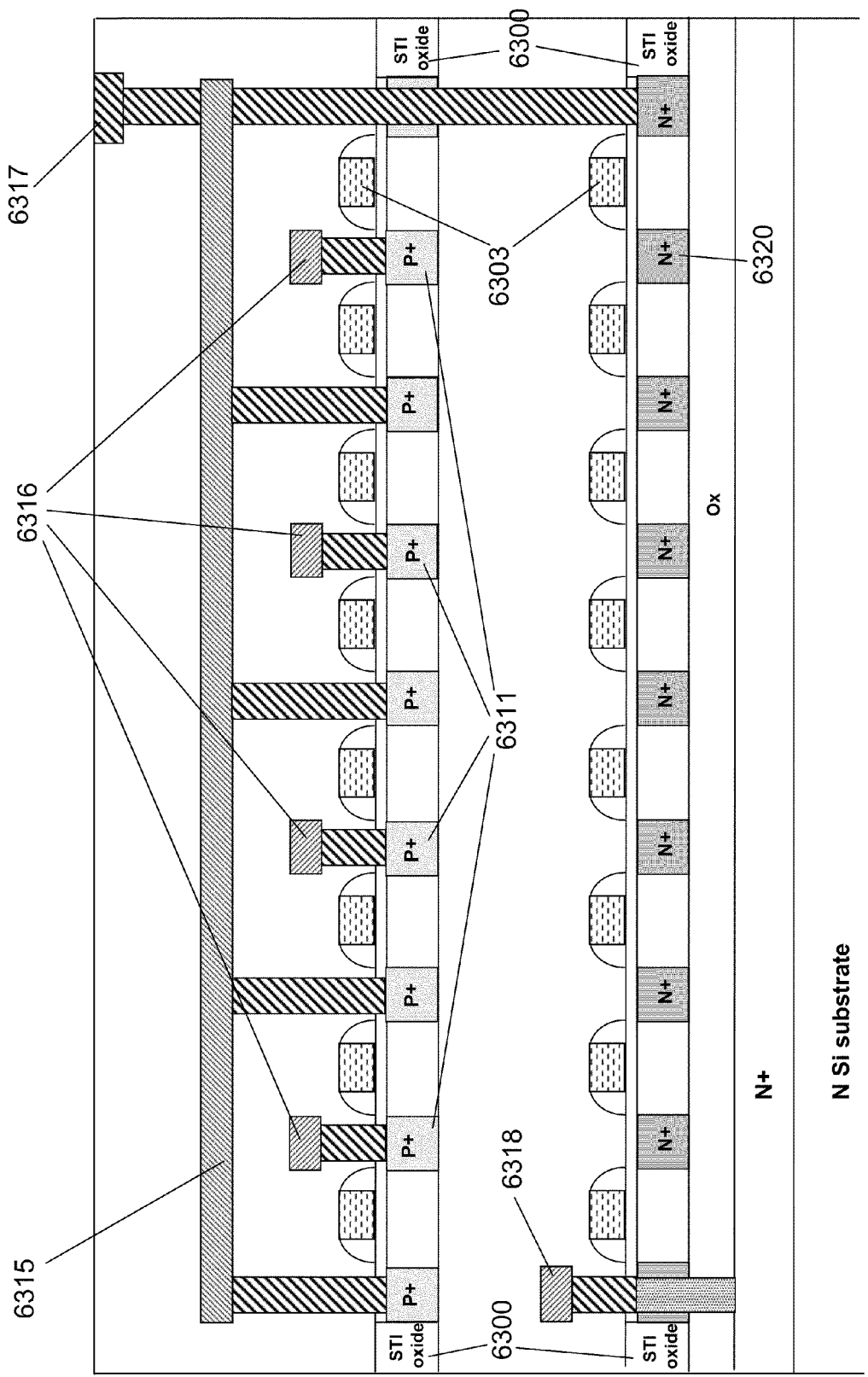
Figure 63E:
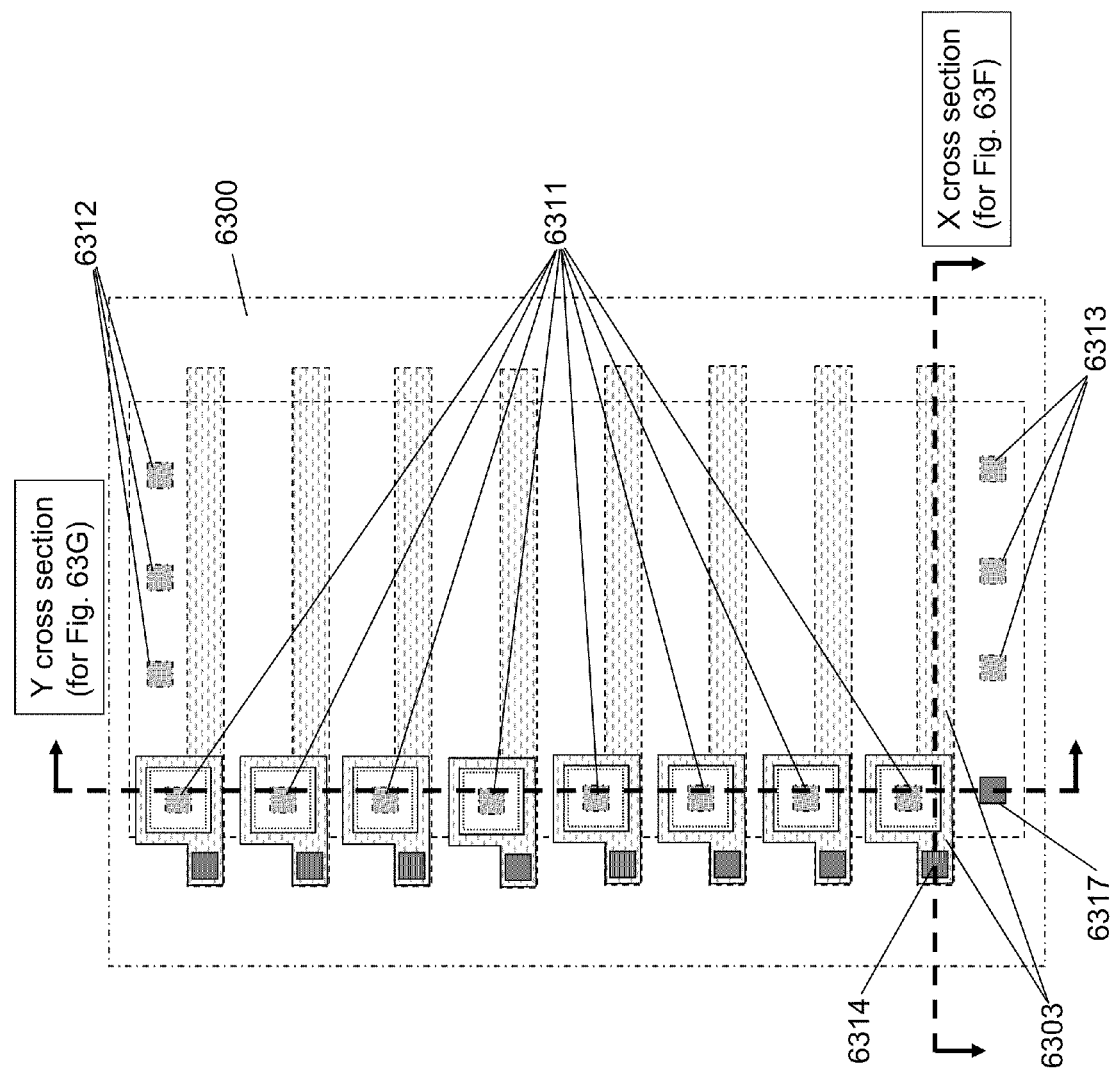
Figure 63F:
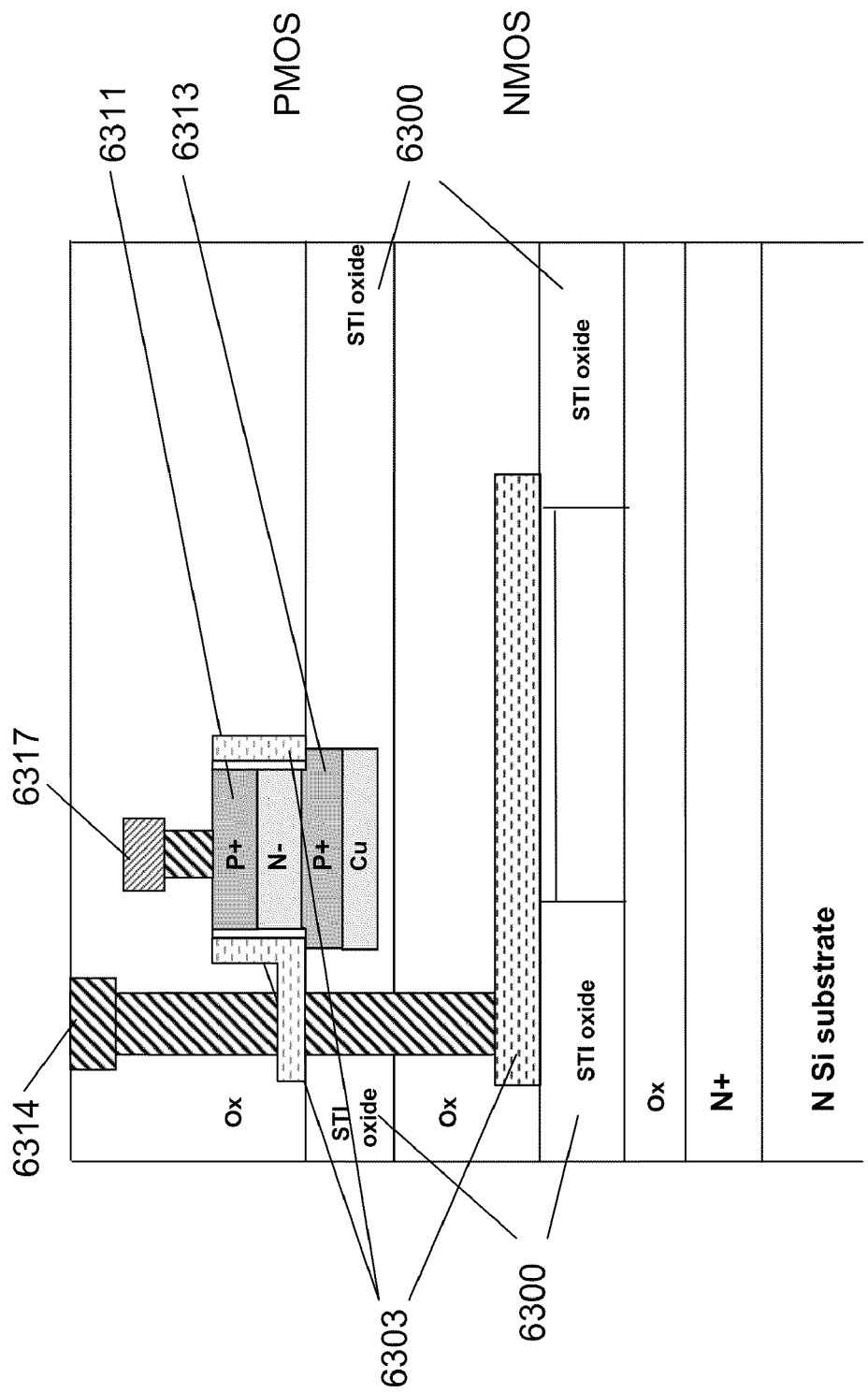
Figure 63G:
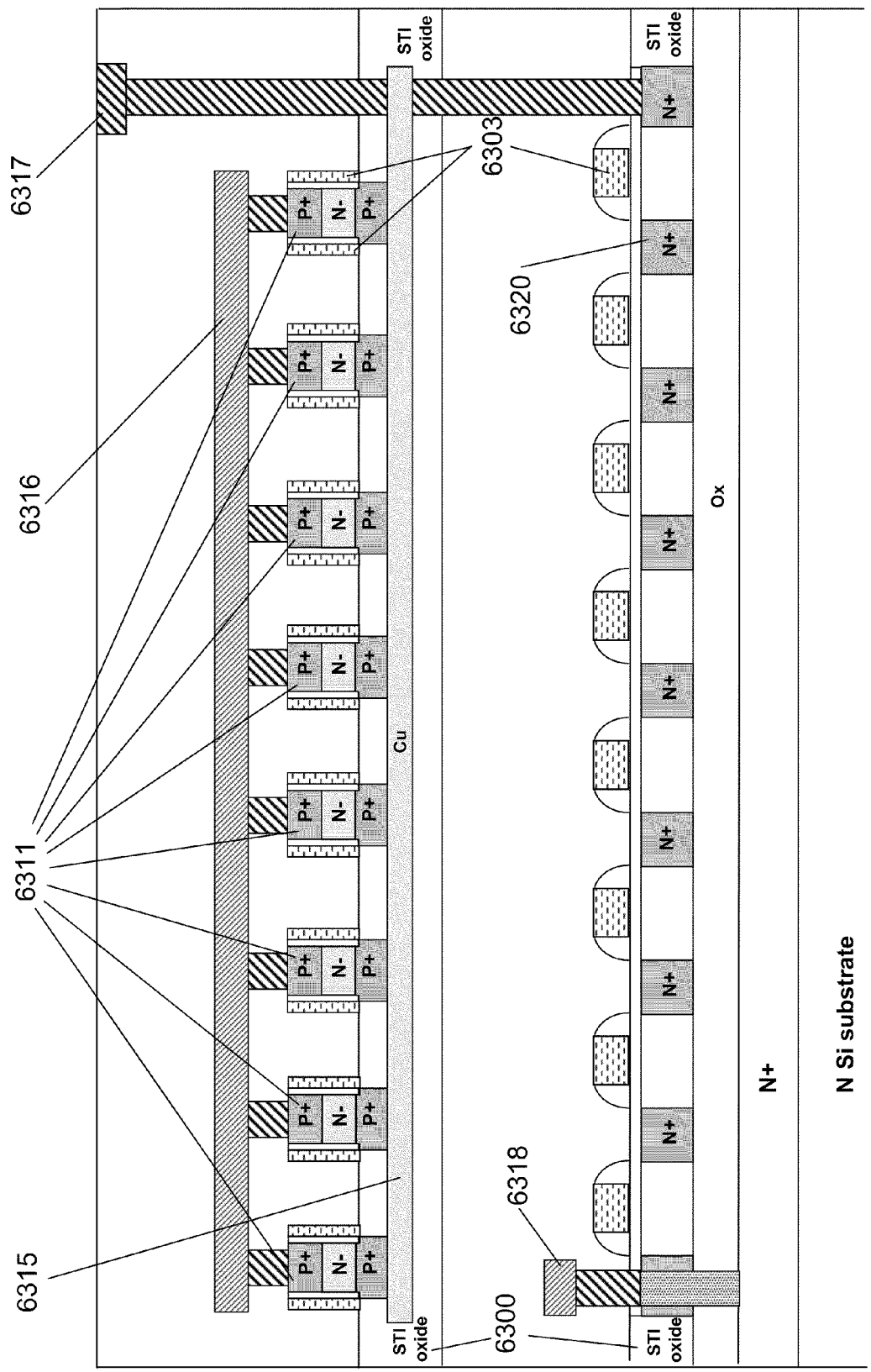

The topside view of the 3D NAND-8 cell, with no metal shown and with horizontal NMOS and PMOS devices, is illustrated in FIG. 63B, the cell X cross sectional views is illustrated in FIG. 63C, and the Y cross sectional view is illustrated in FIG. 63D. The NAND-8 cell with vertical PMOS and horizontal NMOS devices are shown in FIG. 63E for topside view, 63F for the X cross section view, and 63H for the Y cross sectional view. The same reference numbers are used for analogous structures in the embodiment shown in FIGS. 63B through 63D and the embodiment shown in FIGS. 63E through 63G. The eight PMOS sources 6311 are tied together in the PMOS silicon layer and to the V+ supply metal 6316 in the PMOS metal 1 layer thru P+ to Metal contacts. The NMOS A drain and the PMOS A drain are tied 6313 together with a thru P+ to N+ contact 6317 and to the output Y supply metal 6315 in PMOS metal 2, and also connected to all of the PMOS drain contacts thru PMOS metal 1 6315. Input A on PMOS metal 2 6314 is tied 6303 to both the PMOS A gate and the NMOS A gate with a PMOS gate on STI to NMOS gate on STI contact 6314. All the other inputs are tied to P and N gates in similar fashion. The NMOS A source and the NMOS B drain are tied together 6320 in the NMOS silicon layer. The NMOS H source 6232 is tied connected to the ground line 6318 by a contact to NMOS metal 1 and to the back plane N+ ground layer. The transistor isolation oxides 6300 are illustrated.

Figure 64A:
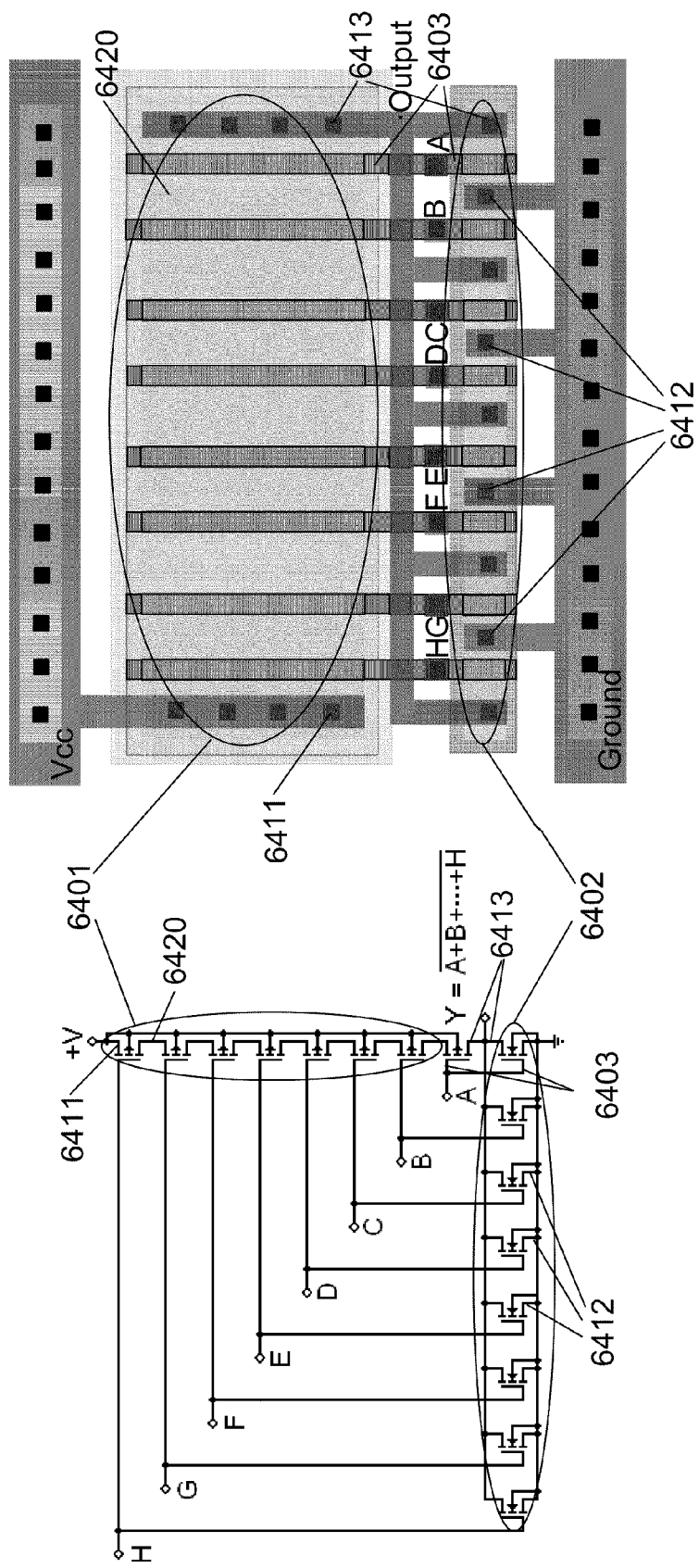
FIG. 64 A-G are drawing illustrations of a 3D NOR8 cell.

A compact 3D CMOS 8 Input NOR may be constructed as illustrated in FIGS. 64A thru 64G. The NOR-8 cell schematic and 2D layout is illustrated in FIG. 64A. The PMOS H transistor source 6411 may be tied to V+ supply. The NMOS drains are tied together 6413 and to the drain of PMOS A and to Output Y. Inputs A to H are tied to one PMOS gate and one NMOS gate. Input A is tied 6403 to the PMOS A gate and NMOS A gate. The NMOS sources are all tied 6412 to ground. The PMOS H drain is tied 6420 to the next PMOS source in the stack, PMOS G, and repeated so forth. The structure built in 3D described below will take advantage of these connections in the $3^{rd}$ dimension.

Figure 64B:
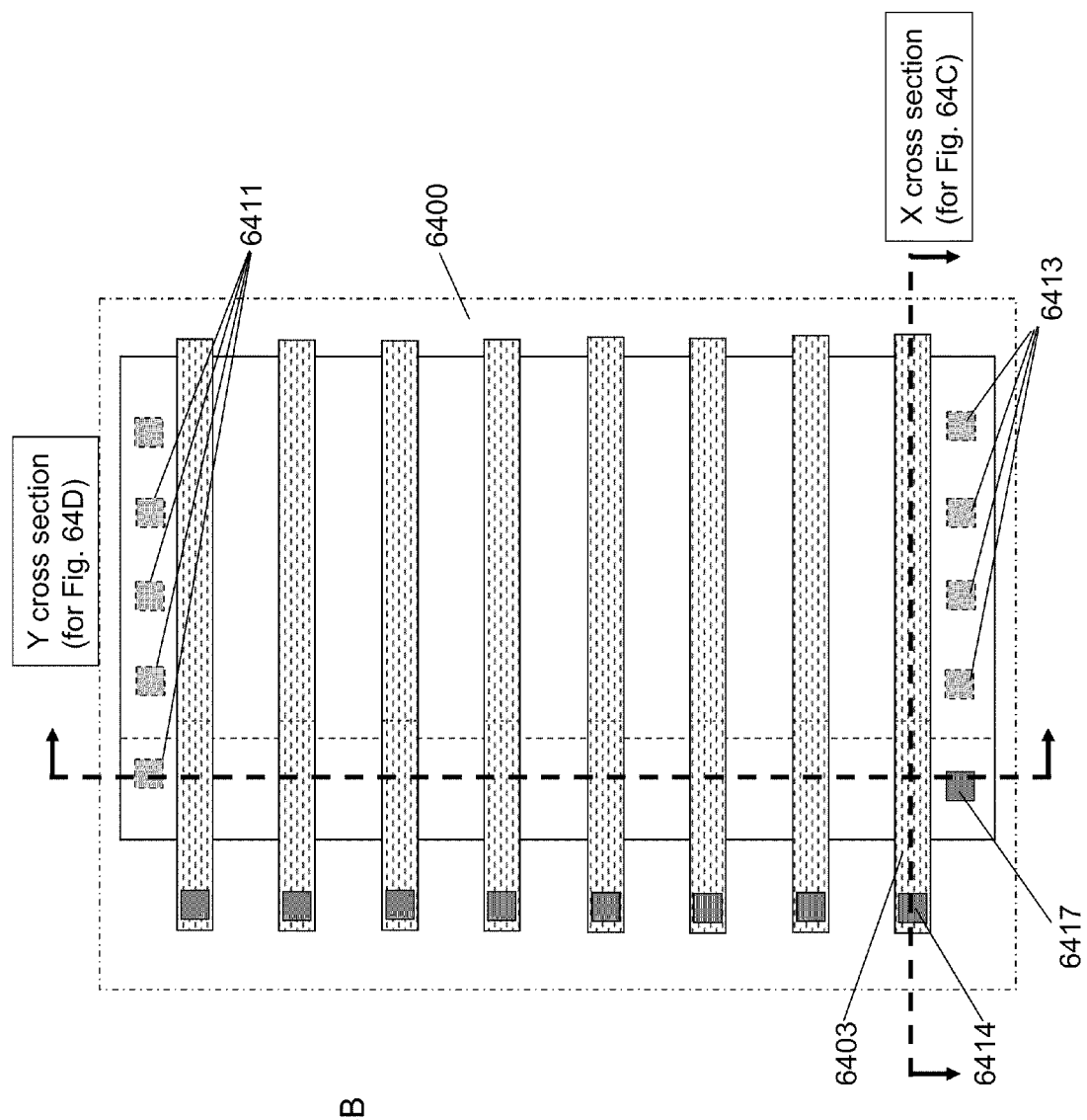
Figure 64C:
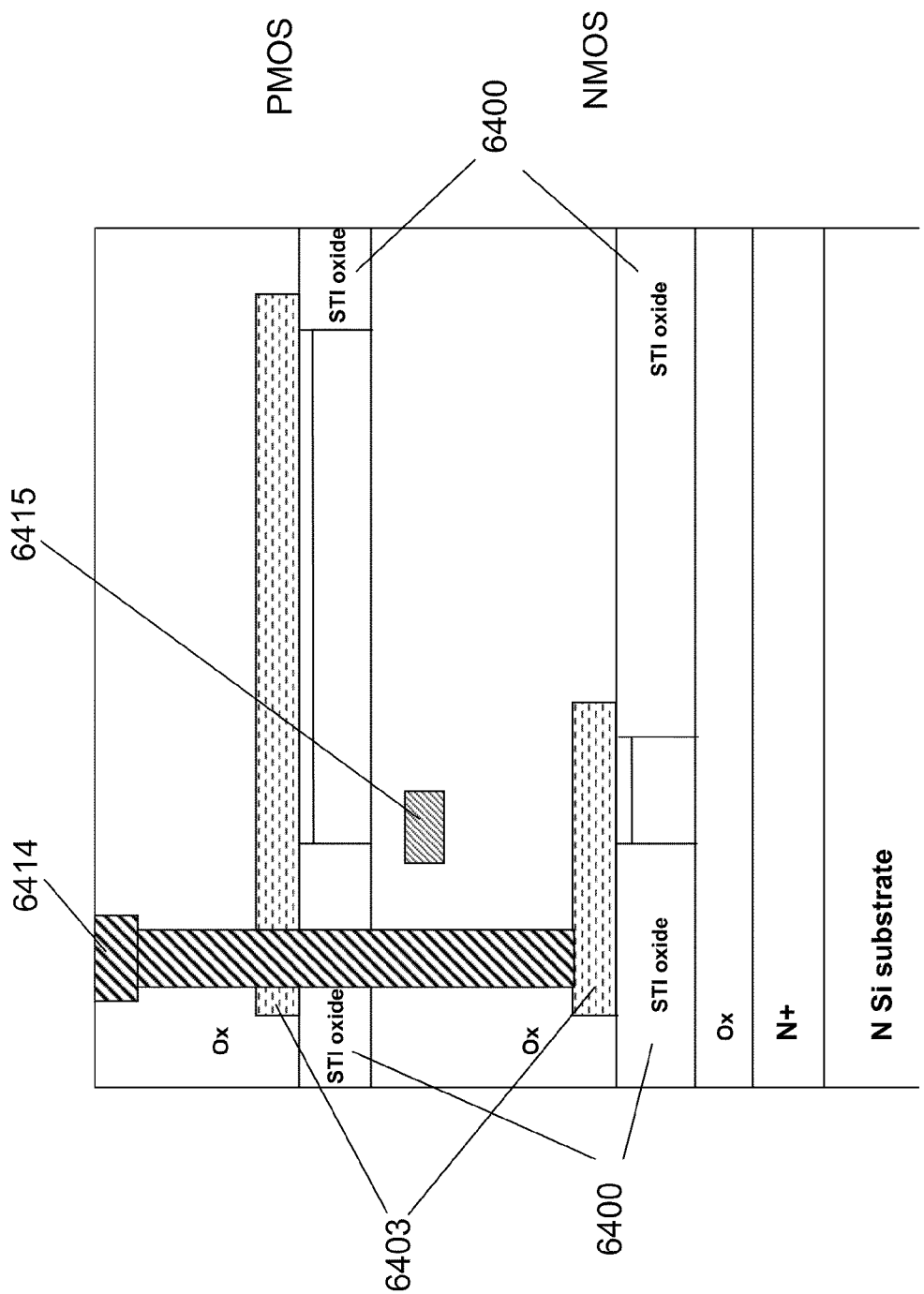
Figure 64D:
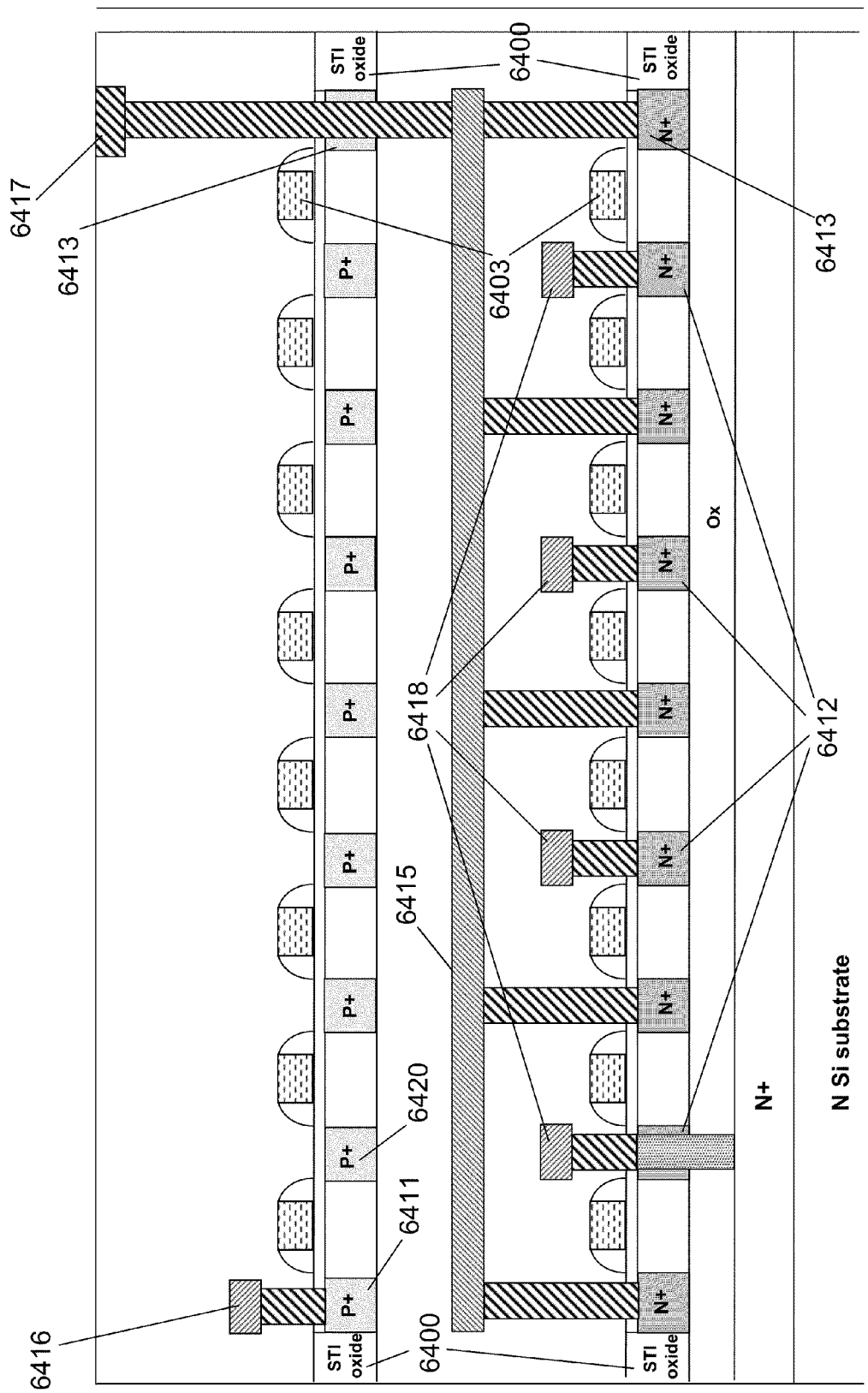
Figure 64G:
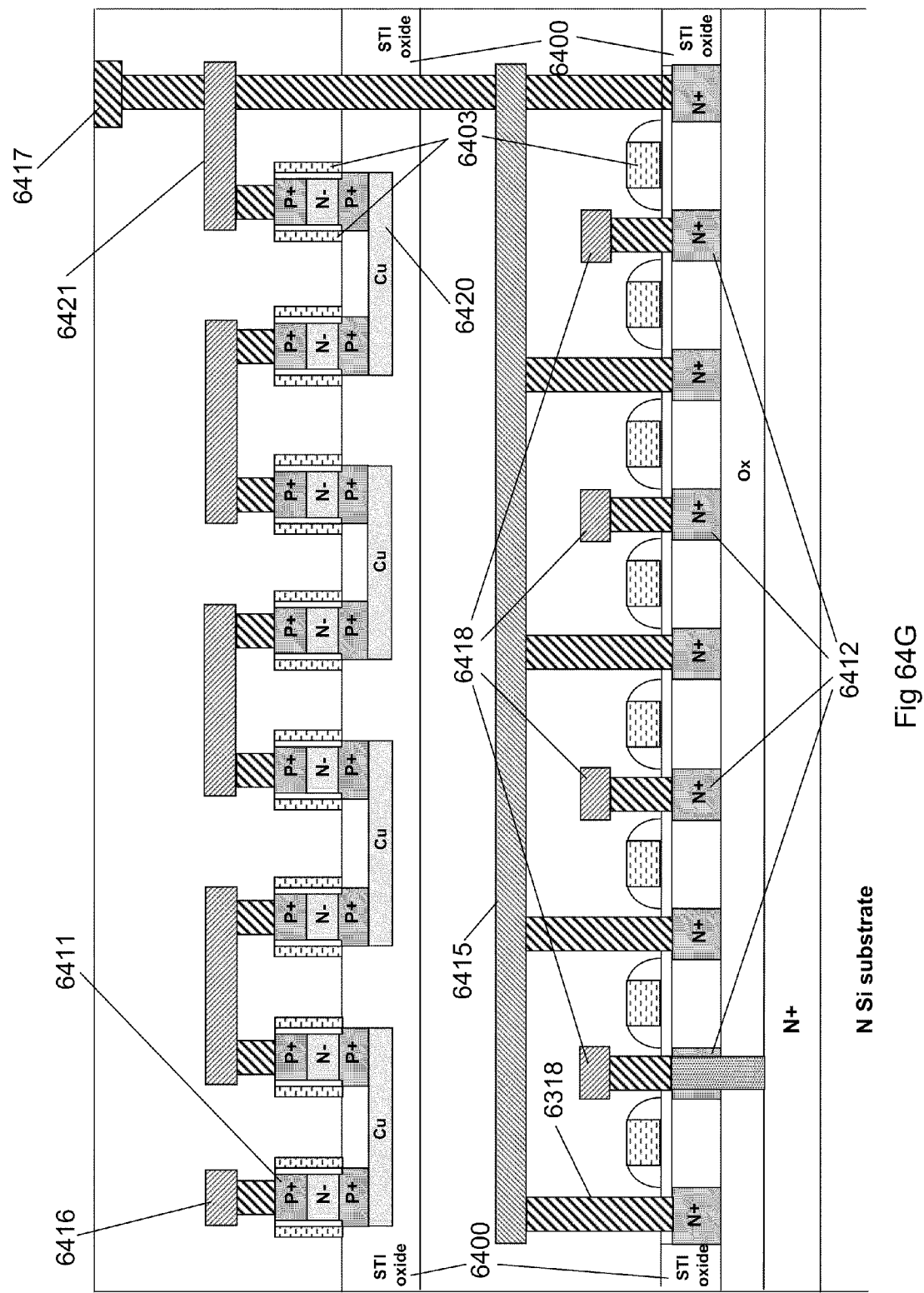

The topside view of the 3D NOR-8 cell, with no metal shown and with horizontal NMOS and PMOS devices, is illustrated in FIG. 64B, the cell X cross sectional views is illustrated in FIG. 64C, and the Y cross sectional view is illustrated in FIG. 64D. The NAND-8 cell with vertical PMOS and horizontal NMOS devices are shown in FIG. 64E for topside view, 64 F for the X cross section view, and 64 G for the Y cross sectional view. The PMOS H source 6411 is tied to the V+ supply metal 6416 in the PMOS metal 1 layer thru a P+ to Metal contact. The PMOS H drain is tied 6420 to PMOS G source in the PMOS silicon layer. The NMOS sources 6412 are all tied to ground by N+ to NMOS metal-1 contacts to metal lines 6418 and to the backplane N+ ground layer in the N– substrate. Input A on PMOS metal-2 is tied to both PMOS and NMOS gates 6403 with a gate on STI to gate on STI contact 6414. The NMOS drains are all tied together with NMOS metal-2 6415 to the NMOS A drain and PMOS A drain 6413 by the P+ to N+ to PMOS metal-2 contact 6417, which is tied to output Y. FIG. 64G illustrates the use of vertical PMOS transistors to compactly tie the stack sources and drain, and make a very compact area cell shown in FIG. 64E. The transistor isolation oxides 6400 are illustrated.

Accordingly a CMOS circuit may be constructed where the various circuit cells are built on two silicon layers achieving a smaller circuit area and shorter intra and inter transistor interconnects. As interconnects become dominating for power and speed, packing circuits in a smaller area would result in a lower power and faster speed end device.

Persons of ordinary skill in the art will appreciate that a number of different process flows have been described with exemplary logic gates and memory cells used as representative circuits. Such skilled persons will further appreciate that whichever flow is chosen for an individual design, a library of all the desired logic functions for use in the design may be created so that the cells may easily be reused either within that individual design or in subsequent ones employing the same flow. Such skilled persons will also appreciate that many different design styles may be used for a given design. For example, a library of logic cells could be built in a manor that has uniform height called standard cells as is well known in the art. Alternatively, a library could be created for use in long continuous strips of transistors called a gated array which is also known in the art. In another alternative embodiment, a library of cells could be created for use in a hand crafted or custom design as is well known in the art. For example, in yet another alternative embodiment, any combination of libraries of logic cells tailored to these design approaches can be used in a particular design as a matter of design choice, the only requirement being that the libraries chosen employ the same process flow if they are to be used on the same layers of a 3D IC. Different flows may be used on different levels of a 3D IC, and one or more libraries of cells appropriate for each respective level may be used in a single design.

Also known in the art are computer program products that may be stored in computer readable media for use in data processing systems employed to automate the design process, more commonly known as computer aided design (CAD) software. Persons of ordinary skill in the art will appreciate the advantages of designing the cell libraries in a manner compatible with the use of CAD software.

Persons of ordinary skill in the art will realize that libraries of I/O cells, analog function cells, complete memory blocks of various types, and other circuits may also be created for one or more processing flows to be used in a design and that such libraries may also be made compatible with CAD software. Many other uses and embodiments will suggest themselves to such skilled persons after reading this specification, thus the scope of the invention is to be limited only by the appended claims.

Figure 59:
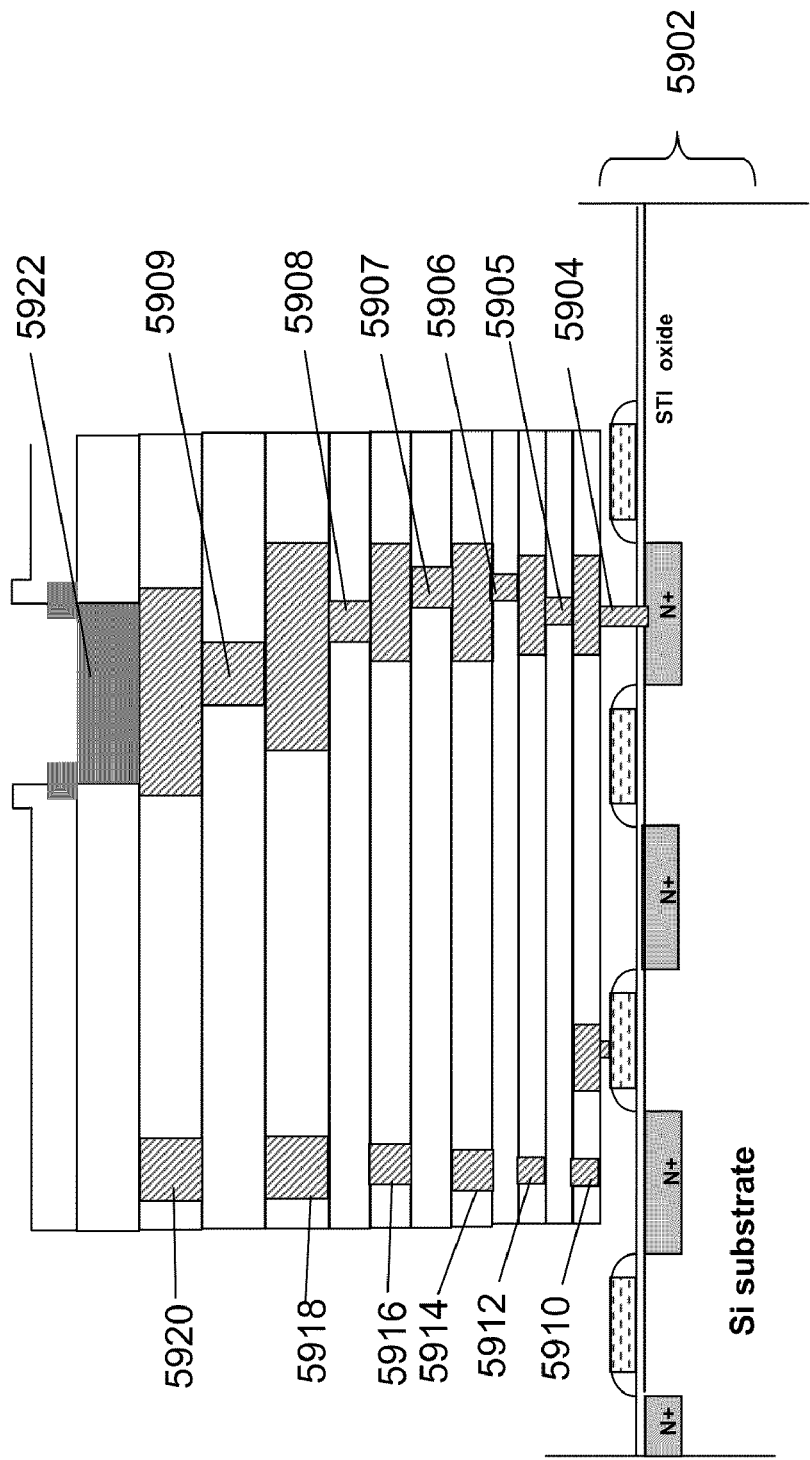
FIG. 59 is a drawing illustration of a metal interconnect stack prior art.

Additionally, when circuit cells are built on two or more layers of thin silicon as shown above, and enjoy the dense vertical thru silicon via interconnections, the metallization layer scheme to take advantage of this dense 3D technology may be improved as follows. FIG. 59 illustrates the prior art of silicon integrated circuit metallization schemes. The conventional transistor silicon layer 5902 is connected to the first metal layer 5910 thru the contact 5904. The dimensions of this interconnect pair of contact and metal lines generally are at the minimum line resolution of the lithography and etch capability for that technology process node. Traditionally, this is called a "1X" design rule metal layer. Usually, the next metal layer is also at the "1X" design rule, the metal line 5912 and via below 5905 and via above 5906 that connects metals 5912 with 5910 or with 5914 where desired. Then the next few layers are often constructed at twice the minimum lithographic and etch capability and called '2X' metal layers, and have thicker metal for higher current carrying capability. These are illustrated with metal line 5914 paired with via 5907 and metal line 5916 paired with via 5908 in FIG. 59. Accordingly, the metal via pairs of 5918 with 5909, and 5920 with bond pad opening 5922, represent the '4X' metallization layers where the planar and thickness dimensions are again larger and thicker than the 2X and 1X layers. The precise number of 1X or 2X or 4X layers may vary depending on interconnection needs and other requirements; however, the general flow is that of increasingly larger metal line, metal space, and via dimensions as the metal layers are farther from the silicon transistors and closer to the bond pads.

Figure 60:
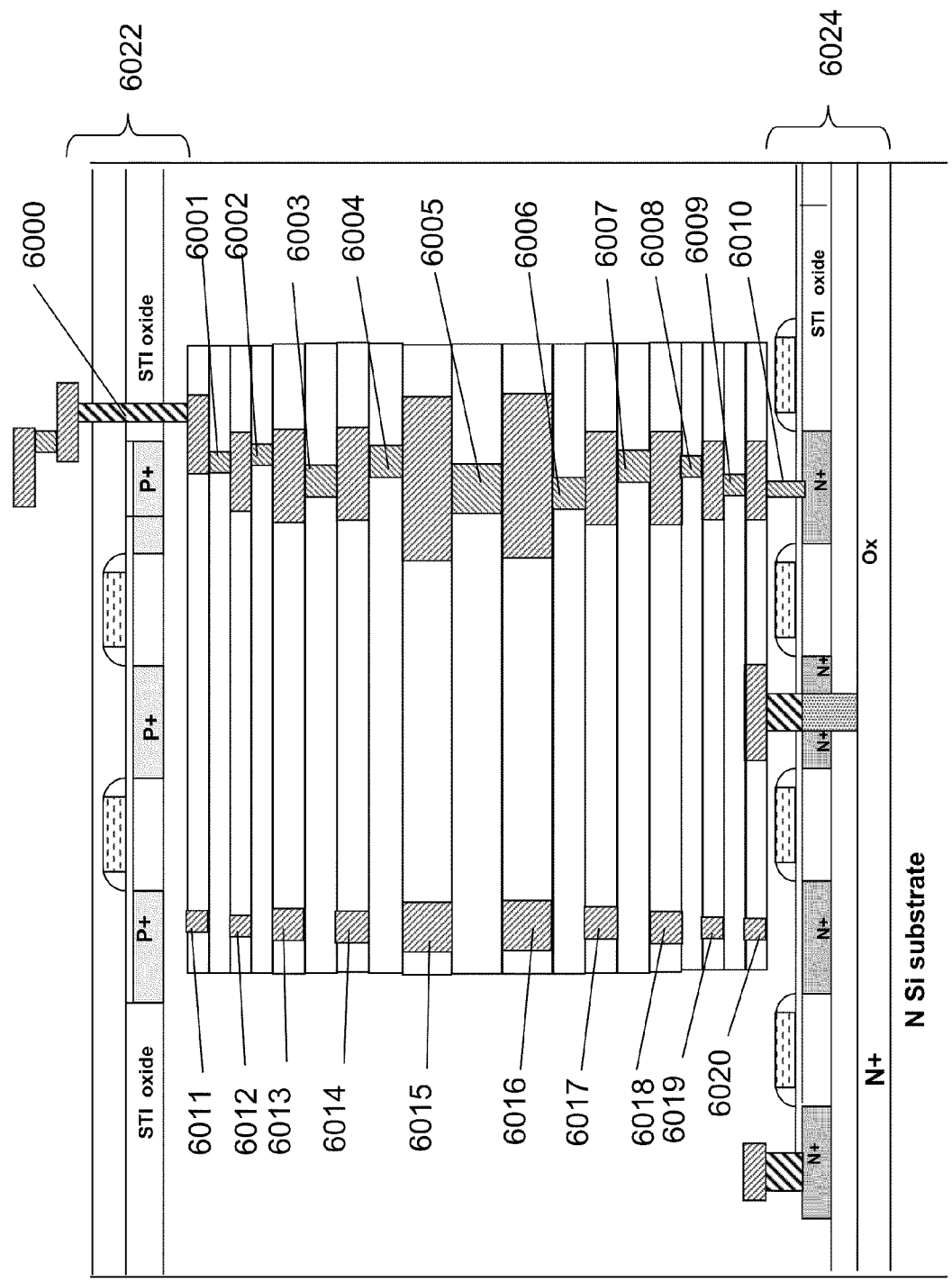
FIG. 60 is a drawing illustration of a metal interconnect stack.

The metallization layer scheme may be improved for 3D circuits as illustrated in FIG. 60. The first crystallized silicon device layer 6024 is illustrated as the NMOS silicon transistor layer from the above 3D library cells, but may also be a conventional logic transistor silicon substrate or layer. The '1X' metal layers 6020 and 6019 are connected with contact 6010 to the silicon transistors and vias 6008 and 6009 to each other or metal line 6018. The 2X layer pairs metal 6018 with via 6007 and metal 6017 with via 6006. The 4X metal layer 6016 is paired with via 6005 and metal 6015, also at 4X. However, now via 6004 is constructed in 2X design rules to enable metal line 6014 to be at 2X. Metal line 6013 and via 6003 are also at 2X design rules and thicknesses. Vias 6002 and 6001 are paired with metal lines 6012 and 6011 at the 1X minimum design rule dimensions and thickness. The thru silicon via 6000 of the illustrated PMOS layer transferred silicon 6022 may then be constructed at the 1X minimum design rules and provide for maximum density of the top layer. The precise numbers of 1X or 2X or 4X layers may vary depending on circuit area and current carrying metallization requirements and tradeoffs. The layer transferred top transistor layer 6022 may be any of the low temperature devices illustrated herein.

As well, the independent formation of each transistor layer enables the use of materials other than silicon to construct transistors. For example, a thin III-V compound quantum well channel such as InGaAs and InSb may be utilized on one or more of the 3D layers described above by direct layer transfer or deposition and the use of buffer compounds such as GaAs and InAlAs to buffer the silicon and III-V lattice mismatches. This enables high mobility transistors that can be optimized independently for p and n-channel use, solving the integration difficulties of incorporating n and p III-V transistors on the same substrate, and also the difficulty of integrating the III-V transistors with conventional silicon transistors on the same substrate. For example, the first layer silicon transistors and metallization generally cannot be exposed to temperatures higher than 400° C. The III-V compounds, buffer layers, and dopings generally require processing temperatures above that 400° C. threshold. By use of the pre deposited, doped, and annealed layer donor wafer formation and subsequent donor to acceptor wafer transfer techniques described above and illustrated in FIGS. 14, 20 to 29, and 43 to 45, III-V transistors and circuits may be constructed on top of silicon transistors and circuits without damaging said underlying silicon transistors and circuits. As well, any stress mismatches between the dissimilar materials desired to be integrated, such as silicon and III-V compounds, may be mitigated by the oxide layers, or specialized buffer layers, that are vertically in-between the dissimilar material layers. Additionally, this now enables the integration of optoelectronic elements, communication, and data path processing with conventional silicon logic and memory transistors and silicon circuits. Another example of a material other than silicon that the independent formation of each transistor layer enables is Germanium.

It should be noted that this 3D IC technology could be used for many applications. As an example the various structures presented in FIGS. 15 to 19 having been constructed in the 'foundation,' which may be below the main or primary or house layer, could be just as well be 'fabricated' in the "Attic," which may be above the main or primary or house layer, by using the techniques described in relation to FIGS. 21 to 35.

Figure 36:
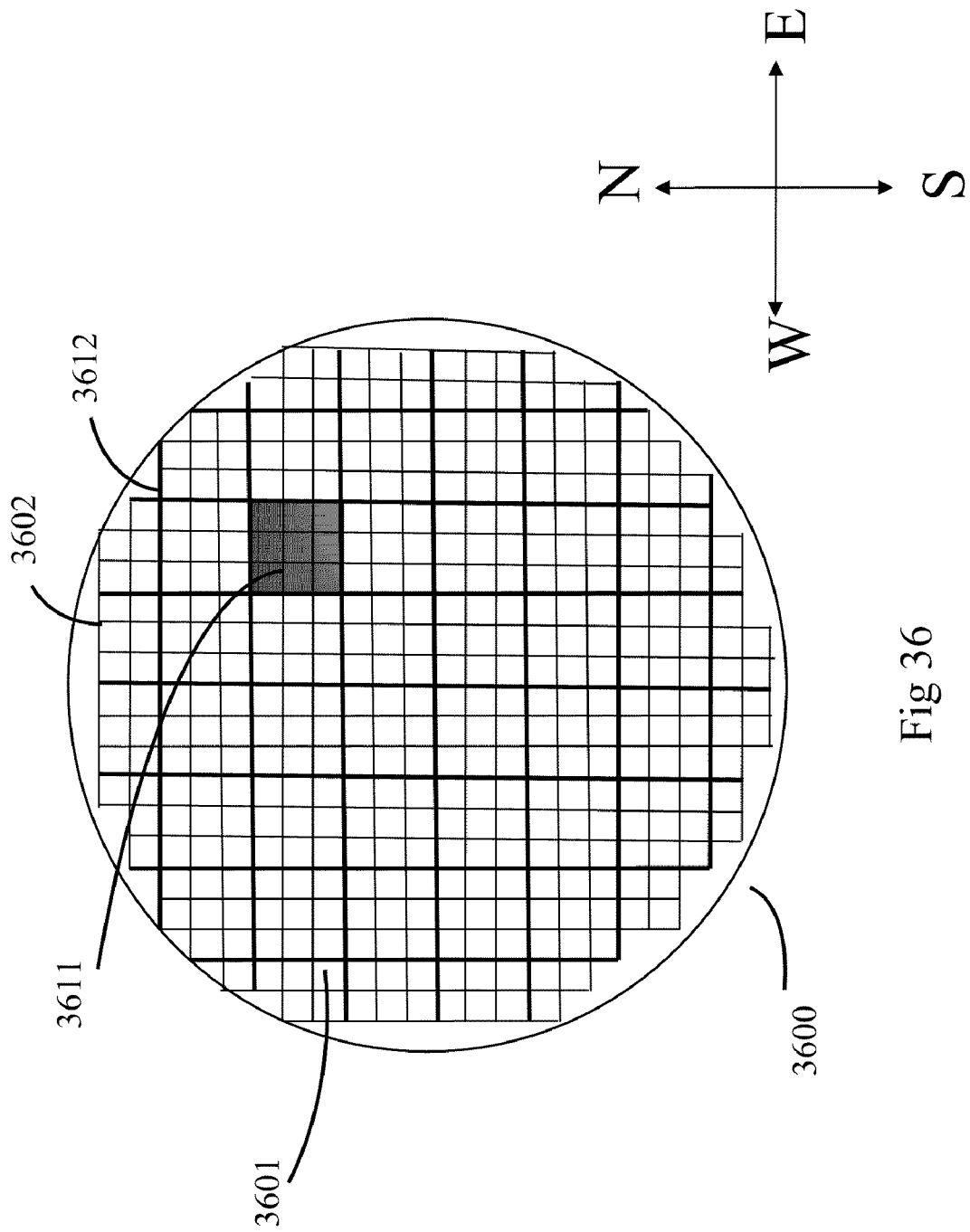
FIG. 36 is a drawing illustration of a tile array wafer.

It also should be noted that the 3D programmable system, where the logic fabric is sized by dicing a wafer of tiled array as illustrated in FIG. 36, could utilize the 'monolithic' 3D techniques related to FIG. 14 in respect to the 'Foundation', or to FIGS. 21 through 35 in respect to the Attic, to add IO or memories as presented in FIG. 11. So while in many cases constructing a 3D programmable system using TSV could be preferable there might be cases where it will be better to use the 'Foundation' or 'Attic".

When a substrate wafer, carrier wafer, or donor wafer is thinned by a cleaving method and a chemical mechanical polish (CMP) in this document, there are other methods that may be employed to thin the wafer. For example, a boron implant and anneal may be utilized to create a layer in the silicon substrate to be thinned that will provide a wet chemical etch stop plane. A dry etch, such as a halogen gas cluster beam, may be employed to thin a silicon substrate and then smooth the silicon surface with an oxygen gas cluster beam. Additionally, these thinning techniques may be utilized independently or in combination to achieve the proper thickness and defect free surface as required by the process flow.

Figure 9A:
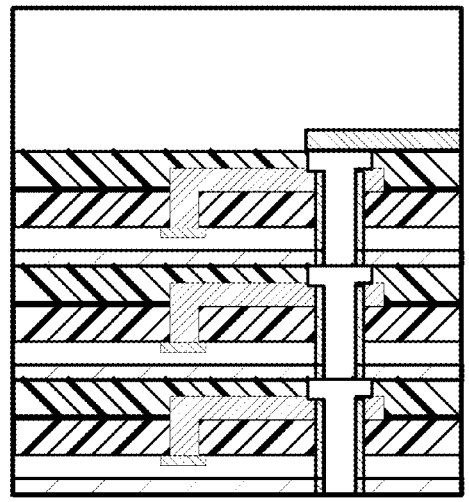
FIGS. 9A through 9C are a drawing illustration of an IC system utilizing Through Silicon Via of a prior art.
Figure 9B:
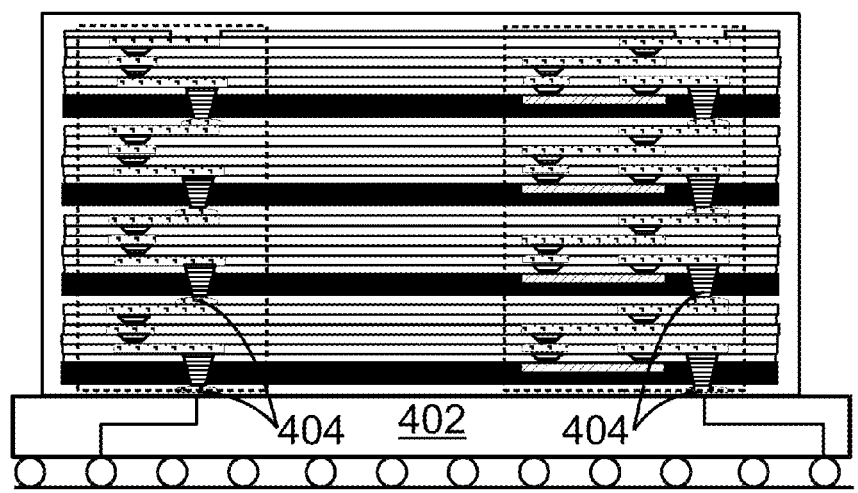
Figure 9C:
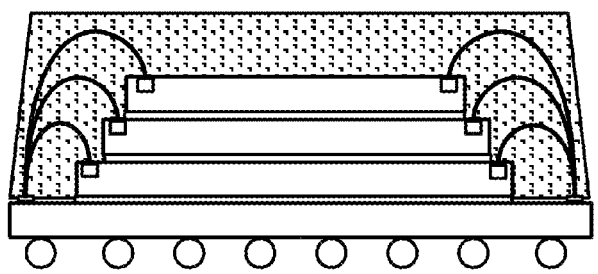

FIGS. 9A through 9C illustrates alternative configurations for three-dimensional—3D integration of multiple dies constructing IC system and utilizing Through Silicon Via. FIG. 9A illustrates an example in which the Through Silicon Via is continuing vertically through all the dies constructing a global cross-die connection.

FIG. 9B provides an illustration of similar sized dies constructing a 3D system. FIG. 9B shows that the Through Silicon Via 404 is at the same relative location in all the dies constructing a standard interface.

FIG. 9C illustrates a 3D system with dies having different sizes. FIG. 9C also illustrates the use of wire bonding from all three dies in connecting the IC system to the outside.

Figure 10A:
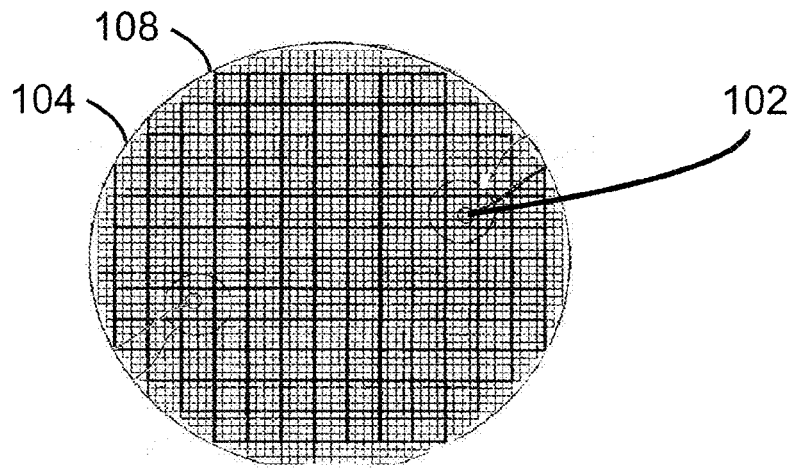
FIG. 10A is a drawing illustration of continuous array wafer of a prior art.
Figure 10B:
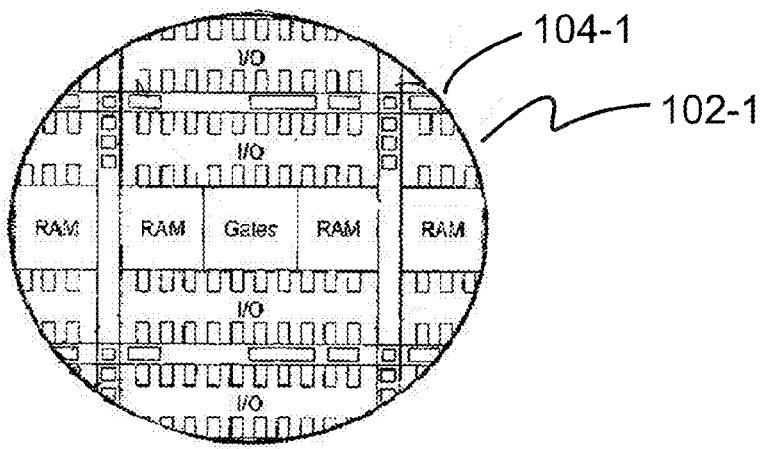
FIG. 10B is a drawing illustration of continuous array portion of wafer of a prior art.
Figure 10C:
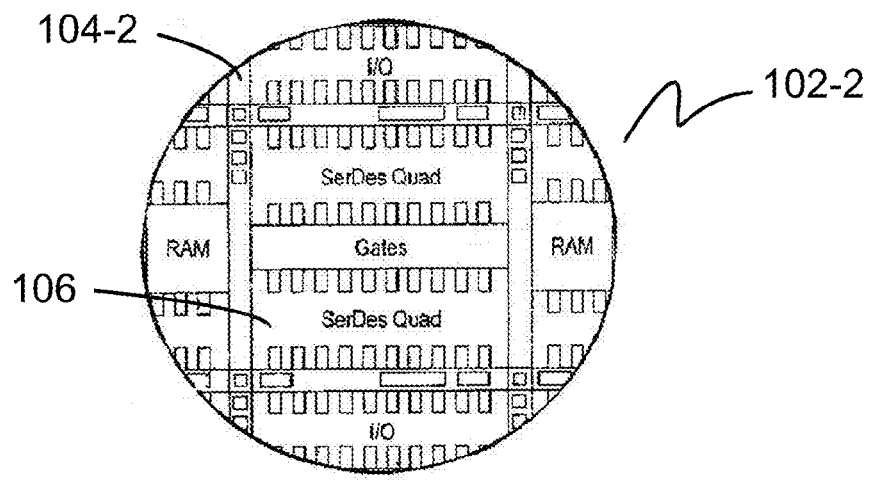
FIG. 10C is a drawing illustration of continuous array portion of wafer of a prior art.

FIG. 10A is a drawing illustration of a continuous array wafer of a prior art U.S. Pat. No. 7,337,425. The bubble 102 shows the repeating tile of the continuous array, and the lines 104 are the horizontal and vertical potential dicing lines. The tile 102 could be constructed as in FIG. 10B 102-1 with potential dicing line 104-1 or as in FIG. 10C with SerDes Quad 106 as part of the tile 102-2 and potential dicing lines 104-2.

In general logic devices comprise varying quantities of logic elements, varying amounts of memories, and varying amounts of I/O. The continuous array of the prior art allows defining various die sizes out of the same wafers and accordingly varying amounts of logic, but it is far more difficult to vary the three-way ratio between logic, I/O, and memory. In addition, there exists different types of memories such as SRAM, DRAM, Flash, and others, and there exist different types of I/O such as SerDes. Some applications might need still other functions like processor, DSP, analog functions, and others.

Embodiments of the current invention may enable a different approach. Instead of trying to put all of these different functions onto one programmable die, which will require a large number of very expensive mask sets, it uses Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly embodiments of the current invention may suggest the use of a continuous array of tiles focusing each one on a single, or very few types of, function. Then, it constructs the end-system by integrating the desired amount from each type of tiles, in a 3D IC system.

Figure 11A:
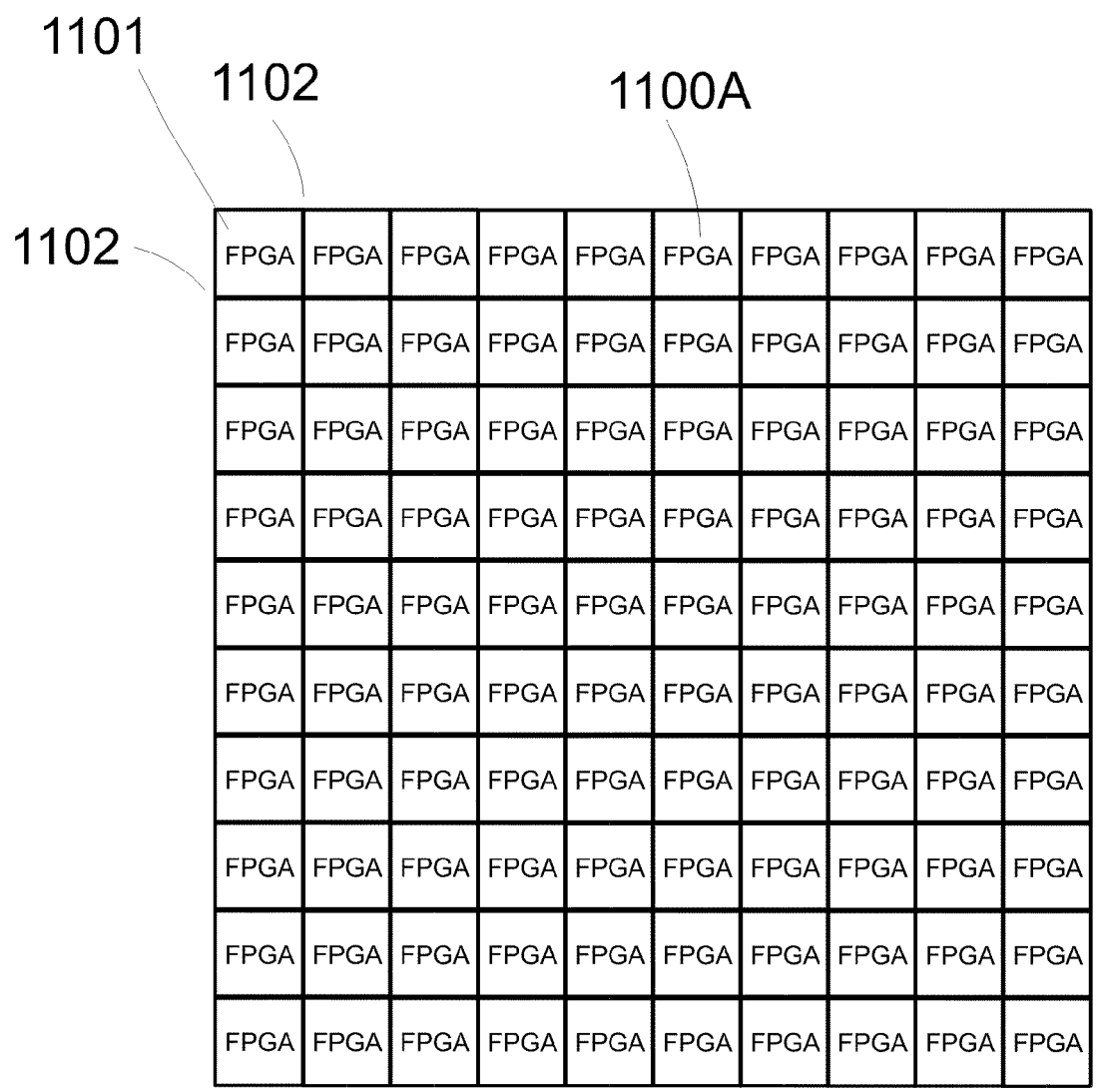
FIGS. 11A through 11F are a drawing illustration of one reticle site on a wafer.

FIG. 11A is a drawing illustration of one reticle site on a wafer comprising tiles of programmable logic 1100A denoted FPGA. Such wafer is a continuous array of programmable logic. 1102 are potential dicing lines to support various die sizes and the amount of logic to be constructed from one mask set. This die could be used as a base 1202A, 1202B, 1202C or 1202D of the 3D system as in FIG. 12. In one alternative of this invention these dies may carry mostly logic, and the desired memory and I/O may be provided on other dies, which may be connected by means of Through-Silicon Via. It should be noted that in some cases it will be desired not to have metal lines, even if unused, in the dicing streets 108. In such case, at least for the logic dies, one may use dedicated masks to allow connection over the unused potential dicing lines to connect the individual tiles according to the desire die size. The actual dicing lines are also called streets.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles with one reticle.

The repeating tile 102 could be of various sizes. For FPGA applications it may be reasonable to assume tile 1101 to have an edge size between 0.5 mm to 1 mm which allows good balance between the end-device size and acceptable relative area loss due to the unused potential dice lines 1102.

There are many advantages for a uniform repeating tile structure of FIG. 11A where a programmable device could be constructed by dicing the wafer to the desired size of programmable device. Yet it is still helpful that the end-device act as a complete integrated device rather than just as a collection of individual tiles 1101. FIG. 36 illustrates a wafer carrying an array of tiles 3601 with potential dice lines 3602 to be diced along actual dice lines 3612 to construct an end-device 3611 of 3×3 tiles. The end device 3611 is bounded by the actual dice lines 3612.

Figure 37:
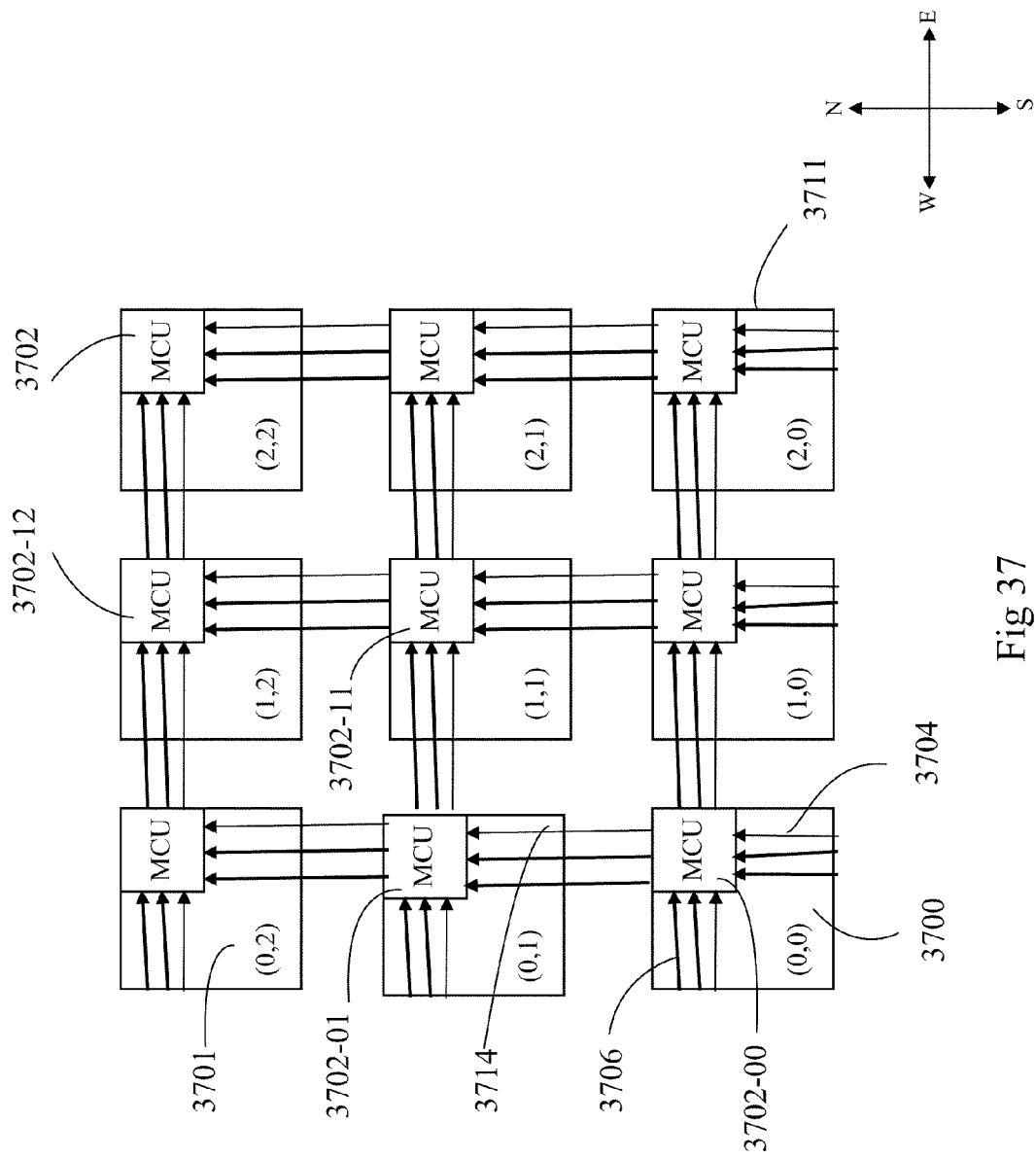
FIG. 37 is a drawing illustration of a programmable end device.

FIG. 37 is a drawing illustration of an end-device 3611 comprising 9 tiles 3701 such as 3601. Each tile 3701 contains a tiny micro control unit—MCU 3702. The micro control unit could have a common architecture such as an 8051 with its own program memory and data memory. The MCUs in each tile will be used to load the FPGA tile 3701 with its programmed function and all its required initialization for proper operation of the device. The MCU of each tile is connected so to be controlled by the tile west of it or the tile south of it, in that order of priority. So, for example, the MCU 3702-11 will be controlled by MCU 3702-01. The MCU 3702-01 has no MCU west of it so it will be controlled by the MCU south of it 3702-00. Accordingly the MCU 3702-00 which is in south-west corner has no tile MCU to control it and it will therefore be the master control unit of the end-device.

Figure 38:
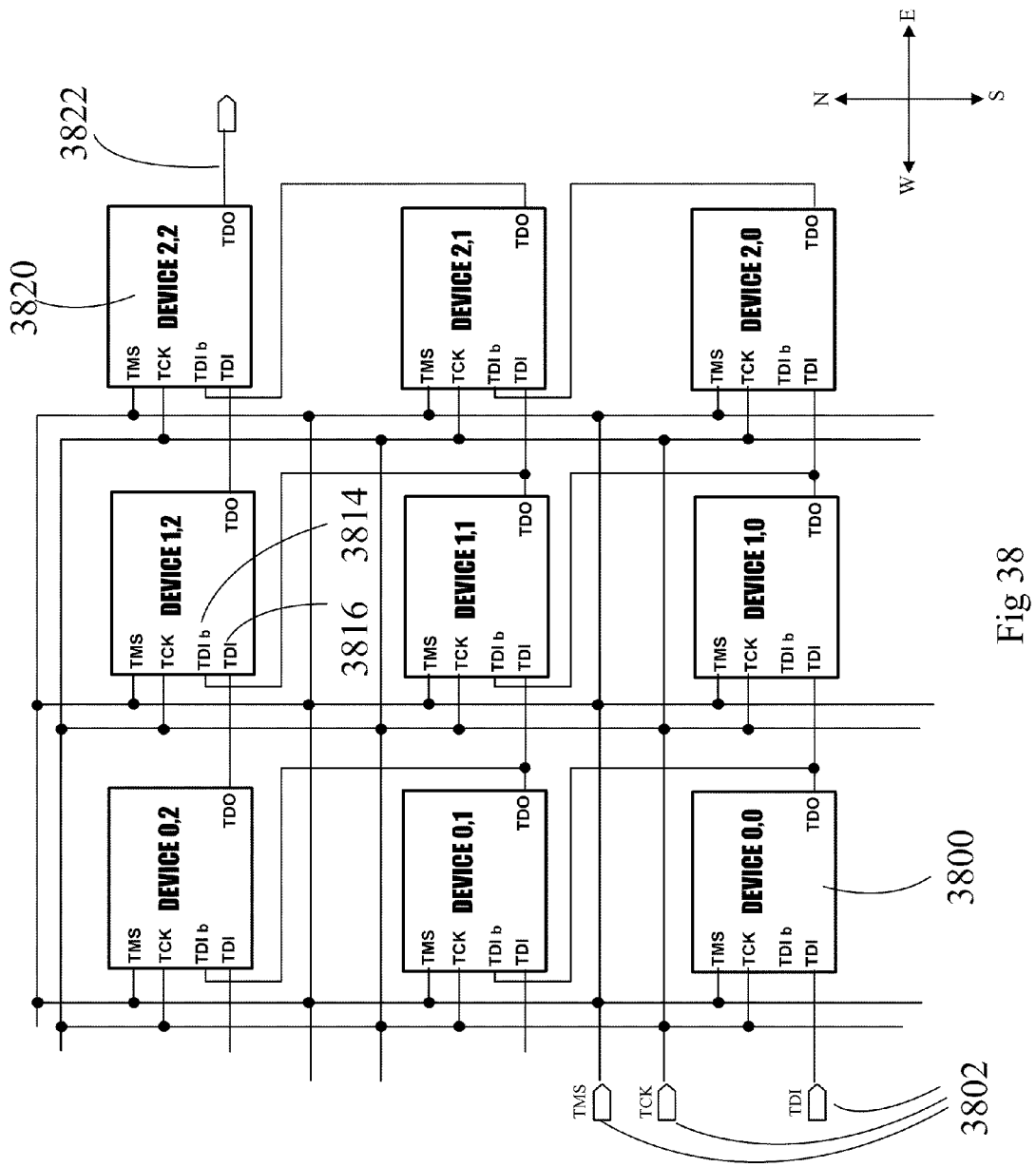
FIG. 38 is a drawing illustration of modified JTAG connections.

FIG. 38 illustrates a simple control connectivity utilizing a slightly modified Joint Test Action Group (JTAG)-based MCU architecture to support such a tiling approach. Each MCU has two Time-Delay-Integration (TDI) inputs, TDI 3816 from the device on its west side and TDIb 3814 from the MCU on its south side. As long as the input from its west side TDI 3816 is active it will be the controlling input, otherwise the TDIb 3814 from the south side will be the controlling input. Again in this illustration the Tile at the south-west corner 3800 will take control as the master. Its control inputs 3802 would be used to control the end-device and through this MCU 3800 it will spread to all other tiles. In the structure illustrated in FIG. 38 the outputs of the end-device 3611 are collected from the MCU of the tile at the north-east corner 3820 at the TDO output 3822. These MCUs and their connectivity would be used to load the end-device functions, initialize it, test it, debug it, program its clocks, and all other desired control functions. Once the end-device has completed its set up or other control and initialization functions such as testing or debugging, these MCUs could be then utilized for user functions as part of the end-device operation.

An additional advantage for this construction of a tiled FPGA array with MCUs is in the construction of an SoC with embedded FPGA function. A single tile 3601 could be connected to an SoC using Through Silicon Vias—TSVs and accordingly provides a self-contained embedded FPGA function.

Clearly, the same scheme can be modified to use the East/North (or any other combination of orthogonal directions) to encode effectively an identical priority scheme.

Figure 11B:
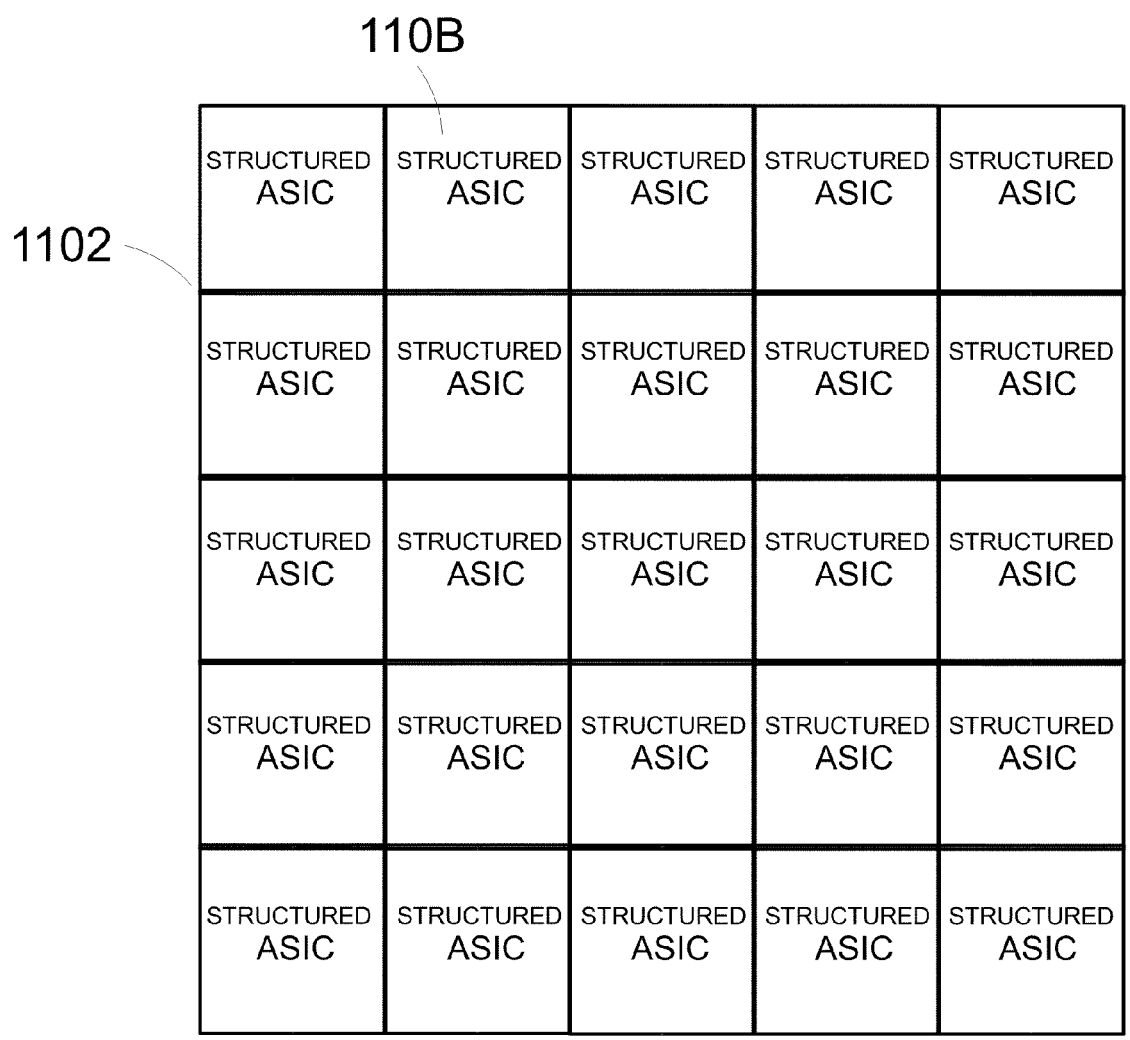

FIG. 11B is a drawing illustration of an alternative reticle site on a wafer comprising tiles of Structured ASIC 1100B. Such wafer may be, for example, a continuous array of configurable logic. 1102 are potential dicing lines to support various die sizes and the amount of logic to be constructed. This die could be used as a base 1202A, 1202B, 1202C or 1202D of the 3D system as in FIG. 12.

Figure 11C:

FIG. 11C is a drawing illustration of another reticle site on a wafer comprising tiles of RAM 1100C. Such wafer may be a continuous array of memories. The die diced out of such wafer may be a memory die component of the 3D integrated system. It might include an antifuse layer or other form of configuration technique to function as a configurable memory die. Yet it might be constructed as a multiplicity of memories connected by a multiplicity of Through-Silicon Vias to the configurable die, which may also be used to configure the raw memories of the memory die to the desired function in the configurable system.

Figure 11D:
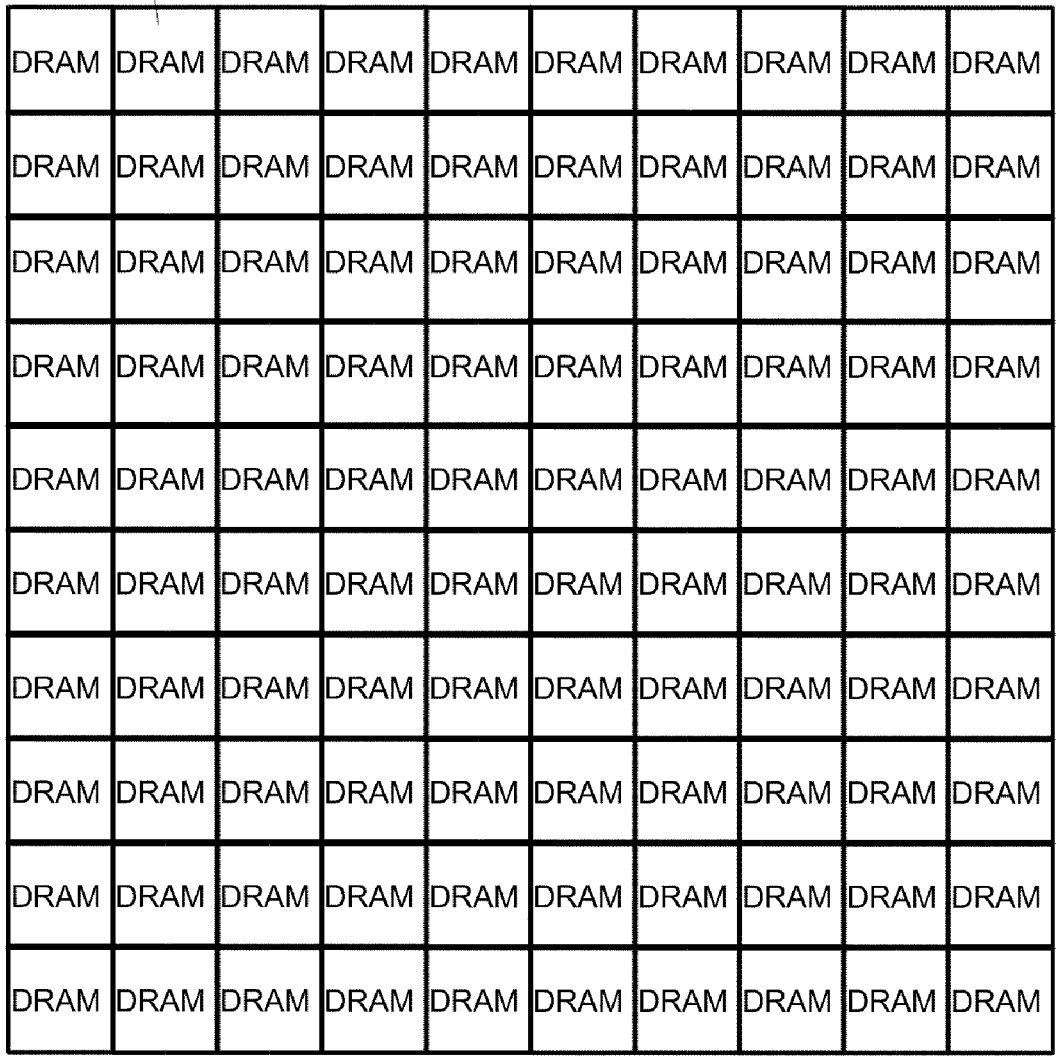

FIG. 11D is a drawing illustration of another reticle site on a wafer comprising tiles of DRAM 1100D. Such wafer may be a continuous array of DRAM memories.

Figure 11E:

FIG. 11E is a drawing illustration of another reticle site on a wafer comprising tiles of microprocessor or microcontroller cores 1100E. Such wafer may be a continuous array of Processors.

Figure 11F:

FIG. 11F is a drawing illustration of another reticle site on a wafer comprising tiles of I/Os 1100F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through-Silicon Vias to the configurable die, which may also be used to configure the raw I/Os of the I/O die to the desired function in the configurable system.

I/O circuits are a good example of where it could be advantageous to utilize an older generation process. Usually, the process drivers are SRAM and logic circuits. It often takes longer to develop the analog function associated with I/O circuits, SerDes circuits, PLLs, and other linear functions. Additionally, while there may be an advantage to using smaller transistors for the logic functionality, I/O may require stronger drive and relatively larger transistors. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control. Clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There are new techniques to build optical guides on silicon or other substrates. An optical clock distribution may be utilized to minimize the power used for clock signal distribution and would enable low skew and low noise for the rest of the digital system. Having the optical clock constructed on a different die and than connected to the digital die by means of Through-Silicon-Vias or by optical means make it very practical, when compared to the prior art of integrating optical clock distribution with logic on the same die.

Alternatively the optical clock distribution guides and potentially some of the support electronics such as the conversion of the optical signal to electronic signal could be integrated by using layer transfer and smart cut approaches as been described before in FIGS. 14 and 20. The optical clock distribution guides and potentially some of the support electronics could be first built on the 'Foundation' wafer 1402 and then a thin layer 1404 may be transferred on top of it using the 'smart cut' flow, so all the following construction of the primary circuit would take place afterward. The optical guide and its support electronics would be able to withstand the high temperatures required for the processing of transistors on layer 1404.

And as related to FIG. 20, the optical guide, and the proper semiconductor structures on which at a later stage the support electronics would be processed, could be pre-built on layer 2019. Using the 'smart cut' flow it would be then transferred on top of a fully processed wafer 808. The optical guide should be able to withstand the ion implant 2008 required for the 'smart cut' while the support electronics would be finalized in flows similar to the ones presented in FIGS. 21 to 35, and 39 to 94. This means that the landing target for the clock signal will need to accommodate the approximately 1 micron misalignment of the transferred layer 2004 to the prefabricated—primary circuit and its upper layer 808. Such misalignment could be acceptable for many designs. Alternatively only the base structure for the support electronics would be pre-fabricated on layer 2019 and the optical guide will be constructed after the layer transfer along with finalized flows of the support electronics using flows similar to the ones presented in relating to FIGS. 21-35, and 39 to 94. Alternatively, the support electronics could be fabricated on top of a fully processed wafer 808 by using flows similar to the ones presented in relating to FIGS. 21-35, and 39 to 94. Then an additional layer transfer on top of the support electronics would be utilized to construct the optical wave guides at low temperature.

Having wafers dedicated to each of these functions may support high volume generic product manufacturing. Then, similar to Lego® blocks, many different configurable systems could be constructed with various amounts of logic memory and I/O. In addition to the alternatives presented in FIG. 11A through 11F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, is a power control function. In many cases it is desired to shut down power at times to a portion of the IC that is not currently operational. Using controlled power distribution by an external die connected by TSVs is advantageous as the power supply voltage to this external die could be higher because it is using an older process. Having a higher supply voltage allows easier and better control of power distribution to the controlled die.

Those components of configurable systems could be built by one vendor, or by multiple vendors, who agree on a standard physical interface to allow mix-and-match of various dies from various vendors.

The construction of the 3D Programmable System could be done for the general market use or custom-tailored for a specific customer.

Another advantage of some embodiments of this invention may be an ability to mix and match various processes. It might be advantageous to use memory from a leading edge process, while the I/O, and maybe an analog function die, could be used from an older process of mature technology (e.g., as discussed above).

Figure 12A:
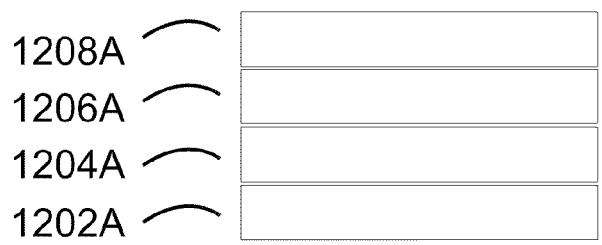
FIGS. 12A through 12E are a drawing illustration of Configurable system.
Figure 12B:
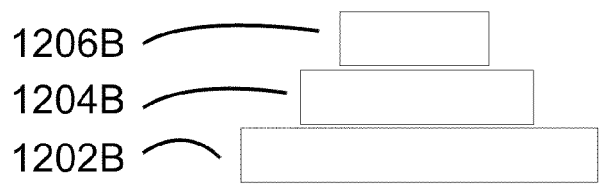
Figure 12C:
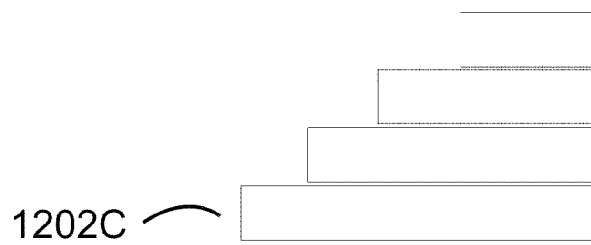
Figure 12D:
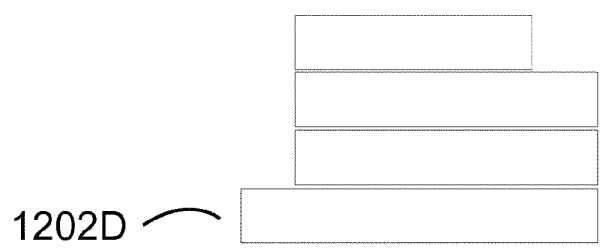
Figure 12E:
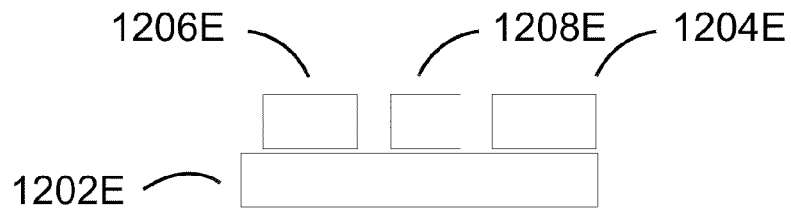

FIGS. 12A through 12E illustrate integrated circuit systems. An integrated circuit system that comprises configurable die could be called a Configurable System. FIG. 12A through 12E are drawings illustrating integrated circuit systems or Configurable Systems with various options of die sizes within the 3D system and alignments of the various dies. FIG. 12E presents a 3D structure with some lateral options. In such case a few dies 1204E, 1206E, 1208E are placed on the same underlying die 1202E allowing relatively smaller die to be placed on the same mother die. For example die 1204E could be a SerDes die while die 1206E could be an analog data acquisition die. It could be advantageous to fabricate these die on different wafers using different process and than integrate them in one system. When the dies are relatively small then it might be useful to place them side by side (such as FIG. 12E) instead of one on top of the other (FIGS. 12A-D).

The Through Silicon Via technology is constantly evolving. In the early generations such via would be 10 microns in diameter. Advanced work is now demonstrating Through Silicon Via with less than a 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other function.

Recent work on 3D integration shows effective ways to bond wafers together and then dice those bonded wafers. This kind of assembly may lead to die structures like FIG. 12A or FIG. 12D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 84A:
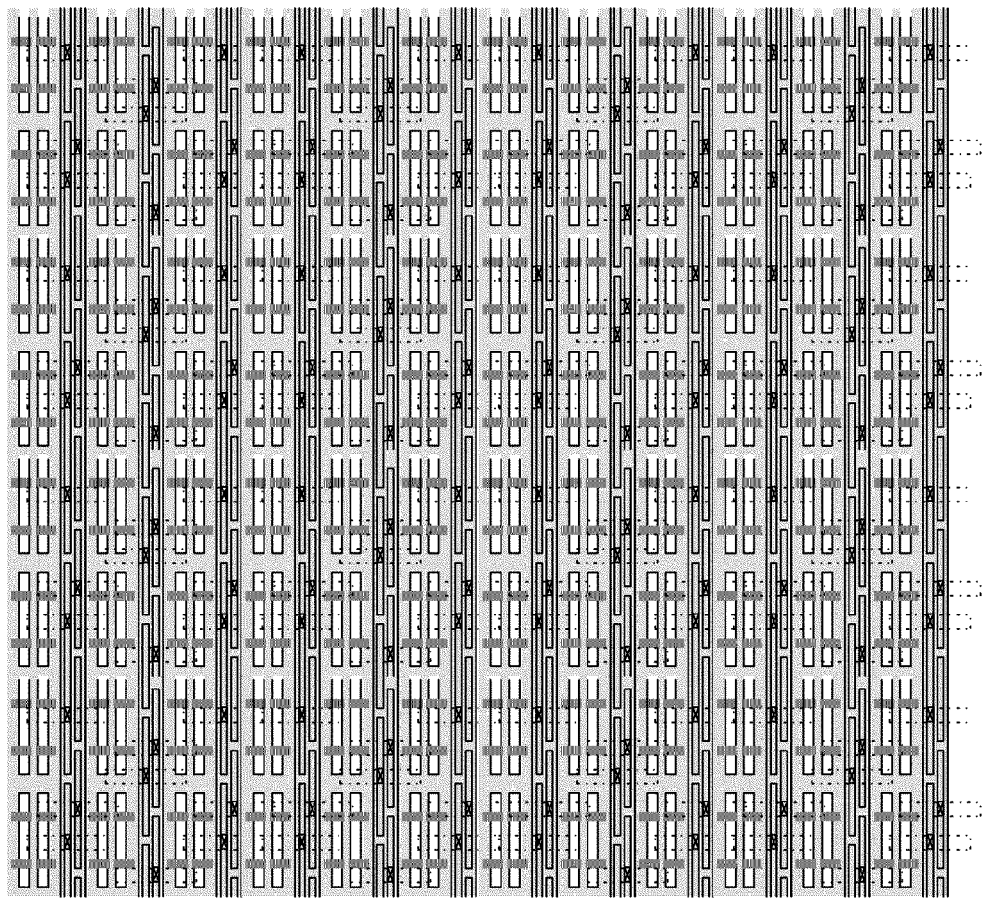
FIG. 84 A-G are drawing illustrations of continuous transistor arrays.
Figure 84B:
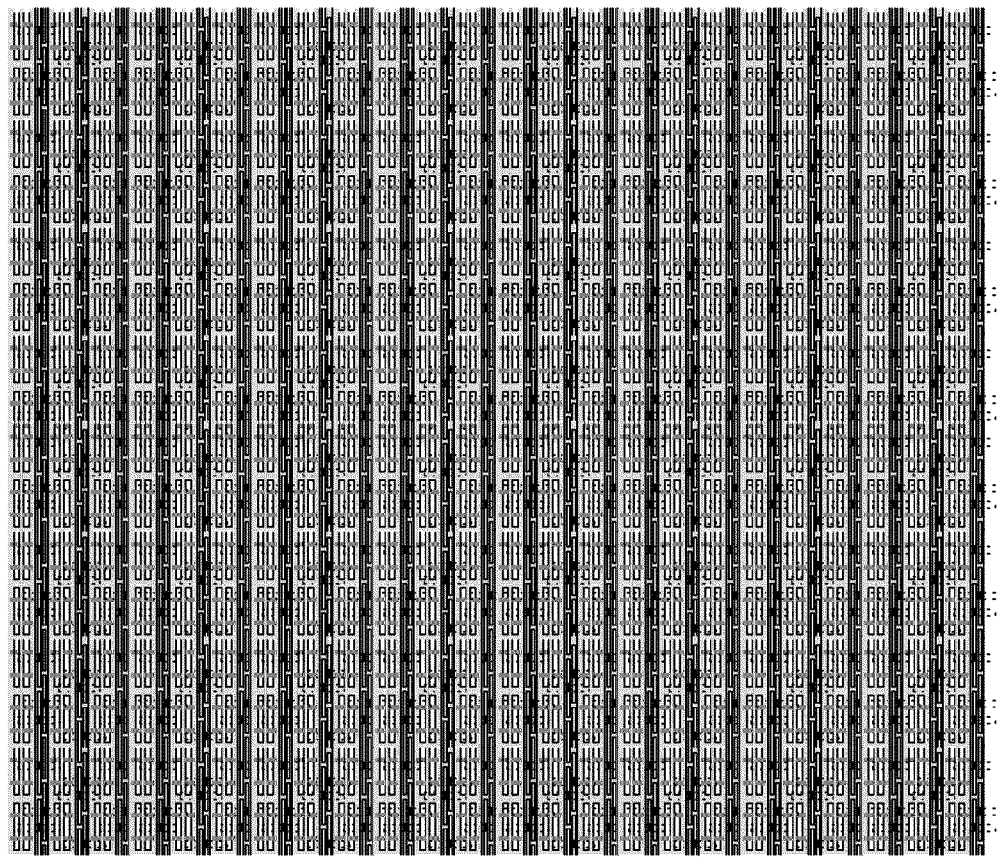
Figure 84C:
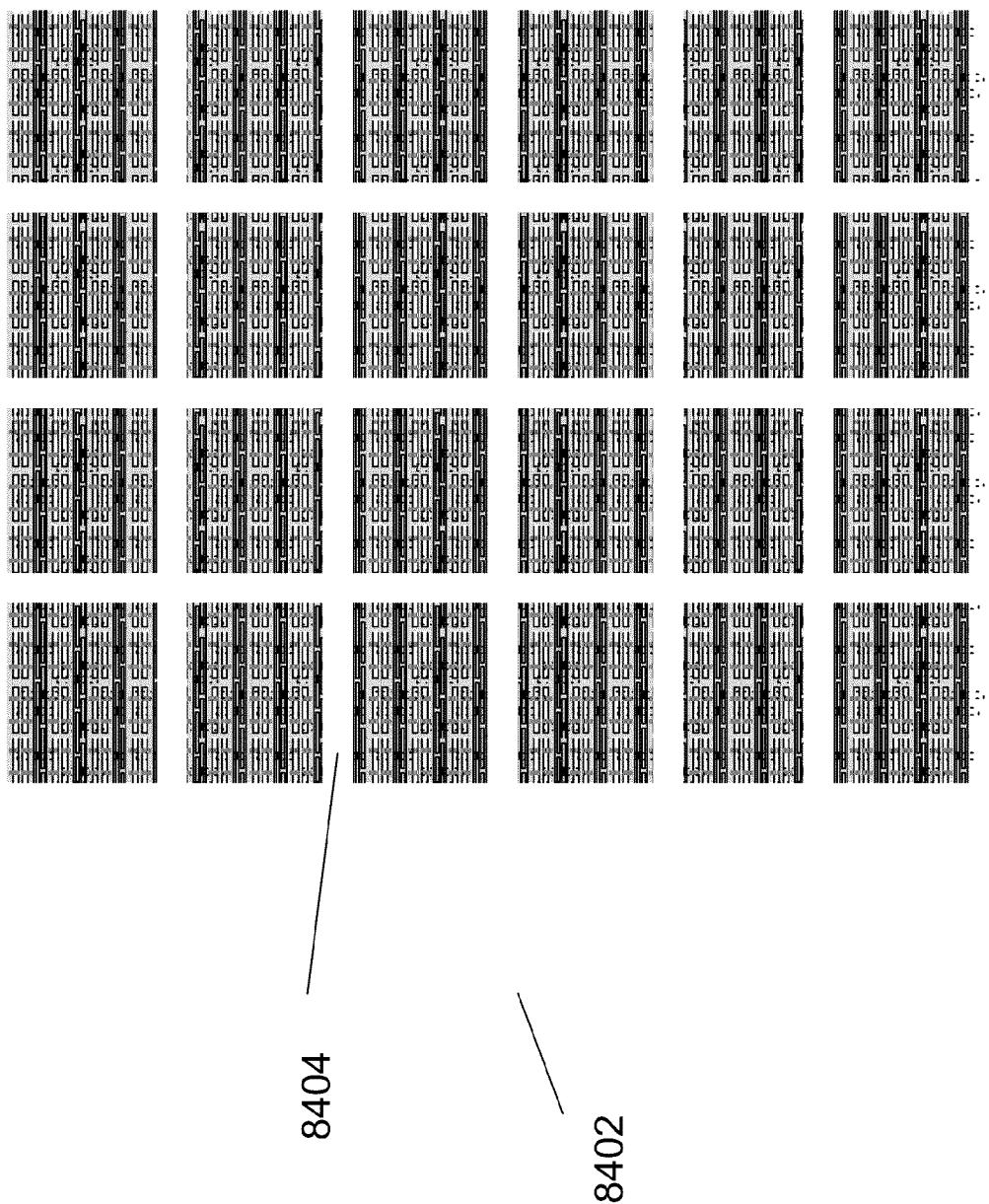

An additional variation of the invention may be the adaptation of the continuous array (presented in relation to FIGS. 10 and 11) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers. For a logic-only layer, the structures presented in FIG. 76 or FIG. 78 could be used extensively, as illustrated in FIG. 84. In such a case, the repeating logic pattern 8402 could be made full reticle size. FIG. 84A illustrates a repeating pattern of the logic cells of FIG. 78B wherein the logic cell is repeating 8×12 times. FIG. 84B illustrates the same logic repeating many more times to fully fill a reticle. The multiple masks used to construct the logic terrain could be used for multiple logic layers within one 3D IC and for multiple ICs. Such a repeating structure could comprise the logic P and N transistors, their corresponding contact layers, and even the landing strips for connecting to the underlying layers. The interconnect layers on top of these logic terrain could be made custom per design or partially custom depending on the design methodology used. The custom metal interconnect may leave the logic terrain unused in the dicing streets area. Alternatively a dicing-streets mask could be used to etch away the unused transistors in the streets area 8404 as illustrated in FIG. 84C.

The continuous logic terrain could use any transistor style including the various transistors previously presented. An additional advantage to some of the 3D layer transfer techniques previously presented may be the option to pre-build, in high volume, transistor terrains for further reduction of 3D custom IC manufacturing costs.

Similarly a memory terrain could be constructed as a continuous repeating memory structure with a fully populated reticle. The non-repeating elements of most memories may be the address decoder and some times the sense circuits. Those non repeating elements may be constructed using the logic transistors of the underlying or overlying layer.

Figure 84D:
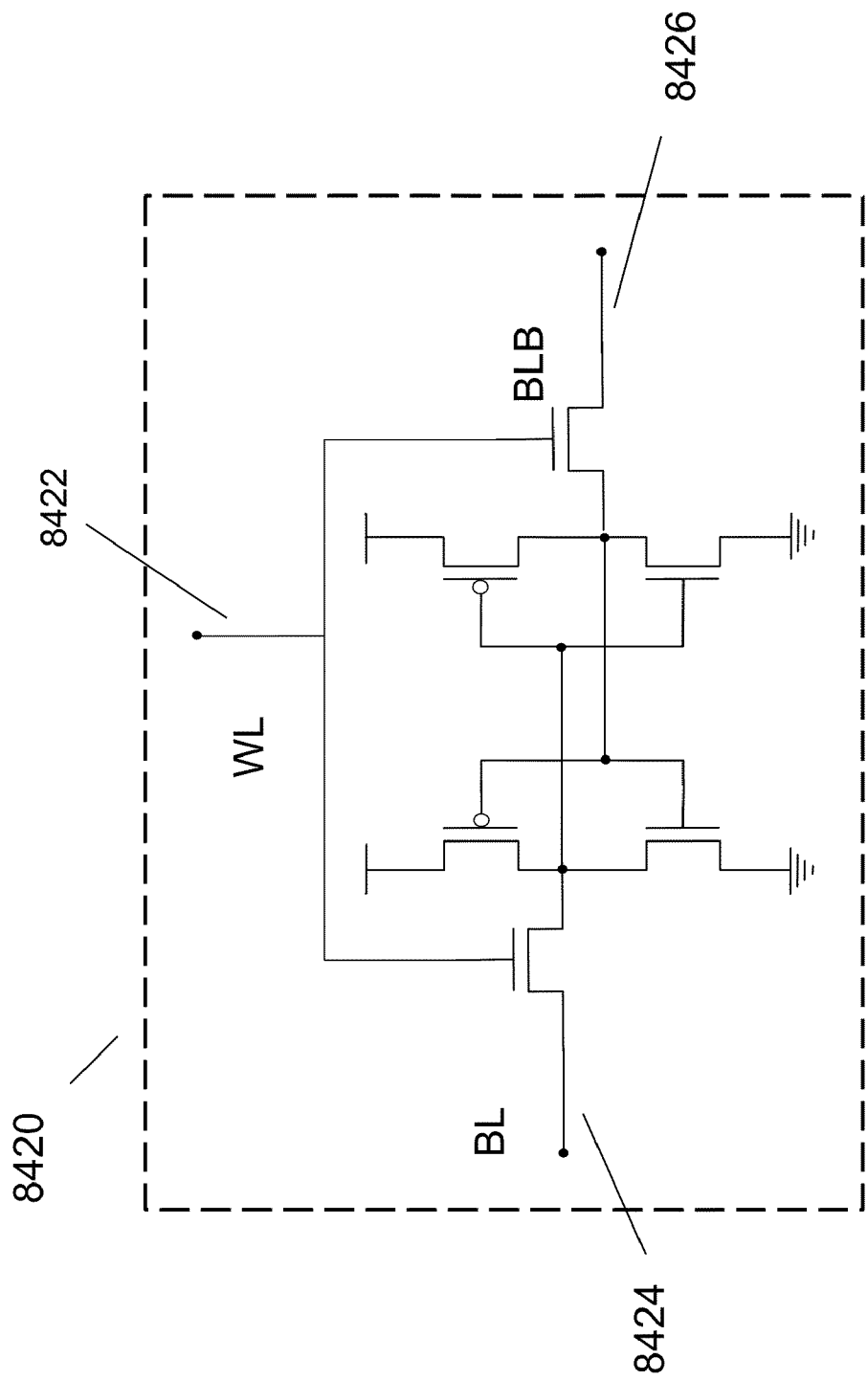

FIGS. 84D-G are drawing illustrations of an SRAM memory terrain. FIG. 84D illustrates a conventional 6 transistor SRAM cell 8420 controlled by Word Line (WL) 8422 and Bit Lines (BL, BLB) 8424, 8426. Usually the SRAM bit cell is specially designed to be very compact.

Figure 84E:
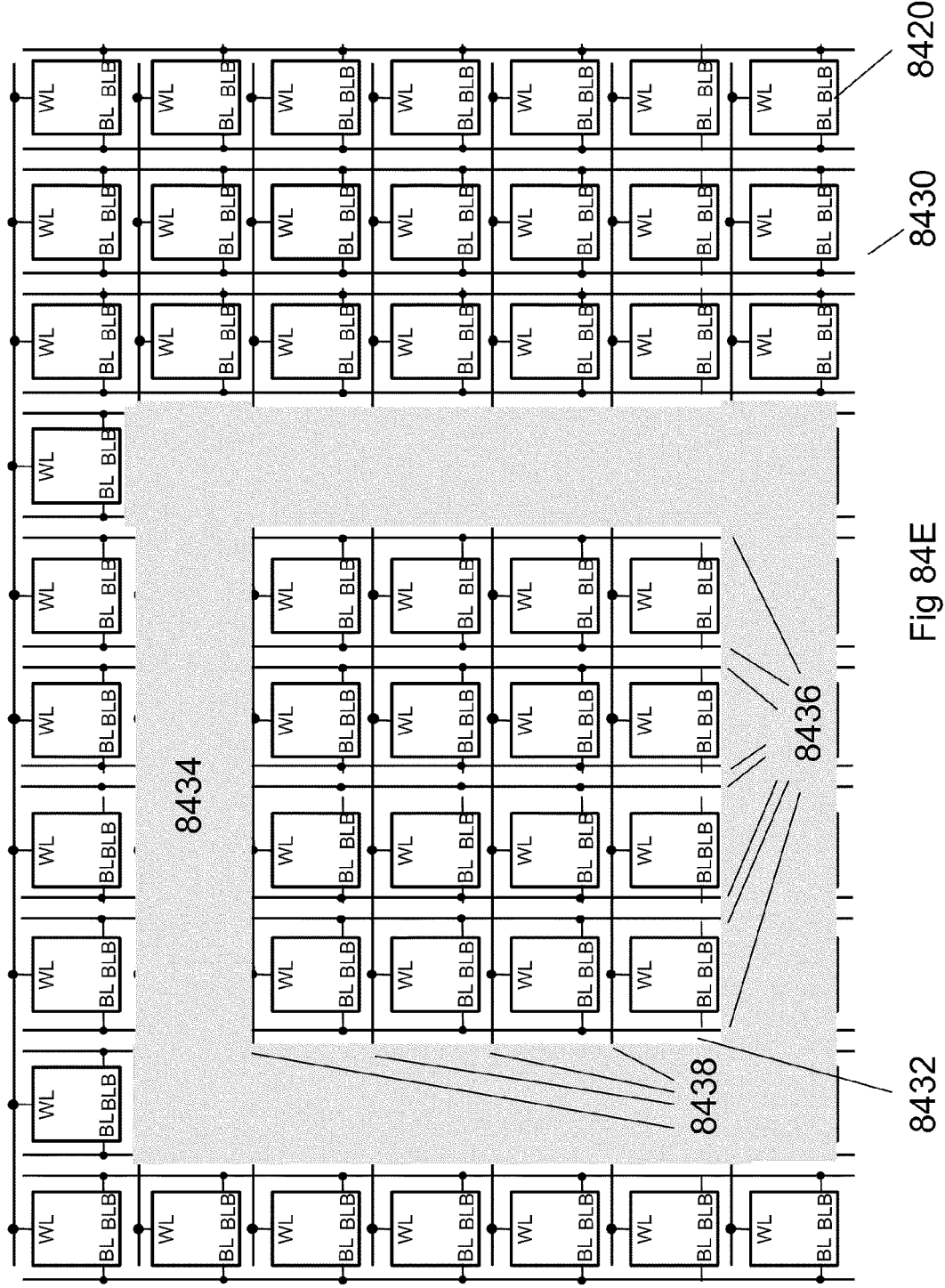

The generic continuous array 8430 may be a reticle step field sized terrain of SRAM bit cells 8420 wherein the transistor layers and even the Metal 1 layer may be used by all designs. FIG. 84E illustrates such continuous array 8430 wherein a 4×4 memory block 8432 has been defined by etching the cells around it 8434. The memory may be customized by custom metal masks such metal 2 and metal 3. To control the memory block the Word Lines 8438 and the Bit Lines 8436 may be connected by through vias to the logic terrain underneath or above it.

Figure 84F:
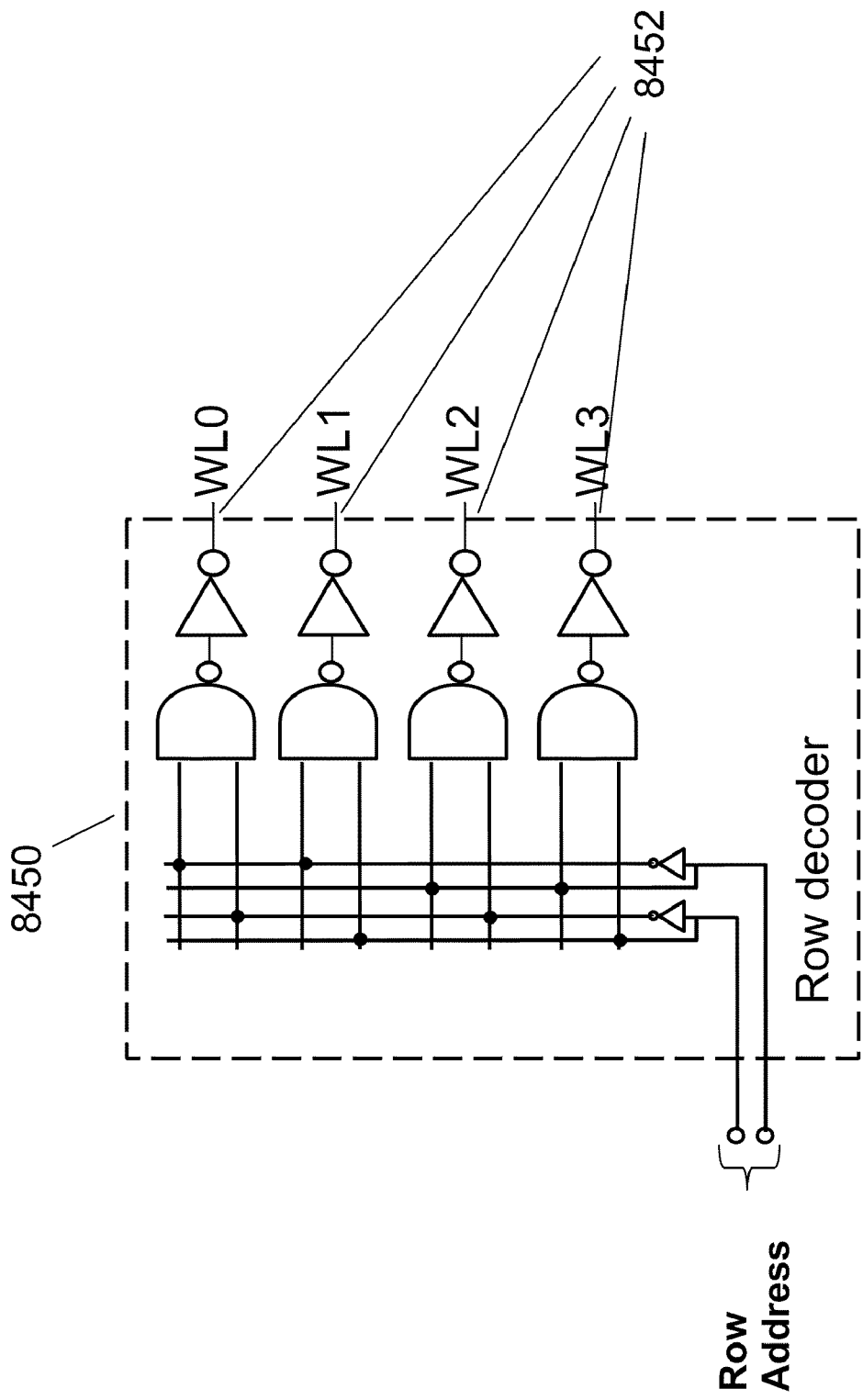
Figure 84G:
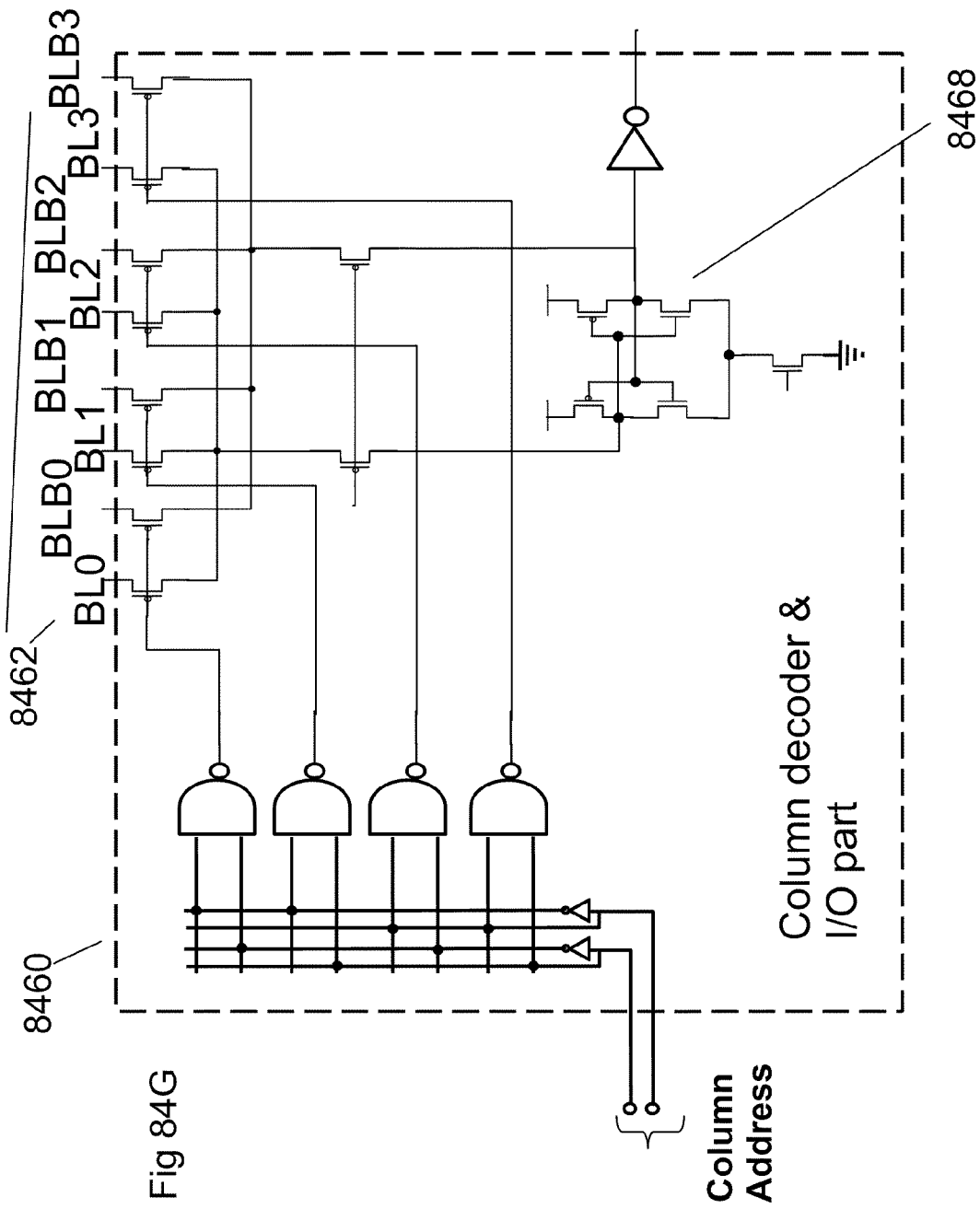

FIG. 84F illustrates the logic structure 8450 that may be constructed on the logic terrain to drive the Word Lines 8452. FIG. 84G illustrates the logic structure 8460 that may be constructed on the logic terrain to drive the Bit Lines 8462. FIG. 84G also illustrates the read sense circuit 8468 that may read the memory content from the bit lines 8462. In a similar fashion, other memory structures may be constructed from the uncommitted memory terrain using the uncommitted logic terrain close to the intended memory structure. In a similar fashion, other types of memory, such as flash or DRAM, may comprise the memory terrain. Furthermore, the memory terrain may be etched away at the edge of the projected die borders to define dicing streets similar to that indicated in FIG. 84C for a logic terrain.

Constructing 3D ICs utilizing multiple layers of different function may combine 3D layers using the layer transfer techniques according to some embodiments of the current invention, with fully prefabricated device connected by industry standard TSV technique.

An additional aspect of the current invention may provide a yield repair for random logic. The 3D IC techniques thus presented may allow the construction of a very complex logic 3D IC by using multiple layers of logic. In such a complex 3D IC, enabling the repair of random defects common in IC manufacturing may be highly desirable. Repair of repeating structures is known and commonly used in memories and will be presented in respect to FIG. 41. Another alternative is a repair for random logic leveraging the attributes of the presented 3D IC techniques and Direct Write eBeam technology such as, for example, technologies offered by Advantest, Fujitsu Microelectronics and Vistec.

FIG. 86 illustrates a 3D logic IC structured for repair. The illustrated 3D logic IC may comprise three logic layers 8602, 8612, 8622 and an upper layer of repair logic 8632. In each logic layer all primary outputs, the Flip Flop (FF) outputs, may be fed to the upper layer 8632, the repair layer. The upper layer 8632 initially may comprise a repeating structure of uncommitted logic transistors similar to those of FIGS. 76 and 78.

Figure 87:
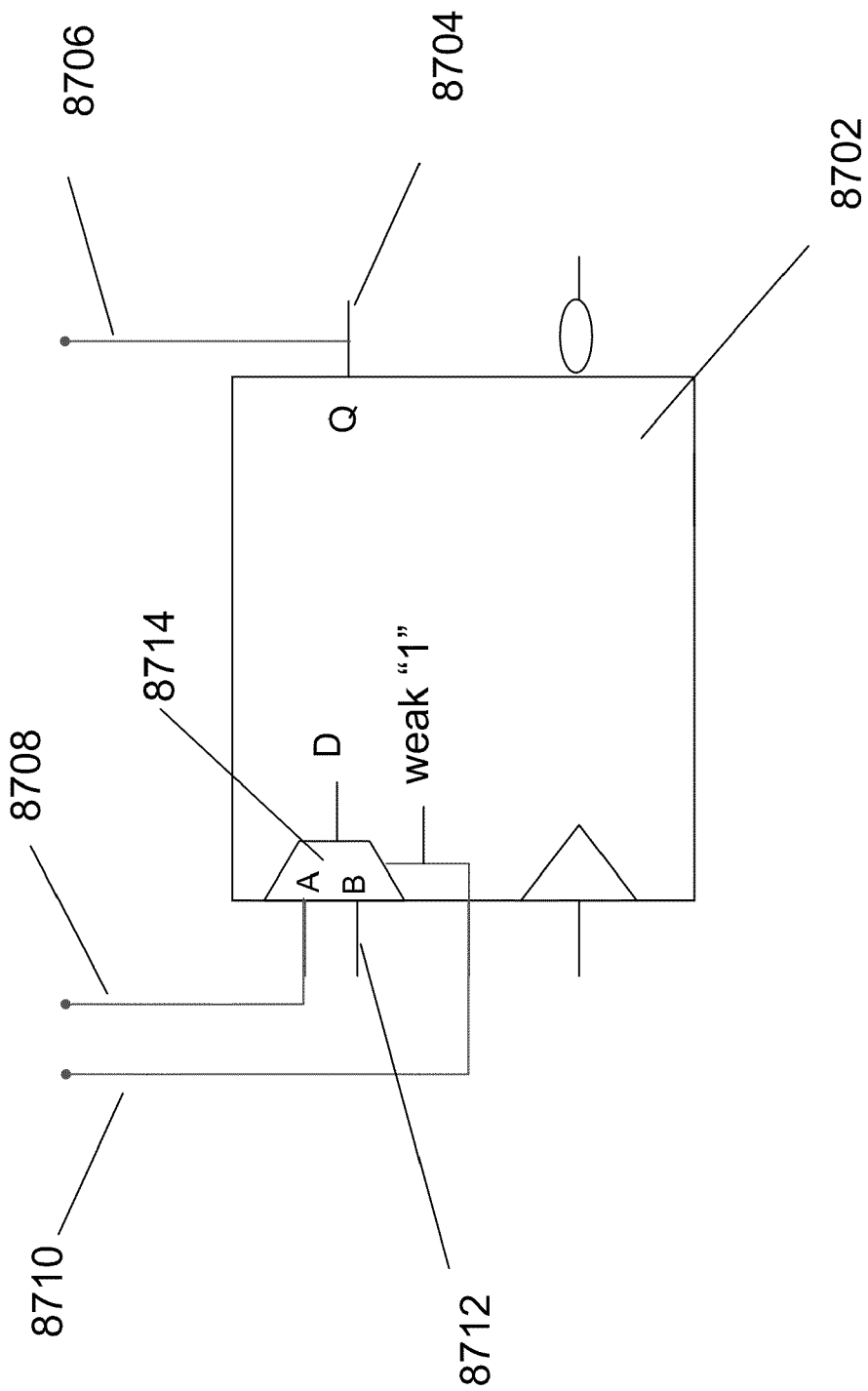
FIG. 87 is a drawing illustration of a Flip Flop designed for repairable 3D IC logic.

FIG. 87 illustrates a Flip Flop designed for repairable 3D IC logic. Such Flip Flop 8702 may include, in addition to its normal output 8704, a branch 8706 going up to the top layer, and the repair logic layer 8632. For each Flip Flop, two lines may originate from the top layer 8632, namely, the repair input 8708 and the control 8710. The normal input to the Flip Flop 8712 may go in through a multiplexer 8714 designed to select the normal input 8712 as long as the top control 8710 is floating. But once the top control 8710 is active low the multiplexer 8714 may select the repair input 8708. A faulty input may impact more than one primary input. The repair may then recreate all the required logic to replace all the faulty inputs in a similar fashion.

Multiple alternatives may exist for inserting the new input, including the use of programmability such as, for example, a one-time-programmable element to switch the multiplexer 8714 from the original input 8712 to the repaired input 8708 without the need of a top control wire 8710.

At the fabrication, the 3D IC wafer may go through a full scan test. If a fault is detected, a yield repair process would be applied. Using the design data base, repair logic may be built on the upper layer 8632. The repair logic has access to all the primary outputs as they are all available on the top layer.

Accordingly, those outputs needed for the repair may be used in the reconstruction of the exact logic found to be faulty. The reconstructed logic may include some enhancement such as drive size or metal wires strength to compensate for the longer lines going up and then down. The repair logic, as a de-facto replacement of the faulty logic 'cone,' may be built using the uncommitted transistors on the top layer. The top layer may be customized with a custom metal layer defined for each die on the wafer as required by utilizing the direct write eBeam. The replacement signal 8708 may be connected to the proper Flip Flop and become active by having the top control signal 8710 active low.

The repair flow may also be used for performance enhancement. If the wafer test includes timing measurements, a slow performing logic 'cone' could be replaced in a similar manner to a faulty logic 'cone' described previously, e.g., in the preceding paragraph.

Figure 86A:
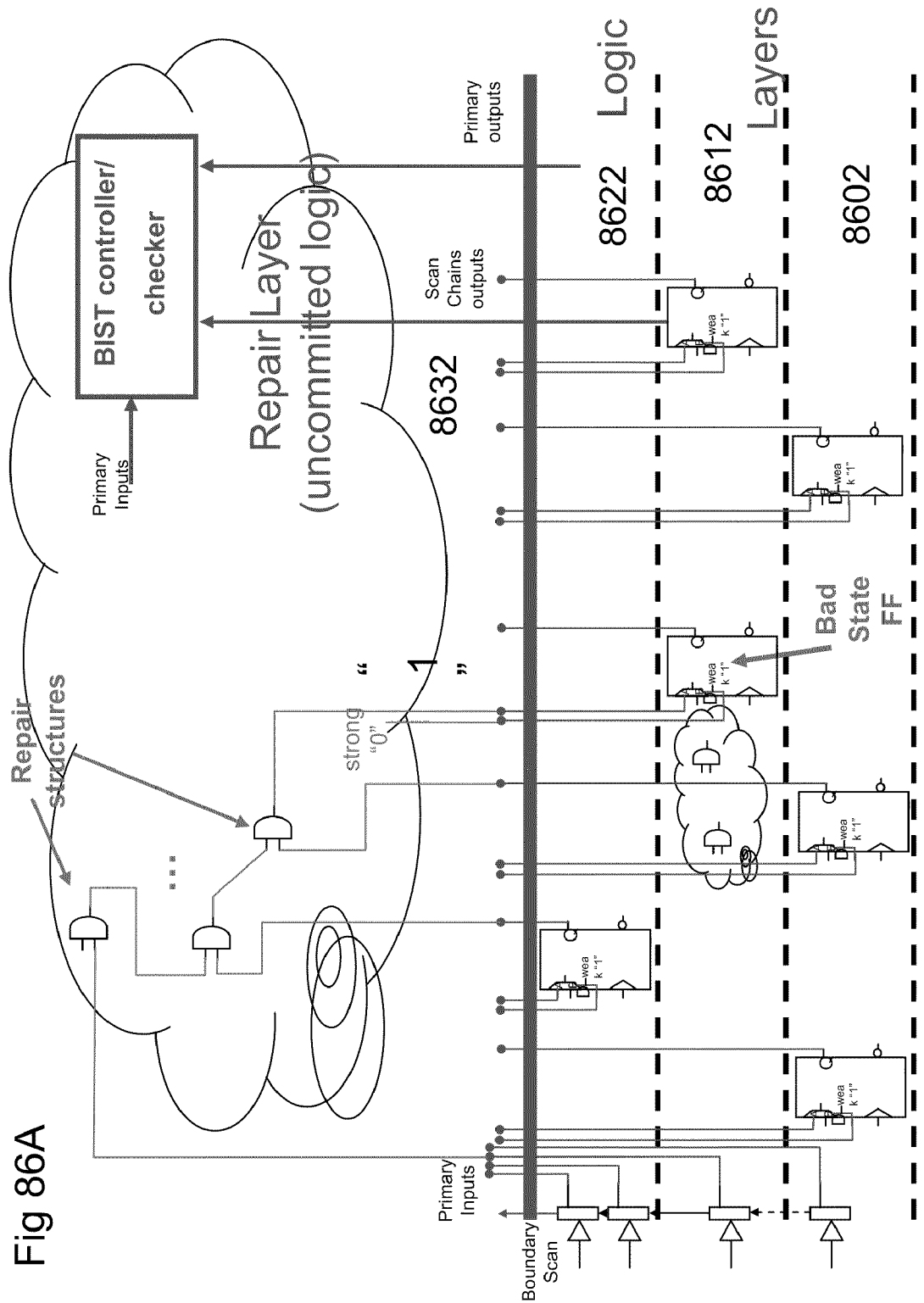
FIG. 86A is a drawing illustration of a 3D logic IC structured for repair.
Figure 86B:
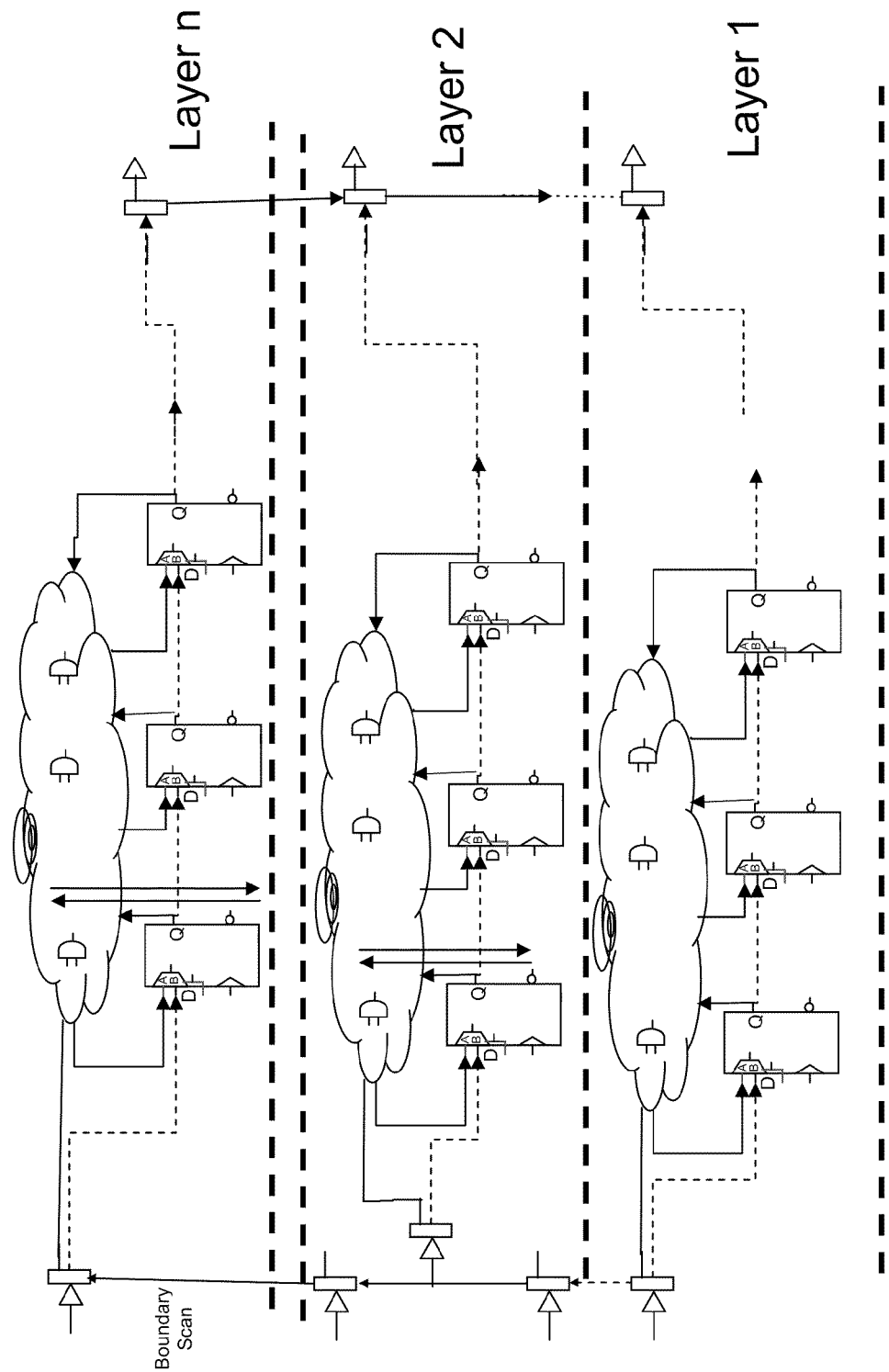
FIG. 86B is a drawing illustration of a 3D IC with scan chain confined to each layer.

FIG. 86B is a drawing illustration of a 3D IC wherein the scan chains are designed so each is confined to one layer. This confinement may allow testing of each layer as it is fabricated and could be useful in many ways. For example, after a circuit layer is completed and then tested showing very bad yield, then the wafer could be removed and not continued for building additional 3D circuit layers on top of bad base. Alternatively, a design may be constructed to be very modular and therefore the next transferred circuit layer could comprise replacement modules for the underlying faulty base layer similar to what was suggested in respect to FIG. 41.

Figure 86C:
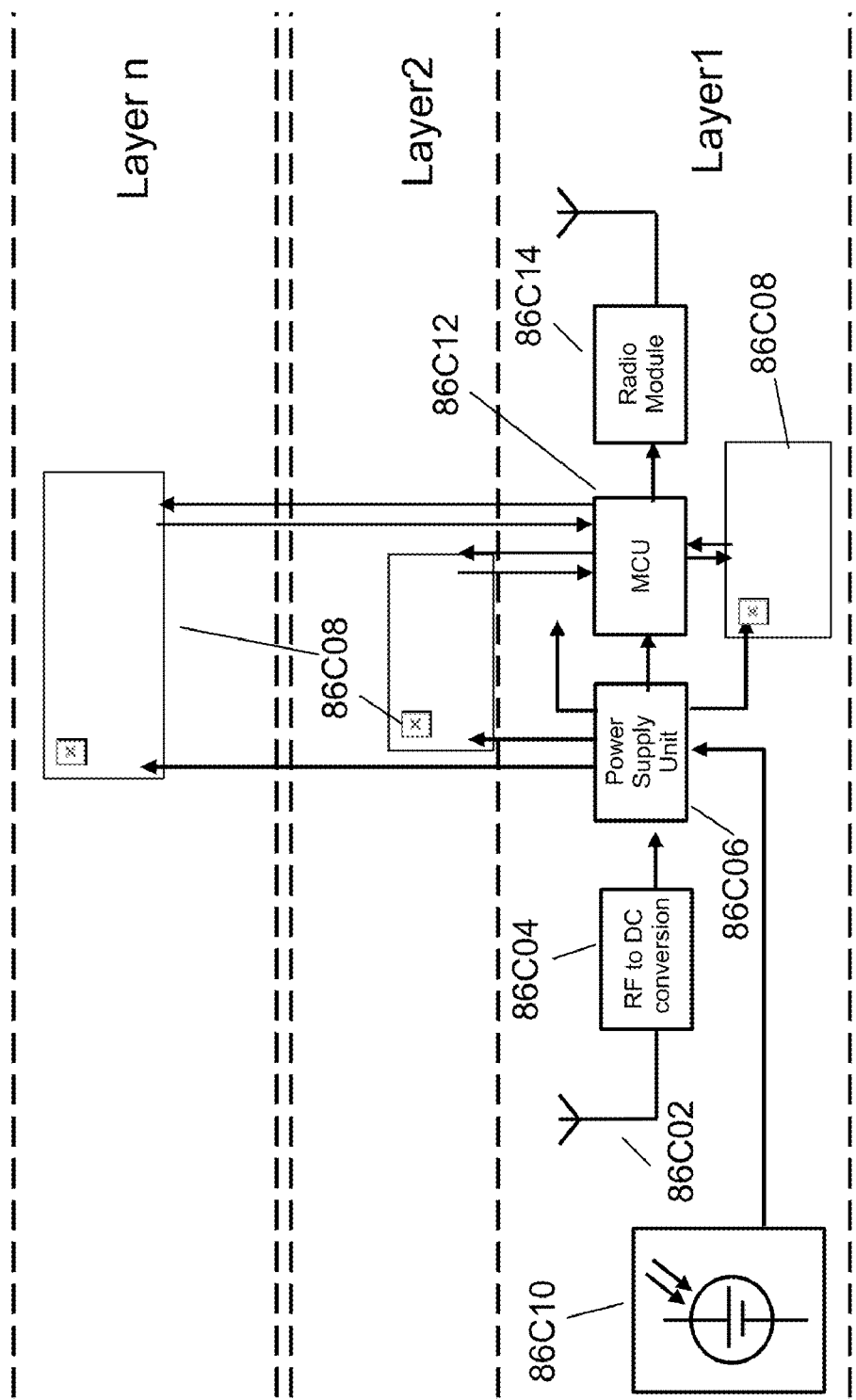
FIG. 86C is a drawing illustration of contact-less testing.

The elements of the invention related to FIGS. 86A and 86B require testing of the wafer during the fabrication phase, which might be of concern in respect to debris associated with making physical contact with a wafer for testing if the wafer is probed when tested. FIG. 86C is a drawing illustration of an embodiment which provides for contact-less automated self testing. A contact-less power harvesting element might be used to harvest the electromagnetic energy directed at the circuit of interest by a coil base antenna 86C02, an RF to DC conversion circuit 86C04, and a power supply unit 86C06 to generate the required supply voltages to run the self test circuits and the various 3D IC circuits 86C08 to be tested. Alternatively, a tiny photo voltaic cell 86C10 could be used to convert light beam energy to electric current which will be converted by the power supply unit 86C06 to the required voltages. Once the circuits are powered, a Micro Control Unit 86C12 could perform a full scan test of all existing circuits 86C08. The self test could be full scan or other BIST (Built In Self Test) alternatives. The test result could be transmitted using wireless radio module 86C14 to a base unit outside of the 3D IC wafer. Such contact less wafer testing could be used for the test as was referenced in respect to FIG. 86A and FIG. 86B or for other application such as wafer to wafer or die to wafer integration using TSVs. Alternative uses of contact-less testing could be applied to various combinations of the invention. One example is where a carrier wafer method may be used to create a wafer transfer layer whereby transistors and the metal layers connecting them to form functional electronic circuits are constructed. Those functional circuits could be contact-lessly tested to validate proper yield, and, if appropriate, actions to repair or activate built-in redundancy may be done. Then using layer transfer, the tested functional circuit layer may be transferred on top of another processed wafer 808, and then be connected be utilizing one of the approaches presented before.

According to the yield repair design methodology, substantially all the primary outputs 8706 may go up and substantially all primary inputs 8712 could be replaced by signals coming from the top 8708.

An additional advantage of this yield repair design methodology may be the ability to reuse logic layers from one design to another design. For example, a 3D IC system may be designed wherein one of the layers may comprise a WiFi transceiver receiver. And such circuit may now be needed for a completely different 3D IC. It might be advantageous to reuse the same WiFi transceiver receiver in the new design by just having the receiver as one of the new 3D IC design layers to save the redesign effort and the associated NRE (non recurring expense) for masks and etc. The reuse could be applied to many other functions, allowing the 3D IC to resemble the old way of integrating function—the PC (printed circuit) Board. For such a concept to work well, a connectivity standard for the connection of wires up and down may be desirable.

Figure 13:
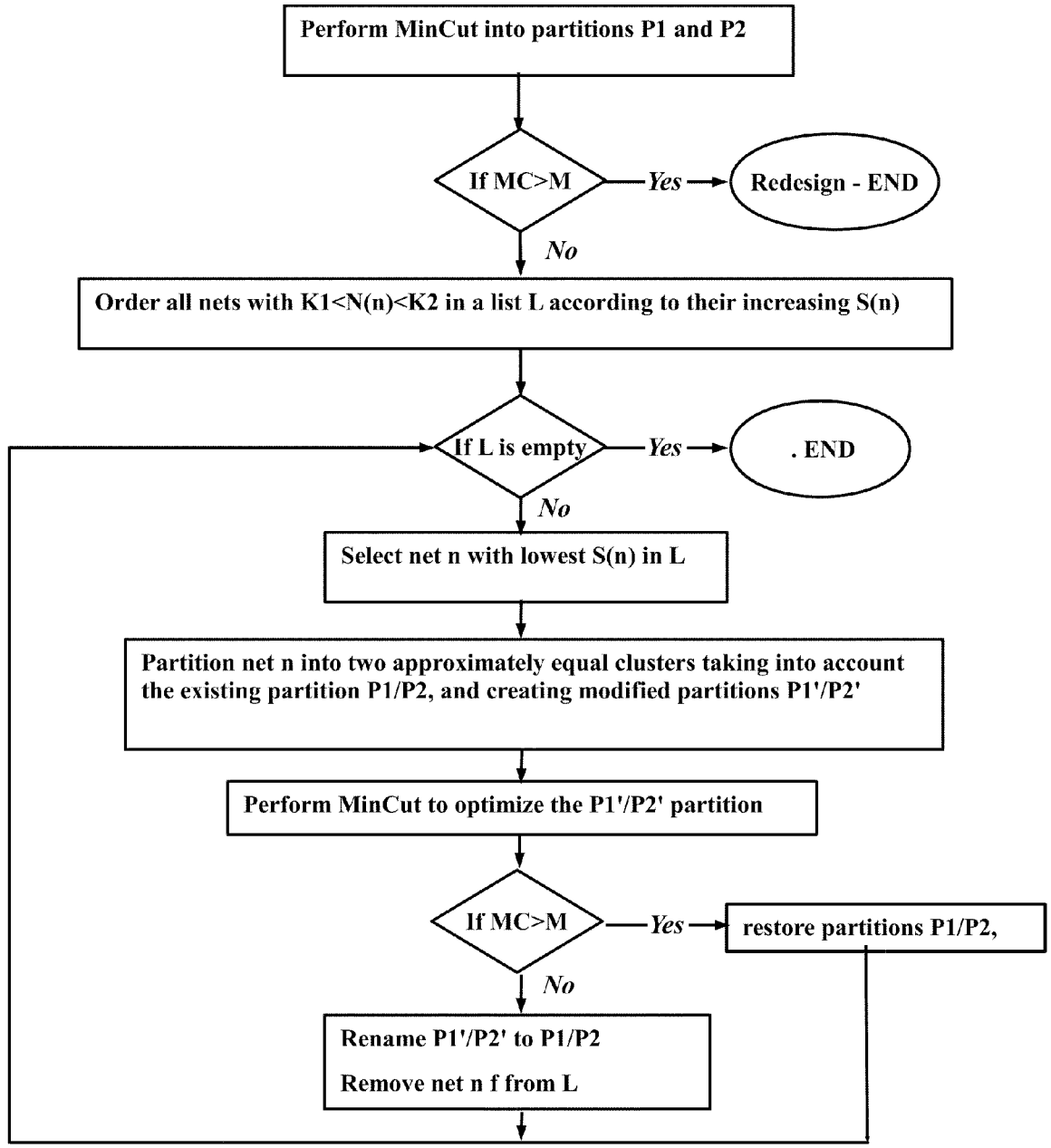
FIG. 13 a drawing illustration of a flow chart for 3D logic partitioning.

FIG. 13 is a flow-chart illustration for 3D logic partitioning. The partitioning of a logic design to two or more vertically connected dies presents a different challenge for a Place and Route—P&R-tool. A place and route tool is a type of CAD software capable of operating on libraries of logic cells (as well as libraries of other types of cells) as previously discussed. The common layout flow of prior art P & R tools may typically start with planning the placement followed by the routing. But the design of the logic of vertically connected dies may give priority to the much-reduced frequency of connections between dies and may create a need for a special design flow and CAD software specifically to support the design flow. In fact, a 3D system might merit planning some of the routing first as presented in the flows of FIG. 13.

The flow chart of FIG. 13 uses the following terms:
M—The number of TSVs available for logic;
N(n)—The number of nodes connected to net n;
S(n)—The median slack of net n;
MinCut—a known algorithm to partition logic design (netlist) to two pieces about equal in size with a minimum number of nets (MC) connecting the pieces; MC—number of nets connecting the two partitions;
K1, K2—Two parameters selected by the designer.

One idea of the proposed flow of FIG. 13 is to construct a list of nets in the logic design that connect more than K1 nodes and less than K2 nodes. K1 and K2 are parameters that could be selected by the designer and could be modified in an iterative process. K1 should be high enough so to limit the number of nets put into the list. The flow's objective is to assign the TSVs to the nets that have tight timing constraints—critical nets. And also have many nodes whereby having the ability to spread the placement on multiple die help to reduce the overall physical length to meet the timing constraints. The number of nets in the list should be close but smaller than the number of TSVs. Accordingly K1 should be set high enough to achieve this objective. K2 is the upper boundary for nets with the number of nodes N(n) that would justify special treatment.

Critical nets may be identified usually by using static timing analysis of the design to identify the critical paths and the available "slack" time on these paths, and pass the constraints for these paths to the floor planning, layout, and routing tools so that the final design is not degraded beyond the requirement.

Once the list is constructed it is priority-ordered according to increasing slack, or the median slack, S(n), of the nets. Then, using a partitioning algorithm, such as, but not limited to, MinCut, the design may be split into two parts, with the highest priority nets split about equally between the two parts. The objective is to give the nets that have tight slack a better chance to be placed close enough to meet the timing challenge. Those nets that have higher than K1 nodes tend to get spread over a larger area, and by spreading into three dimensions we get a better chance to meet the timing challenge.

The Flow of FIG. 13 suggests an iterative process of allocating the TSVs to those nets that have many nodes and are with the tightest timing challenge, or smallest slack.

Clearly the same Flow could be adjusted to three-way partition or any other number according to the number of dies the logic will be spread on.

Constructing a 3D Configurable System comprising anti-fuse based logic also provides features that may implement yield enhancement through utilizing redundancies. This may be even more convenient in a 3D structure of embodiments of the current invention because the memories may not be sprinkled between the logic but may rather be concentrated in the memory die, which may be vertically connected to the logic die. Constructing redundancy in the memory, and the proper self-repair flow, may have a smaller effect on the logic and system performance.

The potential dicing streets of the continuous array of this invention represent some loss of silicon area. The narrower the street the lower the loss is, and therefore, it may be advantageous to use advanced dicing techniques that can create and work with narrow streets.

An additional advantage of the 3D Configurable System of various embodiments of this invention may be a reduction in testing cost. This is the result of building a unique system by using standard 'Lego®' blocks. Testing standard blocks could reduce the cost of testing by using standard probe cards and standard test programs.

The disclosure presents two forms of 3D IC system, first by using TSV and second by using the method referred to herein as the 'Attic' described in FIGS. 21 to 35 and 39 to 40. Those two methods could even work together as a devices could have multiple layers of crystallized silicon produced using layer transfer and the techniques referred to herein as the 'Foundation' and the 'Attic' and then connected together using TSV. The most significant difference is that prior TSVs are associated with a relatively large misalignment (approximately 1 micron) and limited connections (TSV) per mm sq. of approximately 10,000 for a connected fully fabricated device while the disclosed 'smart-cue'—layer transferred techniques allow 3D structures with a very small misalignment (<10 nm) and high connection (vias) per mm sq. of approximately 100,000,000 and are produced in an integrated fabrication flow. An advantage of 3D using TSV is the ability to test each device before integrating it and utilize the Known Good Die (KGD) in the 3D stack or system. This is very helpful to provide good yield and reasonable costs of the 3D Integrated System.

An additional alternative of the invention is a method to allow redundancy so that the highly integrated 3D systems using the layer transfer technique could be produced with good yield. For the purpose of illustrating this redundancy invention we will use the programmable tile array presented in FIGS. 11A, 36-38.

Figure 41:
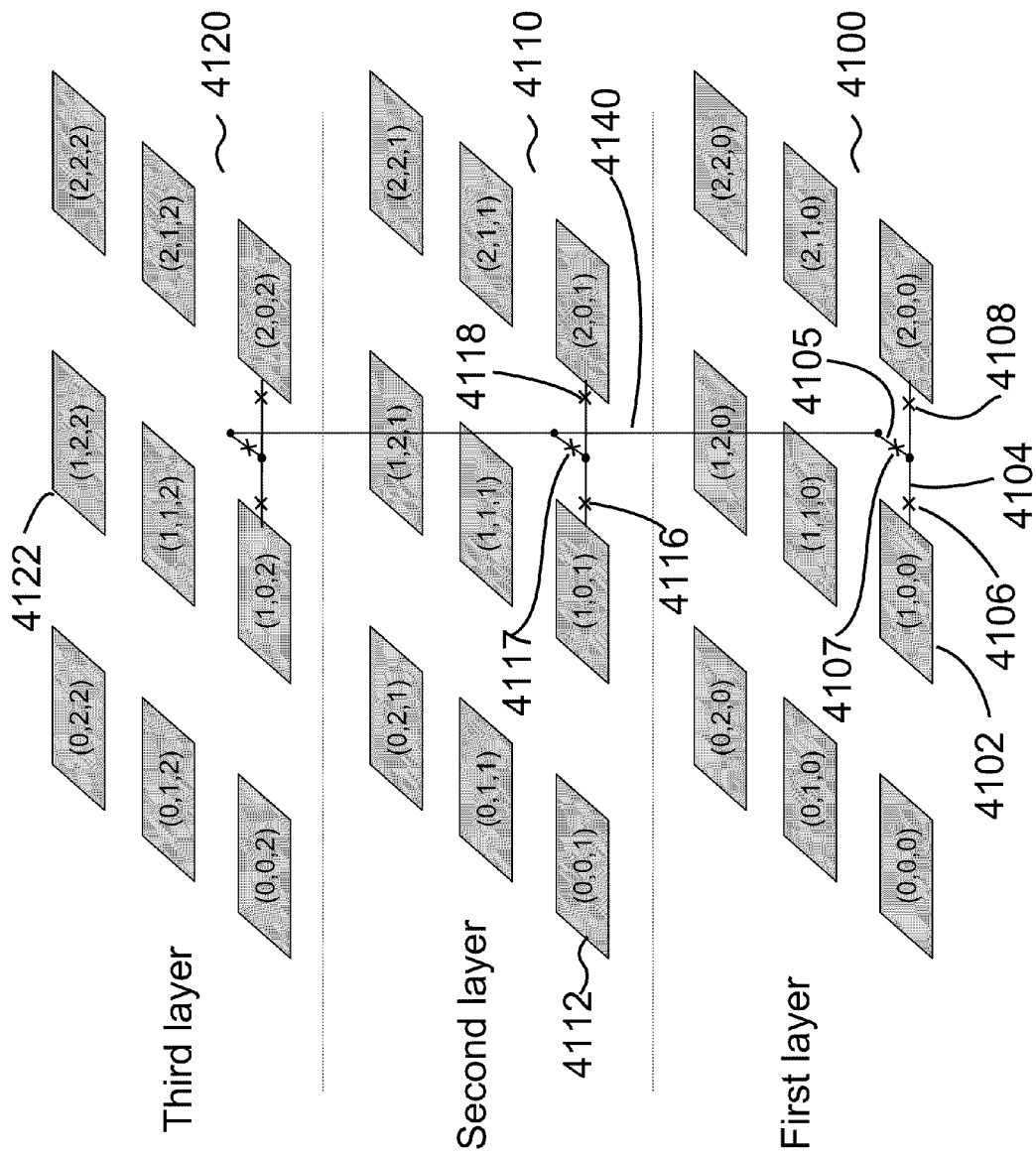
FIG. 41 is a drawing illustration of a 3D IC system with redundancy.

FIG. 41 is a drawing illustration of a 3D IC system with redundancy. It illustrates a 3D IC programmable system comprising: first programmable layer 4100 of 3×3 tiles 4102, overlaid by second programmable layer 4110 of 3×3 tiles 4112, overlaid by third programmable layer 4120 of 3×3 tiles 4122. Between a tile and its neighbor tile in the layer there are many programmable connections 4104. The programmable element 4106 could be antifuse, pass transistor controlled driver, floating gate flash transistor, or similar electrically programmable element. Each inter-tile connection 4104 has a branch out programmable connection 4105 connected to inter-layer vertical connection 4140. The end product is designed so that at least one layer such as 4110 is left for redundancy.

When the end product programmable system is being programmed for the end application each tile will run its own Built-in Test using its own MCU. A tile that is detected to have a defect will be replaced by the tile in the redundancy layer 4110. The replacement will be done by the tile that is at the same location but in the redundancy layer and therefore it should have an acceptable impact on the overall product functionality and performance. For example, if tile (1, 0, 0) has a defect then tile (1, 0, 1) will be programmed to have exactly the same function and will replace tile (1, 0, 0) by properly setting the inter tile programmable connections. Therefore, if defective tile (1, 0, 0) was supposed to be connected to tile (2, 0, 0) by connection 4104 with programmable element 4106, then programmable element 4106 would be turned off and programmable elements 4116, 4117, 4107 will be turned on instead. A similar multilayer connection structure should be used for any connection in or out of a repeating tile. So if the tile has a defect the redundant tile of the redundant layer would be programmed to the defected tile functionality and the multilayer inter tile structure would be activated to disconnect the faulty tile and connect the redundant tile. The inter layer vertical connection 4140 could be also used when tile (2, 0, 0) is defective to insert tile (2, 0, 1), of the redundant layer, instead. In such case (2, 0, 1) will be programmed to have exactly the same function as tile (2, 0, 0), programmable element 4108 will be turned off and programmable elements 4118, 4117, 4107 will be turned on instead.

An additional embodiment of the invention may be a modified TSV (Through Silicon Via) flow. This flow may be for wafer-to-wafer TSV and may provide a technique whereby the thickness of the added wafer may be reduced to about 1 micrometer (micron). FIG. 93 A to D illustrate such a technique. The first wafer 9302 may be the base on top of which the 'hybrid' 3D structure may be built. A second wafer 9304 may be bonded on top of the first wafer 9302. The new top wafer may be face-down so that the circuits 9305 may be face-to-face with the first wafer 9302 circuits 9303.

The bond may be oxide-to-oxide in some applications or copper-to-copper in other applications. In addition, the bond may be by a hybrid bond wherein some of the bonding surface may be oxide and some may be copper.

Figure 93A:
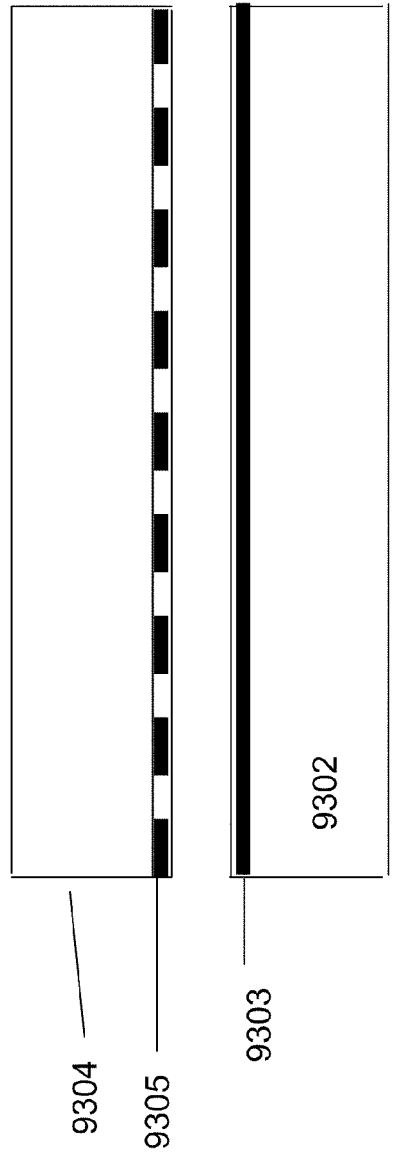
Figure 93B:
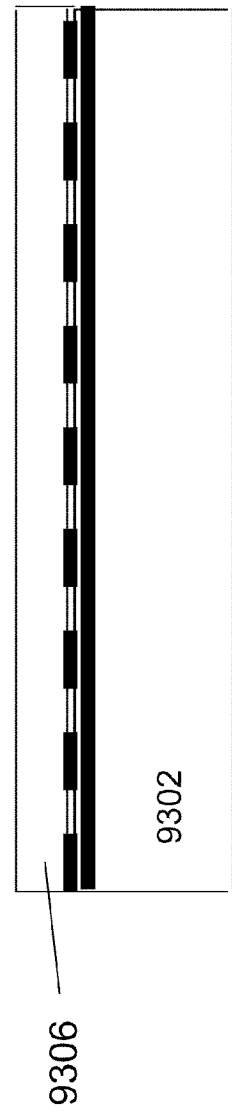

After bonding, the top wafer 9304 may be thinned down to about 60 micron in a conventional back-lap and CMP process. FIG. 93B illustrates the now thinned wafer 9306 bonded to the first wafer 9302.

Figure 93C:
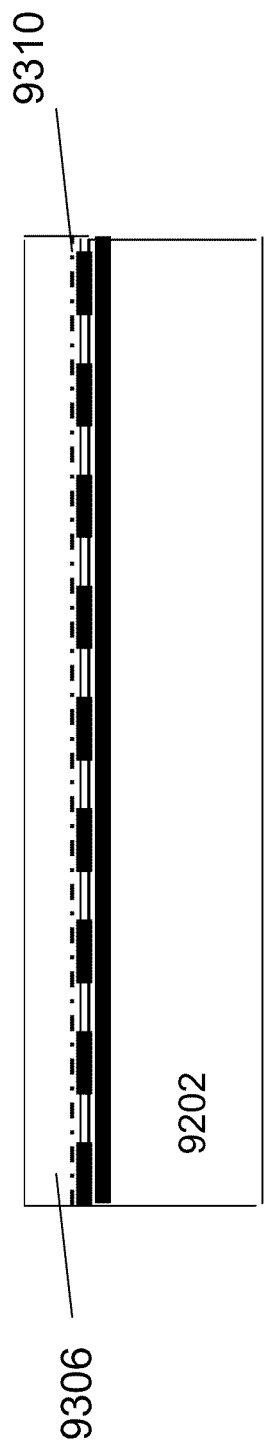

The next step may comprise a high accuracy measurement of the top wafer 9306 thickness. Then, using a high power 1-4 MeV H+ implant, a cleave plane 9310 may be defined in the top wafer 9306. The cleave plane 9310 may be positioned approximately 1 micron above the bond surface as illustrated in FIG. 93C. This process may be performed with a special high power implanter such as, for example, the implanter used by SiGen Corporation for their PV (PhotoVoltaic) application.

Figure 93D:
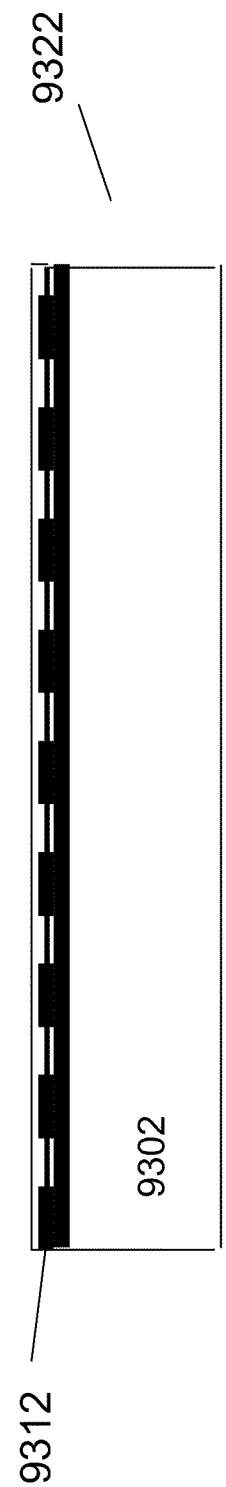

Having the accurate measure of the top wafer 9306 thickness and the highly controlled implant process may enable cleaving most of the top wafer 9306 out thereby leaving a very thin layer 9312 of about 1 micron, bonded on top of the first wafer 9302 as illustrated in FIG. 93D.

An advantage of this process flow may be that an additional wafer with circuits could now be placed and bonded on top of the bonded structure 9322 in a similar manner. But first a connection layer may be built on the back of 9312 to allow electrical connection to the bonded structure 9322 circuits.

Having the top layer thinned to a single micron level may allow such electrical connection metal layers to be fully aligned to the top wafer 9312 electrical circuits 9305 and may allows the vias through the back side of top layer 9312 to be relatively small, of about 100 nm in diameter.

The thinning of the top layer 9312 may enable the modified TSV to be at the level of 100 nm vs. the 5 microns required for TSVs that need to go through 50 microns of silicon. Unfortunately the misalignment of the wafer-to-wafer bonding process may still be quite significant at about +/−0.5 micron. Accordingly, as described elsewhere in this document in relation to FIG. 75, a landing pad of approximately 1×1 microns may be used on the top of the first wafer 9302 to connect with a small metal contact on the face of the second wafer 9304 while using copper-to-copper bonding. This process may represent a connection density of approximately 1 connection per 1 square micron.

It may be desirable to increase the connection density using a concept as illustrated in FIG. 80 and the associated explanations. In the modified TSV case, it may be much more challenging to do so because the two wafers being bonded may be fully processed and once bonded, only very limited access to the landing strips may be available. However, to construct a via, etching through all layers may be needed. FIG. 94 illustrates a method and structures to address these issues.

FIG. 94A illustrates four metal landing strips 9402 exposed at the upper layer of the first wafer 9302. The landing strips 9402 may be oriented East-West at a length 9406 of the maximum East-West bonding misalignment Mx plus a delta D, which will be explained later. The pitch of the landing strip may be twice the minimum pitch Py of this upper layer of the first wafer 9302. 9403 may indicate an unused potential room for an additional metal strip.

FIG. 94B illustrates landing strips 9412, 9413 exposed at the top of the second wafer 9312. FIG. 94B also shows two columns of landing strips, namely, A and B going North to South. The length of these landing strips is 1.25 Py. The two wafers 9302 and 9312 may be bonded copper-to-copper and the landing strips of FIG. 94A and FIG. 94B may be designed so that the bonding misalignment does not exceed the maximum misalignment Mx in the East-West direction and My in the North-South direction. The landing strips 9412 and 9413 of FIG. 94B may be designed so that they may never unintentionally short to landing strips 9402 of 94A and that either row A landing strips 9412 or row B landing strips 9413 may achieve full contact with landing strips 9402. The delta D may be the size from the East edge of landing strips 9413 of row B to the West edge of A landing strips 9412. The number of landing strips 9412 and 9413 of FIG. 94B may be designed to cover the FIG. 94A landing strips 9402 plus My to cover maximum misalignment error in the North-South direction.

Substantially all the landing strips 9412 and 9413 of FIG. 94B may be routed by the internal routing of the top wafer 9312 to the bottom of the wafer next to the transistor layers. The location on the bottom of the wafer is illustrated in FIG. 93D as the upper side of the 9322 structure. Now new vias 9432 may be formed to connect the landing strips to the top surface of the bonded structure using conventional wafer processing steps. FIG. 94C illustrates all the via connections routed to the landing strips of FIG. 94B, arranged in row A 9432 and row B 9433. In addition, the vias 9436 for bringing in the signals may also be processed. All these vias may be aligned to the top wafer 9312.

As illustrated in FIG. 94C, a metal mask may now be used to connect, for example, four of the vias 9432 and 9433 to the four vias 9436 using metal strips 9438. This metal mask may be aligned to the top wafer 9312 in the East-West direction. This metal mask may also be aligned to the top wafer 9312 in the North-South direction but with a special offset that is based on the bonding misalignment in the North-South direction. The length of the metal structure 9438 in the North South direction may be enough to cover the worst case North-South direction bonding misalignment.

It should be stated again that the invention could be applied to many applications other than programmable logic such a Graphics Processor which may comprise many repeating processing units. Other applications might include general logic design in 3D ASICs (Application Specific Integrated Circuits) or systems combining ASIC layers with layers comprising at least in part other special functions. Persons of ordinary skill in the art will appreciate that many more embodiment and combinations are possible by employing the inventive principles contained herein and such embodiments will readily suggest themselves to such skilled persons. Thus the invention is not to be limited in any way except by the appended claims.

Yet another alternative to implement 3D redundancy to improve yield by replacing a defective circuit is by the use of Direct Write E-beam instead of a programmable connection.

An additional variation of the programmable 3D system may comprise a tiled array of programmable logic tiles connected with I/O structures that are pre fabricated on the base wafer 1402 of FIG. 14.

In yet an additional variation, the programmable 3D system may comprise a tiled array of programmable logic tiles connected with I/O structures that are pre-fabricated on top of the finished base wafer 1402 by using any of the techniques presented in conjunction to FIGS. 21-35 or FIGS. 39-40. In fact any of the alternative structures presented in FIG. 11 may be fabricated on top of each other by the 3D techniques presented in conjunction with FIGS. 21-35 or FIGS. 39-40. Accordingly many variations of 3D programmable systems may be constructed with a limited set of masks by mixing different structures to form various 3D programmable systems by varying the amount and 3D position of logic and type of I/Os and type of memories and so forth.

Additional flexibility and reuse of masks may be achieved by utilizing only a portion of the full reticle exposure. Modern steppers allow covering portions of the reticle and hence projecting only a portion of the reticle. Accordingly a portion of a mask set may be used for one function while another portion of that same mask set would be used for another function. For example, let the structure of FIG. 37 represent the logic portion of the end device of a 3D programmable system. On top of that 3×3 programmable tile structure I/O structures could be built utilizing process techniques according to FIGS. 21-35 or FIGS. 39-40. There may be a set of masks where various portions provide for the overlay of different I/O structures; for example, one portion comprising simple I/Os, and another of Serializer/Deserializer (Ser/Des) I/Os. Each set is designed to provide tiles of I/O that perfectly overlay the programmable logic tiles. Then out of these two portions on one mask set, multiple variations of end systems could be produced, including one with all nine tiles as simple I/Os, another with SerDes overlaying tile (0, 0) while simple I/Os are overlaying the other eight tiles, another with SerDes overlaying tiles (0, 0), (0, 1) and (0, 2) while simple I/Os are overlaying the other 6 tiles, and so forth. In fact, if properly designed, multiples of layers could be fabricated one on top of the other offering a large variety of end products from a limited set of masks. Persons of ordinary skill in the art will appreciate that this technique has applicability beyond programmable logic and may profitably be employed in the construction of many 3D ICs and 3D systems. Thus the scope of the invention is only to be limited by the appended claims.

In yet an additional alternative of the current invention, the 3D antifuse Configurable System, may also comprise a Programming Die. In some cases of FPGA products, and primarily in antifuse-based products, there is an external apparatus that may be used for the programming the device. In many cases it is a user convenience to integrate this programming function into the FPGA device. This may result in a significant die overhead as the programming process requires higher voltages as well as control logic. The programmer function could be designed into a dedicated Programming Die. Such a Programmer Die could comprise the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons of ordinary skill in the art, that the present invention is using the term antifuse as it is the common name in the industry, but it also refers in this invention to any micro element that functions like a switch, meaning a micro element that initially has highly resistive-OFF state, and electronically it could be made to switch to a very low resistance—ON state. It could also correspond to a device to switch ON-OFF multiple times—a re-programmable switch. As an example there are new innovations, such as the electro-statically actuated Metal-Droplet micro-switch introduced by C. J. Kim of UCLA micro & nano manufacturing lab, that may be compatible for integration onto CMOS chips.

It will be appreciated by persons skilled in the art that the present invention is not limited to antifuse configurable logic and it will be applicable to other non-volatile configurable logic. A good example for such is the Flash based configurable logic. Flash programming may also require higher voltages, and having the programming transistors and the programming circuits in the base diffusion layer may reduce the overall density of the base diffusion layer. Using various embodiments of the current invention may be useful and could allow a higher device density. It is therefore suggested to build the programming transistors and the programming circuits, not as part of the diffusion layer, but according to one or more embodiments of the present invention. In high volume production one or more custom masks could be used to replace the function of the Flash programming and accordingly save the need to add on the programming transistors and the programming circuits.

Unlike metal-to-metal antifuses that could be placed as part of the metal interconnection, Flash circuits need to be fabricated in the base diffusion layers. As such it might be less efficient to have the programming transistor in a layer far above. An alternative embodiment of the current invention is to use Through-Silicon-Via 816 to connect the configurable logic device and its Flash devices to an underlying structure 804 comprising the programming transistors.

In this document, various terms have been used while generally referring to the element. For example, "house" refers to the first monocrystalline layer with its transistors and metal interconnection layer or layers. This first moncrystalline layer has also been referred to as the main wafer and sometimes as the acceptor wafer and sometimes as the base wafer.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

What is claimed is:

1. A semiconductor device comprising:
a first single crystal silicon layer comprising first transistors, first alignment marks, and at least one metal layer overlying said first single crystal silicon layer, wherein said at least one metal layer comprises copper or aluminum more than other materials;
a second single crystal silicon layer overlying said at least one metal layer, wherein said second single crystal silicon layer comprises:
through vias through said second single crystal silicon layer; and
a plurality of second transistors arranged in substantially parallel bands wherein each of a plurality of the bands comprises a portion of said second transistors along an axis in a repeating pattern; and
connection paths between a portion of said first transistors and second transistors,
wherein each of said connection paths comprises a first metal strip substantially parallel to said axis, and a second metal strip substantially perpendicular to said axis,
wherein said first metal strip is on top of said second single crystal silicon layer,
wherein said second metal strip is underneath said second single crystal silicon layer, and
wherein said first metal strip and said second metal strip provide or are capable of providing a contact area through one of said through vias.

2. A semiconductor device according to claim 1, wherein said second single crystal silicon layer is less than 0.4 micron thick.

3. A semiconductor device according to claim 1, wherein said second transistors are planar transistors.

4. A semiconductor device according to claim 1, wherein said second single crystal silicon layer further comprises second alignment marks, wherein said through vias are aligned in a first direction to said first alignment marks and aligned in a second direction to said second alignment marks.

5. A semiconductor device according to claim 1, wherein said second transistors are gate-last transistors.

6. A semiconductor device comprising:
a first single crystal silicon layer comprising first transistors, first alignment marks, and at least one metal layer overlying said first single crystal silicon layer, wherein said metal layers comprises copper or aluminum more than other materials;
an overlying second single crystal silicon layer comprising second transistors, second alignment marks, and through vias through said second single crystal silicon layer, said through vias aligned in a first direction to said first alignment marks and in a second direction to said second alignment marks;
connection paths between a portion of said first transistors and second transistors, wherein each of said connection paths comprises a first metal strip substantially parallel to an axis, and a second metal strip substantially perpendicular to said axis, wherein said first metal strip is on top of said second single crystal silicon layer;

wherein said second metal strip is underneath said second single crystal silicon layer, and wherein said first metal strip and second metal strip provide or are capable of providing a contact area through one of said through vias.

7. A semiconductor device according to claim 6, wherein said second single crystal silicon layer is less than 0.4 micron thick.

8. A semiconductor device according to claim 6, wherein said second transistors are planar transistors.

9. A semiconductor device according to claim 6, wherein said second transistors are gate-last transistors.

10. A semiconductor device comprising:
a first single crystal silicon layer comprising first transistors, first alignment marks, and at least one metal layer overlying said first single crystal silicon layer, wherein said at least one metal layer comprises copper or aluminum more than other materials;
a second single crystal silicon layer overlying said at least one metal layer;
wherein said second single crystal silicon layer comprises through vias through said second single crystal silicon layer and a plurality of second transistors comprising P type transistors and N type transistors;
wherein said second transistors are arranged in substantially parallel bands, and
wherein each of a plurality of the bands comprises a portion of said second transistors along an axis in a repeating pattern;
connection paths between a portion of said first transistors and second transistors,
wherein each of said connection paths comprises a first metal strip substantially parallel to said axis, and a second metal strip substantially perpendicular to said axis,
wherein said first metal strip is on top of said second single crystal silicon layer,
wherein said second metal strip is underneath said second single crystal silicon layer, and
wherein said first metal strip and second metal strip provide or are capable of providing a contact area through one of said through vias.

11. A semiconductor device according to claim 10, wherein said second single crystal silicon layer is less than 0.4 micron thick.

12. A semiconductor device according to claim 10, wherein said second transistors are planar transistors.

13. A semiconductor device according to claim 10,
wherein said second single crystal silicon layer comprises second alignment marks, and wherein said through vias are aligned in a first direction to said first alignment marks and in a second direction to said second alignment marks.

14. A semiconductor device according to claim 10, wherein said second transistors are gate-last transistors.

\* \* \* \* \*